US010128445B2

(12) United States Patent
Ito et al.

(10) Patent No.: US 10,128,445 B2
(45) Date of Patent: Nov. 13, 2018

(54) ORGANIC LIGHT EMITTING ELEMENT AND ORGANIC LIGHT EMITTING DISPLAY DEVICE INCLUDING THE SAME

(71) Applicant: SAMSUNG DISPLAY CO., LTD., Yongin, Gyeonggi-do (KR)

(72) Inventors: Naoyuki Ito, Seongnam-si (KR); Seul Ong Kim, Suwon-si (KR); Youn Sun Kim, Seoul (KR); Dong Woo Shin, Seoul (KR); Jung Sub Lee, Bucheon-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 524 days.

(21) Appl. No.: 14/736,498

(22) Filed: Jun. 11, 2015

(65) Prior Publication Data

US 2016/0020405 A1 Jan. 21, 2016

(30) Foreign Application Priority Data

Jul. 10, 2014 (KR) ........................ 10-2014-0086977

(51) Int. Cl.
*H01L 51/00* (2006.01)
*H01L 51/50* (2006.01)
*H01L 27/32* (2006.01)

(52) U.S. Cl.
CPC ...... *H01L 51/0067* (2013.01); *H01L 51/0052* (2013.01); *H01L 51/0072* (2013.01);
(Continued)

(58) Field of Classification Search
CPC ............. H01L 51/0067; H01L 51/0072; H01L 51/0052; H01L 51/0054; H01L 51/0058; H01L 51/5072; H01L 51/5012
(Continued)

(56) References Cited

U.S. PATENT DOCUMENTS

2007/0170419 A1* 7/2007 Gerhard .............. H01L 51/0058 257/40
2014/0077190 A1* 3/2014 Kim .................... H01L 51/0072 257/40

FOREIGN PATENT DOCUMENTS

JP 2009-212238 A 9/2009
JP 2012-082209 A 4/2012

(Continued)

*Primary Examiner* — Ruiyun Zhang
(74) *Attorney, Agent, or Firm* — Lee & Morse, P.C.

(57) ABSTRACT

An organic light emitting element and an organic light emitting device, the organic light emitting element including a first compound represented by the following Chemical Formula 1 and a second compound represented by the following Chemical Formula 2:

[Chemical Formula 1]

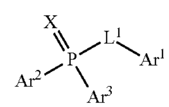

[Chemical Formula 2]

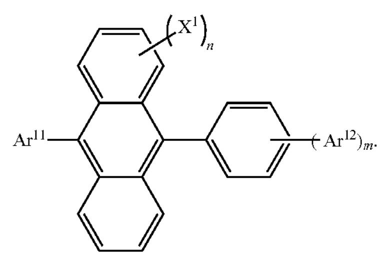

11 Claims, 5 Drawing Sheets

(52) U.S. Cl.
CPC ........ *H01L 27/323* (2013.01); *H01L 51/0054* (2013.01); *H01L 51/0058* (2013.01); *H01L 51/0071* (2013.01); *H01L 51/0073* (2013.01); *H01L 51/5012* (2013.01); *H01L 51/5072* (2013.01); *H01L 51/5096* (2013.01)

(58) Field of Classification Search
USPC .................... 428/690, 691, 917; 257/40, 88; 252/301.16, 500
See application file for complete search history.

(56) References Cited

FOREIGN PATENT DOCUMENTS

| | | | |
|---|---|---|---|
| JP | 2013-515361 | A | 5/2013 |
| KR | 10-2012-0066390 | A | 6/2012 |
| KR | 10-2014-0000617 | A | 1/2014 |
| WO | WO 2011-076323 | A1 | 6/2011 |
| WO | WO 2013-051875 | A2 | 4/2013 |

* cited by examiner

ORGANIC LIGHT EMITTING ELEMENT AND ORGANIC LIGHT EMITTING DISPLAY DEVICE INCLUDING THE SAME

CROSS-REFERENCE TO RELATED APPLICATION

Korean Patent Application No. 10-2014-0086977 filed on Jul. 10, 2014, in the Korean Intellectual Property Office, and entitled: "Organic Light Emitting Diode and Organic Light Emitting Display Device Including the Same," is incorporated by reference herein in its entirety.

BACKGROUND

1. Field

Embodiments relate to an organic light emitting element and an organic light emitting device including the same.

2. Description of the Related Art

Recently, lightness and flatness of a monitor, a television, or the like have been demanded, and a cathode ray tube (CRT) has been largely replaced by a liquid crystal display (LCD) according to the demand. However, the liquid crystal display, which is a light receiving element, may require a separate backlight, and may have a limitation in response speed, viewing angle, and the like.

As a display device capable of overcoming the aforementioned limitation, an organic light emitting device, which is a self-emitting display element having advantages of a wide viewing angle, excellent contrast, and a fast response time, has been considered.

In the organic light emitting diode display, an electron injected from one electrode and a hole injected from another electrode may be coupled with each other in the organic emission layer to generate an exciton, and the exciton may emit energy to emit light.

The above information disclosed in this Background section is only for enhancement of understanding of the background and therefore it may contain information that does not form the prior art that is already known in this country to a person of ordinary skill in the art.

SUMMARY

Embodiments are directed to an organic light emitting element and an organic light emitting device including the same.

A first compound represented by Chemical Formula 1 and a second compound represented by Chemical Formula 2 according to an exemplary embodiment may be provided.

[Chemical Formula 1]

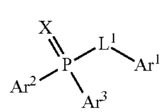

In Chemical Formula 1,

X may be one selected from a group consisting of S, O, and Se, $L^1$ may be an independent single bond, or a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic, $Ar^1$ to $Ar^3$ are equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic.

[Chemical Formula 2]

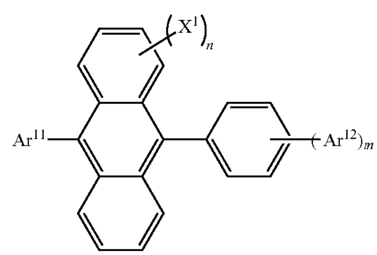

wherein, in Chemical Formula 2, $Ar^{11}$ denotes a substituted or unsubstituted C6 to C30 aryl group or a substituted or unsubstituted C6 to C30 heteroaryl group, m denotes an integer of 0 to 3, $Ar^1$ denotes a substituted or unsubstituted C5 to C30 aryl group or a substituted or unsubstituted C5 to C30 heteroaryl group, when m is 2 or more, each $Ar^{12}$ may be equal to or different from one another, $X^1$ denotes hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C60 arylsilyl group, a substituted or unsubstituted ring-type C6 to C30 aromatic hydrocarbon group, a substituted or unsubstituted C6 to C30 condensed aromatic hydrocarbon group, a substituted or unsubstituted ring-type C2 to C30 aromatic heterocyclic ring-type group, or a substituted or unsubstituted C2 to C30 condensed aromatic heterocyclic ring-type group, n is an integer of 0 to 8, and when n is 2 or more, each $X^1$ is equal to or different from one another.

The organic light emitting element may include: an anode and a cathode facing each other; an emission layer provided between the anode and the cathode; a hole transfer layer provided between the anode and the emission layer; and an electron transfer layer provided between the cathode and the emission layer, wherein the electron transfer layer may include the first compound, and the emission layer may include the second compound.

The electron transfer layer may further include lithium quinolate (Liq).

the first compound is a compound represented by Chemical Formula 3:

[Chemical Formula 3]

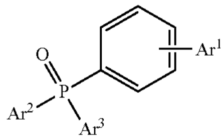

wherein, in Chemical Formula 3, $Ar^1$ to $Ar^3$ are equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic.

The first compound may include one selected from a group consisting of compounds represented by Chemical Formula 1-1 to Chemical Formula 1-188:

(1-1)

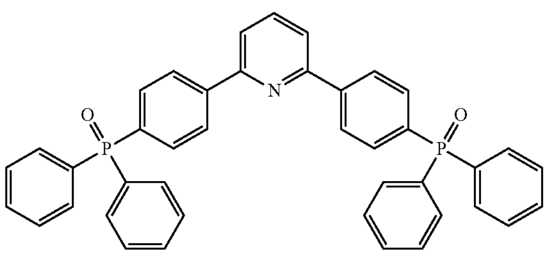

(1-2)

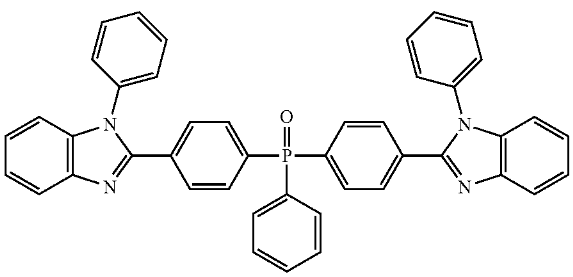

(1-3)

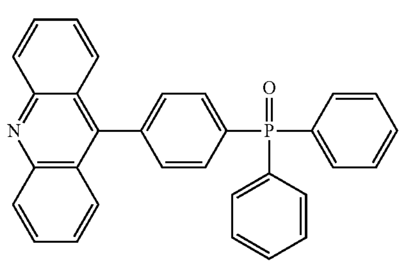

-continued (1-4)

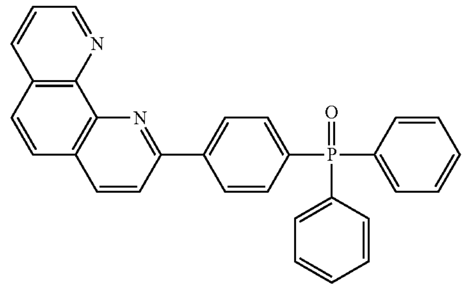

(1-5)

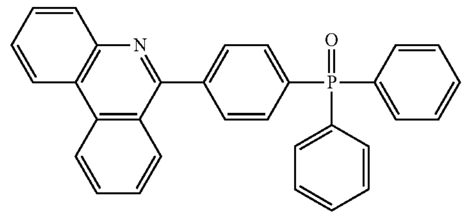

(1-6)

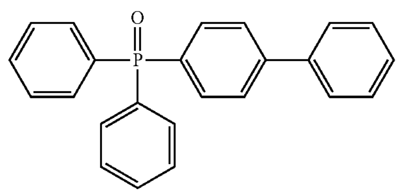

(1-7)

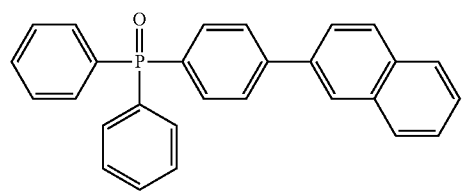

(1-8)

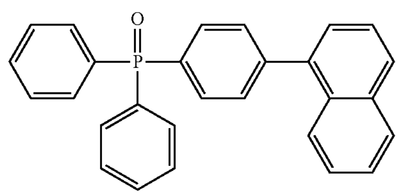

(1-9)

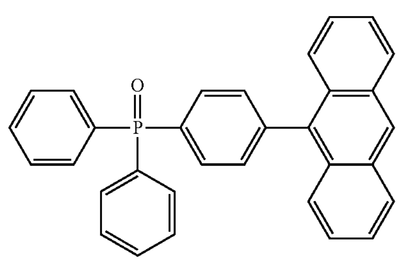

(1-10)

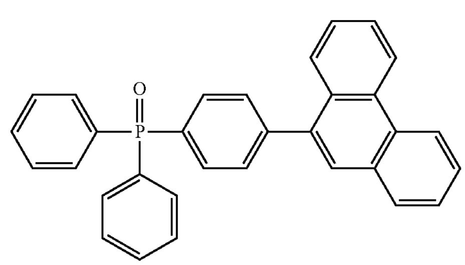

-continued
(1-11)
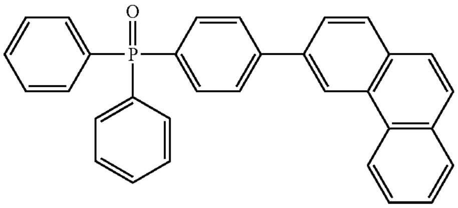
(1-12)
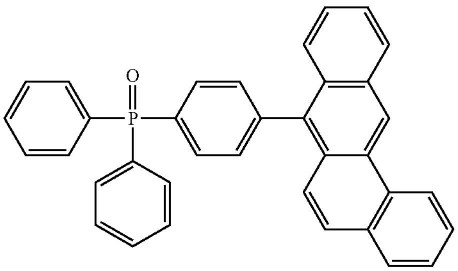
(1-13)
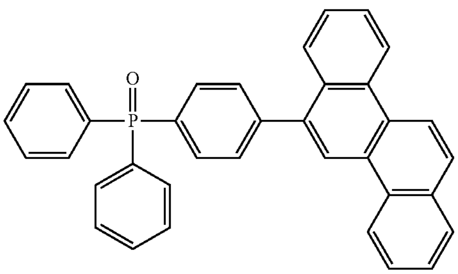
(1-14)
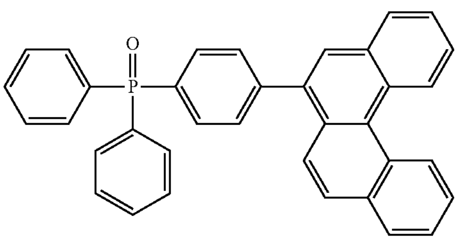
(1-15)
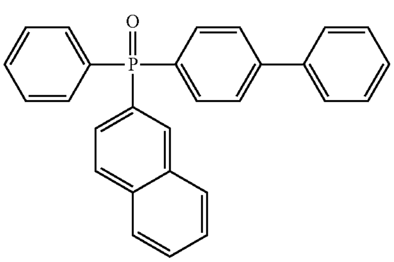
(1-16)
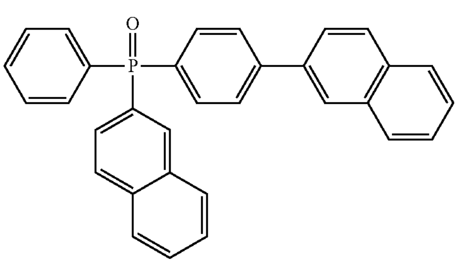
-continued
(1-17)
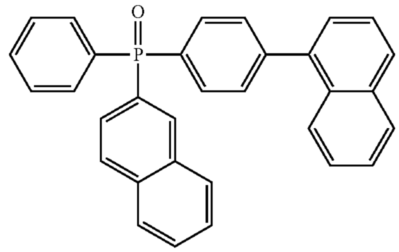
(1-18)
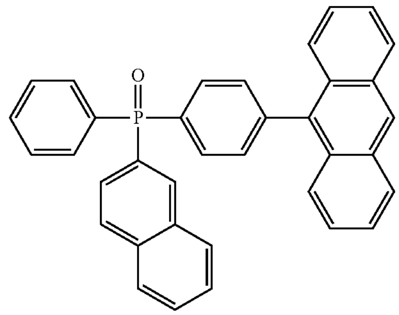
(1-19)
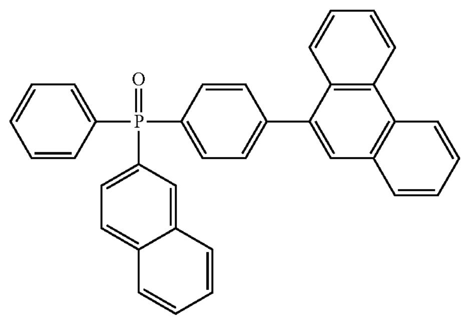
(1-20)
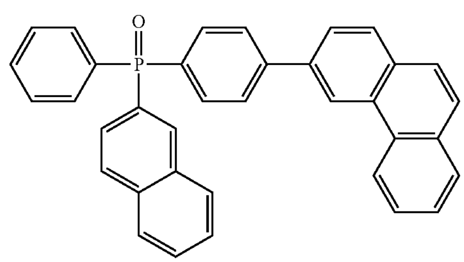
(1-21)
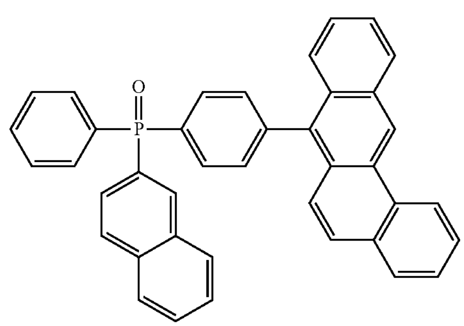

-continued
(1-22)
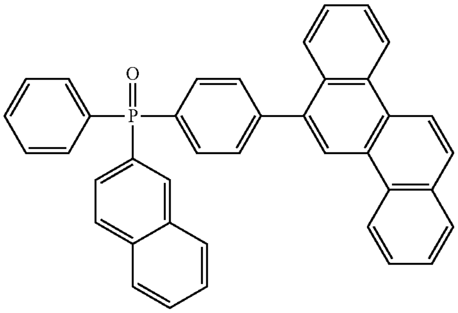
(1-23)
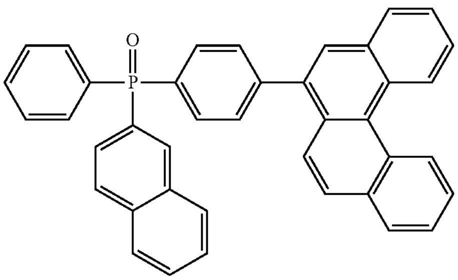
(1-24)
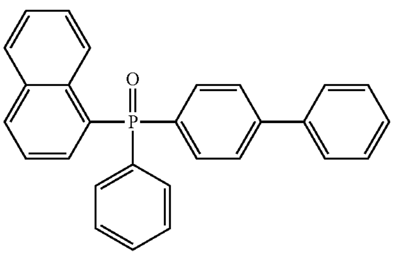
(1-25)
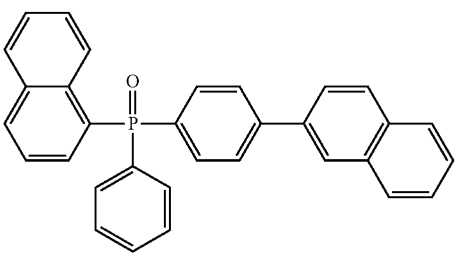
(1-26)
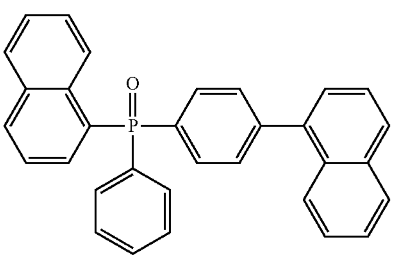
(1-27)
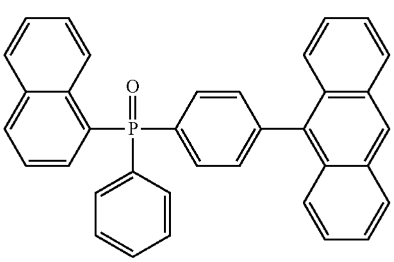
-continued
(1-28)
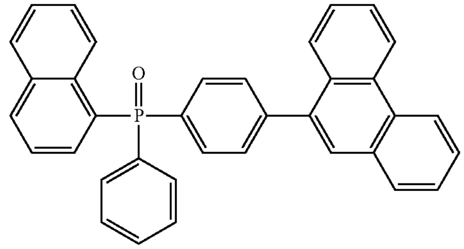
(1-29)
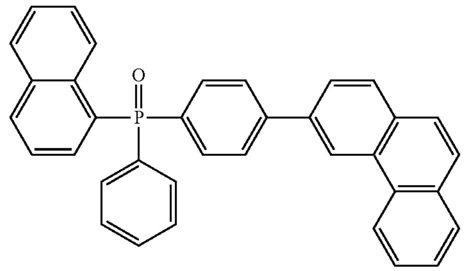
(1-30)
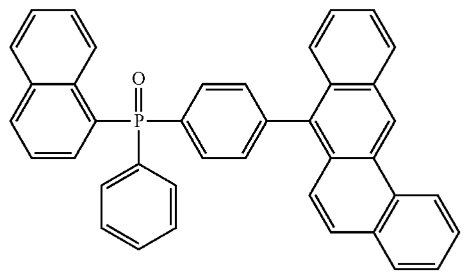
(1-31)
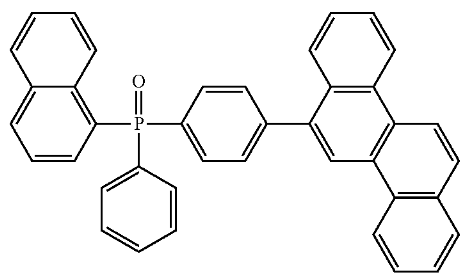
(1-32)
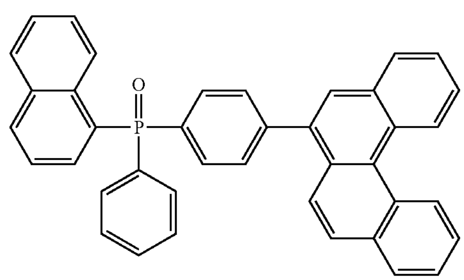
(1-33)
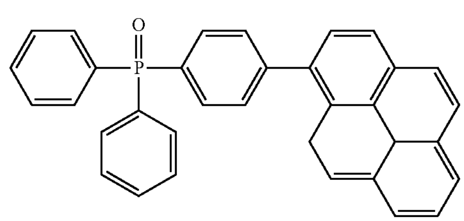

-continued
(1-34)
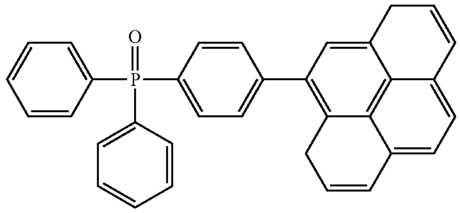
(1-35)
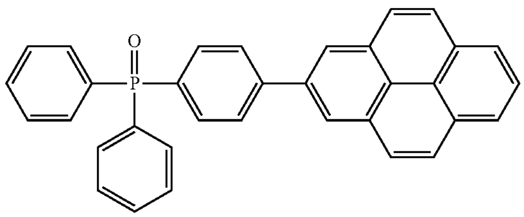
(1-36)
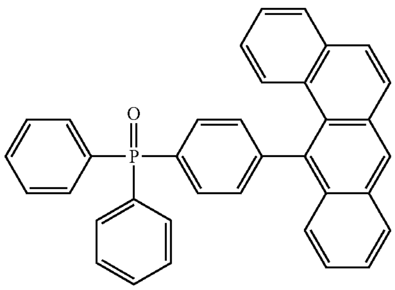
(1-37)
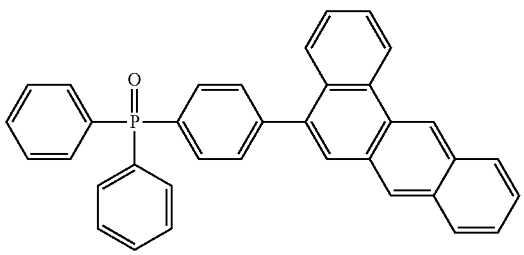
(1-38)
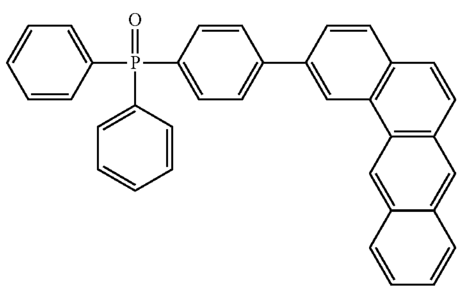
(1-39)
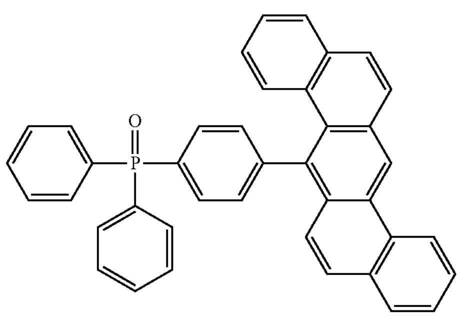
-continued
(1-40)
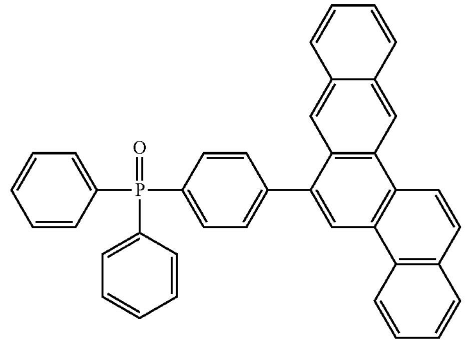
(1-41)
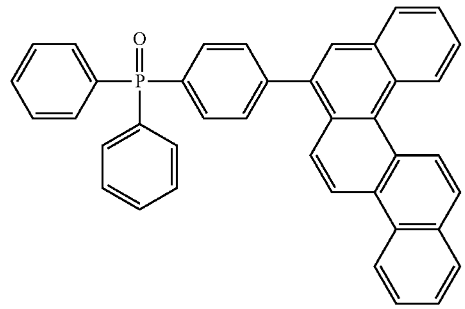
(1-42)
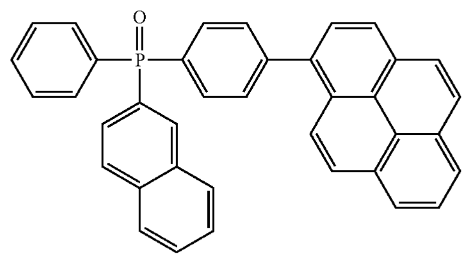
(1-43)
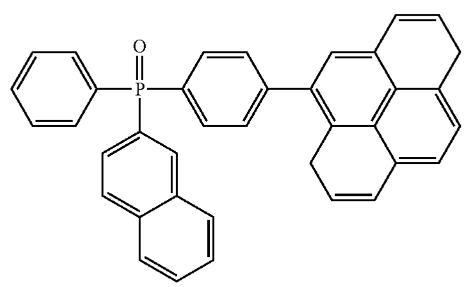
(1-44)
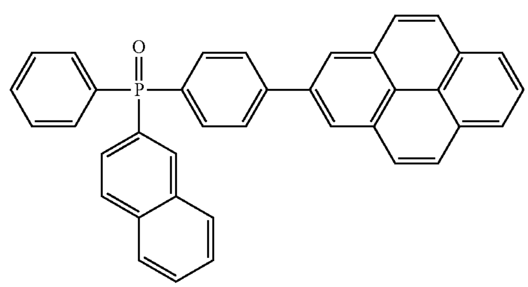

-continued
(1-45)
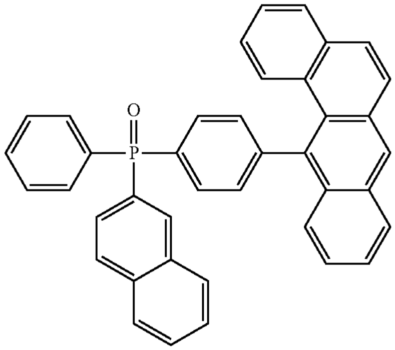
(1-46)
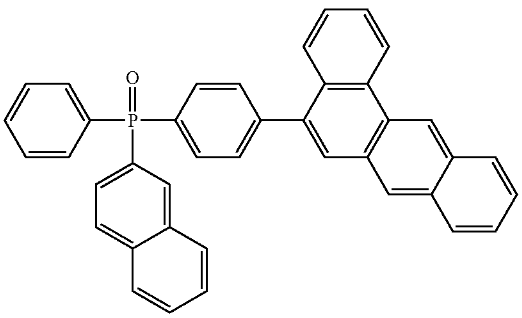
(1-47)
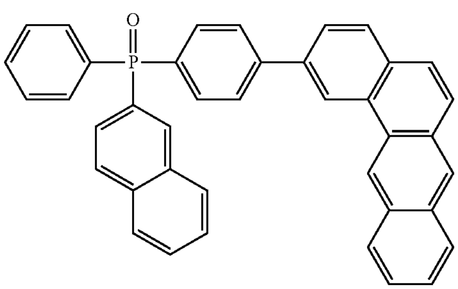
(1-48)
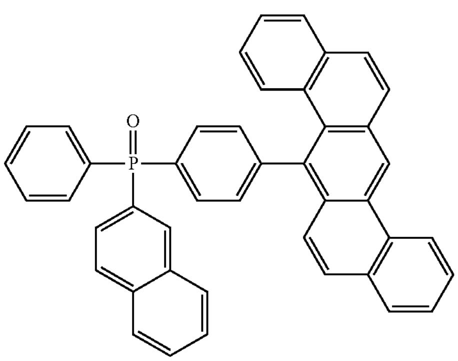
-continued
(1-49)
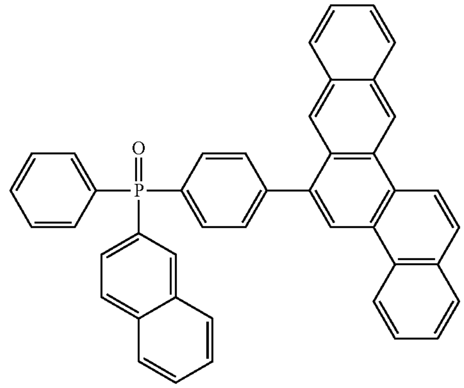
(1-50)
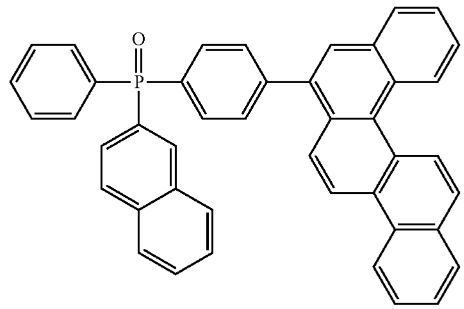
(1-51)
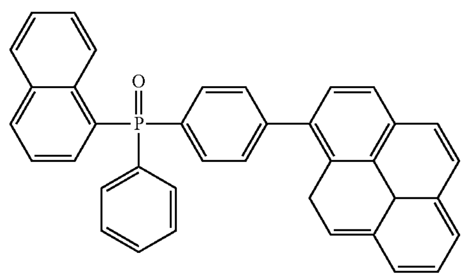
(1-52)
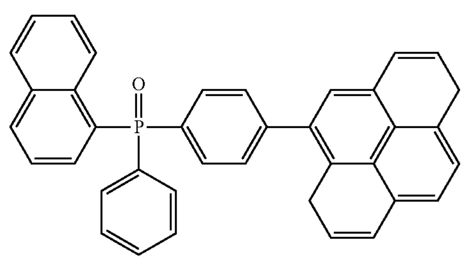
(1-53)
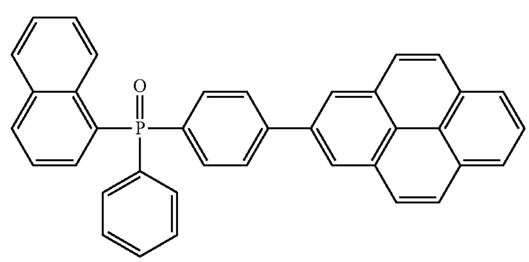

-continued
(1-54)
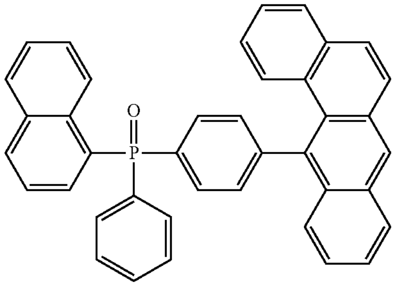
(1-55)
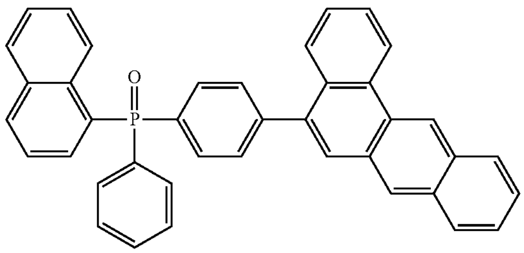
(1-56)
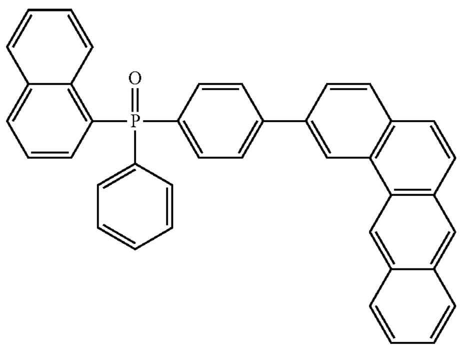
(1-57)
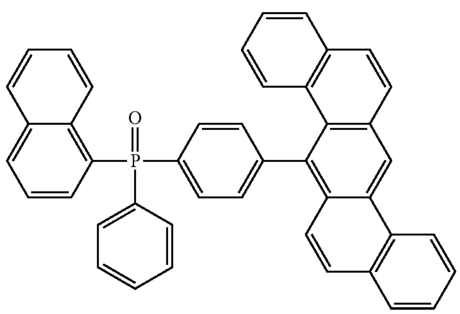
(1-58)
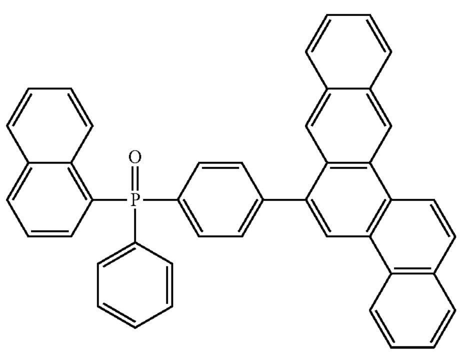
-continued
(1-59)
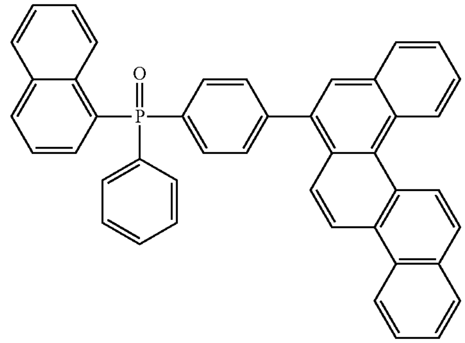
(1-60)
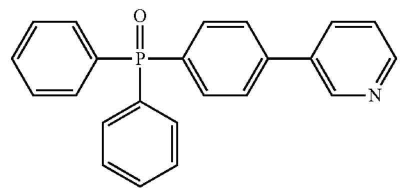
(1-61)
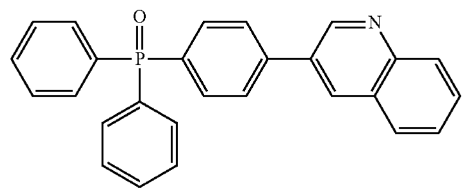
(1-62)
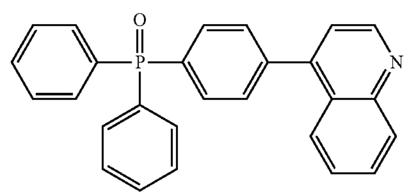
(1-63)
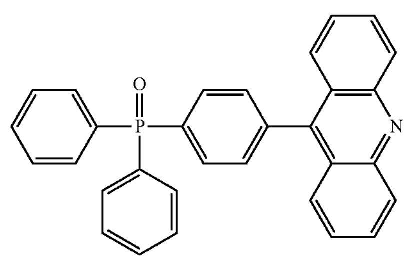
(1-64)
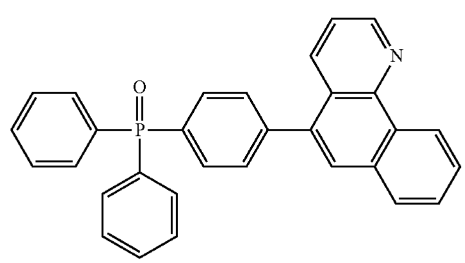

-continued
(1-65)
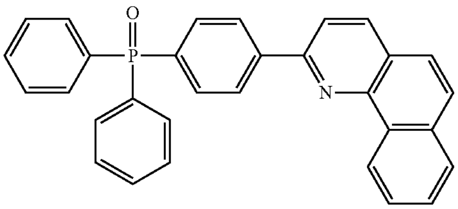
(1-66)
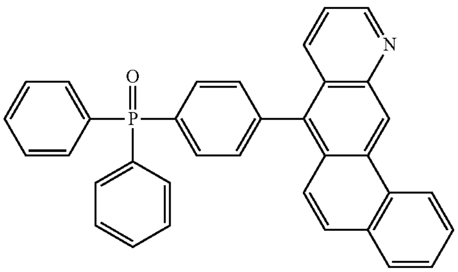
(1-67)
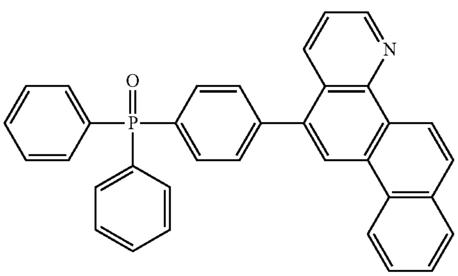
(1-68)
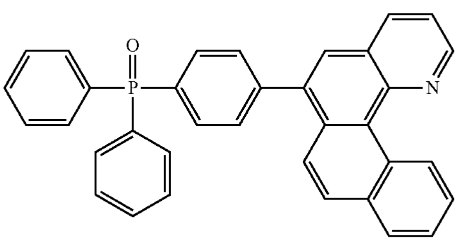
(1-69)
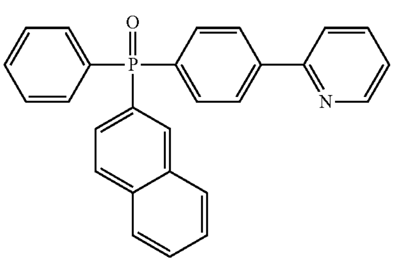
(1-70)
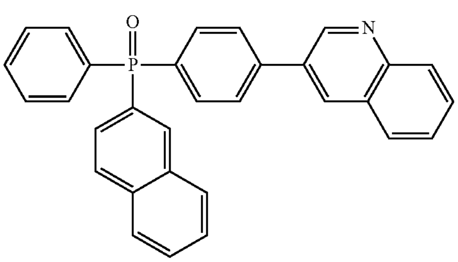
-continued
(1-71)
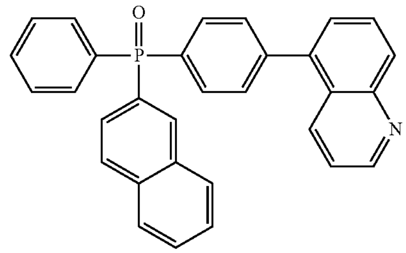
(1-72)
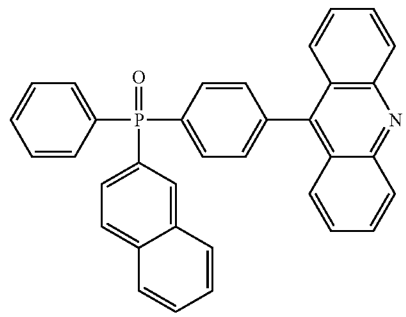
(1-73)
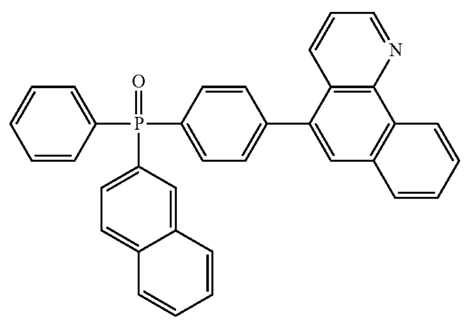
(1-74)
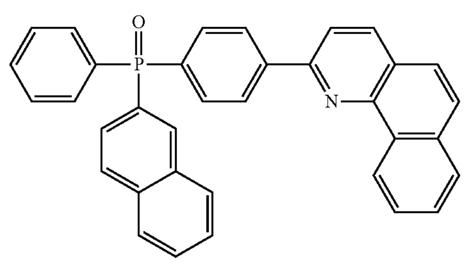
(1-75)
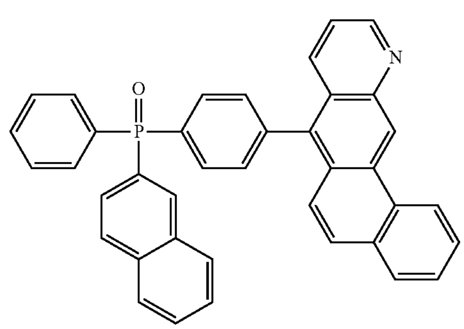

-continued
(1-76)
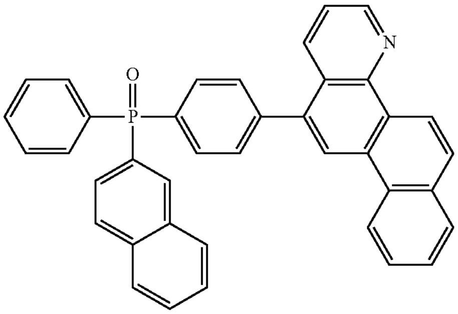
(1-77)
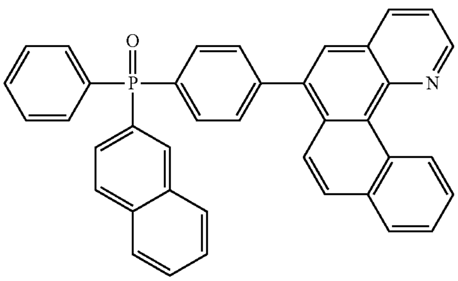
(1-78)
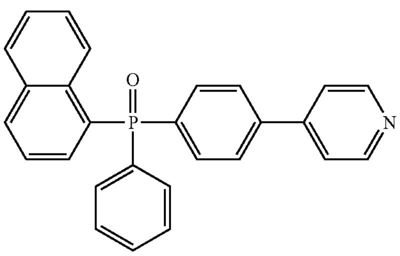
(1-79)
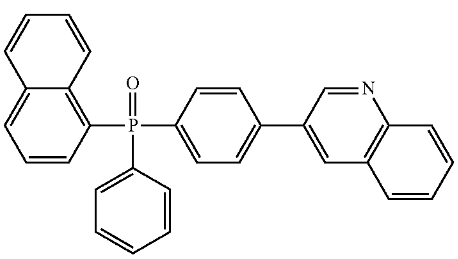
(1-80)
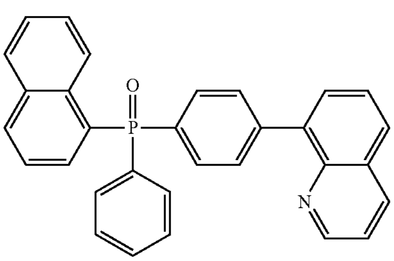
(1-81)
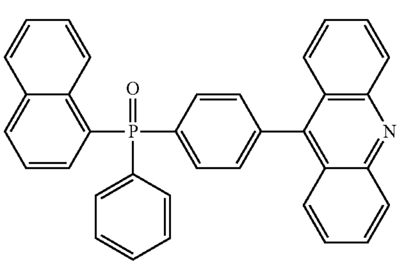
-continued
(1-82)
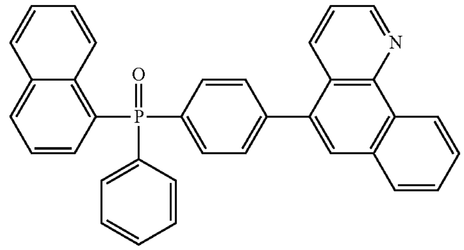
(1-83)
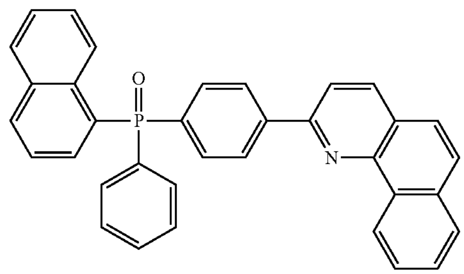
(1-84)
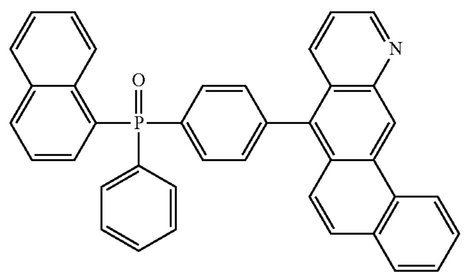
(1-85)
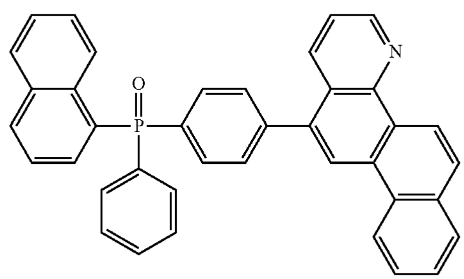
(1-86)
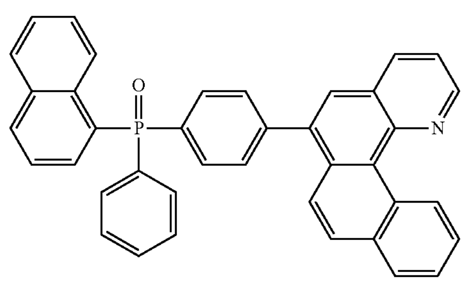
(1-87)
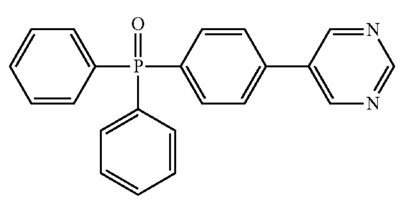

-continued
(1-88)
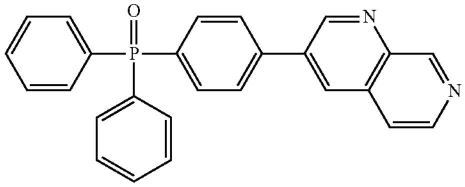
(1-89)
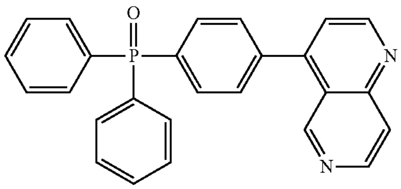
(1-90)
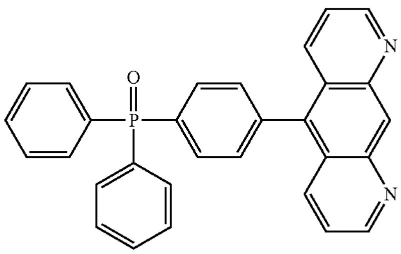
(1-91)
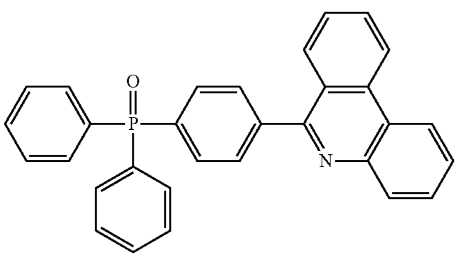
(1-92)
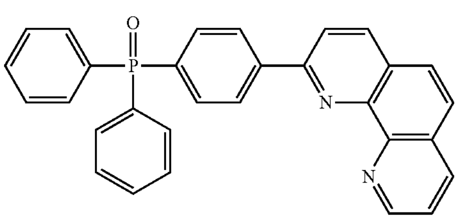
(1-93)
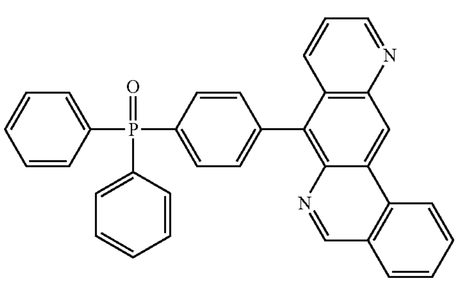
-continued
(1-94)
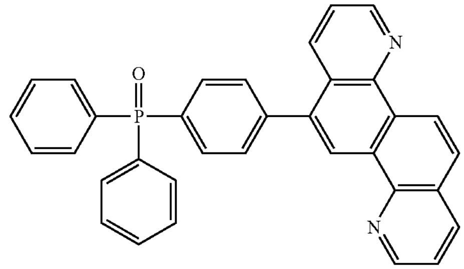
(1-95)
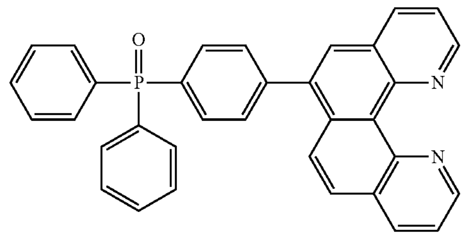
(1-96)
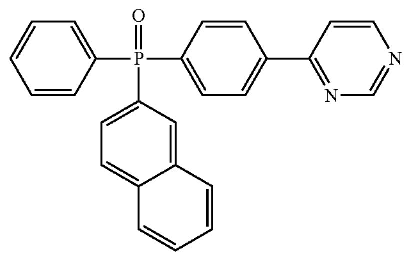
(1-97)
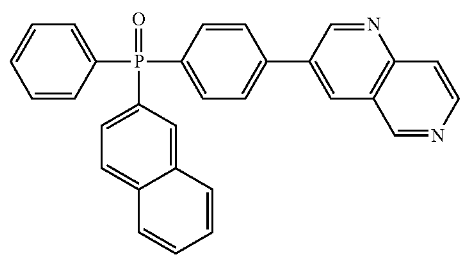
(1-98)
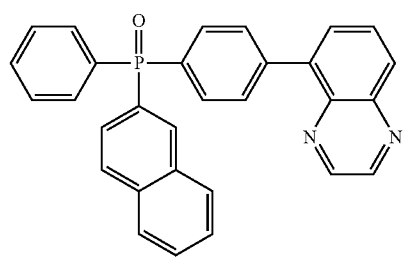
(1-99)
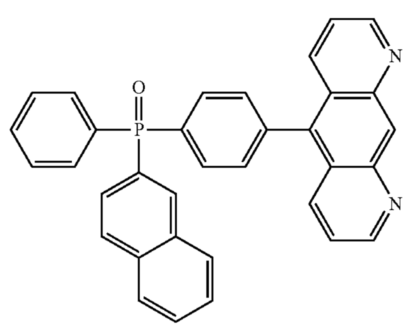

-continued
(1-100)
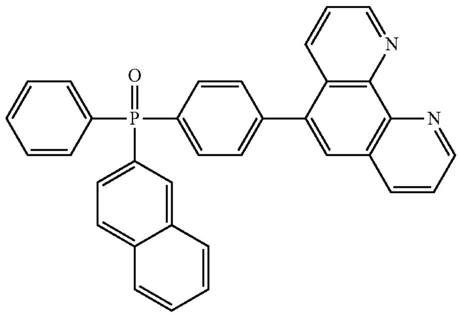
(1-101)
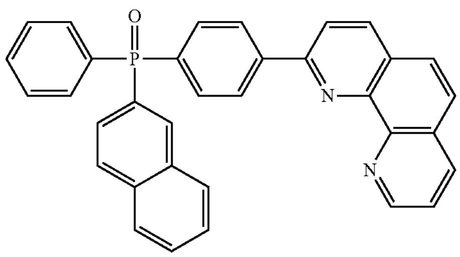
(1-102)
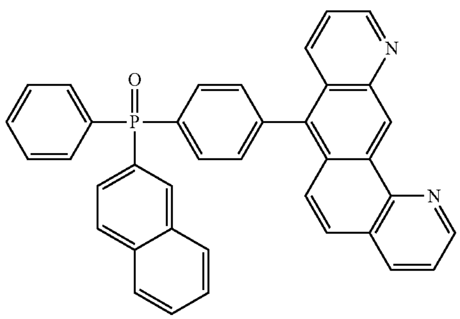
(1-103)
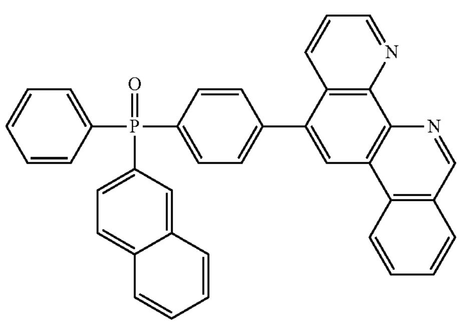
(1-104)
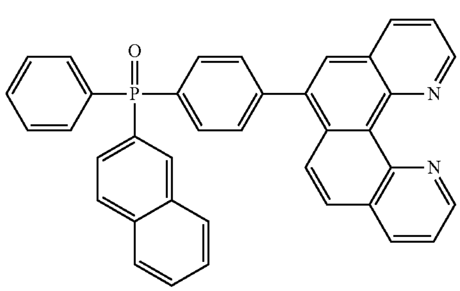
-continued
(1-105)
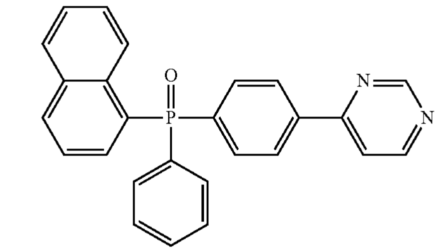
(1-106)
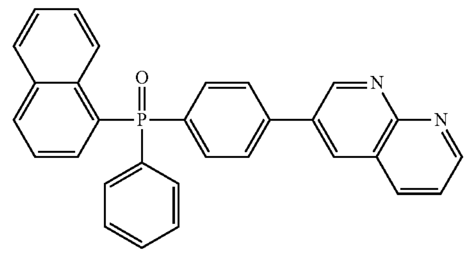
(1-107)
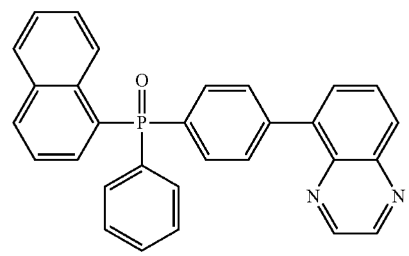
(1-108)
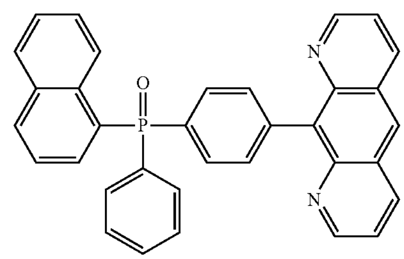
(1-109)
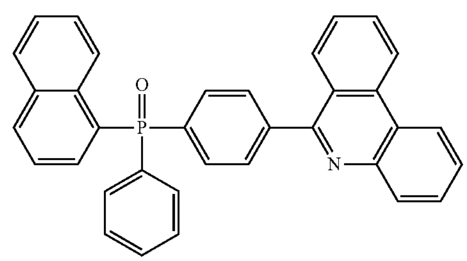
(1-110)
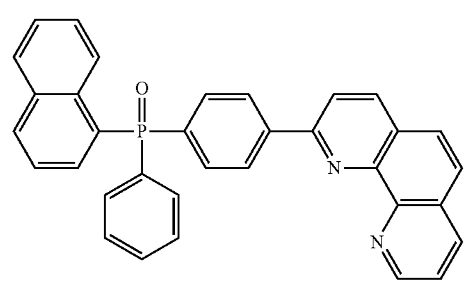

-continued
(1-111)
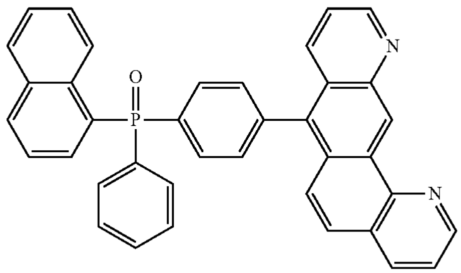
(1-112)
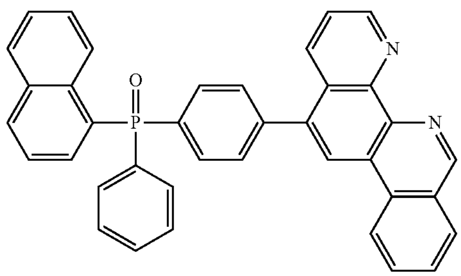
(1-113)
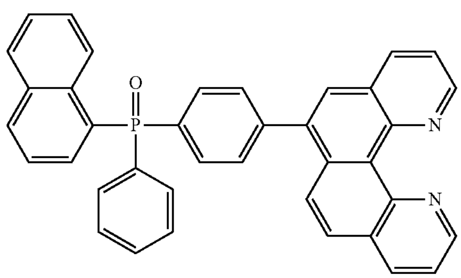
(1-114)
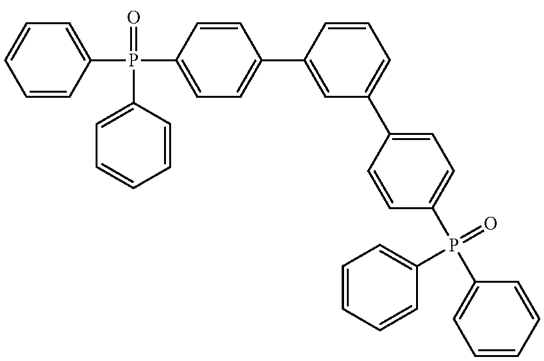
(1-115)
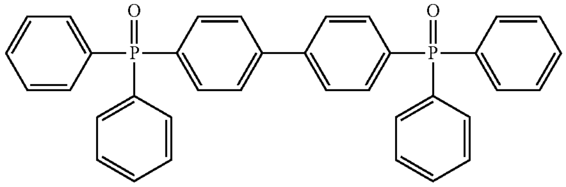
-continued
(1-116)
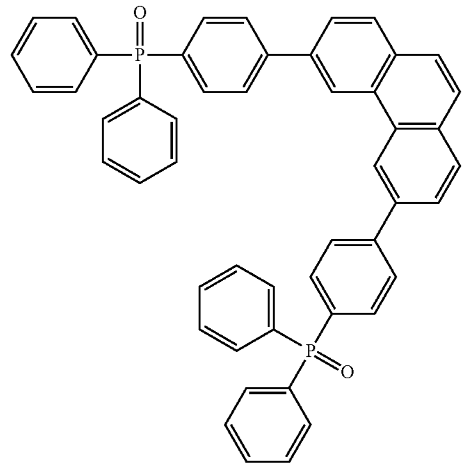
(1-117)
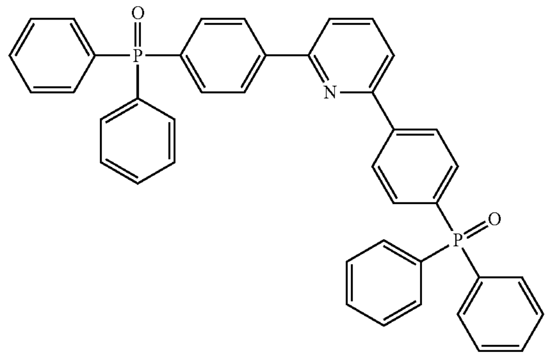
(1-118)
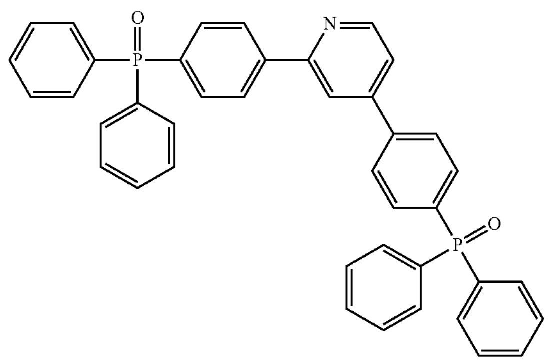
(1-119)
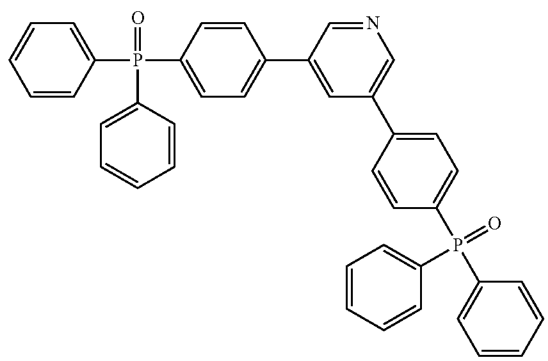

-continued
(1-120)
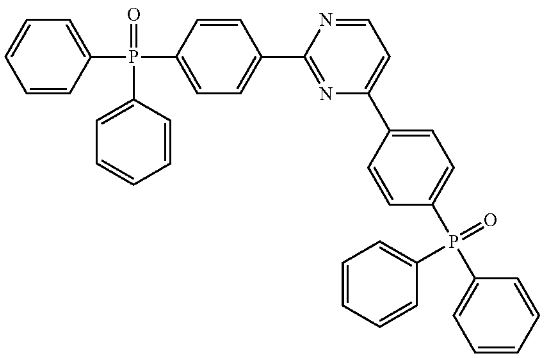
(1-121)
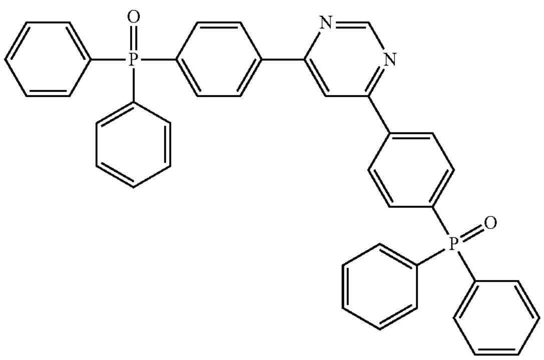
(1-122)
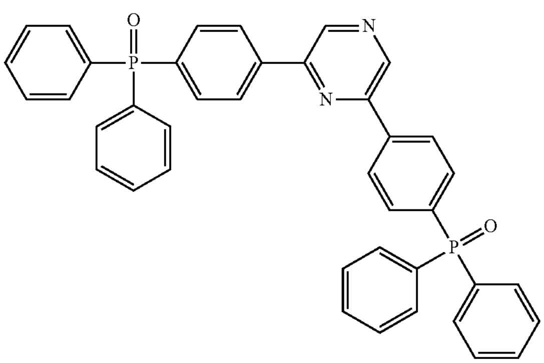
(1-123)
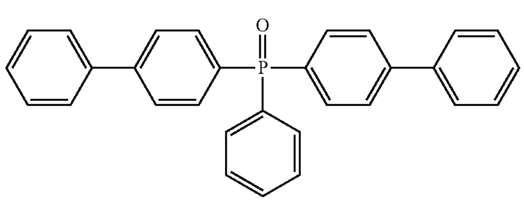
(1-124)
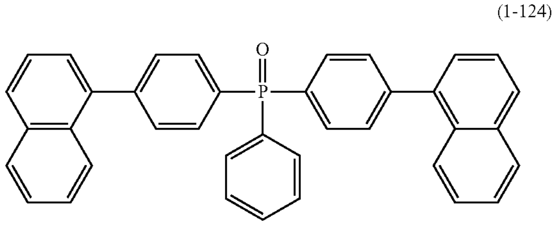
-continued
(1-125)
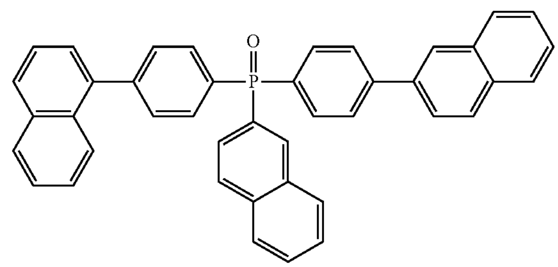
(1-126)
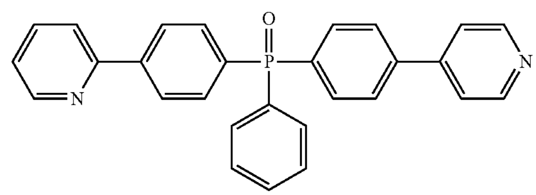
(1-127)
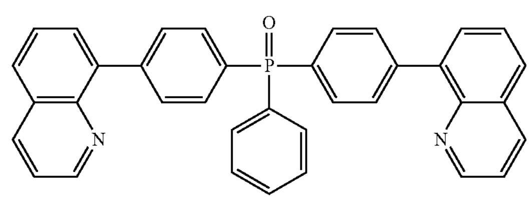
(1-128)
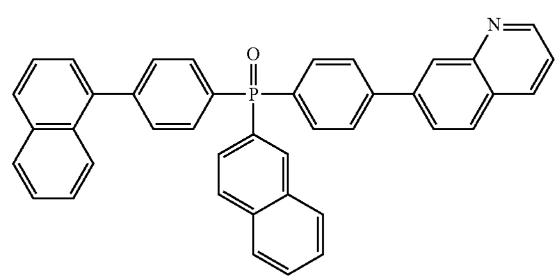
(1-129)
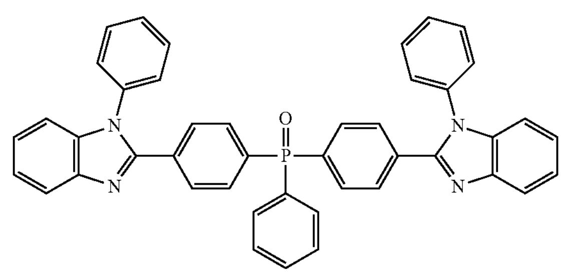
(1-130)
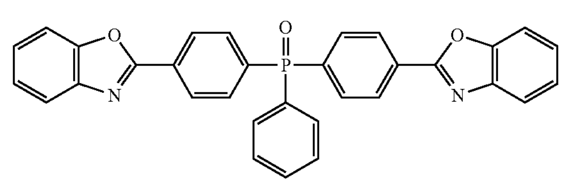

-continued
(1-131)
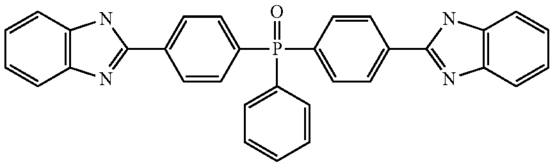
(1-132)
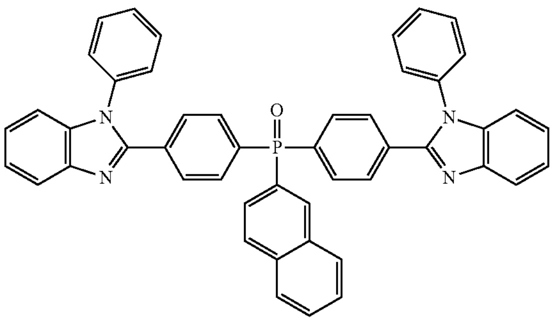
(1-133)
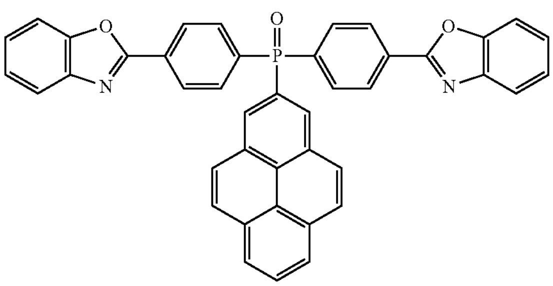
(1-134)
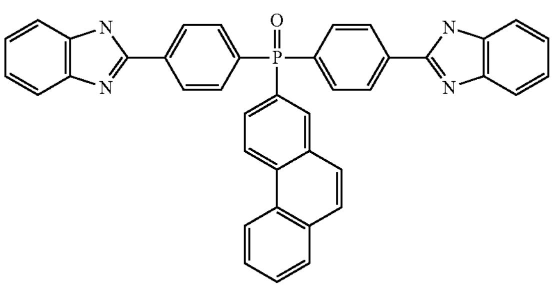
(1-135)
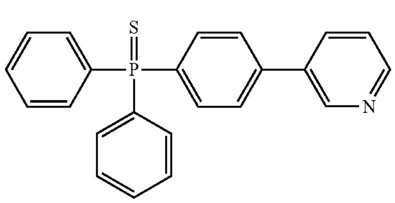
(1-136)
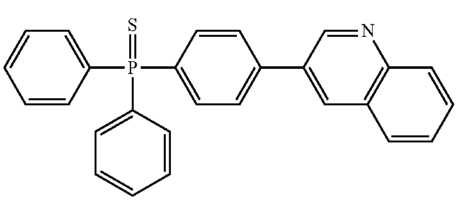
-continued
(1-137)
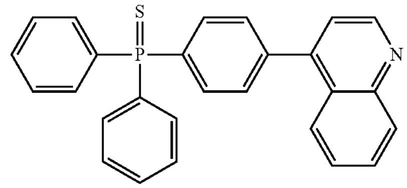
(1-138)
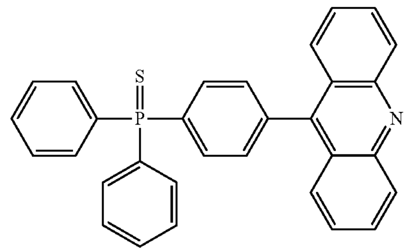
(1-139)
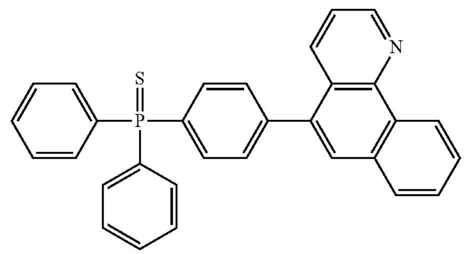
(1-140)
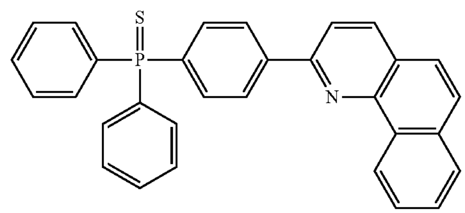
(1-141)
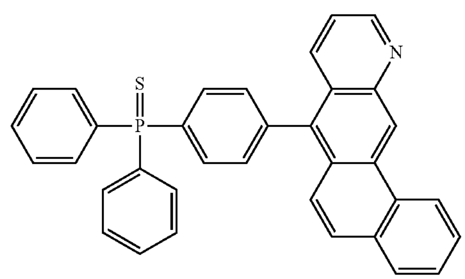
(1-142)
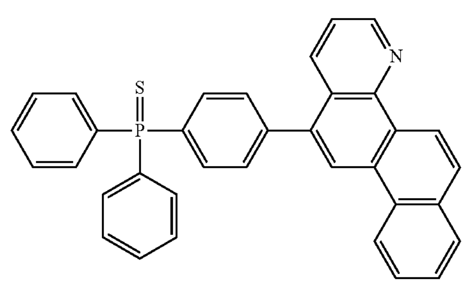

-continued
(1-143)
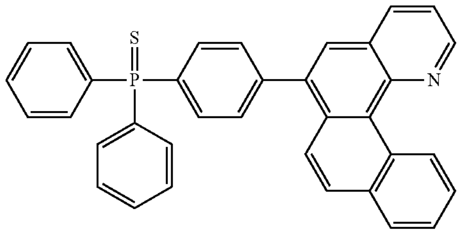
(1-144)
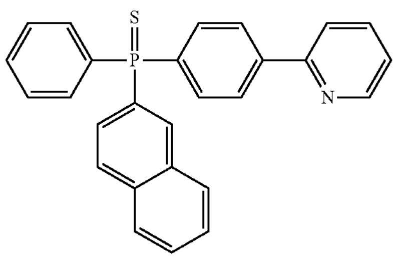
(1-145)
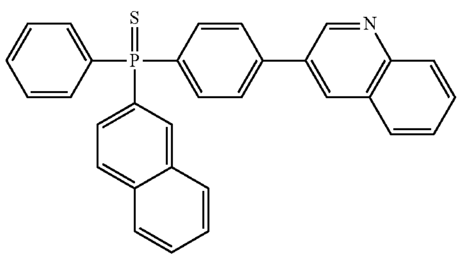
(1-146)
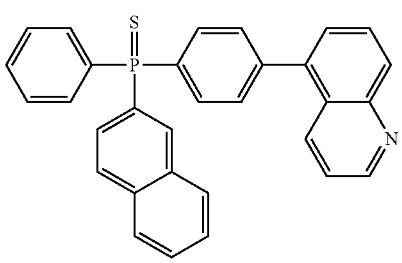
(1-147)
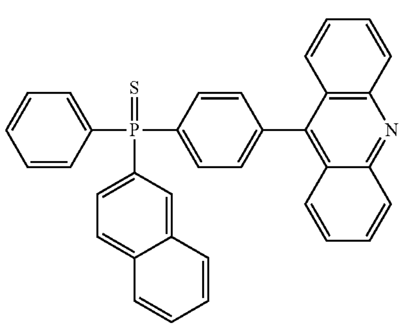
-continued
(1-148)
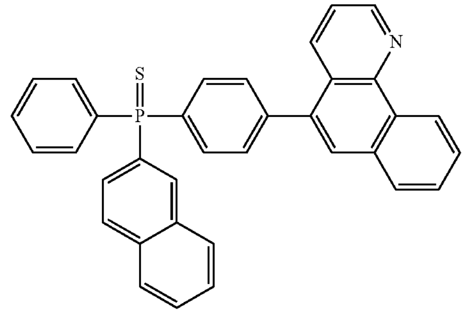
(1-149)
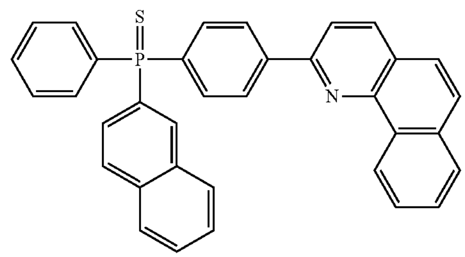
(1-150)
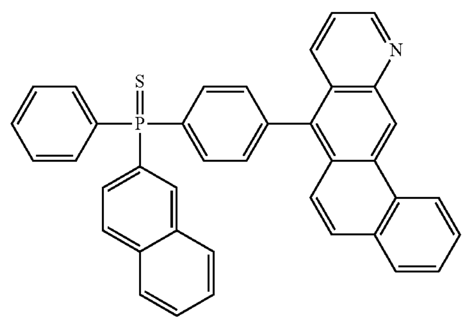
(1-151)
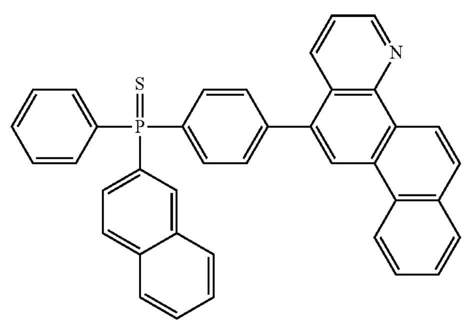
(1-152)
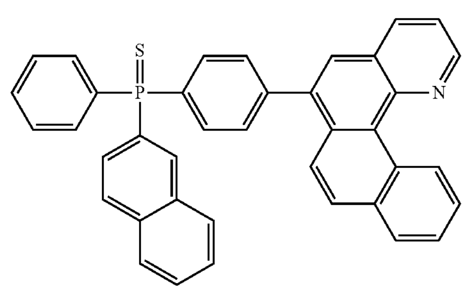

-continued
(1-153)
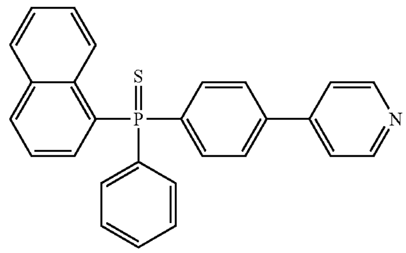
(1-154)
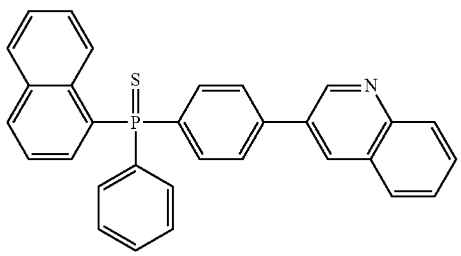
(1-155)
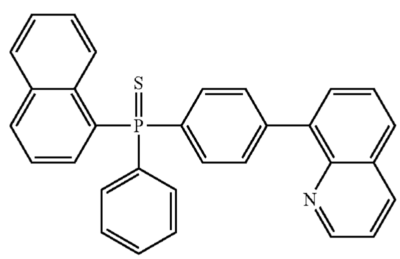
(1-156)
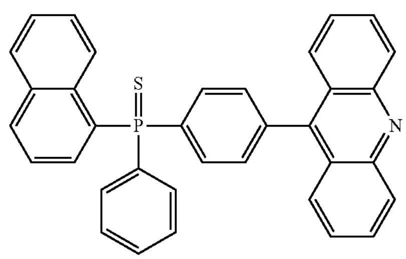
(1-157)
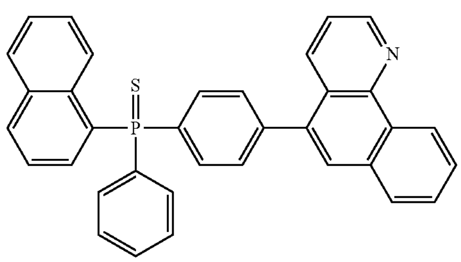
(1-158)
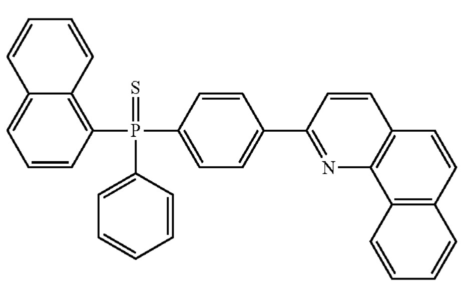
-continued
(1-159)
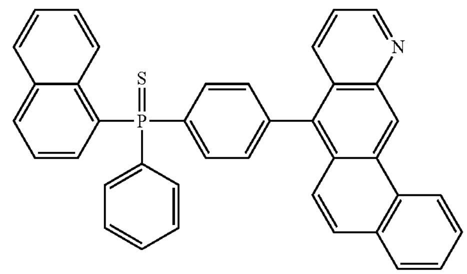
(1-160)
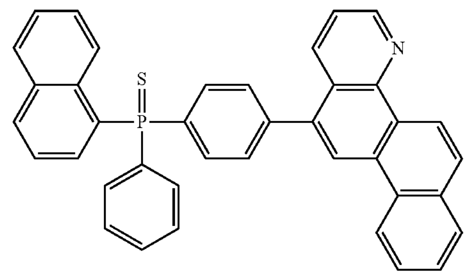
(1-161)
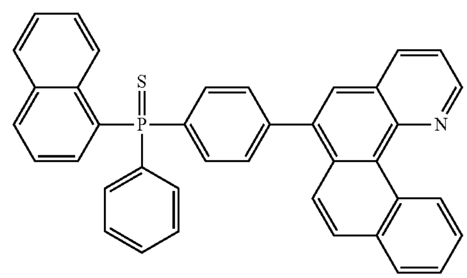
(1-162)
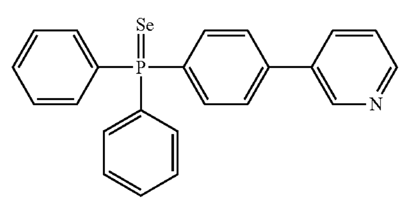
(1-163)
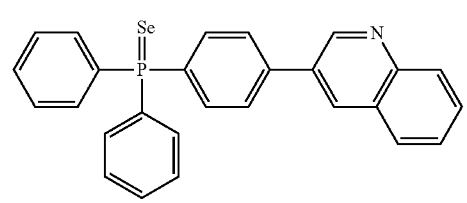
(1-164)
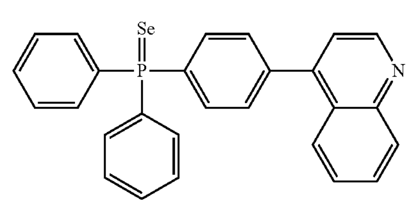

-continued
(1-165)
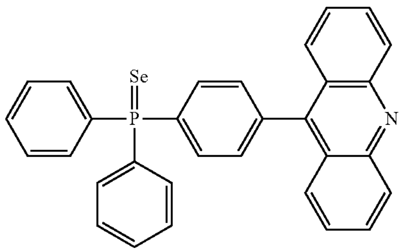
(1-166)
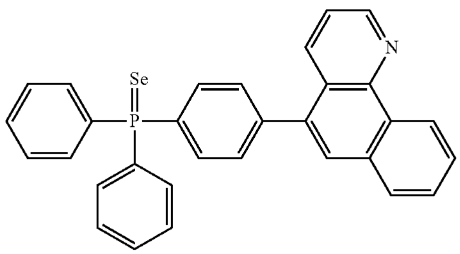
(1-167)
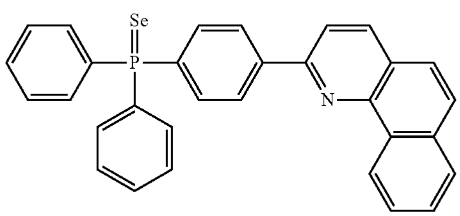
(1-168)
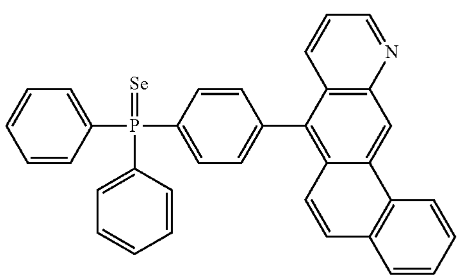
(1-169)
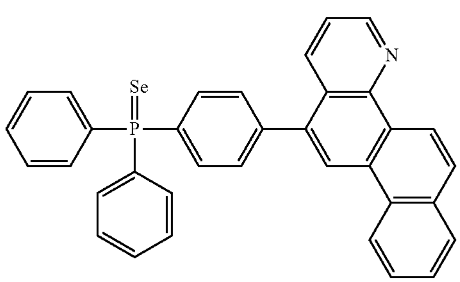
(1-170)
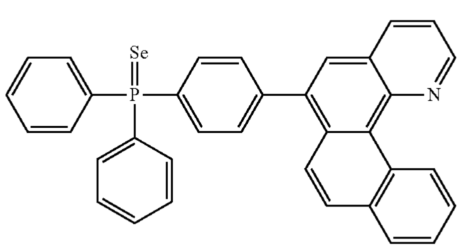
-continued
(1-171)
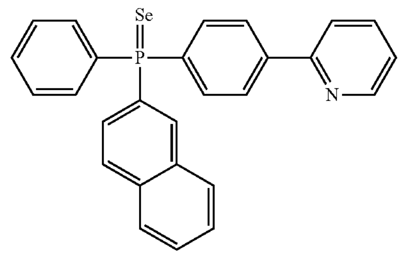
(1-172)
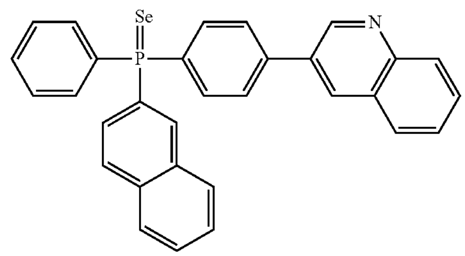
(1-173)
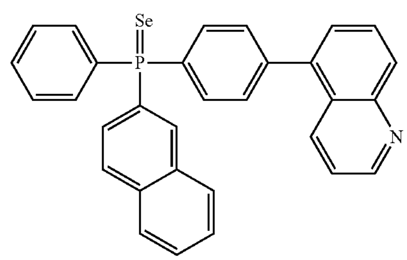
(1-174)
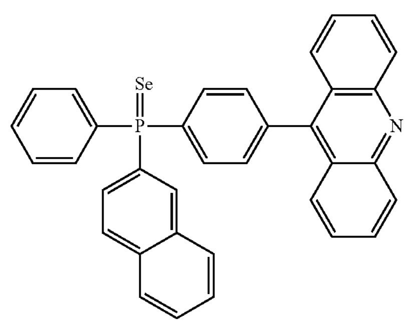
(1-175)
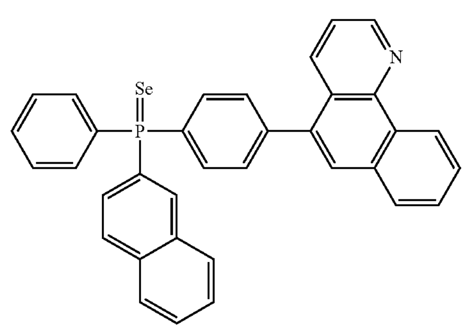

-continued
(1-176)
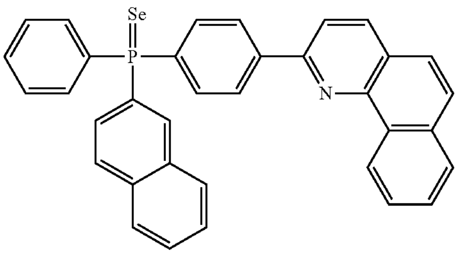
(1-177)
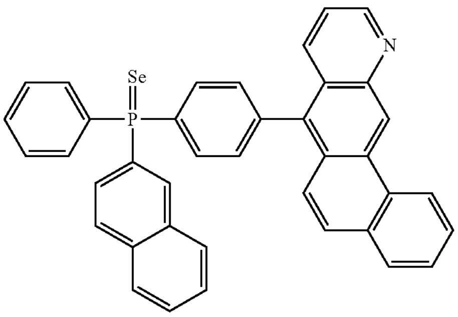
(1-178)
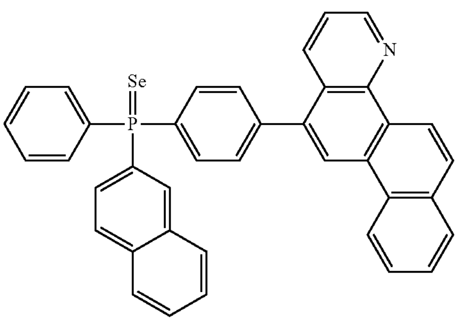
(1-179)
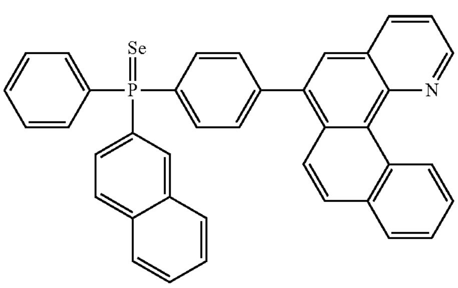
(1-180)
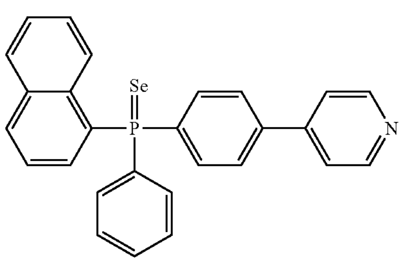
-continued
(1-181)
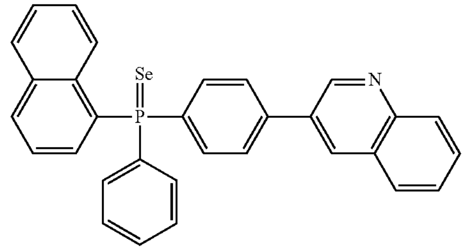
(1-182)
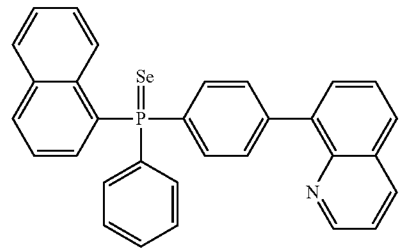
(1-183)
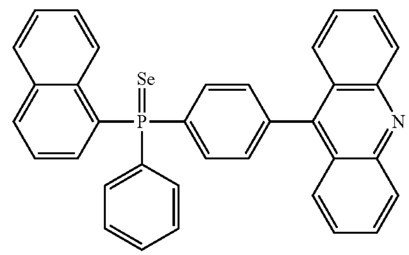
(1-184)
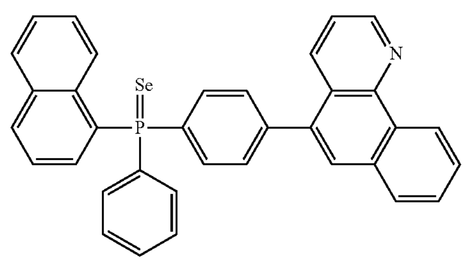
(1-185)
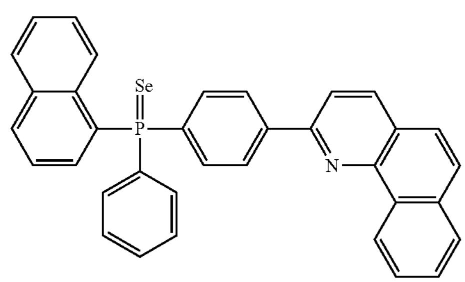

-continued
(1-186)
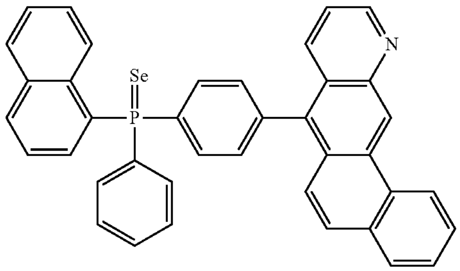
(1-187)
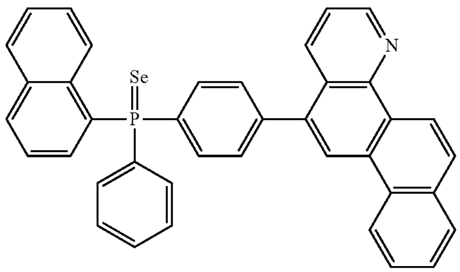
-continued
(1-188)
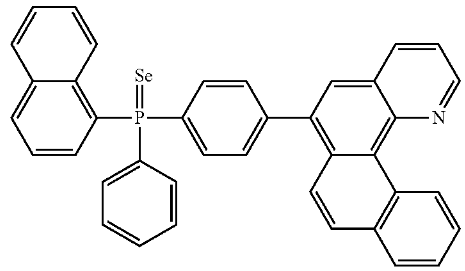
$Ar^{11}$ of the second compound may be a substituted or unsubstituted phenyl group.
The second compound may be one selected from a group consisting of compounds represented by Chemical Formula 2-1 to Chemical Formula 2-147:
(2-1)
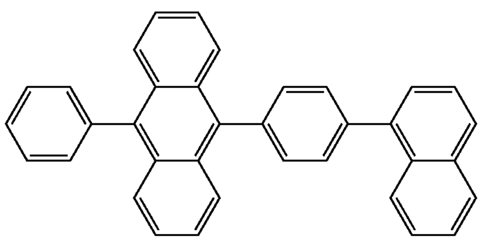
(2-2)
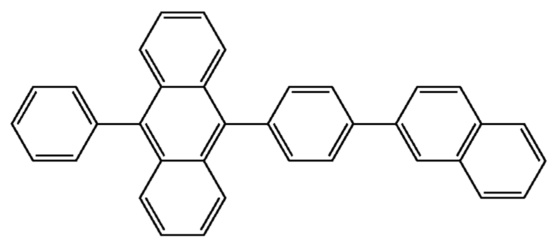
(2-3)
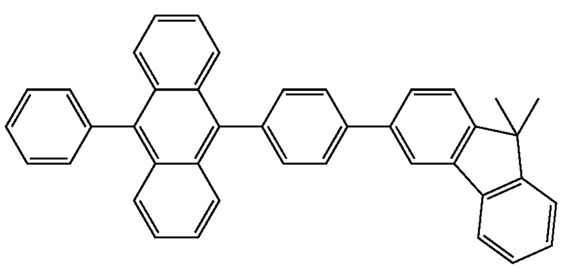
(2-4)
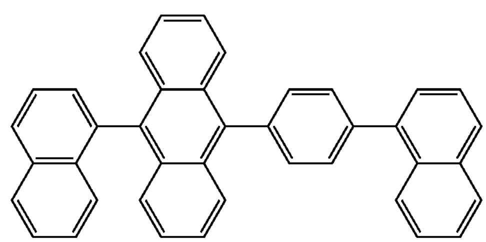
(2-5)
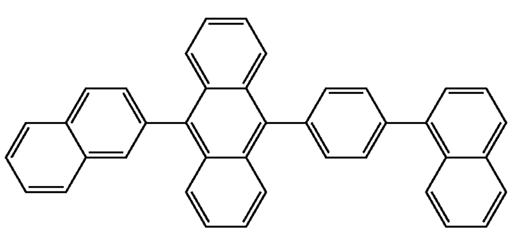
(2-6)
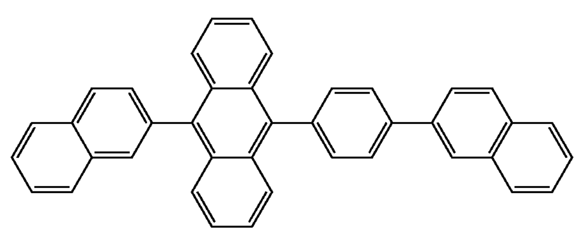
(2-7)
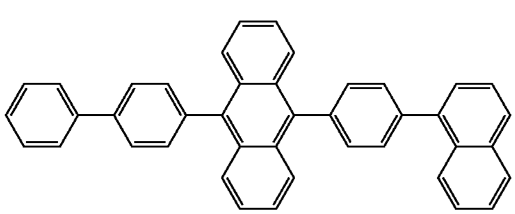
(2-8)
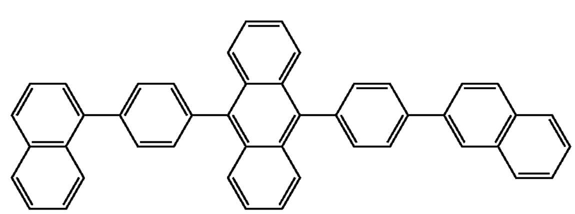

-continued
(2-9)
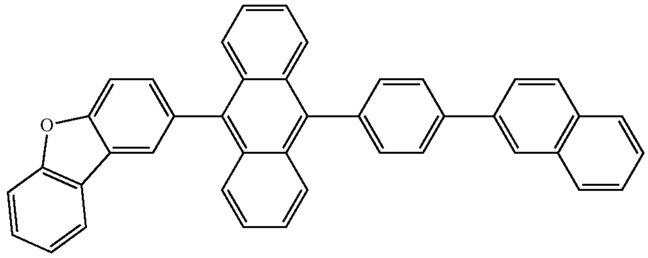
(2-10)
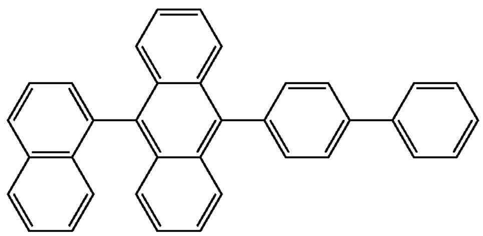
(2-11)
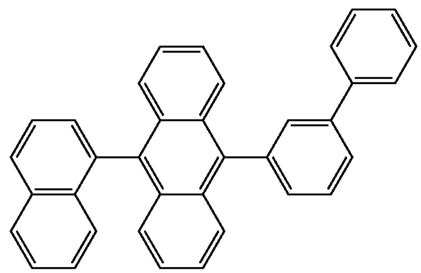
(2-12)
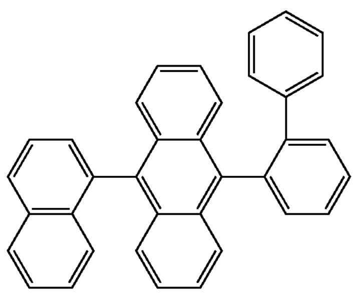
(2-13)
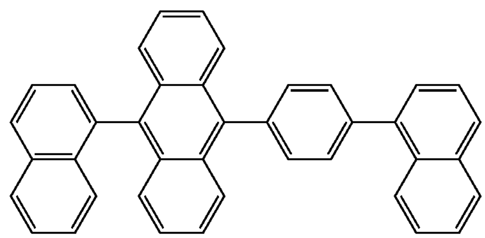
(2-14)
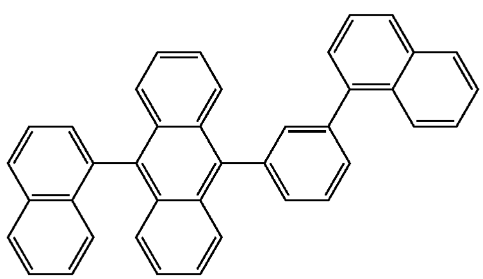
(2-15)
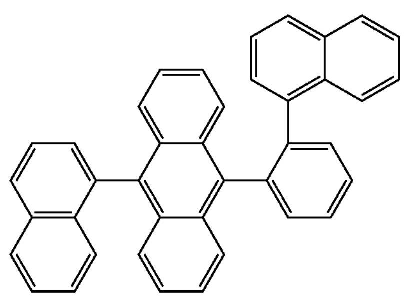
(2-16)
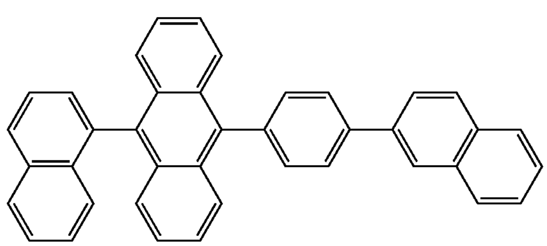
(2-17)
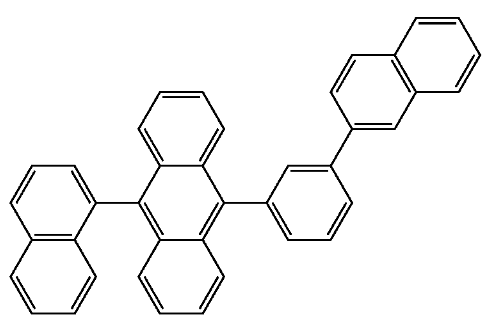

-continued
(2-18)
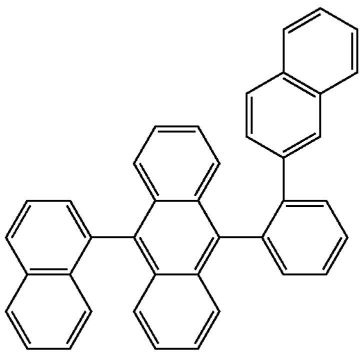
(2-19)
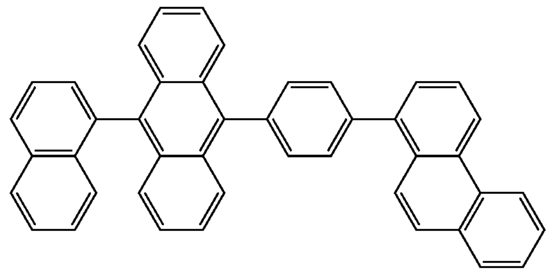
(2-20)
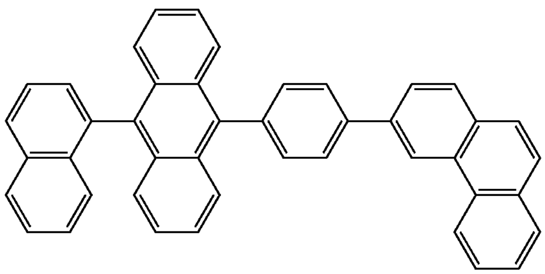
(2-21)
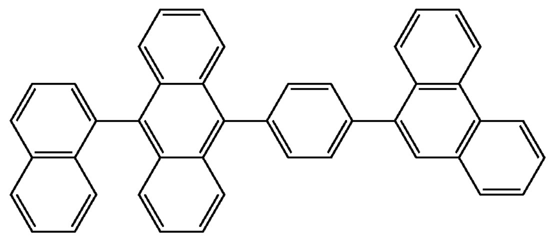
(2-22)
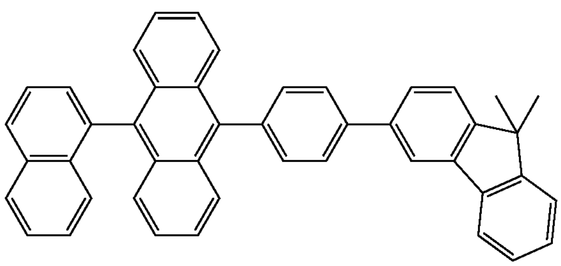
(2-23)
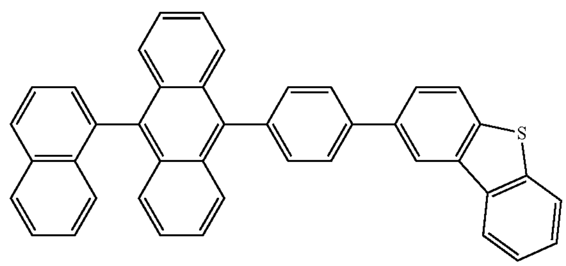
(2-24)
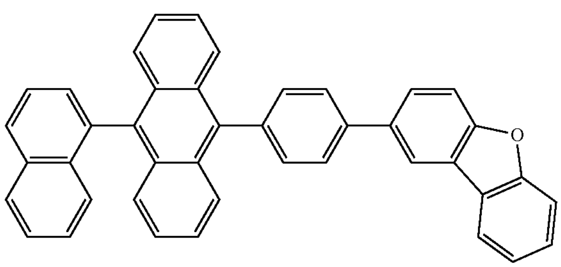
(2-25)
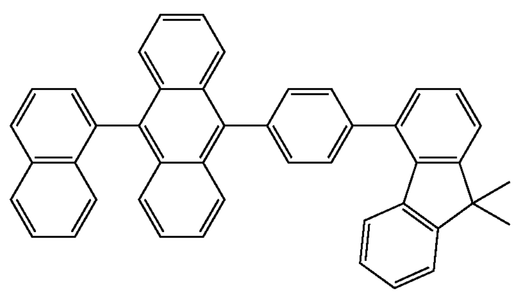
(2-26)
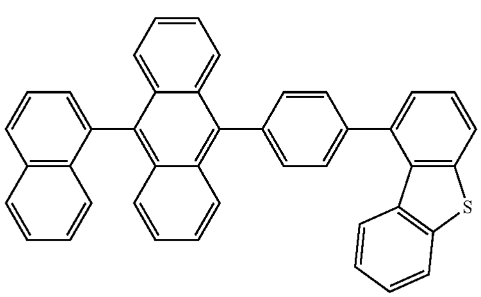
(2-27)
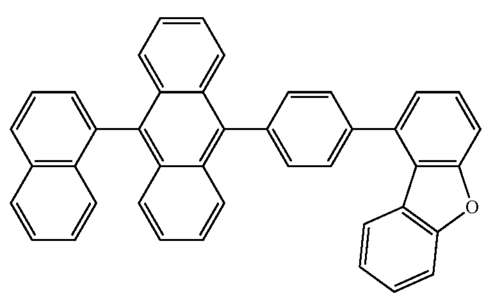

-continued
(2-28)
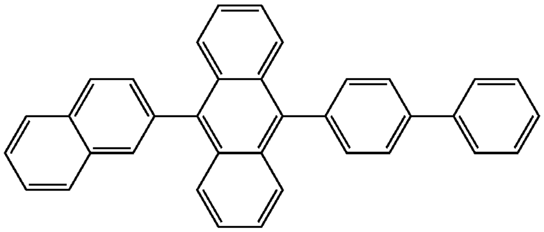
(2-29)
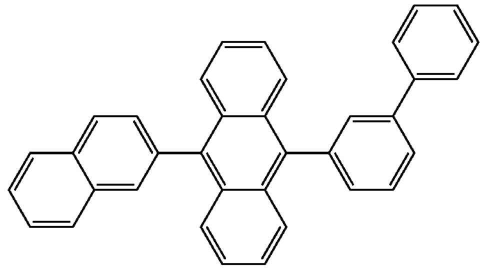
(2-30)
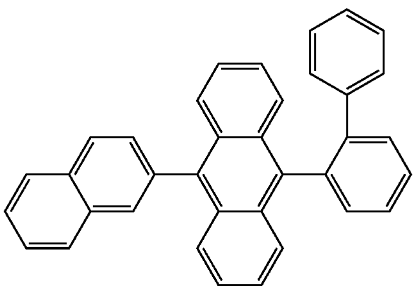
(2-31)
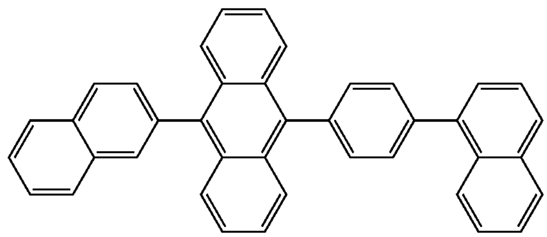
(2-33)
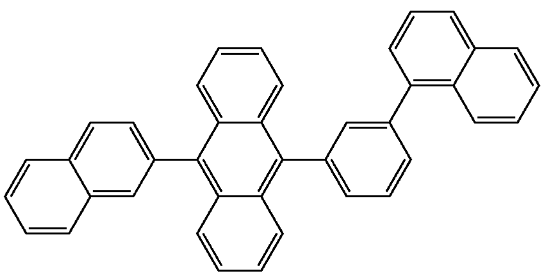
(2-34)
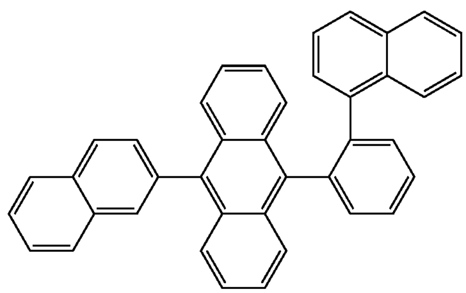
(2-32)
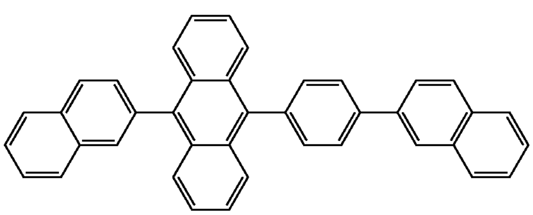
(2-35)
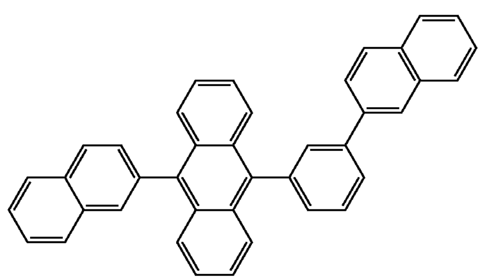
(2-36)
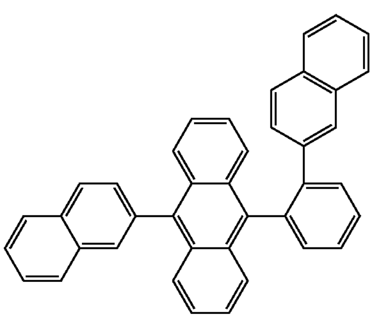
(2-37)
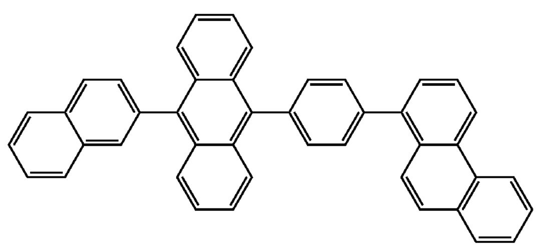

-continued
(2-38)
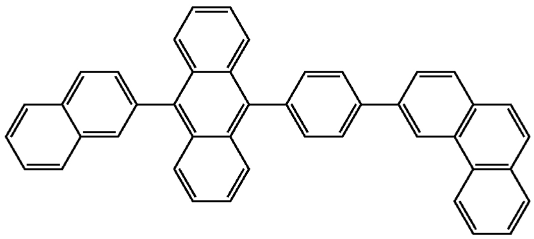
(2-39)
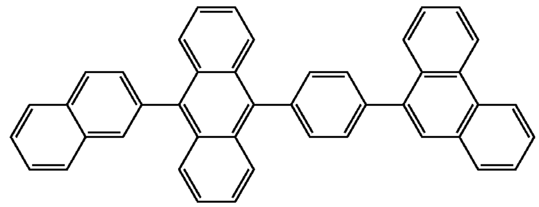
(2-40)
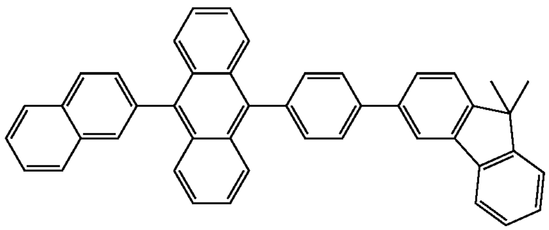
(2-41)
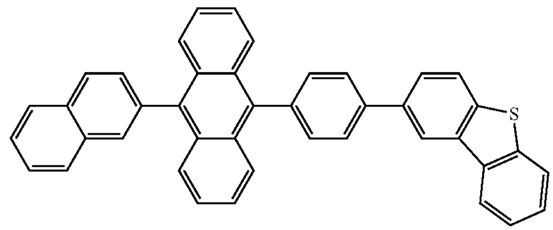
(2-42)
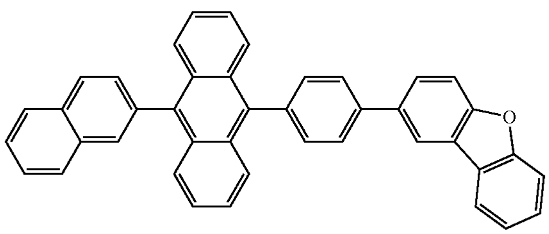
(2-43)
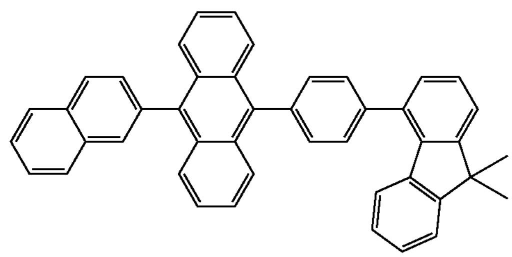
(2-44)
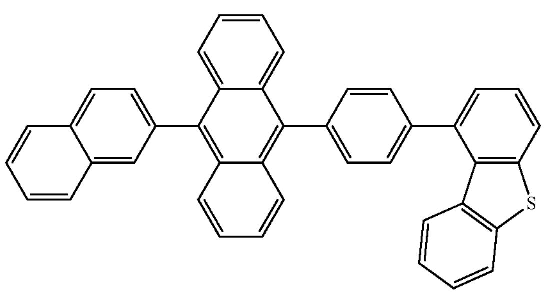
(2-45)
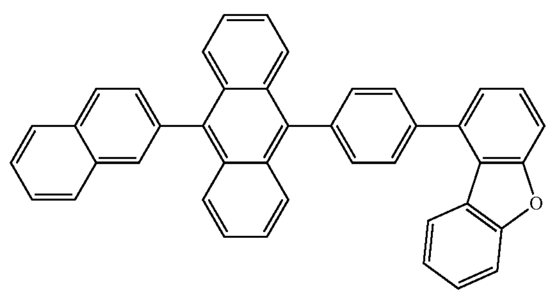
(2-46)
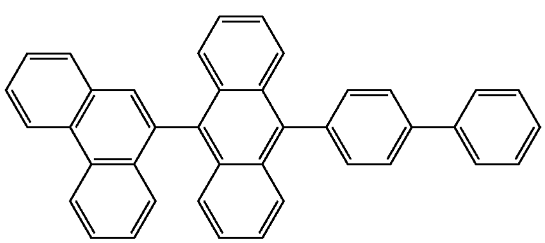
(2-47)
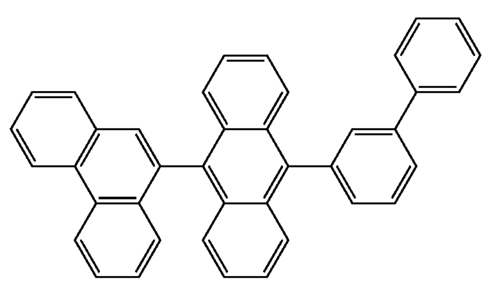

-continued
(2-48)
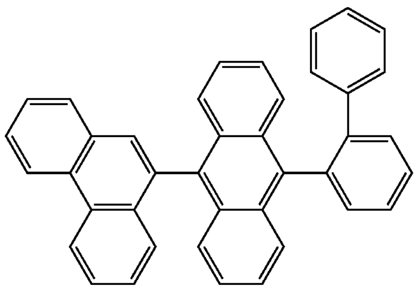
(2-49)
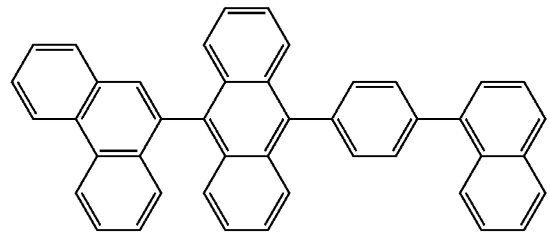
(2-50)
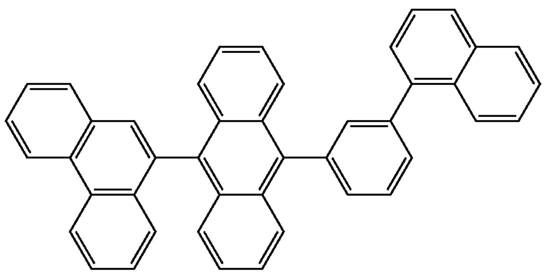
(2-51)
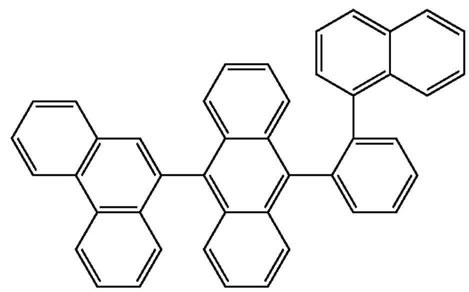
(2-52)
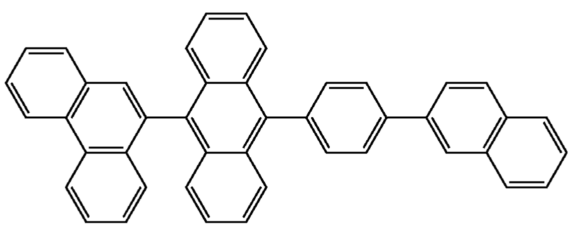
(2-53)
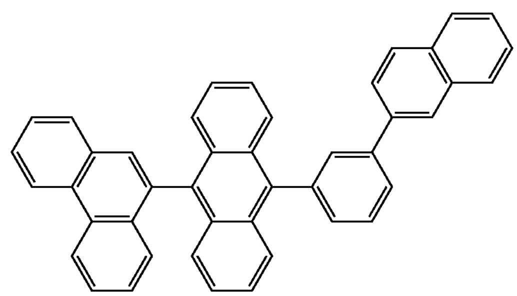
(2-54)
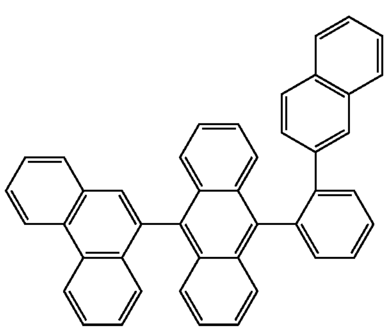
(2-55)
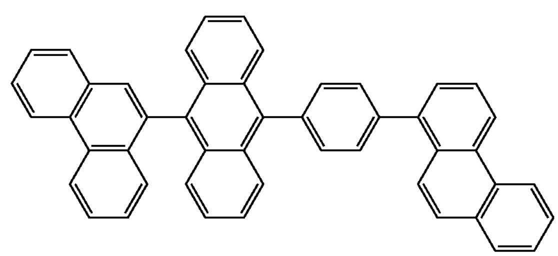
(2-56)
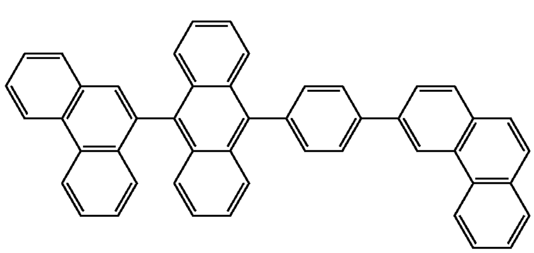
(2-57)
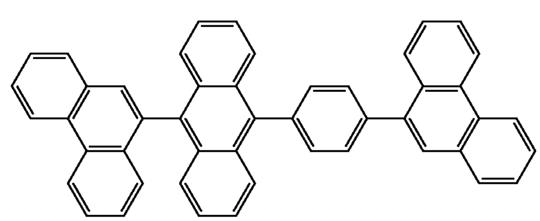

-continued
(2-58)
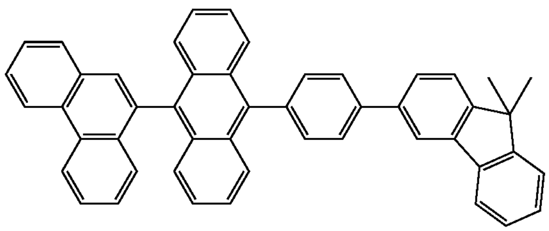
(2-59)
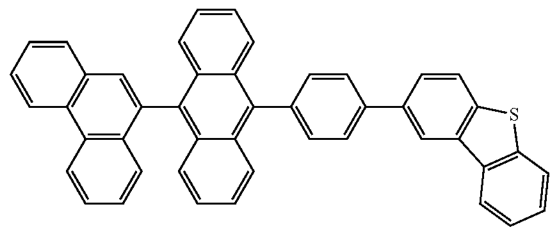
(2-60)
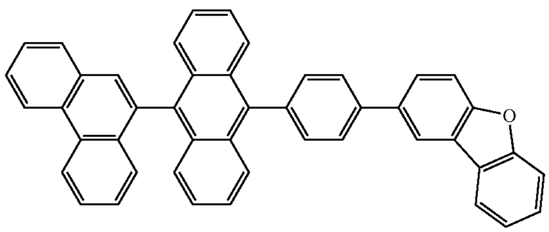
(2-61)
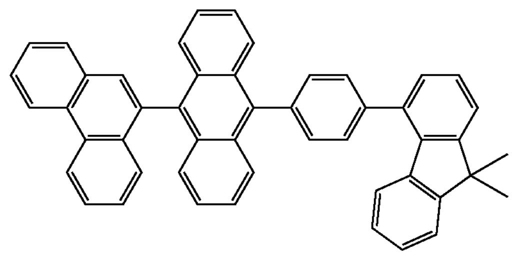
(2-62)
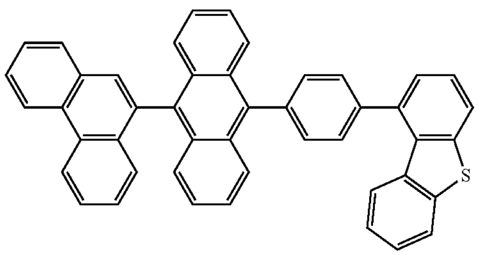
(2-63)
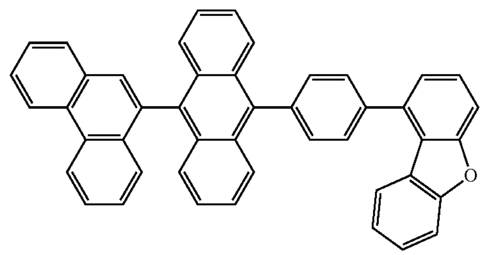
(2-64)
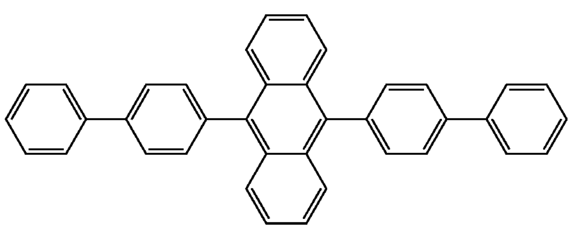
(2-65)
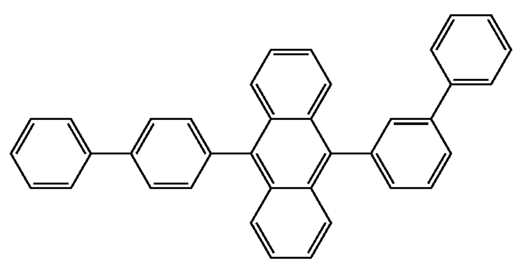
(2-66)
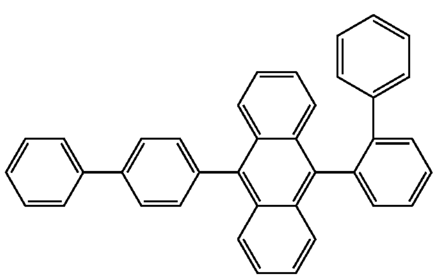
(2-67)
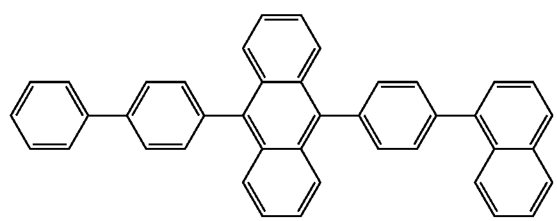
(2-68)
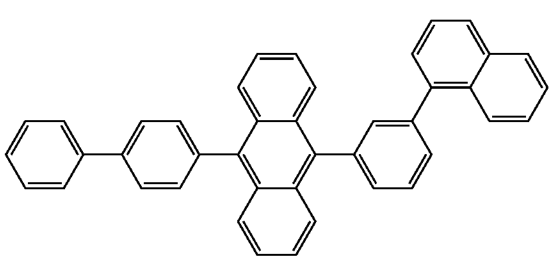
(2-69)
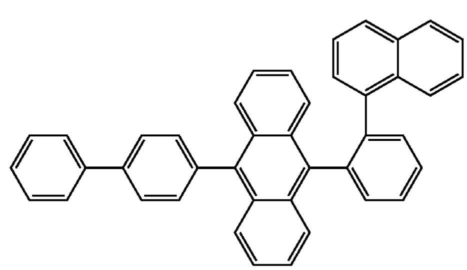

-continued
(2-70)
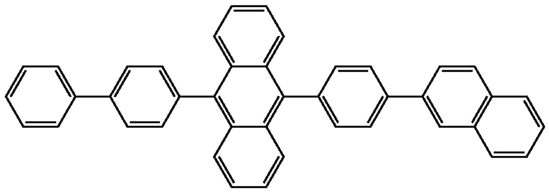
(2-71)
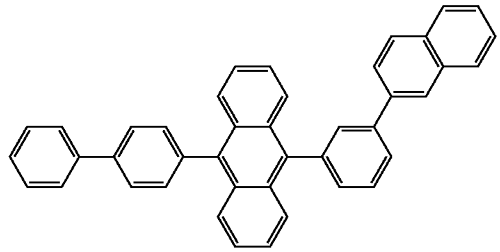
(2-72)
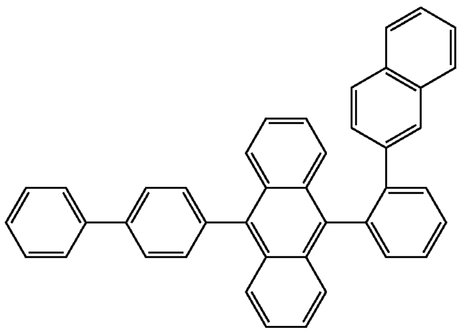
(2-73)
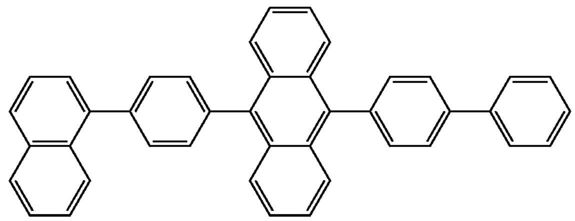
(2-74)
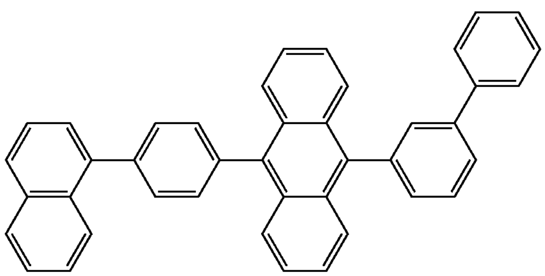
(2-75)
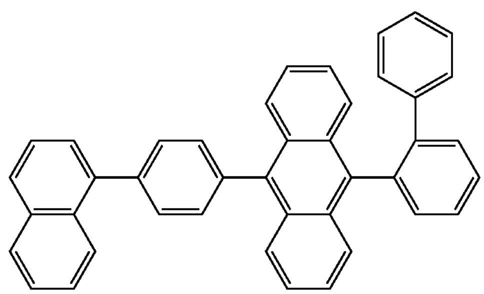
(2-76)
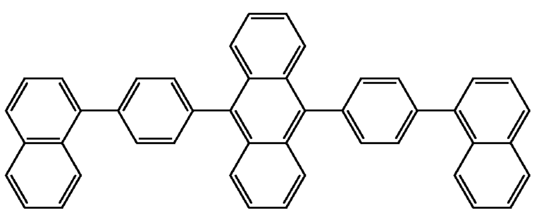
(2-77)
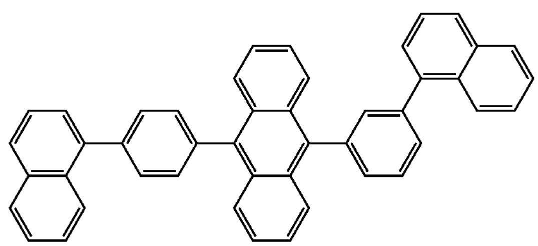
(2-78)
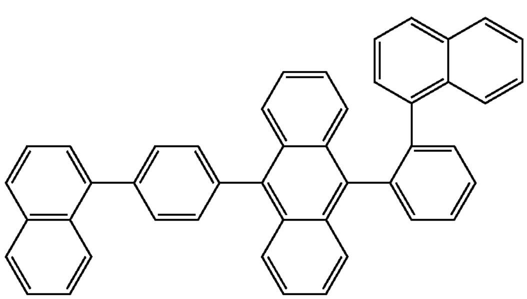
(2-79)
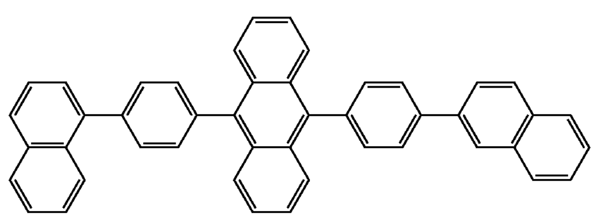

-continued
(2-80)
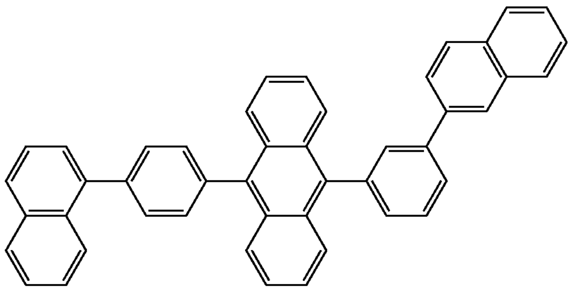
(2-81)
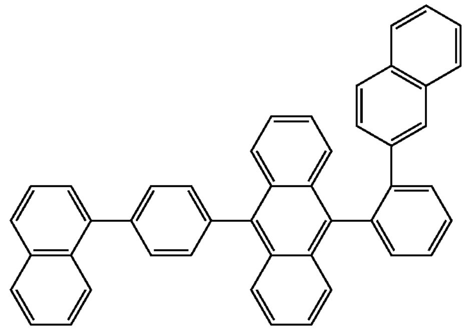
(2-82)
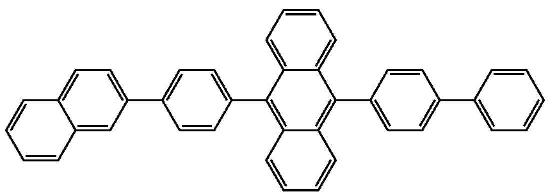
(2-83)
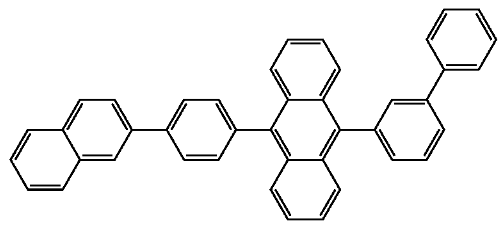
(2-84)
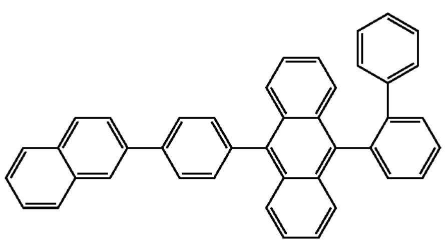
(2-85)
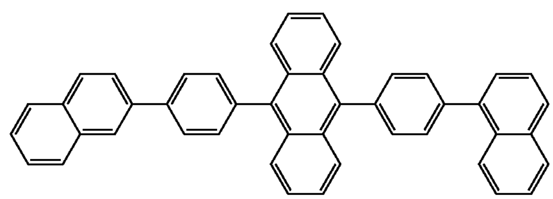
(2-86)
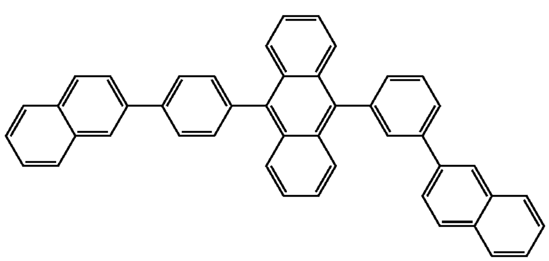
(2-87)
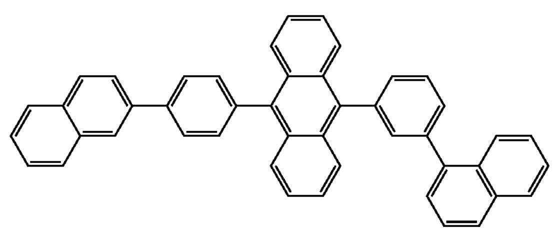
(2-88)
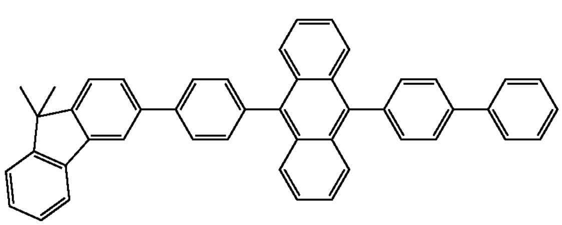
(2-89)
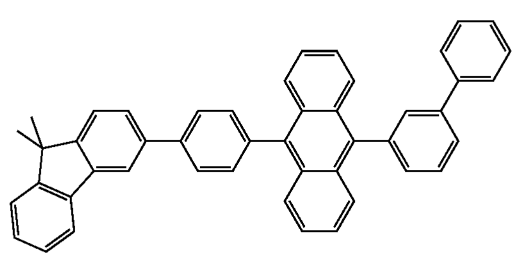

-continued
(2-90)
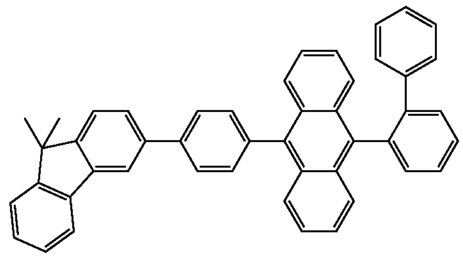
(2-91)
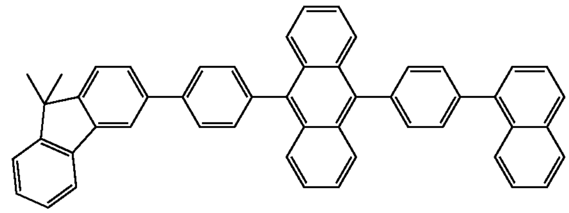
(2-92)
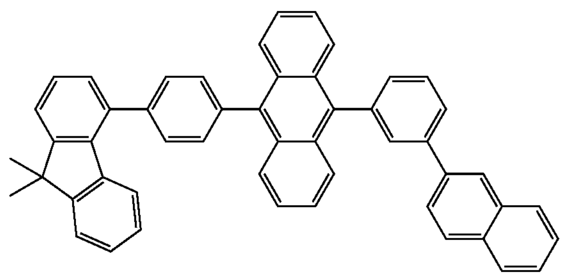
(2-93)
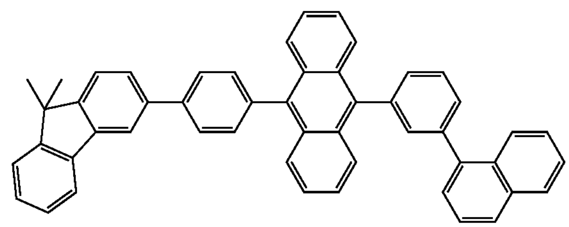
(2-94)
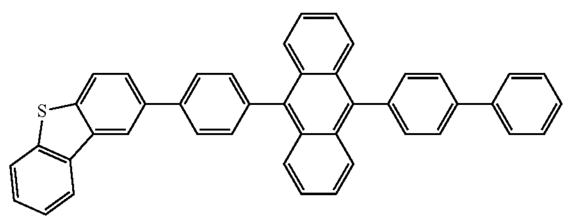
(2-95)
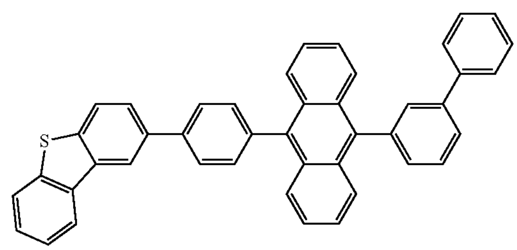
(2-96)
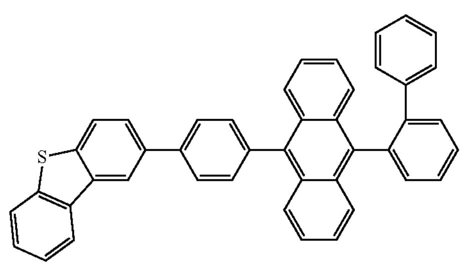
(2-97)
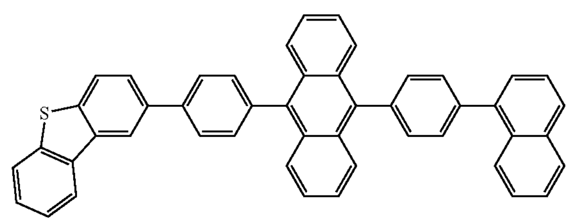
(2-98)
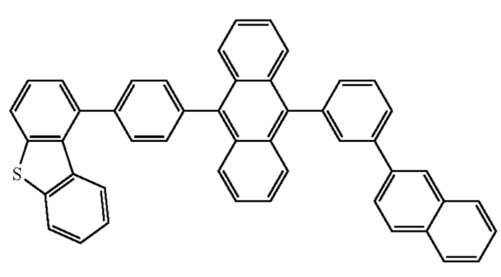
(2-99)
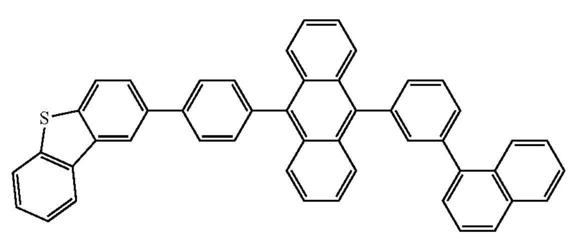

-continued
(2-100)
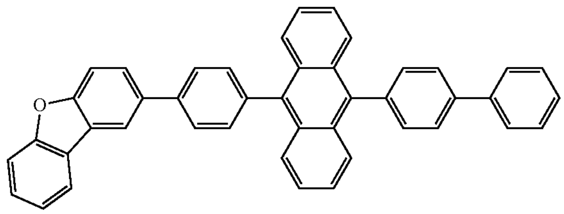
(2-101)
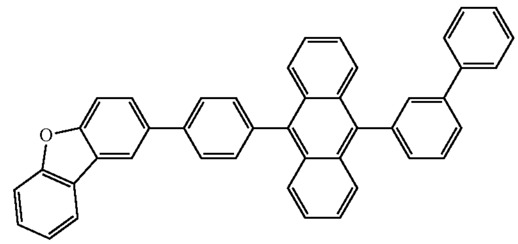
(2-102)
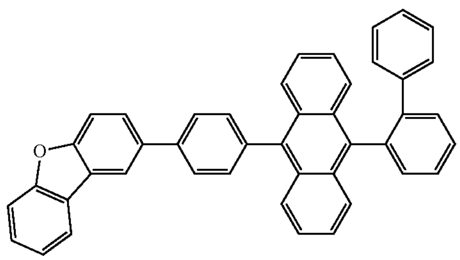
(2-103)
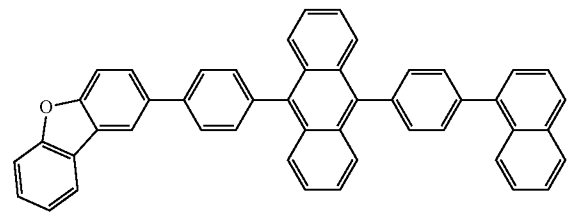
(2-104)
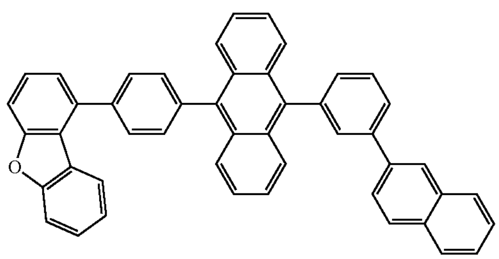
(2-105)
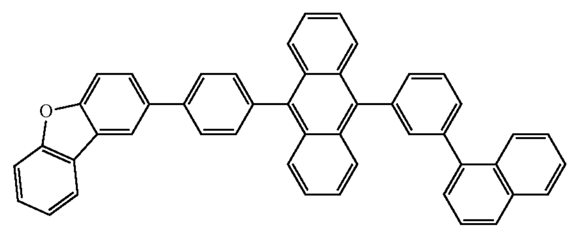
(2-106)
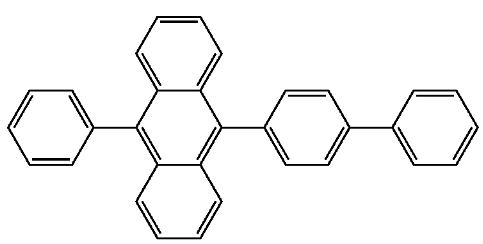
(2-107)
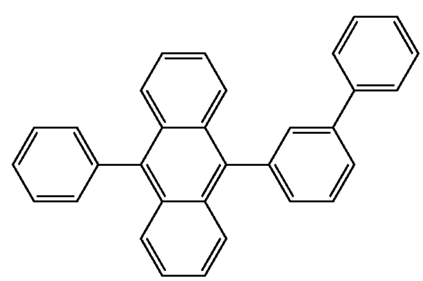
(2-108)
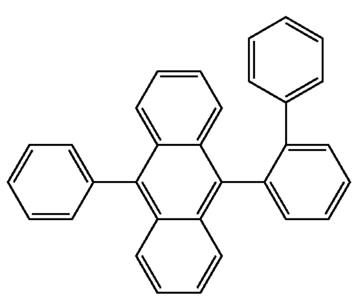
(2-109)
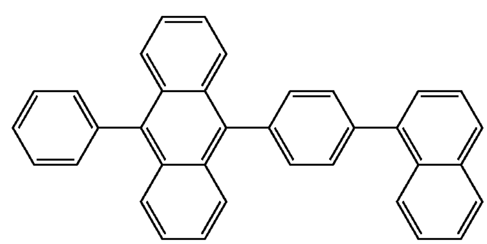

-continued
(2-110)
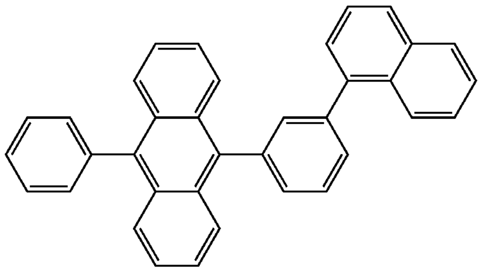
(2-111)
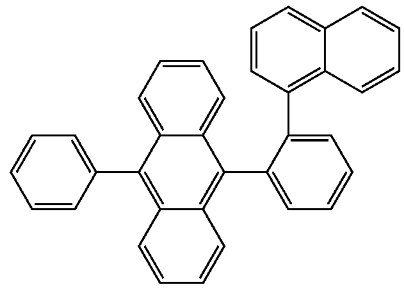
(2-112)
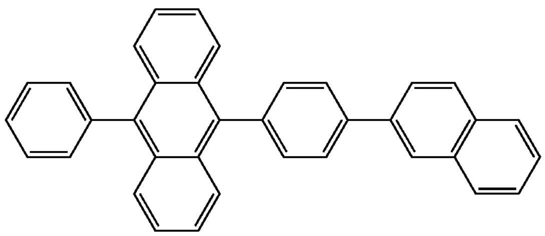
(2-113)
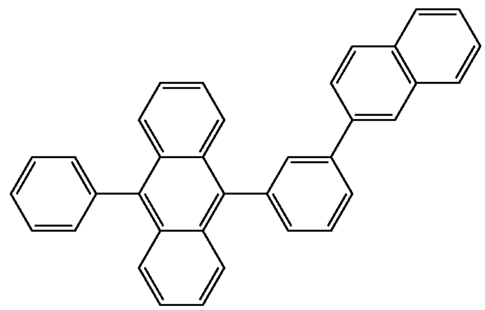
(2-114)
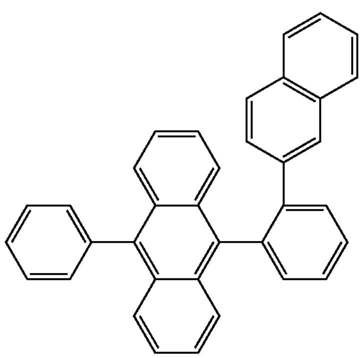
(2-115)
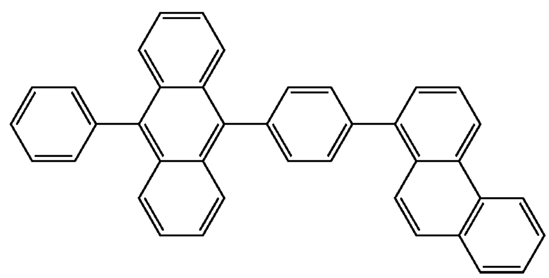
(2-116)
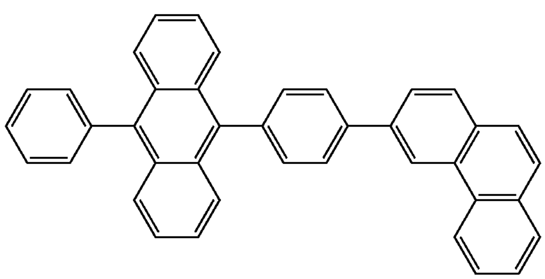
(2-117)
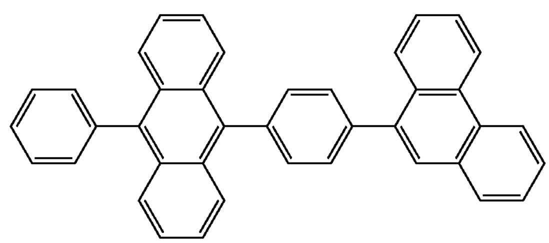
(2-118)
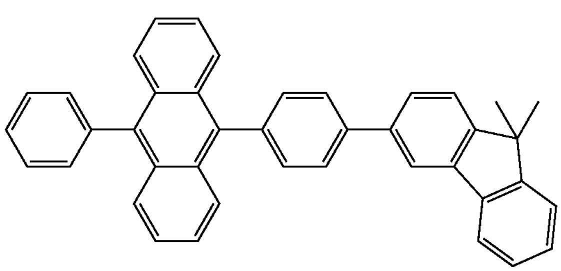
(2-119)
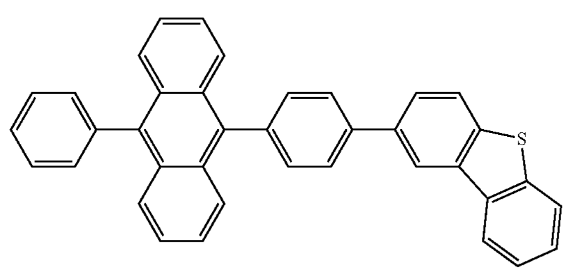

-continued
(2-120)
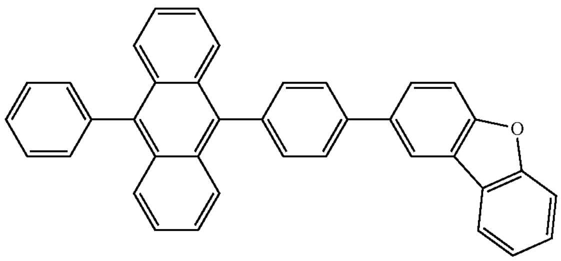
(2-121)
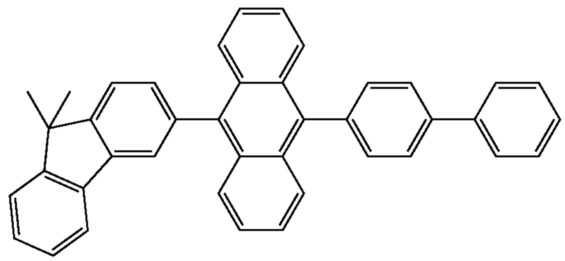
(2-122)
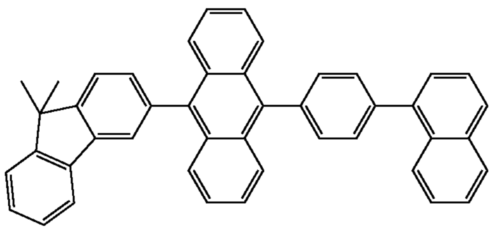
(2-123)
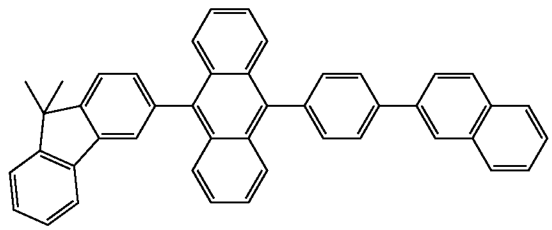
(2-124)
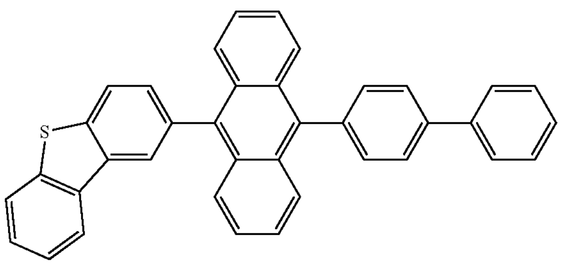
(2-125)
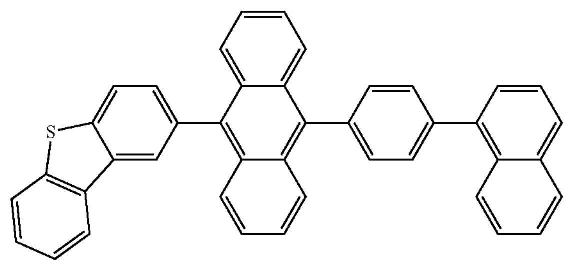
(2-126)
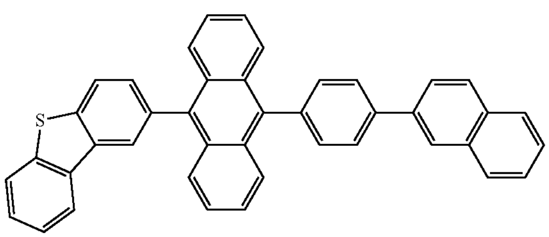
(2-127)
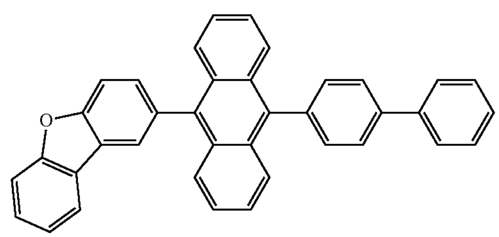
(2-128)
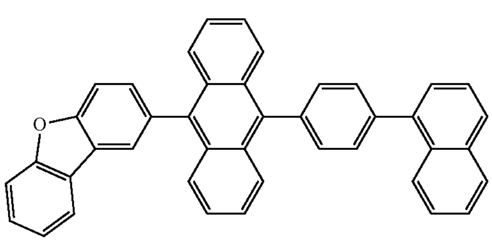
(2-129)
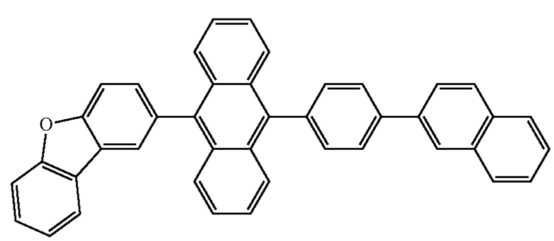
(2-130)
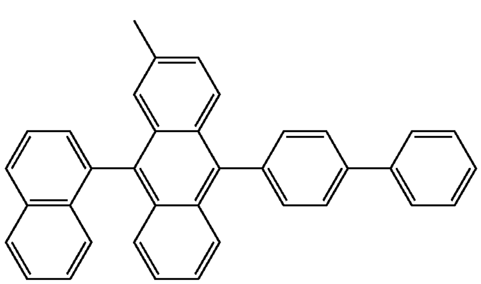
(2-131)
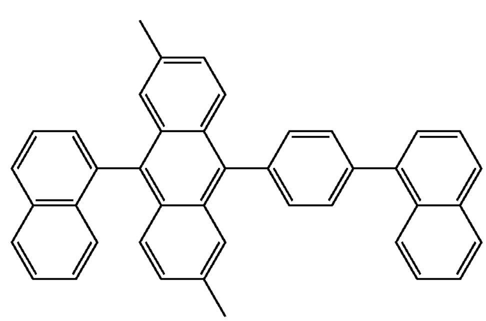

-continued
(2-132)
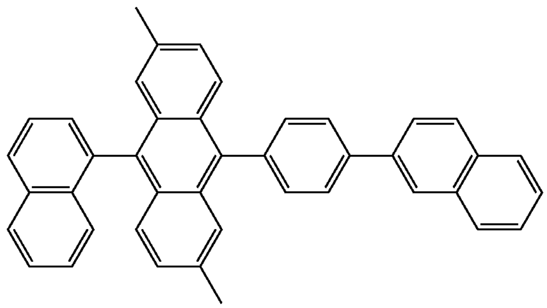
(2-133)
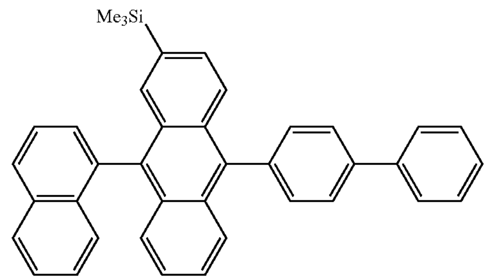
(2-134)
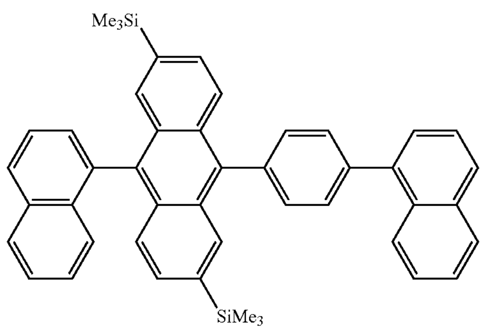
(2-135)
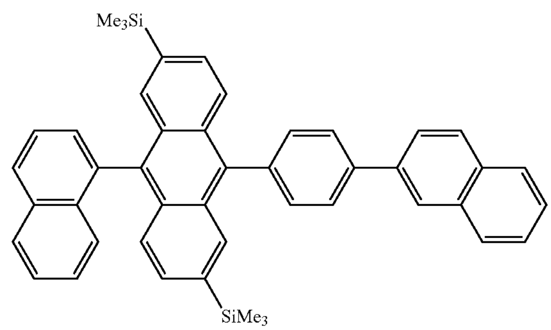
(2-136)
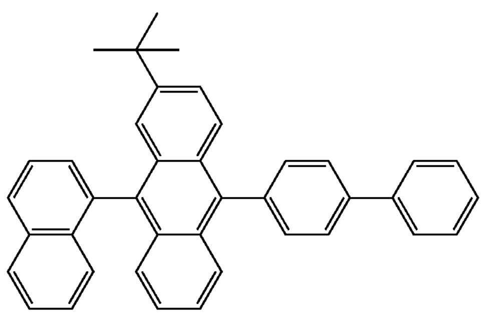
(2-137)
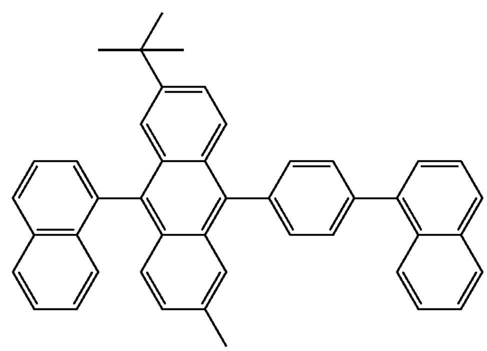
(2-138)
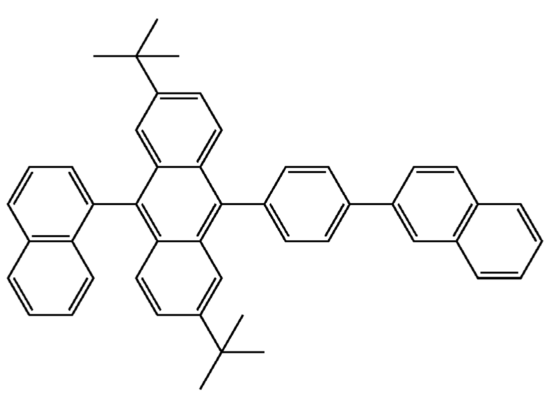
(2-139)
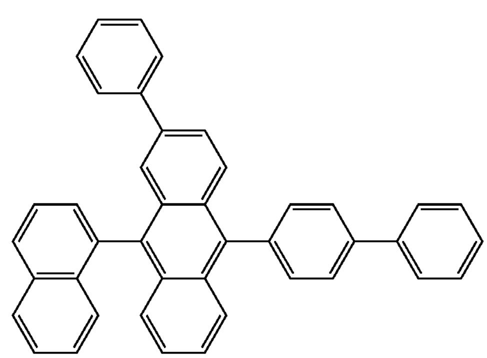

-continued (2-140)

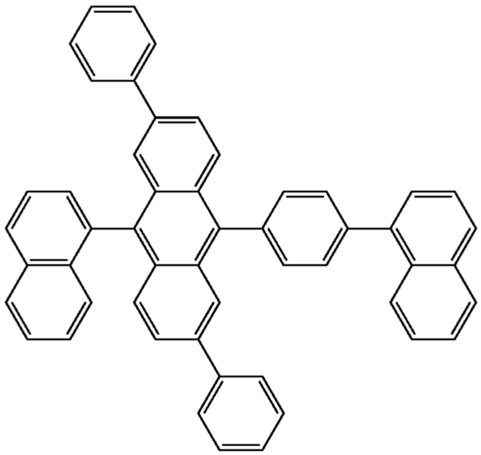

(2-141)

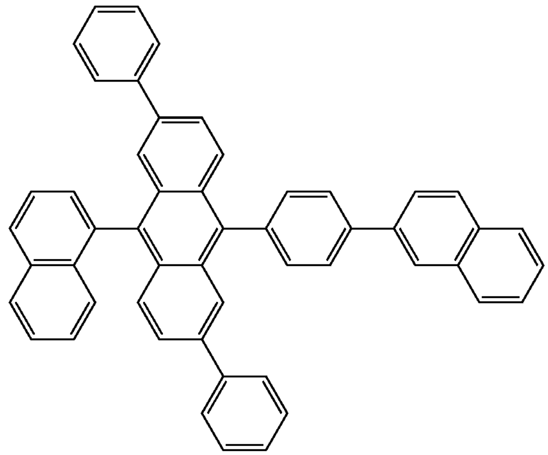

(2-142)

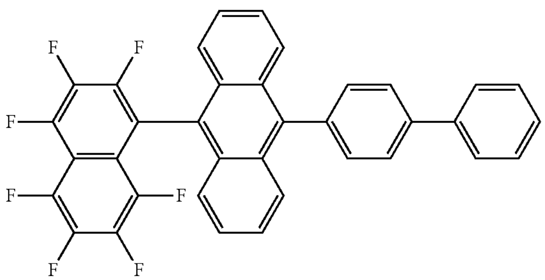

(2-143)

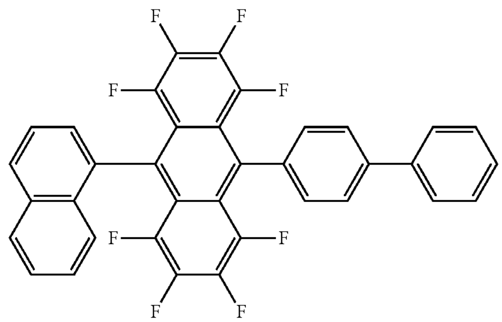

(2-144)

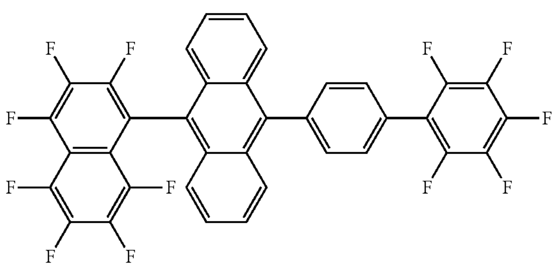

(2-145)

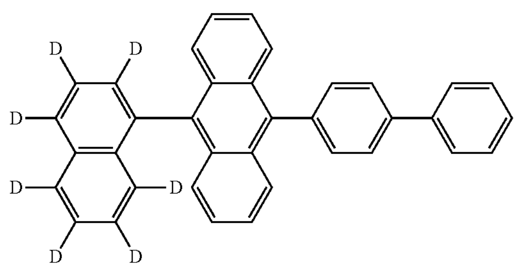

(2-146)

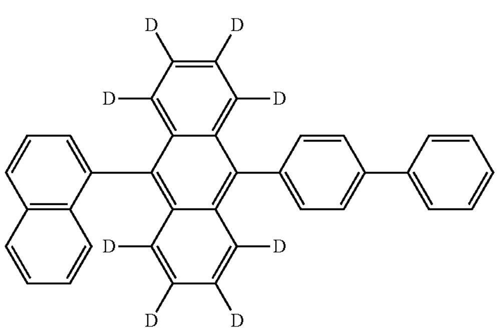

(2-147)

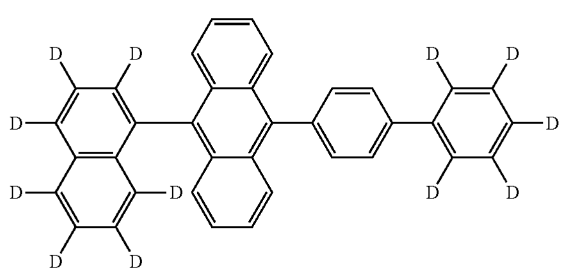

The organic light emitting element may include: an anode and a cathode facing each other; an emission layer provided between the anode and the cathode; a hole transfer layer provided between the anode and the emission layer; and an electron transfer layer and a hole blocking layer provided between the cathode and the emission layer, wherein the hole blocking layer may include the first compound, and the emission layer may include the second compound.

The first compound may be a compound represented by Chemical Formula 3:

[Chemical Formula 3]

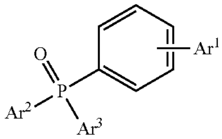

wherein, in Chemical Formula 3, $Ar^1$ to $Ar^3$ are equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic.

The first compound may be selected from a group consisting of compounds represented by Chemical Formula 1-1 to Chemical Formula 1-188:

(1-1)

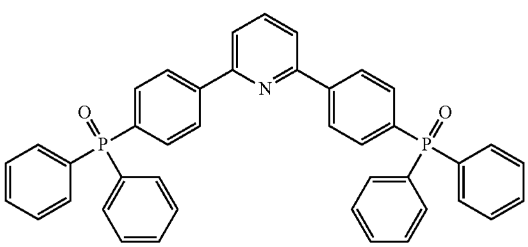

(1-2)

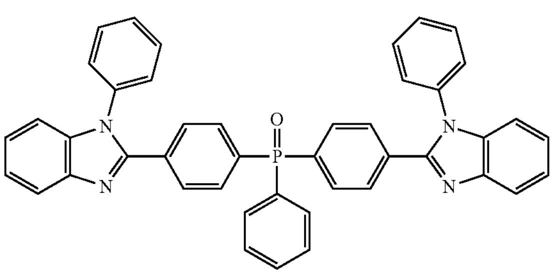

(1-3)

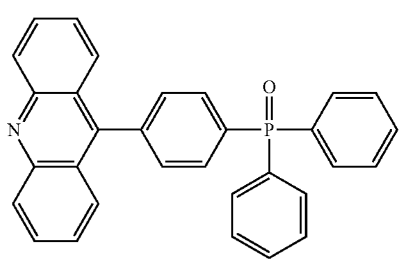

-continued (1-4)

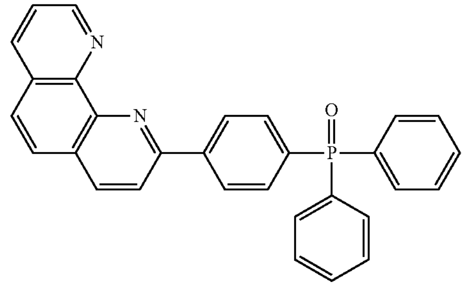

(1-5)

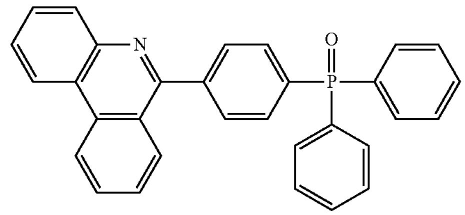

(1-6)

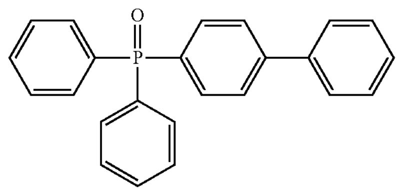

(1-7)

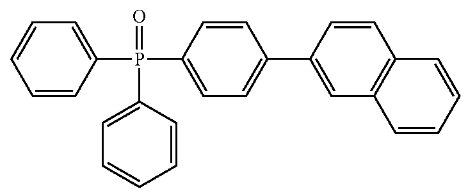

(1-8)

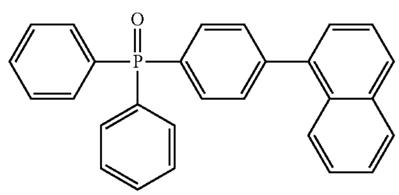

(1-9)

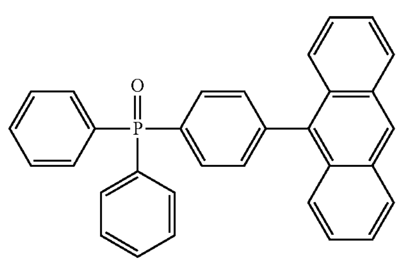

(1-10)

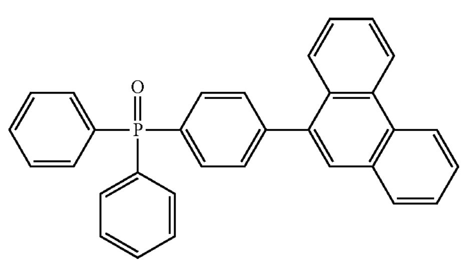

-continued
(1-11)
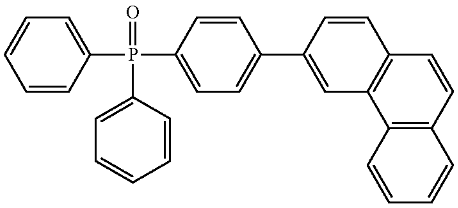
(1-12)
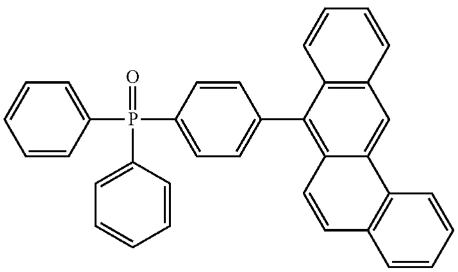
(1-13)
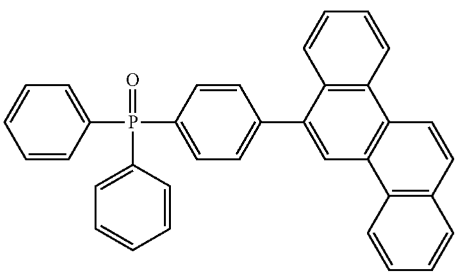
(1-14)
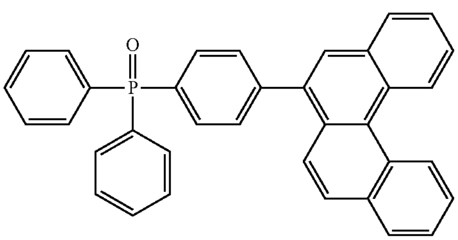
(1-15)
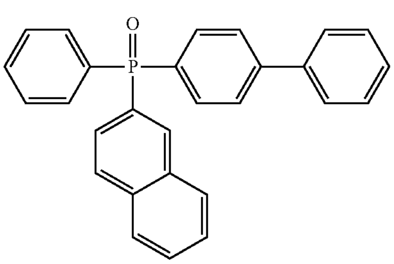
(1-16)
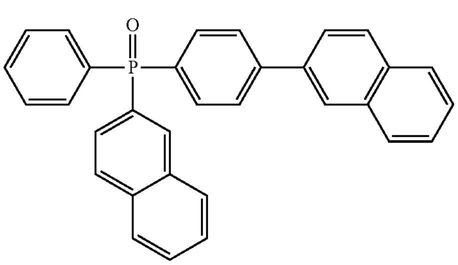
-continued
(1-17)
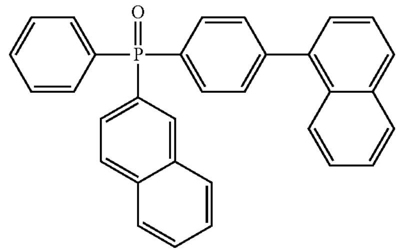
(1-18)
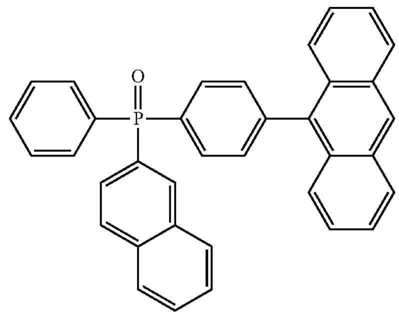
(1-19)
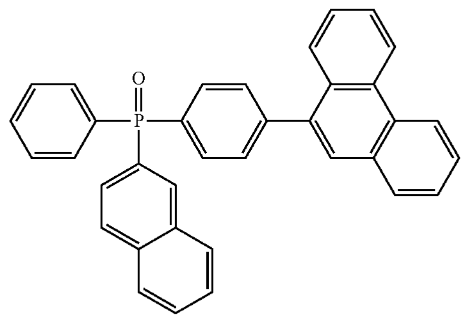
(1-20)
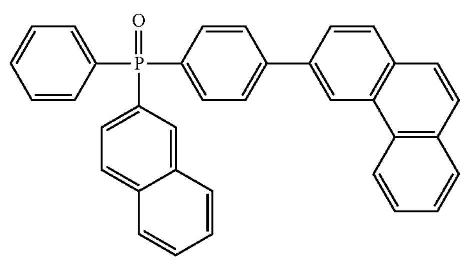
(1-21)
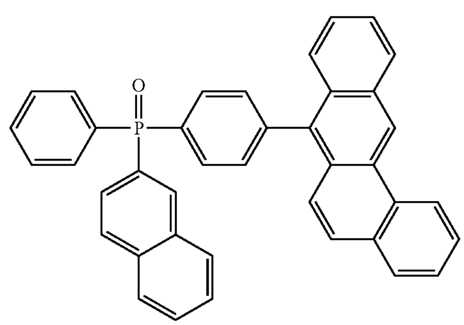

(1-22)
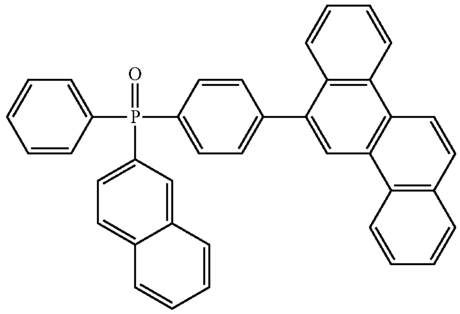
(1-23)
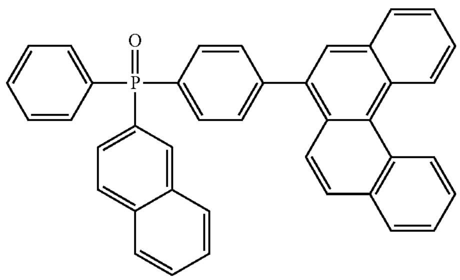
(1-24)
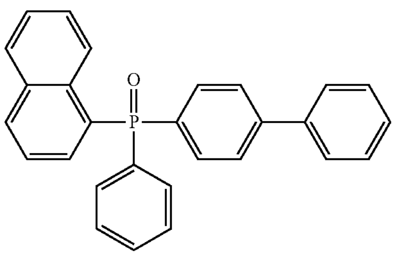
(1-25)
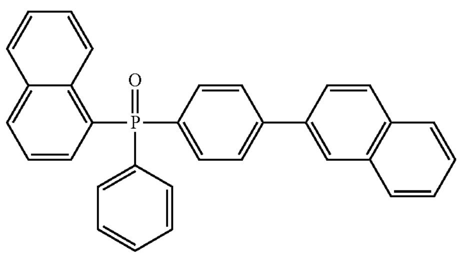
(1-26)
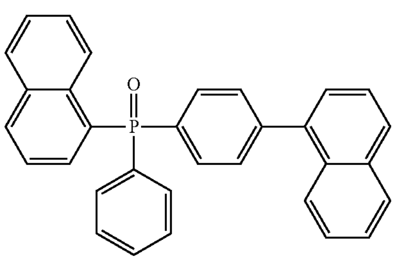
(1-27)
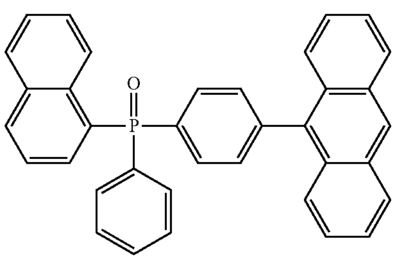
(1-28)
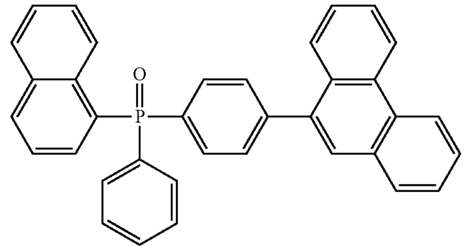
(1-29)
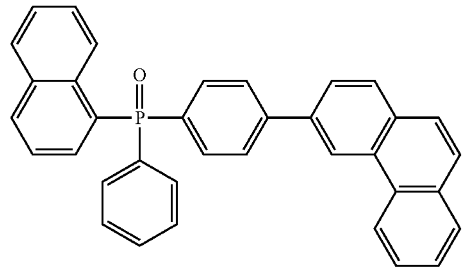
(1-30)
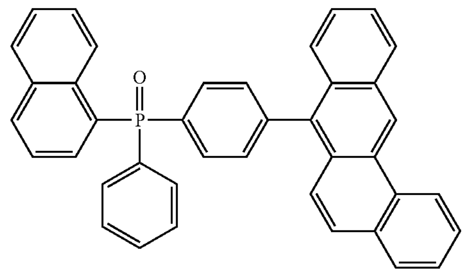
(1-31)
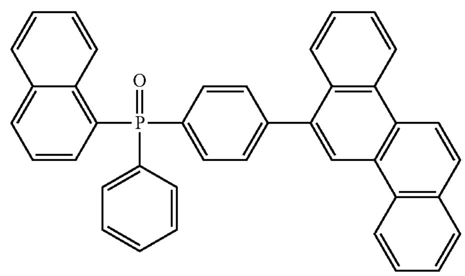
(1-32)
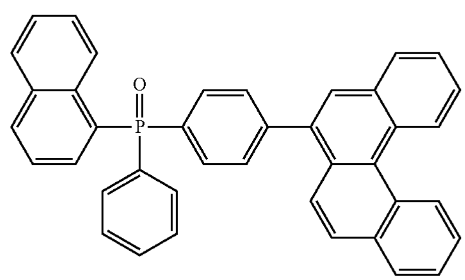
(1-33)
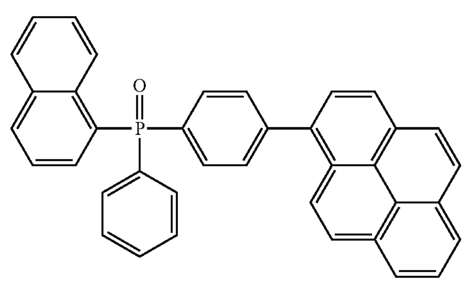

-continued
(1-34)
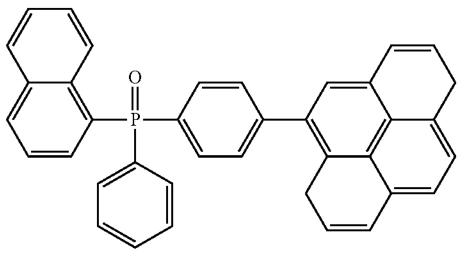
(1-35)
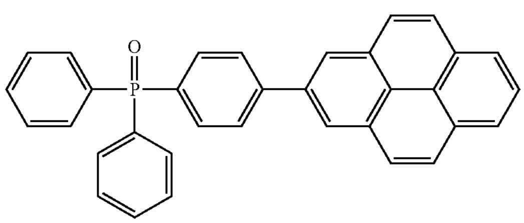
(1-36)
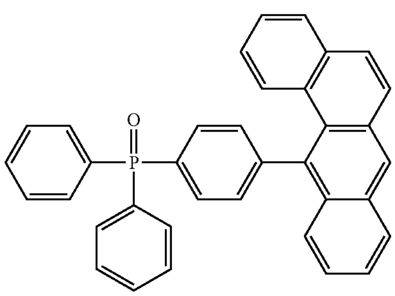
(1-37)
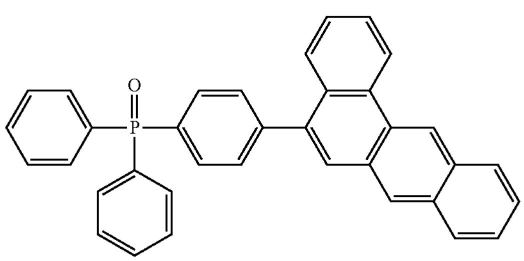
(1-38)
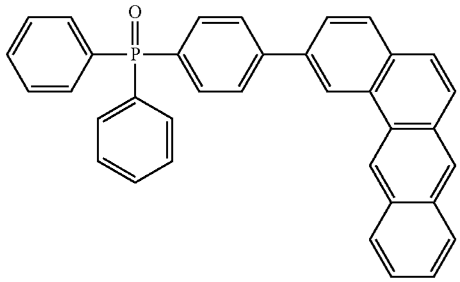
-continued
(1-39)
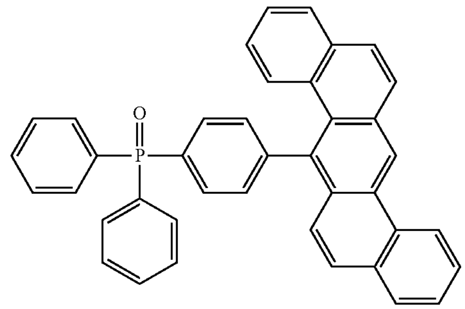
(1-40)
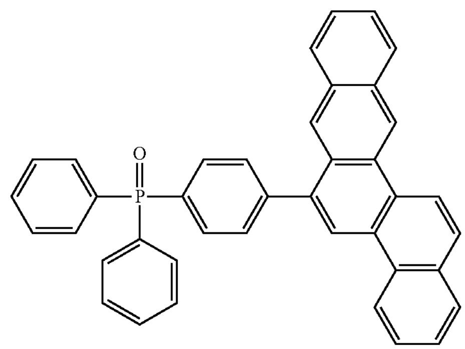
(1-41)
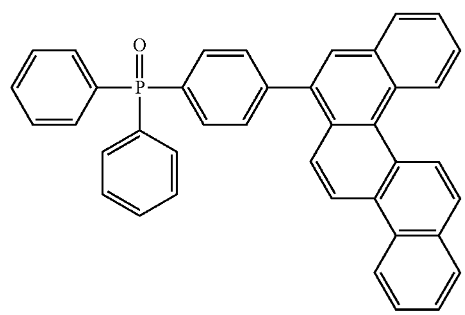
(1-42)
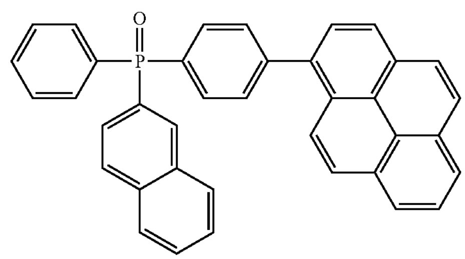
(1-43)
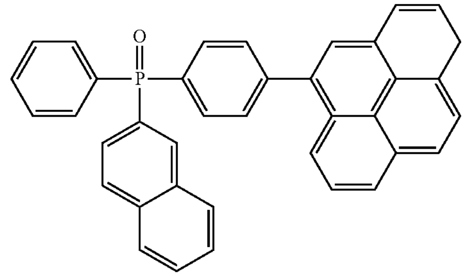

-continued
(1-44)
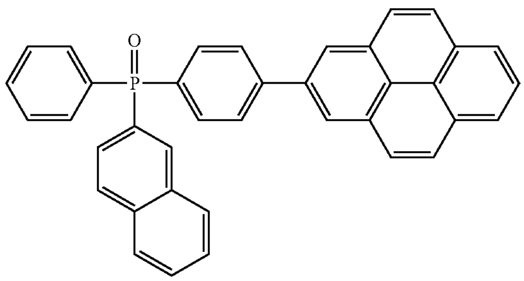
(1-45)
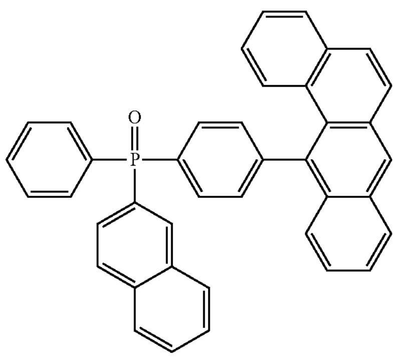
(1-46)
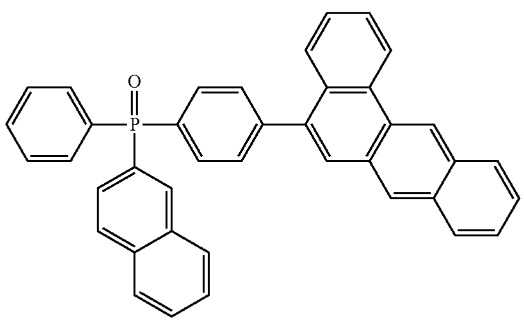
(1-47)
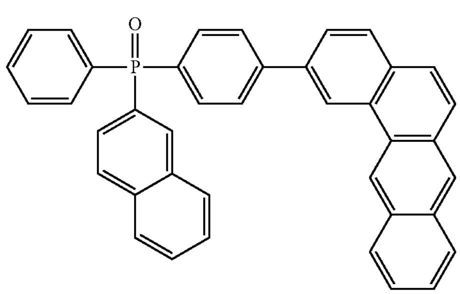
(1-48)
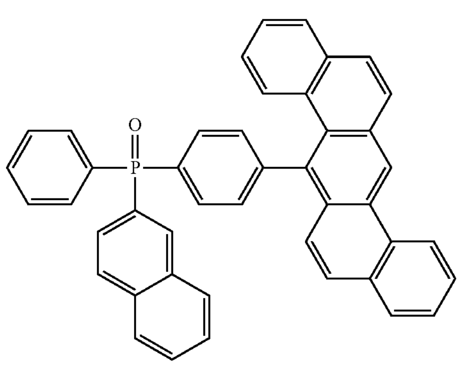
-continued
(1-49)
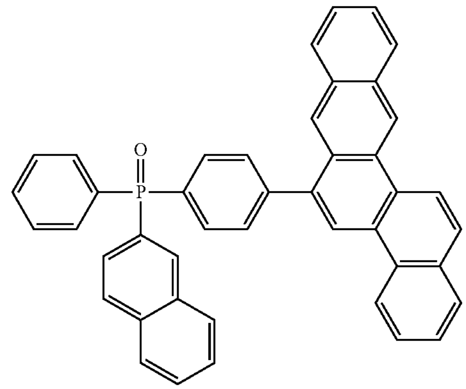
(1-50)
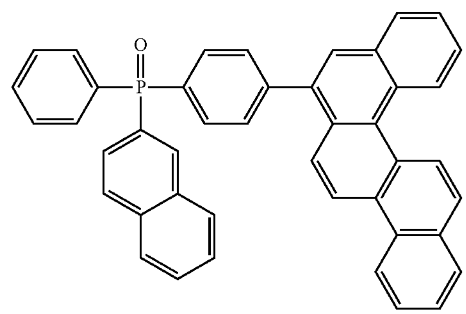
(1-51)
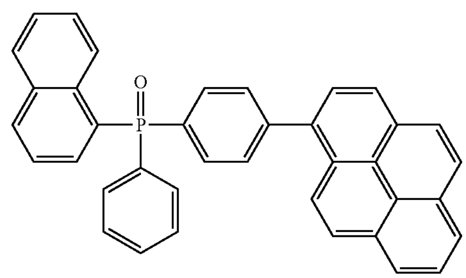
(1-52)
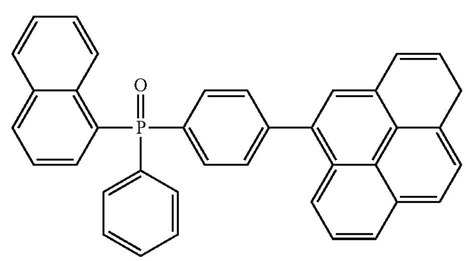
(1-53)
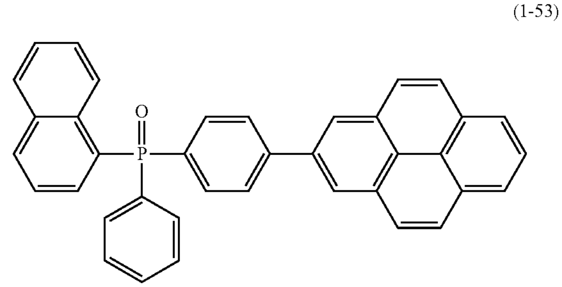

-continued
(1-54)
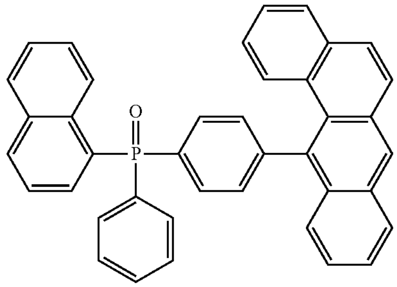
(1-55)
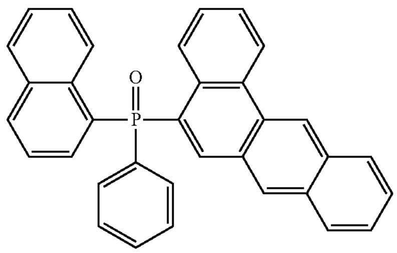
(1-56)
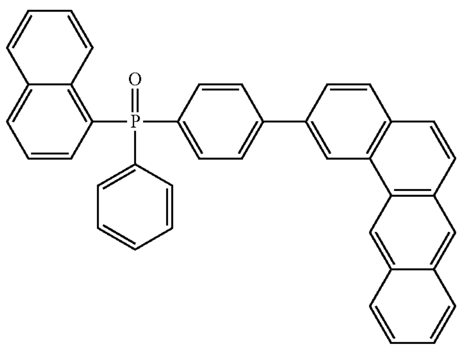
(1-57)
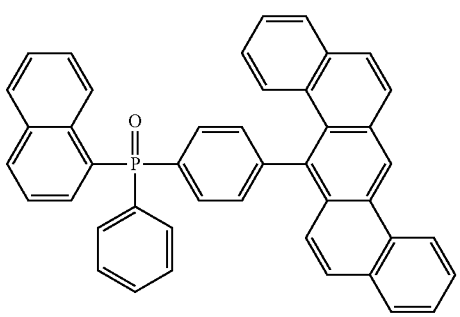
(1-58)
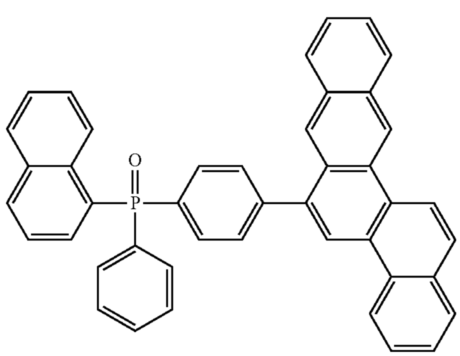
-continued
(1-59)
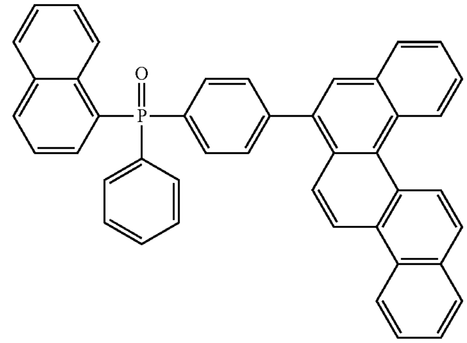
(1-60)
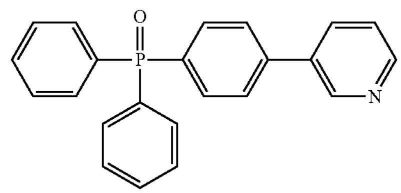
(1-61)
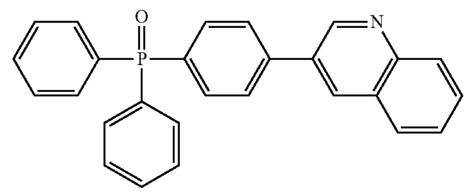
(1-62)
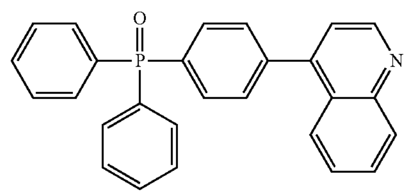
(1-63)
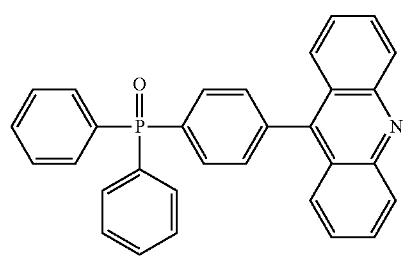
(1-64)
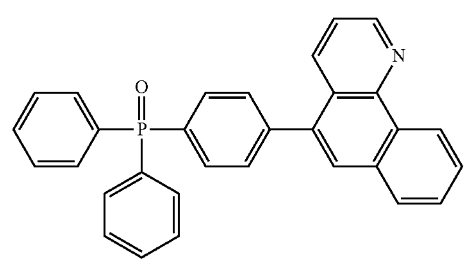

-continued
(1-65)
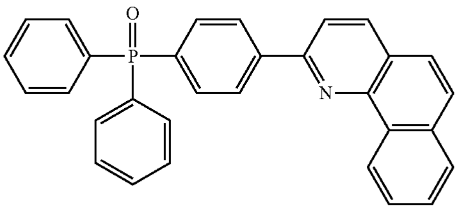
(1-66)
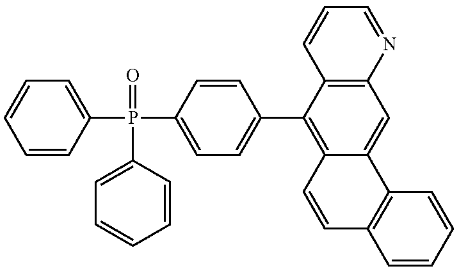
(1-67)
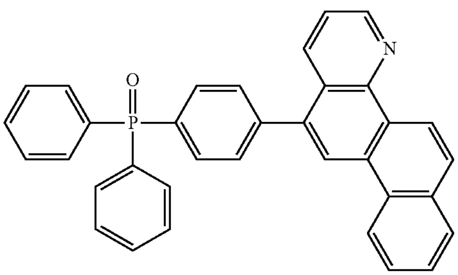
(1-68)
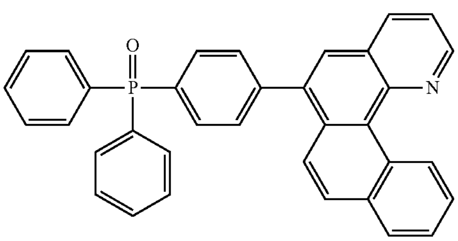
(1-69)
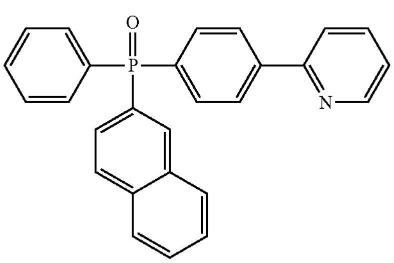
(1-70)
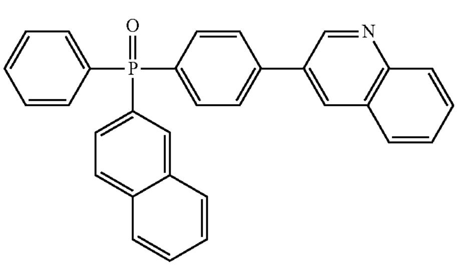
-continued
(1-71)
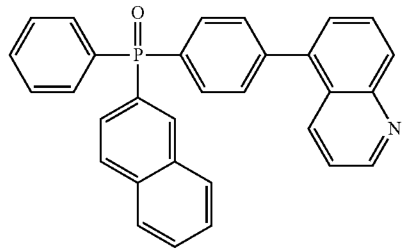
(1-72)
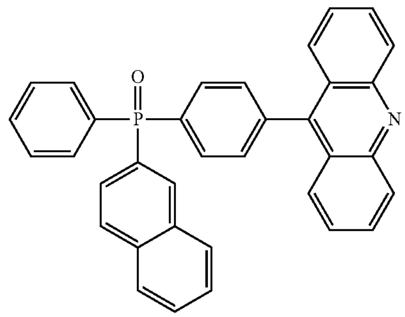
(1-73)
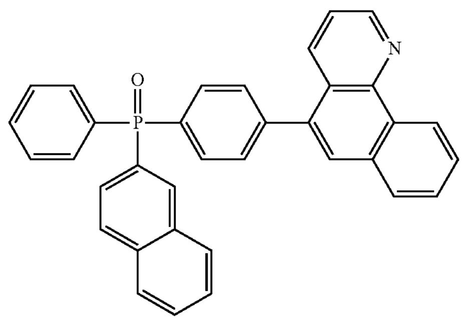
(1-74)
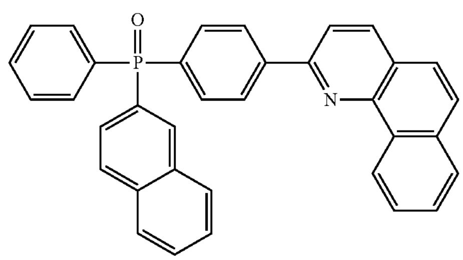
(1-75)
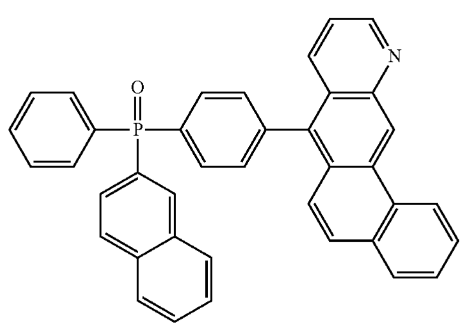

-continued
(1-76)
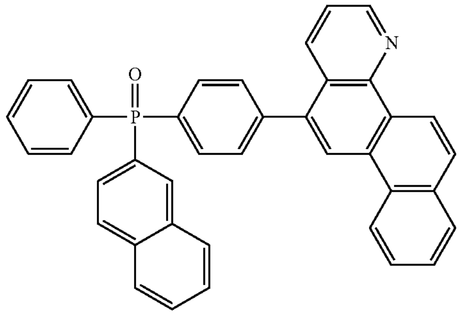
(1-77)
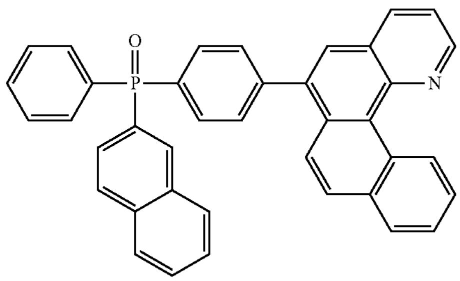
(1-78)
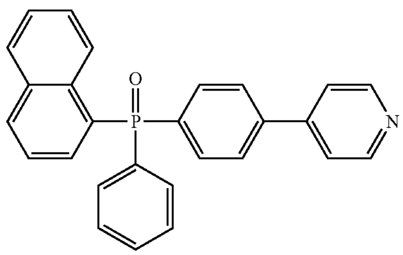
(1-79)
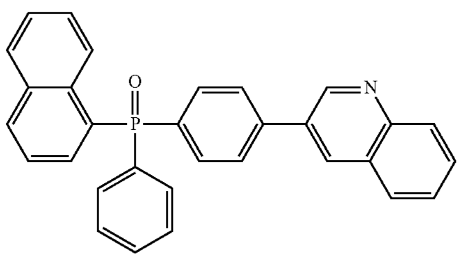
(1-80)
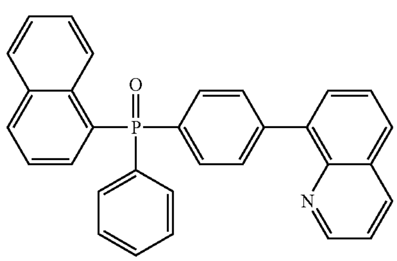
(1-81)
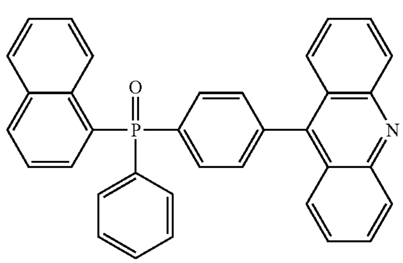
-continued
(1-82)
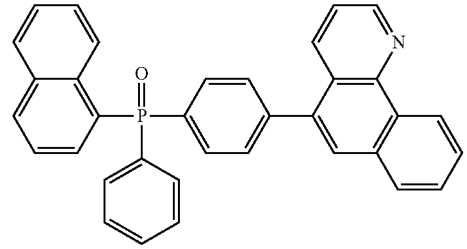
(1-83)
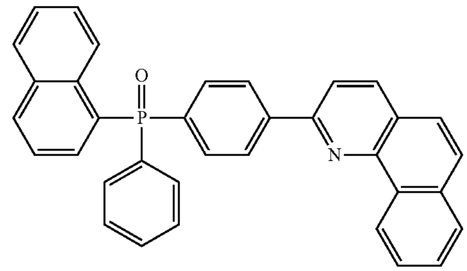
(1-84)
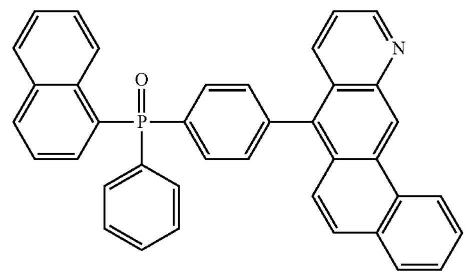
(1-85)
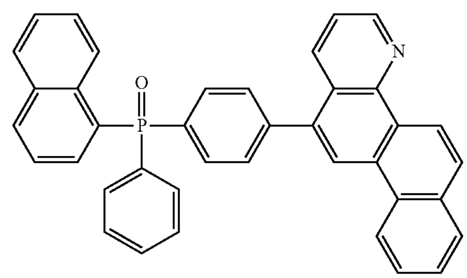
(1-86)
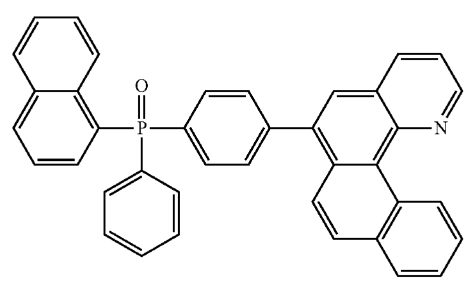
(1-87)
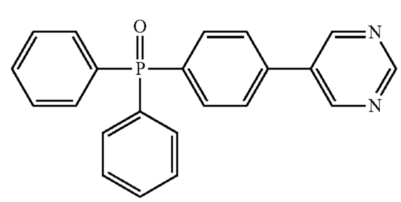

-continued
(1-88)
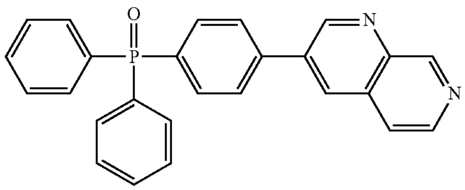
(1-89)
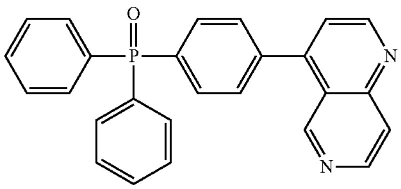
(1-90)
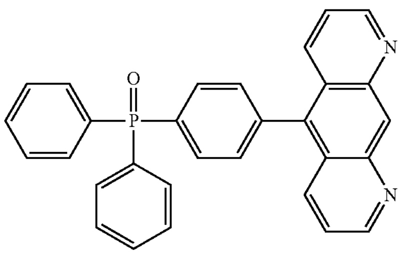
(1-91)
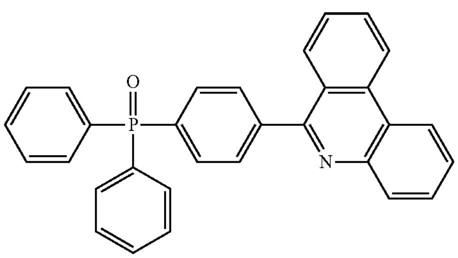
(1-92)
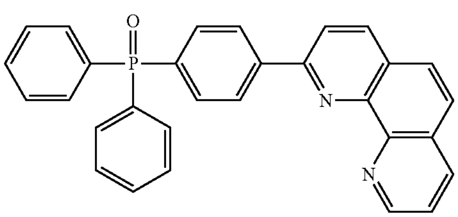
(1-93)
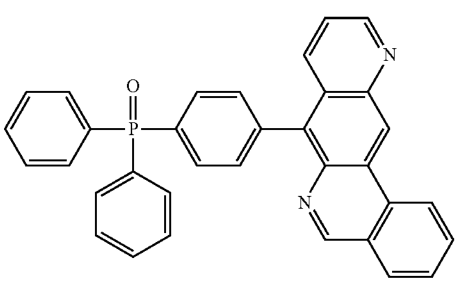
-continued
(1-94)
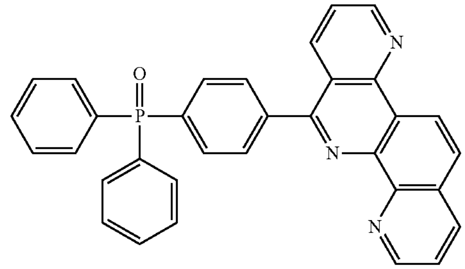
(1-95)
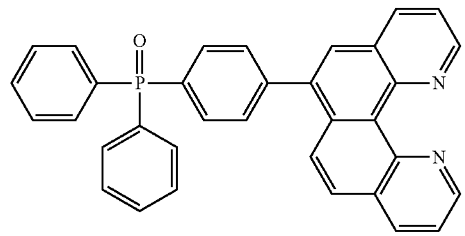
(1-96)
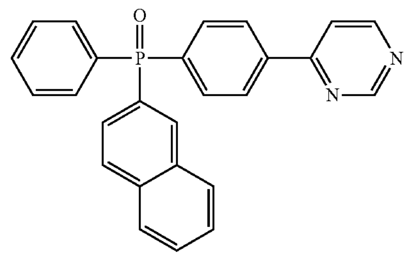
(1-97)
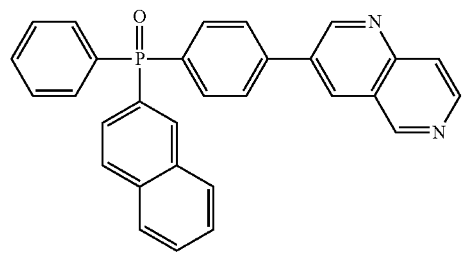
(1-98)
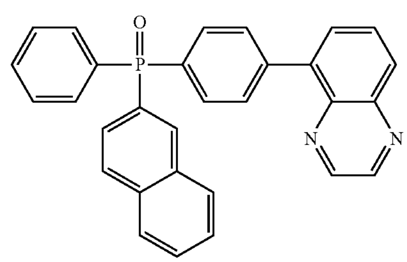
(1-99)
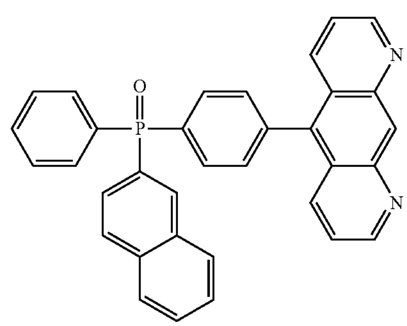

-continued
(1-100)
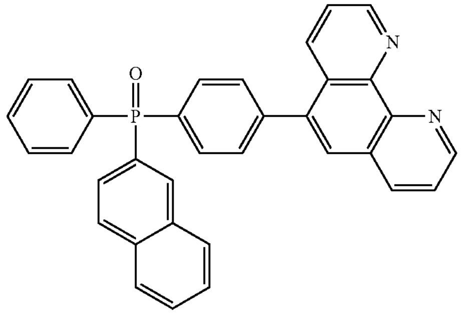
(1-101)
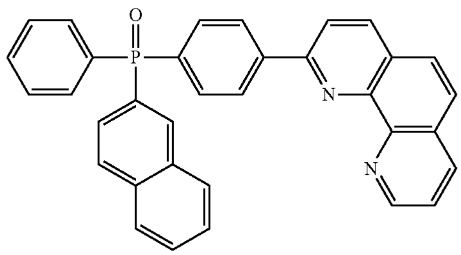
(1-102)
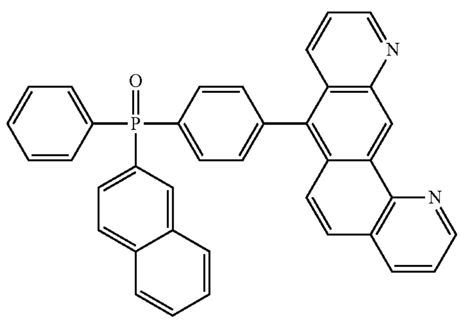
(1-103)
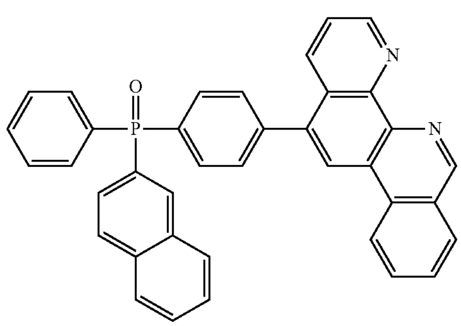
(1-104)
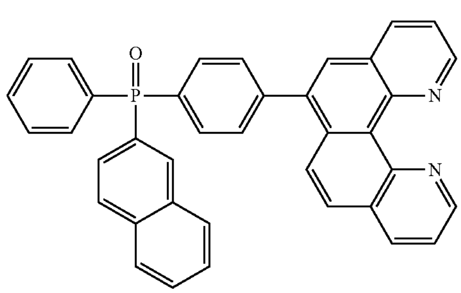
-continued
(1-105)
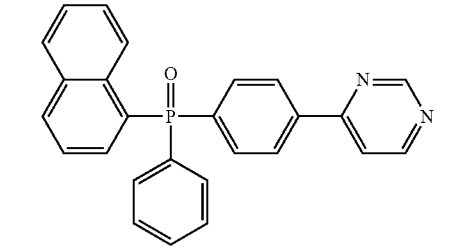
(1-106)
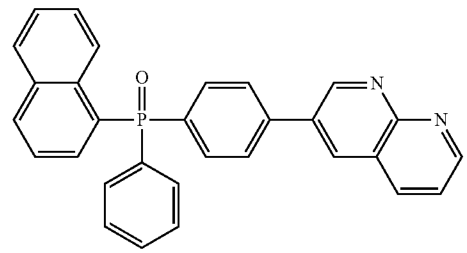
(1-107)
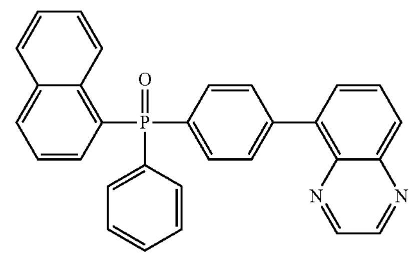
(1-108)
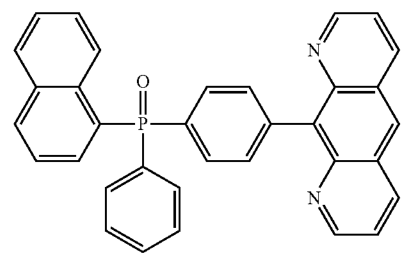
(1-109)
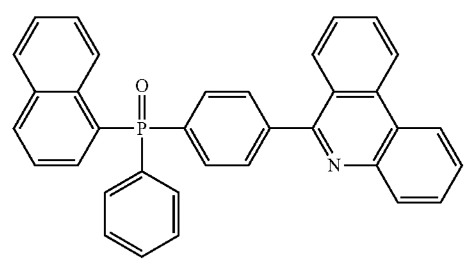
(1-110)
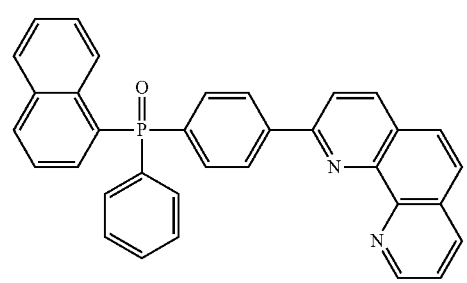

-continued
(1-111)
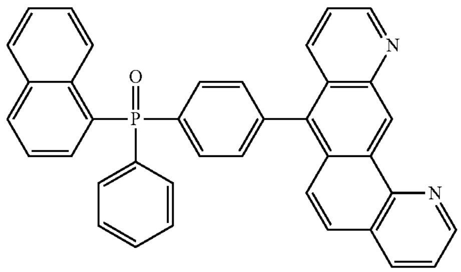
(1-112)
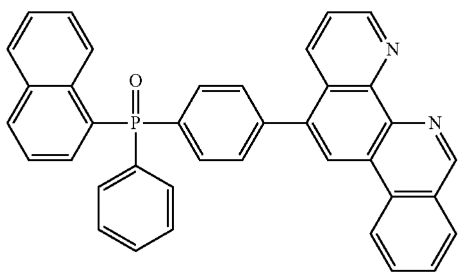
(1-113)
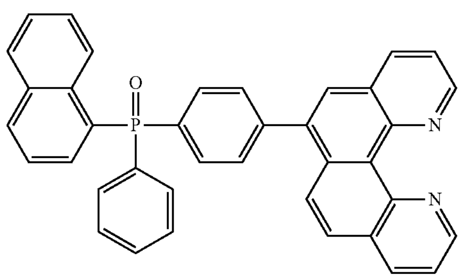
(1-114)
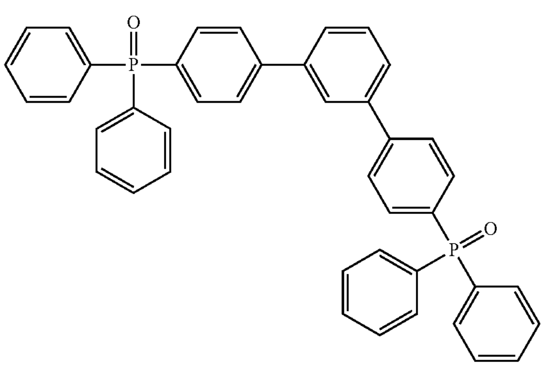
(1-115)
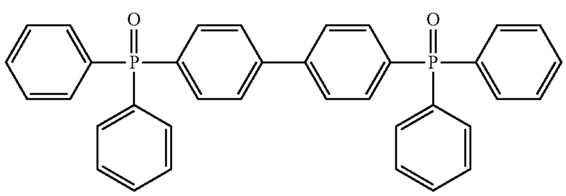
-continued
(1-116)
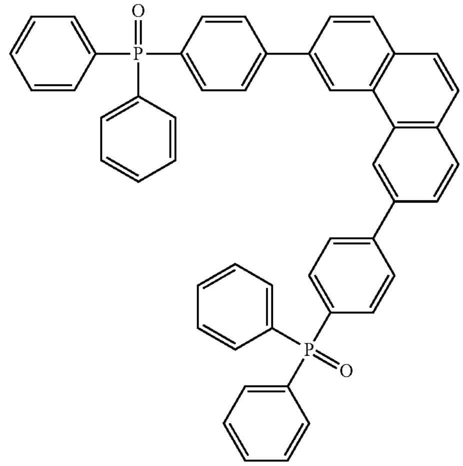
(1-117)
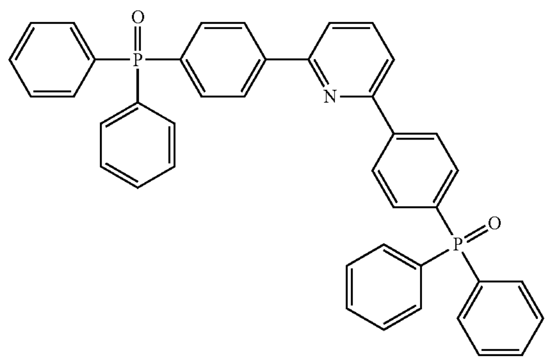
(1-118)
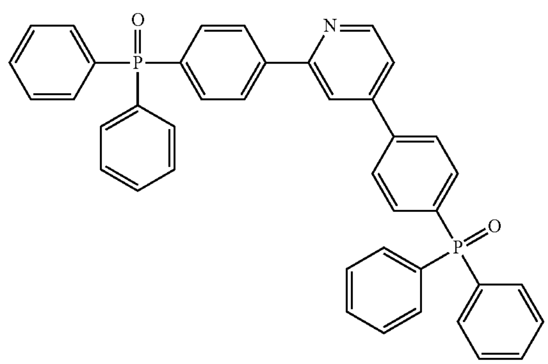
(1-119)
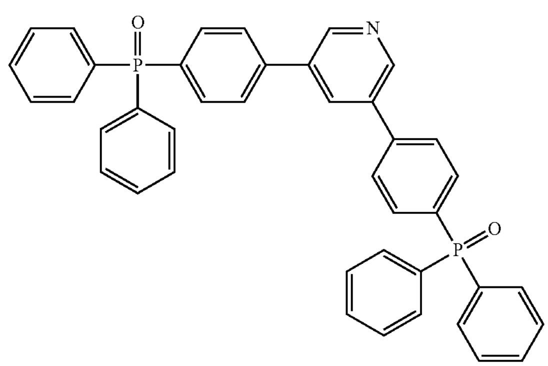

-continued
(1-120)
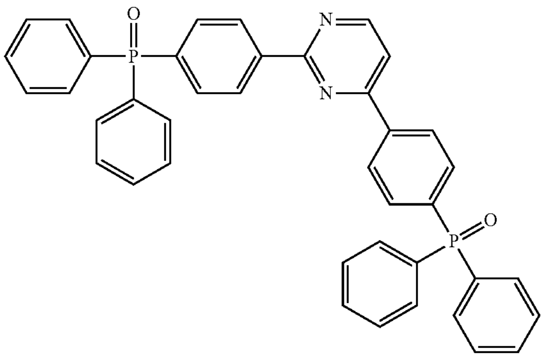
(1-121)
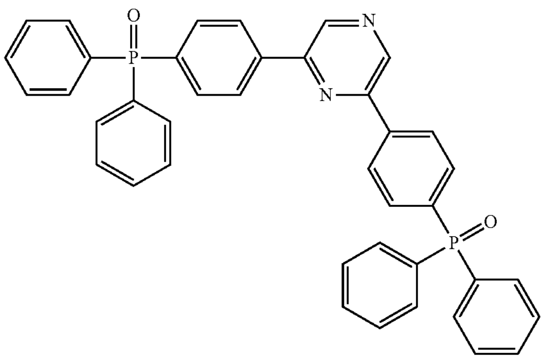
(1-122)
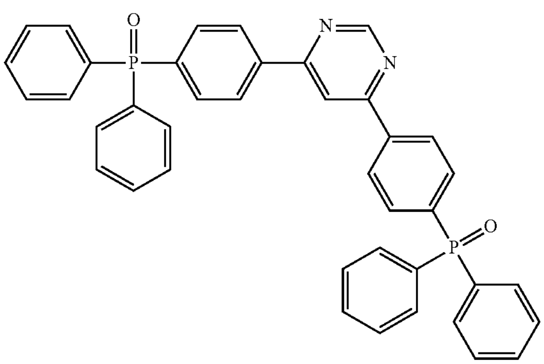
(1-123)
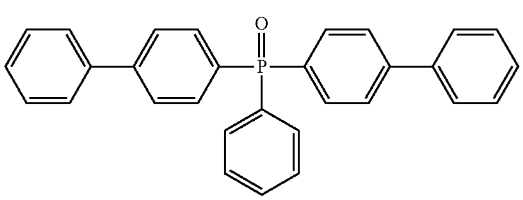
(1-124)
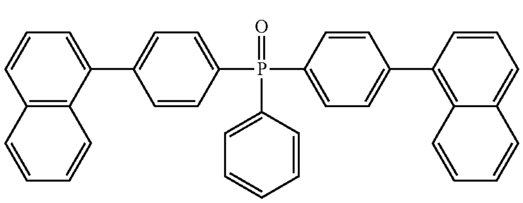
-continued
(1-125)
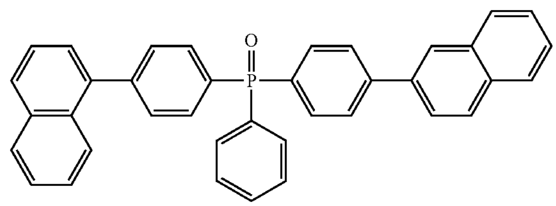
(1-126)
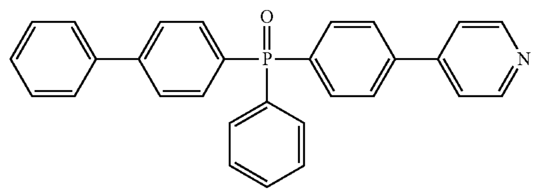
(1-127)
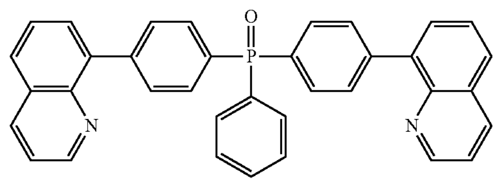
(1-128)
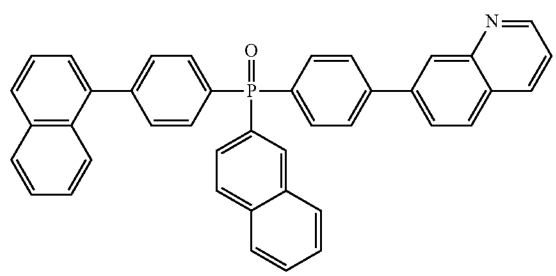
(1-129)
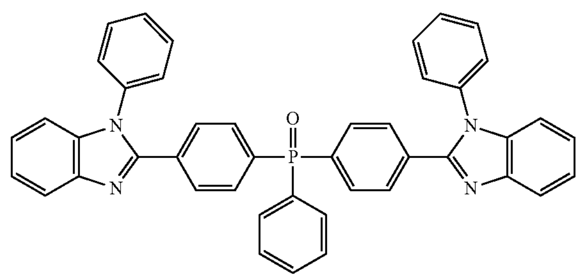
(1-130)
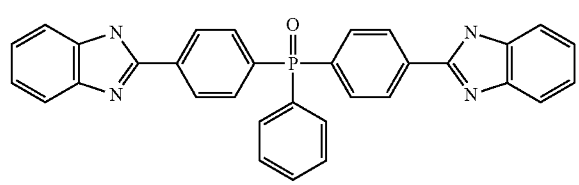
(1-131)
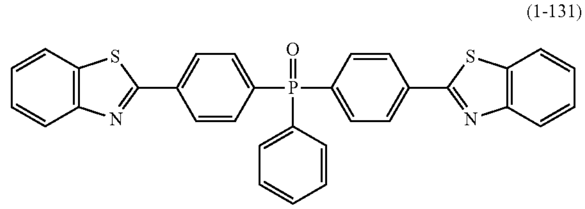

-continued
(1-132)
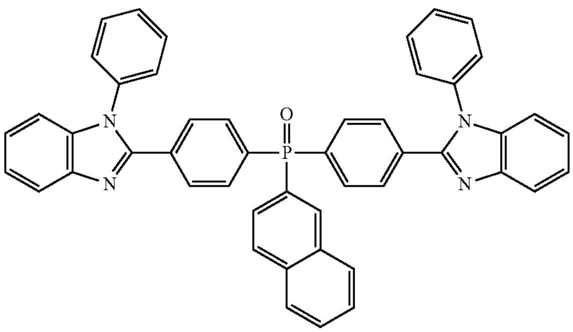
(1-133)
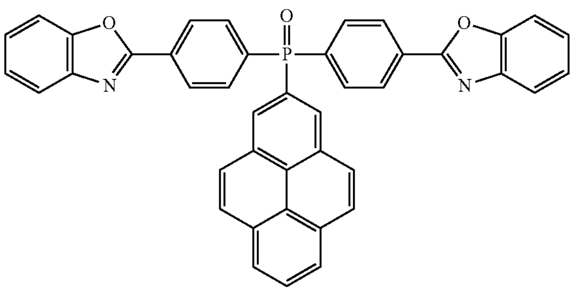
(1-134)
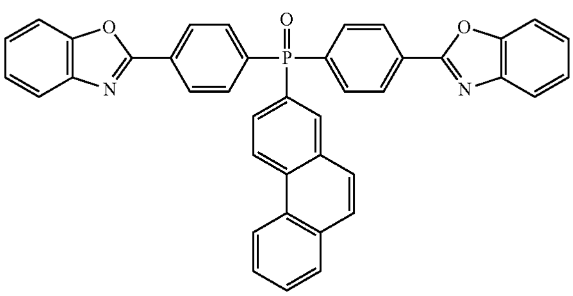
(1-135)
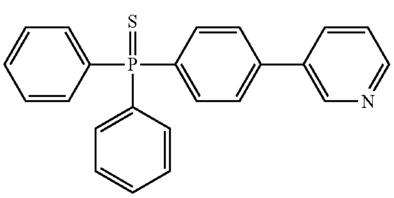
(1-136)
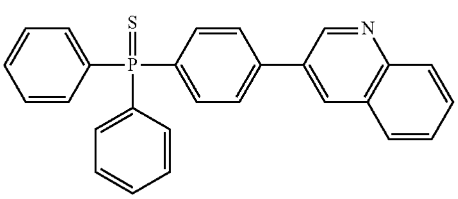
(1-137)
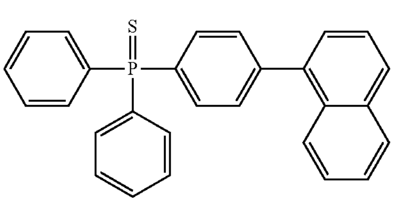
-continued
(1-138)
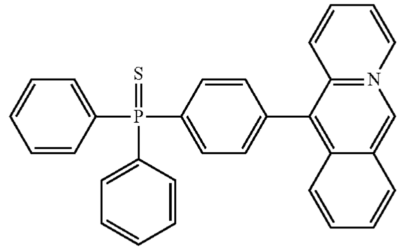
(1-139)
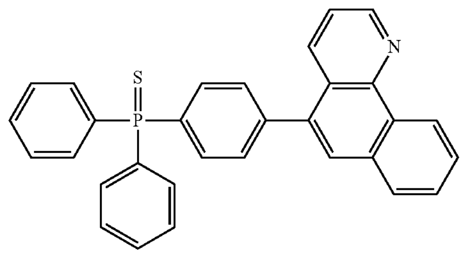
(1-140)
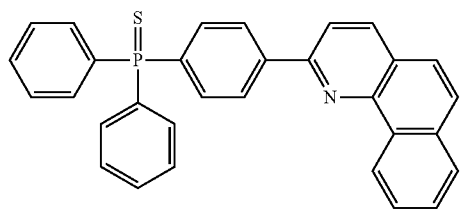
(1-141)
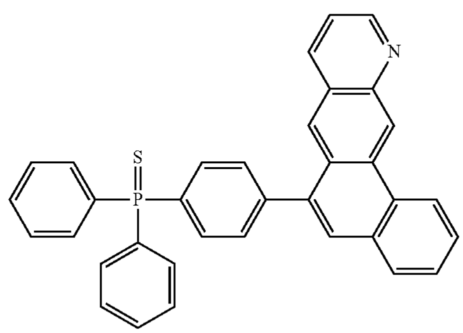
(1-142)
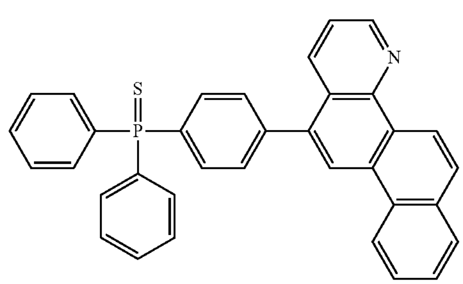

-continued
(1-143)
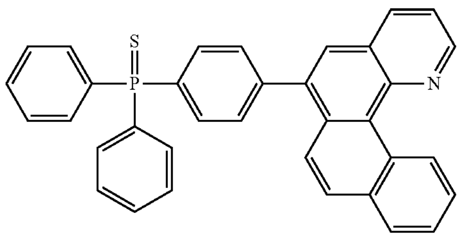
(1-144)
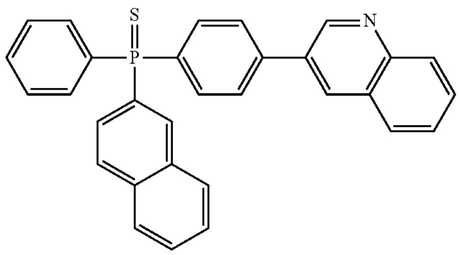
(1-145)
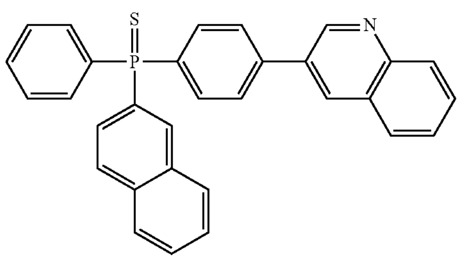
(1-146)
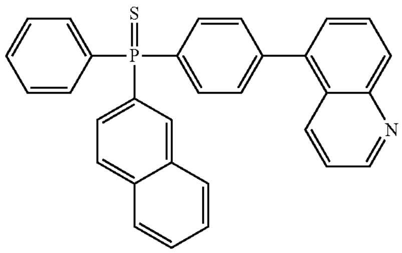
(1-147)
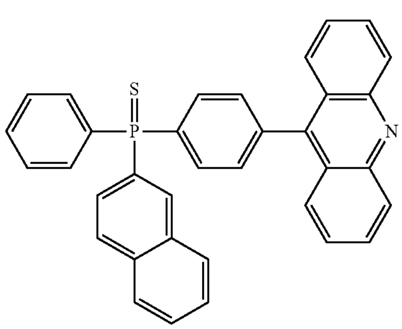
-continued
(1-148)
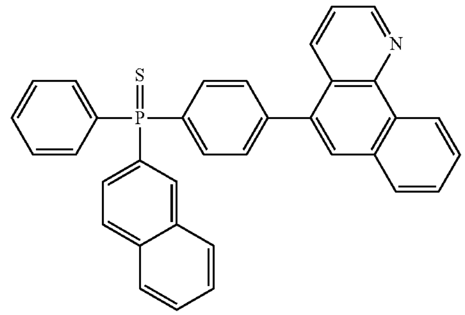
(1-149)
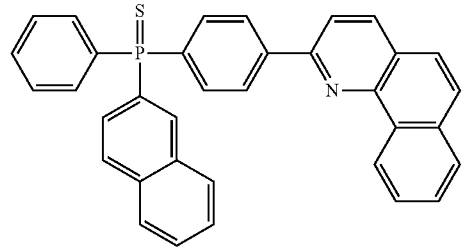
(1-150)
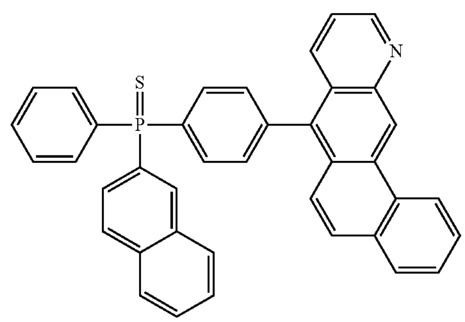
(1-151)
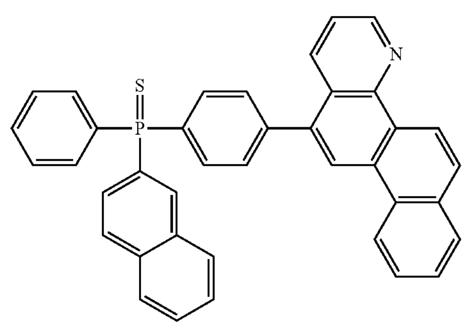
(1-152)
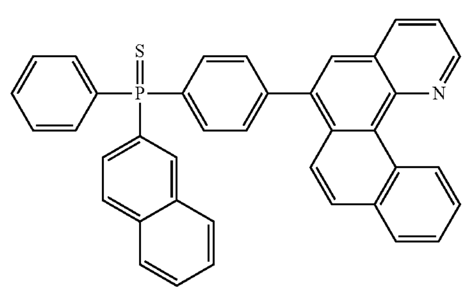

-continued
(1-153)
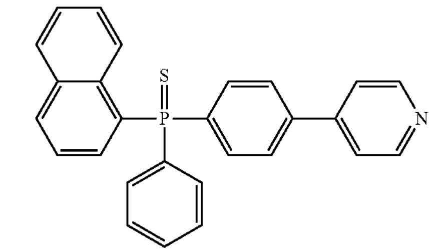
(1-154)
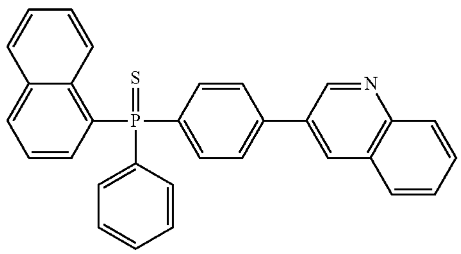
(1-155)
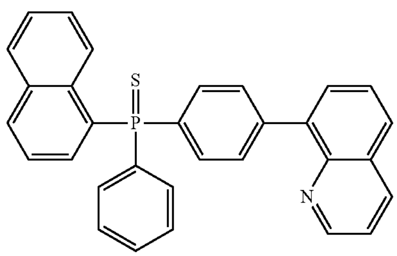
(1-156)
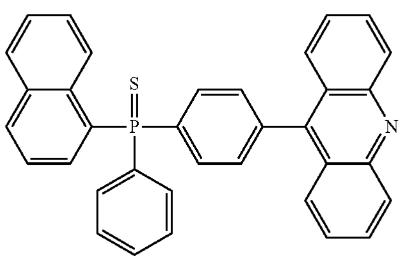
(1-157)
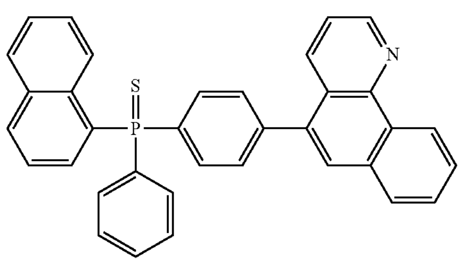
(1-158)
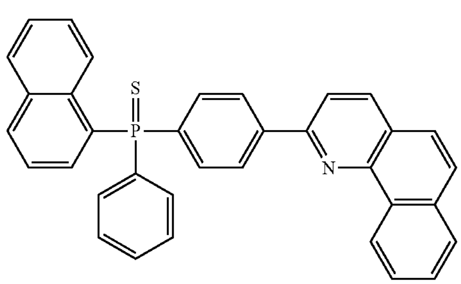
-continued
(1-159)
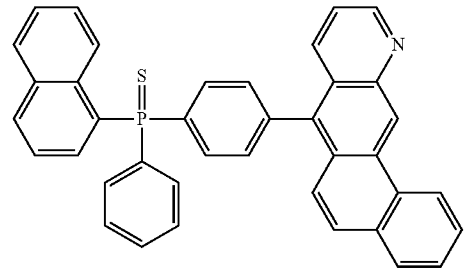
(1-160)
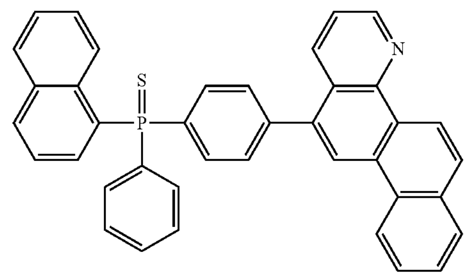
(1-161)
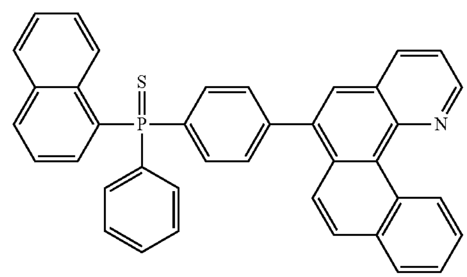
(1-162)
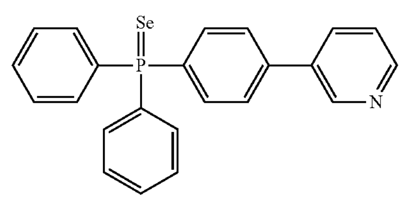
(1-163)
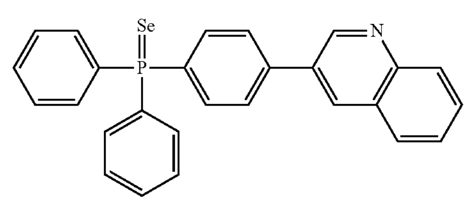
(1-164)
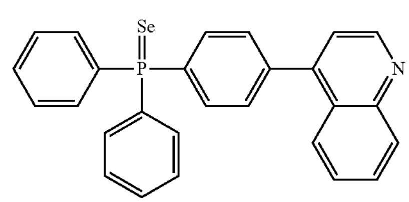

-continued
(1-165)
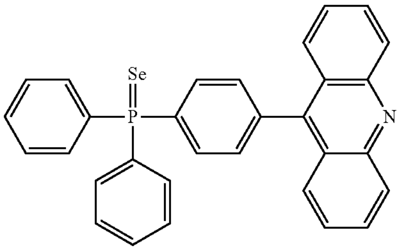
(1-166)
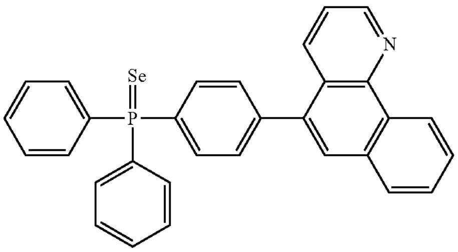
(1-167)
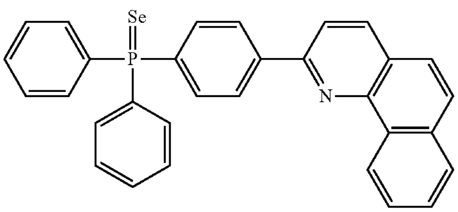
(1-168)
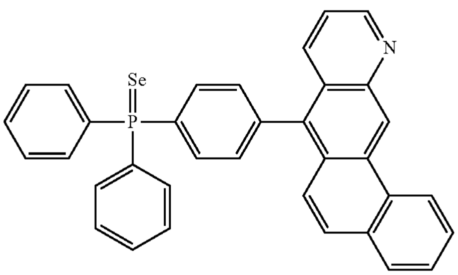
(1-169)
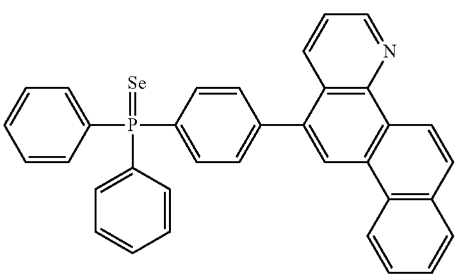
(1-170)
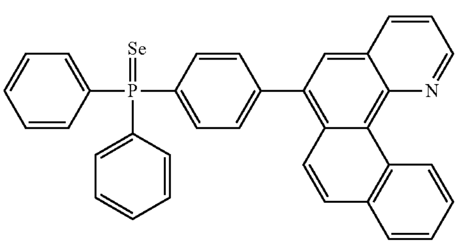
-continued
(1-171)
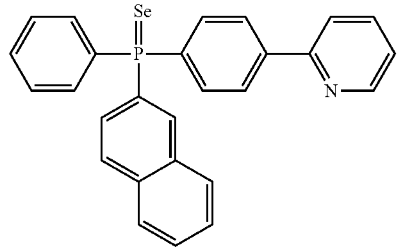
(1-172)
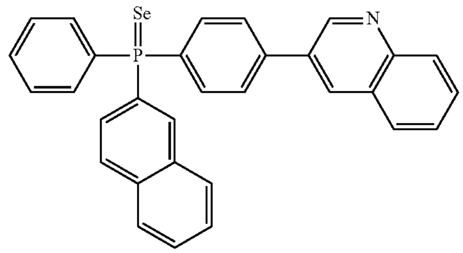
(1-173)
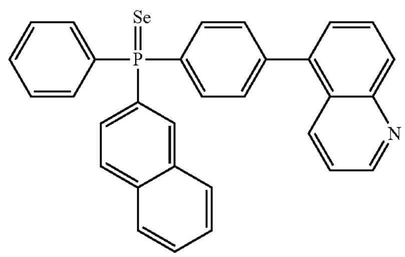
(1-174)
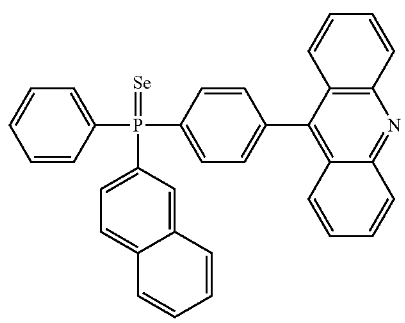
(1-175)
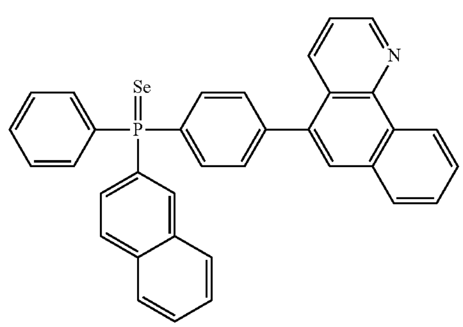

-continued
(1-176)
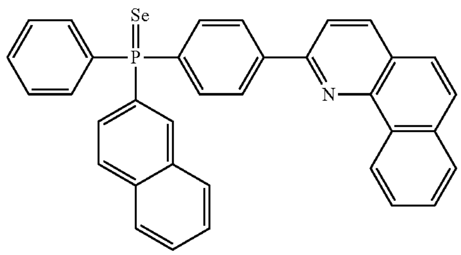
(1-177)
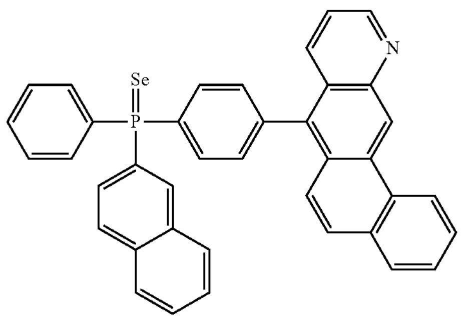
(1-178)
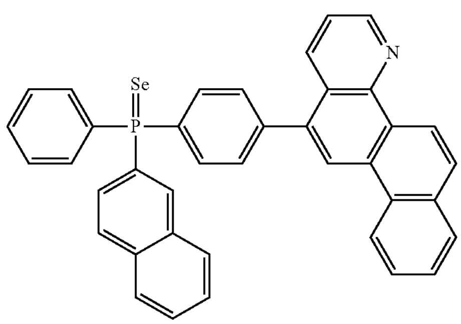
(1-179)
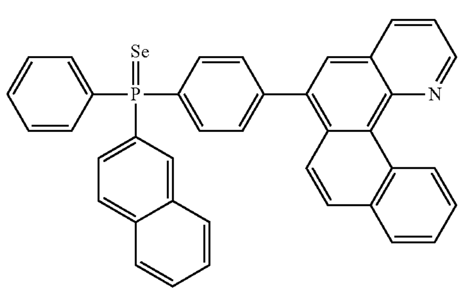
(1-180)
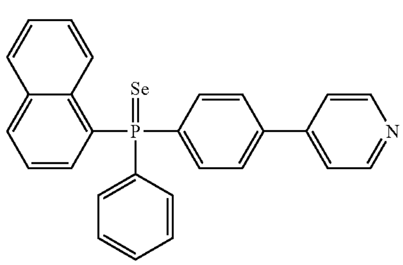
-continued
(1-181)
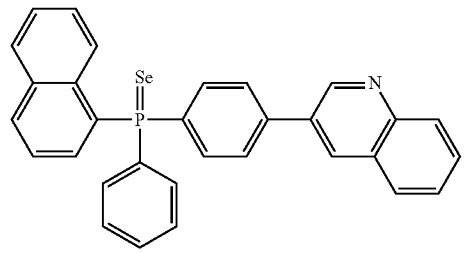
(1-182)
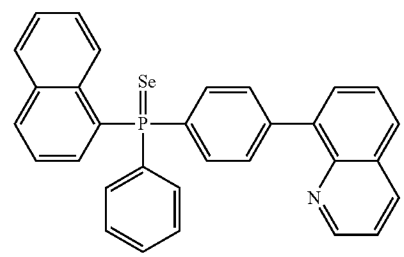
(1-183)
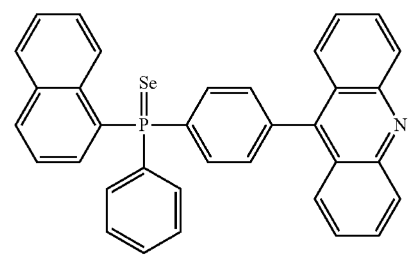
(1-184)
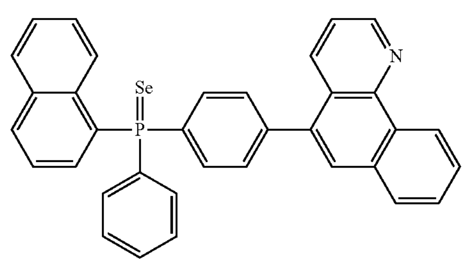
(1-185)
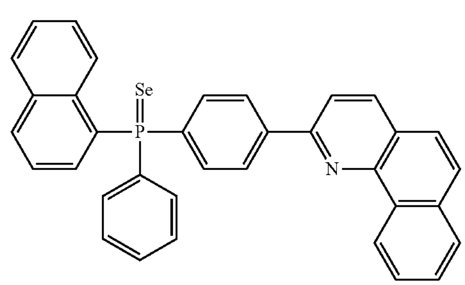

-continued (1-186)

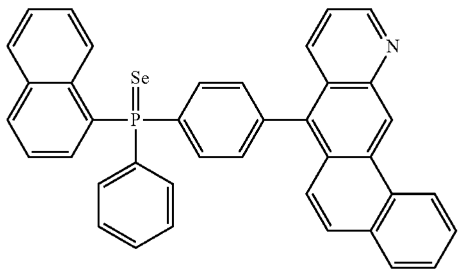

(1-187)

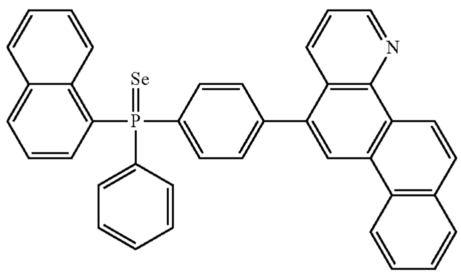

(1-188)

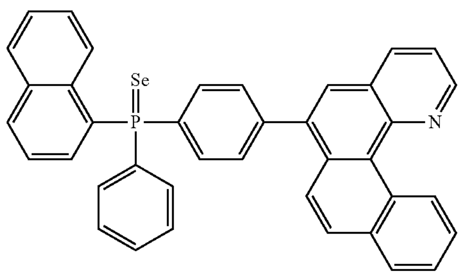

An organic light emitting device according to an embodiment includes: a substrate; gate lines provided on the substrate; data lines and a driving voltage line crossing the gate lines; a switching thin film transistor connected with a gate line and a data line; a driving thin film transistor connected with the switching thin film transistor and the driving voltage line; and an organic light emitting element connected with the driving thin film transistor, wherein the organic light emitting element may include a first compound represented by Chemical Formula 1 and a second compound represented by Chemical Formula 2:

[Chemical Formula 1]

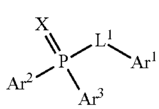

wherein, in Chemical Formula 1, X may be one selected from a group consisting of S, O, and Se, $L^1$ may be an independent single bond, or a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic, $Ar^1$ to $Ar^3$ are equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic,

[Chemical Formula 2]

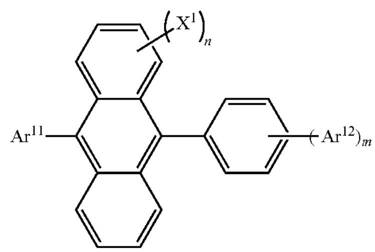

wherein, in Chemical Formula 2, $Ar^{11}$ denotes a substituted or unsubstituted C6 to C30 aryl group or a substituted or unsubstituted C6 to C30 heteroaryl group, m denotes an integer of 0 to 3, $Ar^{12}$ denotes a substituted or unsubstituted C5 to C30 aryl group or a substituted or unsubstituted C5 to C30 heteroaryl group, when m is 2 or more, each $Ar^{12}$ may be equal to or different from one another, $X^1$ denotes hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C60 arylsilyl group, a substituted or unsubstituted ring-type C6 to C30 aromatic hydrocarbon group, a substituted or unsubstituted C6 to C30 condensed aromatic hydrocarbon group, a substituted or unsubstituted ring-type C2 to C30 aromatic heterocyclic ring-type group, or a substituted or unsubstituted C2 to C30 condensed aromatic heterocyclic ring-type group, n is an integer of 0 to 8, and when n is 2 or more, each $X^1$ is equal to or different from one another.

The organic light emitting element may include: an anode and a cathode that face each other; an emission layer provided between the anode and the cathode; a hole transfer layer provided between the anode and the emission layer; and an electron transfer layer provided between the cathode and the emission layer, wherein the electron transfer layer may include the first compound, and the emission layer may include the second compound.

The first compound may be a compound represented by Chemical Formula 3:

[Chemical Formula 3]

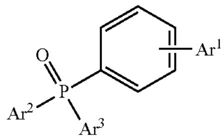

wherein, in Chemical Formula 3, $Ar^1$ to $Ar^3$ are equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic.

The first compound may be one selected from a group consisting of compounds represented by Chemical Formula 1-1 to Chemical Formula 1-188:

(1-1)

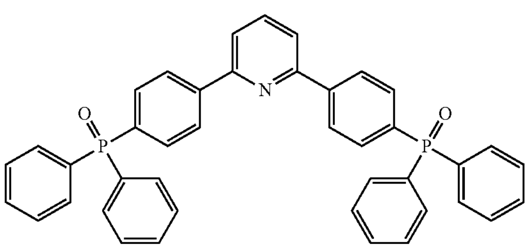

(1-2)

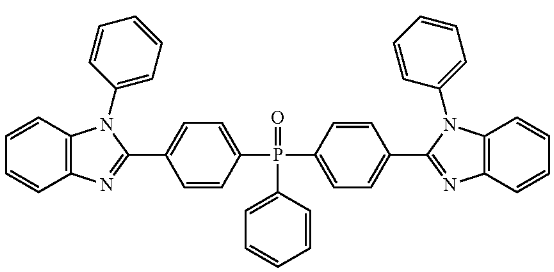

(1-3)

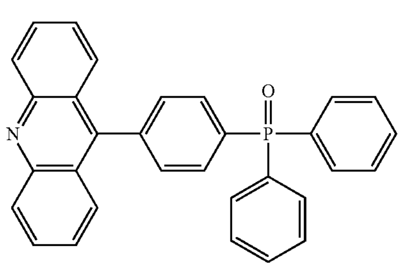

-continued (1-4)

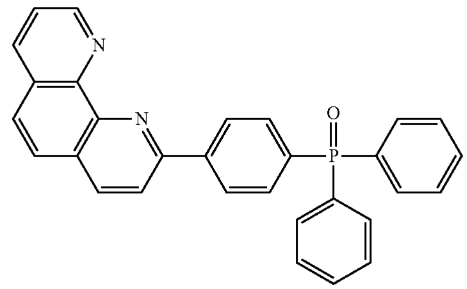

(1-5)

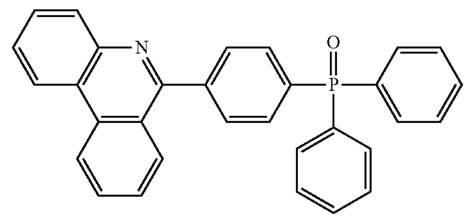

(1-6)

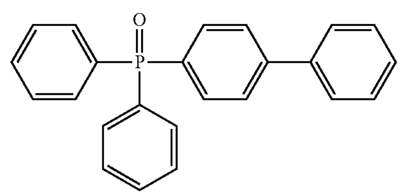

(1-7)

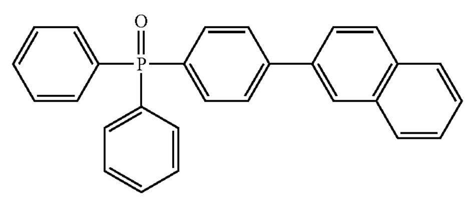

(1-8)

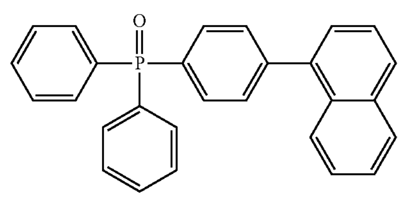

(1-9)

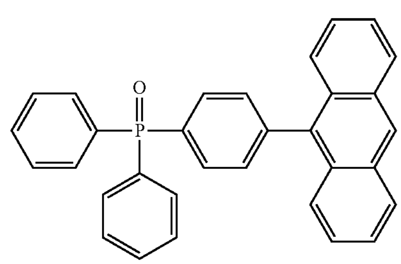

(1-10)

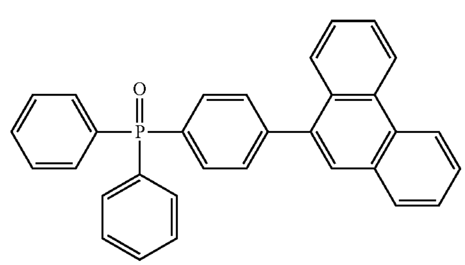

-continued
(1-11)
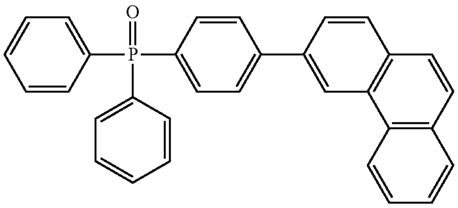
(1-12)
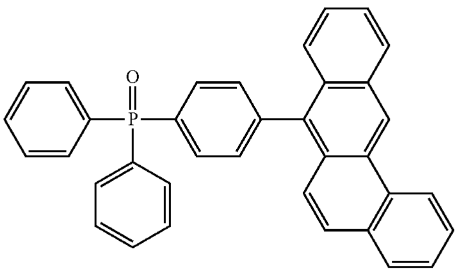
(1-13)
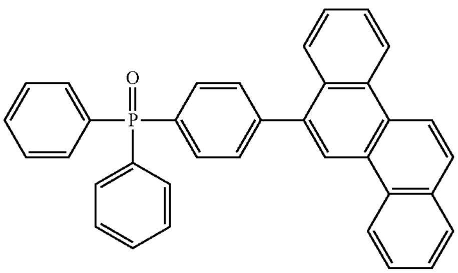
(1-14)
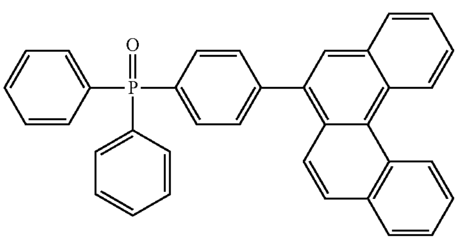
(1-15)
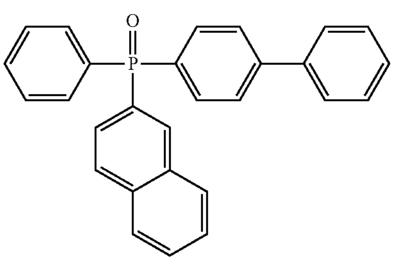
(1-16)
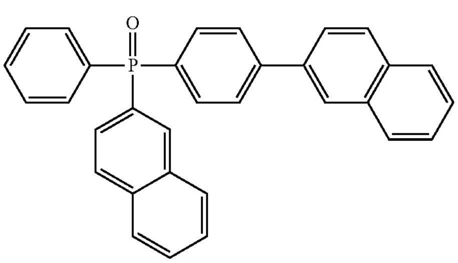
-continued
(1-17)
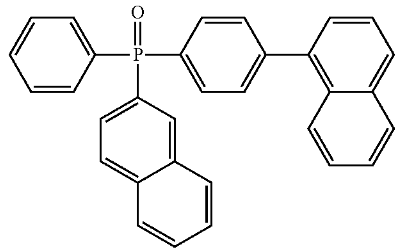
(1-18)
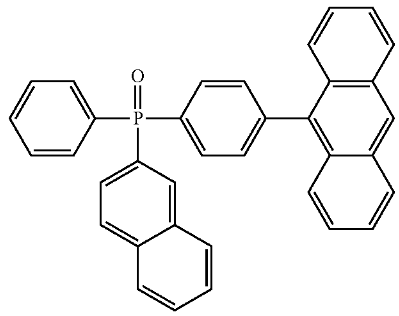
(1-19)
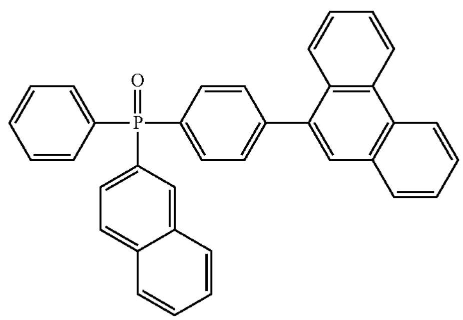
(1-20)
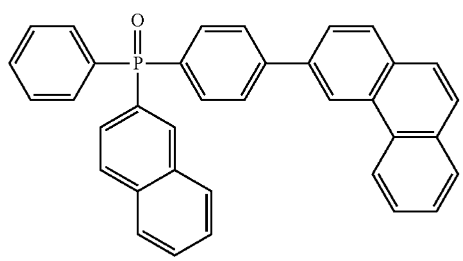
(1-21)
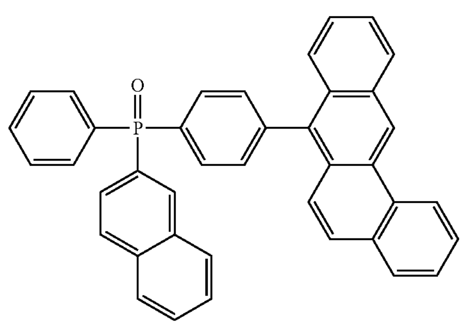

-continued
(1-22)
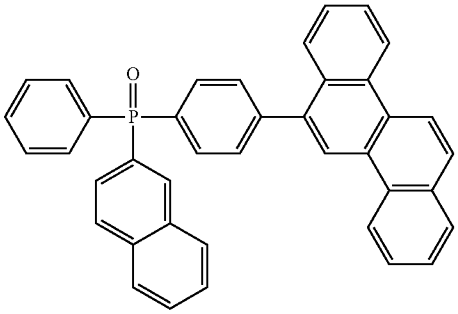
(1-23)
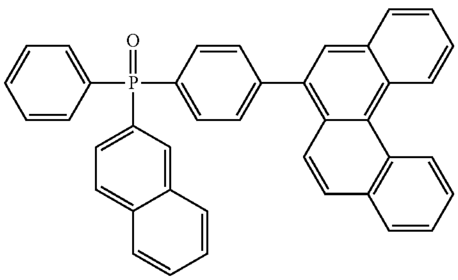
(1-24)
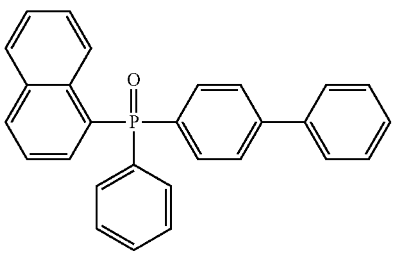
(1-25)
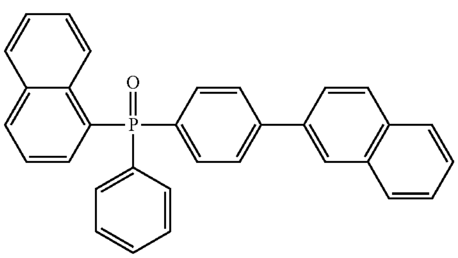
(1-26)
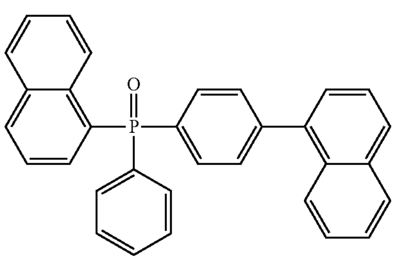
(1-27)
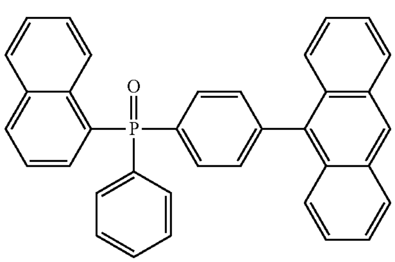
-continued
(1-28)
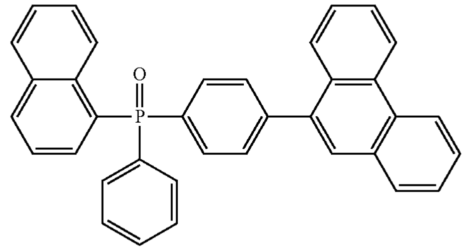
(1-29)
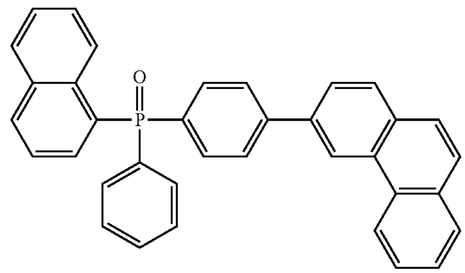
(1-30)
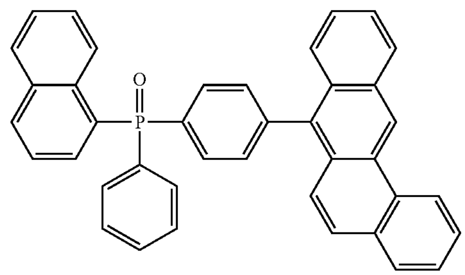
(1-31)
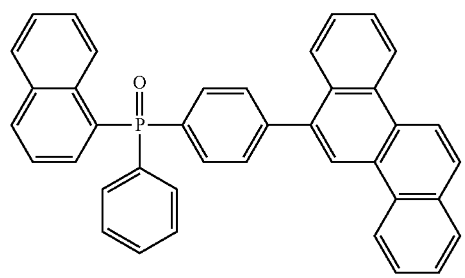
(1-32)
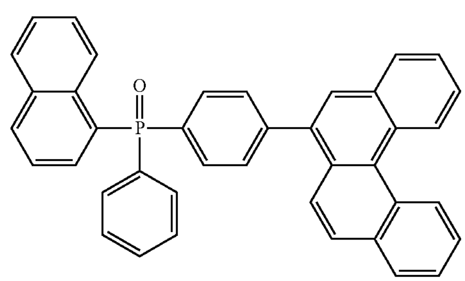
(1-33)
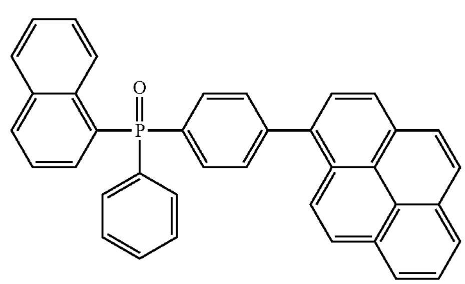

-continued
(1-34)
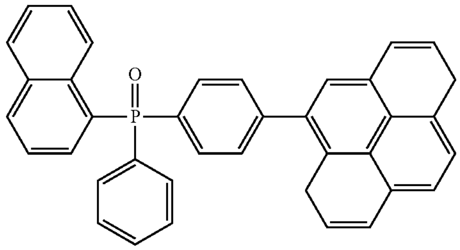
(1-35)
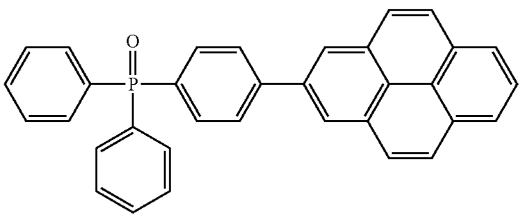
(1-36)
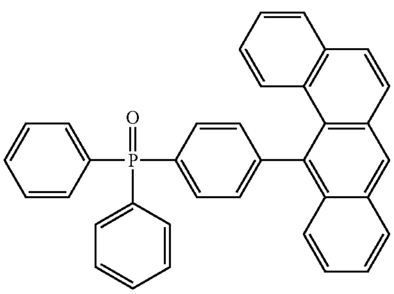
(1-37)
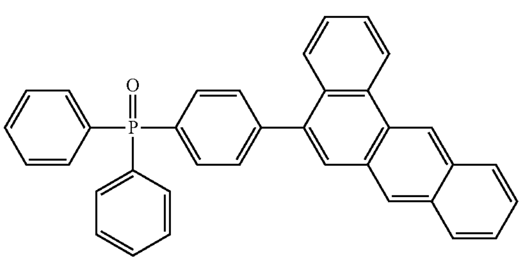
(1-38)
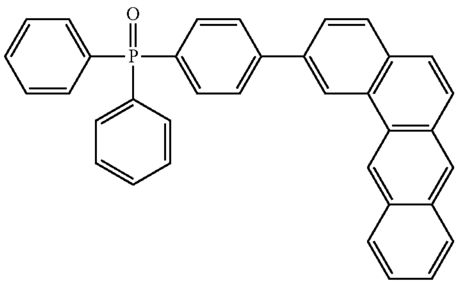
-continued
(1-39)
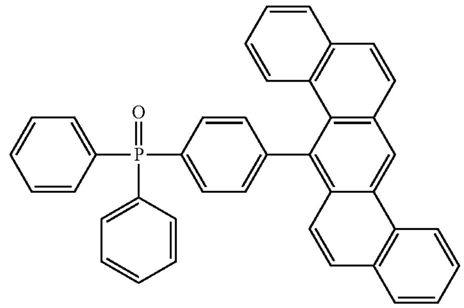
(1-40)
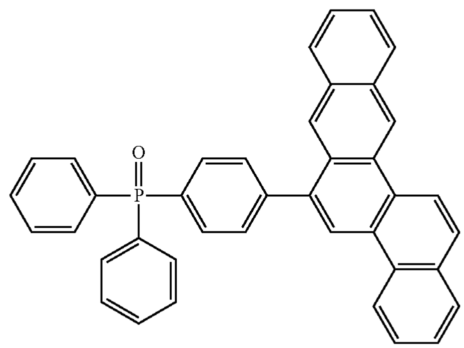
(1-41)
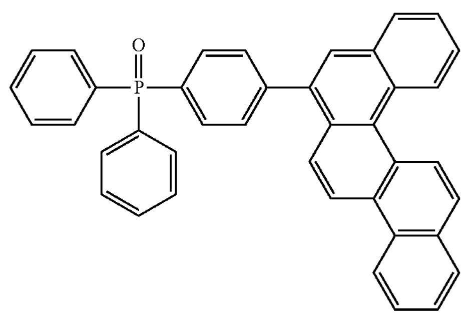
(1-42)
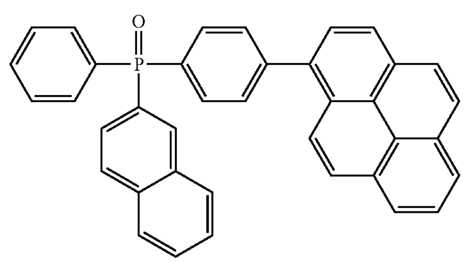
(1-43)
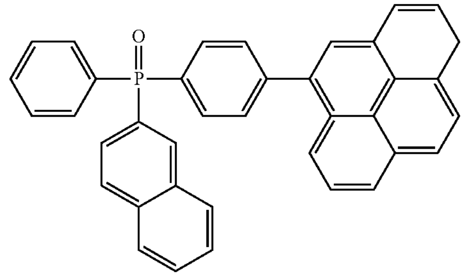

-continued
(1-44)
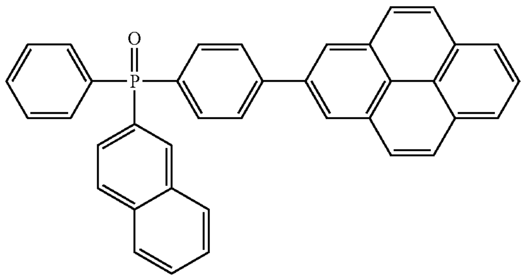
(1-45)
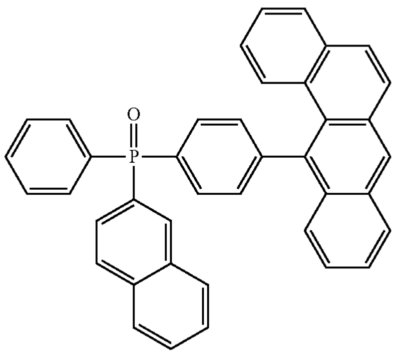
(1-46)
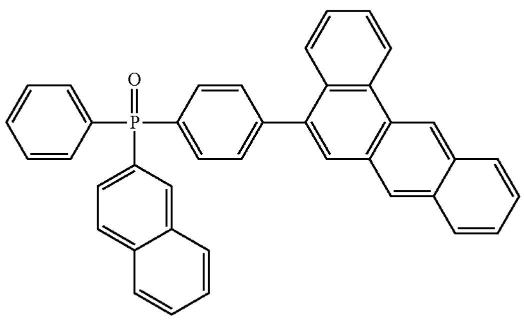
(1-47)
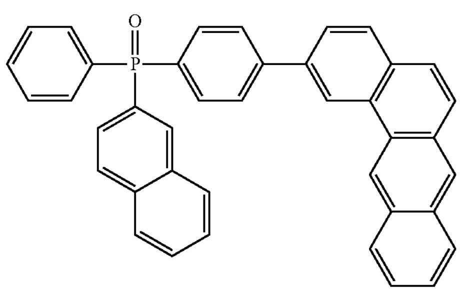
(1-48)
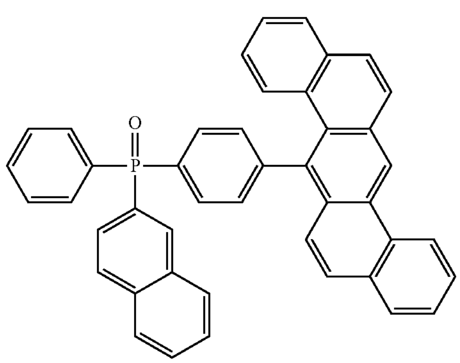
-continued
(1-49)
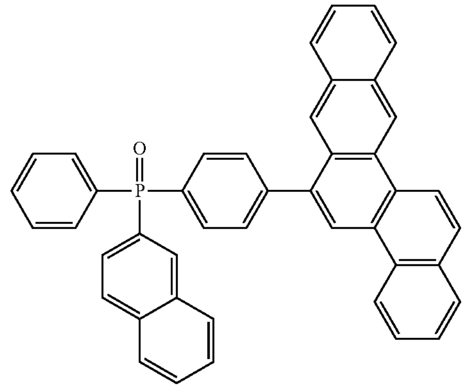
(1-50)
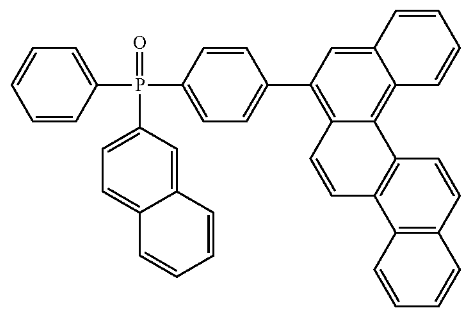
(1-51)
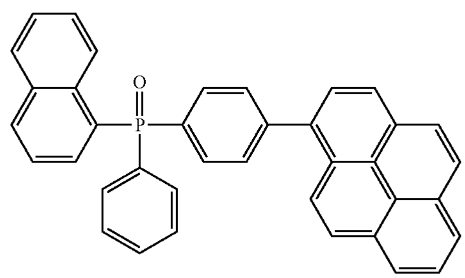
(1-52)
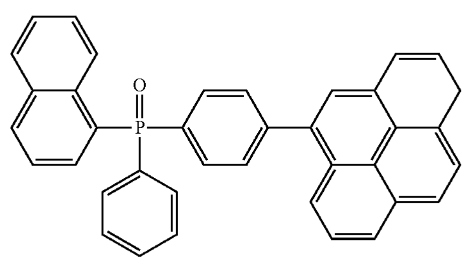
(1-53)
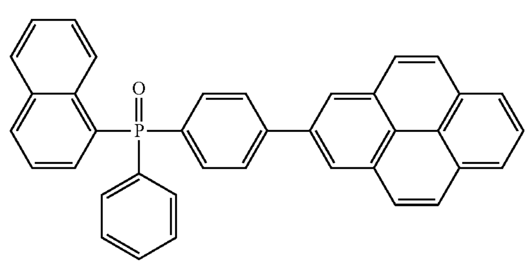

-continued
(1-54)
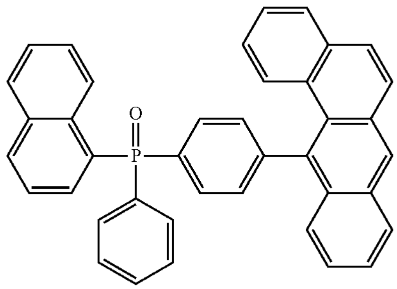
(1-55)
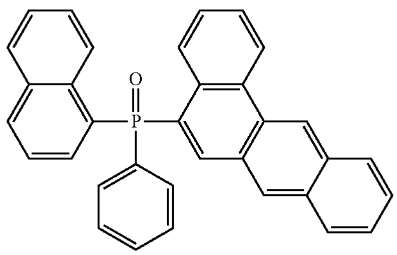
(1-56)
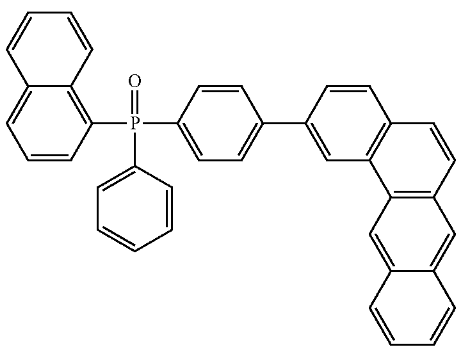
(1-57)
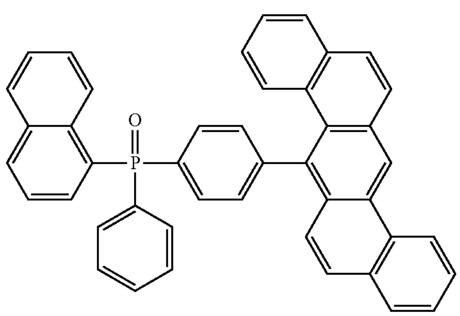
(1-58)
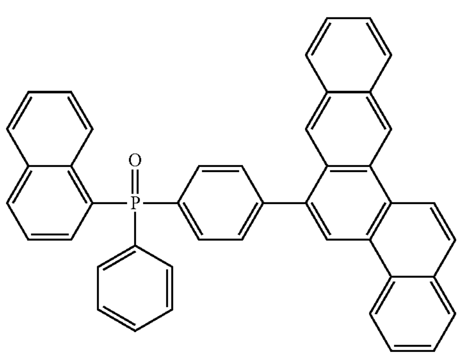
-continued
(1-59)
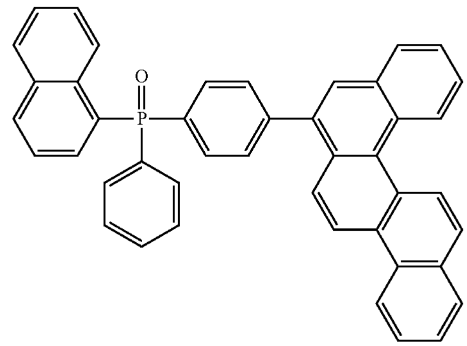
(1-60)
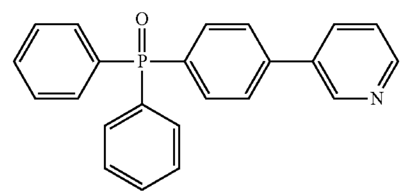
(1-61)
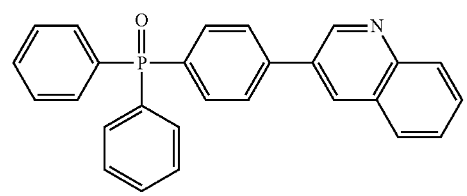
(1-62)
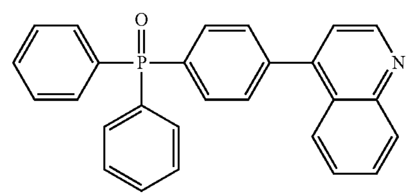
(1-63)
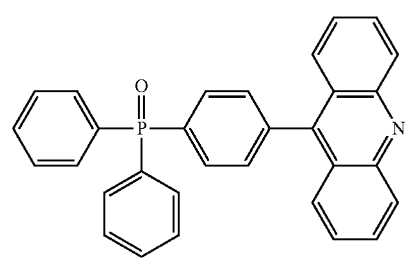
(1-64)
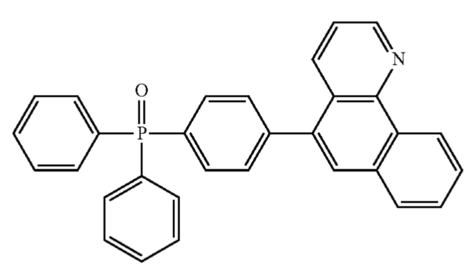

-continued
(1-65)
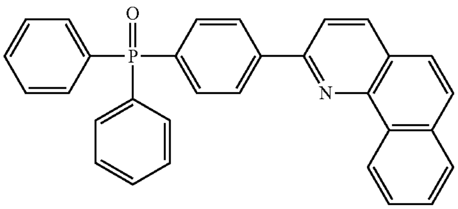
(1-66)
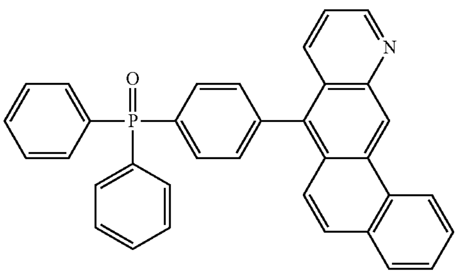
(1-67)
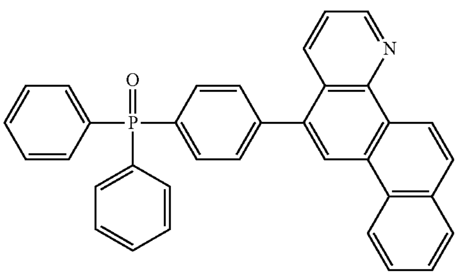
(1-68)
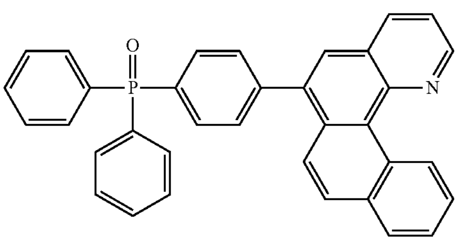
(1-69)
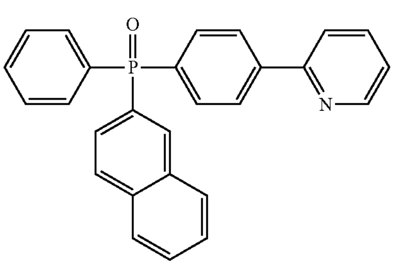
(1-70)
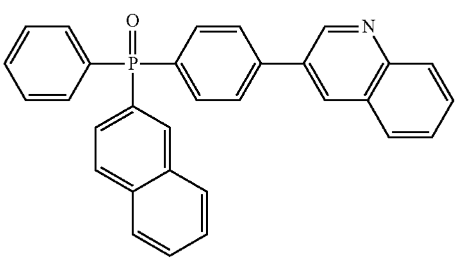
-continued
(1-71)
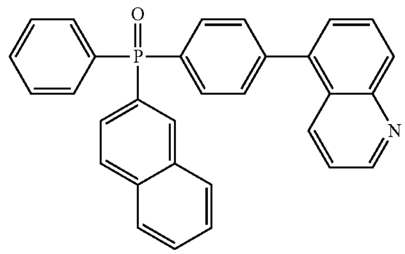
(1-72)
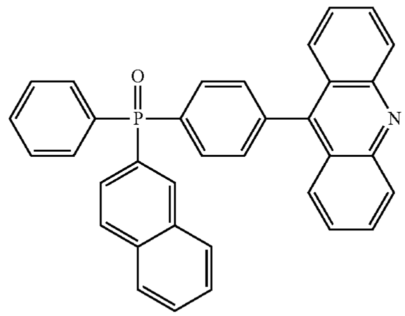
(1-73)
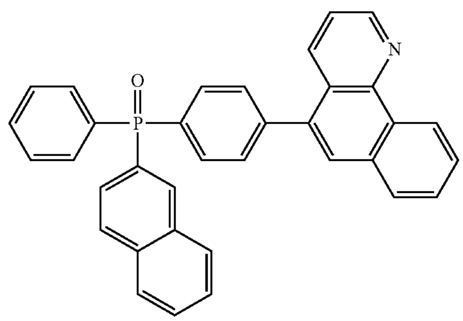
(1-74)
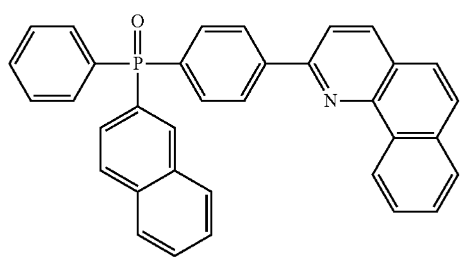
(1-75)
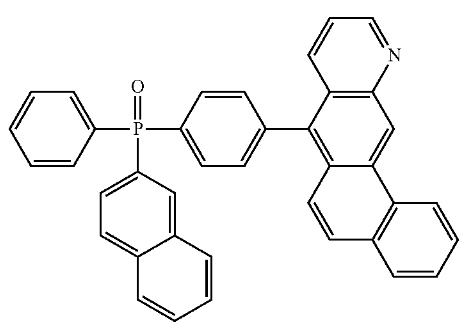

-continued
(1-76)
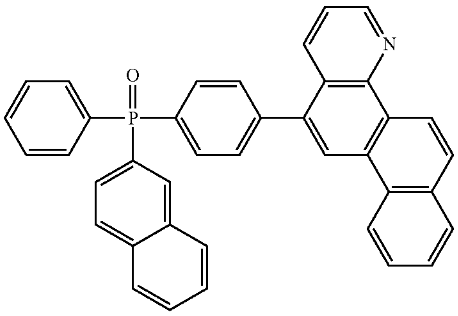
(1-77)
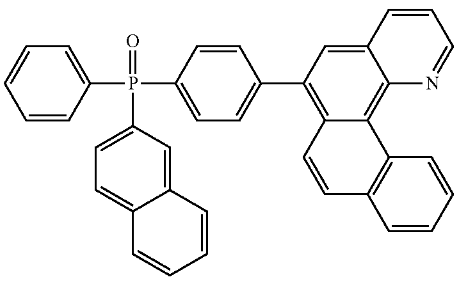
(1-78)
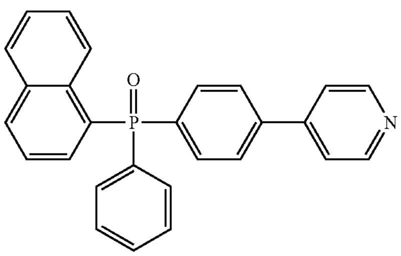
(1-79)
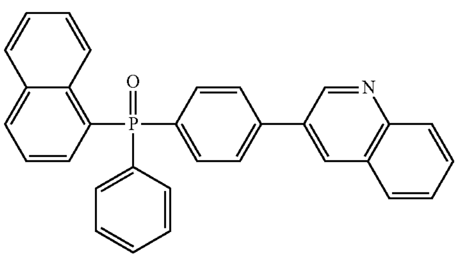
(1-80)
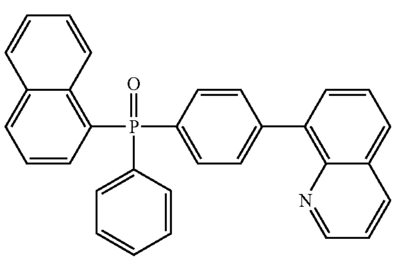
(1-81)
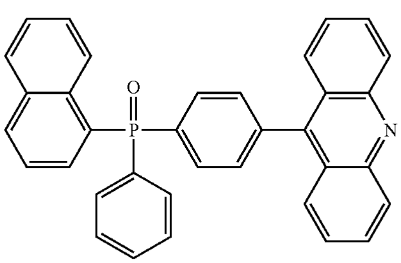
-continued
(1-82)
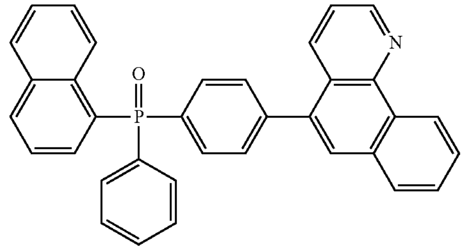
(1-83)
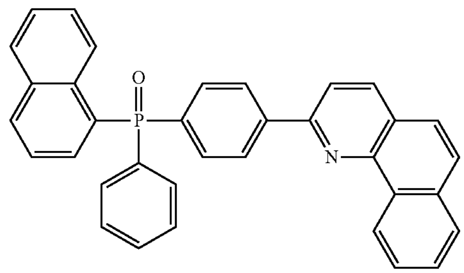
(1-84)
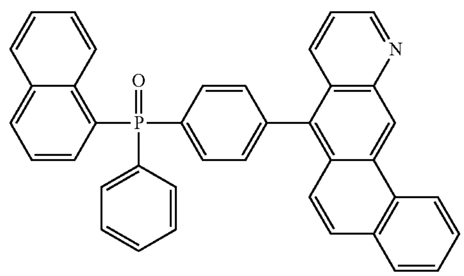
(1-85)
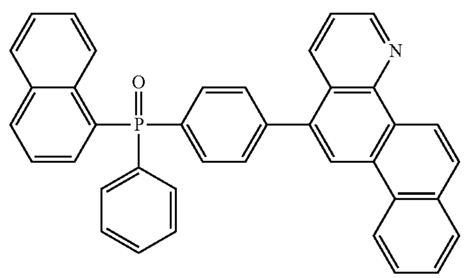
(1-86)
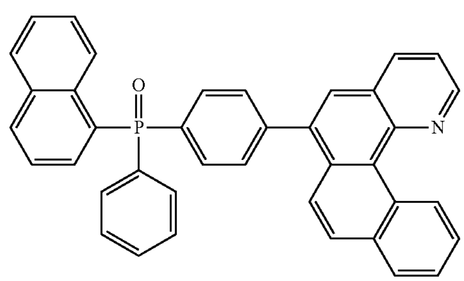
(1-87)
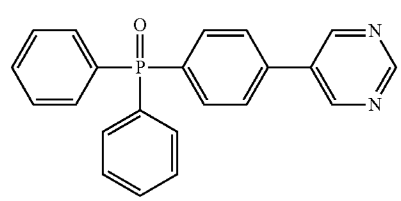

-continued
(1-88)
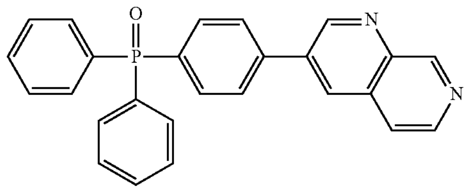
(1-89)
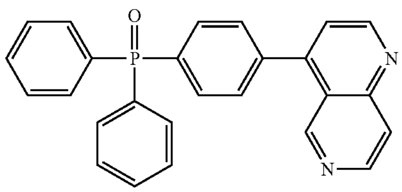
(1-90)
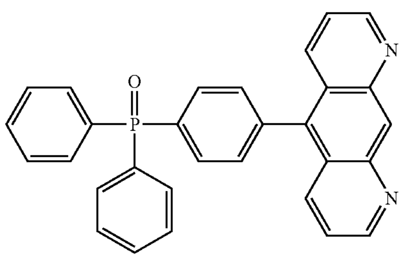
(1-91)
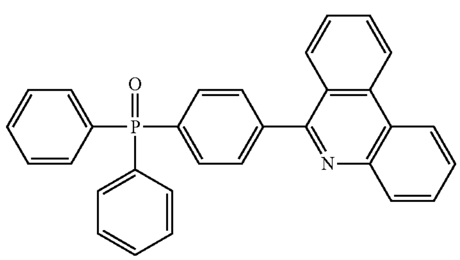
(1-92)
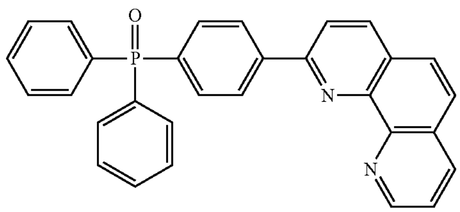
(1-93)
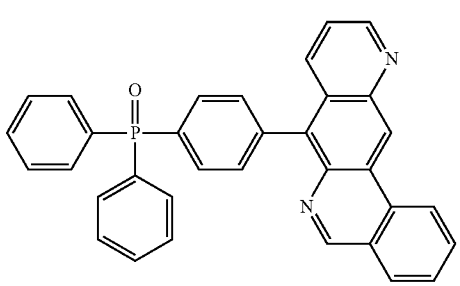
-continued
(1-94)
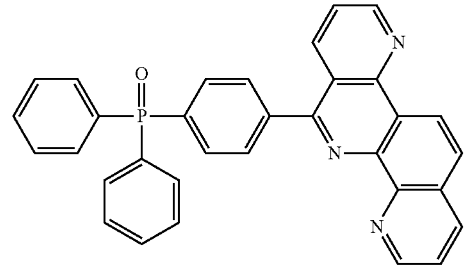
(1-95)
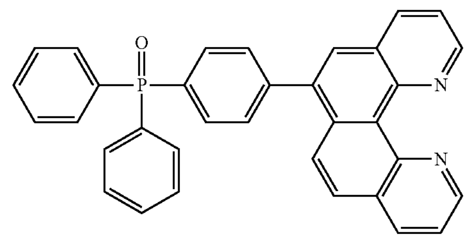
(1-96)
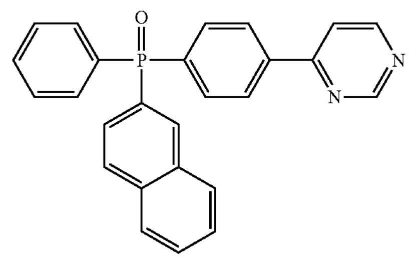
(1-97)
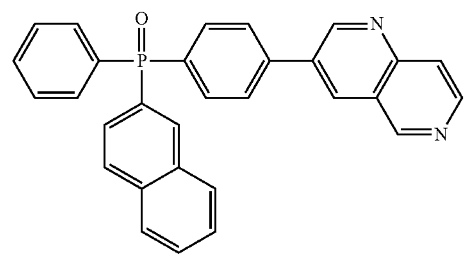
(1-98)
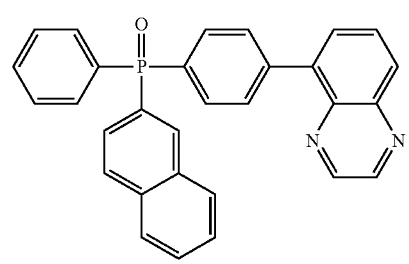
(1-99)
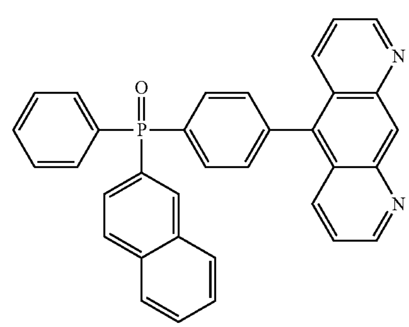

-continued
(1-100)
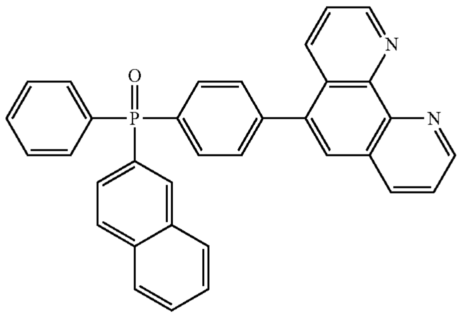
(1-101)
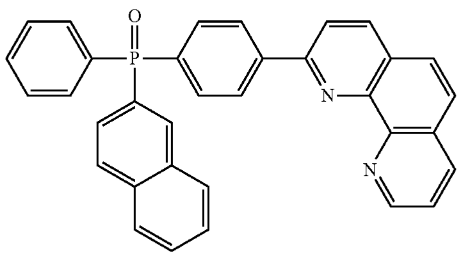
(1-102)
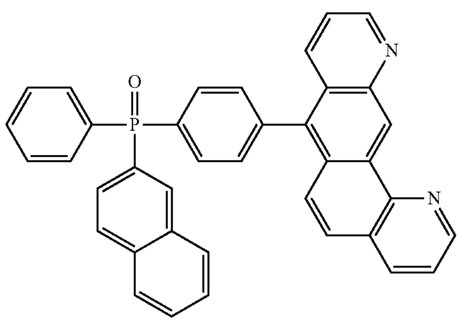
(1-103)
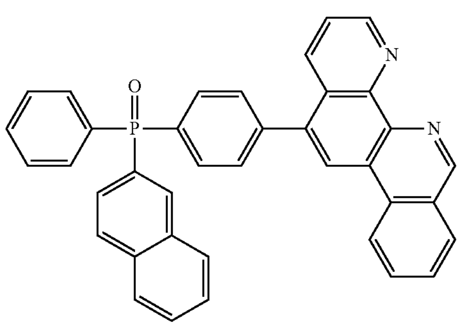
(1-104)
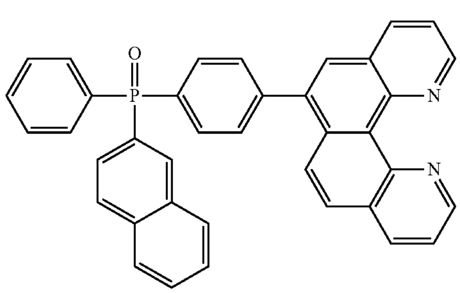
-continued
(1-105)
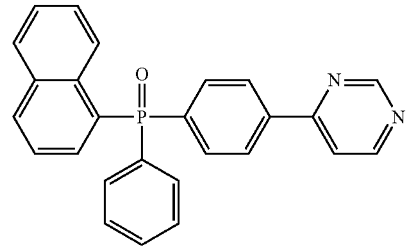
(1-106)
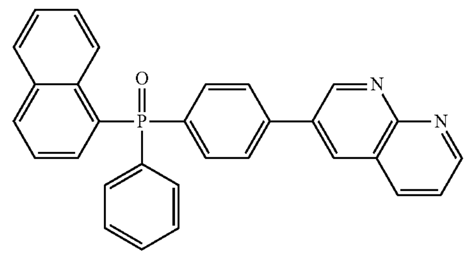
(1-107)
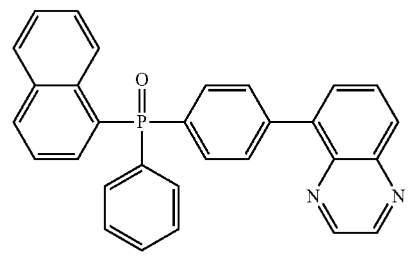
(1-108)
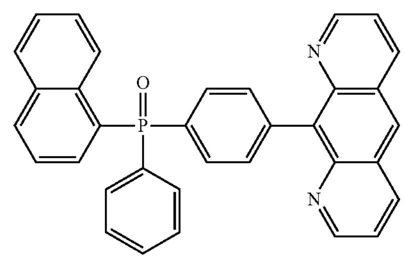
(1-109)
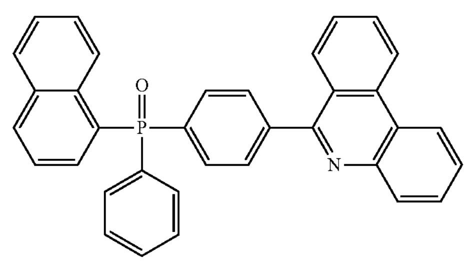
(1-110)
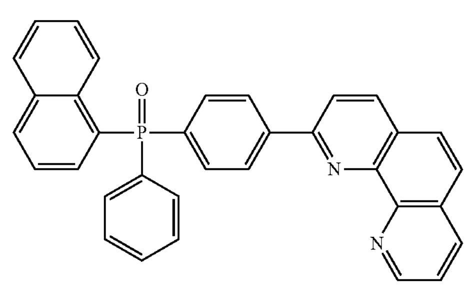

-continued
(1-111)
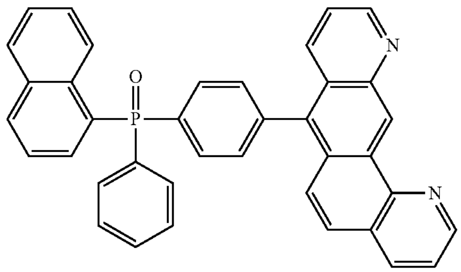
(1-112)
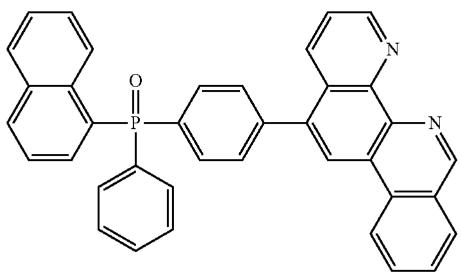
(1-113)
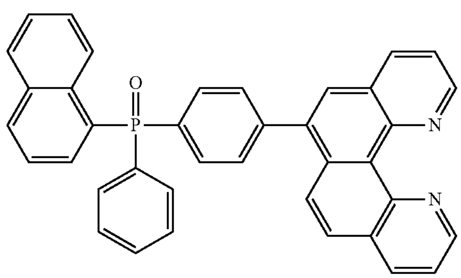
(1-114)
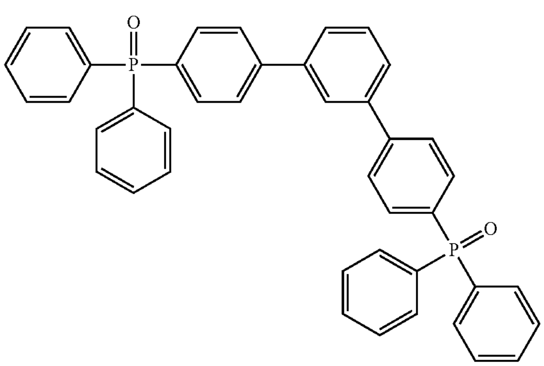
(1-115)
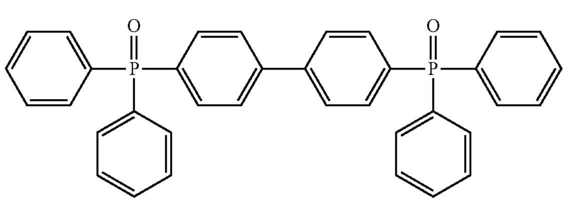
-continued
(1-116)
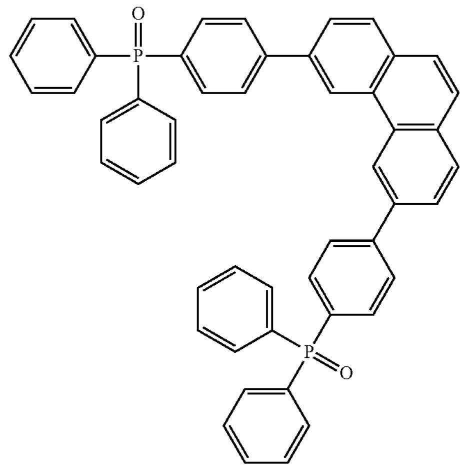
(1-117)
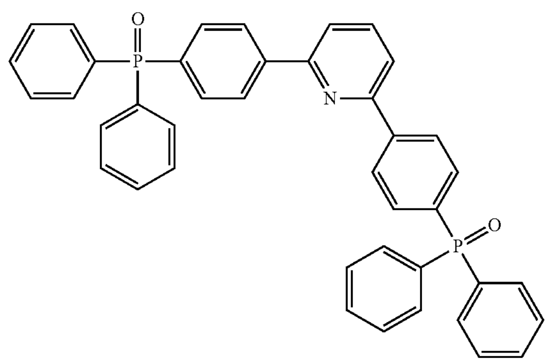
(1-118)
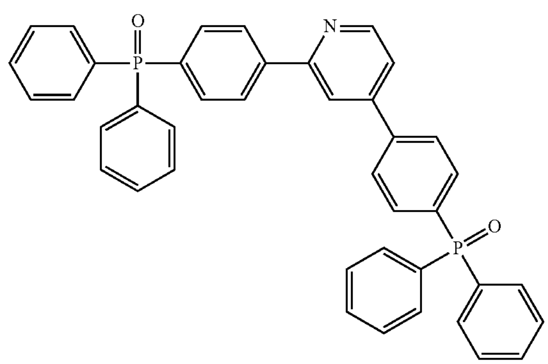
(1-119)
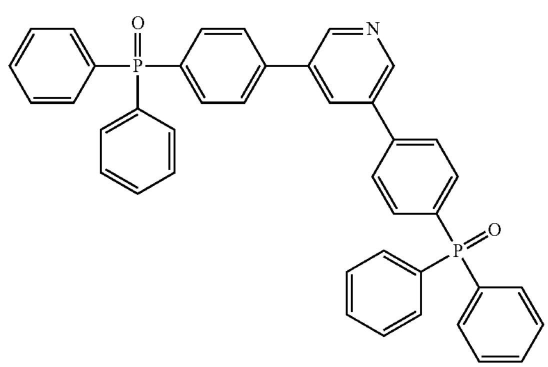

-continued
(1-120)
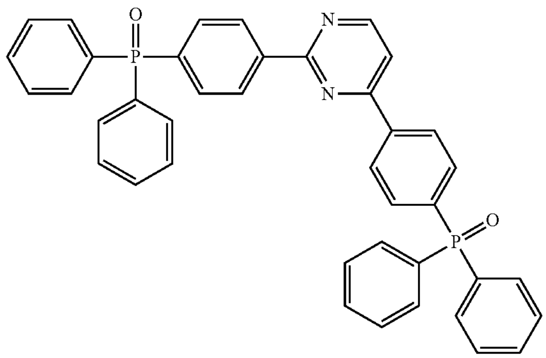
(1-121)
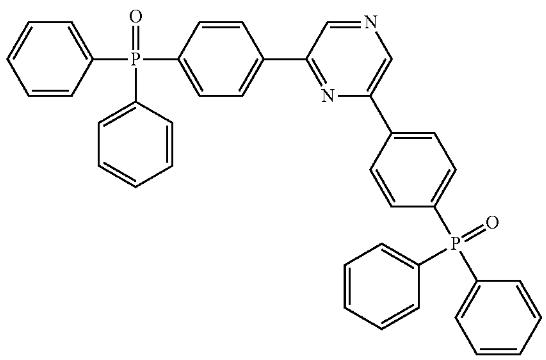
(1-122)
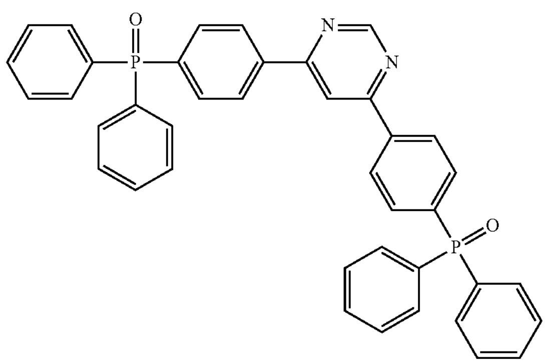
(1-123)
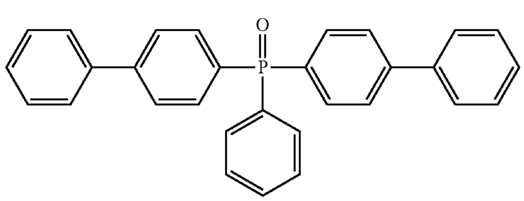
(1-124)
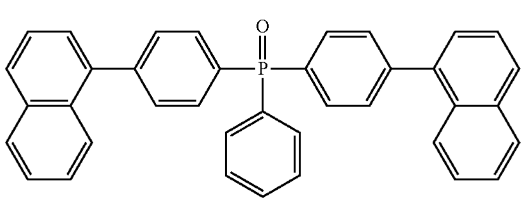
-continued
(1-125)
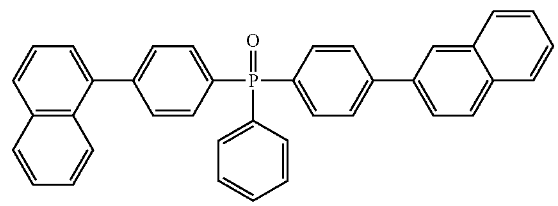
(1-126)
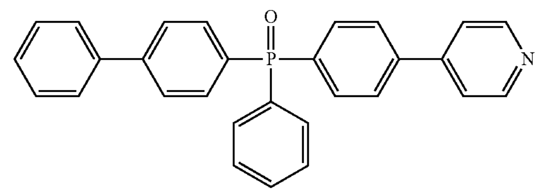
(1-127)
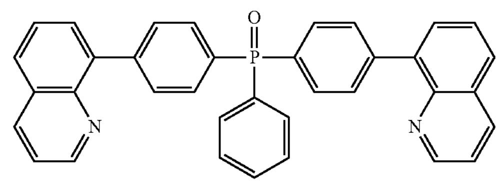
(1-128)
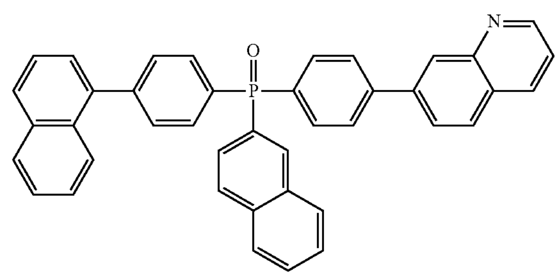
(1-129)
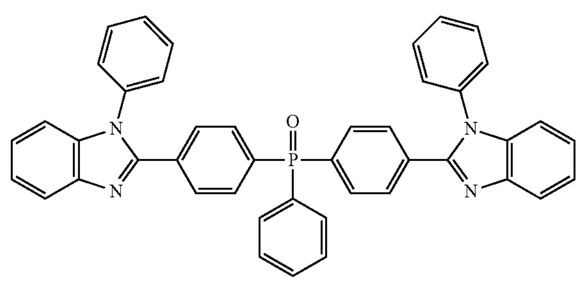
(1-130)
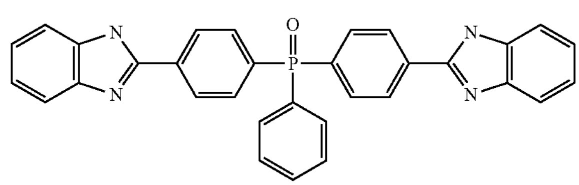
(1-131)
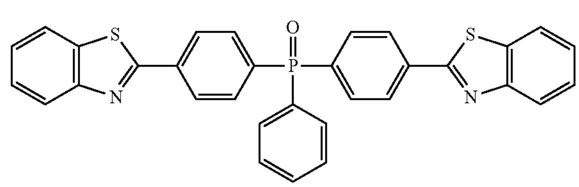

-continued
(1-132)
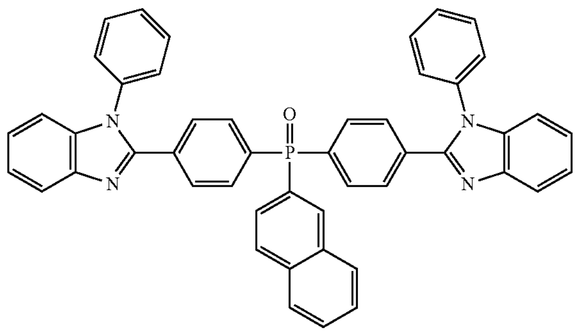
(1-133)
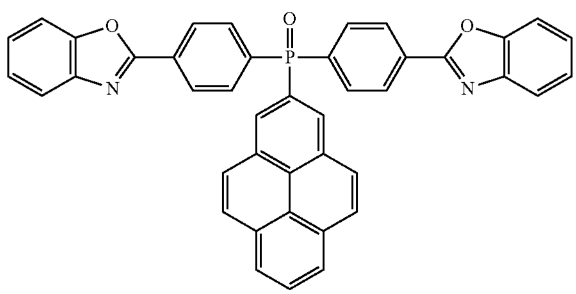
(1-134)
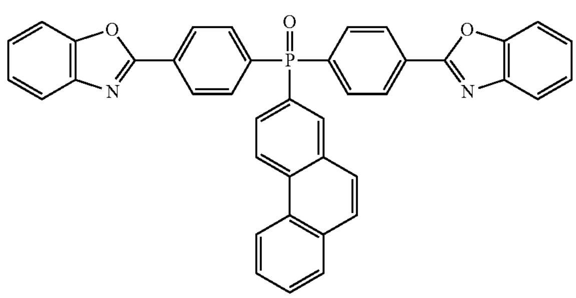
(1-135)
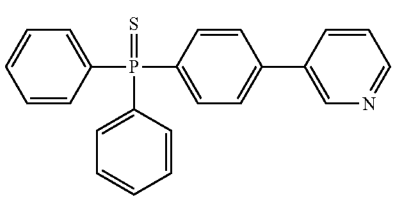
(1-136)
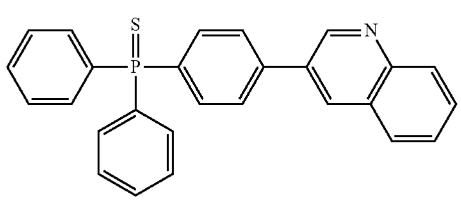
(1-137)
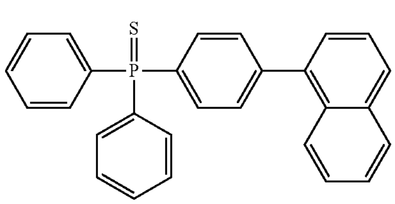
-continued
(1-138)
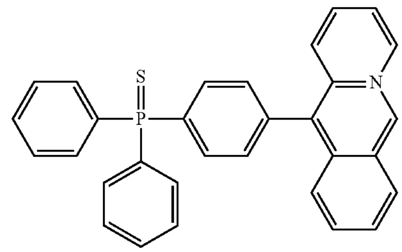
(1-139)
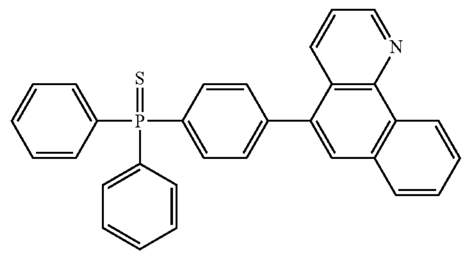
(1-140)
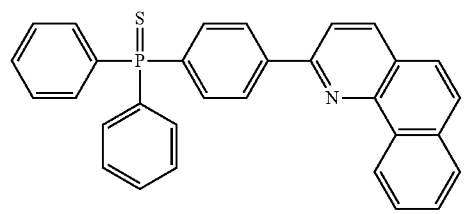
(1-141)
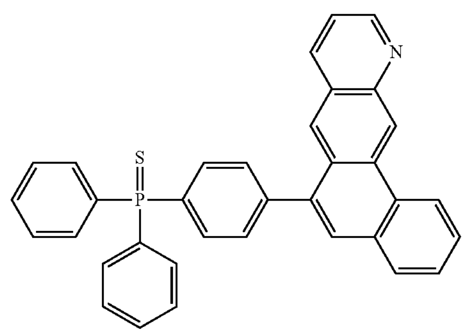
(1-142)
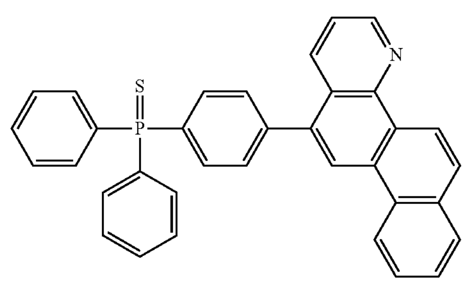
(1-143)
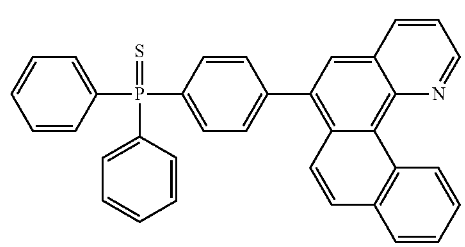

-continued
(1-144)
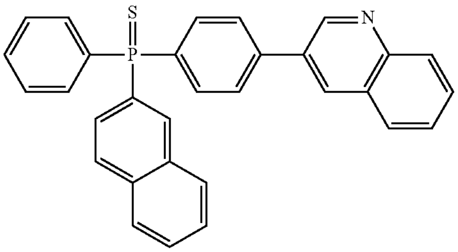
(1-145)
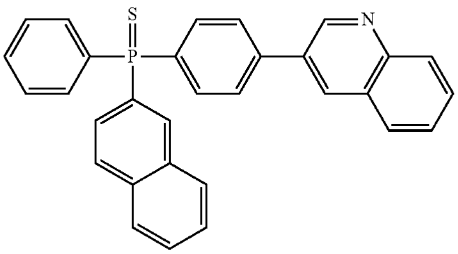
(1-146)
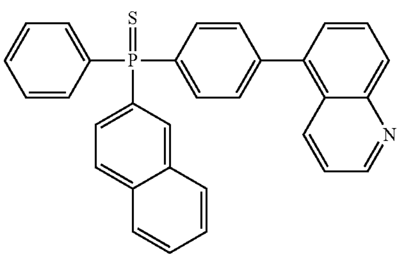
(1-147)
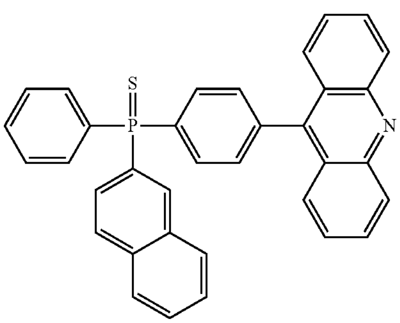
(1-148)
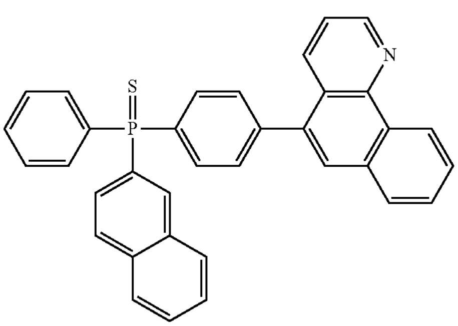
-continued
(1-149)
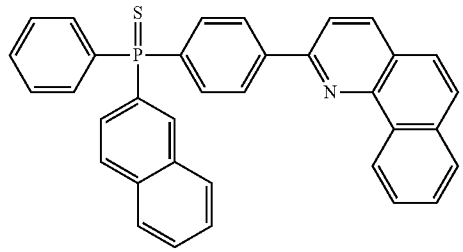
(1-150)
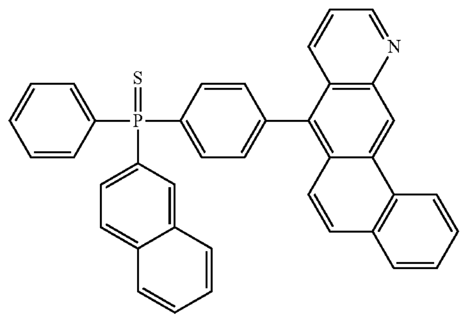
(1-151)
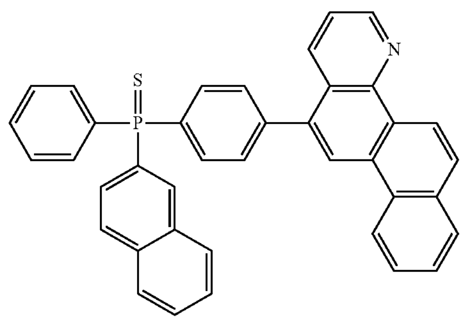
(1-152)
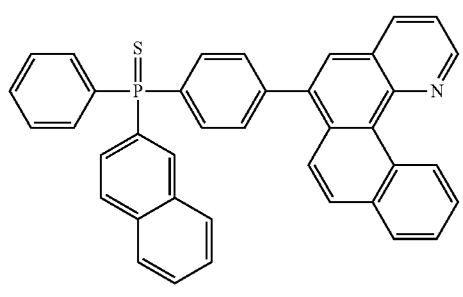
(1-153)
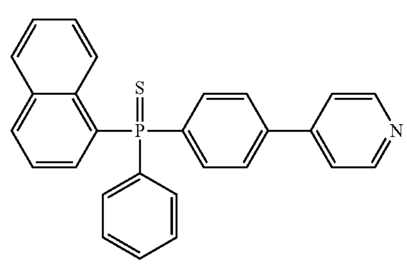

-continued
(1-154)
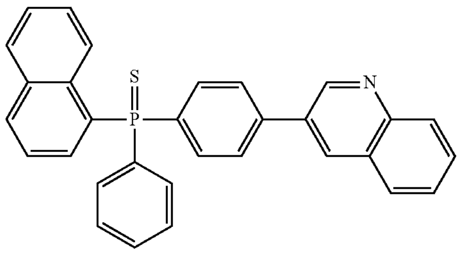
(1-155)
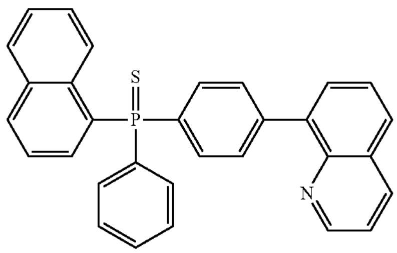
(1-156)
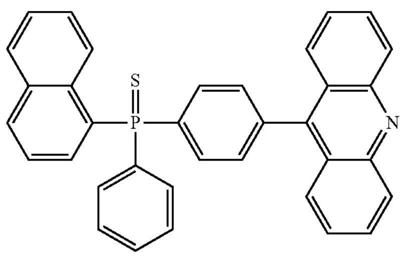
(1-157)
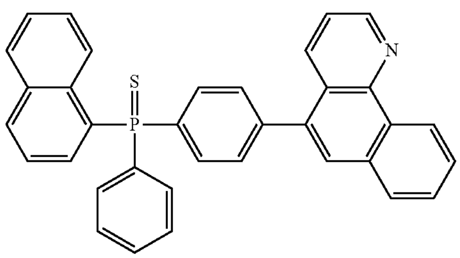
(1-158)
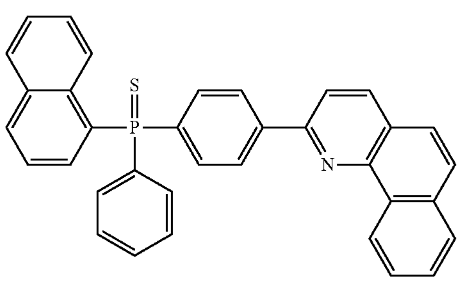
(1-159)
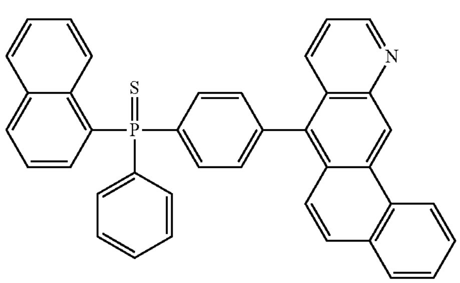
-continued
(1-160)
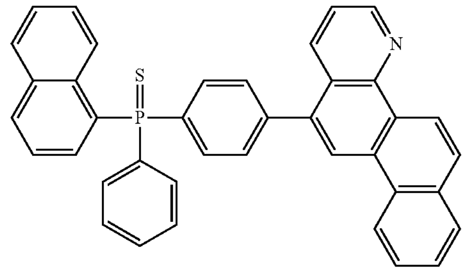
(1-161)
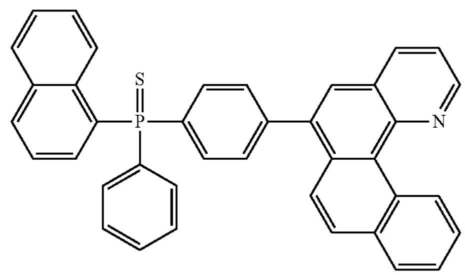
(1-162)
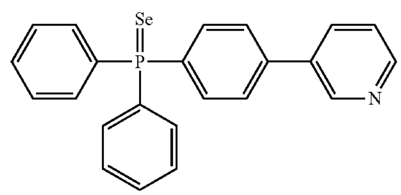
(1-163)
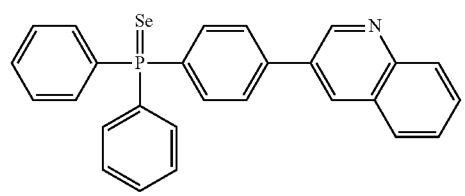
(1-164)
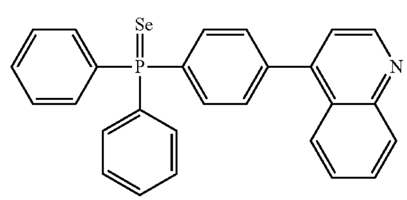
(1-165)
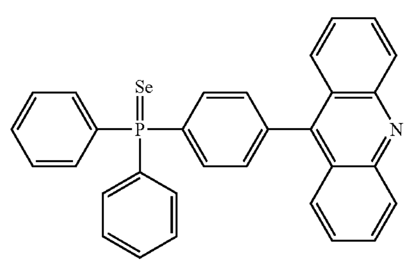

-continued
(1-166)
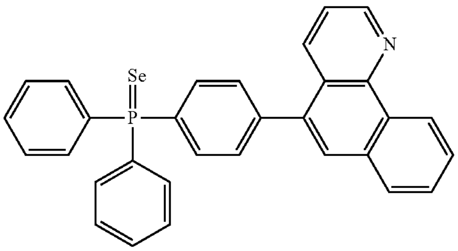
(1-167)
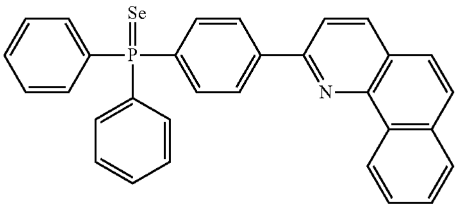
(1-168)
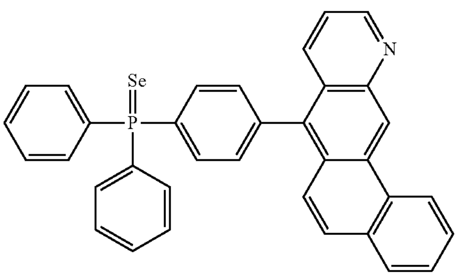
(1-169)
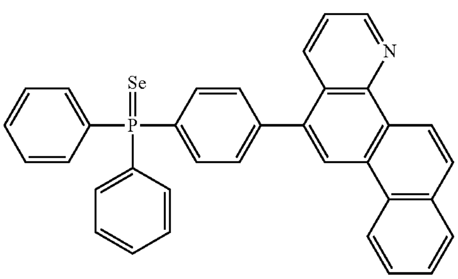
(1-170)
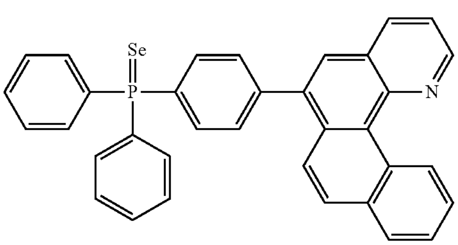
(1-171)
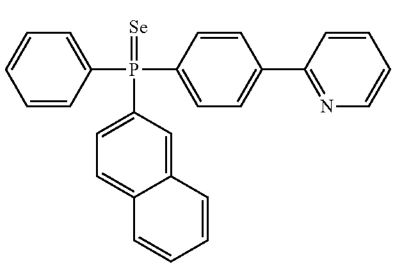
-continued
(1-172)
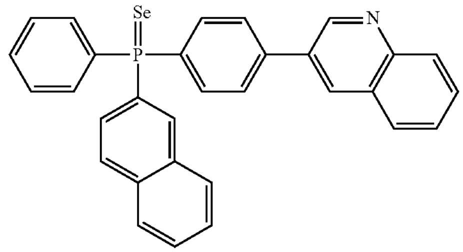
(1-173)
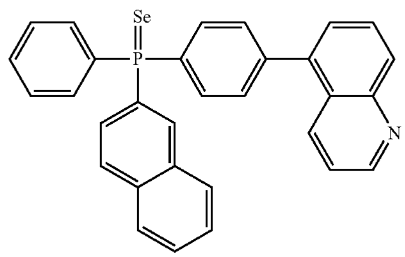
(1-174)
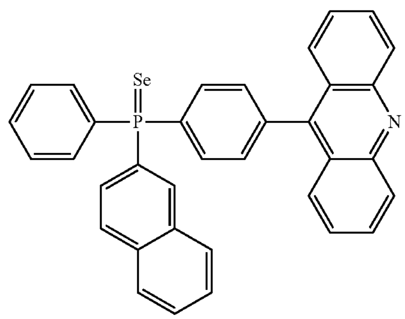
(1-175)
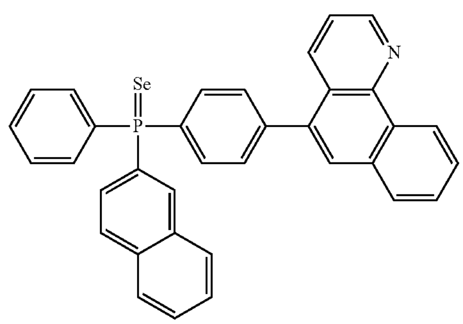
(1-176)
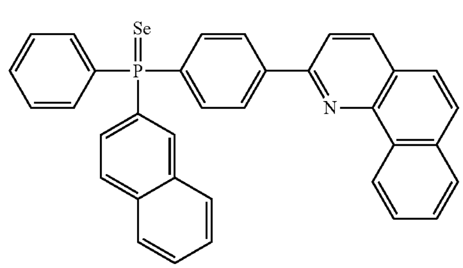

(1-177)
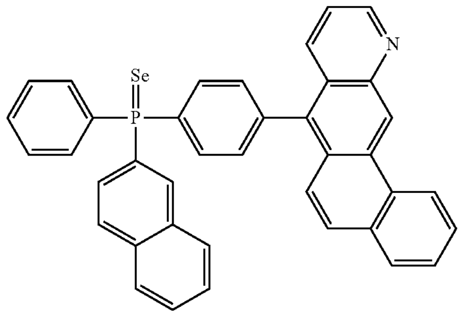
(1-178)
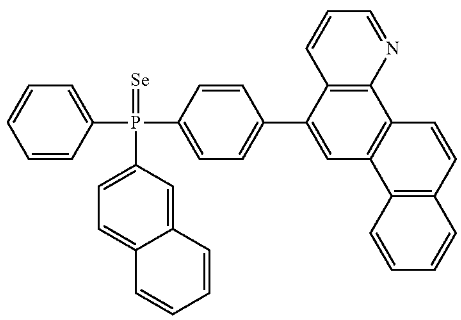
(1-179)
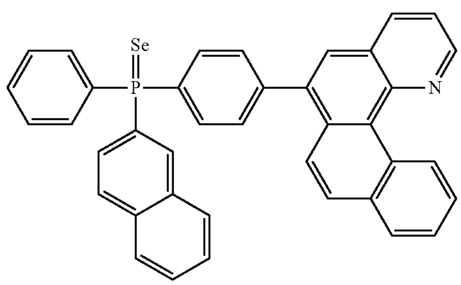
(1-180)
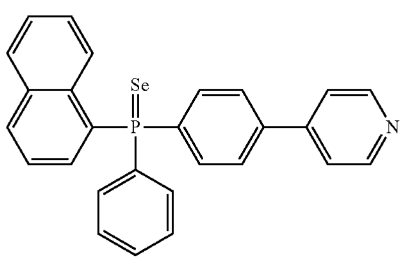
(1-181)
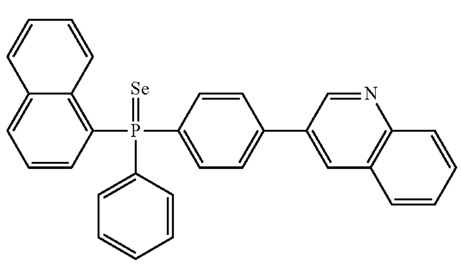
(1-182)
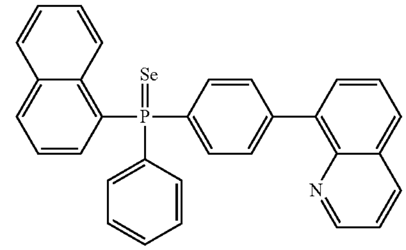
(1-183)
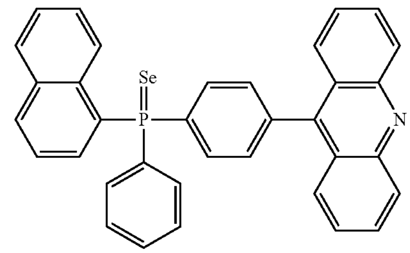
(1-184)
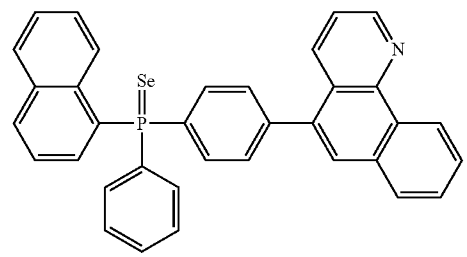
(1-185)
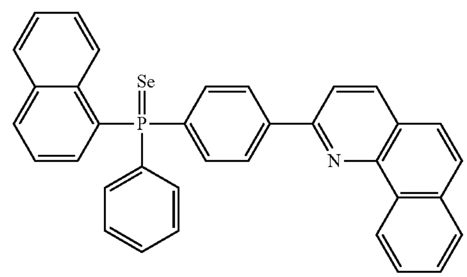
(1-186)
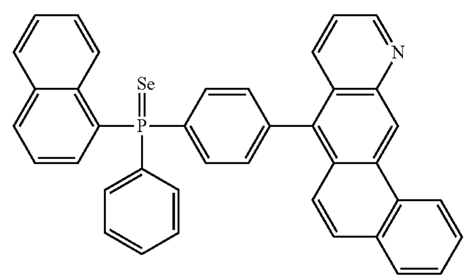
(1-187)
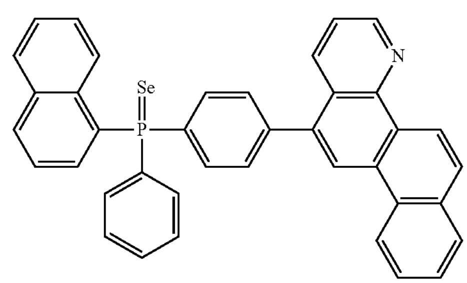

-continued
(1-188)
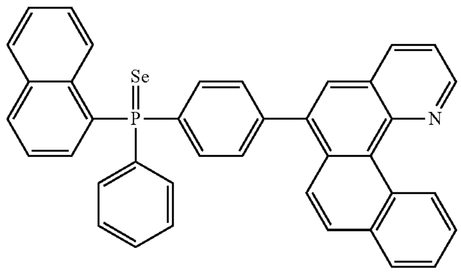
The second compound may be one selected from a group consisting of compounds represented by Chemical Formula 2-1 to Chemical Formula 2-147:
(2-1)
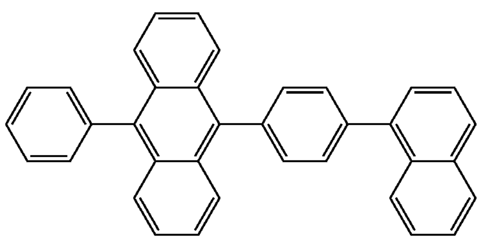
(2-2)
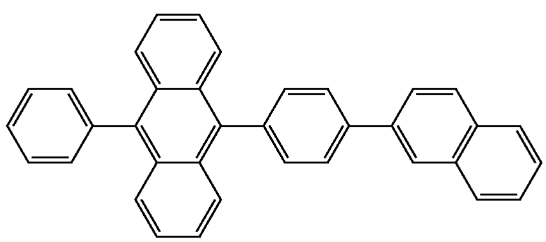
(2-3)
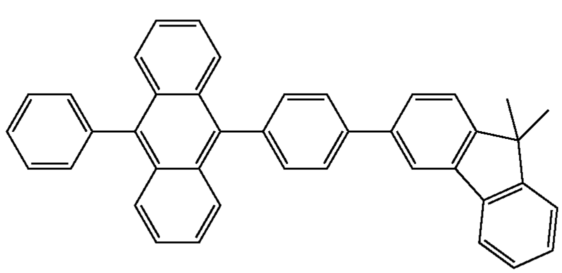
(2-4)
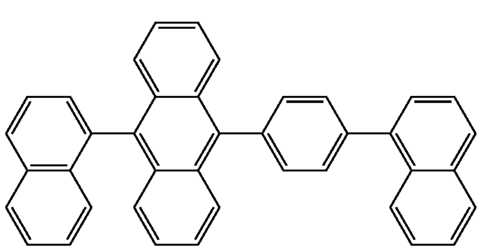
-continued
(2-5)
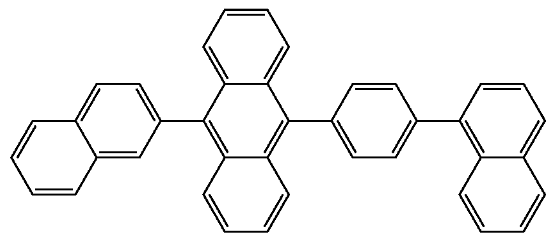
(2-6)
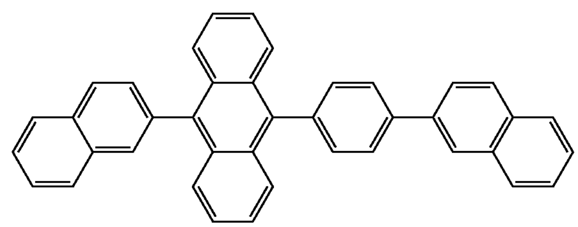
(2-7)
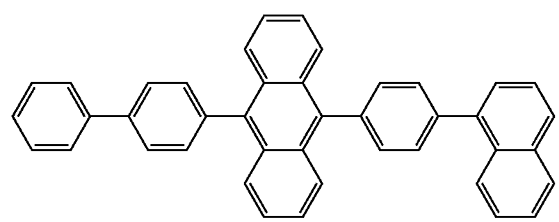
(2-8)
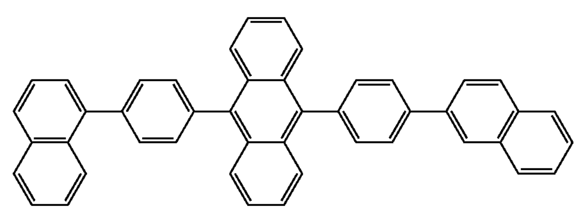
(2-9)
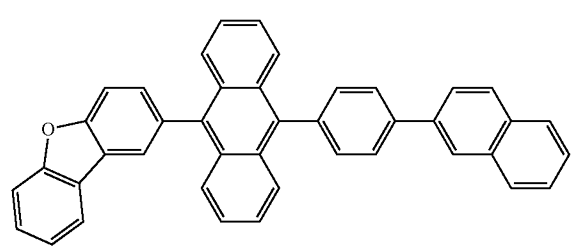
(2-10)
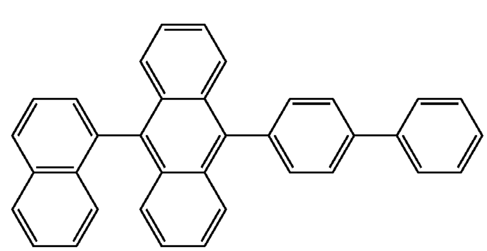

-continued
(2-11)
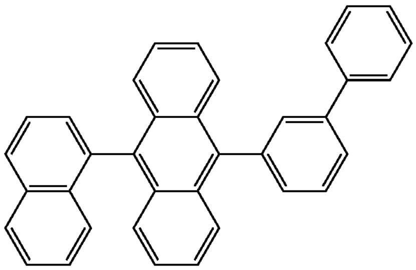
(2-12)
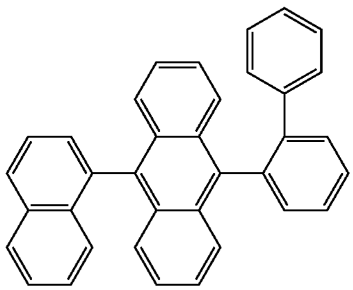
(2-13)
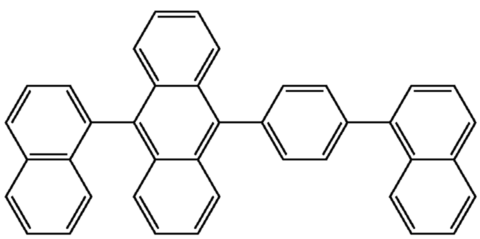
(2-14)
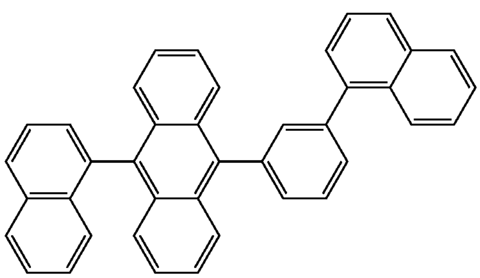
(2-15)
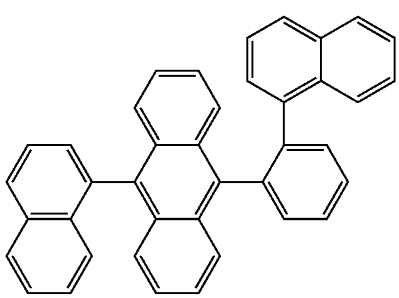
(2-16)
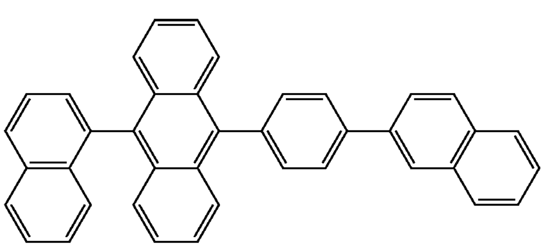
-continued
(2-17)
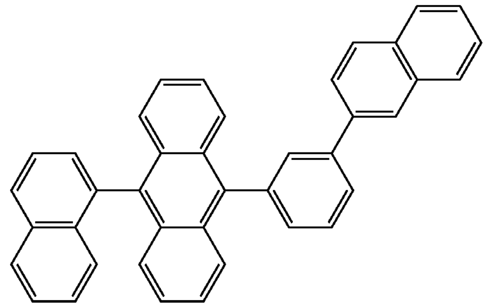
(2-18)
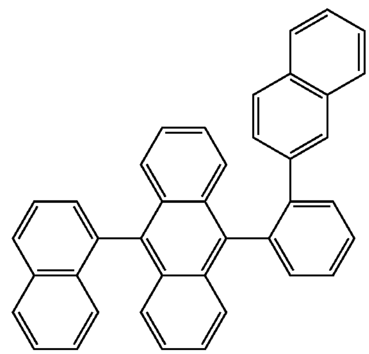
(2-19)
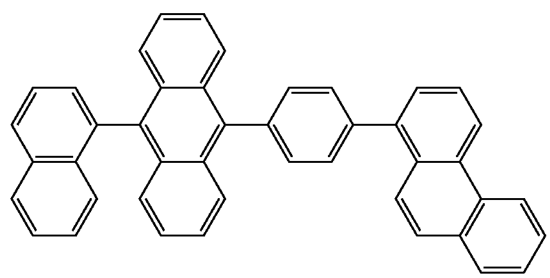
(2-20)
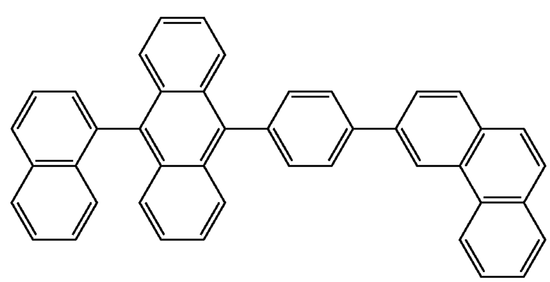
(2-21)
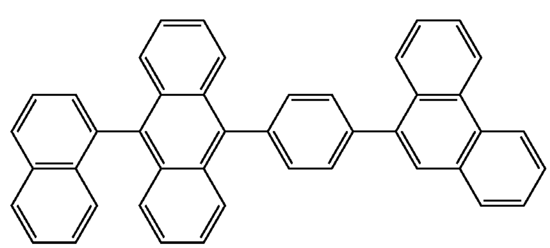

-continued
(2-22)
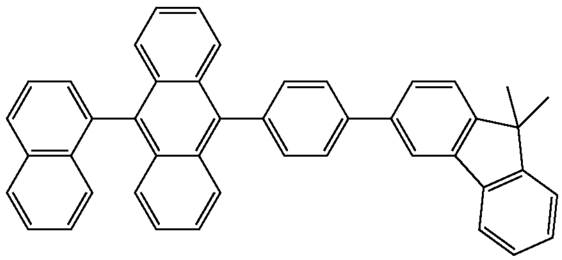
(2-23)
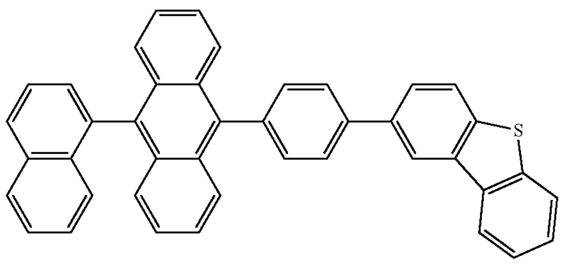
(2-24)
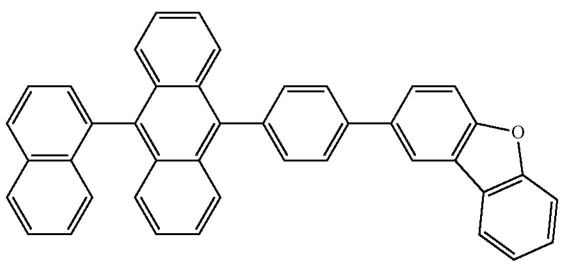
(2-25)
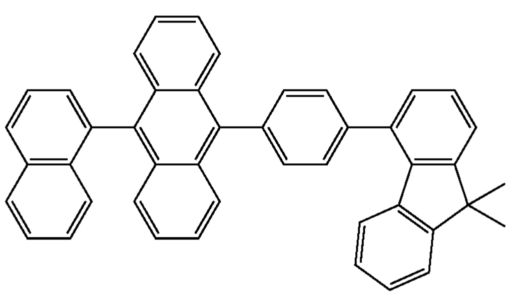
(2-26)
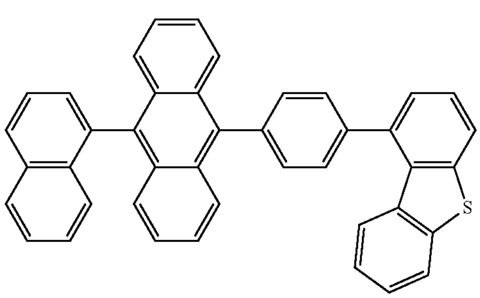
-continued
(2-27)
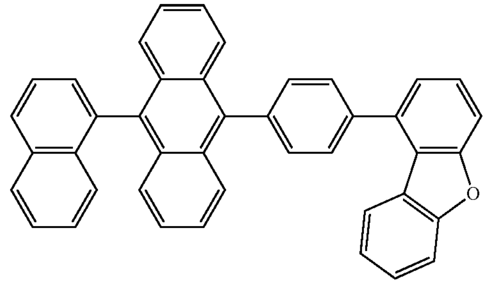
(2-28)
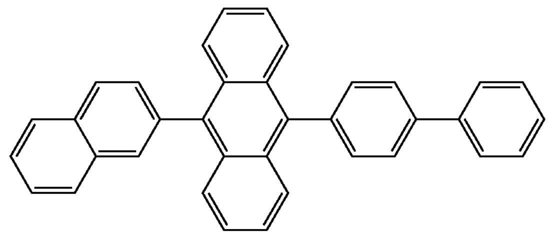
(2-28)
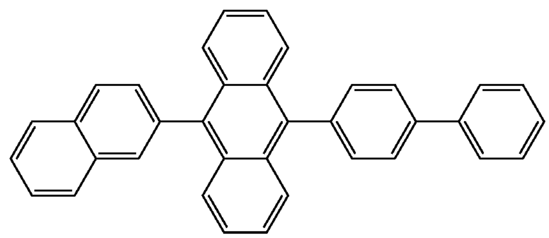
(2-29)
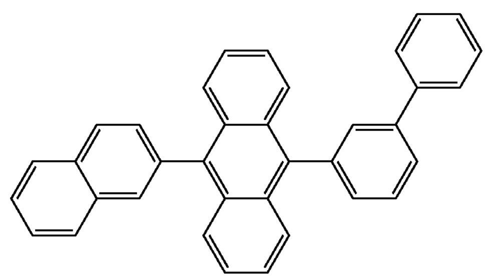
(2-30)
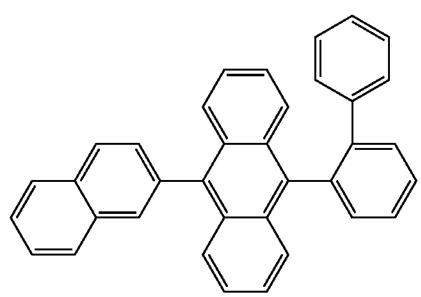
(2-31)
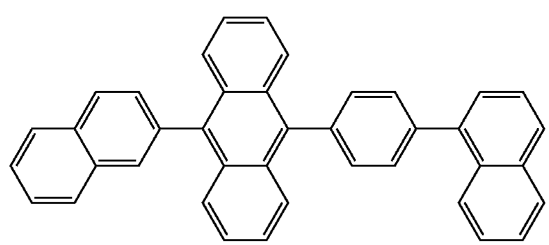

-continued
(2-32)
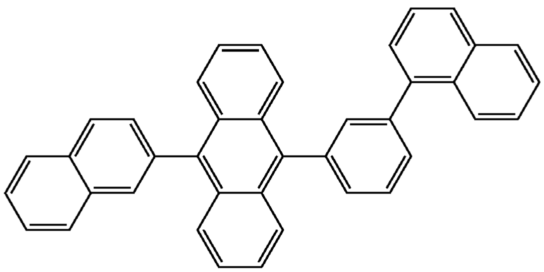
(2-33)
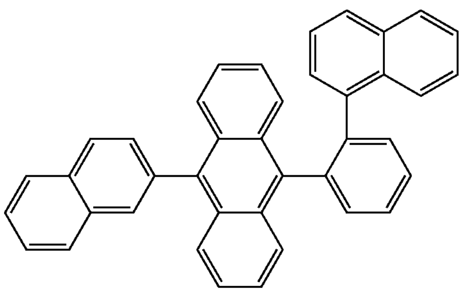
(2-34)
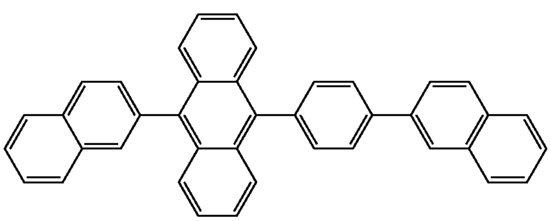
(2-35)
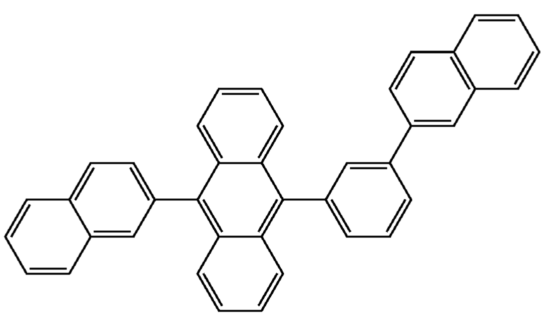
(2-36)
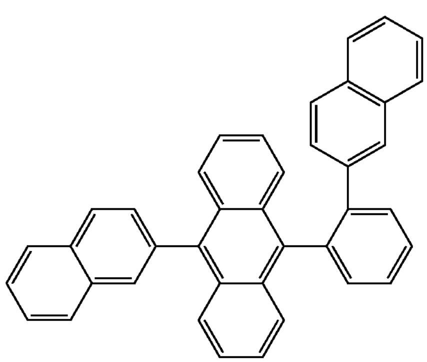
-continued
(2-37)
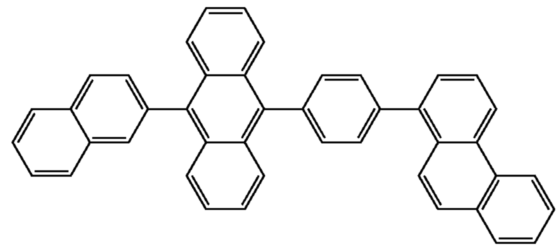
(2-38)
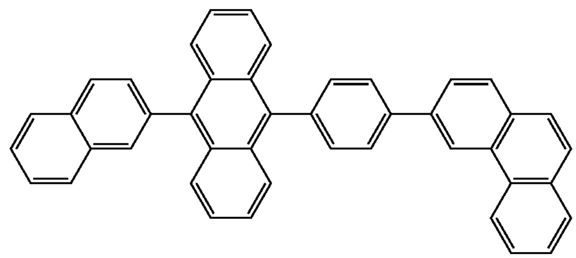
(2-39)
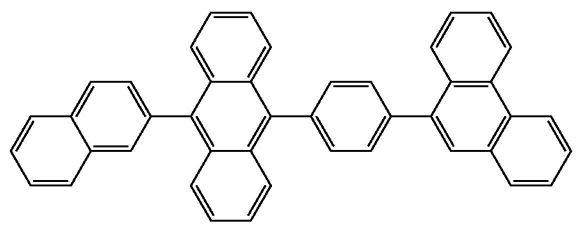
(2-40)
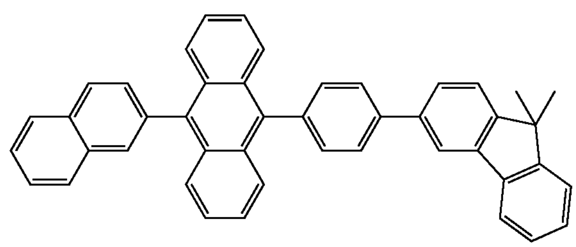
(2-41)
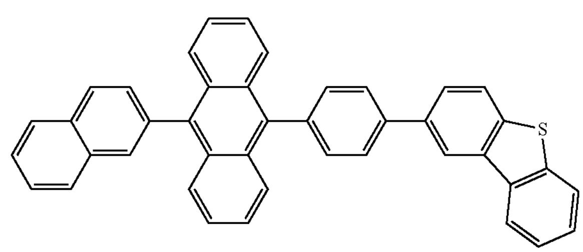
(2-42)
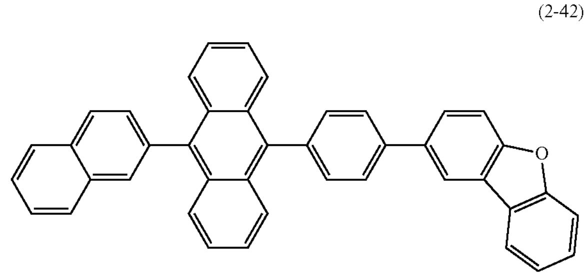

-continued
(2-43)
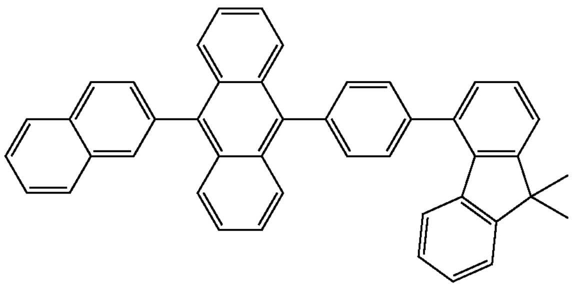
(2-44)
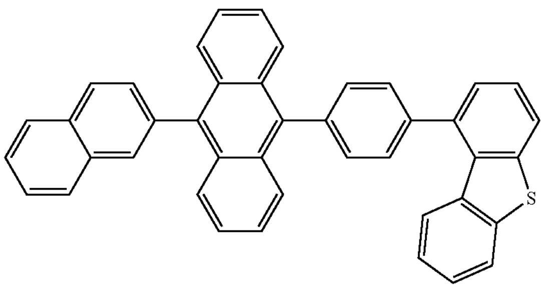
(2-45)
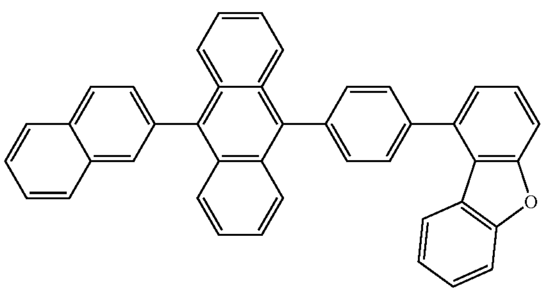
(2-46)
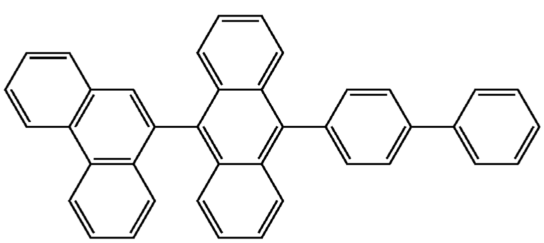
(2-47)
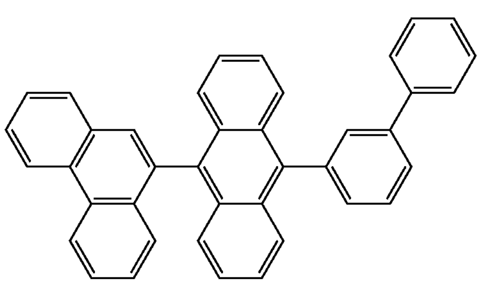
-continued
(2-48)
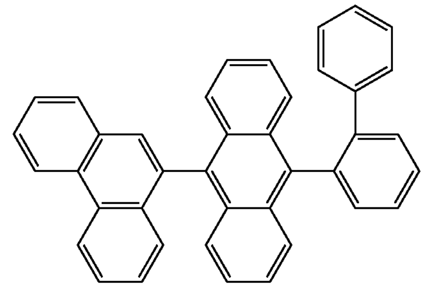
(2-49)
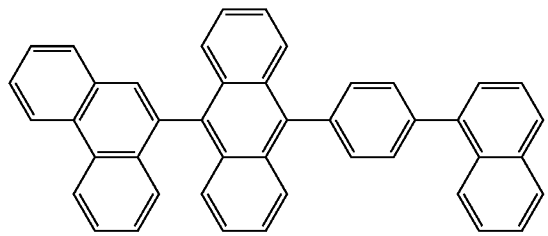
(2-50)
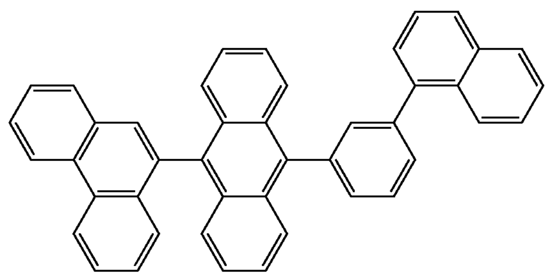
(2-51)
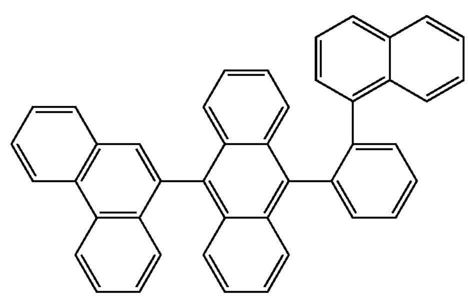
(2-52)
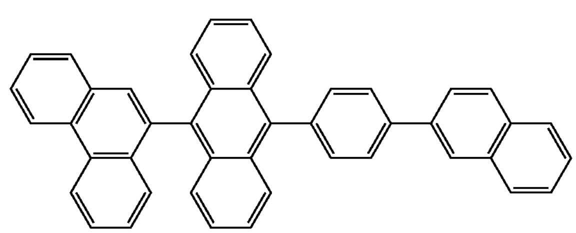

-continued
(2-53)
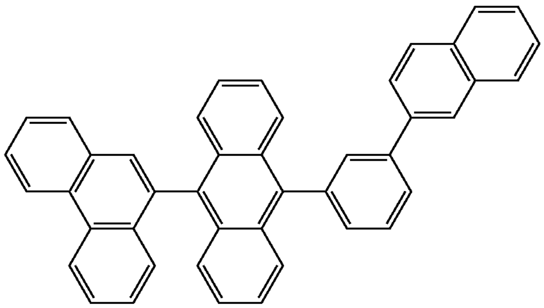
(2-54)
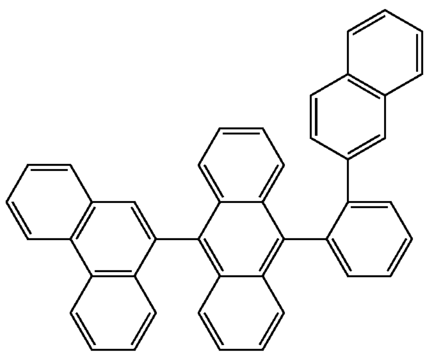
(2-55)
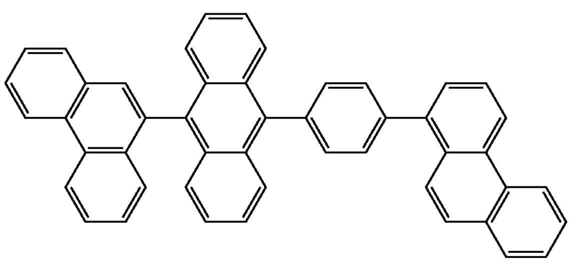
(2-56)
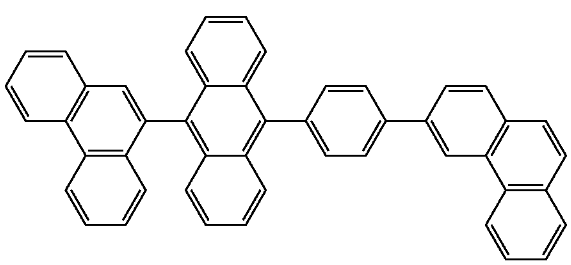
(2-57)
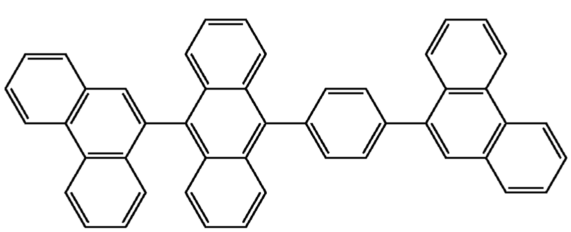
-continued
(2-58)
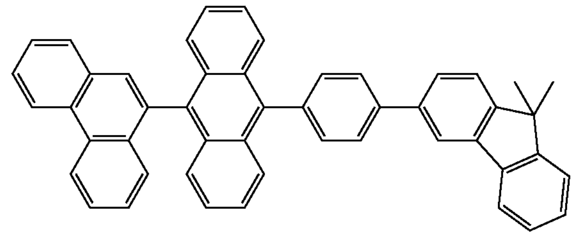
(2-59)
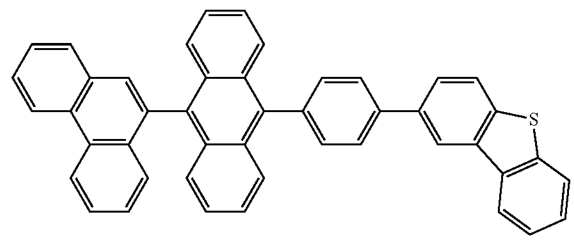
(2-60)
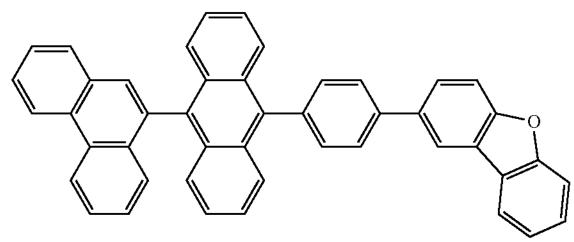
(2-61)
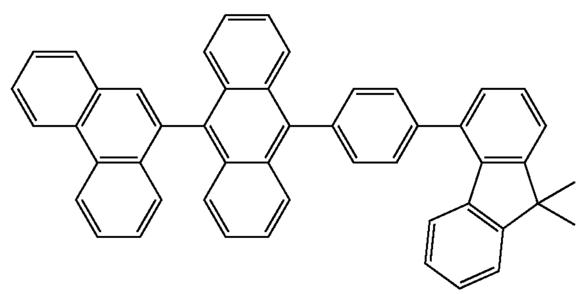
(2-62)
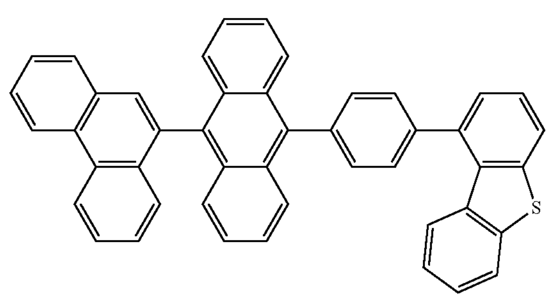

(2-63)
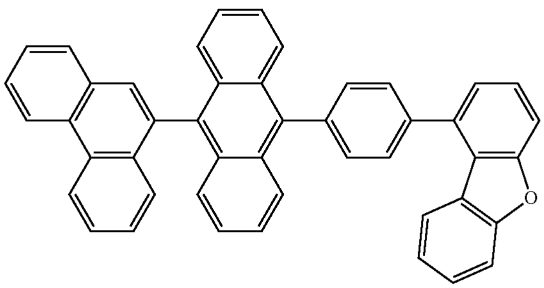
(2-64)
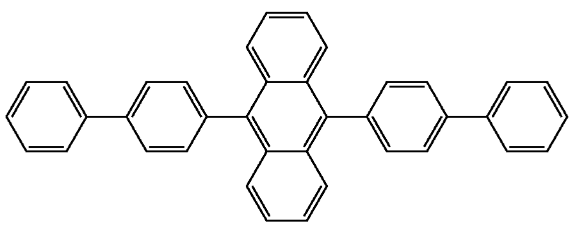
(2-65)
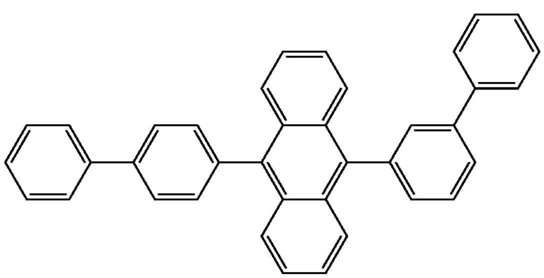
(2-66)
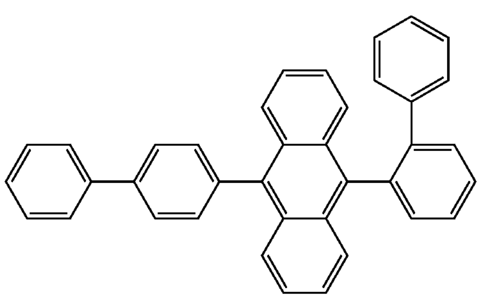
(2-67)
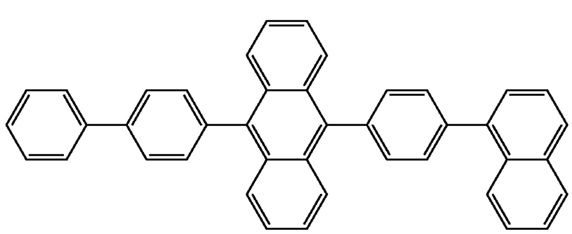
(2-68)
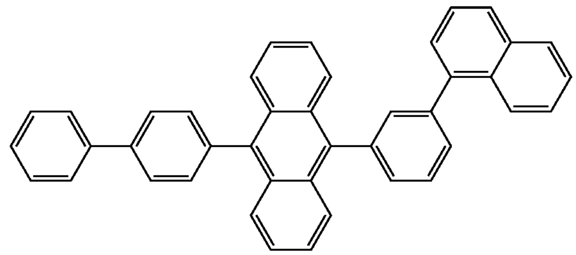
(2-69)
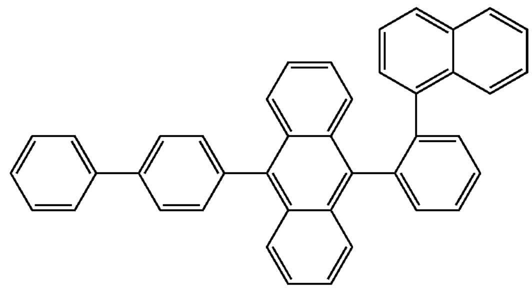
(2-70)
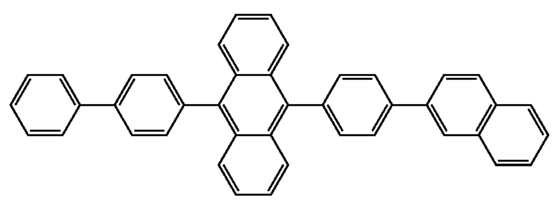
(2-71)
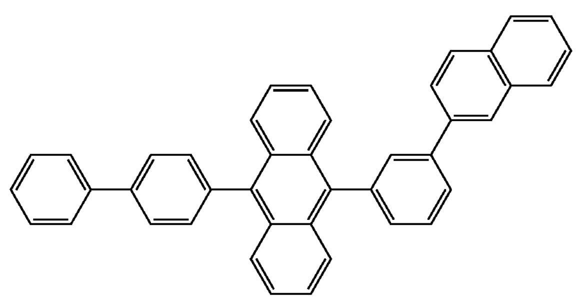
(2-72)
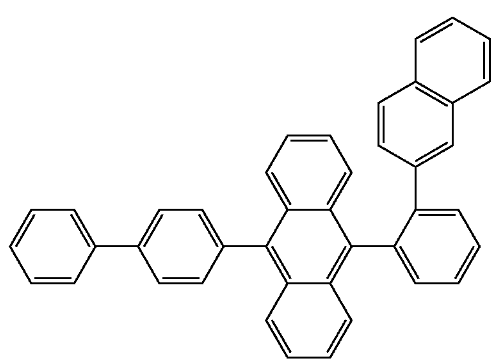

-continued
(2-73)
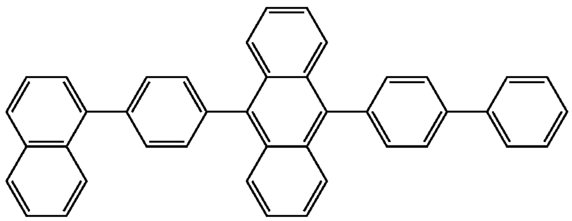
(2-74)
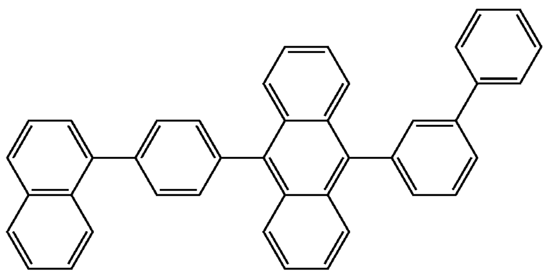
(2-75)
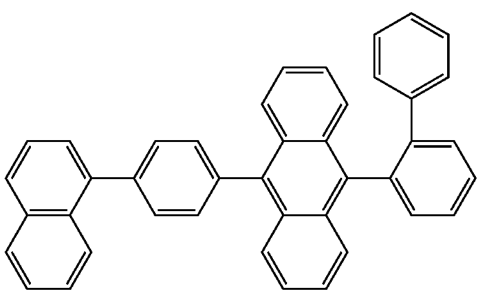
(2-76)
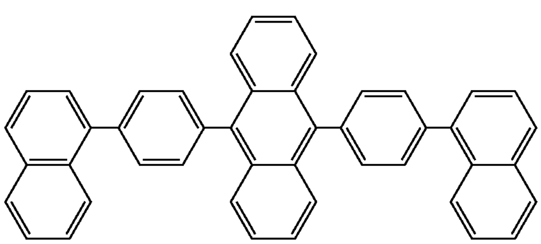
(2-77)
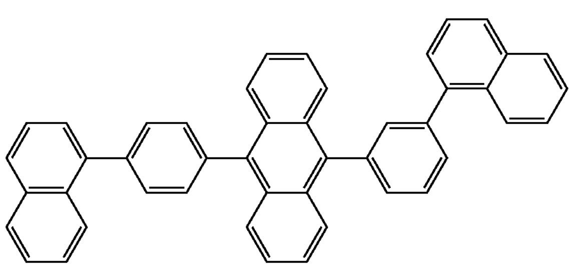
-continued
(2-78)
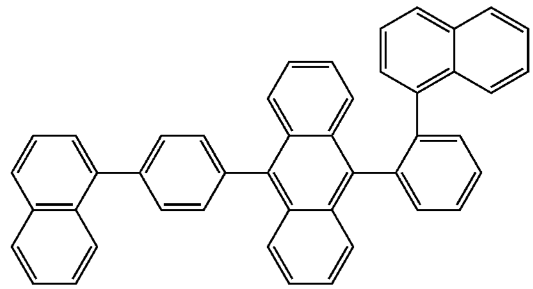
(2-79)
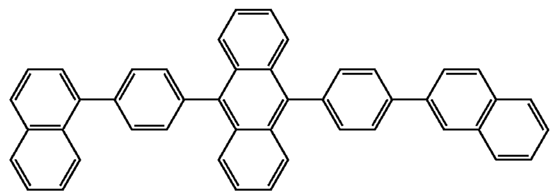
(2-80)
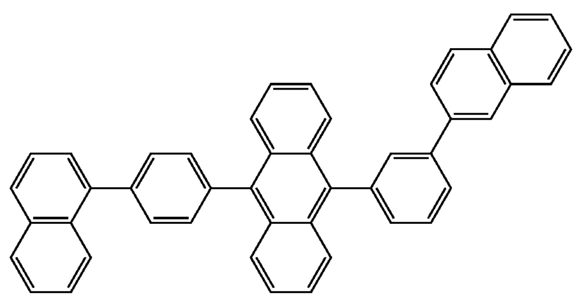
(2-81)
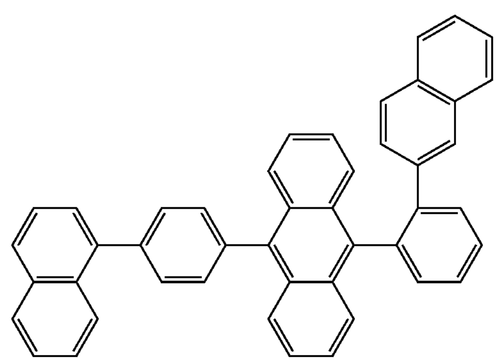
(2-82)
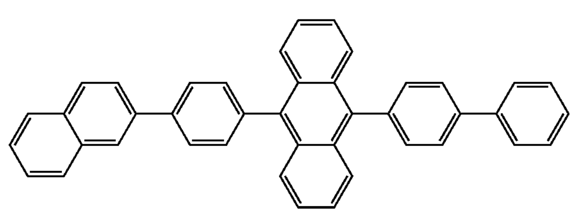

-continued
(2-83)
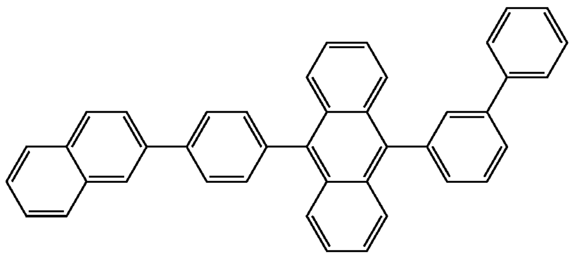
(2-84)
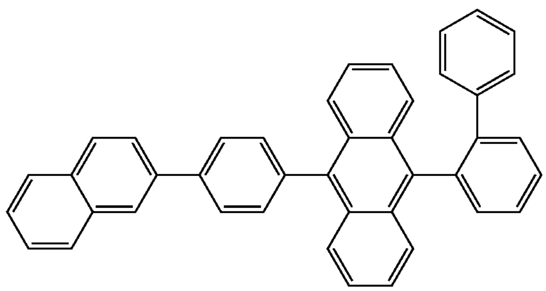
(2-85)
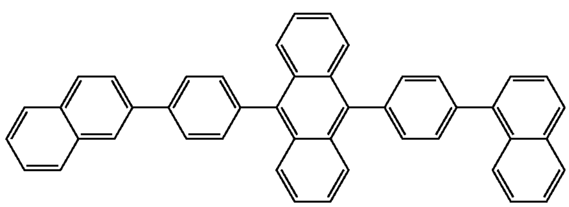
(2-86)
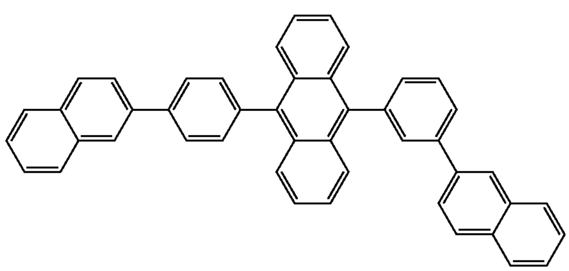
(2-87)
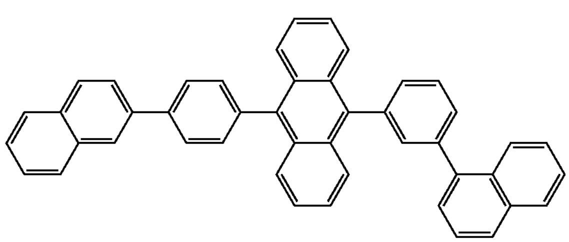
(2-88)
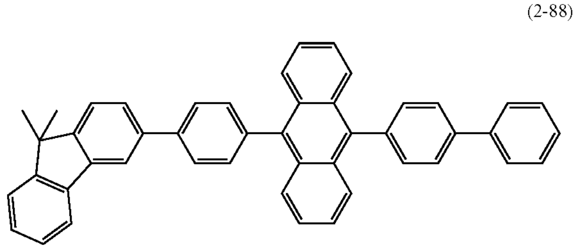
-continued
(2-89)
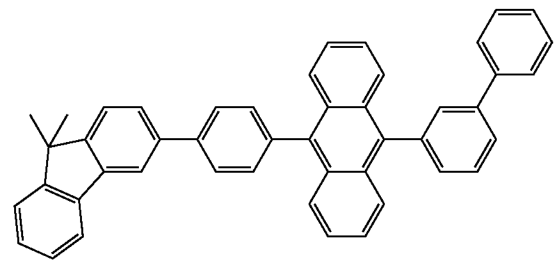
(2-90)
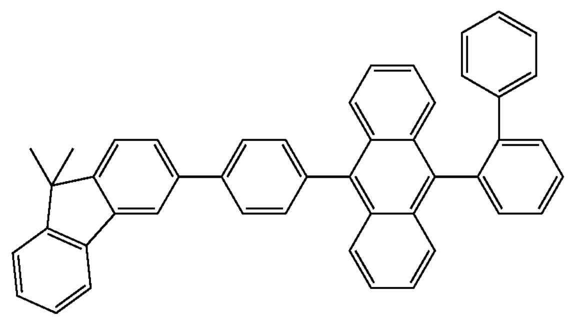
(2-91)
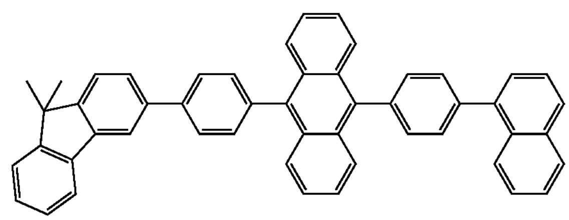
(2-92)
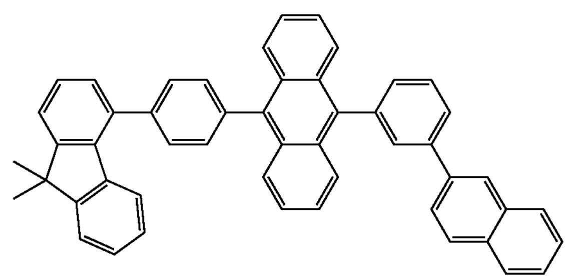
(2-93)
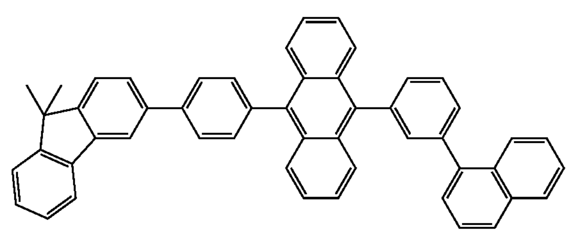
(2-94)
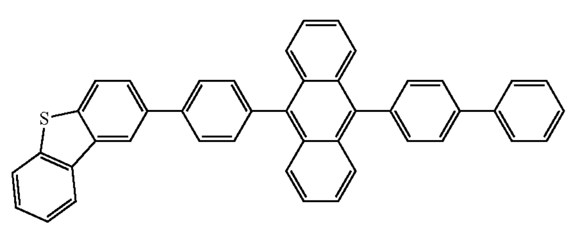

-continued
(2-95)
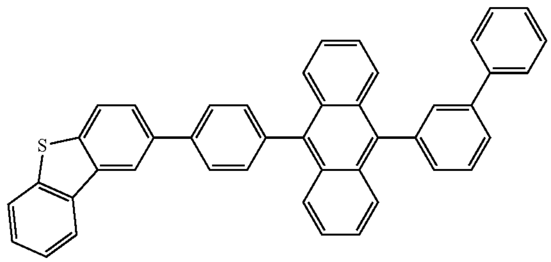
(2-96)
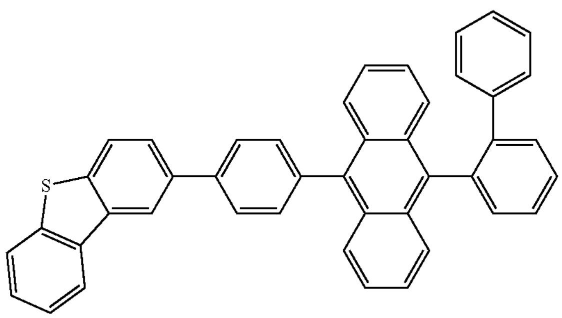
(2-97)
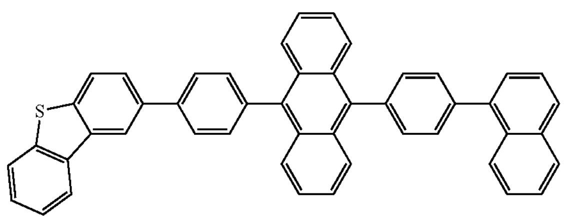
(2-98)
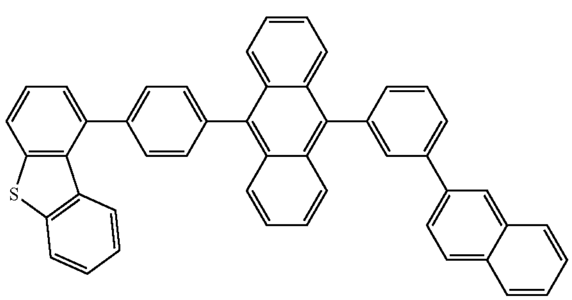
(2-99)
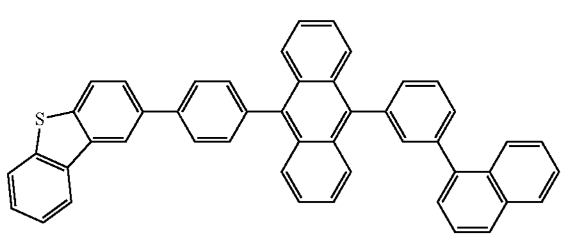
-continued
(2-100)
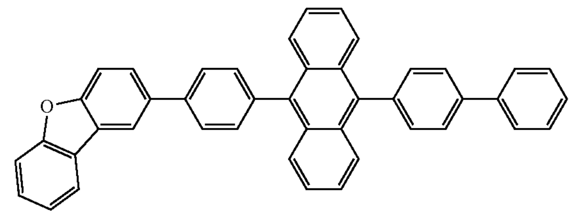
(2-101)
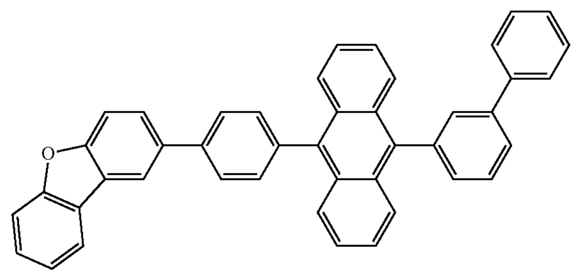
(2-102)
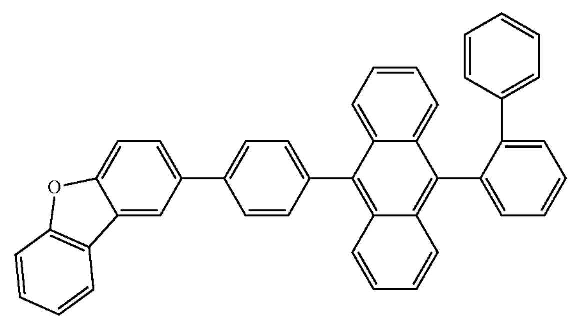
(2-103)
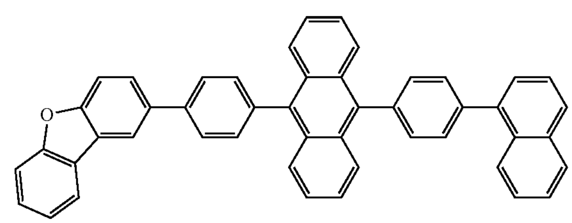
(2-104)
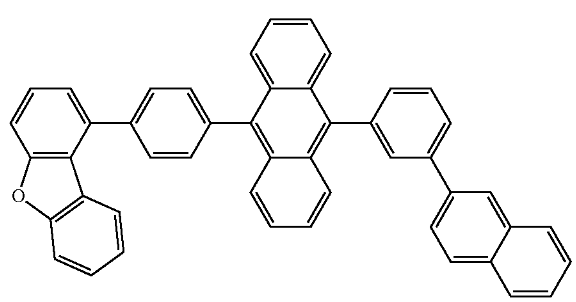

-continued
(2-105)
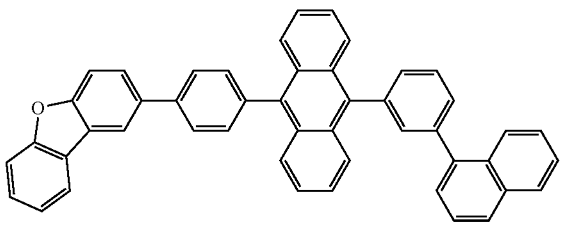
(2-106)
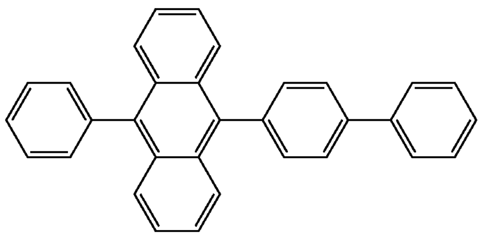
(2-107)
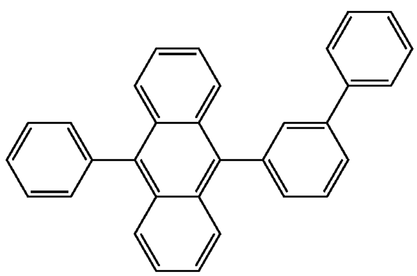
(2-108)
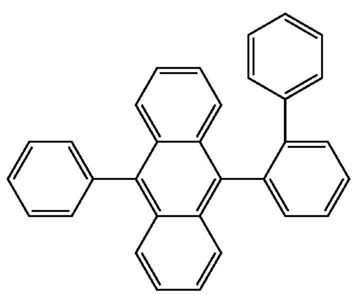
(2-109)
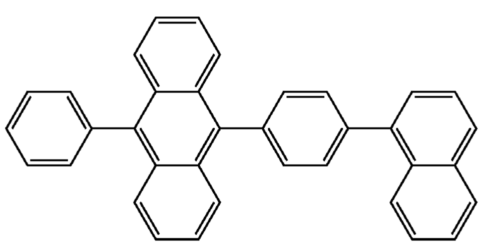
(2-110)
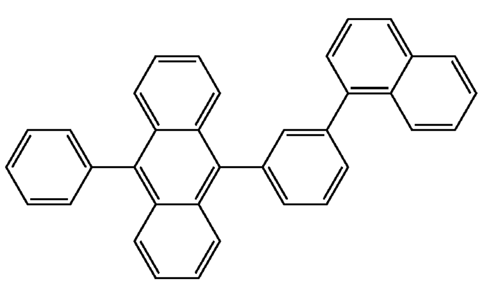
-continued
(2-111)
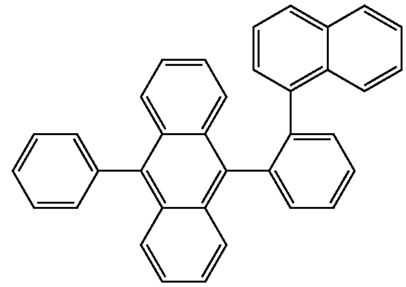
(2-112)
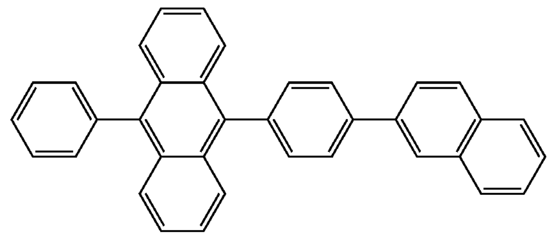
(2-113)
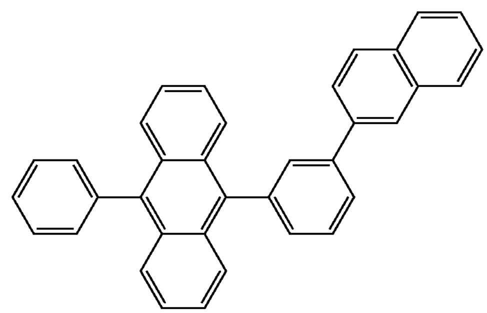
(2-114)
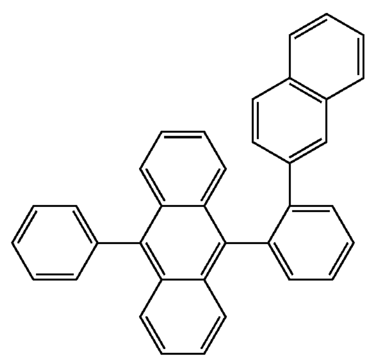
(2-115)
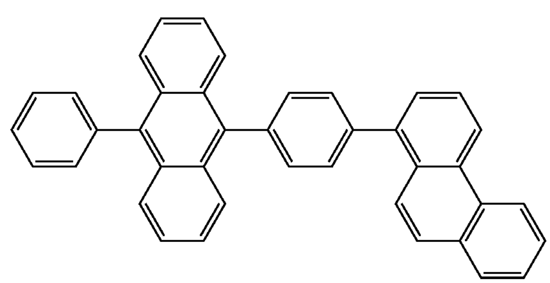

-continued
(2-116)
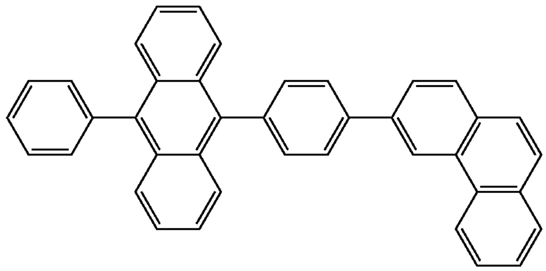
(2-117)
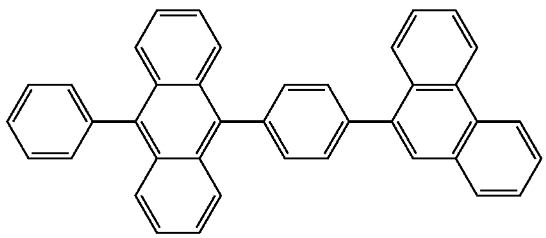
(2-118)
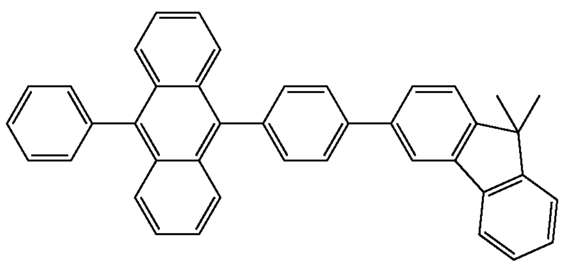
(2-119)
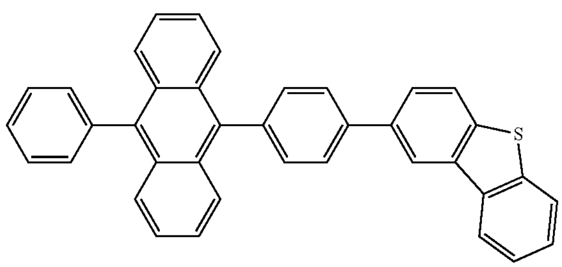
(2-120)
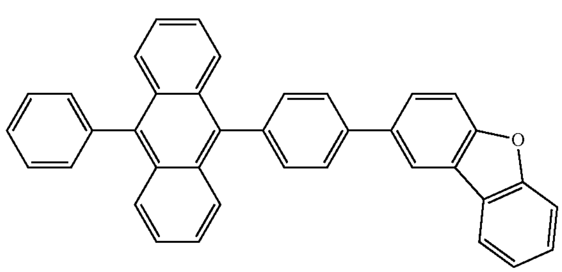
-continued
(2-121)
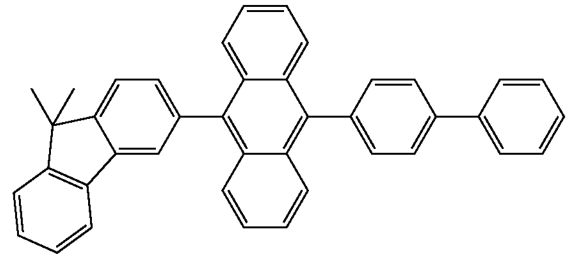
(2-122)
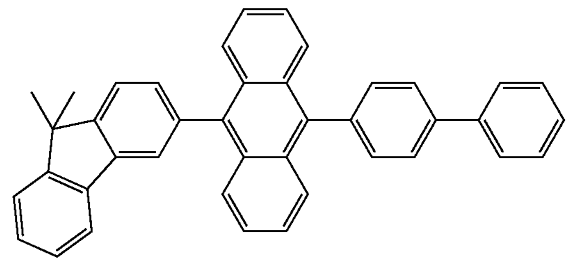
(2-123)
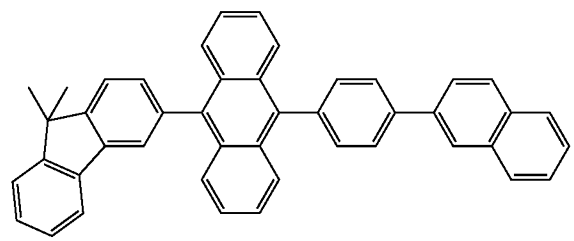
(2-124)
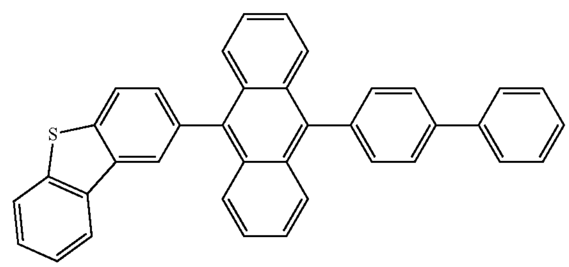
(2-125)
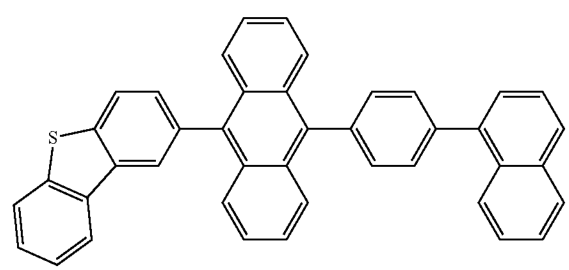

-continued
(2-126)
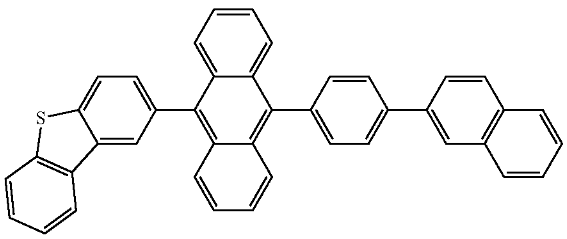
(2-127)
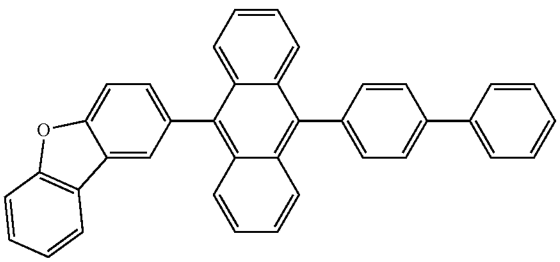
(2-128)
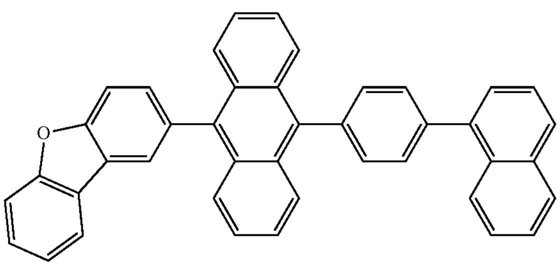
(2-129)
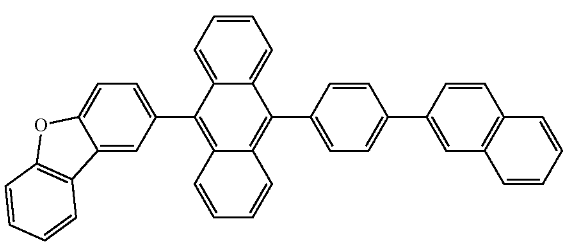
(2-130)
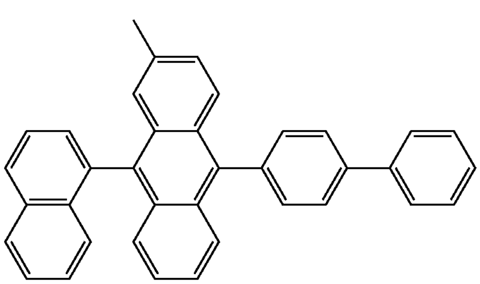
-continued
(2-131)
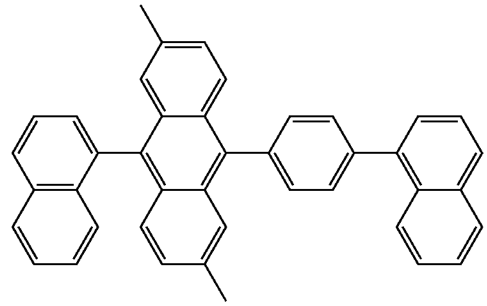
(2-132)
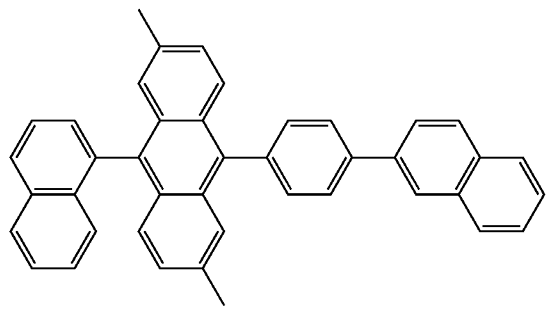
(2-133)
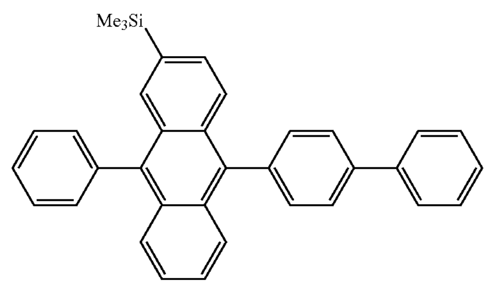
(2-134)
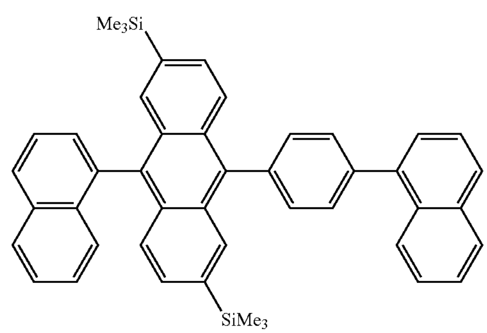
(2-135)
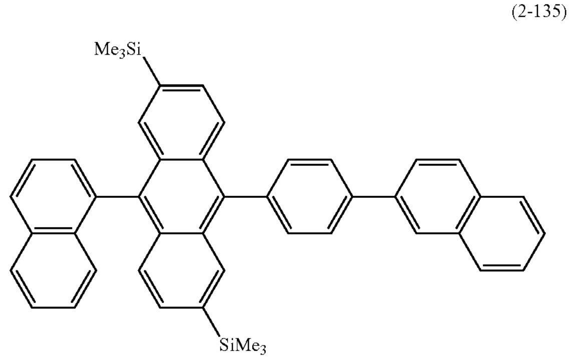

-continued
(2-136)
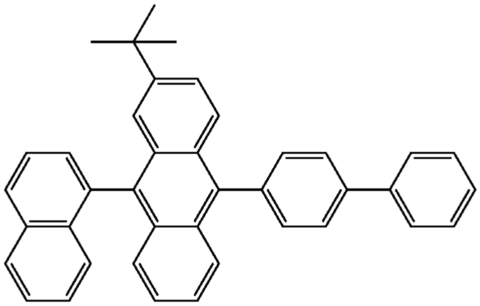
(2-137)
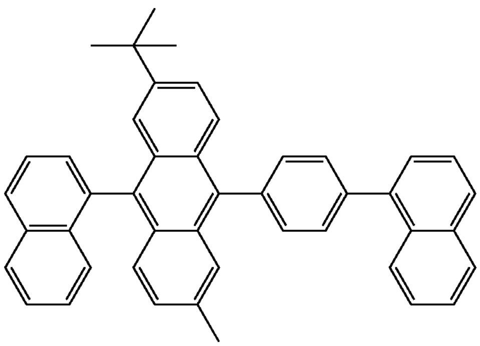
(2-138)
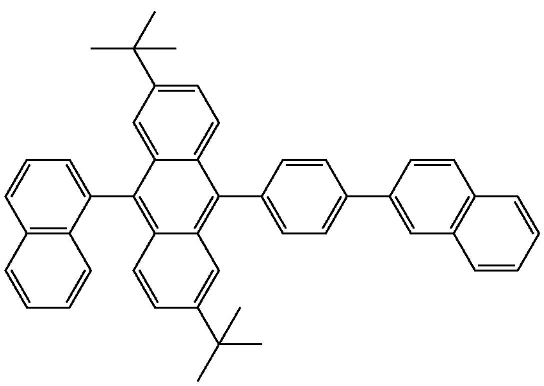
(2-139)
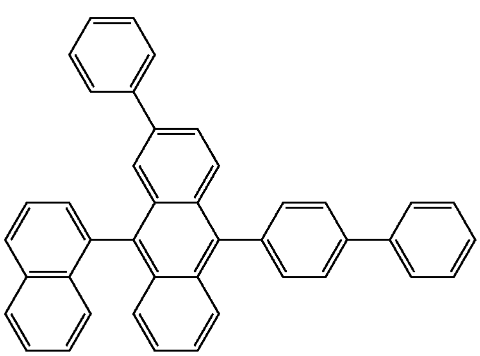
-continued
(2-140)
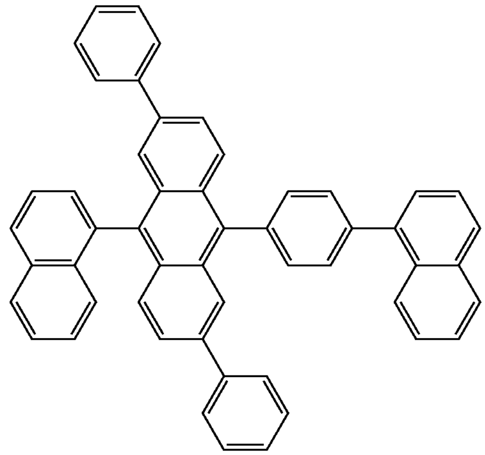
(2-141)
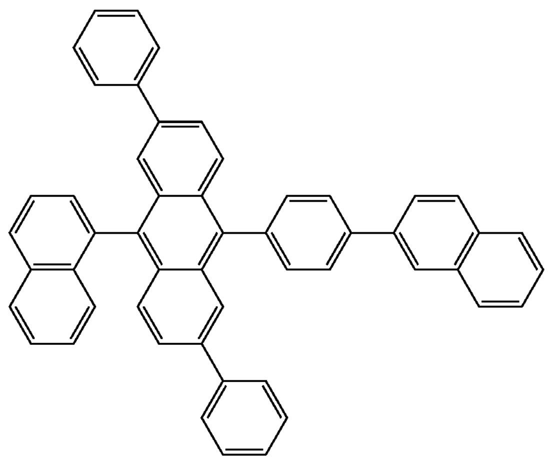
(2-142)
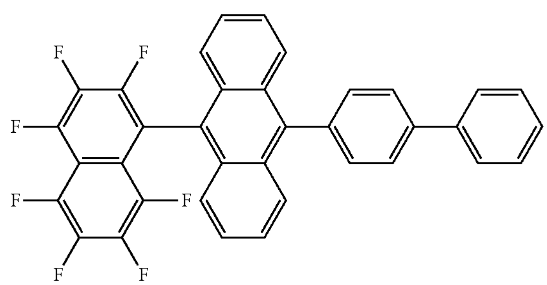
(2-143)
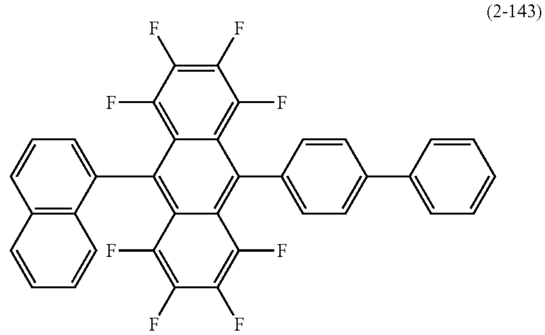

-continued (2-144)

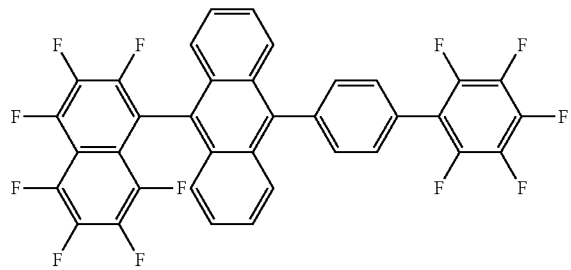

(2-145)

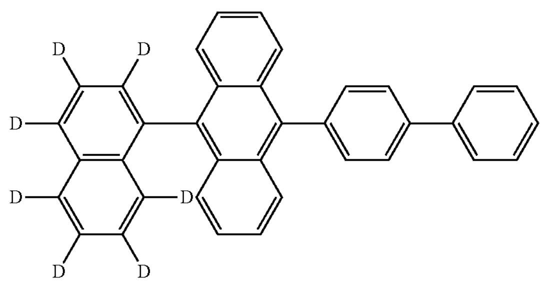

(2-146)

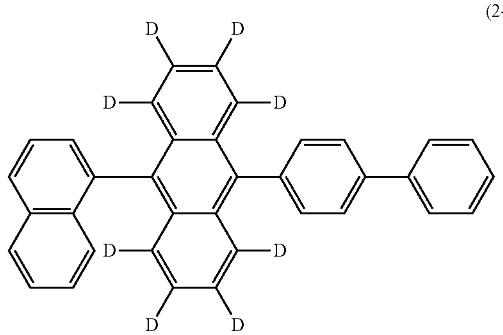

(2-147)

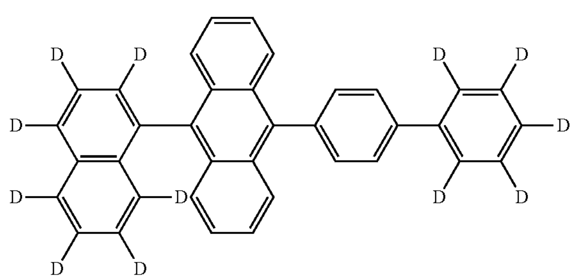

The organic light emitting element may include: an anode and a cathode that face each other; an emission layer provided between the anode and the cathode; a hole transfer layer provided between the anode and the emission layer; and an electron transfer layer and a hole blocking layer provided between the cathode and the emission layer, wherein the hole blocking layer may include the first compound, and the emission layer may include the second compound.

The first compound may be a compound represented by Chemical Formula 3:

[Chemical Formula 3]

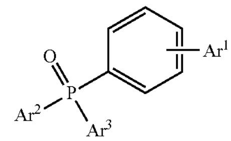

wherein, in Chemical Formula 3, $Ar^1$ to $Ar^3$ are equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted ring-type C6 to C30 aromatic hydrocarbon group, a substituted or unsubstituted ring-type C6 to C30 condensed aromatic hydrocarbon group, a substituted or unsubstituted ring-type C2 to C30 aromatic heterocyclic, or a substituted or unsubstituted C2 to C30 condensed aromatic heterocyclic.

The first compound may be one selected from a group consisting of compounds represented by Chemical Formula 1-1 to Chemical Formula 1-188:

(1-1)

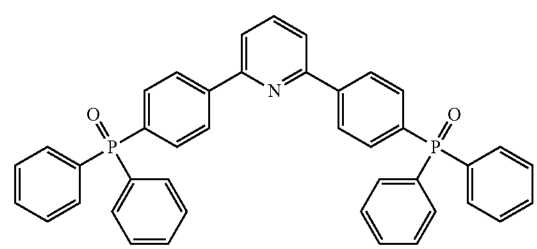

(1-2)

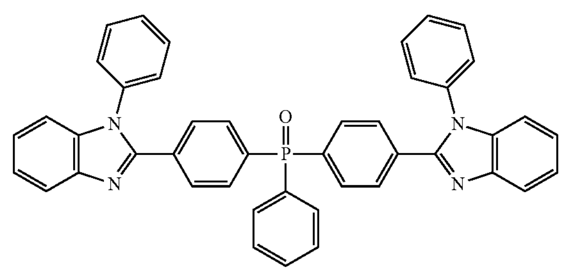

(1-3)

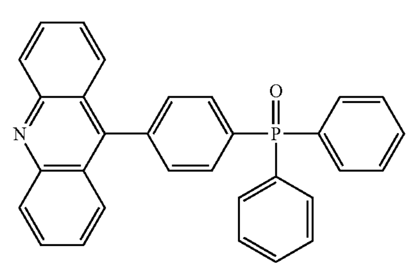

-continued
(1-4)
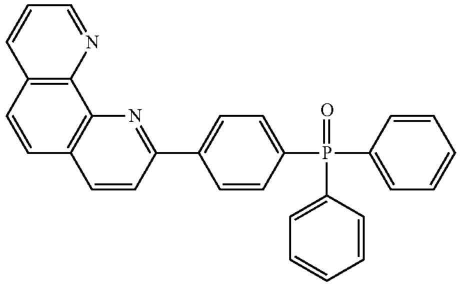
(1-5)
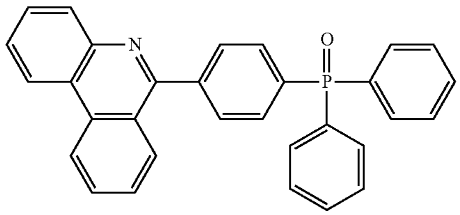
(1-6)
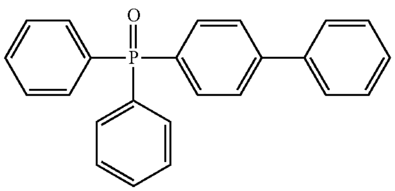
(1-7)
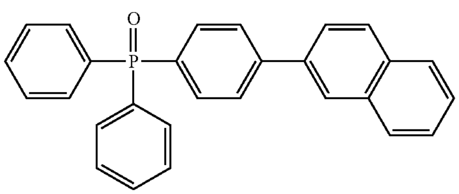
(1-8)
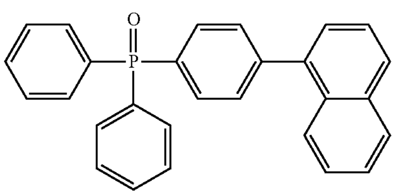
(1-9)
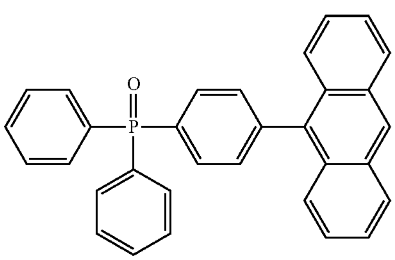
(1-10)
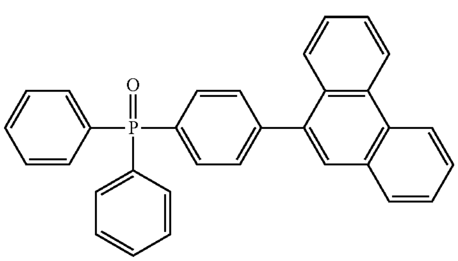
-continued
(1-11)
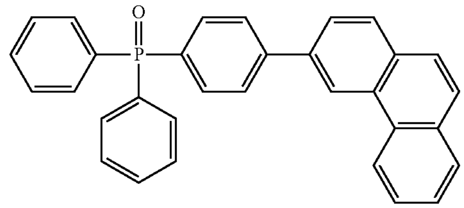
(1-12)
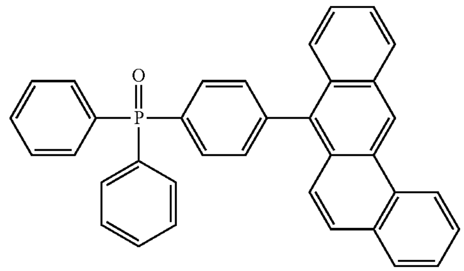
(1-13)
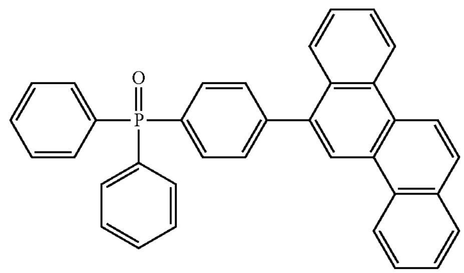
(1-14)
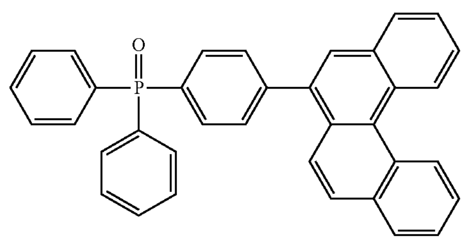
(1-15)
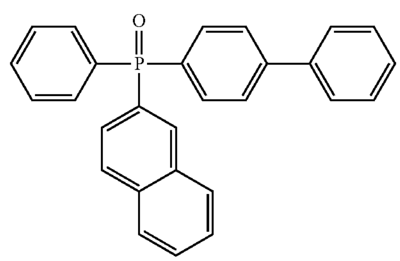
(1-16)
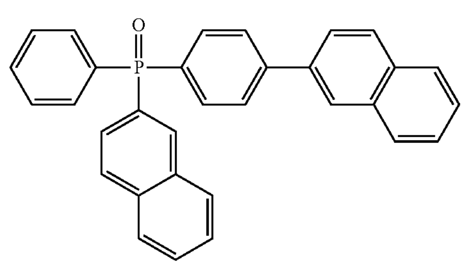

-continued
(1-17)
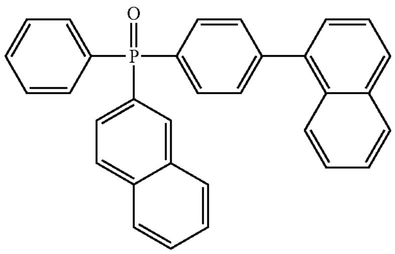
(1-18)
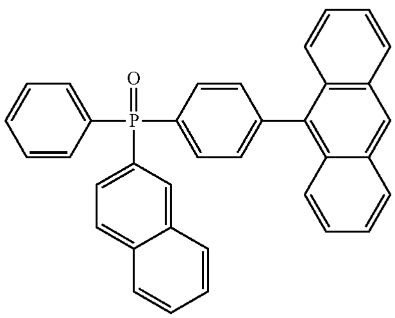
(1-19)
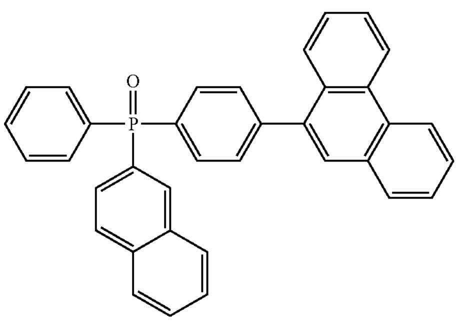
(1-20)
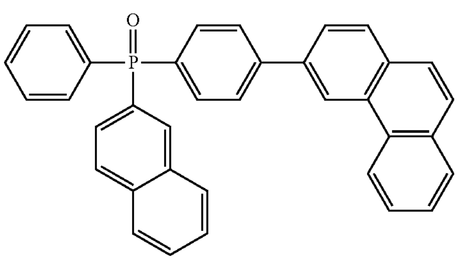
(1-21)
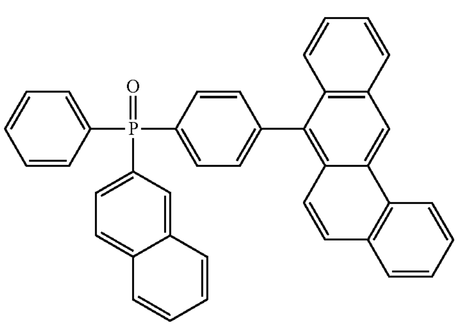
-continued
(1-22)
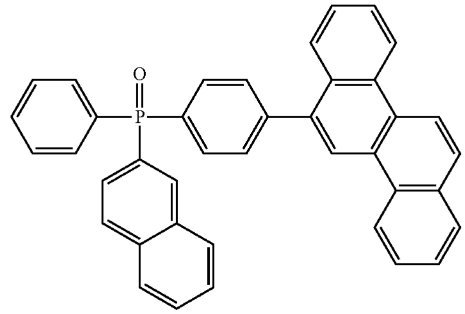
(1-23)
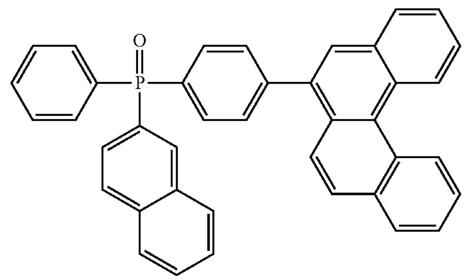
(1-24)
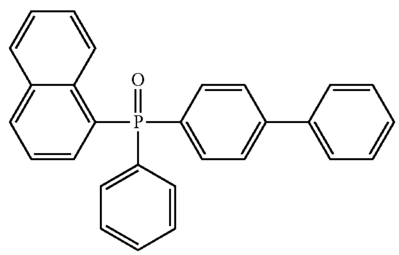
(1-25)
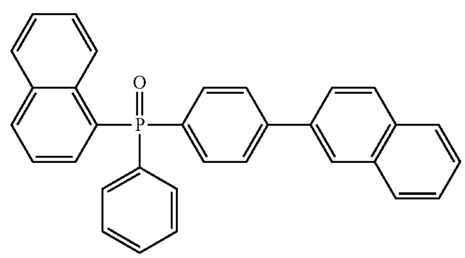
(1-26)
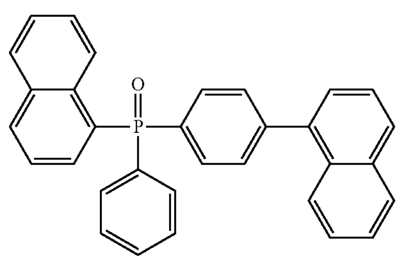
(1-27)
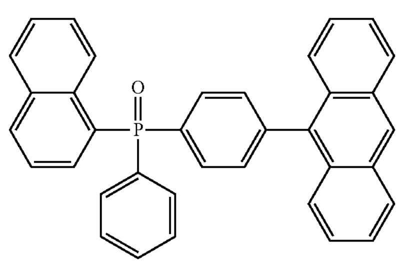

-continued
(1-28)
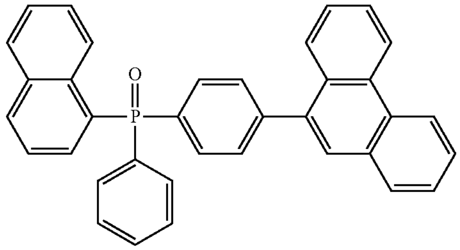
(1-29)
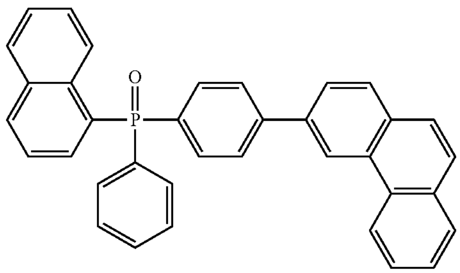
(1-30)
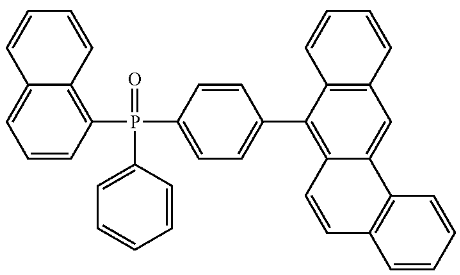
(1-31)
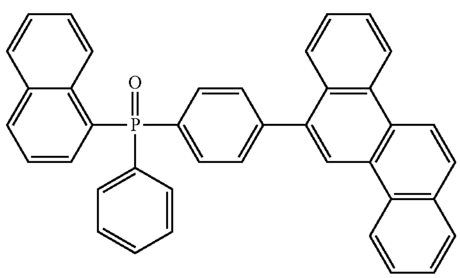
(1-32)
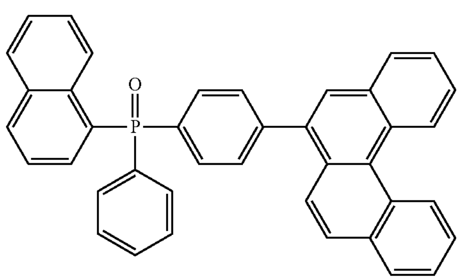
(1-33)
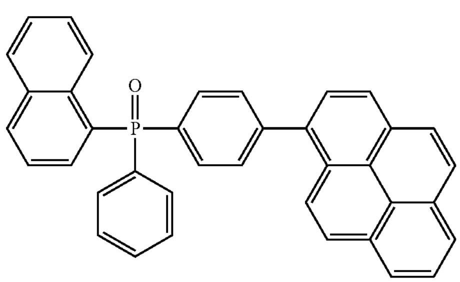
-continued
(1-34)
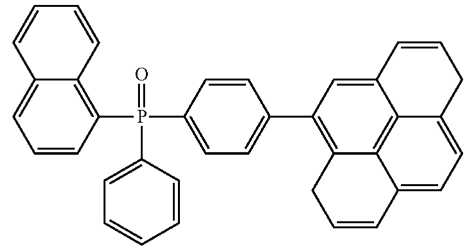
(1-35)
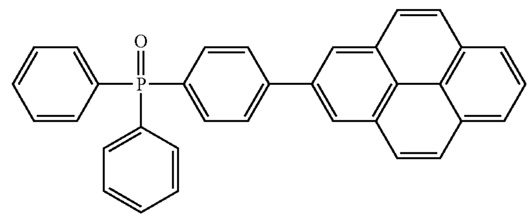
(1-36)
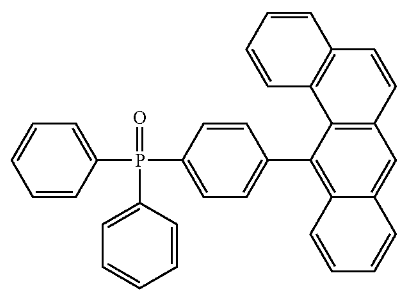
(1-37)
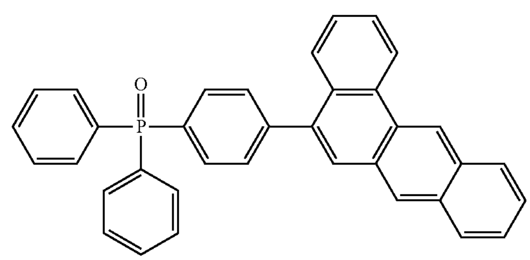
(1-38)
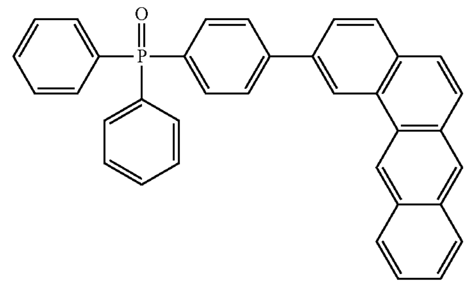

-continued
(1-39)
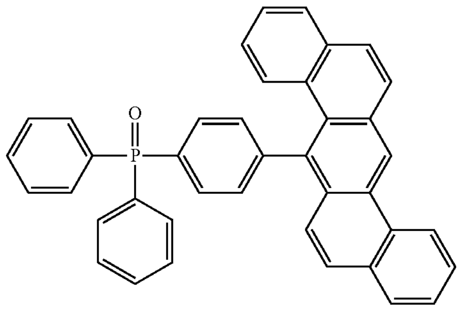
(1-40)
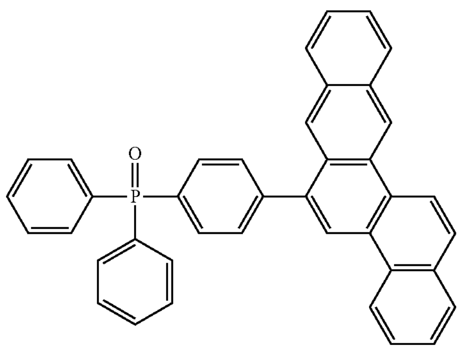
(1-41)
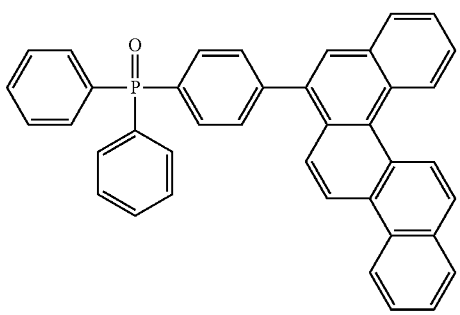
(1-42)
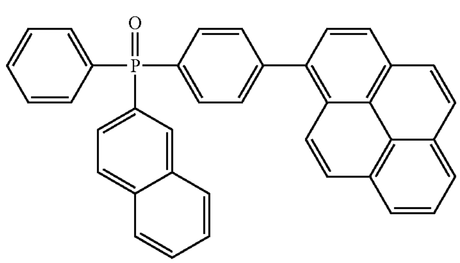
(1-43)
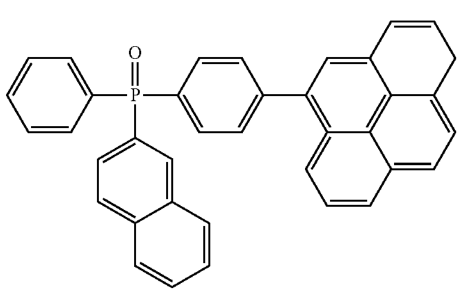
-continued
(1-44)
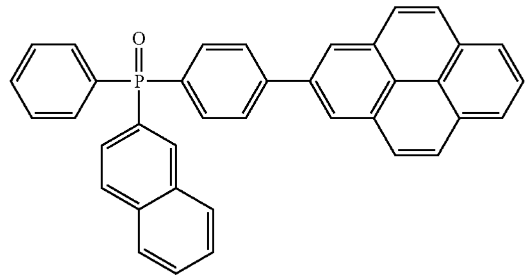
(1-45)
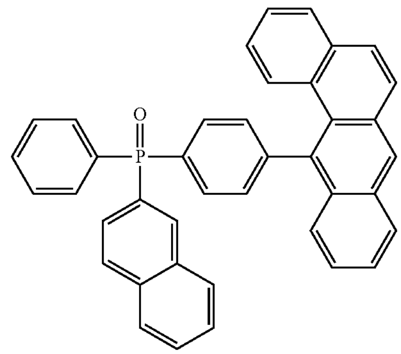
(1-46)
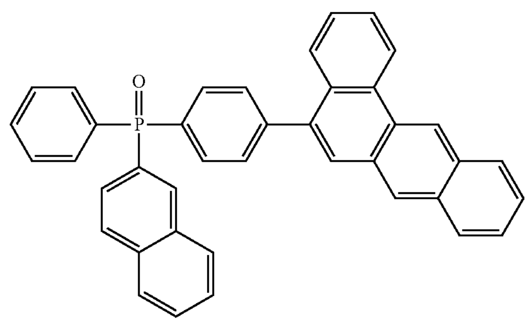
(1-47)
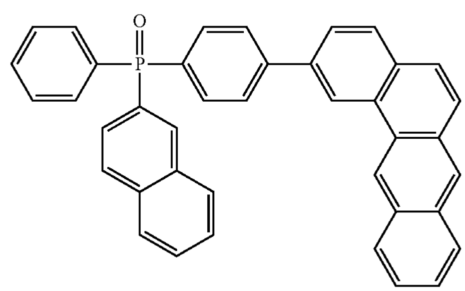
(1-48)
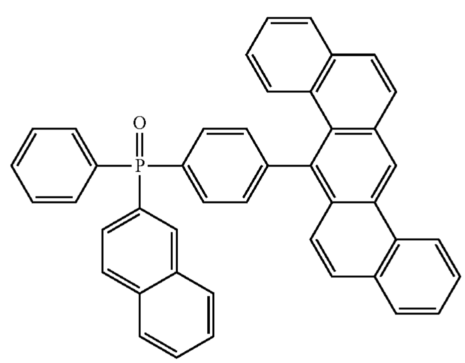

-continued
(1-49)
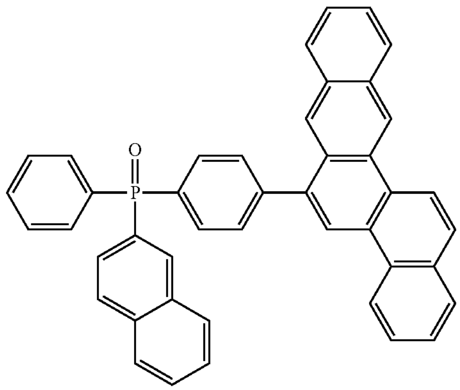
(1-50)
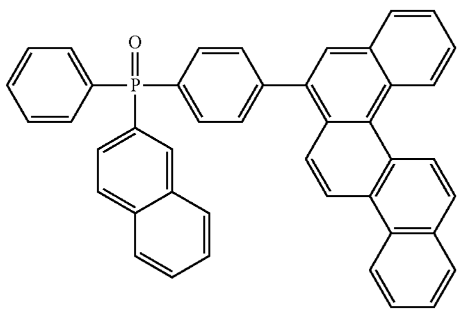
(1-51)
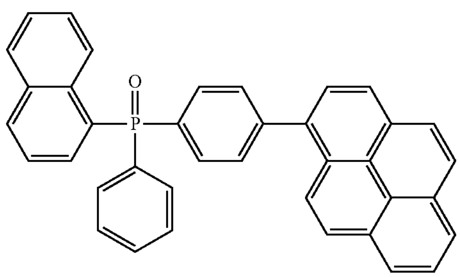
(1-52)
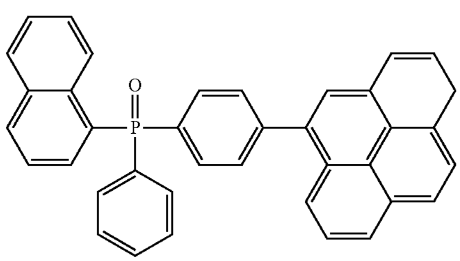
(1-53)
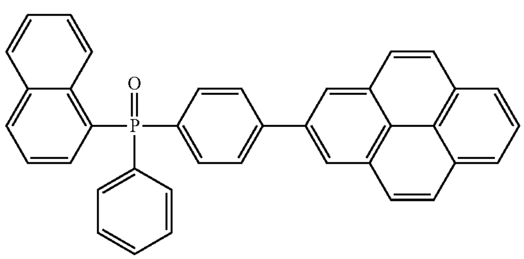
-continued
(1-54)
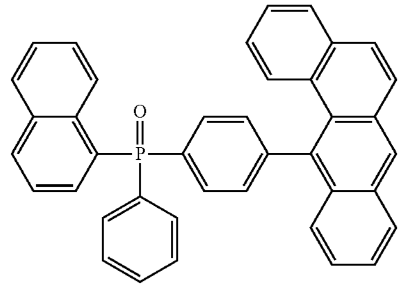
(1-55)
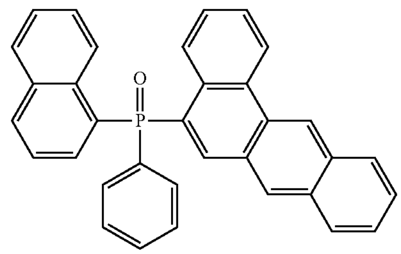
(1-56)
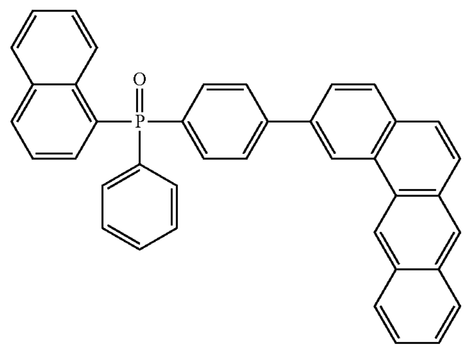
(1-57)
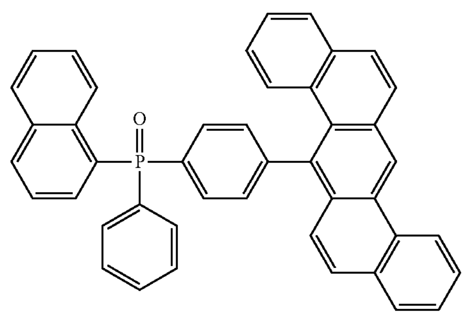
(1-58)
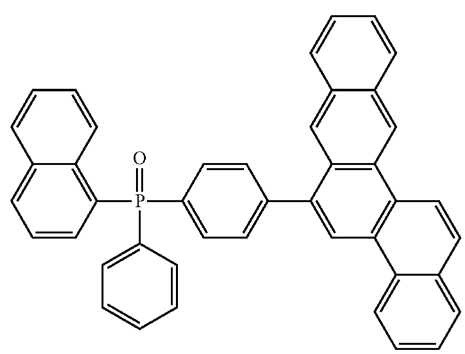

-continued
(1-59)
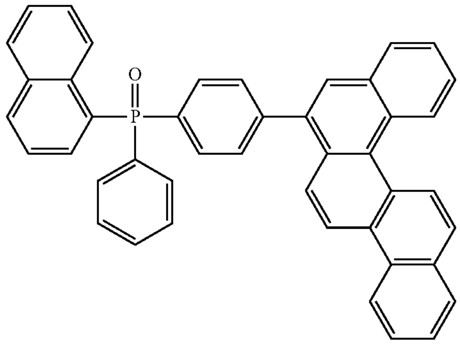
(1-60)
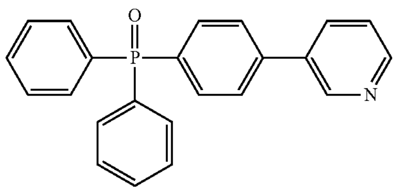
(1-61)
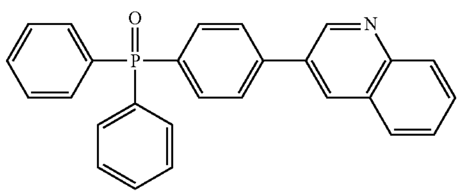
(1-62)
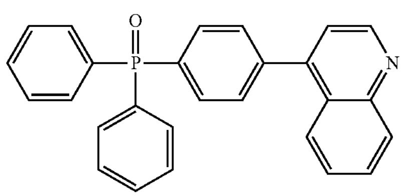
(1-63)
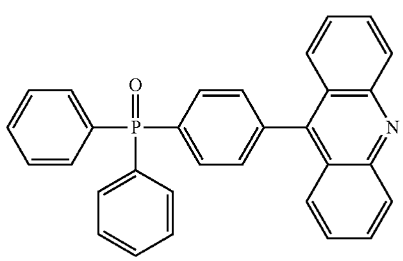
(1-64)
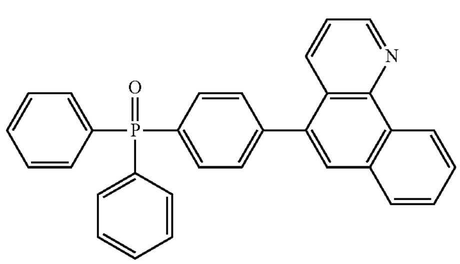
-continued
(1-65)
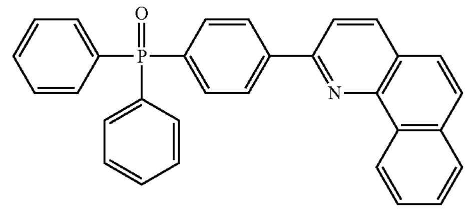
(1-66)
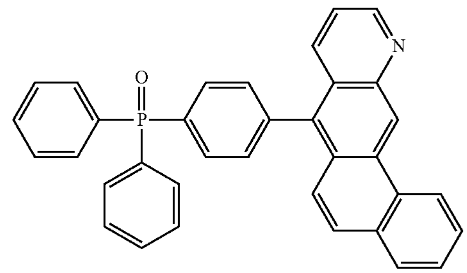
(1-67)
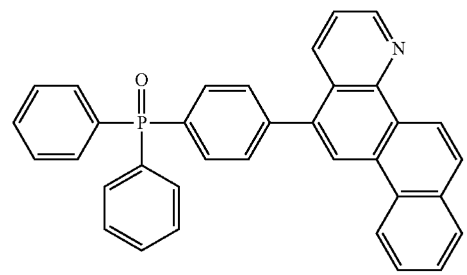
(1-68)
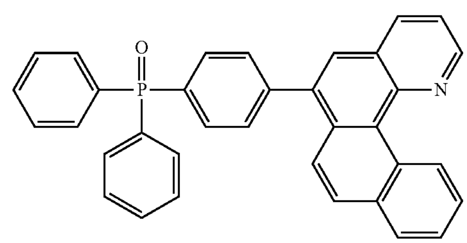
(1-69)
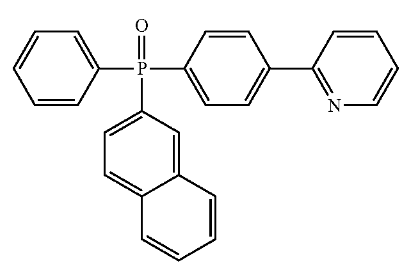
(1-70)
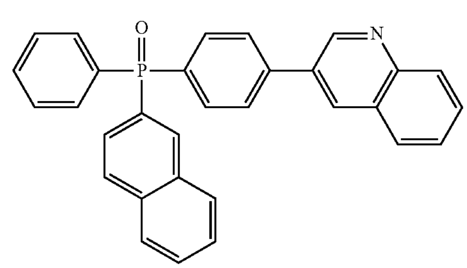

-continued
(1-71)
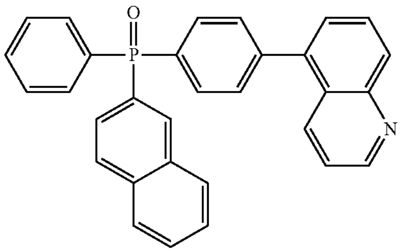
(1-72)
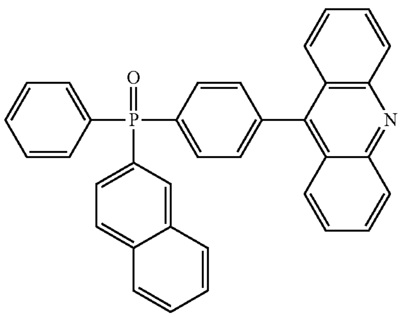
(1-73)
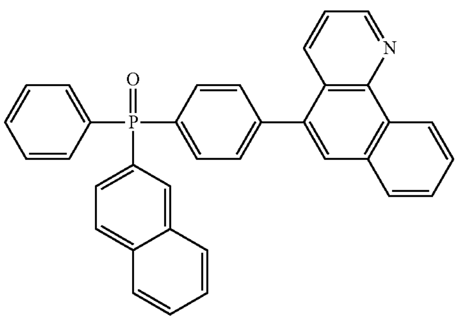
(1-74)
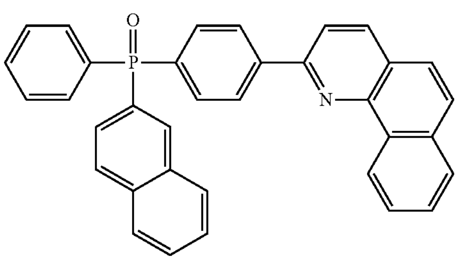
(1-75)
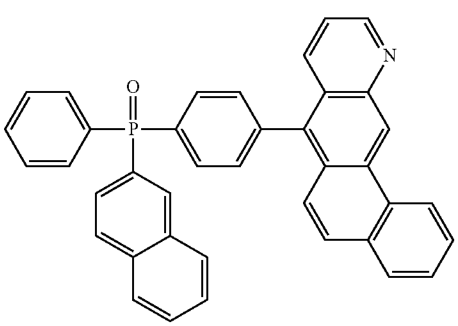
-continued
(1-76)
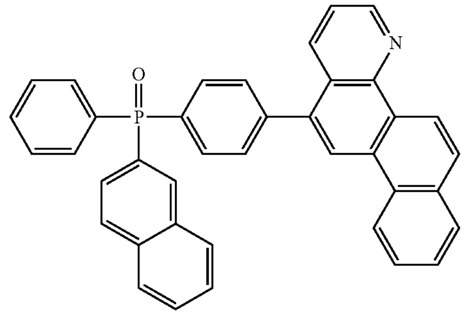
(1-77)
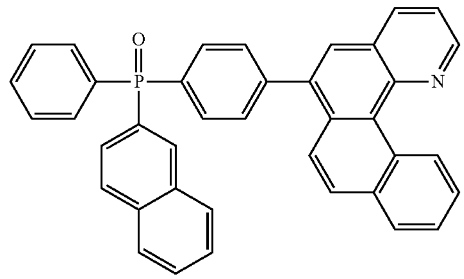
(1-78)
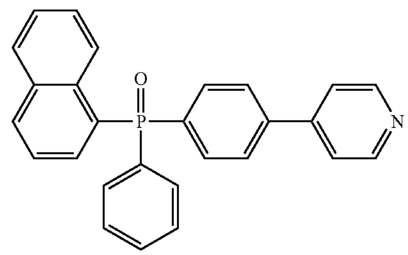
(1-79)
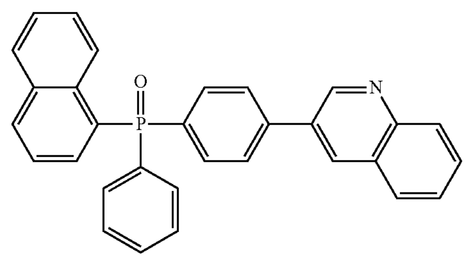
(1-80)
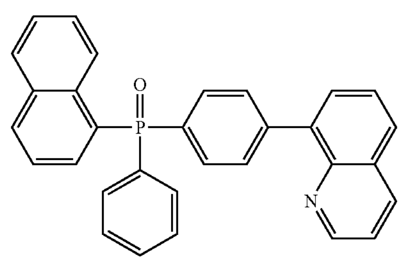
(1-81)
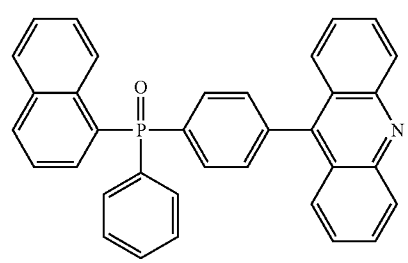

-continued
(1-82)
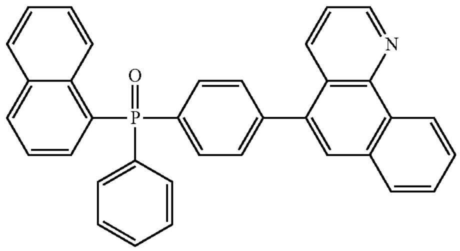
(1-83)
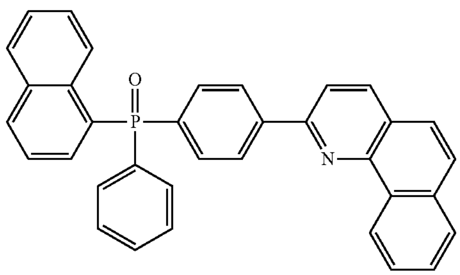
(1-84)
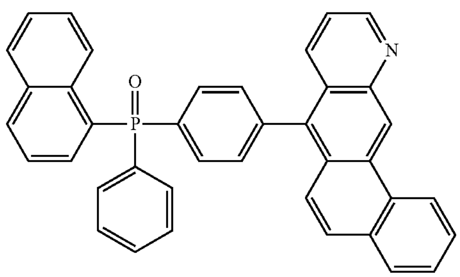
(1-85)
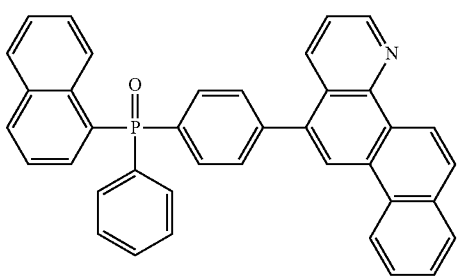
(1-86)
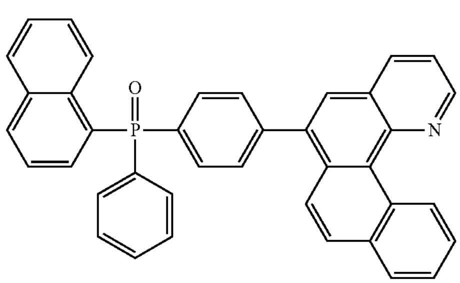
(1-87)
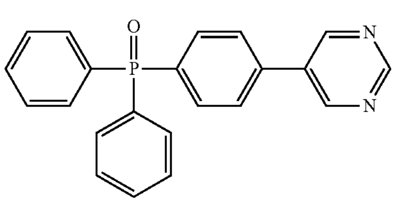
-continued
(1-88)
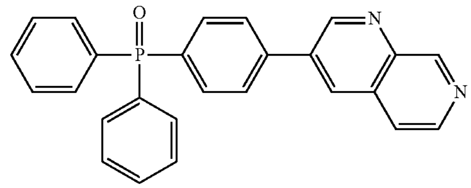
(1-89)
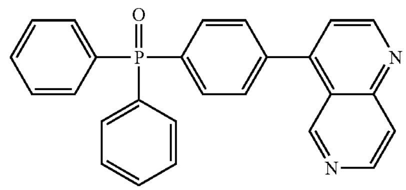
(1-90)
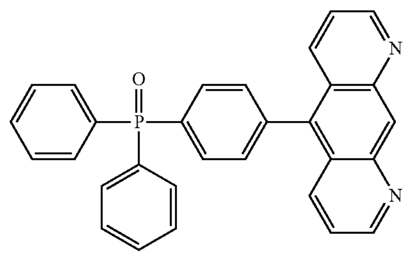
(1-91)
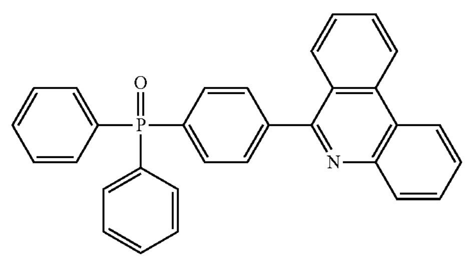
(1-92)
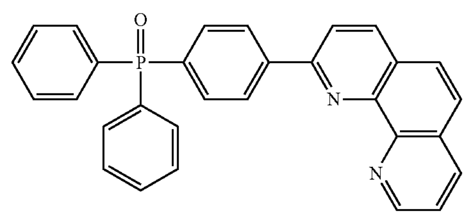
(1-93)
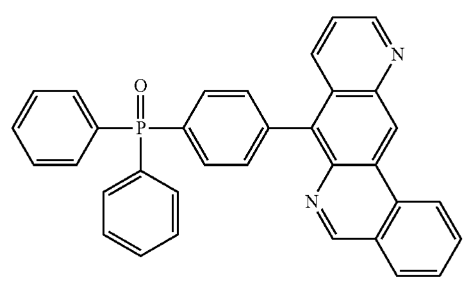

-continued
(1-94)
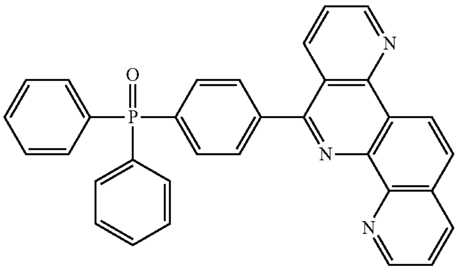
(1-95)
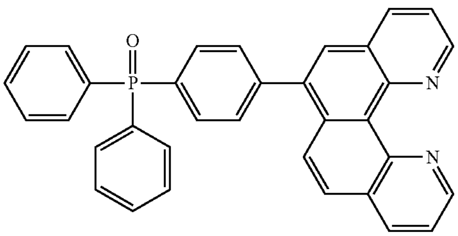
(1-96)
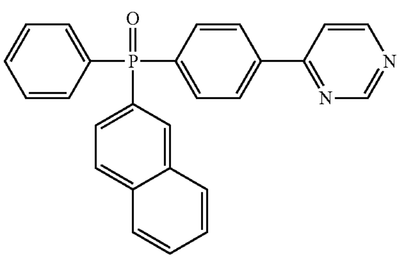
(1-97)
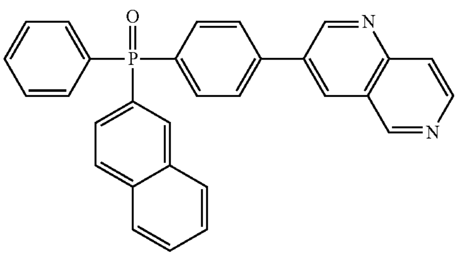
(1-98)
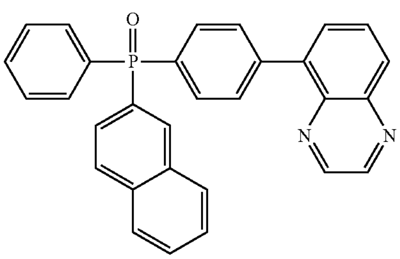
(1-99)
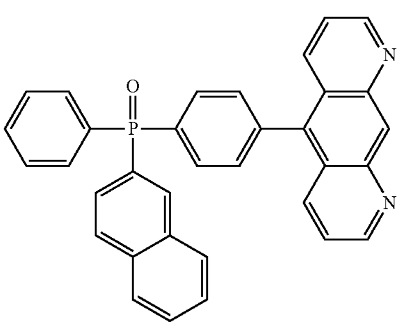
-continued
(1-100)
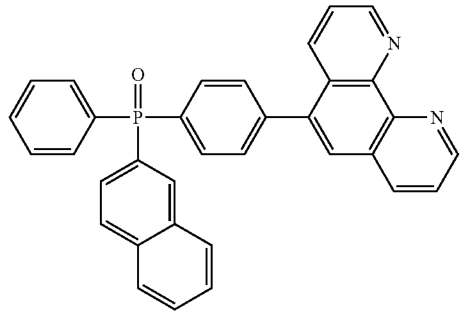
(1-101)
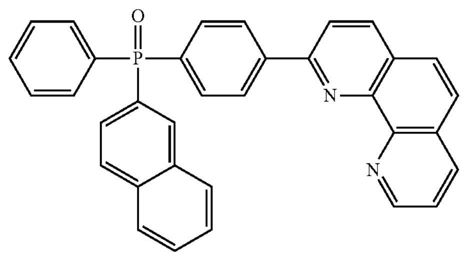
(1-102)
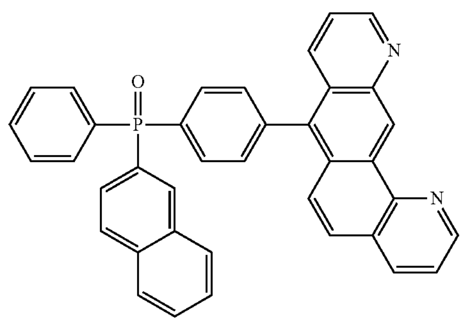
(1-103)
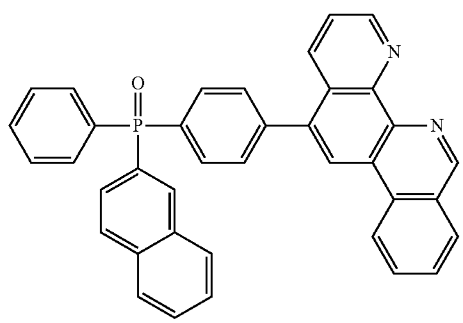
(1-104)
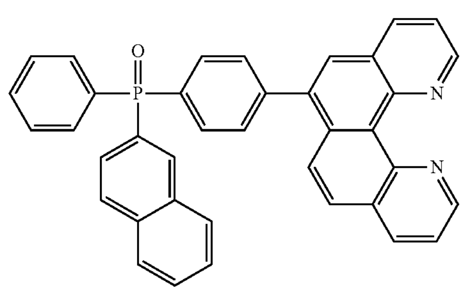

-continued
(1-105)
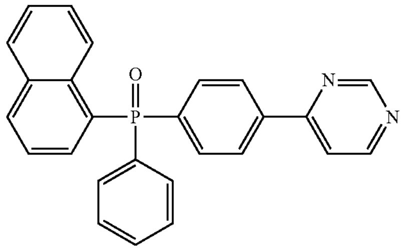
(1-106)
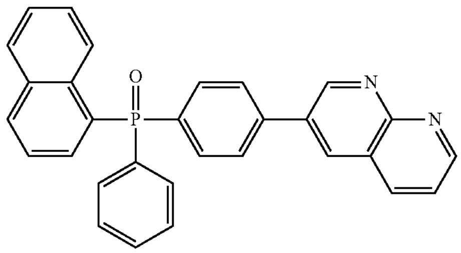
(1-107)
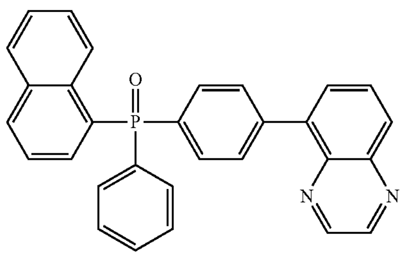
(1-108)
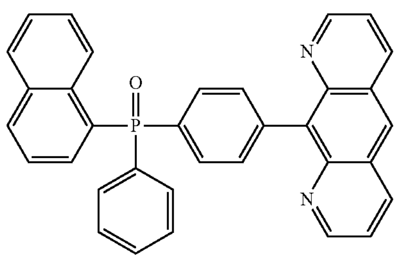
(1-109)
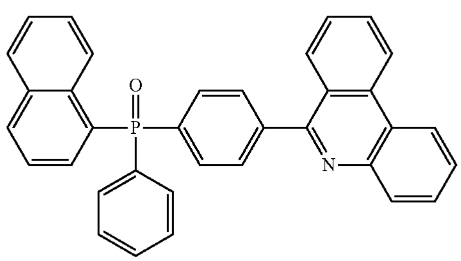
(1-110)
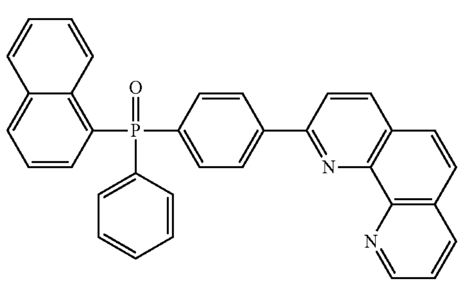
-continued
(1-111)
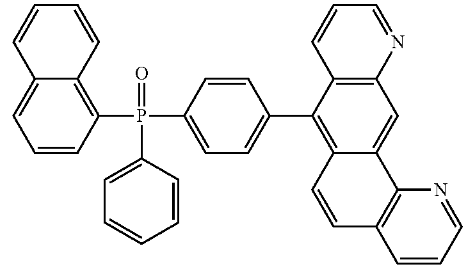
(1-112)
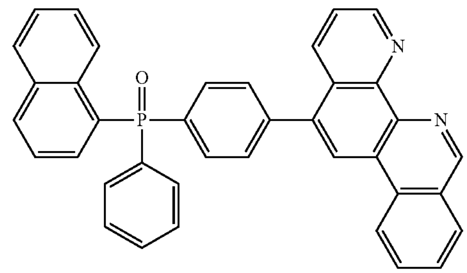
(1-113)
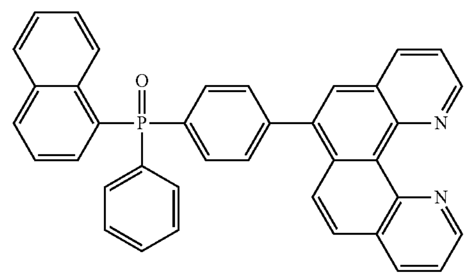
(1-114)
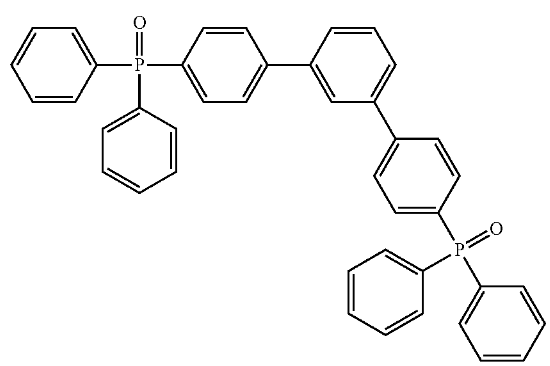
(1-115)
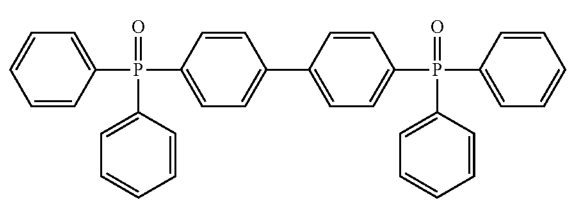

-continued
(1-116)
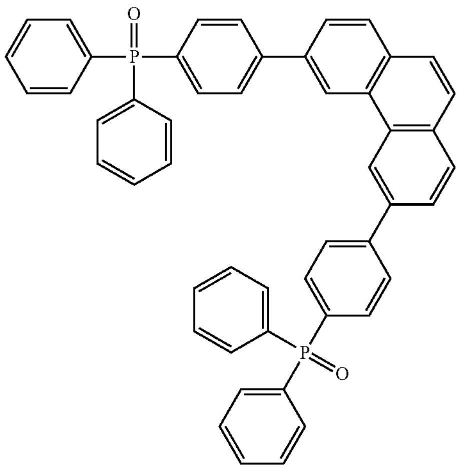
(1-117)
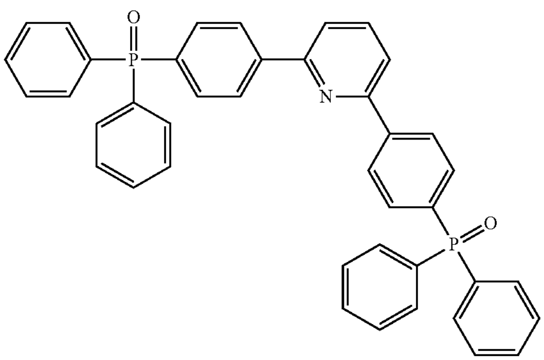
(1-118)
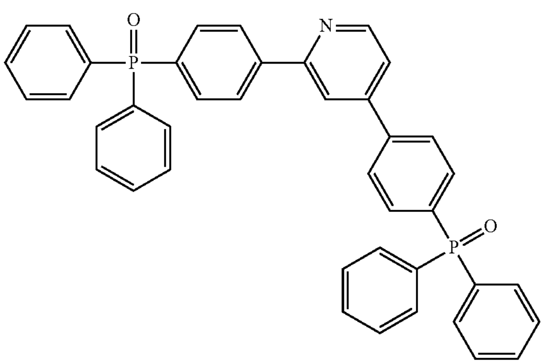
(1-119)
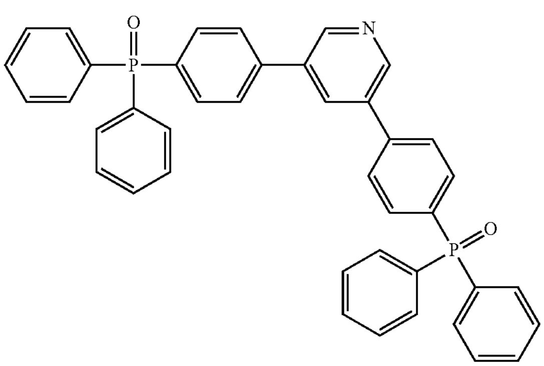
-continued
(1-120)
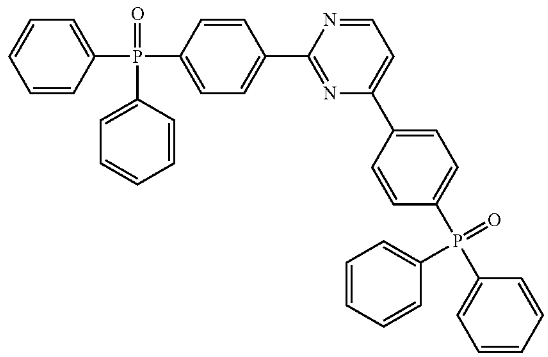
(1-121)
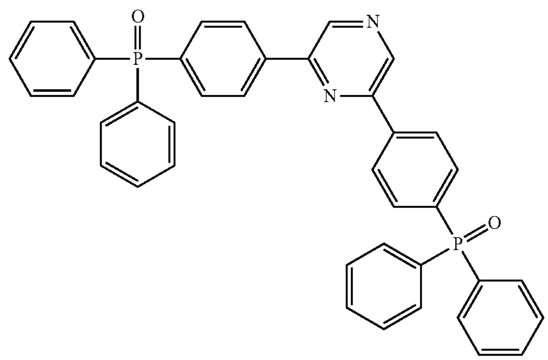
(1-122)
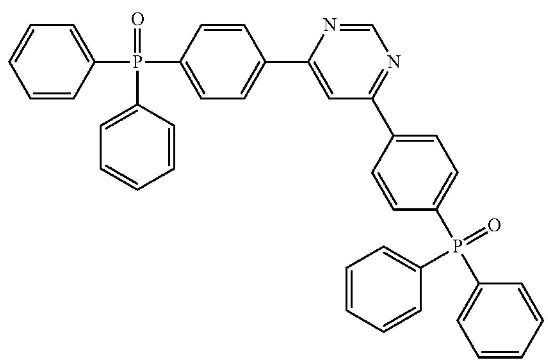
(1-123)
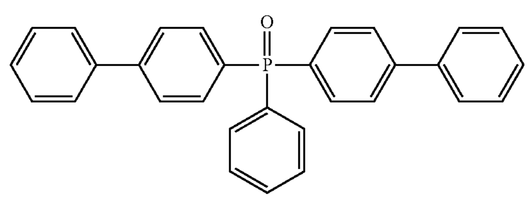
(1-124)
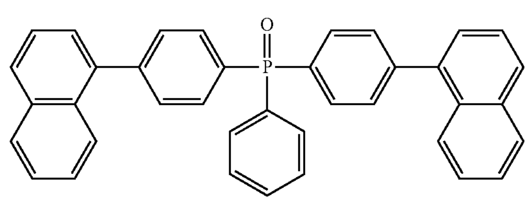

-continued
(1-125)
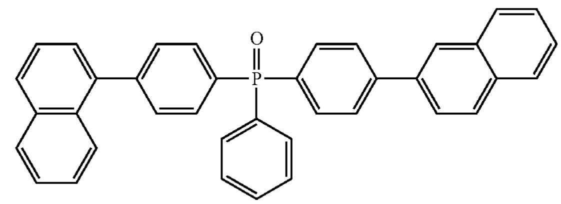
(1-126)
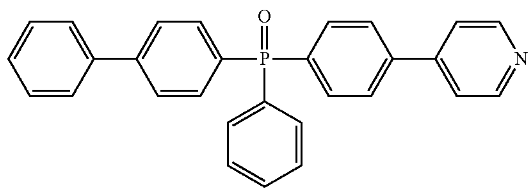
(1-127)
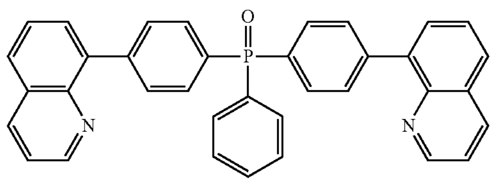
(1-128)
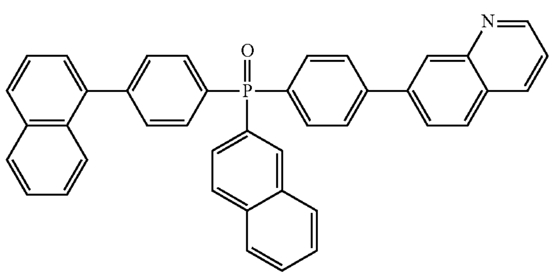
(1-129)
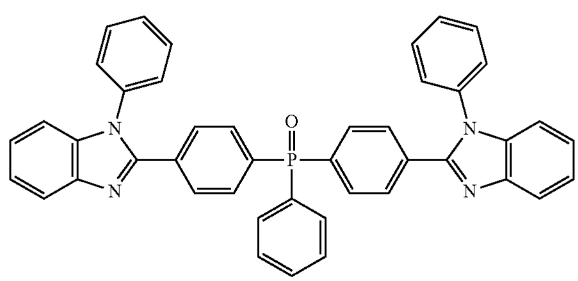
(1-130)
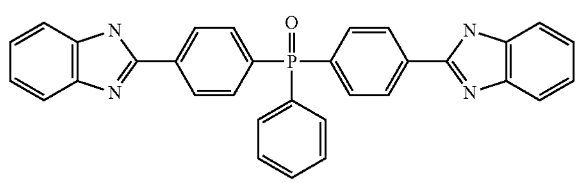
(1-131)
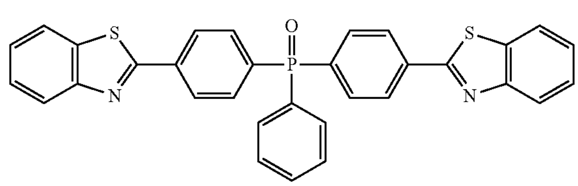
-continued
(1-132)
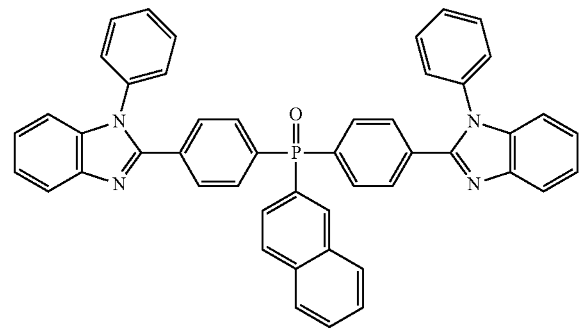
(1-133)
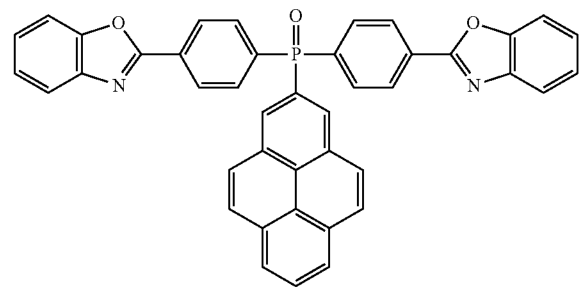
(1-134)
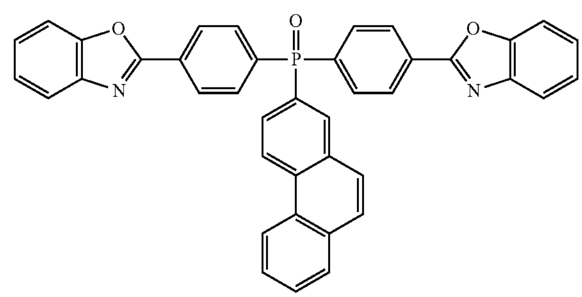
(1-135)
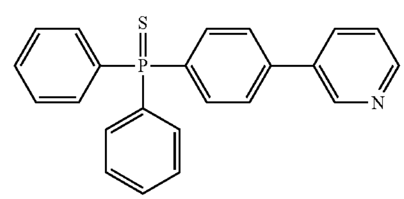
(1-136)
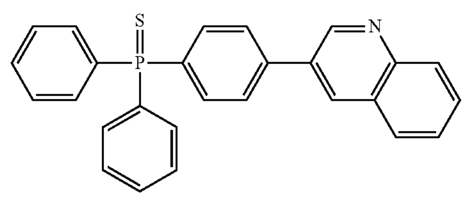
(1-137)
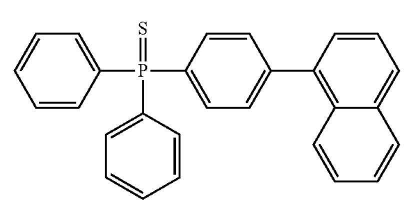

-continued
(1-138)
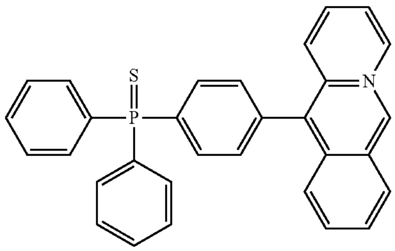
(1-139)
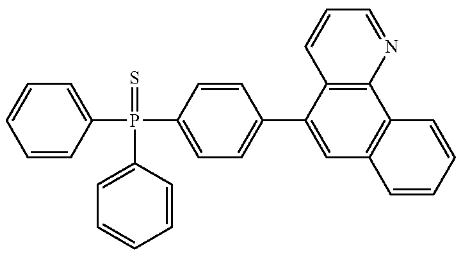
(1-140)
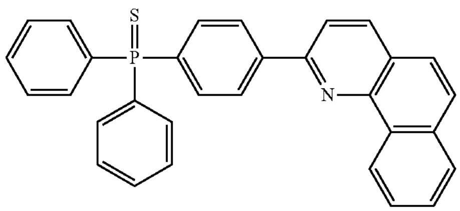
(1-141)
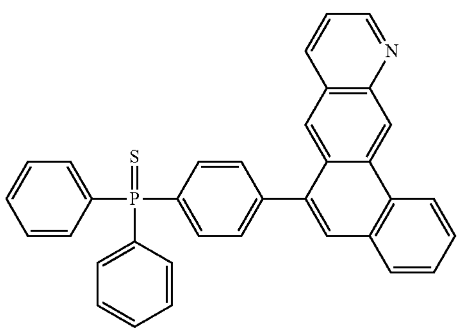
(1-142)
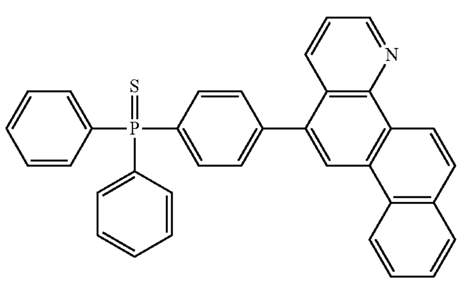
(1-143)
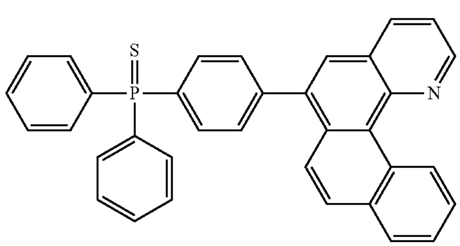
-continued
(1-144)
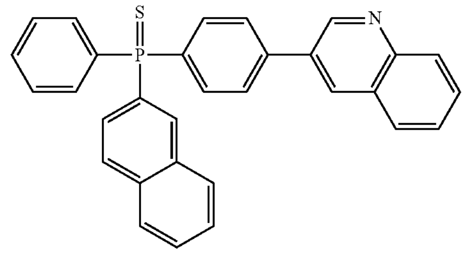
(1-145)
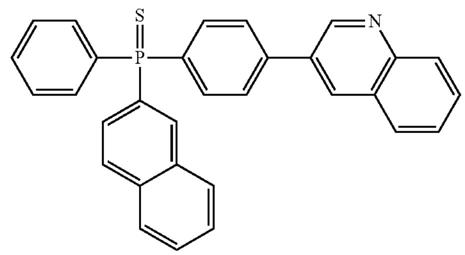
(1-146)
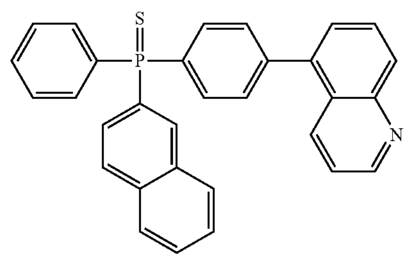
(1-147)
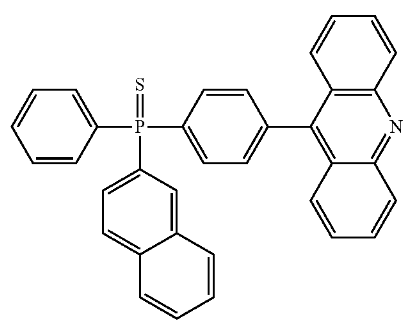
(1-148)
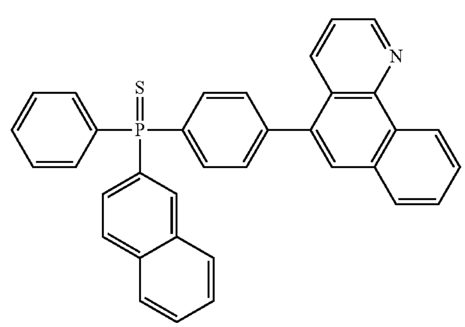

-continued
(1-149)
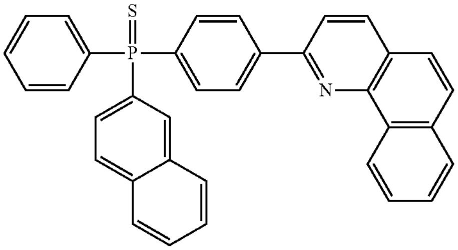
(1-150)
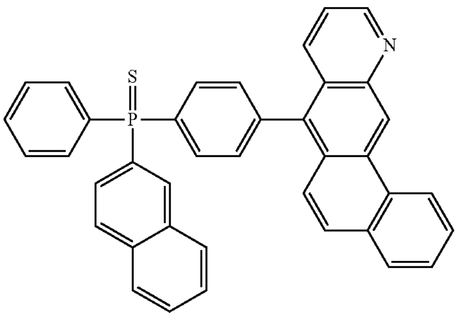
(1-151)
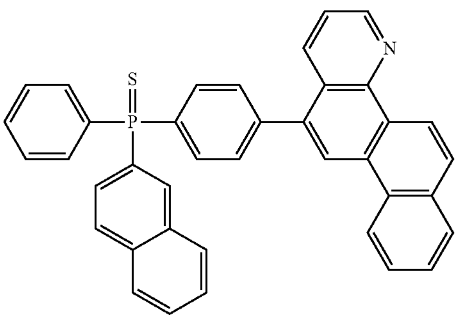
(1-152)
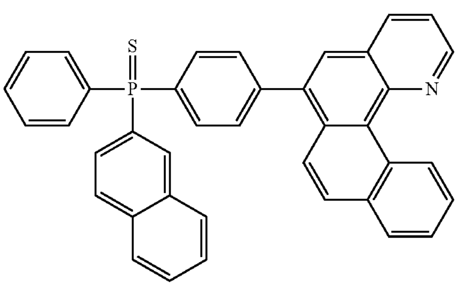
(1-153)
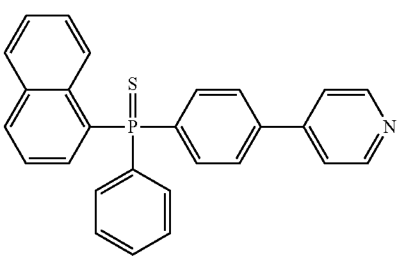
-continued
(1-154)
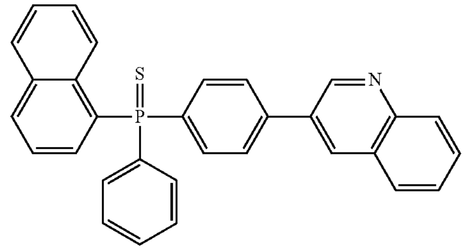
(1-155)
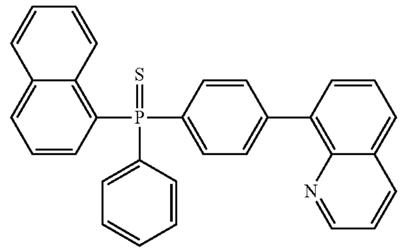
(1-156)
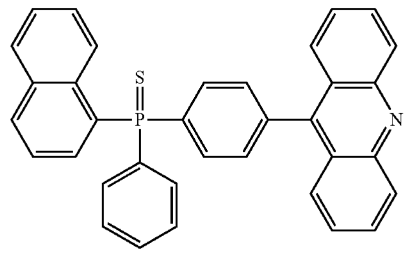
(1-157)
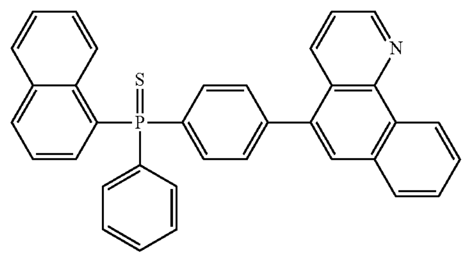
(1-158)
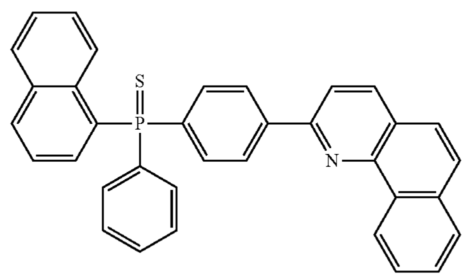
(1-159)
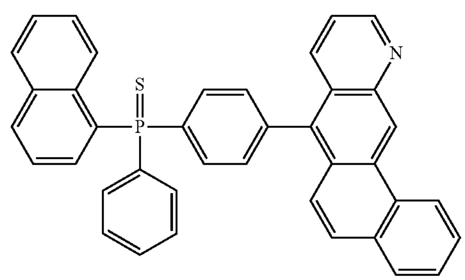

(1-160)
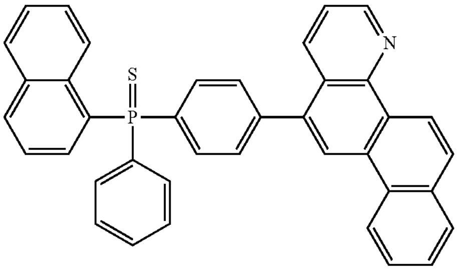
(1-161)
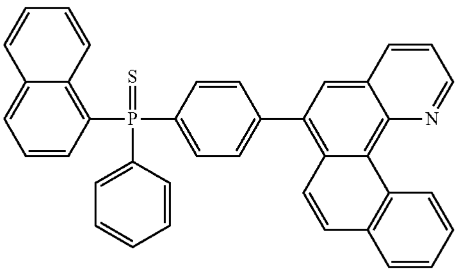
(1-162)
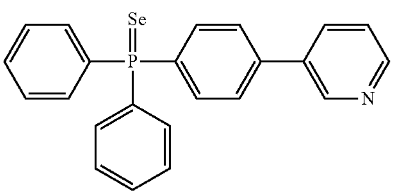
(1-163)
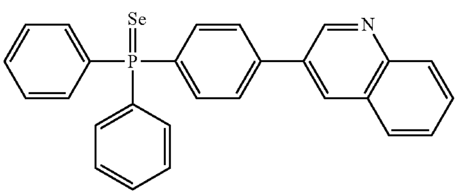
(1-164)
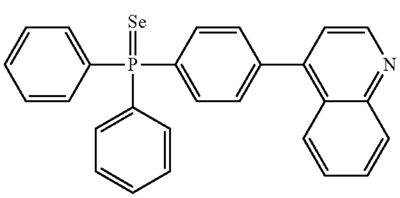
(1-165)
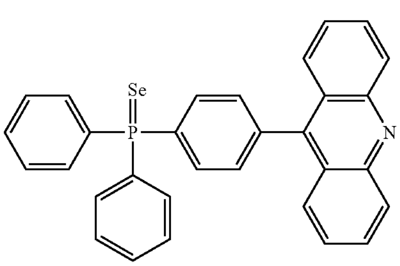
(1-166)
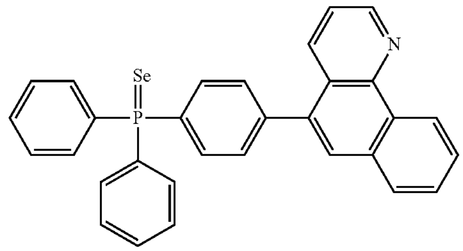
(1-167)
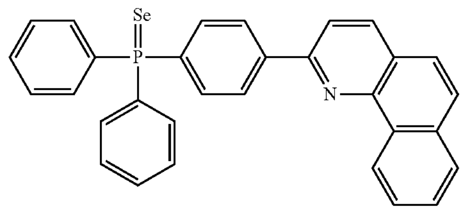
(1-168)
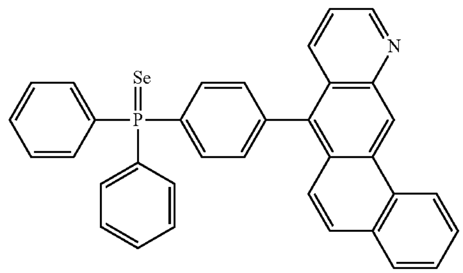
(1-169)
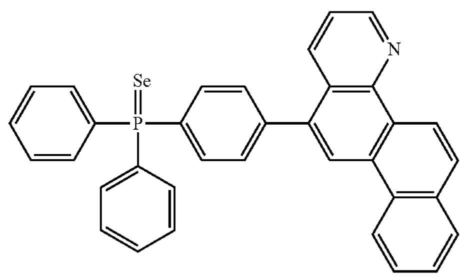
(1-170)
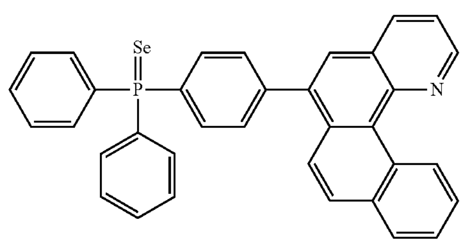
(1-171)
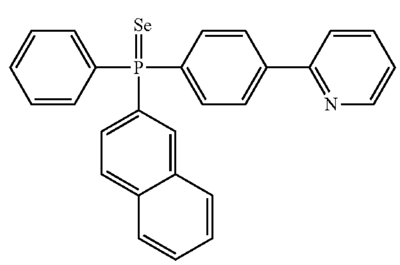

-continued
(1-172)
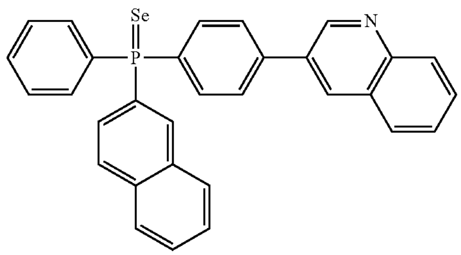
(1-173)
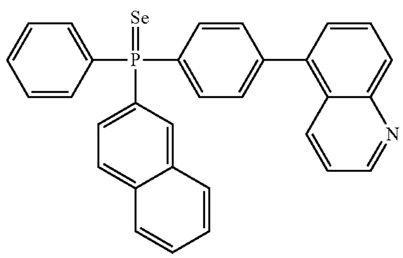
(1-174)
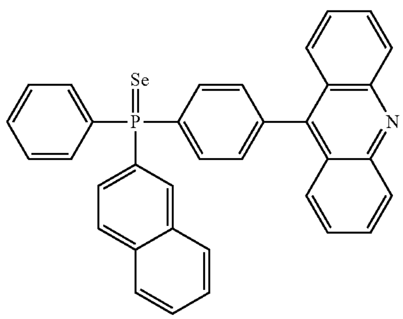
(1-175)
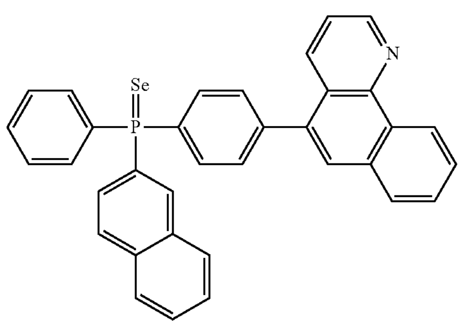
(1-176)
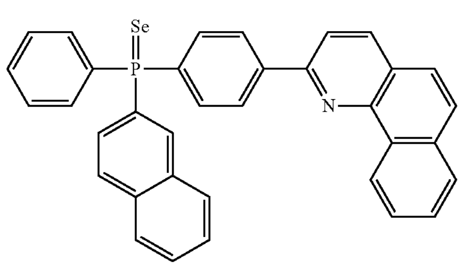
-continued
(1-177)
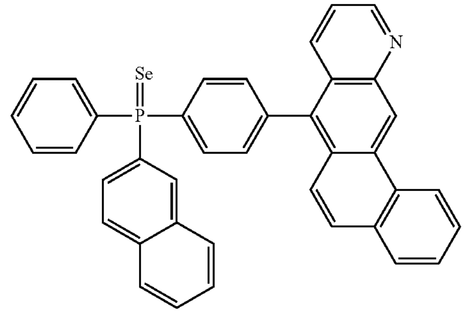
(1-178)
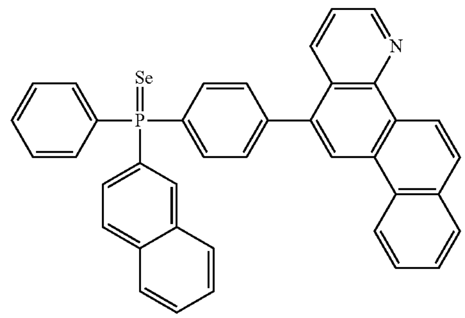
(1-179)
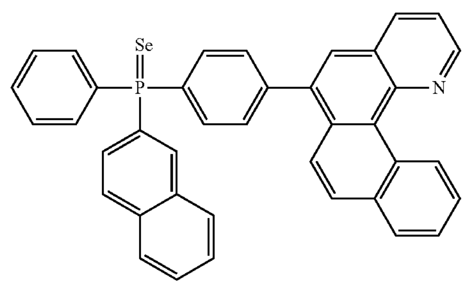
(1-180)
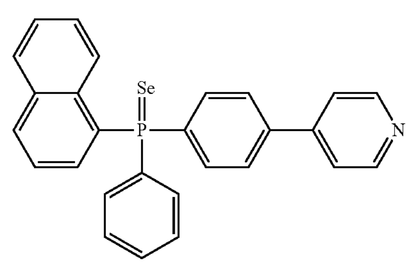
(1-181)
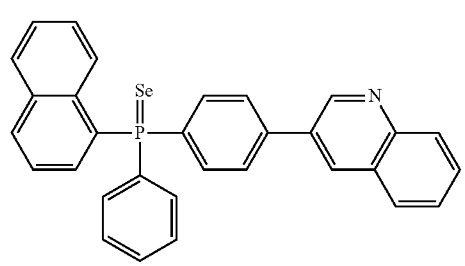

-continued
(1-182)
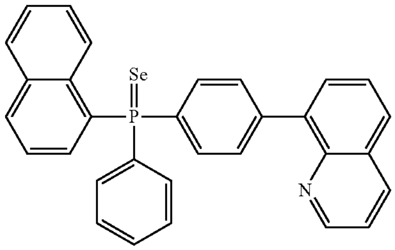
(1-183)
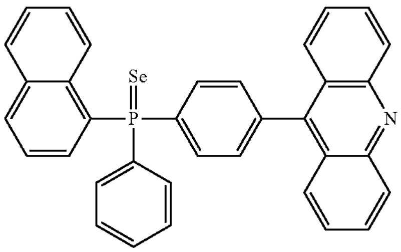
(1-184)
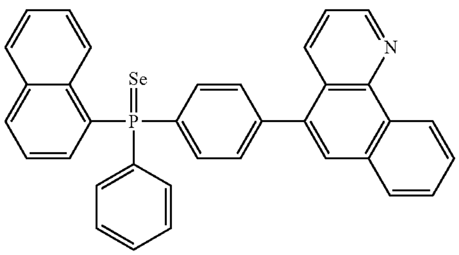
(1-185)
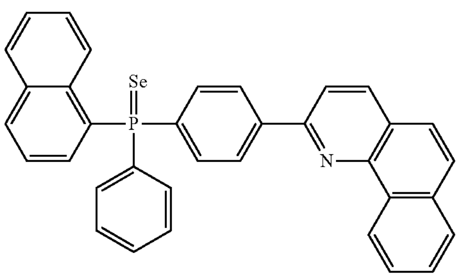
(1-186)
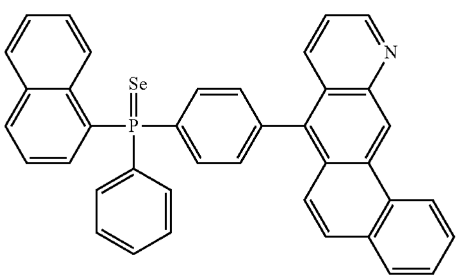
(1-187)
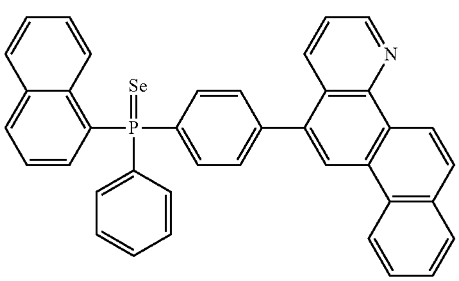
-continued
(1-188)
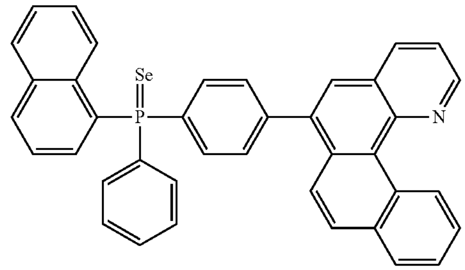
The second compound may be one selected from a group consisting of compounds represented by Chemical Formula 2-1 to Chemical Formula 2-147:
(2-1)
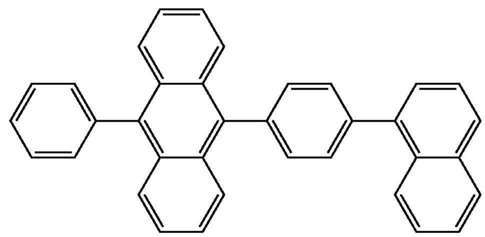
(2-2)
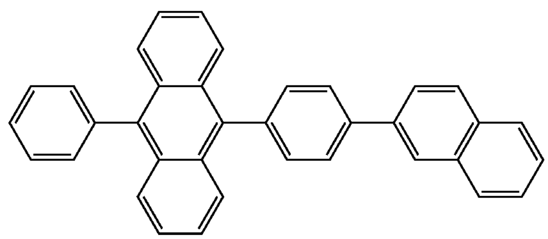
(2-3)
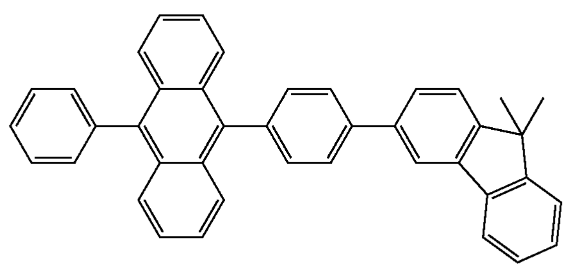
(2-4)
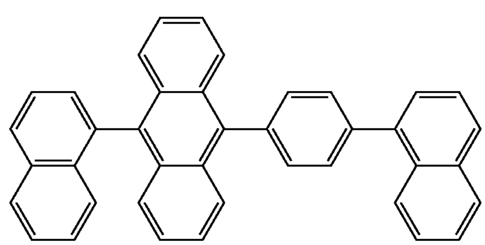

-continued
(2-5)
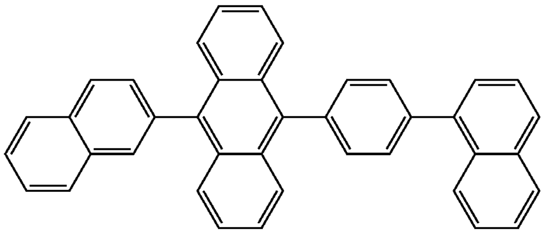
(2-6)
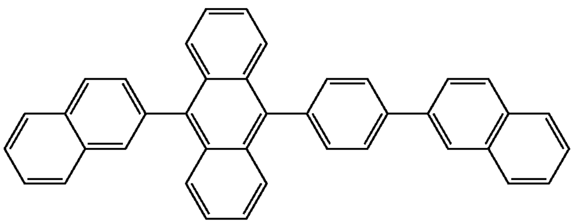
(2-7)
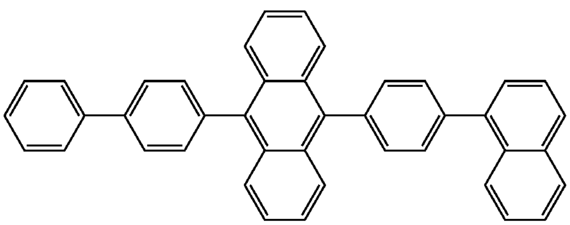
(2-8)
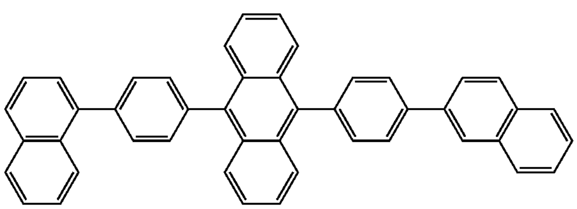
(2-9)
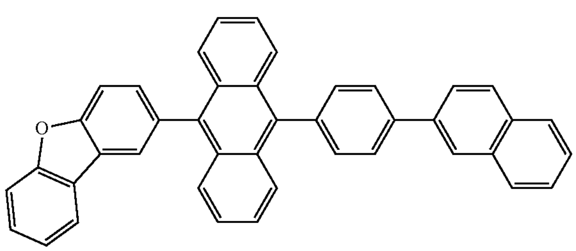
(2-10)
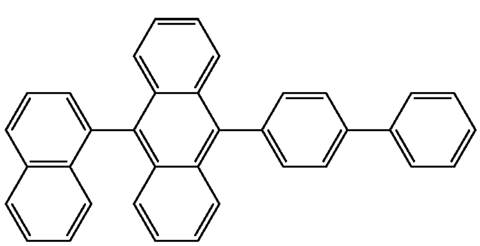
-continued
(2-11)
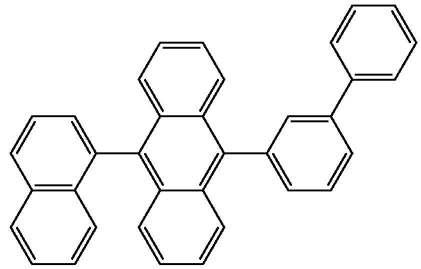
(2-12)
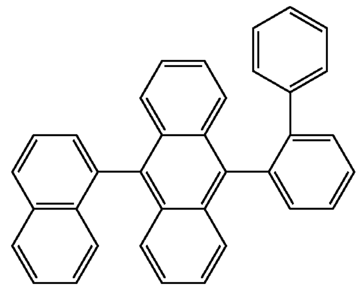
(2-13)
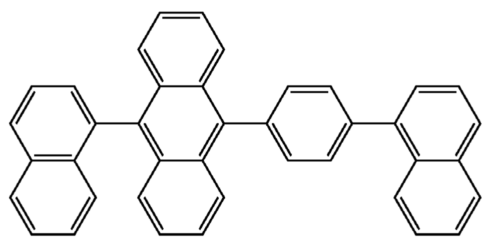
(2-14)
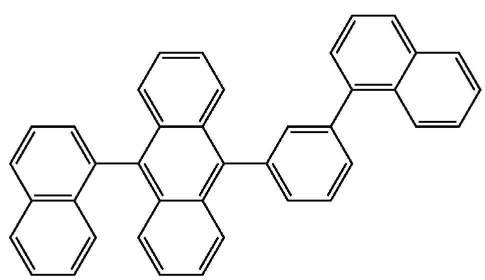
(2-15)
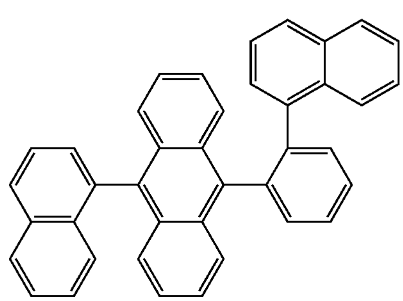

-continued
(2-16)
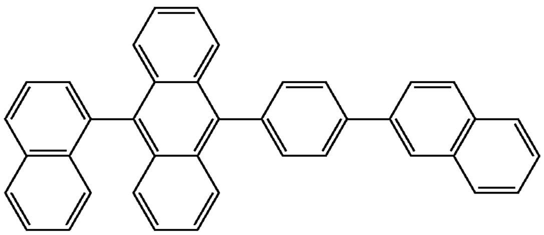
(2-17)
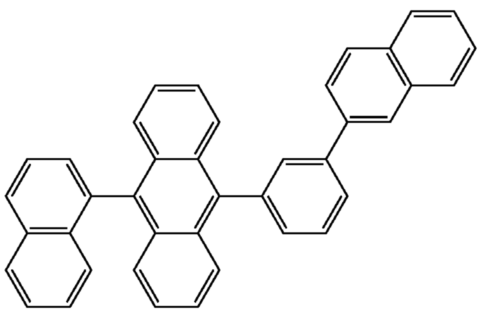
(2-18)
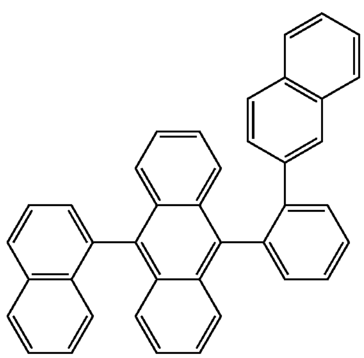
(2-19)
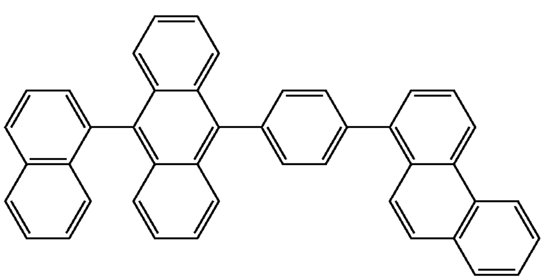
(2-20)
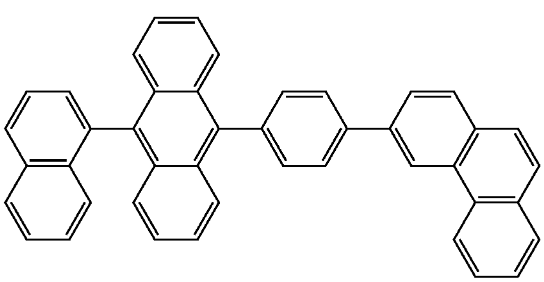
-continued
(2-21)
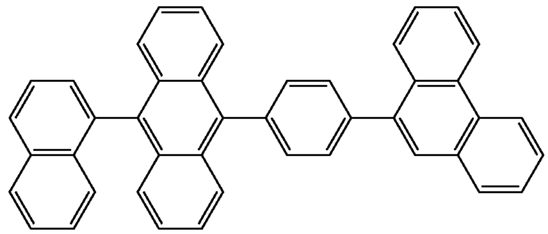
(2-22)
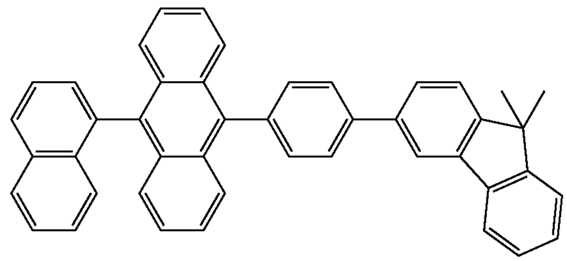
(2-23)
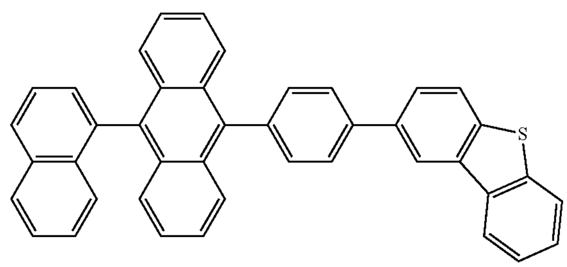
(2-24)
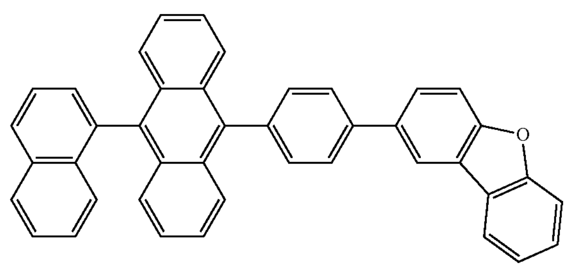
(2-25)
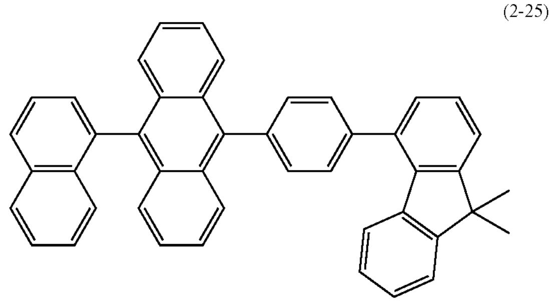

-continued
(2-26)
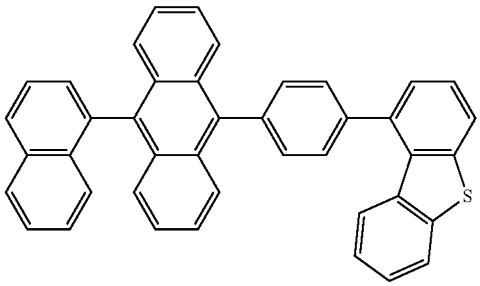
(2-27)
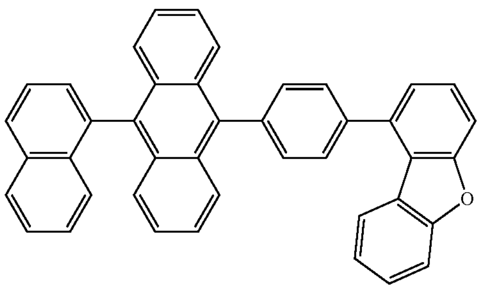
(2-28)
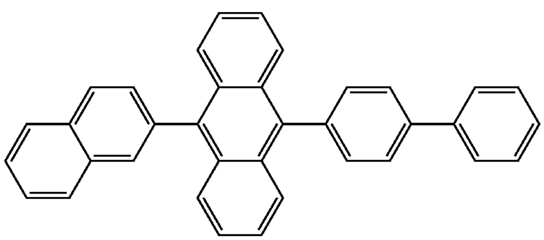
(2-29)
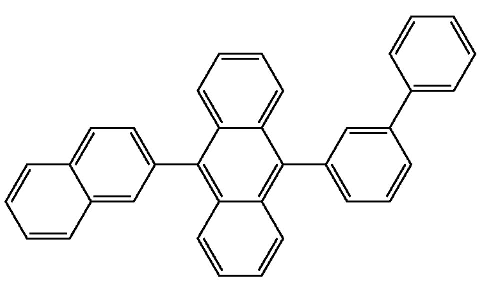
(2-30)
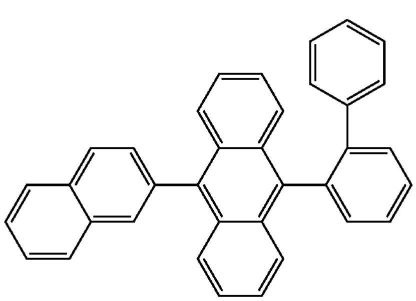
-continued
(2-31)
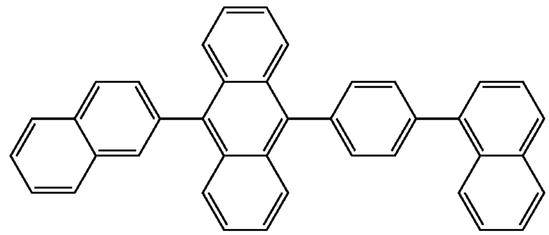
(2-32)
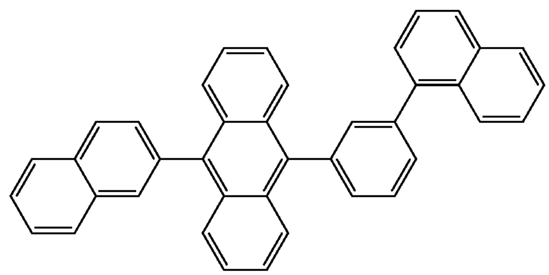
(2-33)
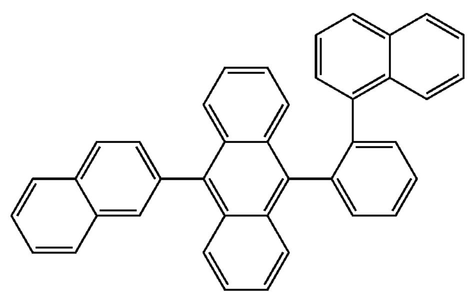
(2-34)
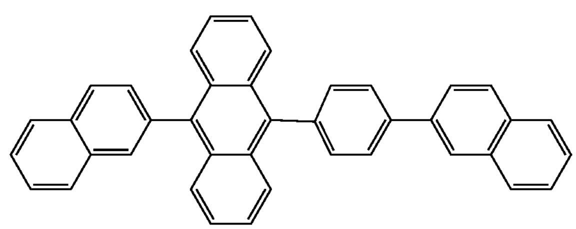
(2-35)
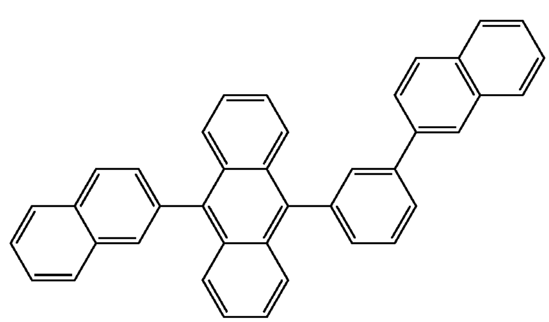

-continued
(2-36)
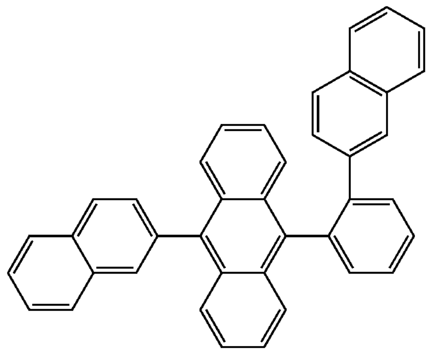
(2-37)
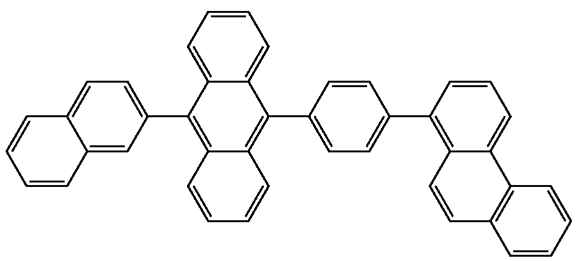
(2-38)
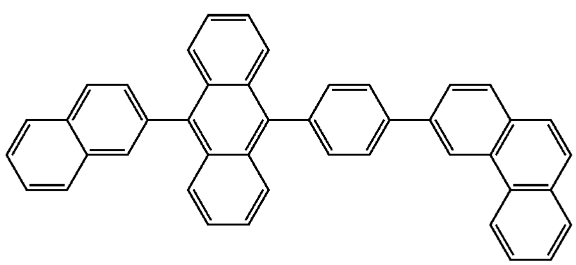
(2-39)
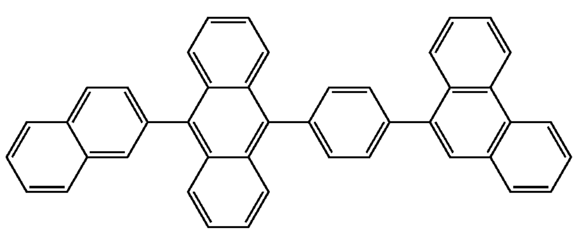
(2-40)
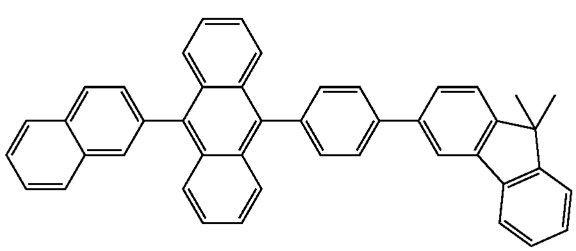
-continued
(2-41)
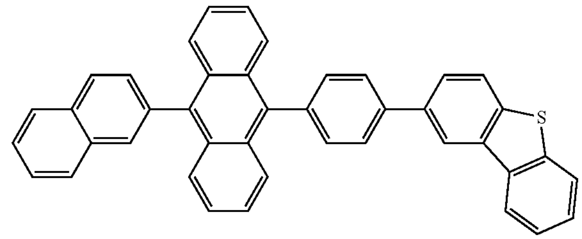
(2-42)
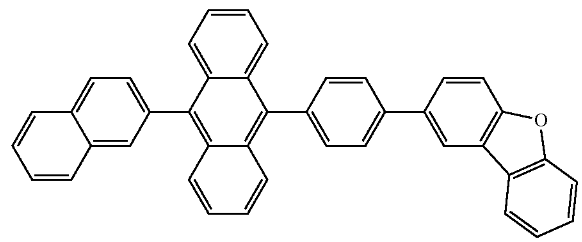
(2-43)
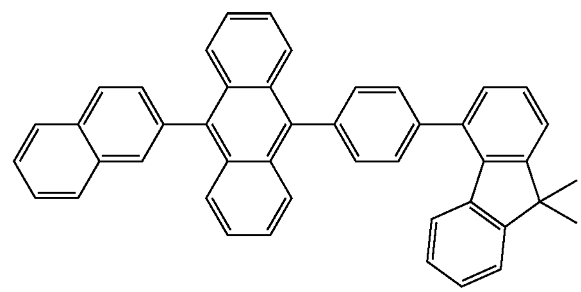
(2-44)
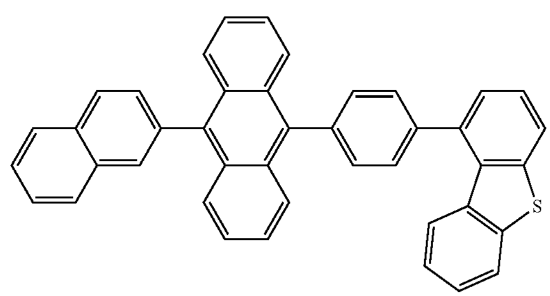
(2-45)
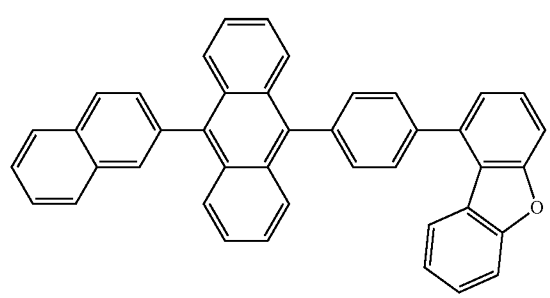

-continued
(2-46)
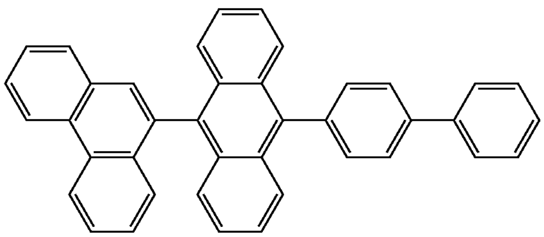
(2-47)
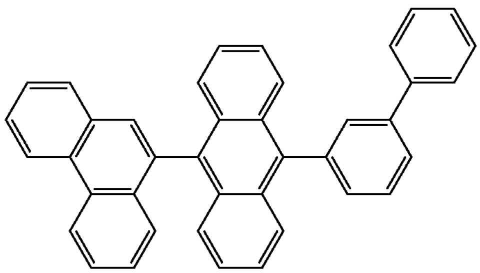
(2-48)
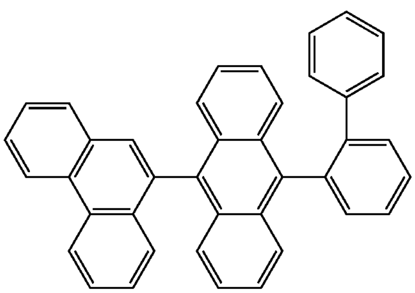
(2-49)
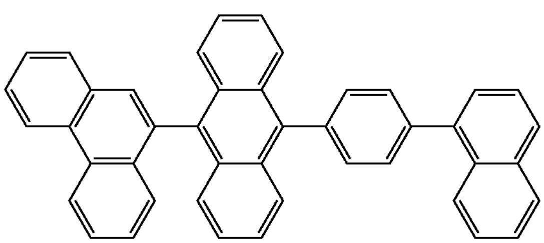
(2-50)
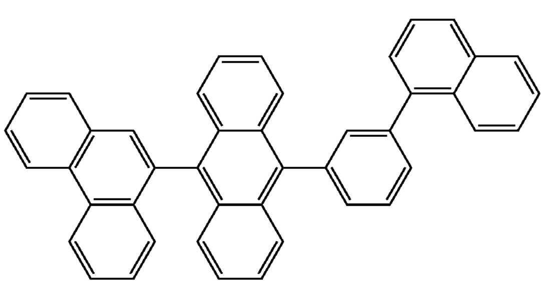
-continued
(2-51)
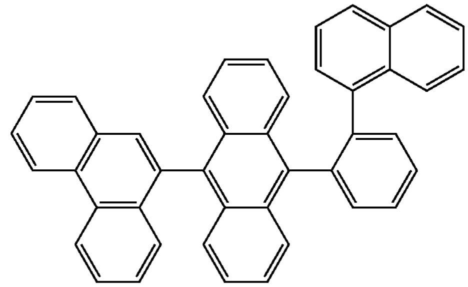
(2-52)
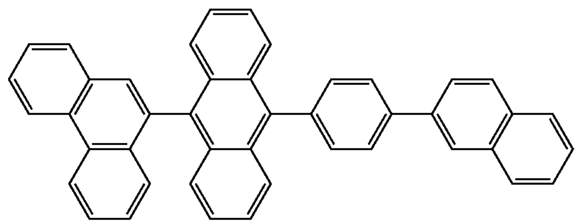
(2-53)
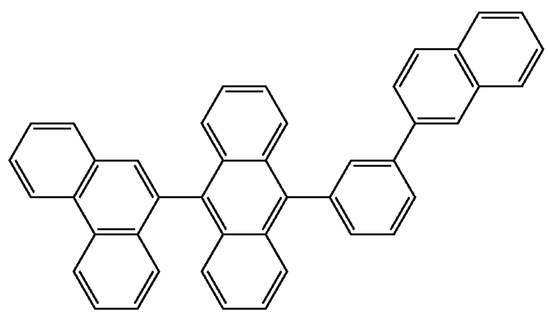
(2-54)
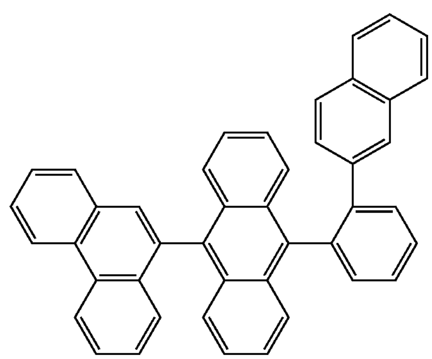
(2-55)
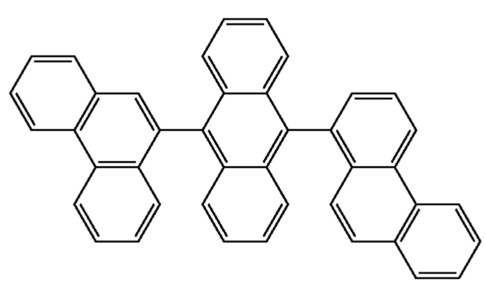

-continued
(2-56)
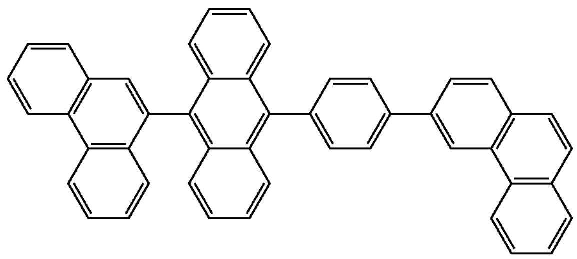
(2-57)
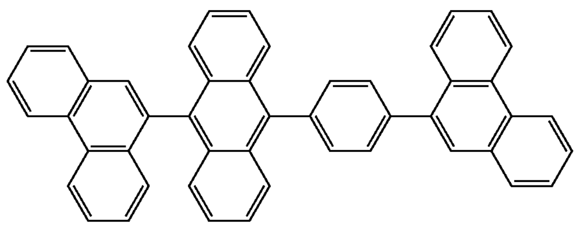
(2-58)
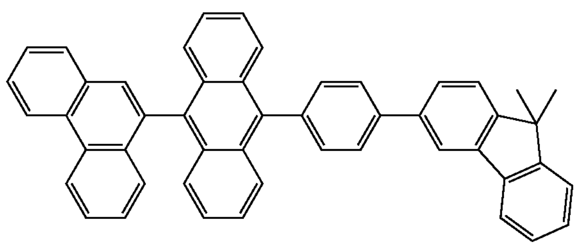
(2-59)
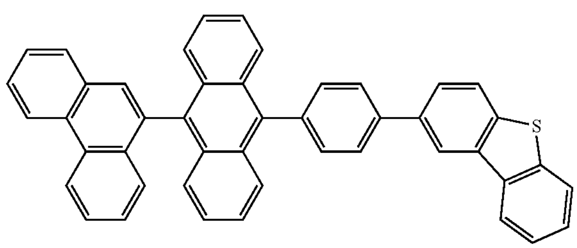
(2-60)
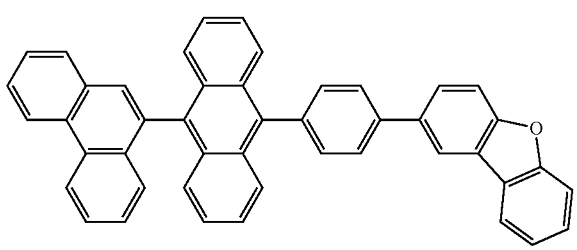
(2-61)
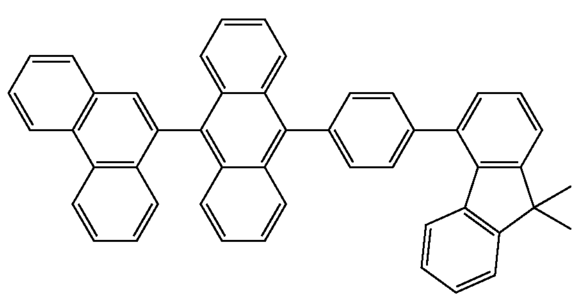
-continued
(2-62)
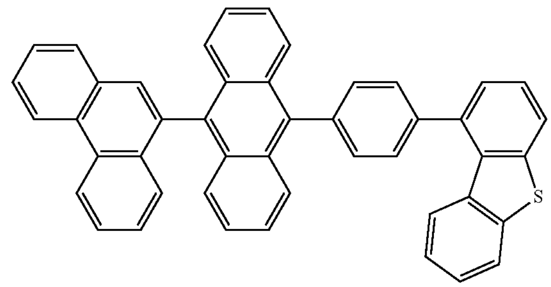
(2-63)
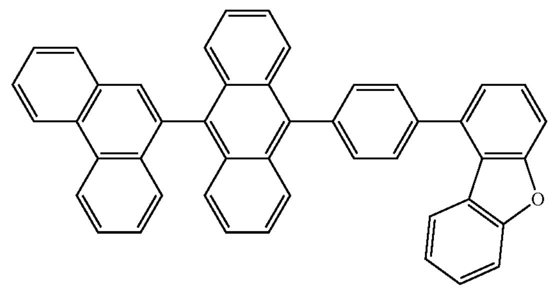
(2-64)
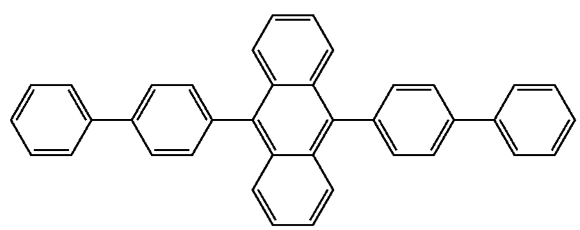
(2-65)
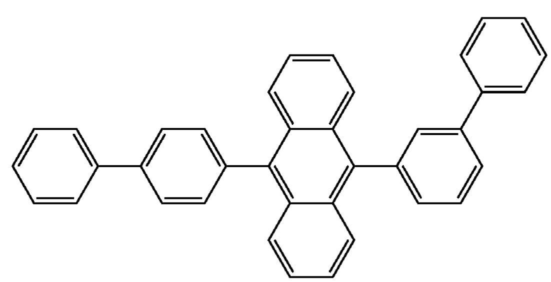
(2-66)
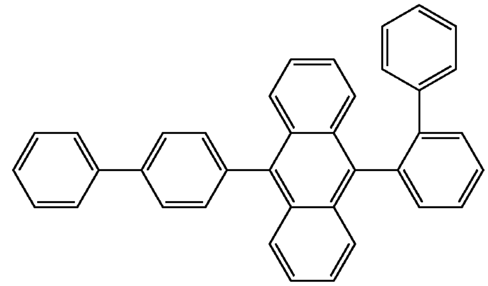

(2-67)
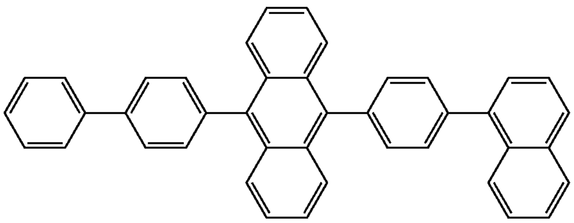
(2-68)
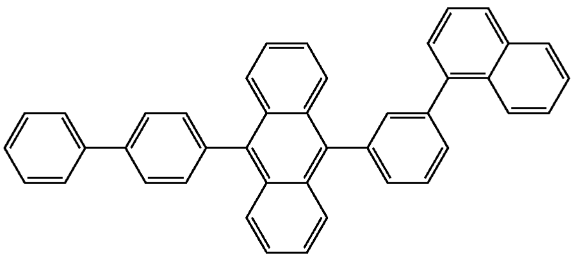
(2-69)
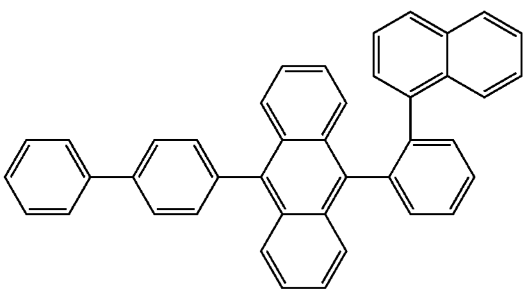
(2-70)
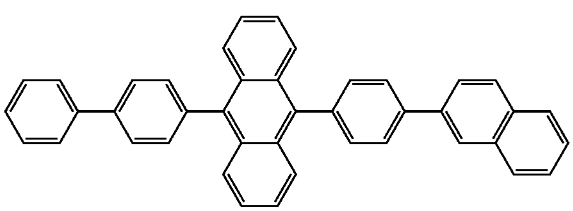
(2-71)
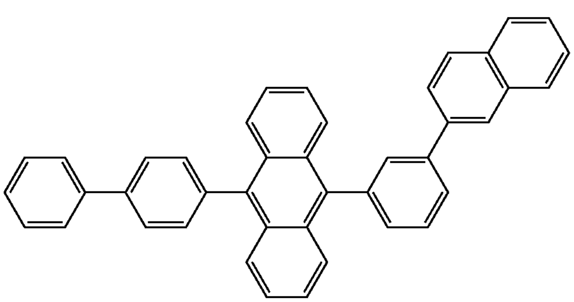
(2-72)
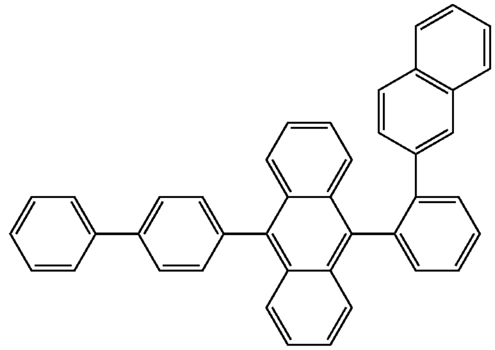
(2-73)
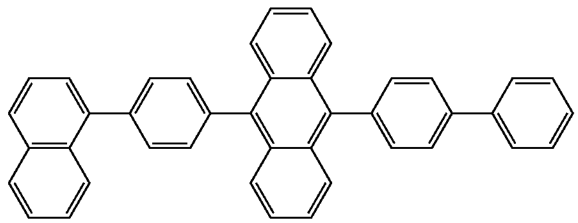
(2-74)
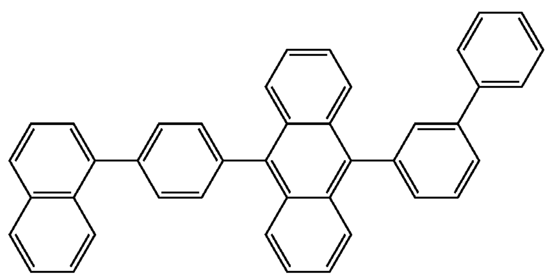
(2-75)
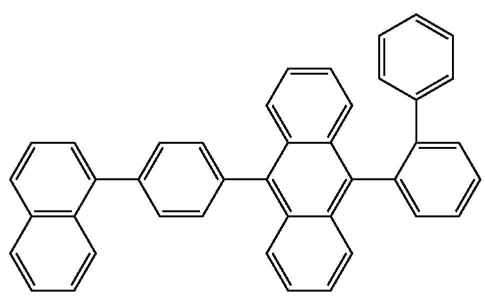
(2-76)
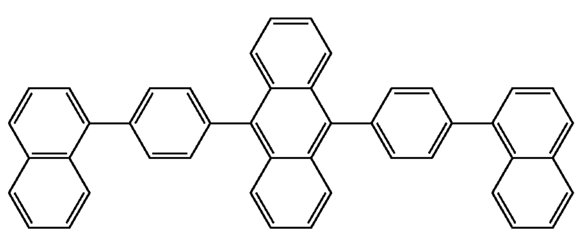

-continued
(2-77)
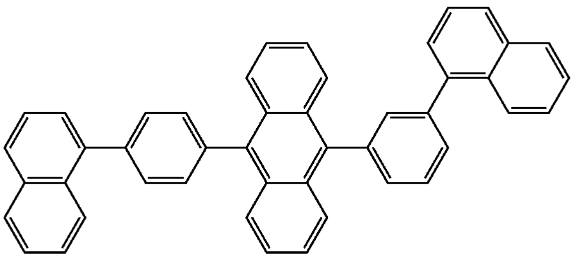
(2-78)
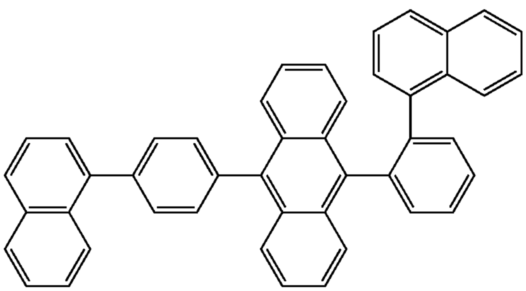
(2-79)
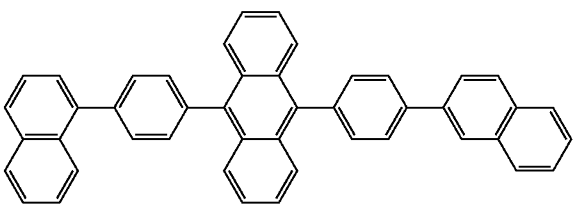
(2-80)
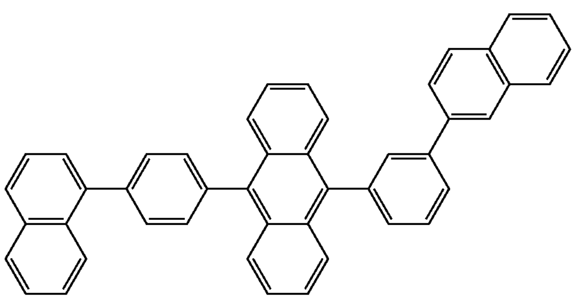
(2-81)
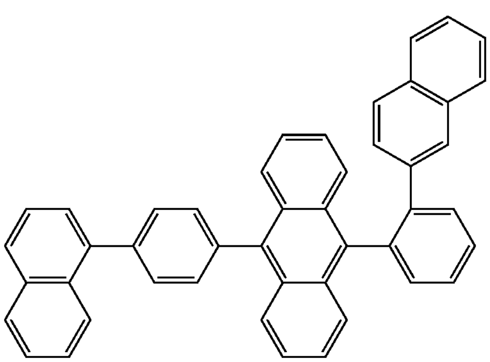
-continued
(2-82)
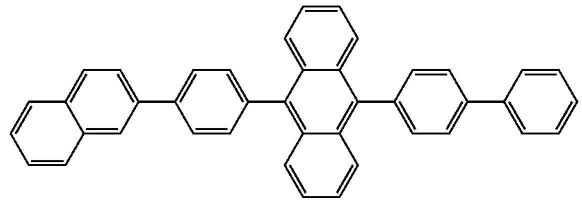
(2-83)
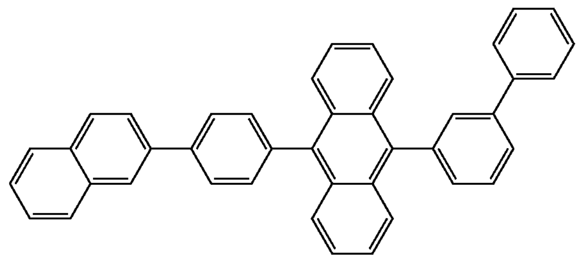
(2-84)
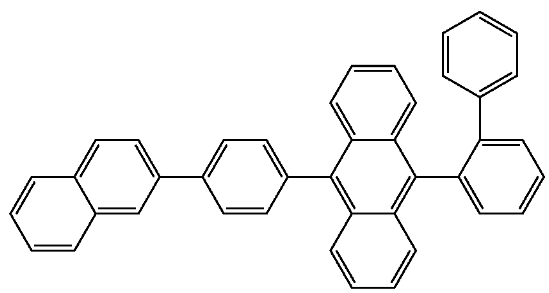
(2-85)
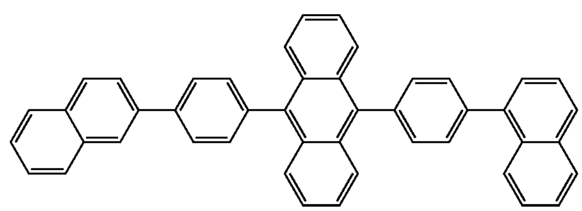
(2-86)
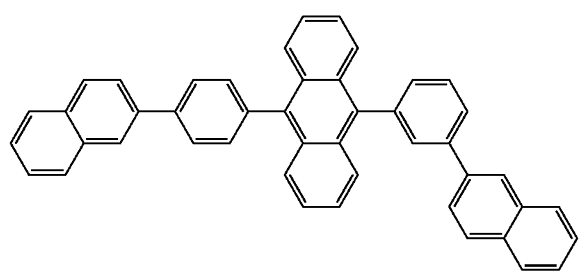
(2-87)
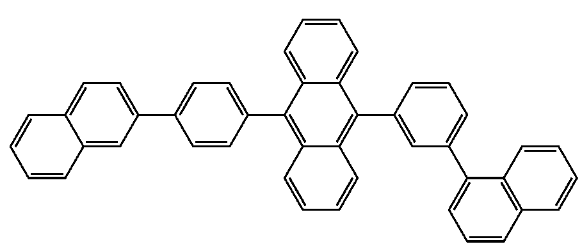

-continued
(2-88)
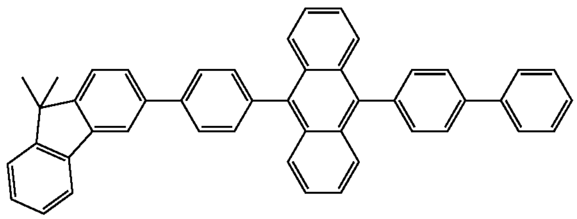
(2-89)
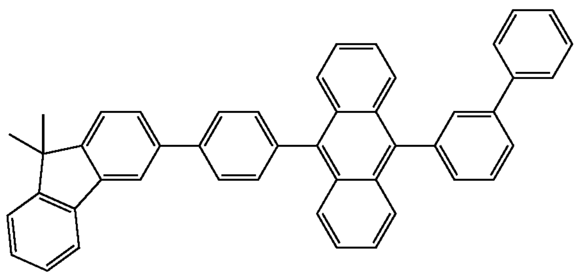
(2-90)
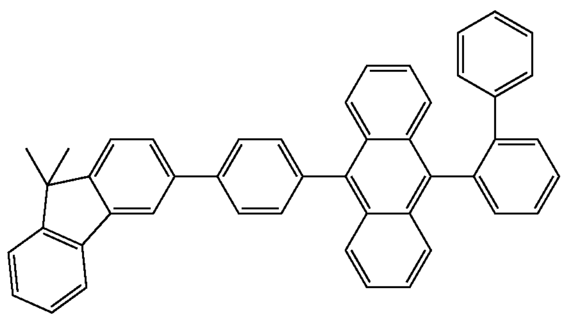
(2-91)
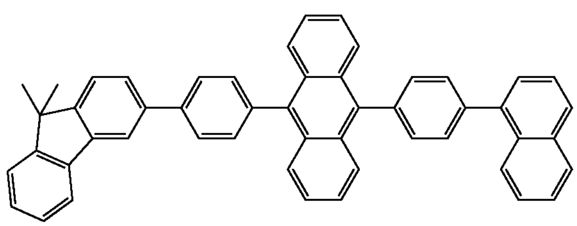
(2-92)
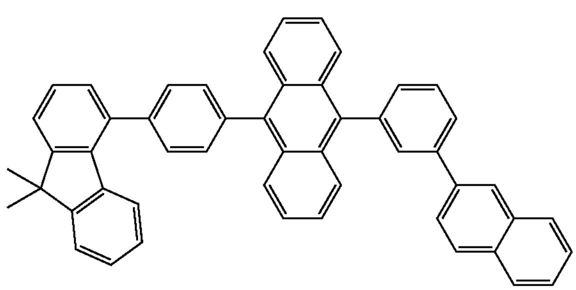
-continued
(2-93)
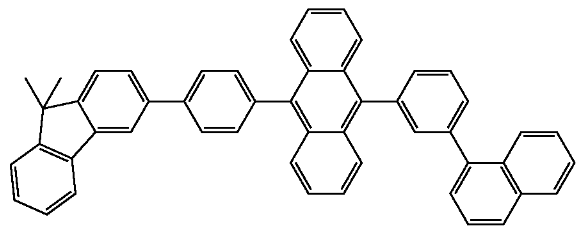
(2-94)
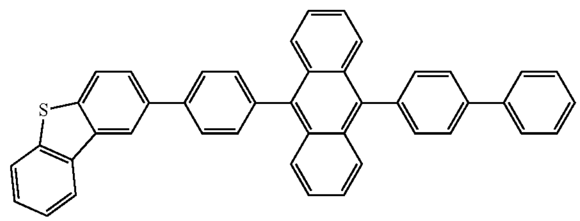
(2-95)
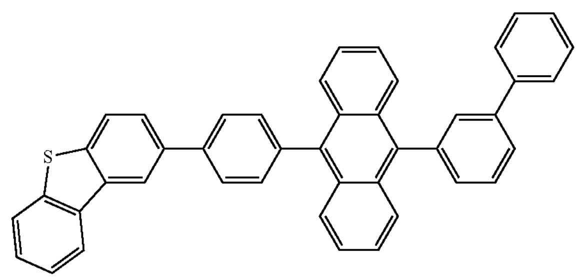
(2-96)
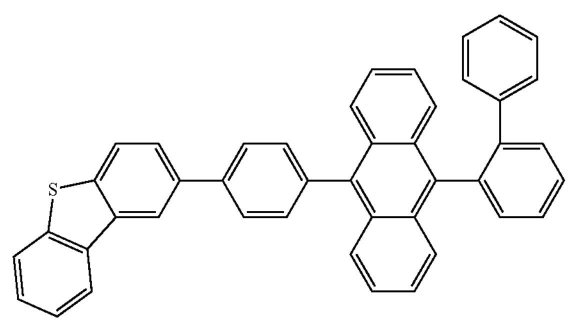
(2-97)
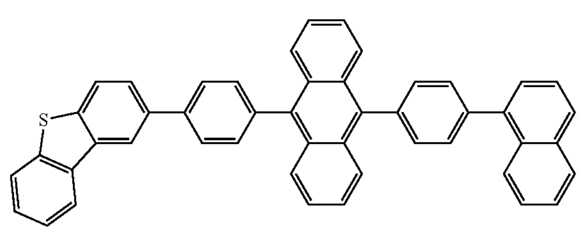

-continued
(2-98)
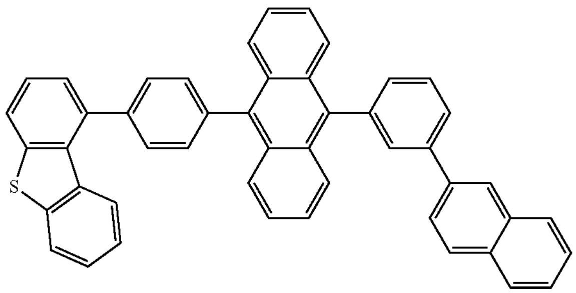
(2-99)
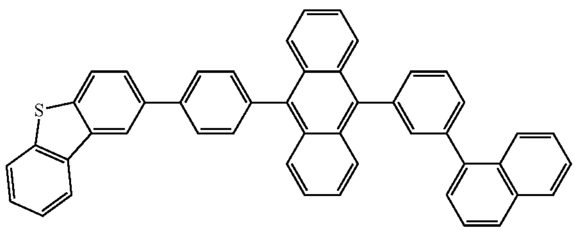
(2-100)
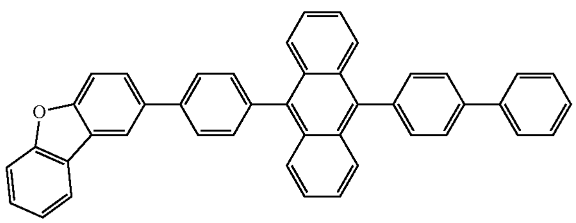
(2-101)
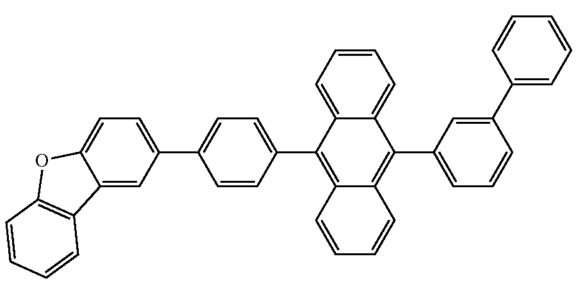
(2-102)
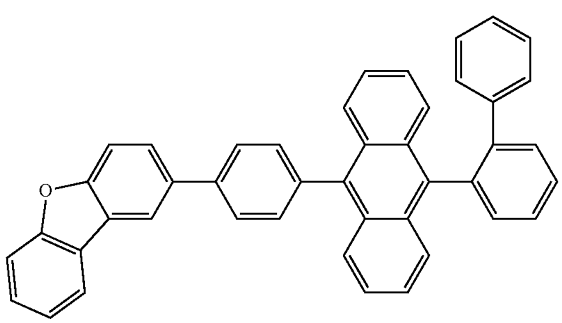
-continued
(2-103)
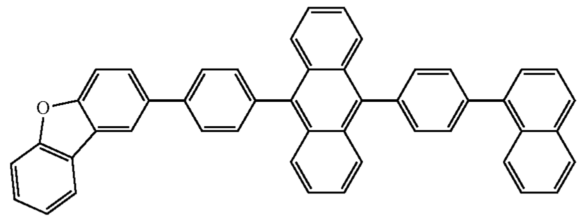
(2-104)
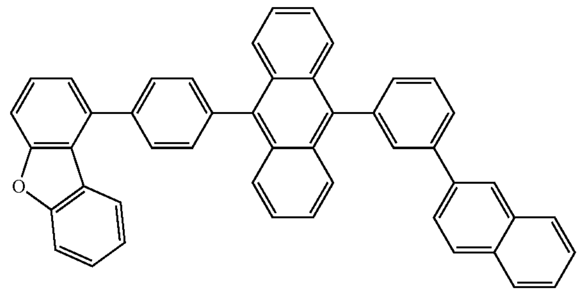
(2-105)
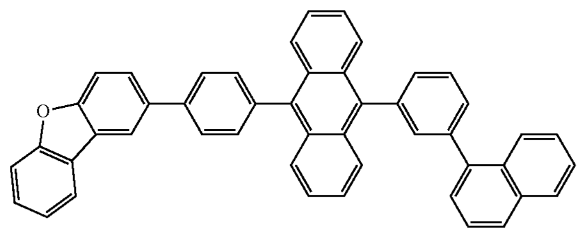
(2-106)
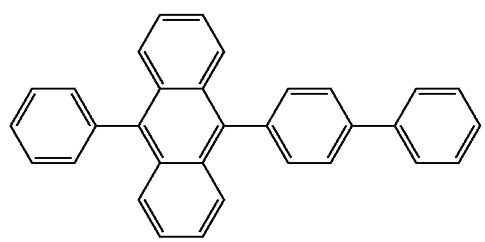
(2-107)
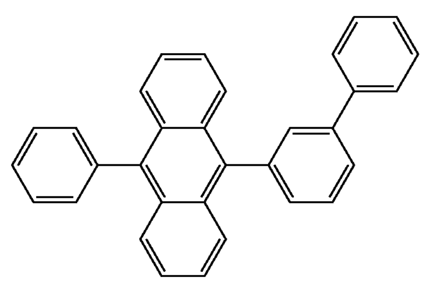
(2-108)
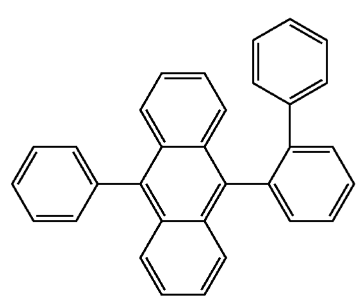

(2-109)
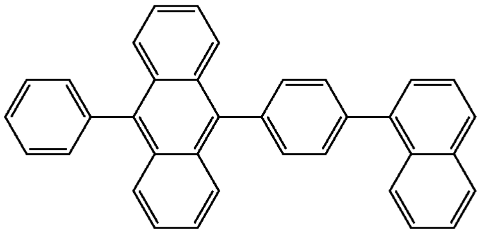
(2-110)
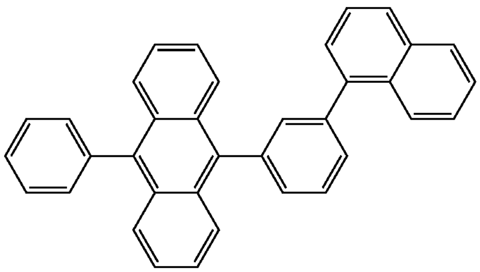
(2-111)
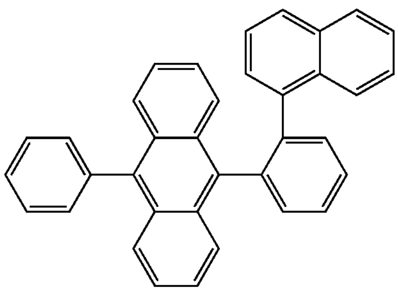
(2-112)
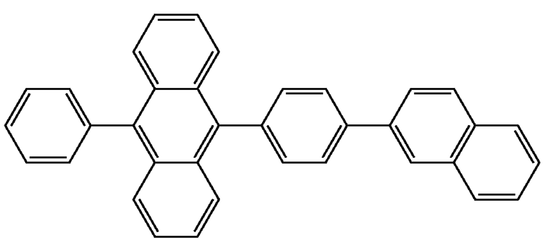
(2-113)
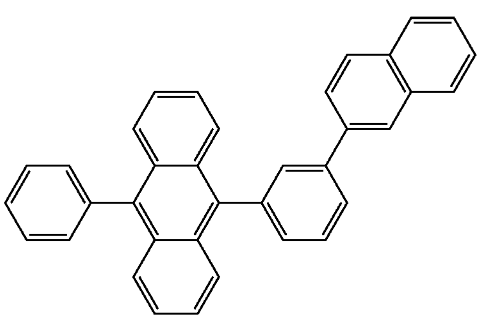
(2-114)
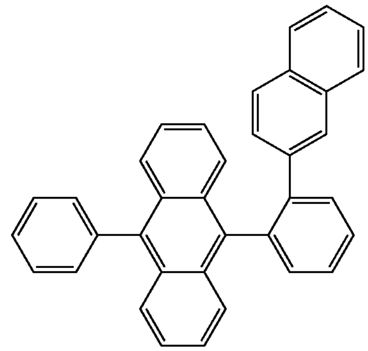
(2-115)
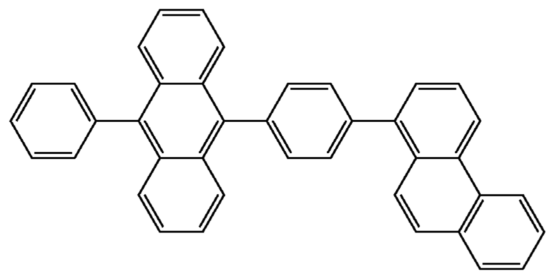
(2-116)
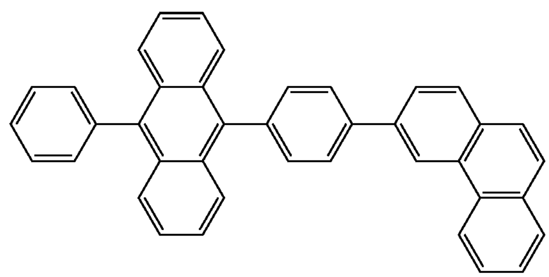
(2-117)
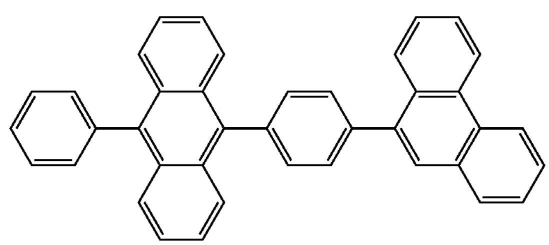
(2-118)
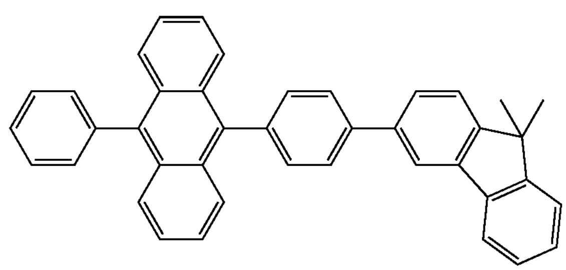

-continued
(2-119)
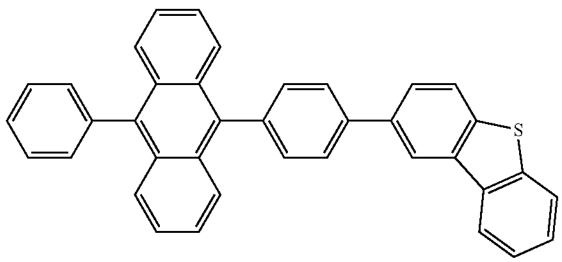
(2-120)
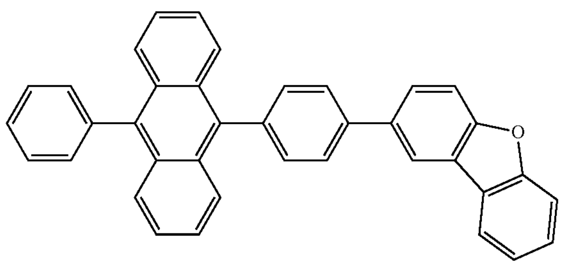
(2-121)
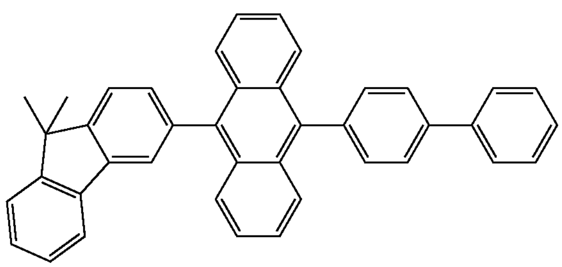
(2-122)
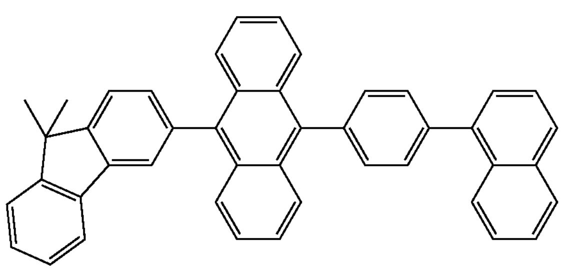
(2-123)
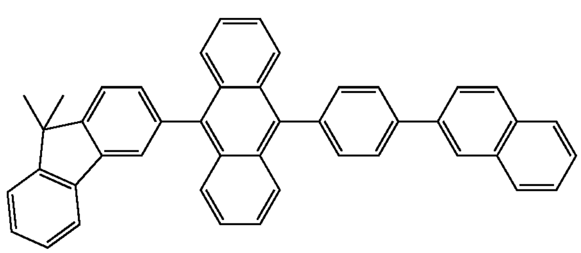
-continued
(2-124)
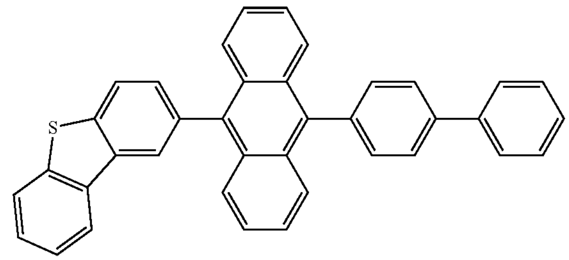
(2-125)
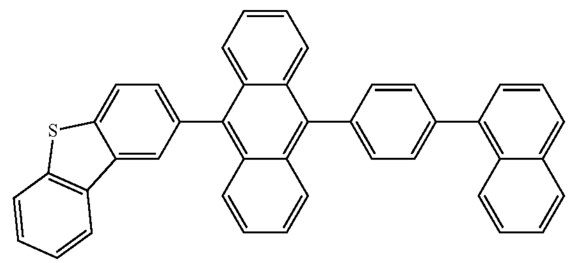
(2-126)
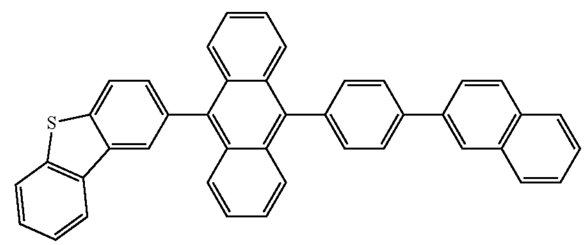
(2-127)
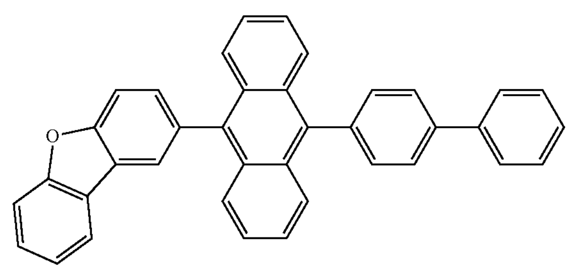
(2-128)
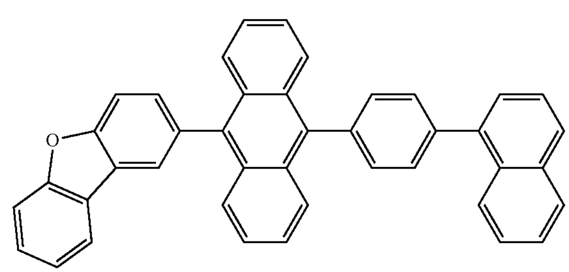

-continued
(2-129)
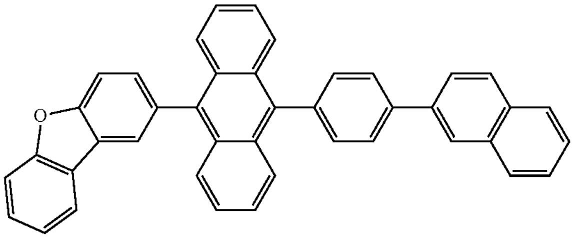
(2-130)
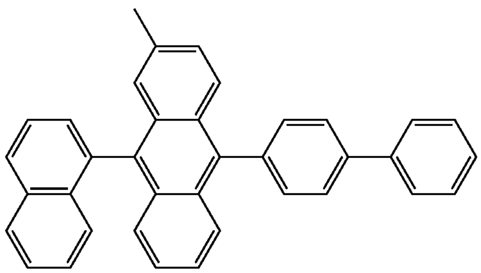
(2-131)
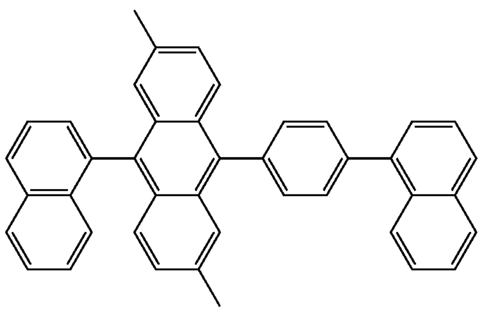
(2-132)
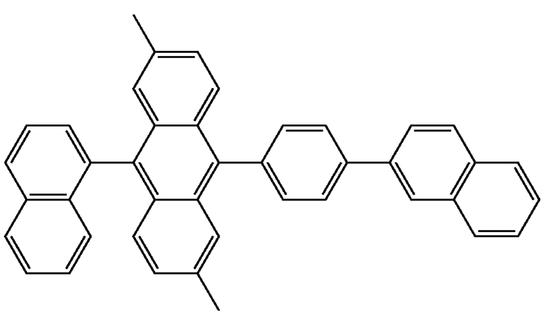
(2-133)
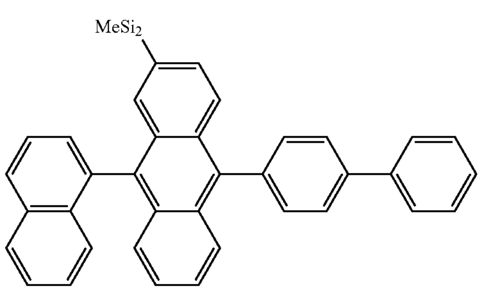
-continued
(2-134)
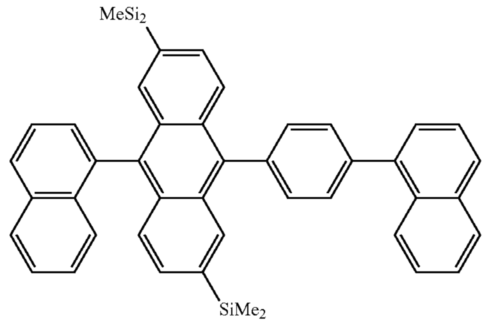
(2-135)
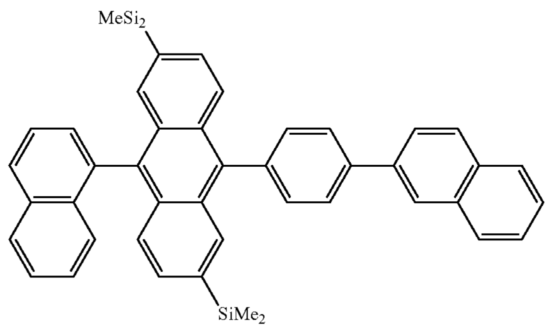
(2-136)
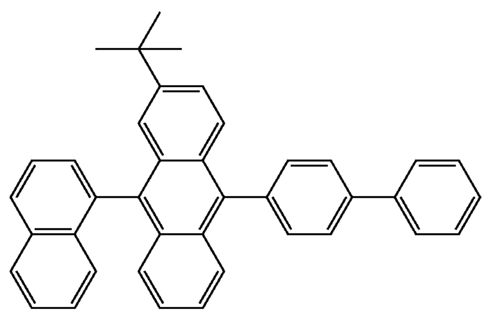
(2-137)
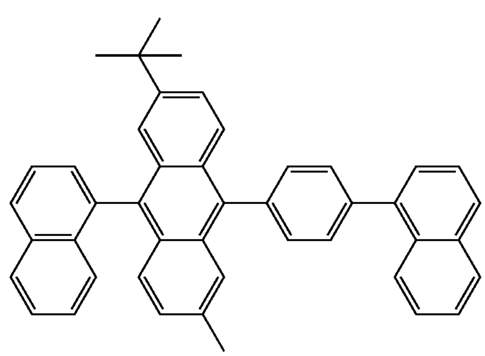

(2-138)
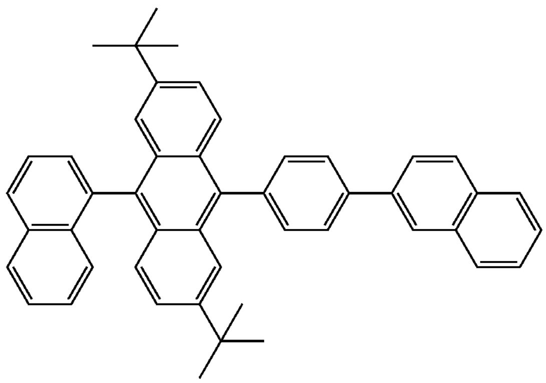
(2-139)
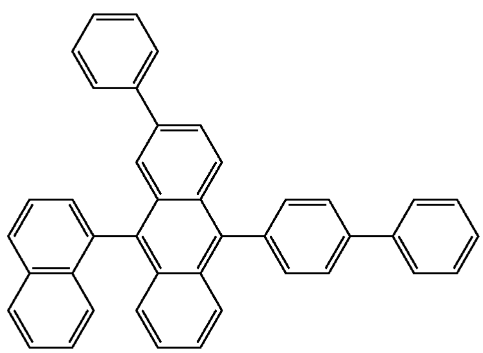
(2-140)
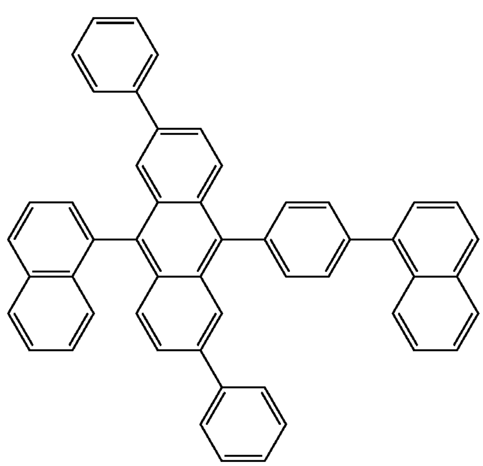
(2-141)
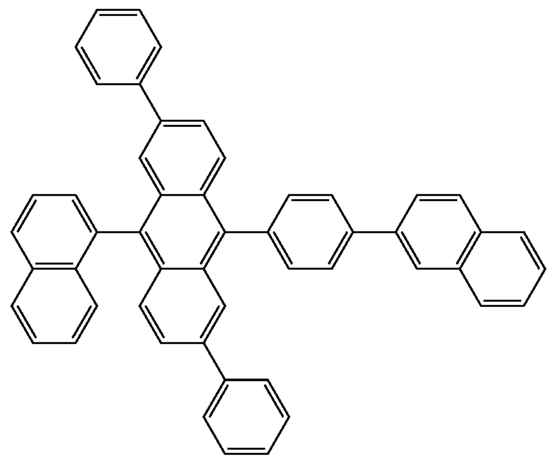
(2-142)
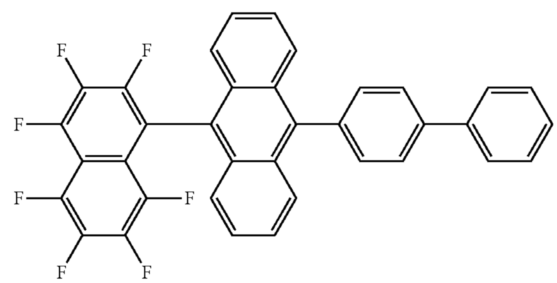
(2-143)
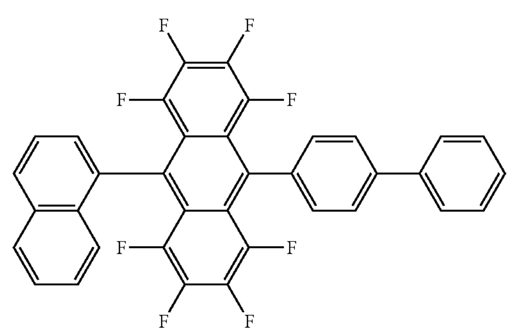
(2-144)
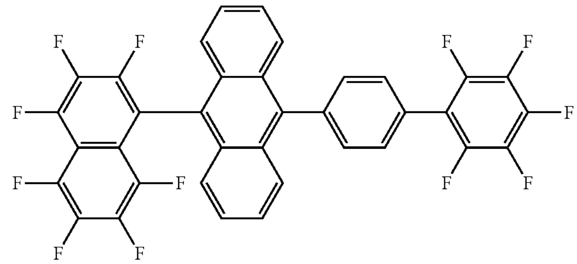

-continued (2-145)

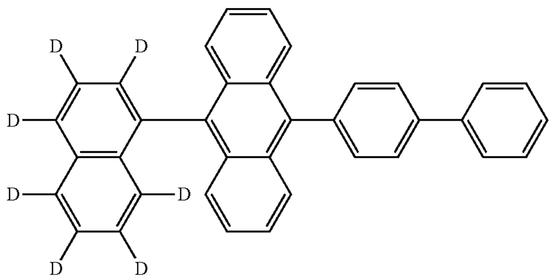

(2-146)

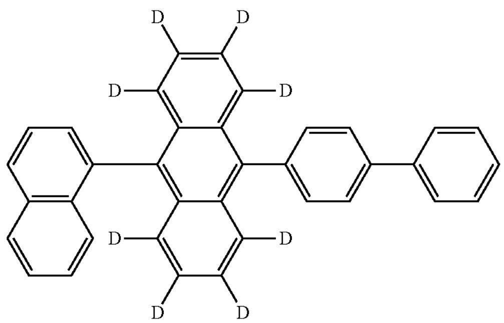

(2-147)

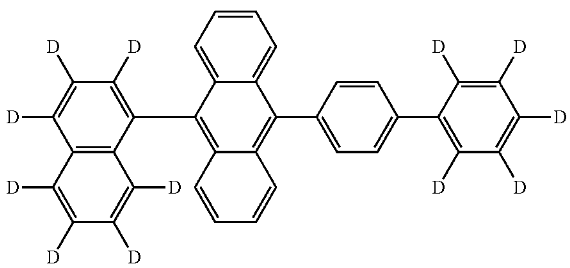

As described, in the organic light emitting element according to the exemplary embodiment, an phenyl-substituted anthracene-based compound is used as a host of the emission layer and at the same time an phosphine-based compound is used as an electron transfer layer of the organic light emitting element so that carrier balance can be improved, efficiency of the organic light emitting element can be enhanced, and life span can be increased.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
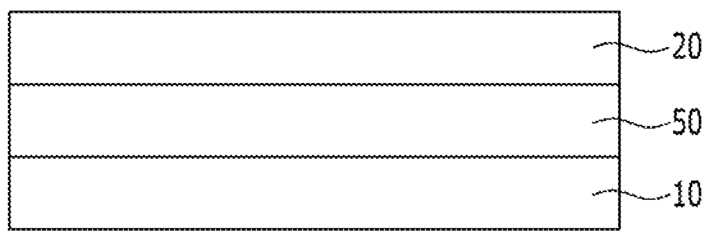
FIGS. 1-3 illustrate a structure of an organic light emitting element according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the present specification, the term "substituted", unless separately defined, means a substitution with a substituent selected from a group consisting of deuterium, C1 to C6 alkyl groups, C6 to C36 aryl groups, C2 to C30 heteroaryl groups, C1 to C30 alkoxy groups, C2 to C30 alkenyl groups, C6 to C30 aryloxy groups, C3 to C30 silyloxy groups, C1 to C30 acyl groups, C2 to C30 acyloxy groups, C2 to C30 heteroacyloxy groups, C1 to C30 sulfonyl groups, C1 to C30 alkylthiol groups, C6 to C30 arylthiol groups, C1 to C30 heterocyclothiol groups, C1 to C30 phosphoric acid amide groups C3 to C40 silyl groups, NR''R''' (here, R'' and R''' are respectively substituents selected from a group consisting of a hydrogen atom, C1 to C30 alkyl groups, and C6 to C30 aryl groups), a carboxylic acid group, a halogen group, a cyano group, a nitro group, an azo group, a fluorene group, and a hydroxyl group.

In addition, in the specification, the term "hetero", unless separately defined, means that a single functional group contains 1 to 3 heteroatoms selected from the group consisting of B, N, O, S, P, Si, and P(=O), and carbon atoms as the remainder.

Further, among groups used in chemical formulae of the present specification, definition of a representative group is as follows (the number of carbons that limits substituents is not restrictive, and does not limit characteristics of the constituents).

An unsubstituted C1 to C30 alkyl group may be a linear type or a branched type, and nonrestrictive examples of the unsubstituted C1 to C30 alkyl may be methyl, ethyl, propyl, iso-propyl, sec-butyl, hexyl, iso-amyl, hexyl, heptyl, octyl, nonyl, dodecyl, and the like.

An unsubstituted C1 to C30 alkoxy group indicates a group having a structure of —OA (wherein A is an unsubstituted C1 to C30 alkyl group as described above). Nonlimiting examples of the unsubstituted C1 to C30 include a methoxy group, an ethoxy group, a propoxy group, an isopropyloxy group, a butoxy group, and a pentoxy group.

An unsubstituted C6 to C30 aryl group indicates a carbocyclic aromatic system containing at least one ring. At least two rings may be fused to each other or linked to each other by a single bond. The term "aryl" refers to an aromatic system, such as phenyl, naphthyl, or anthracenyl. Examples of the unsubstituted C6 to C30 aryl group may be selected from a group consisting of a phenyl group, a toryl group, a biphenyl group, a naphthyl group, an anthracenyl group, a terphenyl group, a fluorenyl group, a phenanthrenyl group, a pyrenyl group, a diphenylanthracenyl group, a diphenylanthracenyl group, a dinaphthylanthracenyl group, a pentacenyl group, a bromophenyl group, a hydroxyphenyl group, a stilbene group, an azobenzenyl group, and a ferrocenyl group.

An unsubstituted C2 to C30 heteroaryl group includes one, two, or three heteroatoms selected from a group consisting of B, N, O, S, P, Si, and P(=O). At least two rings may be fused to each other or linked each other by a single bond. Examples of the unsubstituted C2 to C30 heteroaryl group include a pyrazolyl group, an imidazolyl group, an oxazolyl group, a thiazolyl group, a triazolyl group, a tetrazolyl group, an oxadiazolyl group, a thidiazol group, a pyridinyl group, a triazinyl group, a carbazole group, an N-phenylcarbazole group, an indole group, a quinolyl group, an isoquinolyl group, a thiophene group, a dibenzothiophene group, and a dibenzimidazole group.

Figure 2:
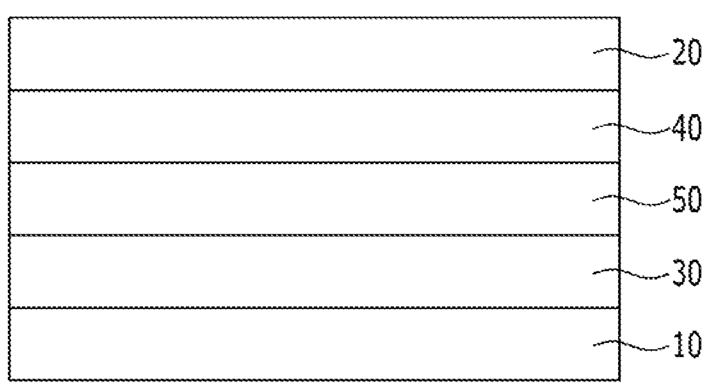

Hereinafter, an organic light emitting element according to an exemplary embodiment will be described in further detail. FIG. 1 and FIG. 2 illustrate cross-sectional views of an organic light emitting element according to an exemplary embodiment.

Referring to FIG. 1, an organic light emitting element according to an exemplary embodiment may include an anode 10, a cathode 20 facing the anode 10, and an emission layer 50 between the anode 10 and the cathode 20.

A substrate (not shown) may be provided on a side of the anode 10 or on a side of the cathode 20. The substrate may be made of an inorganic material such as glass, an organic material such as a polycarbonate, polymethylmethacrylate, polyethylene terephthalate, polyethylene naphthalate, a polyamide, polyether sulfone, or a combination thereof, or of a silicon wafer.

The anode 10 may be a transparent electrode or an opaque electrode. The transparent electrode may be, e.g., formed of a conductive oxide such as indium tin oxide (ITO), indium zinc oxide (IZO), tin oxide ($SnO_2$), zinc oxide (ZnO), or a combination thereof, or a metal such as aluminum, silver, and magnesium, with a thin thickness, and the opaque electrode may be, e.g., formed of a metal such as aluminum, silver, and magnesium.

For example, the anode 10 of the organic light emitting device according to the exemplary embodiment may have a structure in which a reflective layer and an electrical reflective layer are layered. In an implementation, the reflective layer may be made of silver (Ag), aluminum (Al), chromium (Cr), molybdenum (Mo), tungsten (W), titanium (Ti), gold (Au), palladium (Pd), or an alloy thereof, and the electrical reflective layer may be made of a transparent electrode material such as ITO, IZO, or ZnO.

The anode 10 may be formed using a sputtering method, a vapor phase deposition method, an ion beam deposition method, an electron beam deposition method, or a laser ablation method.

The cathode 20 may include a material having a low work function for easy electron injection. In an implementation, the material may be a metal such as magnesium, calcium, sodium, potassium, titanium, indium, yttrium, lithium, gadolinium, aluminum, silver, tin, lead, cesium, barium, or the like, or an alloy thereof, or a multi-layered structure material such as LiF/Al, $LiO_2$/Al, LiF/Ca, LiF/Al, and $BaF_2$/Ca, but this is not restrictive. In an implementation, a metal electrode such as aluminum may be used as the cathode 20.

For example, a conductive material used in the cathode 20 according to the exemplary embodiment may include magnesium, calcium, tin, lead, titanium, yttrium, lithium, ruthenium, manganese, aluminum, lithium fluoride, and the like, and an alloy thereof, but this is not restrictive. The alloy may include magnesium/silver, magnesium/indium, lithium/aluminum, and the like. An alloy ratio of the alloys may be controlled based on a temperature of deposition sources, an atmosphere, and a degree of vacuum, and an appropriate ratio may be selected.

The anode 10 and the cathode 20 may be formed of two or more layers, as desired.

The emission layer 50 may include a blue, red, or green emission material, and the emission layer 50 may include a host and a dopant.

In an implementation, the emission layer 50 according to an embodiment may include a second compound represented by the following Chemical Formula 2 as a host.

[Chemical Formula 2]

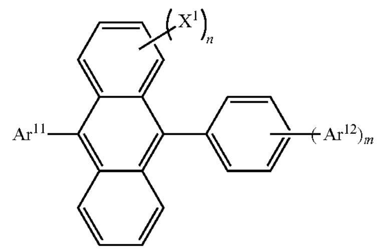

In Chemical Formula 2, $Ar^{11}$ may be a substituted or unsubstituted C6 to C30 aryl group or a substituted or unsubstituted C6 to C30 heteroaryl group, m may be an integer of 0 to 3, $Ar^{12}$ may be a substituted or unsubstituted C5 to C30 aryl group or a substituted or unsubstituted C5 to C30 heteroaryl group, when m is 2 or more, each $Ar^{12}$ may be the same as or different from one another, $X^1$ may be hydrogen (H), deuterium, fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C60 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group, n may be an integer of 0 to 8, and when n is 2 or more, each $X^1$ may be the same as or different from one another.

In an implementation, the second compound (e.g., represented by Chemical Formula 2) may be represented by one of the following Chemical Formula 2-1 to Chemical Formula 2-147.

(2-1)

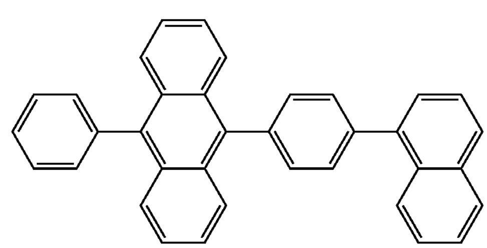

-continued
(2-2)
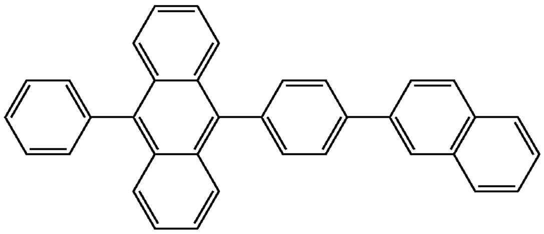
(2-3)
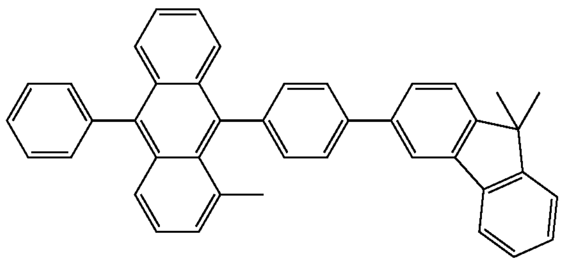
(2-4)
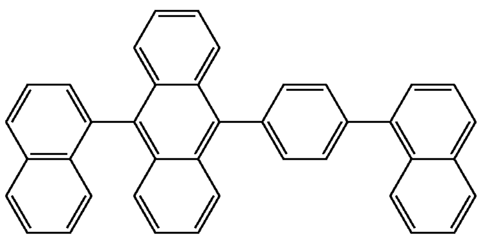
(2-5)
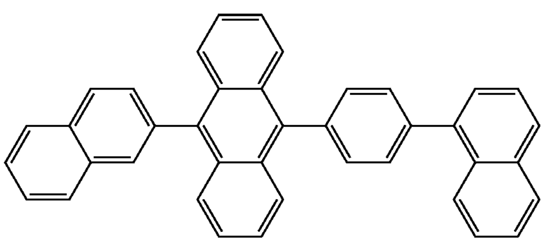
(2-6)
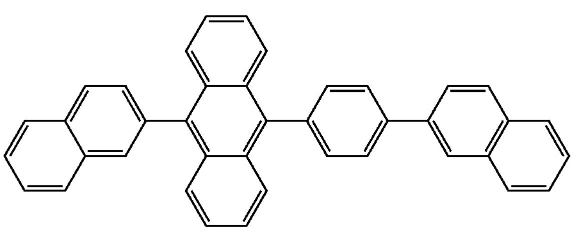
(2-7)
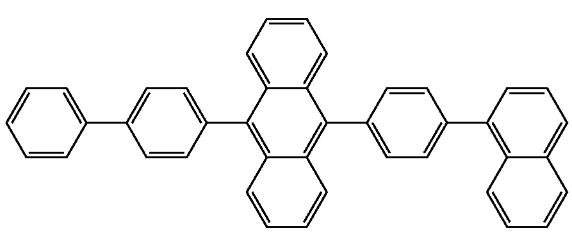
-continued
(2-8)
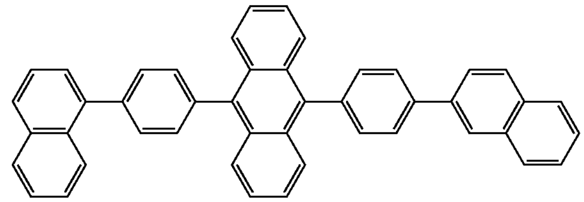
(2-9)
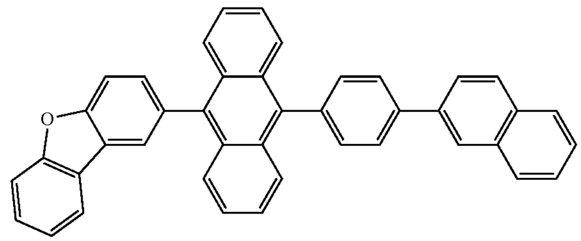
(2-10)
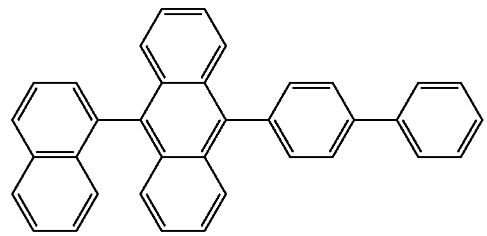
(2-11)
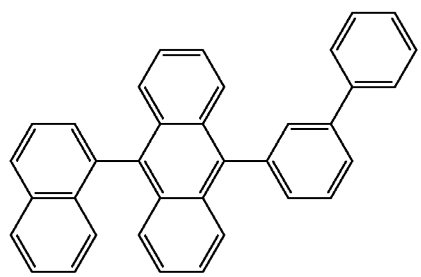
(2-12)
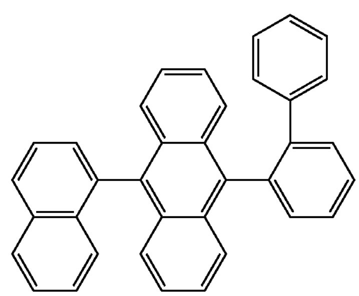
(2-13)
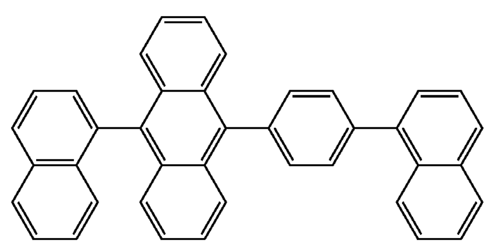

-continued
(2-14)
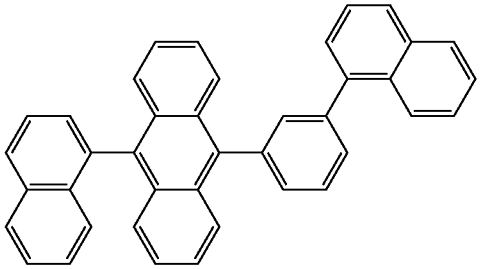
(2-15)
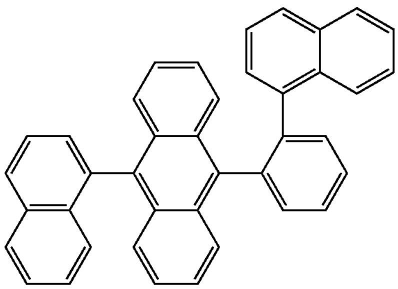
(2-16)
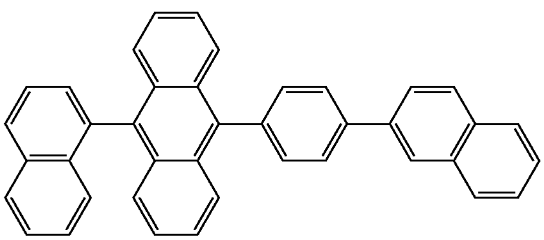
(2-17)
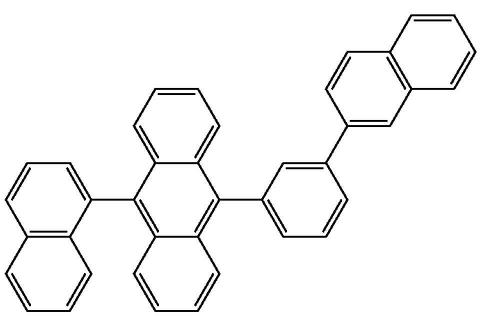
(2-18)
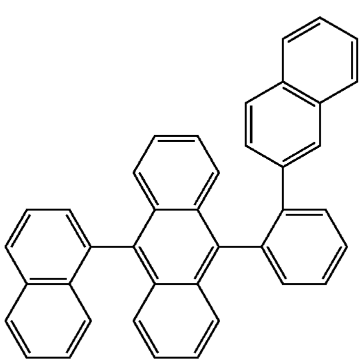
-continued
(2-19)
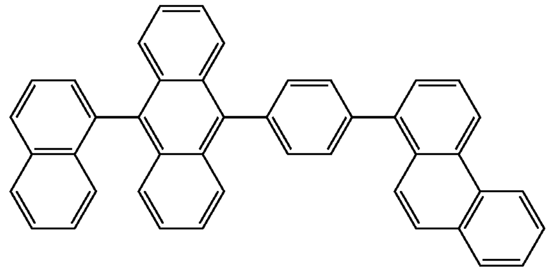
(2-20)
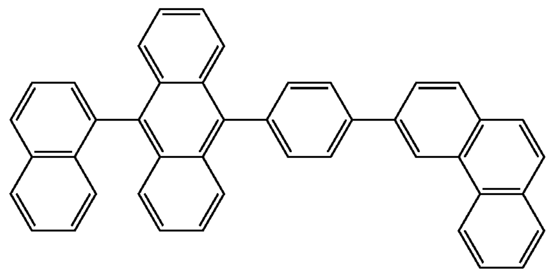
(2-21)
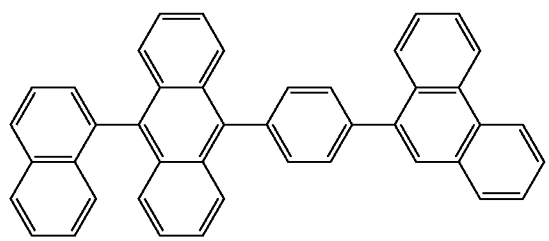
(2-22)
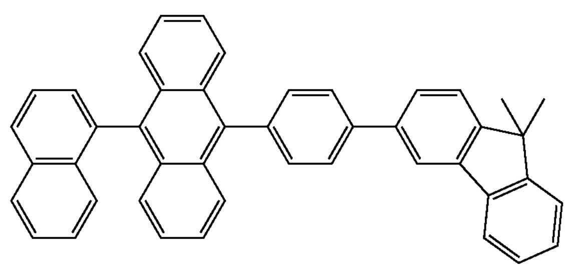
(2-23)
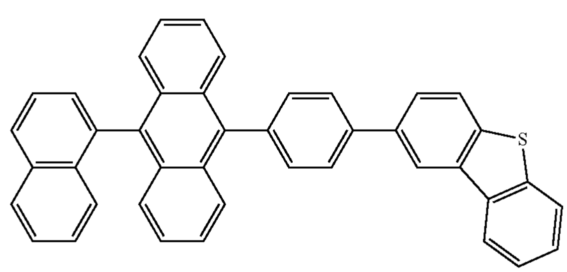

-continued
(2-24)
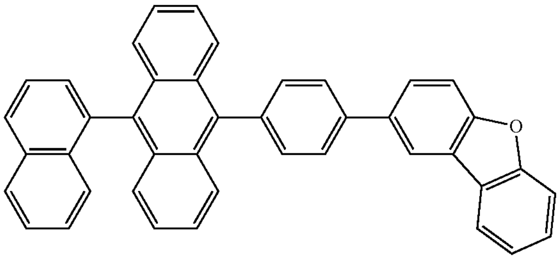
(2-25)
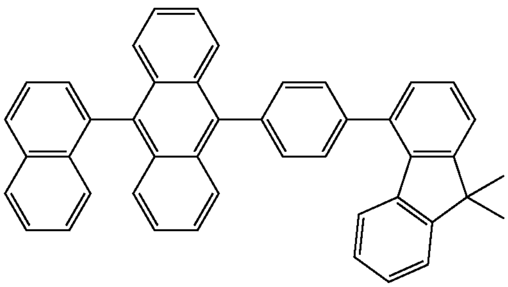
(2-26)
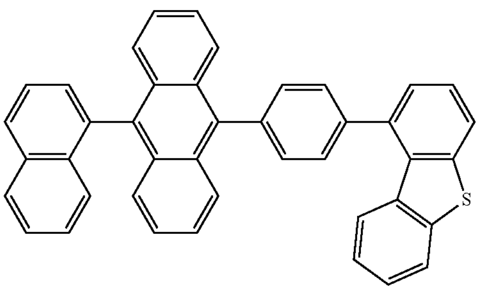
(2-27)
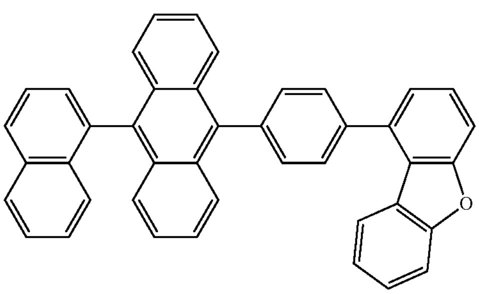
(2-28)
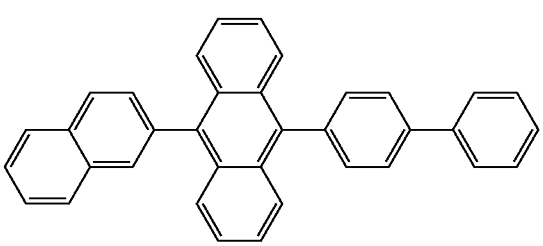
-continued
(2-29)
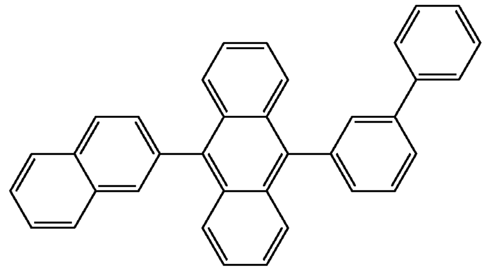
(2-30)
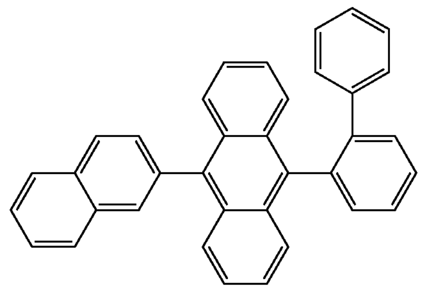
(2-31)
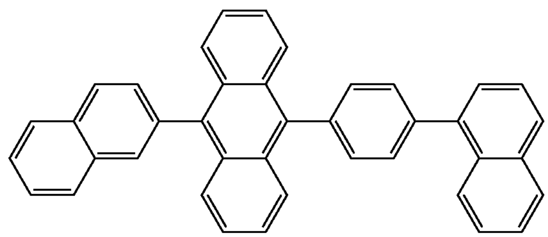
(2-32)
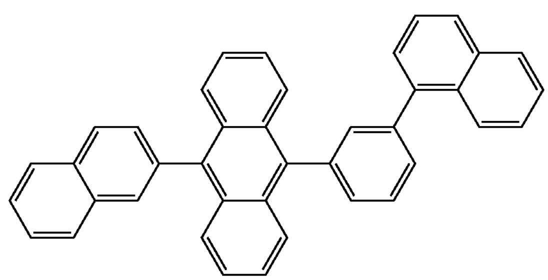
(2-33)
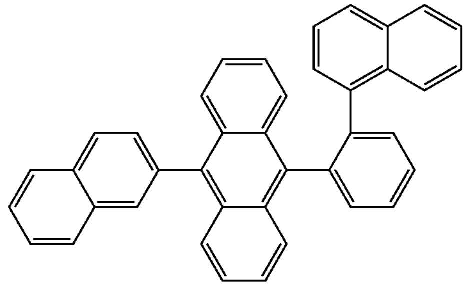

-continued
(2-34)
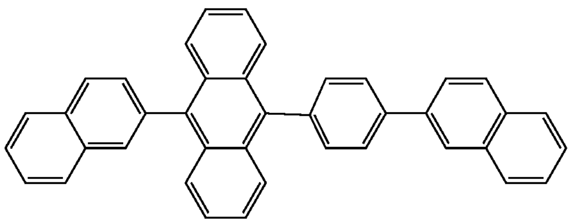
(2-35)
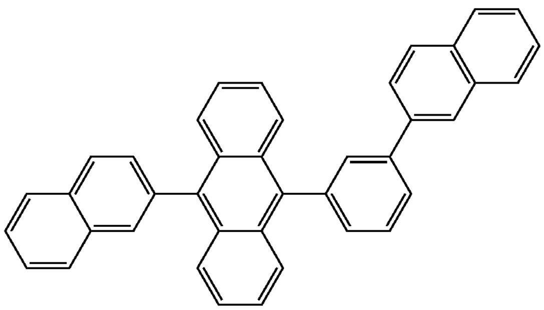
(2-36)
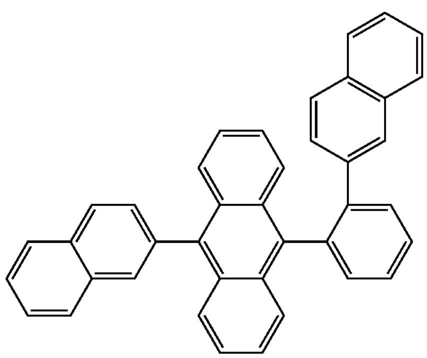
(2-37)
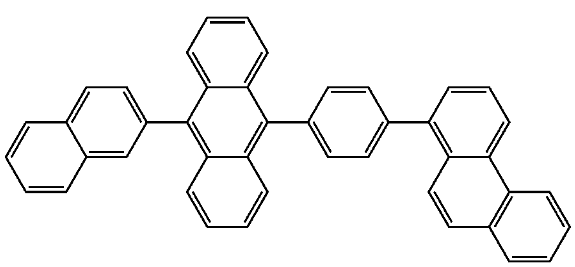
(2-38)
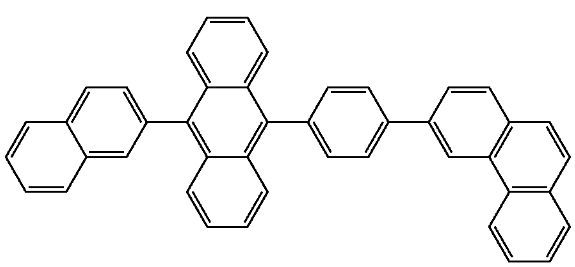
-continued
(2-39)
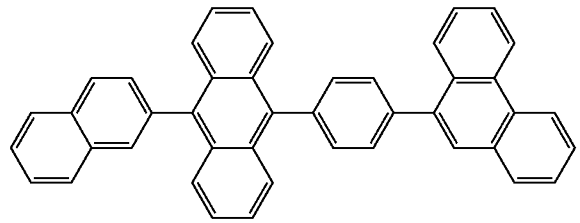
(2-40)
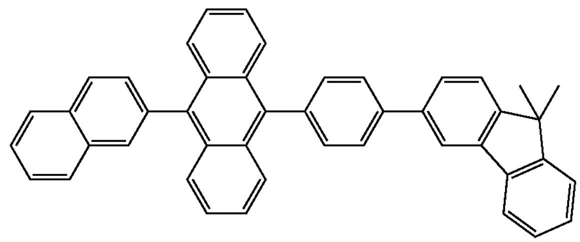
(2-41)
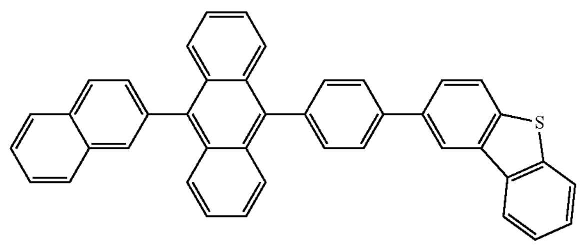
(2-42)
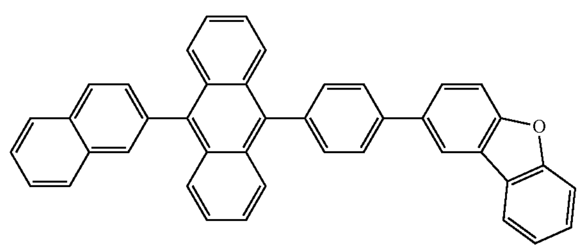
(2-43)
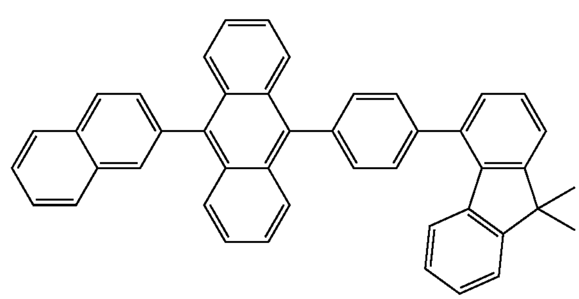

-continued
(2-44)
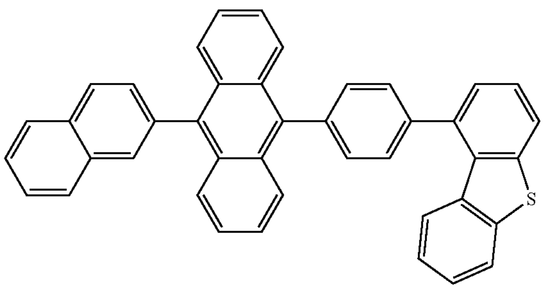
(2-45)
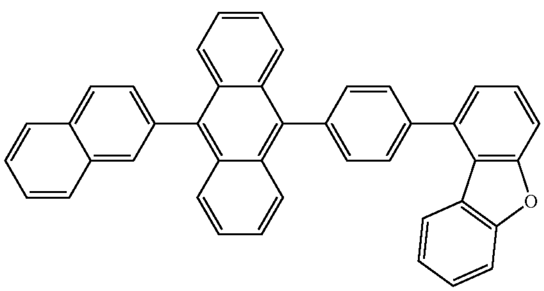
(2-46)
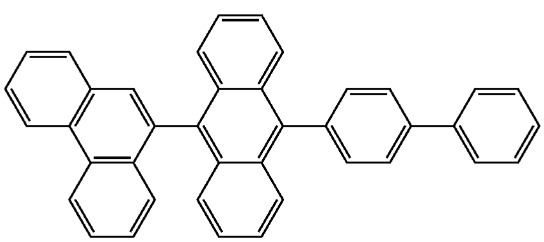
(2-47)
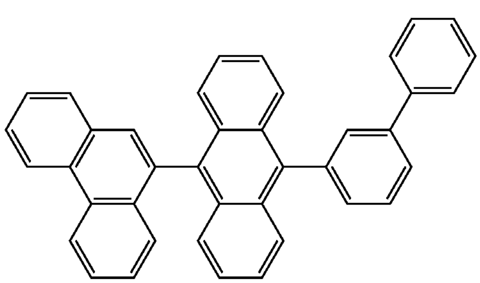
(2-48)
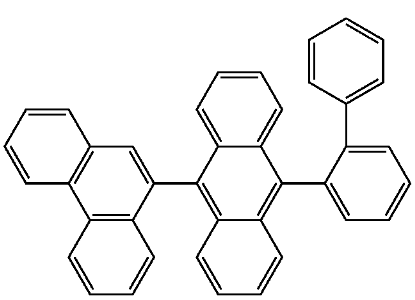
-continued
(2-49)
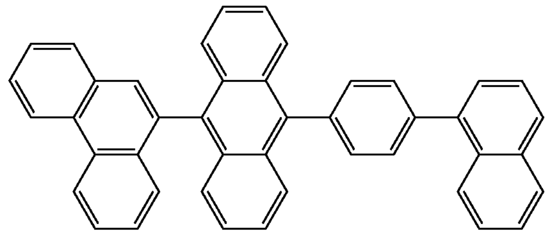
(2-50)
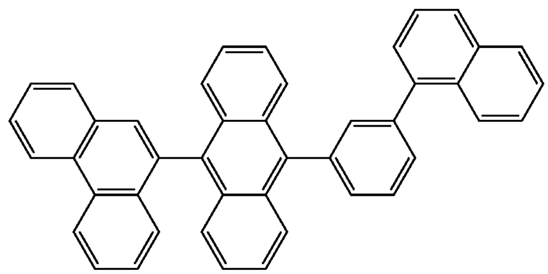
(2-51)
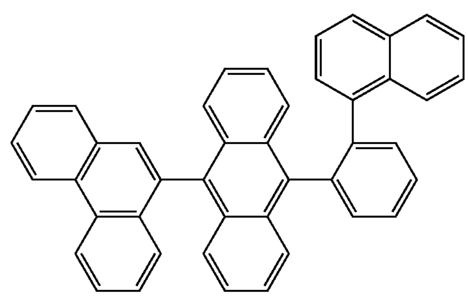
(2-52)
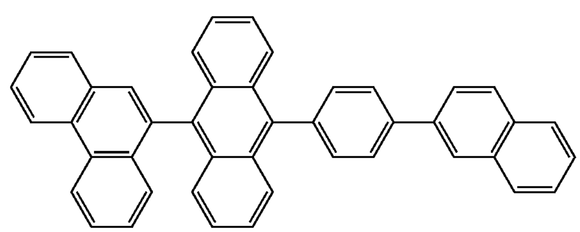
(2-53)
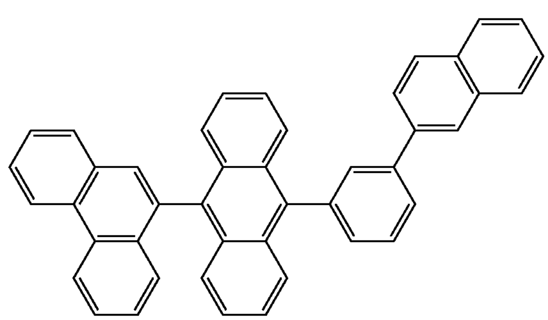

-continued
(2-54)
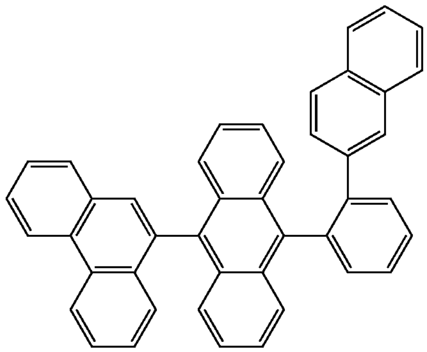
(2-55)
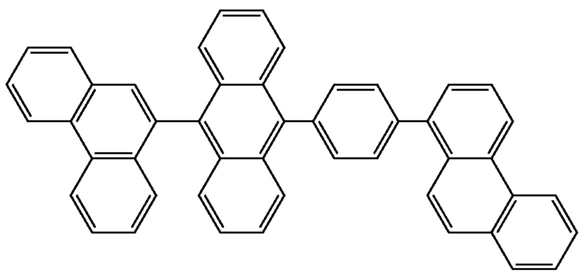
(2-56)
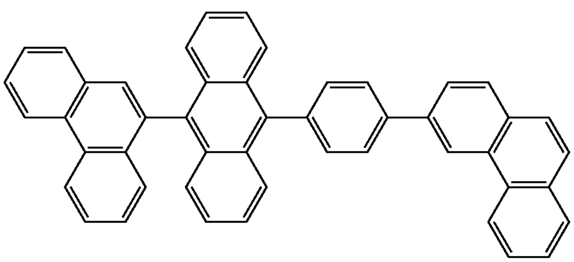
(2-57)
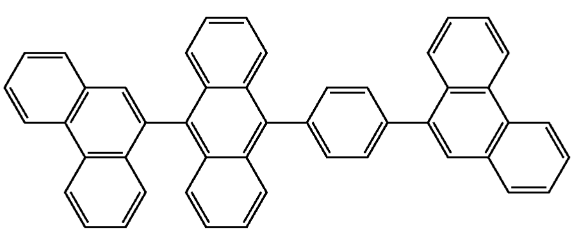
(2-58)
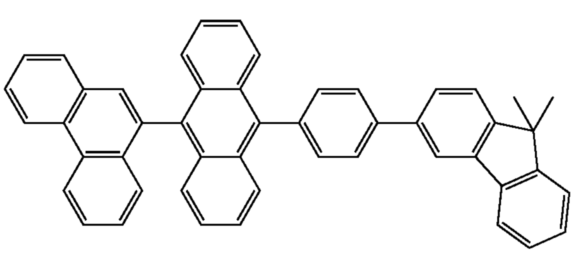
-continued
(2-59)
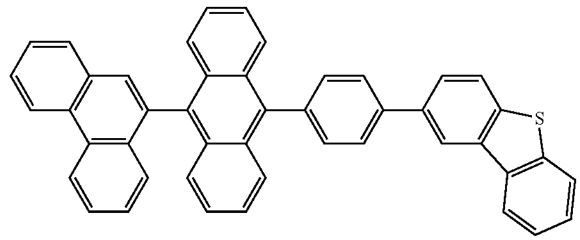
(2-60)
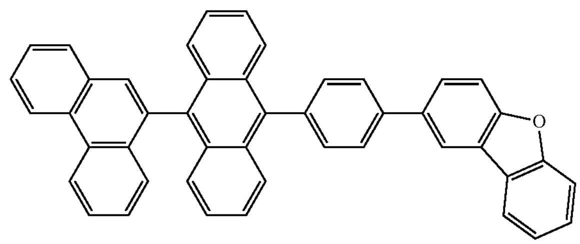
(2-61)
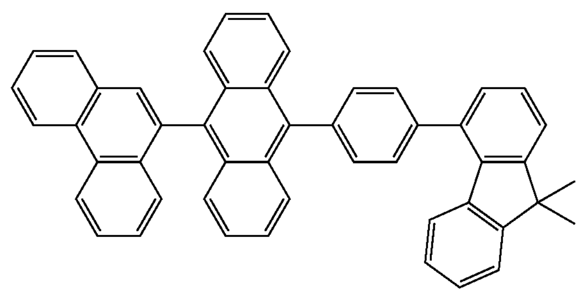
(2-62)
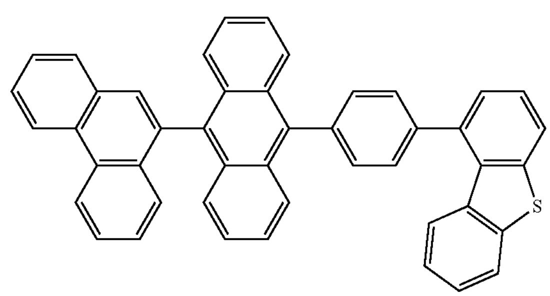
(2-63)
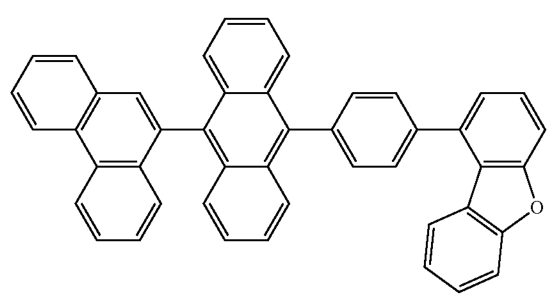

-continued
(2-64)
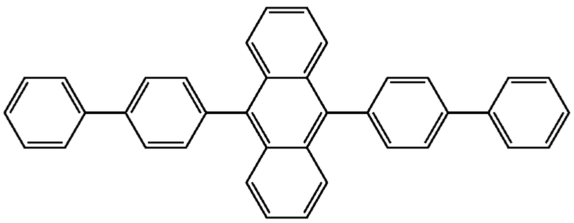
(2-65)
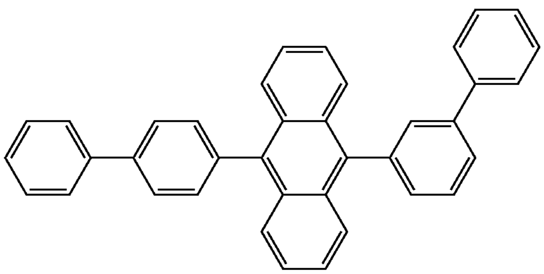
(2-66)
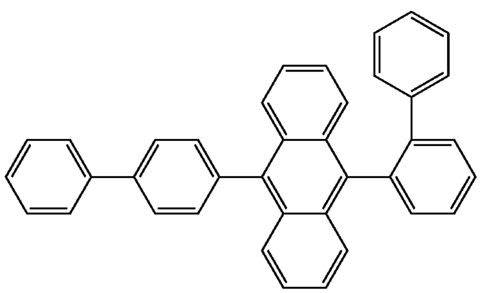
(2-67)
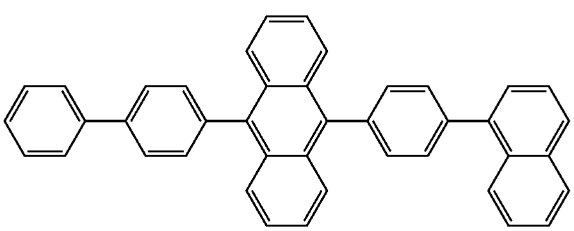
(2-68)
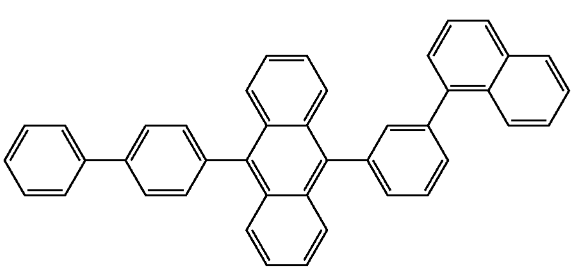
-continued
(2-69)
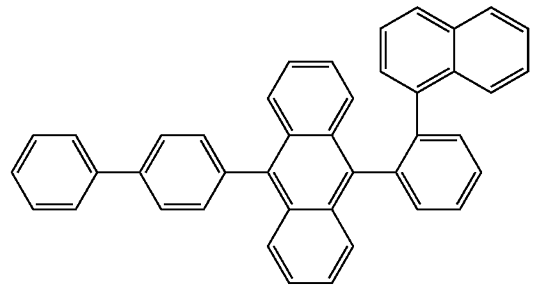
(2-70)
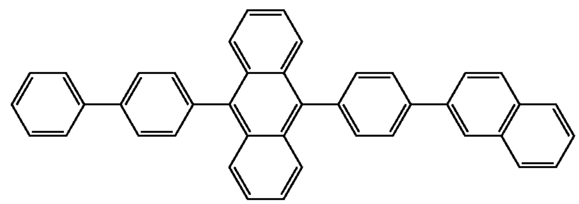
(2-71)
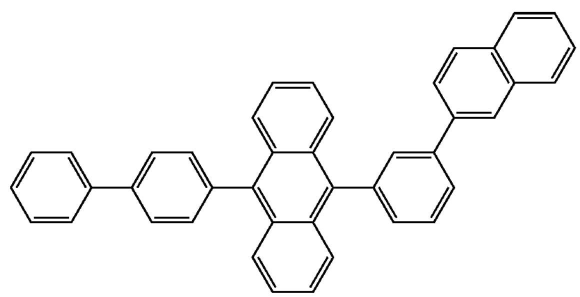
(2-72)
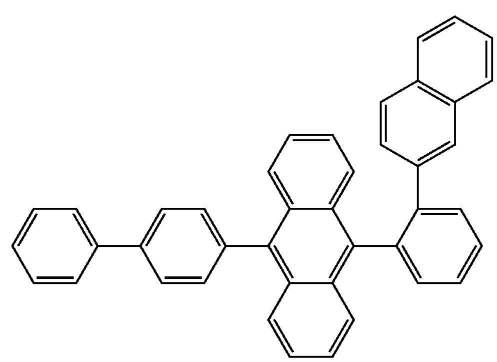
(2-73)
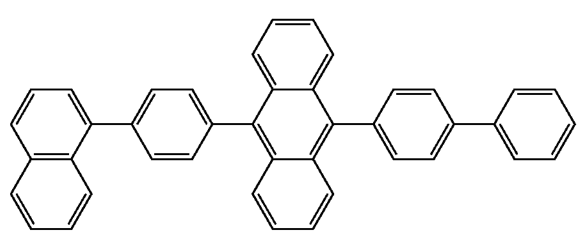

-continued
(2-74)
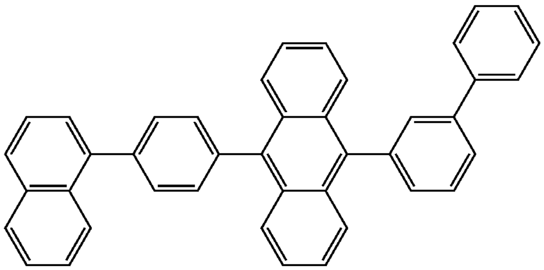
(2-75)
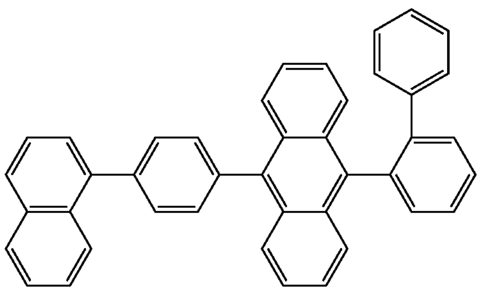
(2-76)
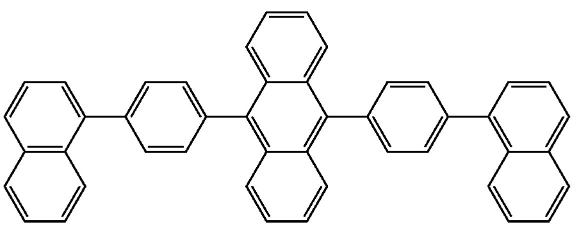
(2-77)
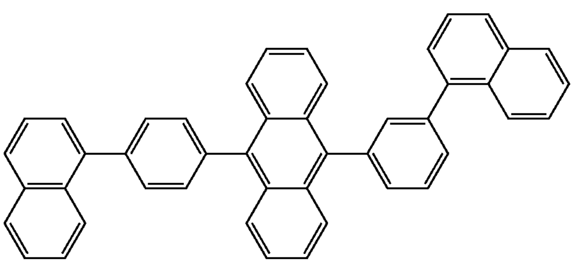
(2-78)
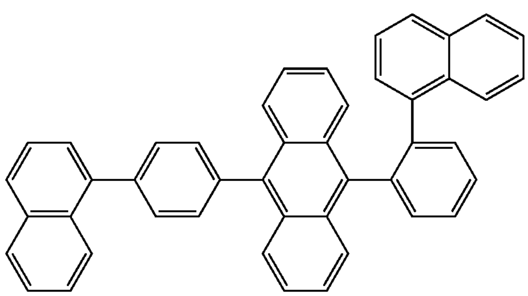
-continued
(2-79)
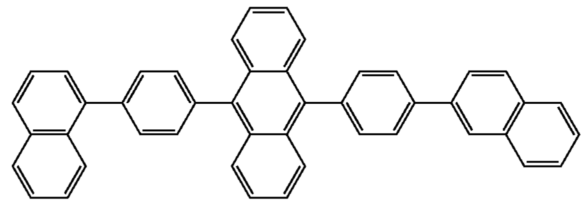
(2-80)
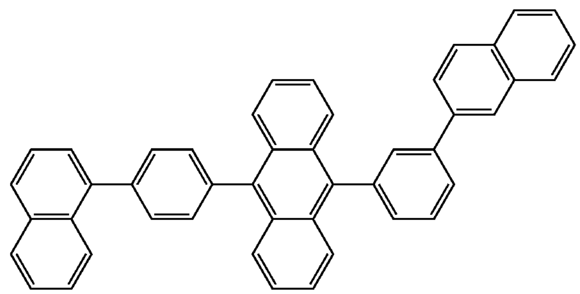
(2-81)
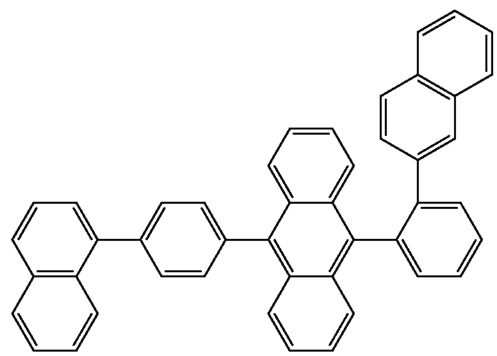
(2-82)
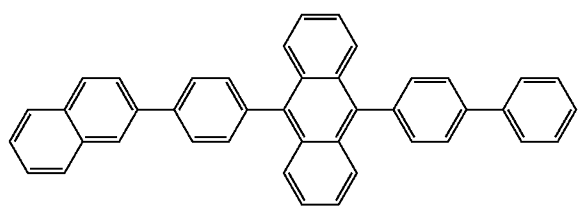
(2-83)
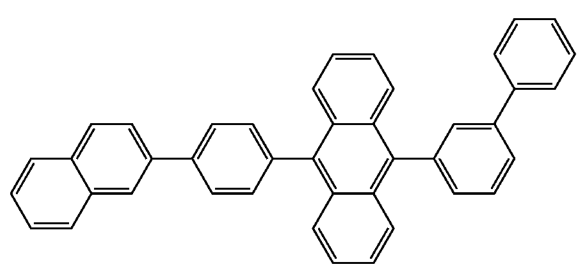

-continued
(2-84)
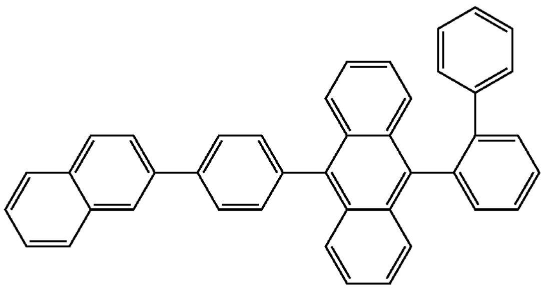
(2-85)
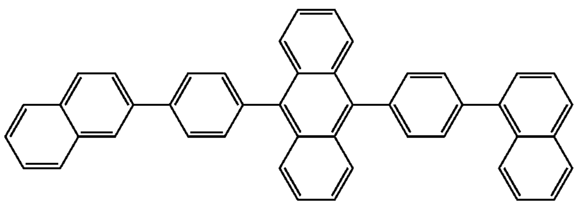
(2-86)
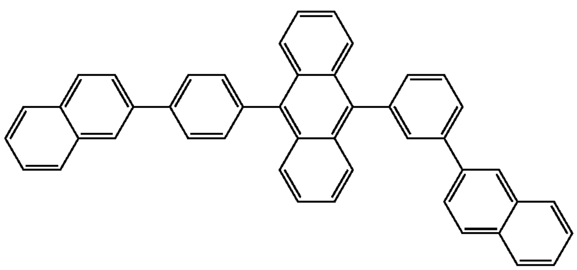
(2-87)
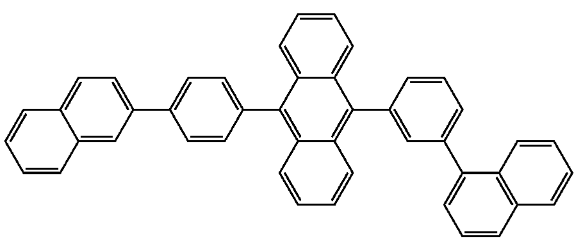
(2-88)
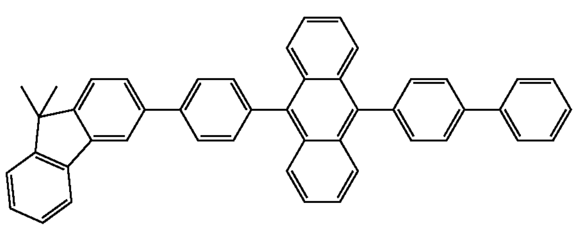
(2-89)
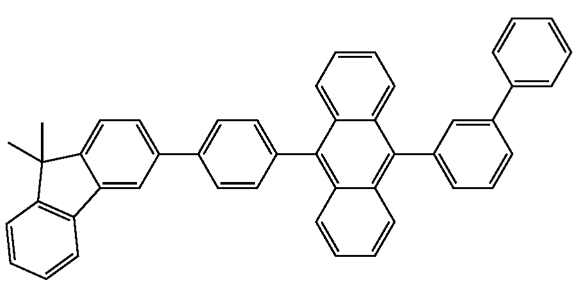
-continued
(2-90)
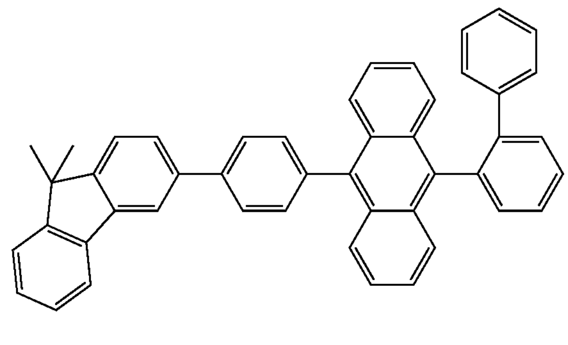
(2-91)
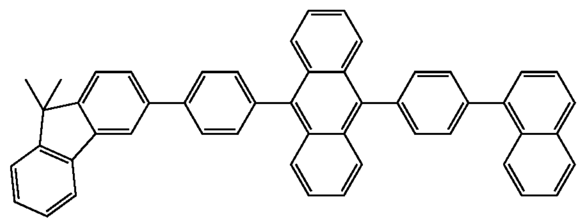
(2-92)
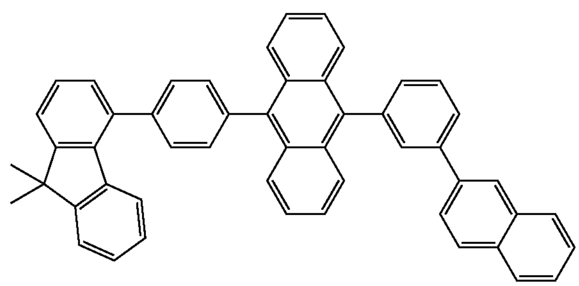
(2-93)
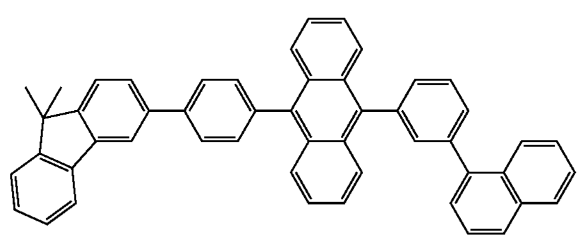
(2-94)
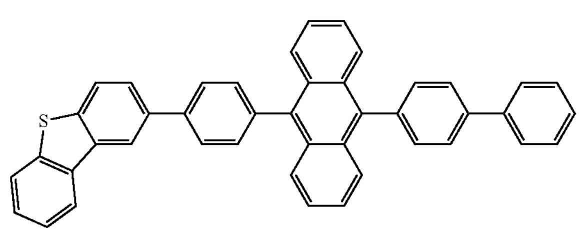

-continued
(2-95)
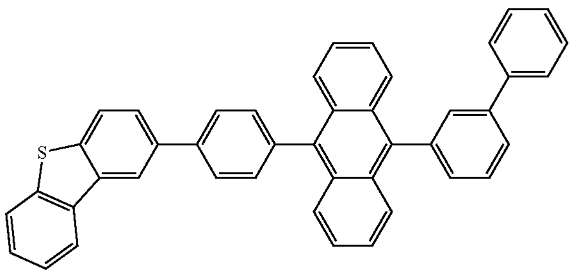
(2-96)
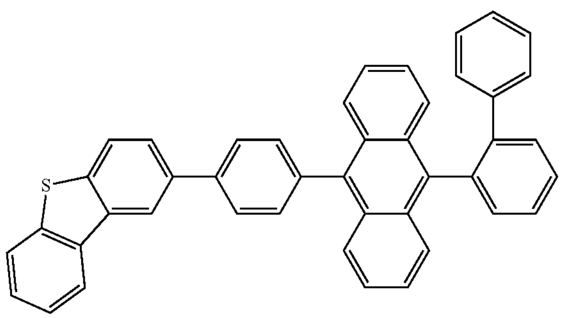
(2-97)
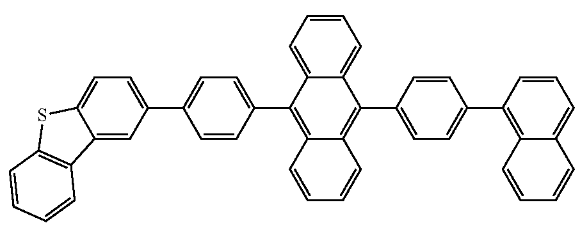
(2-98)
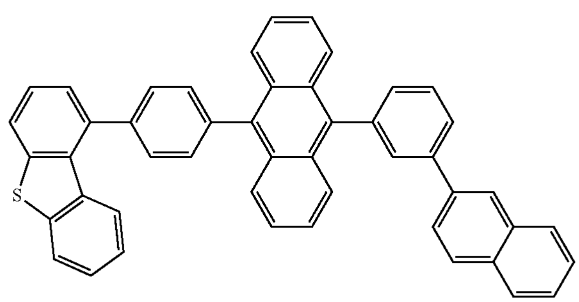
(2-99)
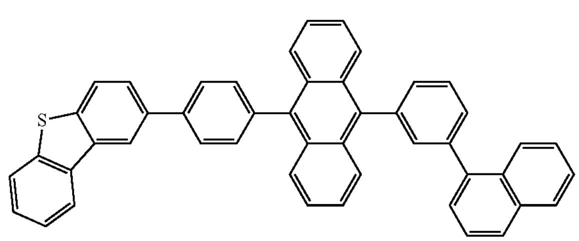
-continued
(2-100)
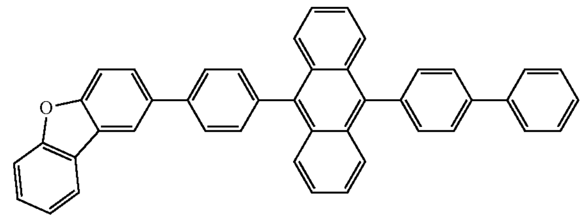
(2-101)
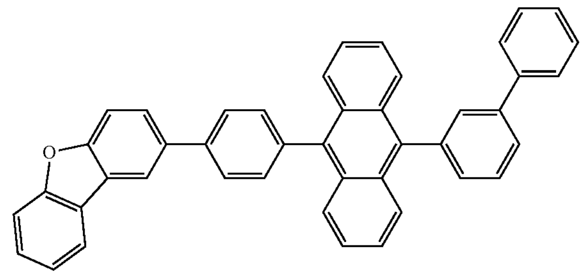
(2-102)
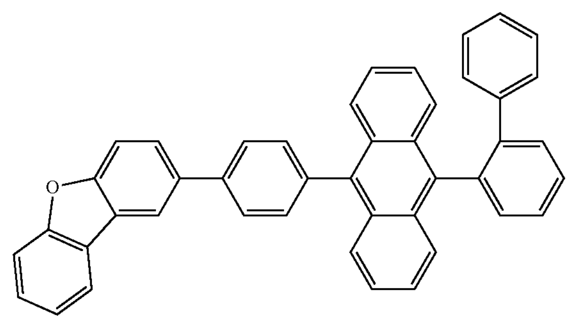
(2-103)
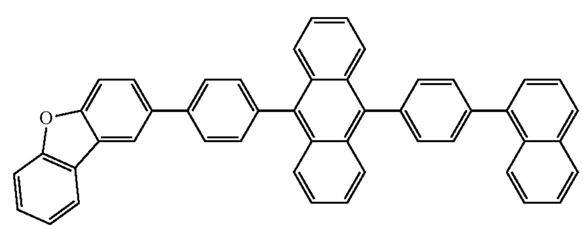
(2-104)
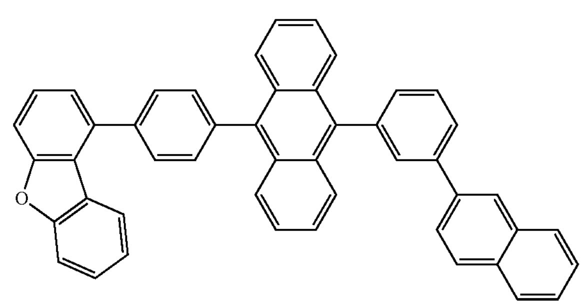

-continued
(2-105)
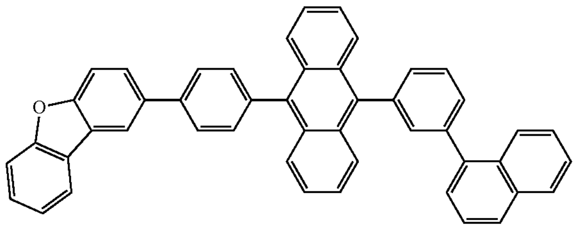
(2-106)
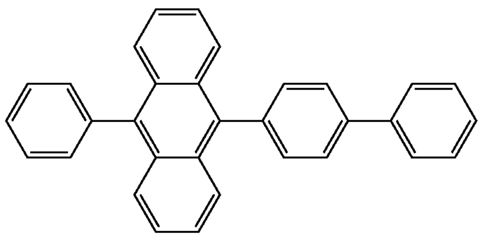
(2-107)
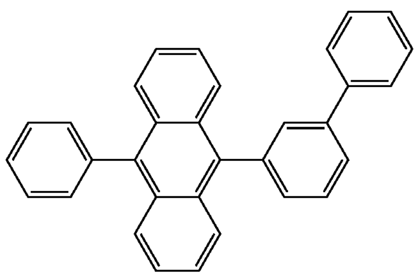
(2-108)
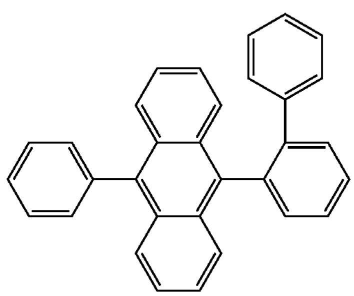
(2-109)
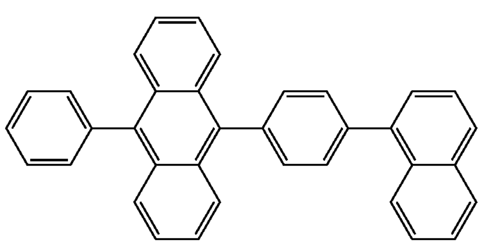
(2-110)
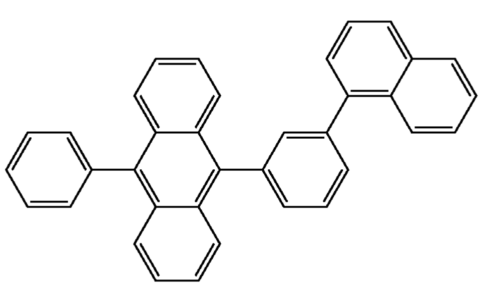
-continued
(2-111)
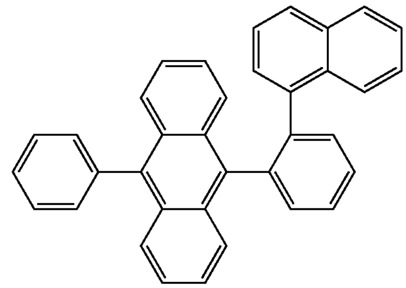
(2-112)
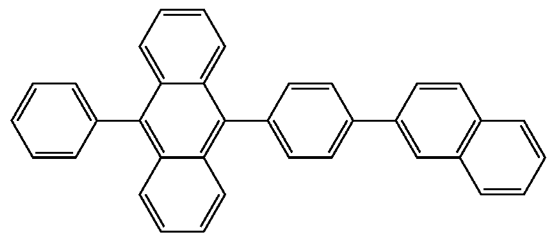
(2-113)
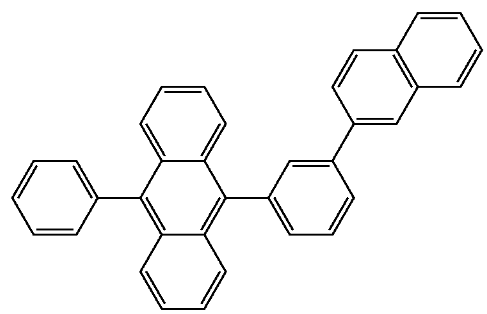
(2-114)
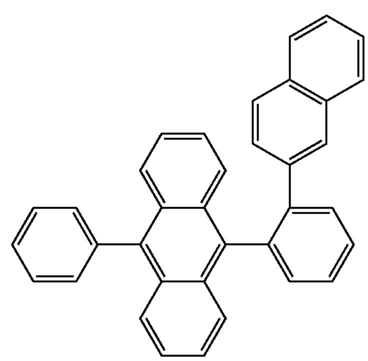
(2-115)
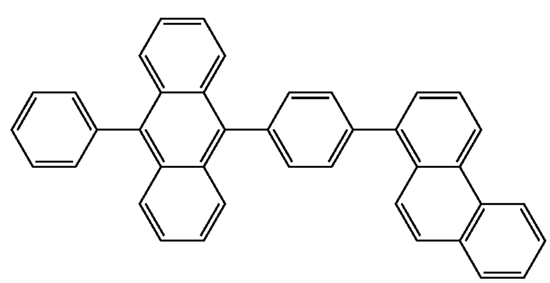

-continued
(2-116)
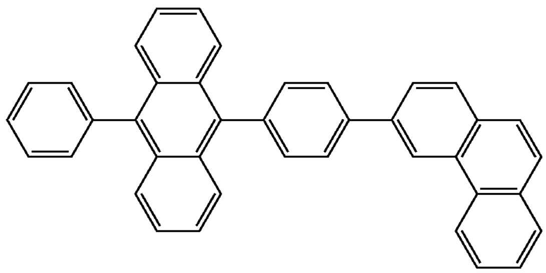
(2-117)
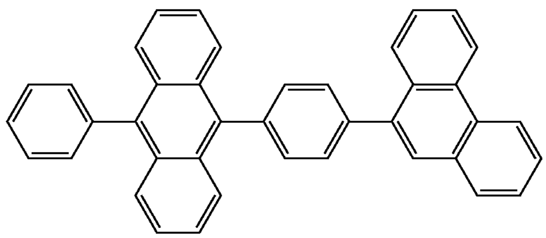
(2-118)
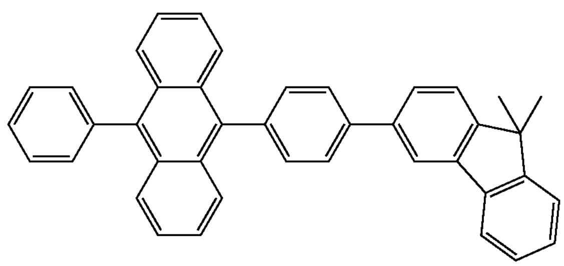
(2-119)
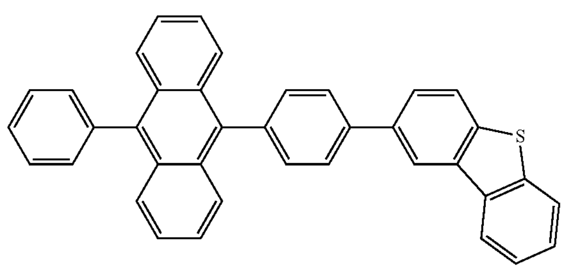
(2-120)
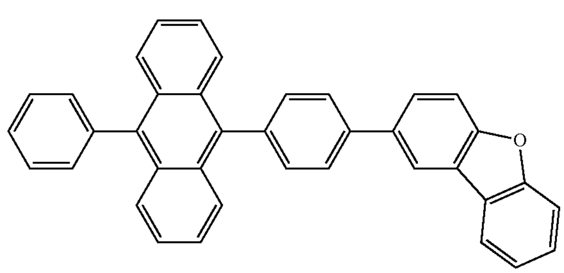
-continued
(2-121)
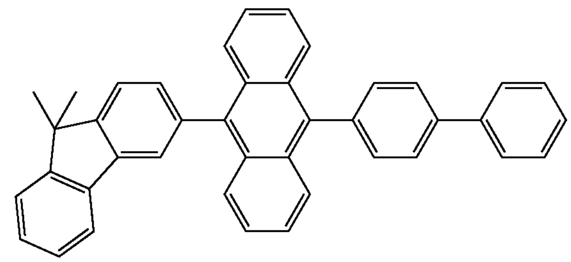
(2-122)
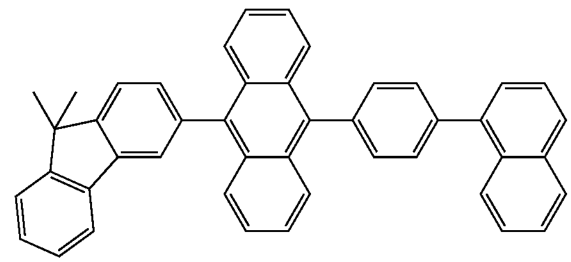
(2-123)
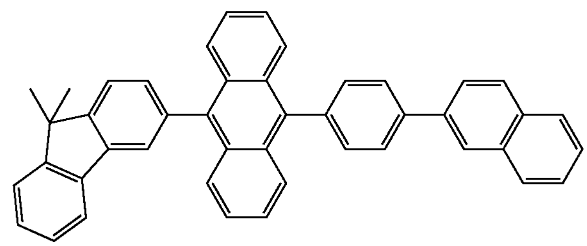
(2-124)
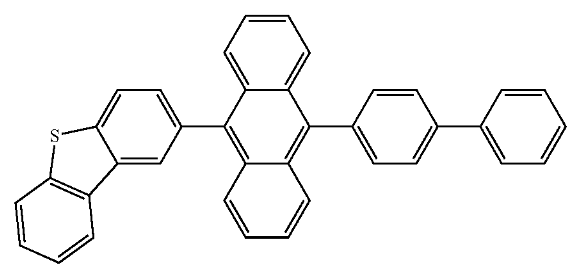
(2-125)
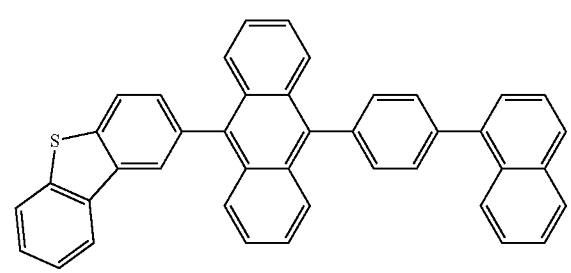

-continued
(2-126)
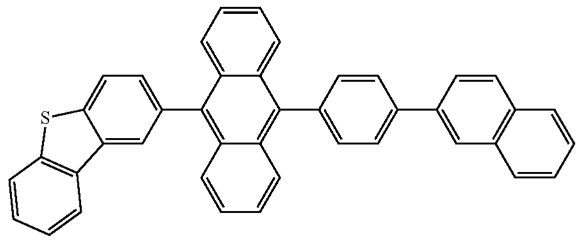
(2-127)
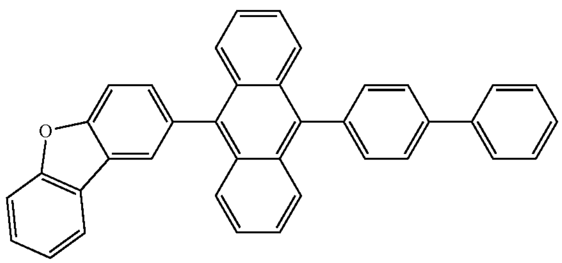
(2-128)
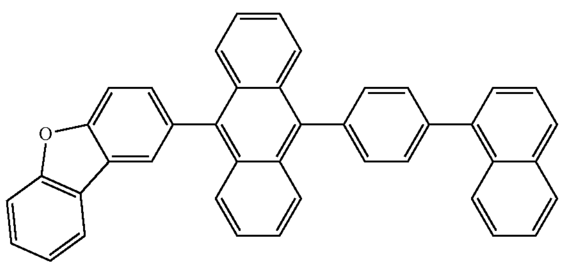
(2-129)
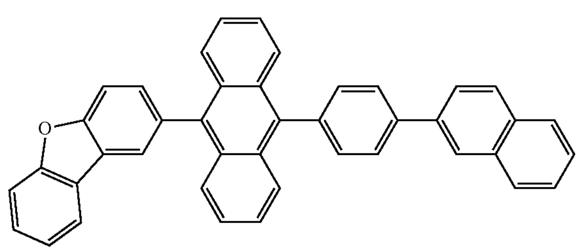
(2-130)
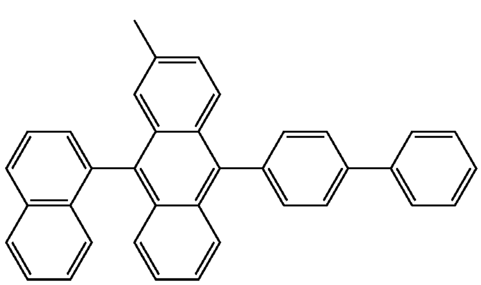
-continued
(2-131)
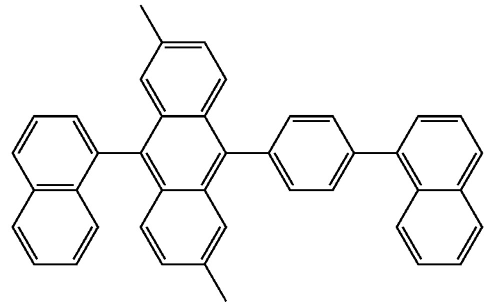
(2-132)
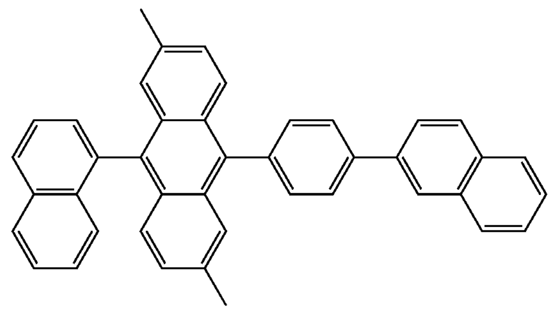
(2-133)
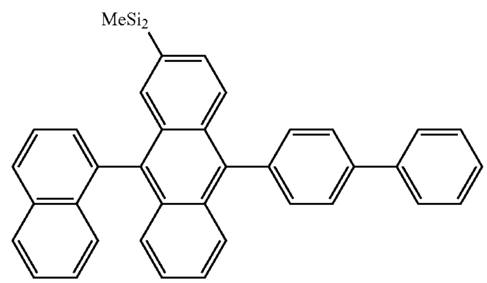
(2-134)
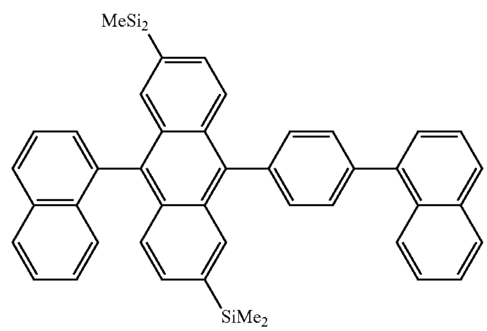
(2-135)
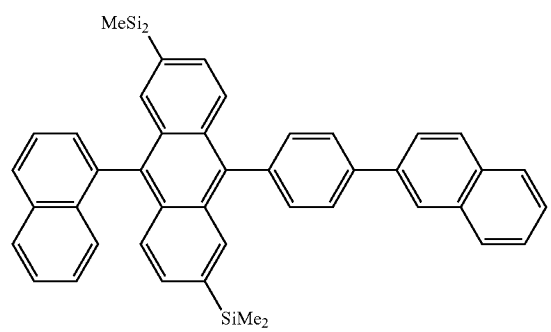

-continued
(2-136)
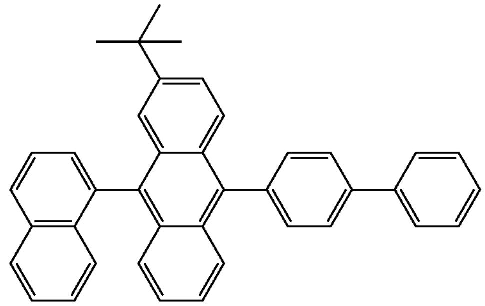
(2-137)
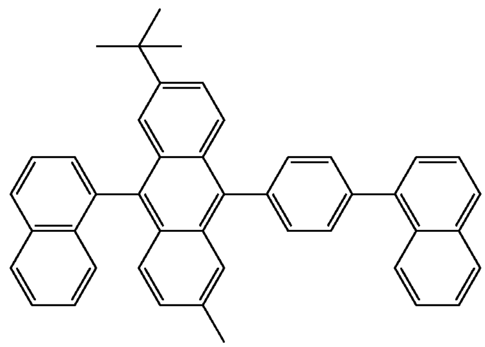
(2-138)
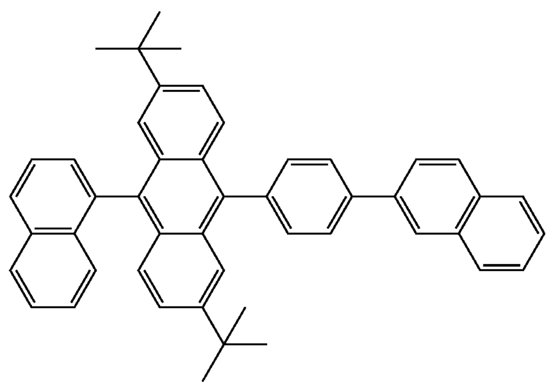
(2-139)
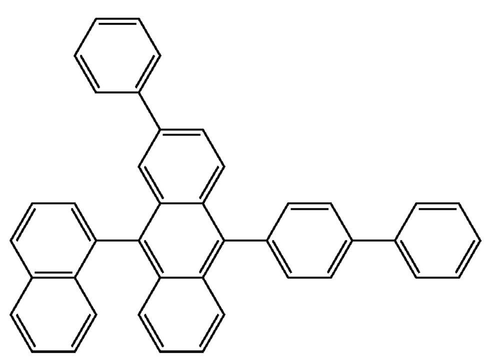
-continued
(2-140)
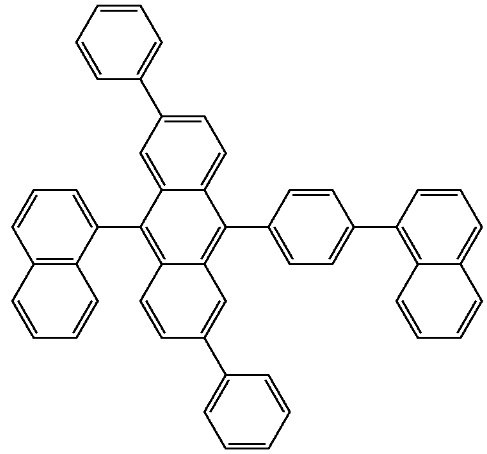
(2-141)
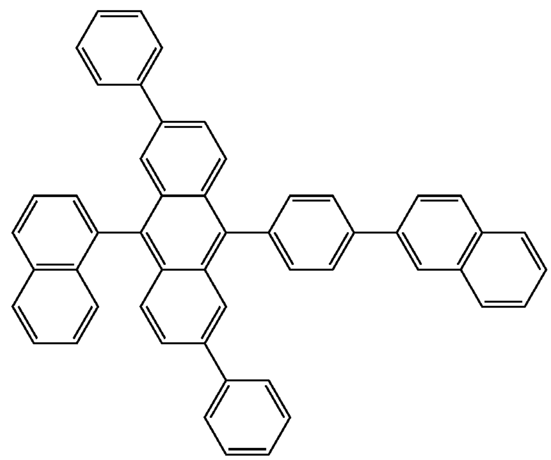
(2-142)
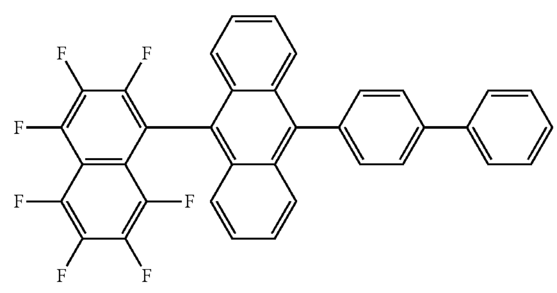
(2-143)
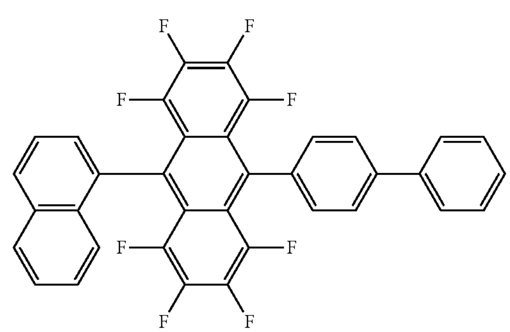

-continued (2-144)

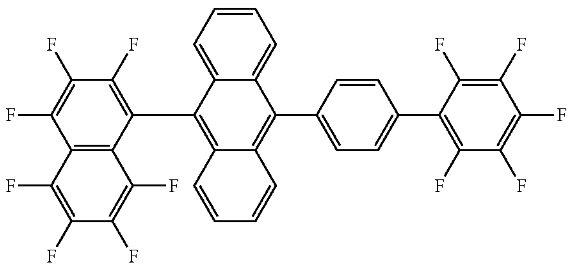

(2-145)

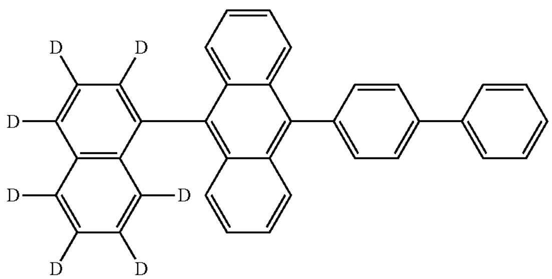

(2-146)

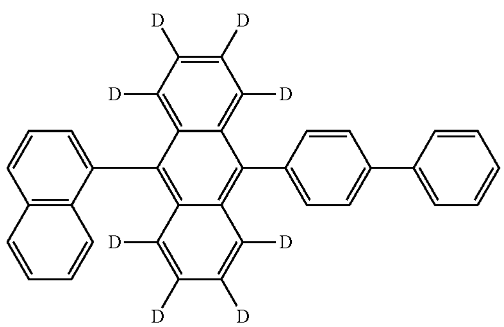

(2-147)

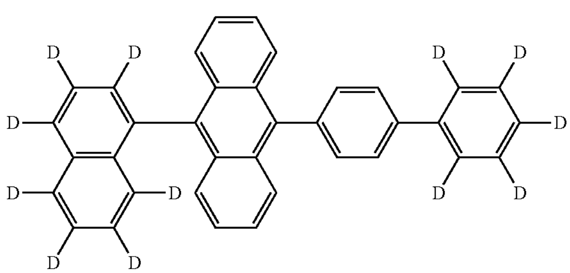

The emission layer 50 may additionally include a dopant material. The dopant material may include, e.g., IDE102 and IDE105, which are commercially available from Idemitsu Co., Ltd. and C545T, which is commercially available from Hayashibara Co., Ltd. as a fluorescent dopant. The dopant material may include, e.g., a red phosphorous dopant PtOEP, RD 61 of UDC Co., Ltd, a green phosphorous dopant $Ir(PPy)_3$(PPy=2-phenylpyridine), a blue phosphorous dopant $F_2$Irpic, and a red phosphorous dopant RD 61 of UDC Co., Ltd. as a phosphorous dopant.

In an implementation, as a dopant of the emission layer 50, $Ir(ppy)_3$, $Ir(ppy)_2$acac, $(piq)_2$Ir(acac), Pt(OEP), or the like may be used, but is not limited thereto.

A doping concentration of the dopant is not specifically restrictive, and may be, e.g., 0.01-15 parts by weight, with reference to 100 parts by weight of the host.

In implementation, the dopant included in the emission layer 50 may include a fourth compound represented by the following Chemical Formula 4.

[Chemical Formula 4]

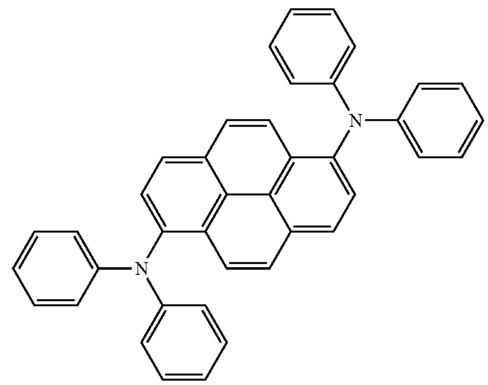

The fourth compound may be included in an amount of about 1 to 10 parts by weight, with reference to 100 parts by weight of the host.

In an implementation, the fourth compound may be included in an amount of up to about 5 wt % in the emission layer.

A thickness of the emission layer 50 may be 5 nm to 200 nm, e.g., 10 nm to 40 nm, so as to help reduce a voltage applied to an element.

The emission layer 50 may be formed using various methods including, e.g., a vacuum deposition method, a spin coating method, an LB method, or the like.

When an organic layer of the emission layer 50 is formed using the vacuum deposition method, a deposition condition may be determined based on a compound used as a material of the organic layer, a structure of the organic layer, and thermal characteristics of the organic layer. In general, the deposition conditions may be a deposition temperature of 100° C. to 500° C., a degree of vacuum of $10^{-8}$ to $10^{-3}$ torr, and a deposition speed of 0.01 to 100 Å/s, but is not limited thereto.

When the organic layer of the emission layer 50 is formed using the spin coating method, coating conditions may be determined based on a compound used as a material of the organic layer, a structure of the organic layer, and thermal characteristics of the organic layer. In general, the coating conditions may be a coating speed of about 2,000 rpm to 5,000 rpm, and a thermal treatment temperature for elimination of solvent after coating may be about 80° C. to 200° C., but are not limited thereto.

Hereinafter, an organic light emitting element according to an exemplary embodiment will be described with reference to FIG. 2.

Referring to FIG. 2, as in the above-described exemplary embodiment, an organic light emitting element according to the present exemplary embodiment may include an anode 10 and a cathode 20 facing each other, and an emission layer 50 between the anode 10 and the cathode 20. The organic light emitting device according to the present exemplary embodiment may further include a hole transfer layer 30 between the anode 10 and the emission layer 50 and an electron transfer layer 40 between the cathode 20 and the emission layer 50.

The cathode 20, the anode 10, and emission layer 50 may be the same as those in the exemplary embodiment of FIG. 1. For example, the emission layer 50 may include a compound represented by Chemical Formula 2. Similar constituent elements will not be further described.

The hole transfer layer 30 may include a suitable hole transfer material, e.g., may include an arylene-diamine derivative, a starburst-based compound, a biphenyl-diamine derivative including a Spiro group, or a ladder-type compound. In an implementation, the hole transfer material may include, e.g., 4,4",4""tris[(3-methylphenyl(phenyeamino)] triphenylamine (m-MTDATA), 1,3,5-tris[4-(3-methylphenyl-phenylamino)phenyl]benzene (m-MTDATB), copper phthalocyanine (CuPc), or the like, but is not limited thereto.

The thickness of the hole transfer layer 30 may be about 50 Å to 1000 Å, e.g., 100 Å to 600 Å. When the thickness of the hole transfer layer 30 satisfies the above-stated range, an excellent hole transfer characteristic may be acquired without a substantial increase of a driving voltage.

The hole transfer layer 30 may further include an auxiliary material for improvement of film conductivity, and when the hole transfer layer 30 further includes the auxiliary material, the auxiliary material may be evenly or unevenly distributed to the layers.

The hole transfer layer 30 may be formed above the anode 10 using various methods such as a vacuum deposition method, a spin coating method, a casting method, an LB method, and the like. When the hole transfer layer 30 is formed using the vacuum deposition method and the spin coating method, a deposition condition and a coating condition may be changed according to compounds used to form the hole transfer layer 30.

The organic light emitting element according to the present exemplary embodiment may include a first compound represented by the following Chemical Formula 1.

[Chemical Formula 1]

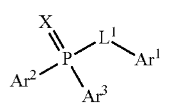

In Chemical Formula 1,

X may be, e.g., S, O, or Se, and $L^1$ may be or may include, e.g., an independent single bond, or a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group. For example, $L^1$ include a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

$Ar^1$ to $Ar^3$ may each independently be, e.g., hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

The first compound (e.g., represented by Chemical Formula 1) may be represented by the following Chemical Formula 3. For example, the electron transfer layer may include a compound represented by the following Chemical Formula 3.

[Chemical Formula 3]

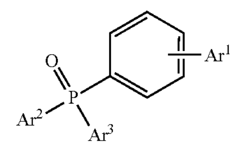

In Chemical Formula 3, $Ar^1$ to $Ar^3$ may each independently be hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

In an implementation, the first compound (e.g., represented by Chemical Formula 1) may be represented by one of the following Chemical Formula 1-1 to Chemical Formula 1-188.

(1-1)

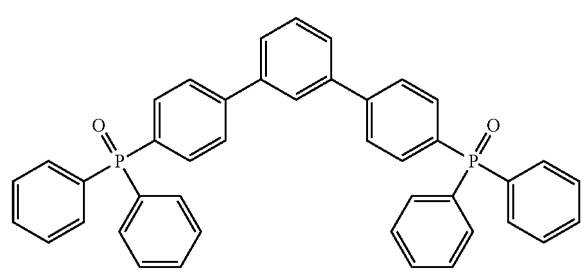

-continued
(1-2)
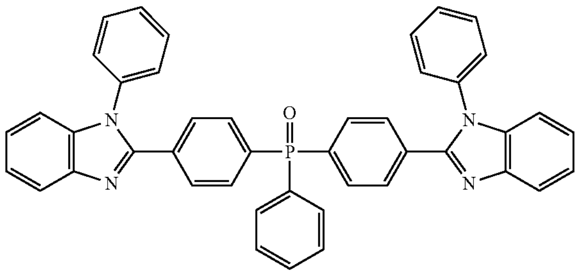
(1-3)
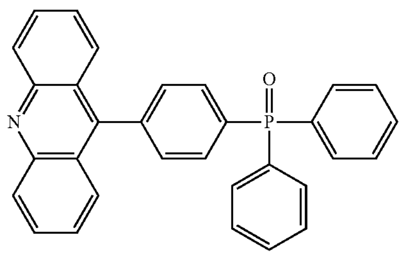
(1-4)
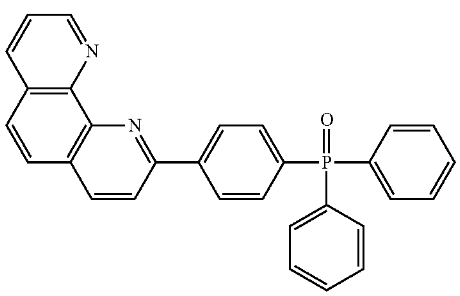
(1-5)
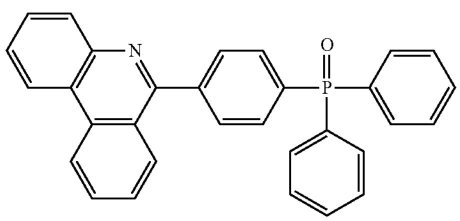
(1-6)
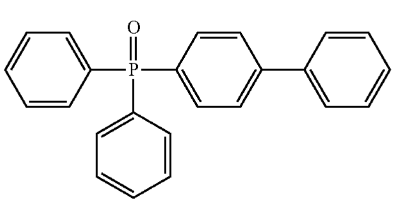
(1-7)
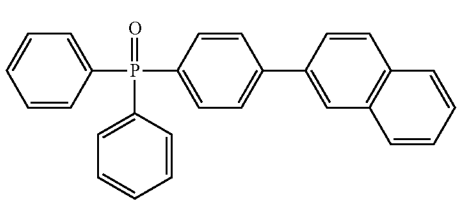
-continued
(1-8)
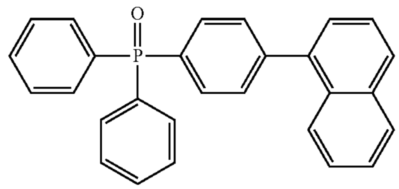
(1-9)
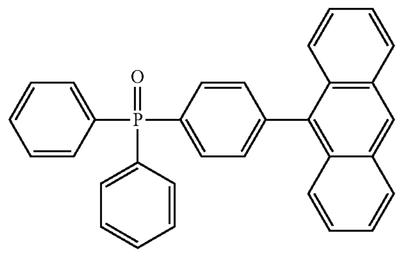
(1-10)
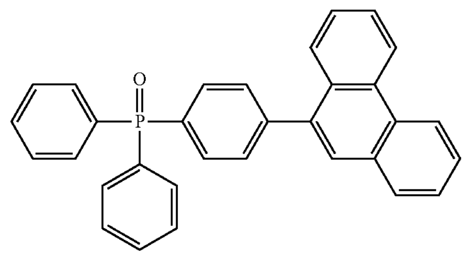
(1-11)
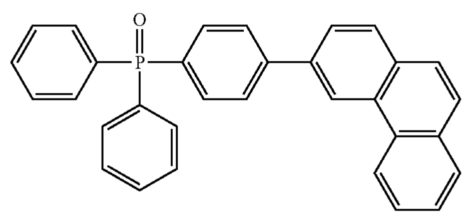
(1-12)
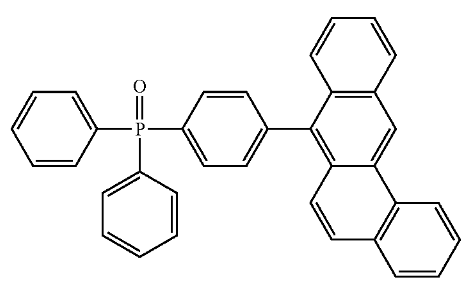
(1-13)
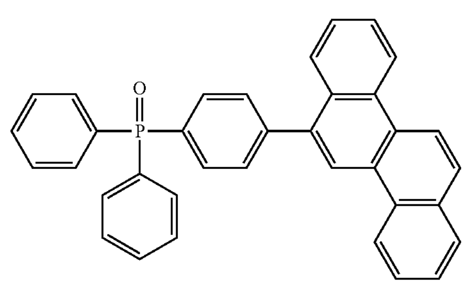

-continued
(1-14)
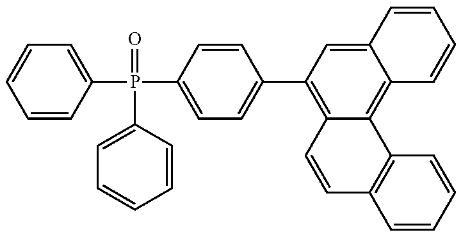
(1-15)
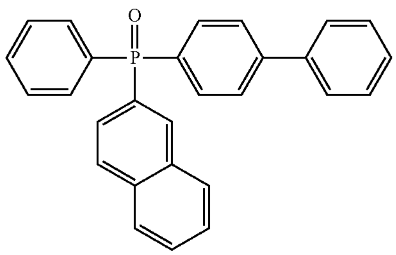
(1-16)
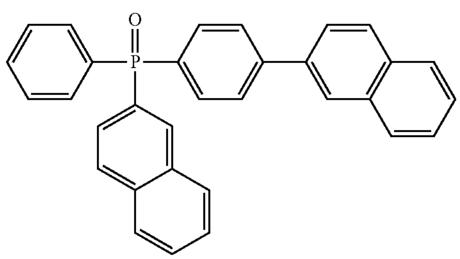
(1-17)
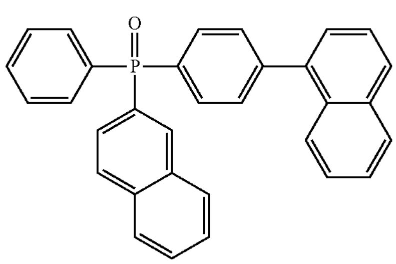
(1-18)
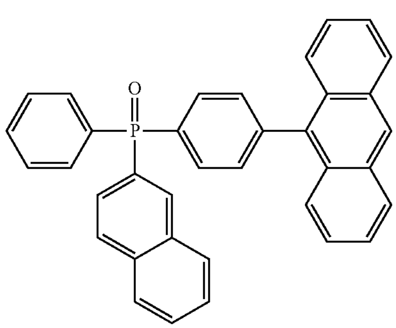
-continued
(1-19)
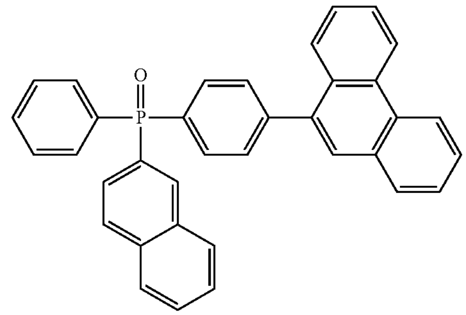
(1-20)
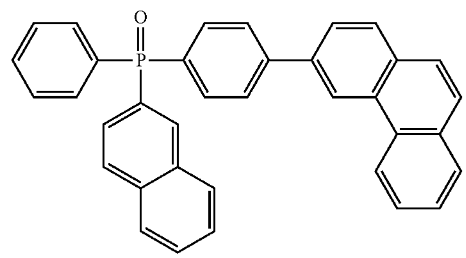
(1-21)
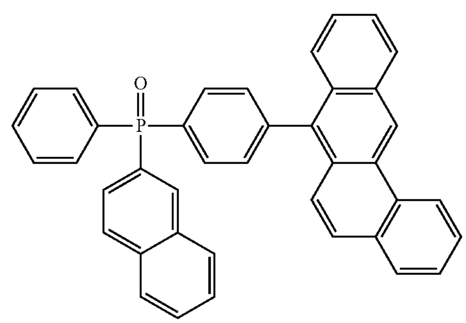
(1-22)
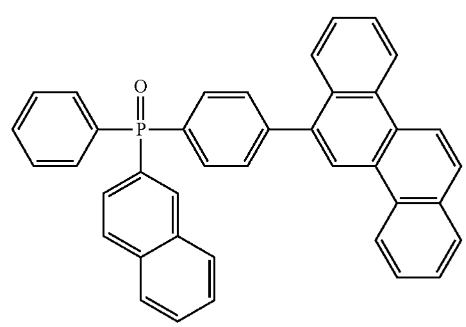
(1-23)
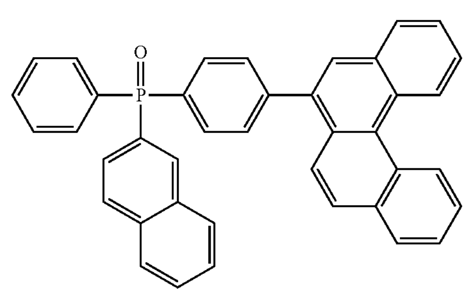

-continued
(1-24)
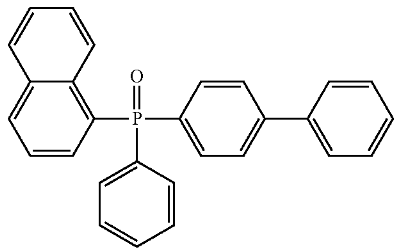
(1-25)
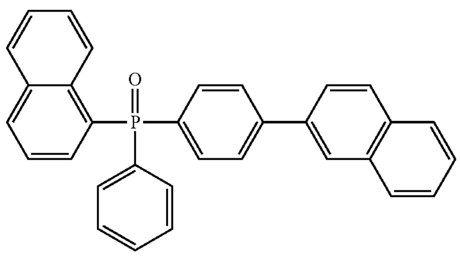
(1-26)
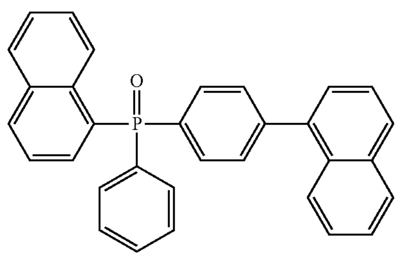
(1-27)
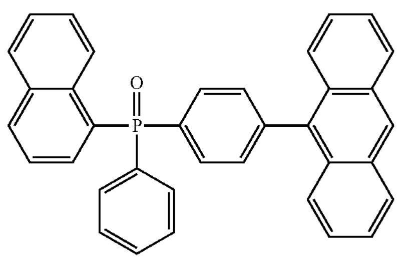
(1-28)
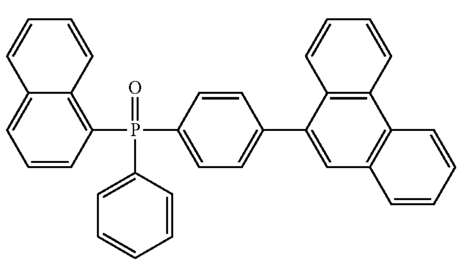
(1-29)
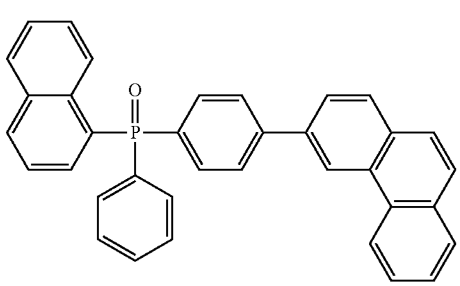
-continued
(1-30)
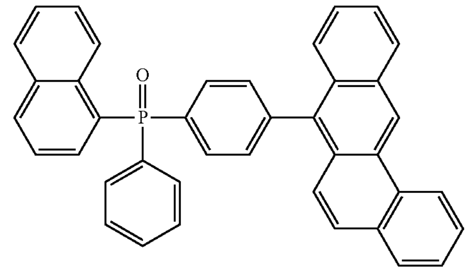
(1-31)
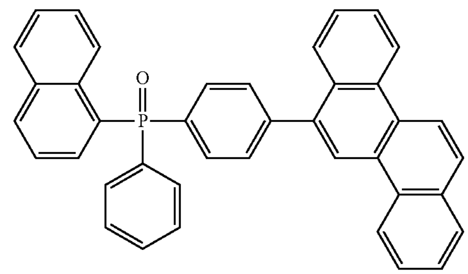
(1-32)
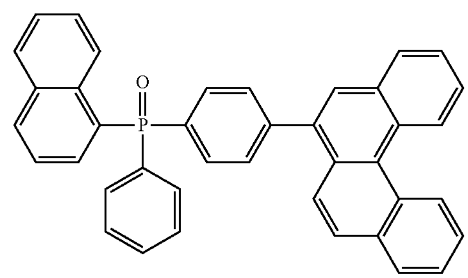
(1-33)
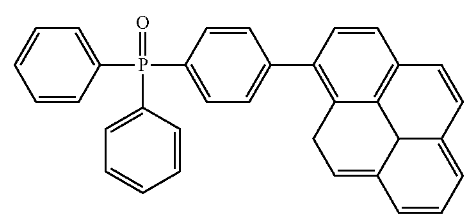
(1-34)
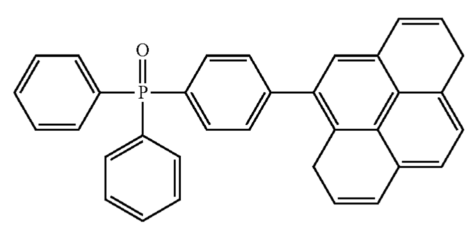
(1-35)
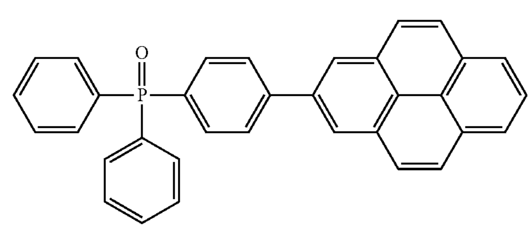

-continued
(1-36)
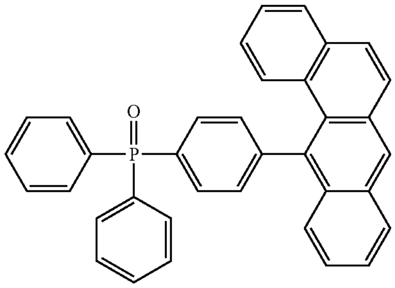
(1-37)
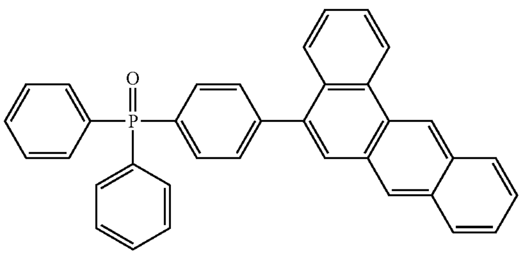
(1-38)
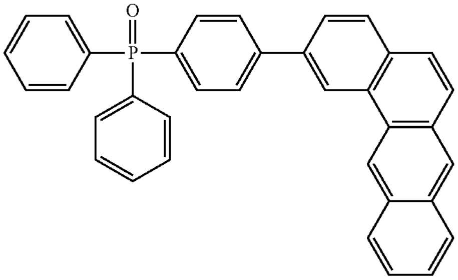
(1-39)
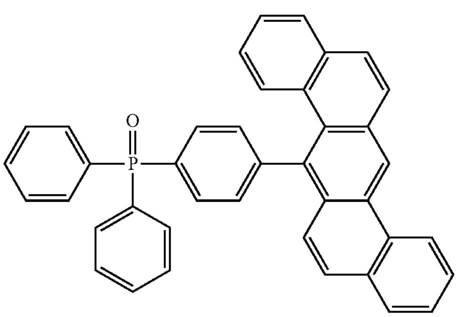
(1-40)
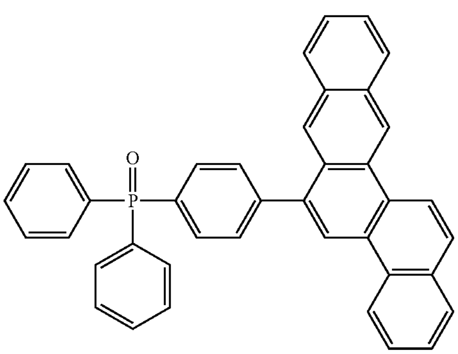
-continued
(1-41)
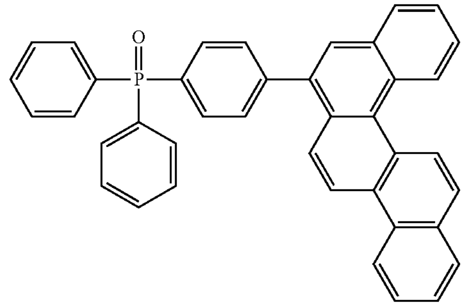
(1-42)
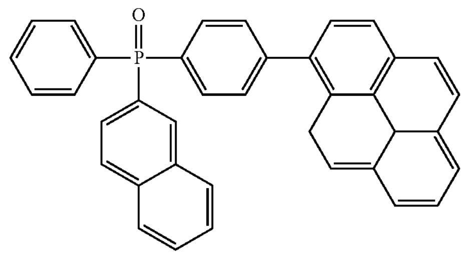
(1-43)
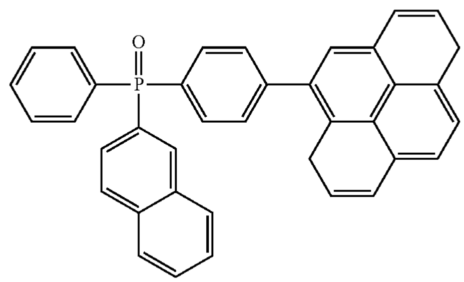
(1-44)
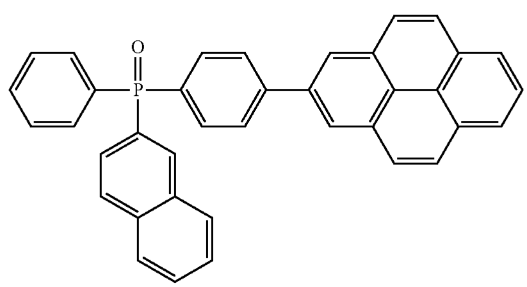
(1-45)
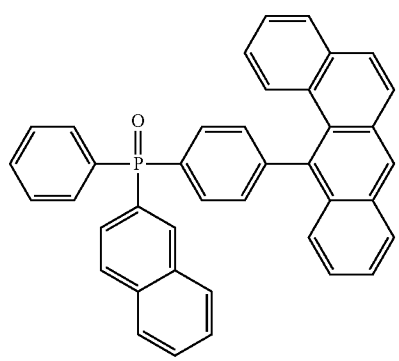

-continued
(1-46)
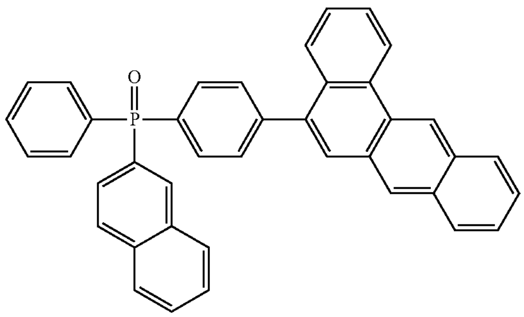
(1-47)
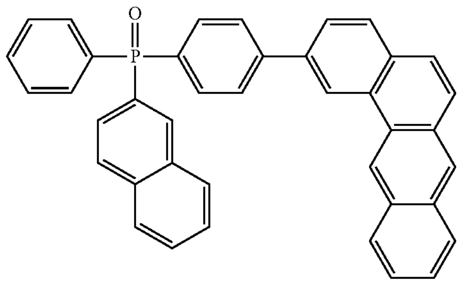
(1-48)
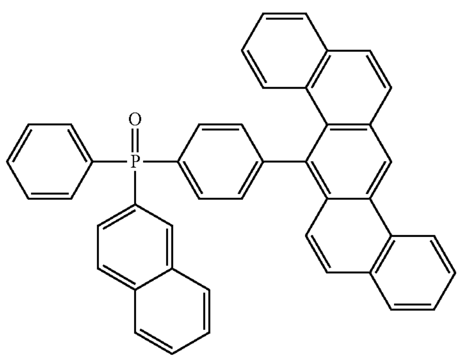
(1-49)
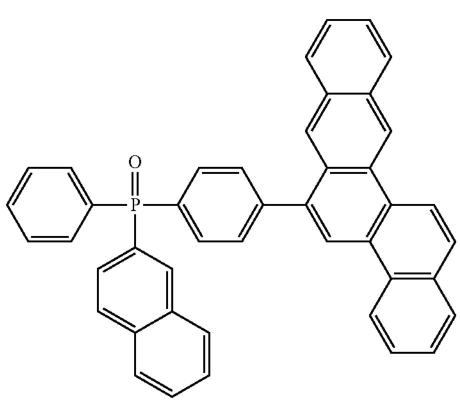
-continued
(1-50)
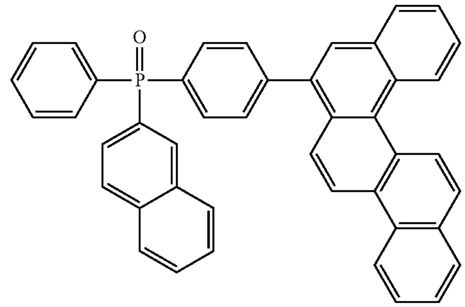
(1-51)
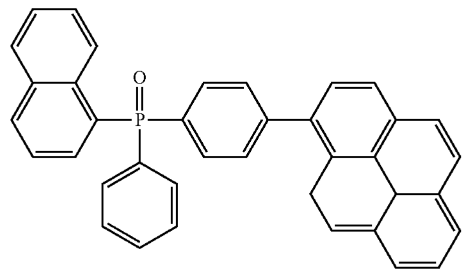
(1-52)
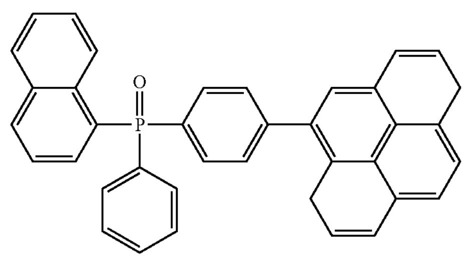
(1-53)
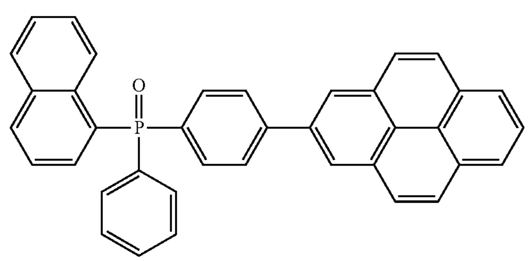
(1-54)
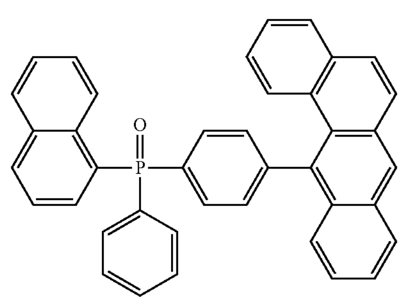

(1-55)
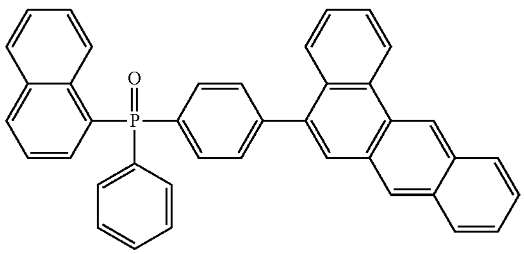
(1-56)
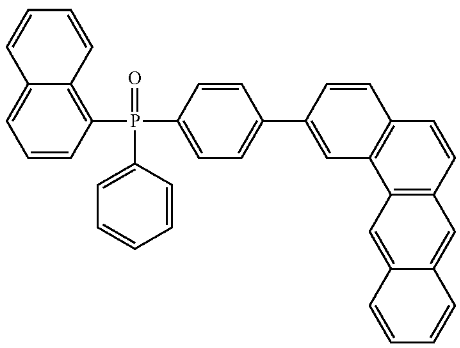
(1-57)
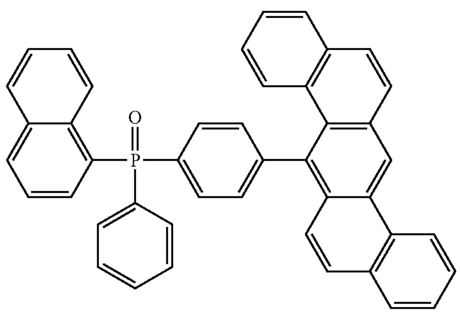
(1-58)
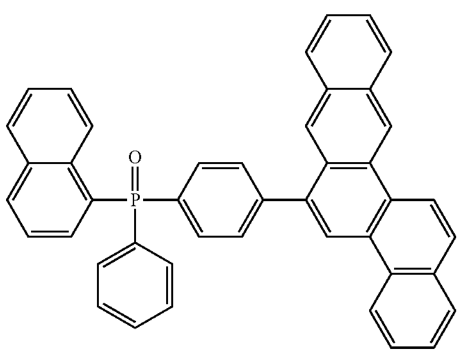
(1-59)
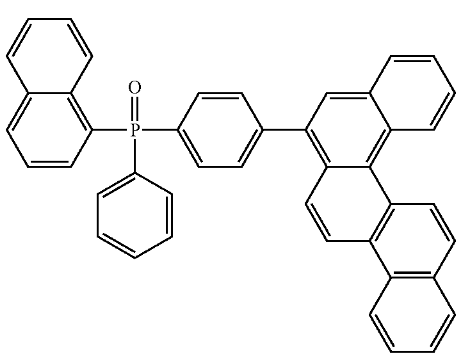
(1-60)
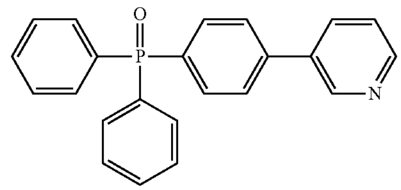
(1-61)
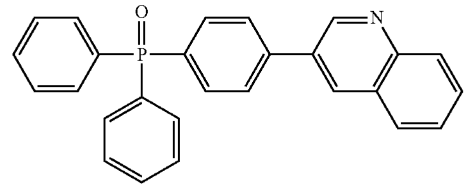
(1-62)
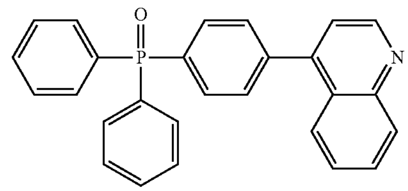
(1-63)
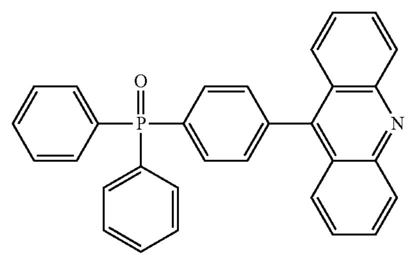
(1-64)
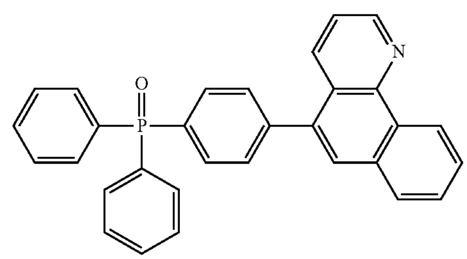
(1-65)
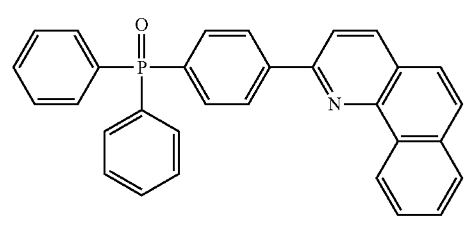
(1-66)
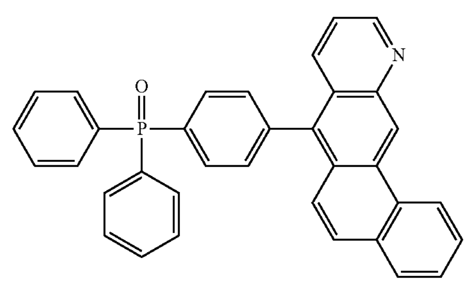

-continued
(1-67)
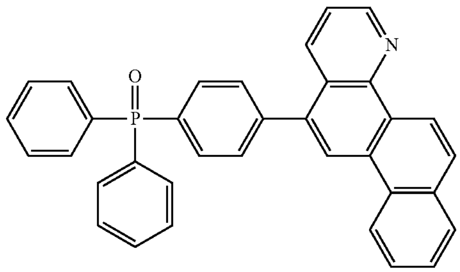
(1-68)
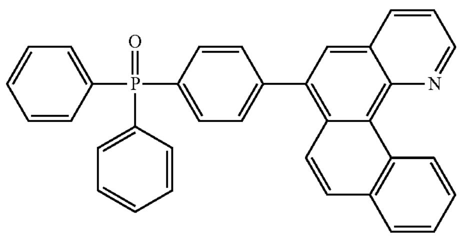
(1-69)
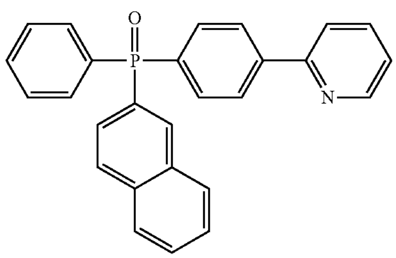
(1-70)
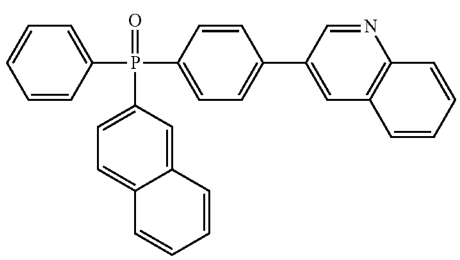
(1-71)
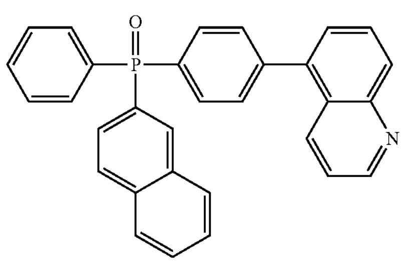
(1-72)
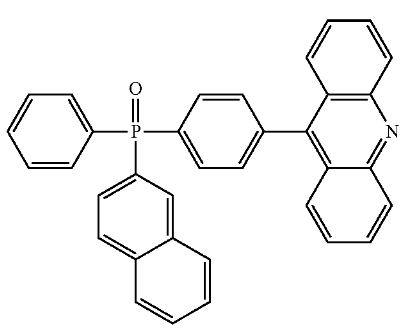
-continued
(1-73)
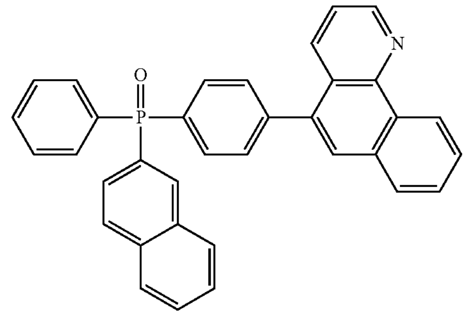
(1-74)
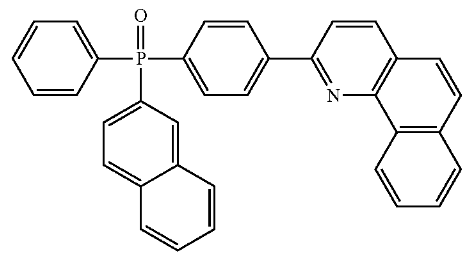
(1-75)
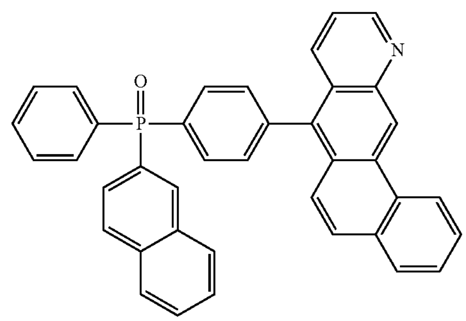
(1-76)
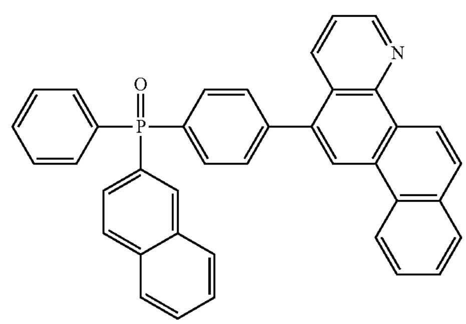
(1-77)
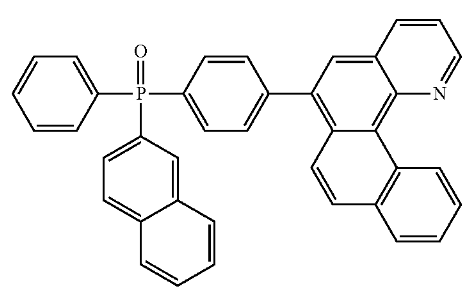

-continued
(1-78)
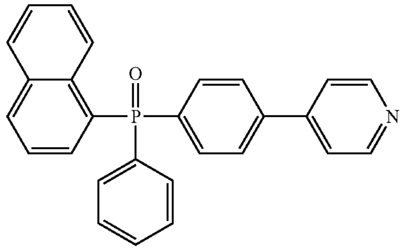
(1-79)
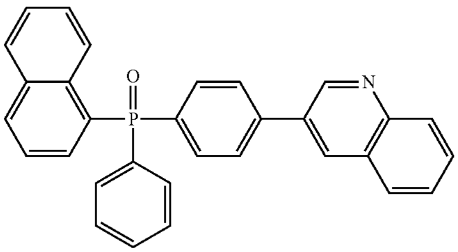
(1-80)
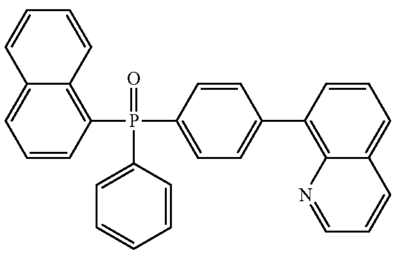
(1-81)
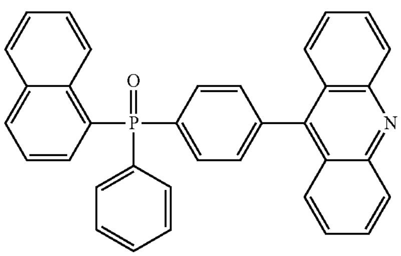
(1-82)
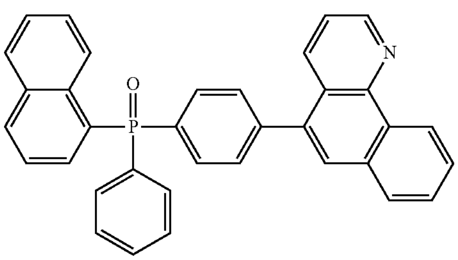
(1-83)
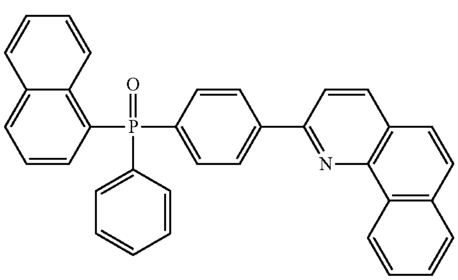
-continued
(1-84)
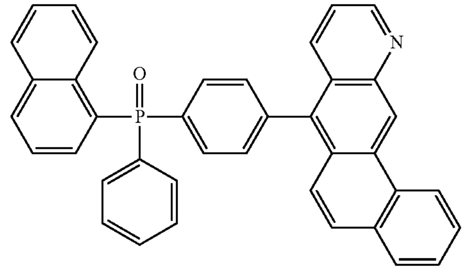
(1-85)
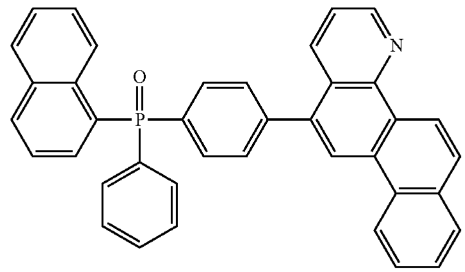
(1-86)
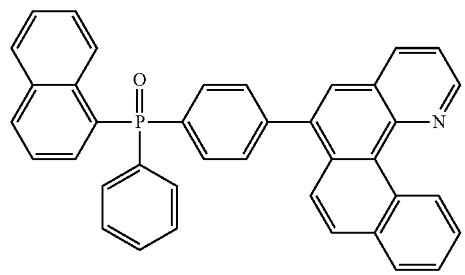
(1-87)
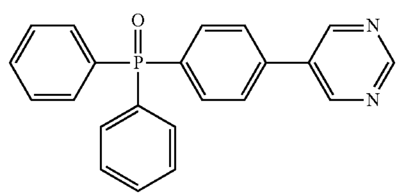
(1-88)
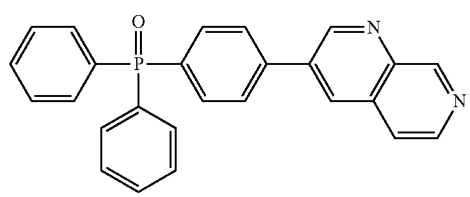
(1-89)
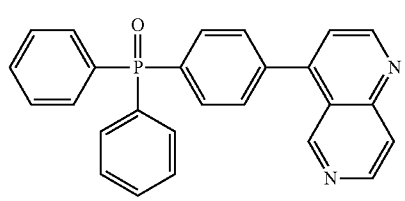

-continued
(1-90)
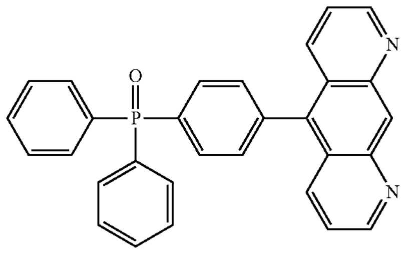
(1-91)
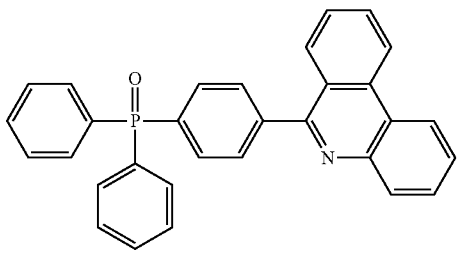
(1-92)
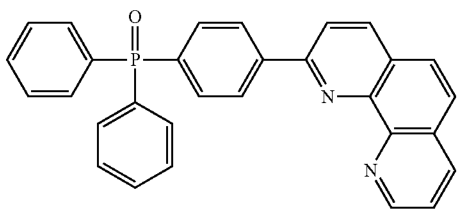
(1-93)
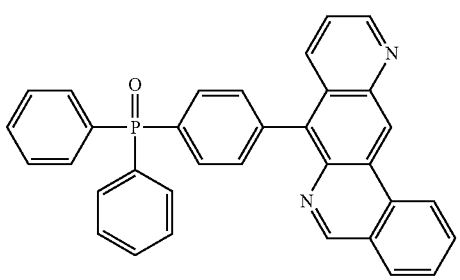
(1-94)
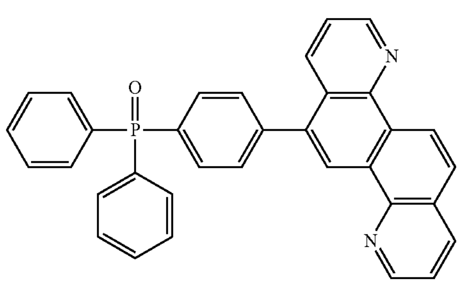
(1-95)
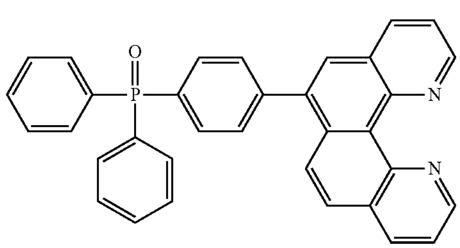
-continued
(1-96)
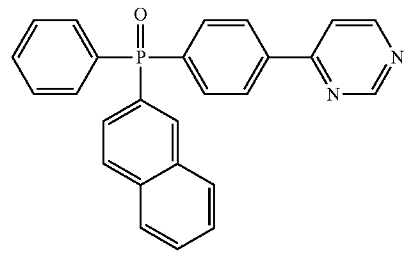
(1-97)
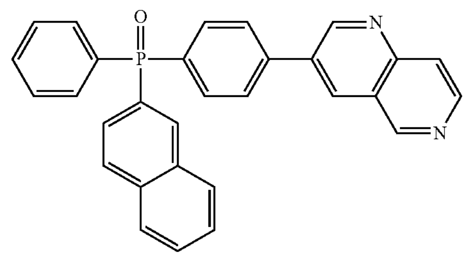
(1-98)
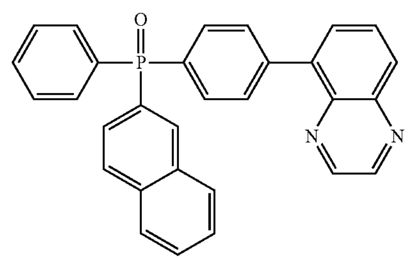
(1-99)
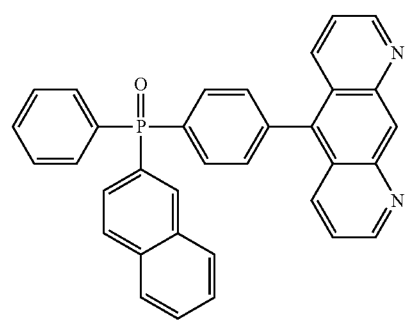
(1-100)
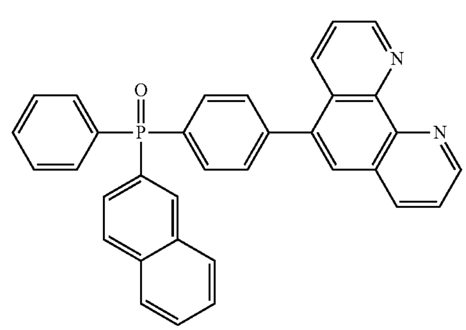

-continued
(1-101)
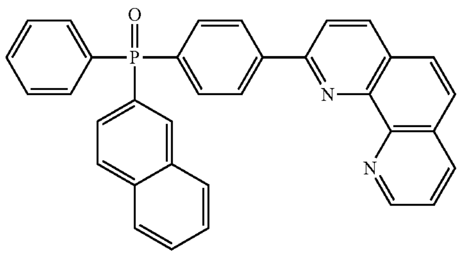
(1-102)
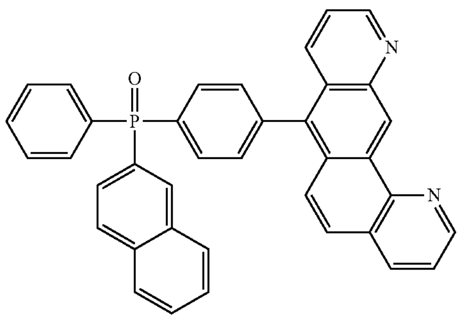
(1-103)
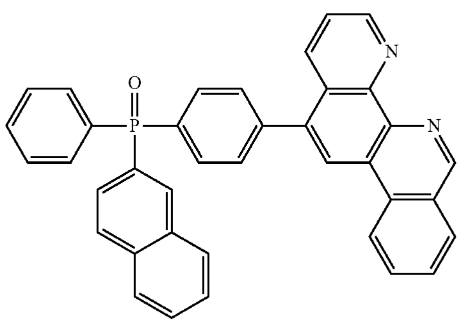
(1-104)
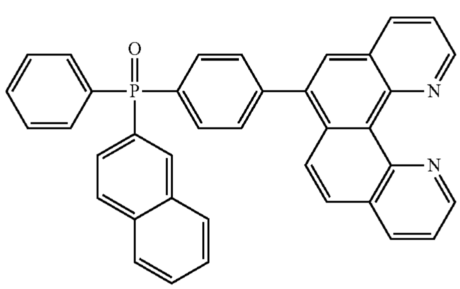
(1-105)
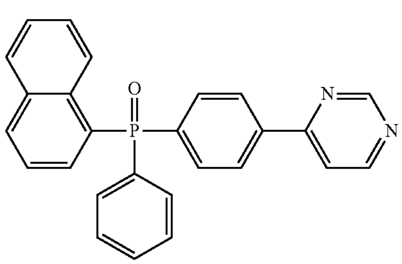
-continued
(1-106)
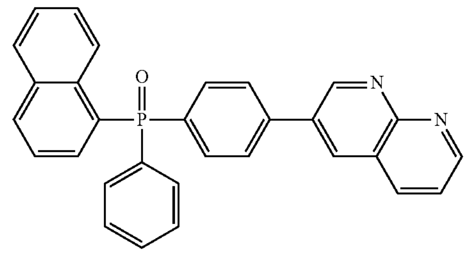
(1-107)
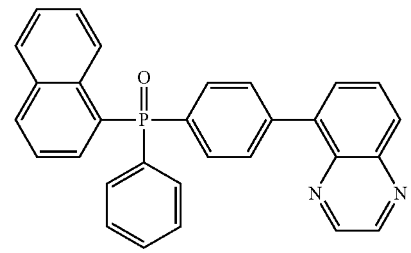
(1-108)
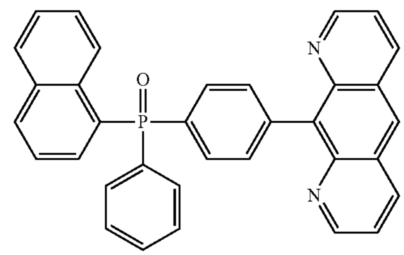
(1-109)
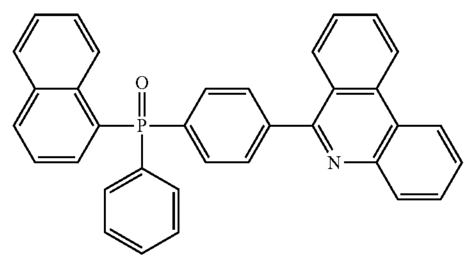
(1-110)
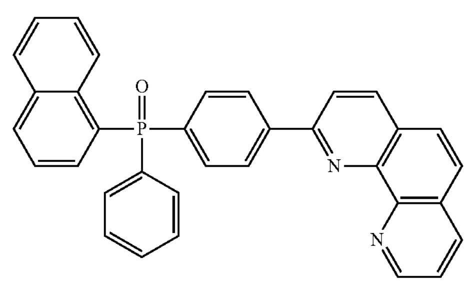
(1-111)
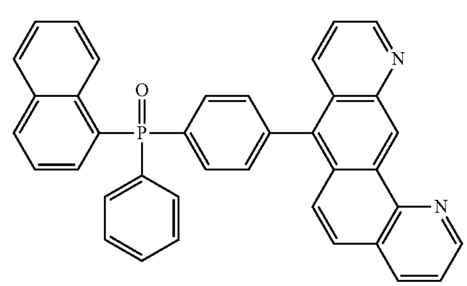

-continued
(1-112)
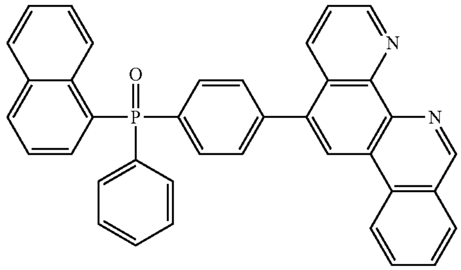
(1-113)
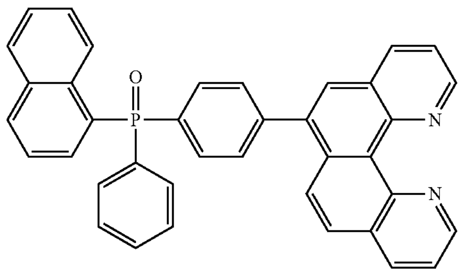
(1-114)
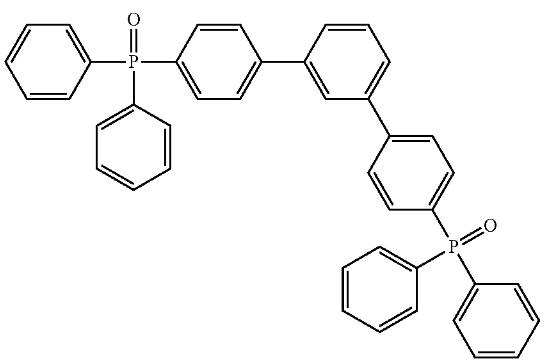
(1-115)
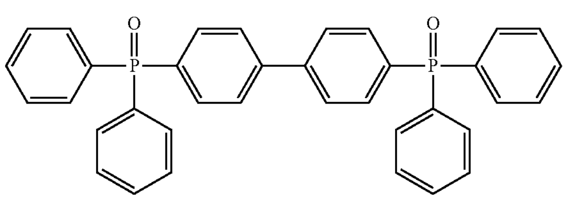
(1-116)
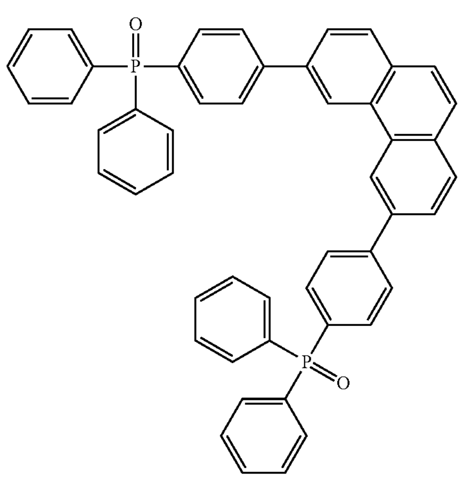
-continued
(1-117)
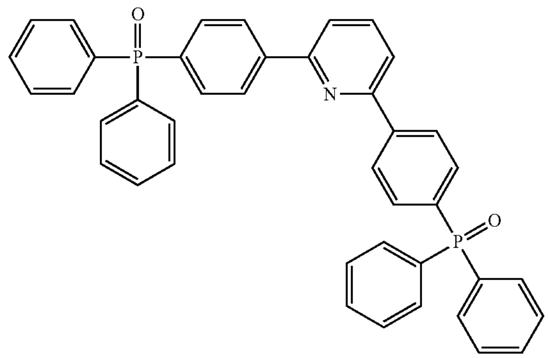
(1-118)
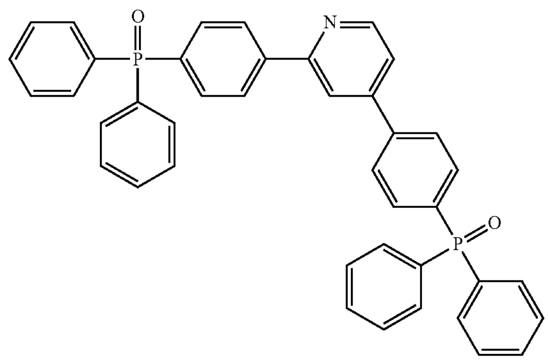
(1-119)
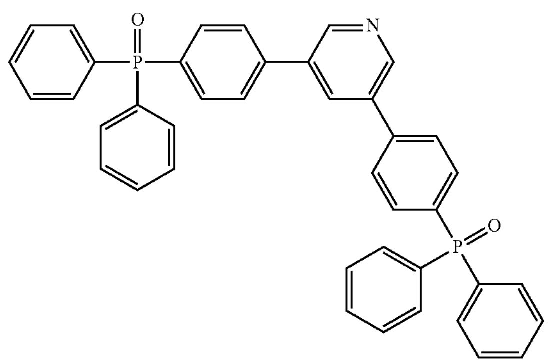
(1-120)
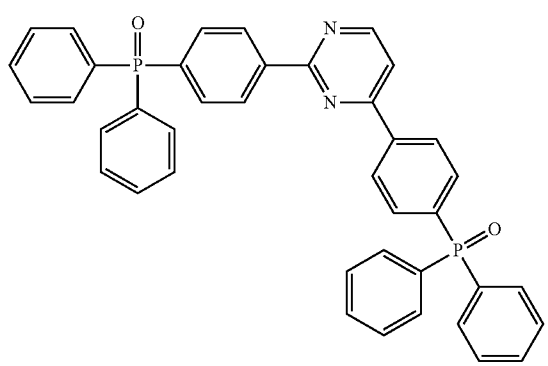

-continued
(1-121)
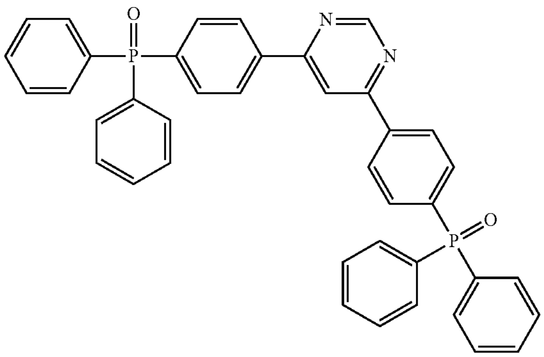
(1-122)
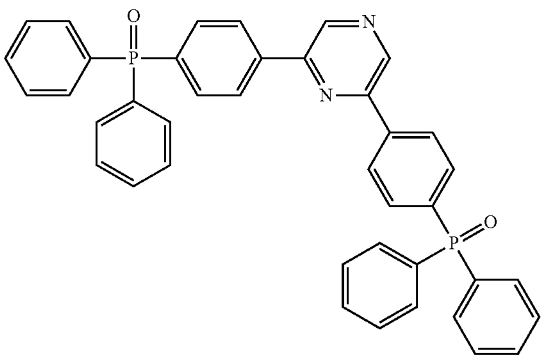
(1-123)
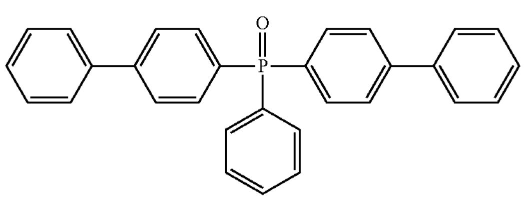
(1-124)
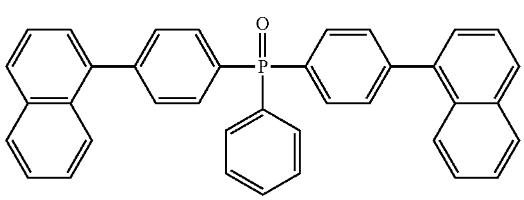
(1-125)
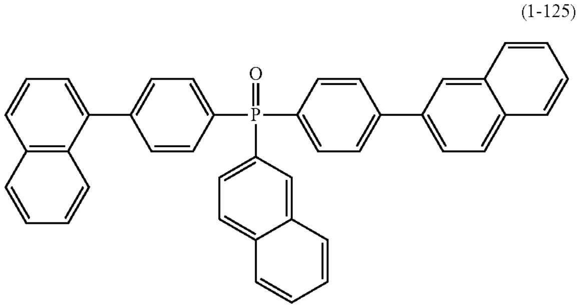
-continued
(1-126)
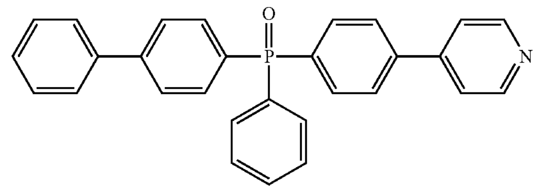
(1-127)
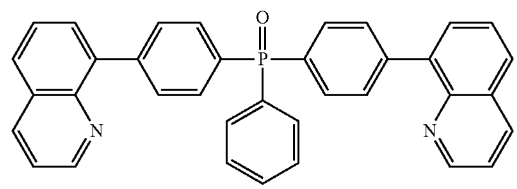
(1-128)
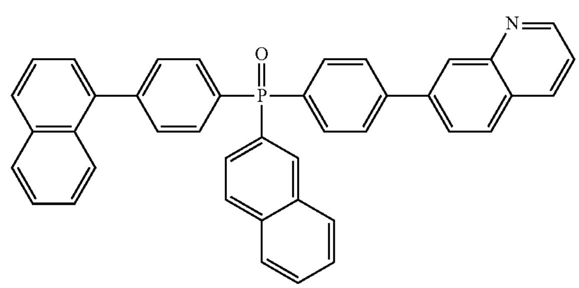
(1-129)
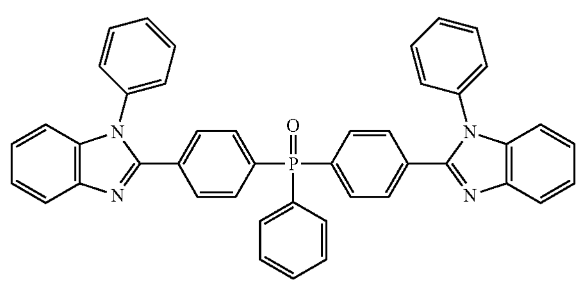
(1-130)
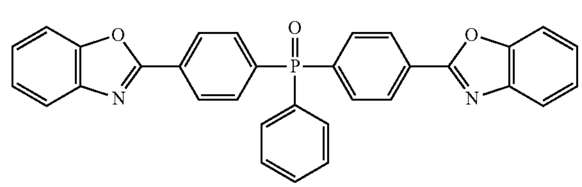
(1-131)
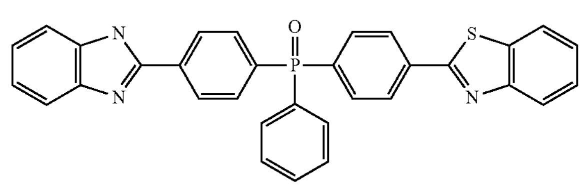

-continued
(1-132)
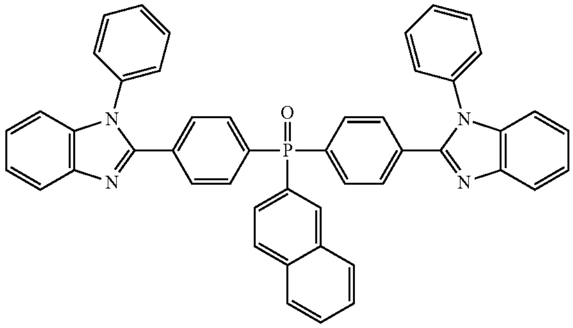
(1-133)
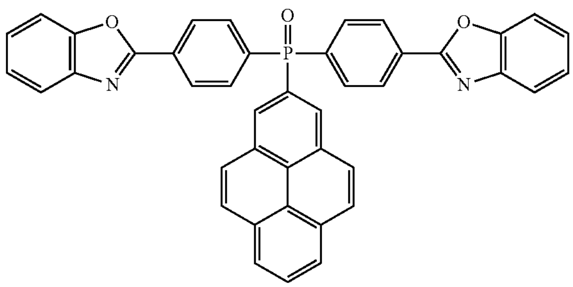
(1-134)
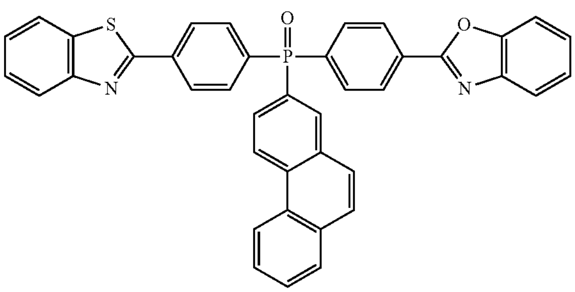
(1-135)
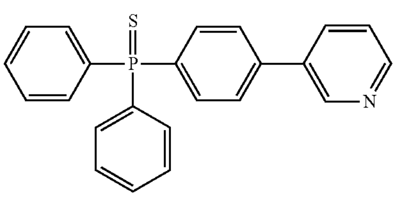
(1-136)
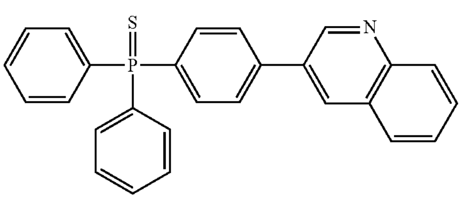
(1-137)
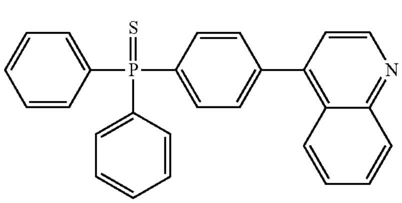
-continued
(1-138)
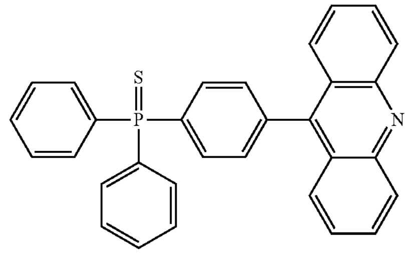
(1-139)
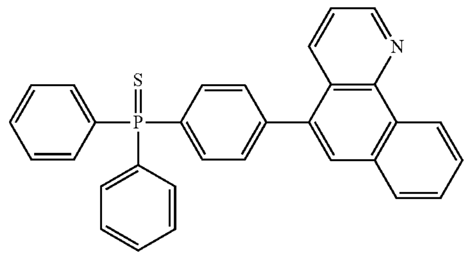
(1-140)
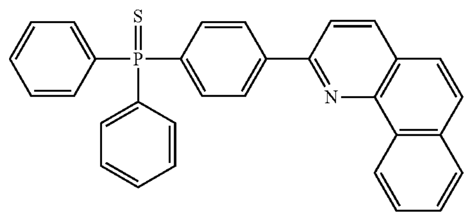
(1-141)
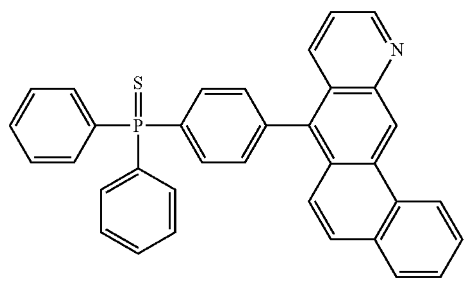
(1-142)
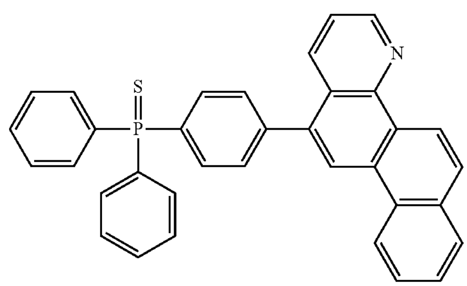
(1-143)
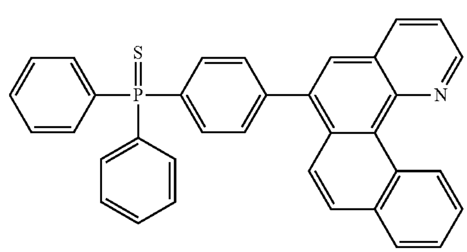

(1-144)
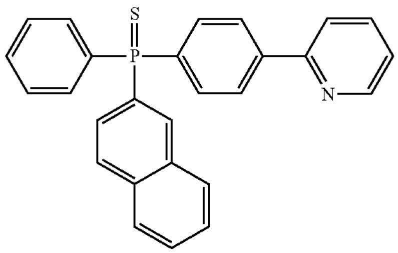
(1-145)
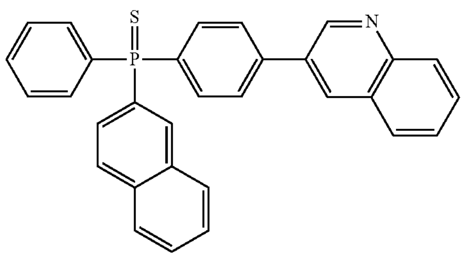
(1-146)
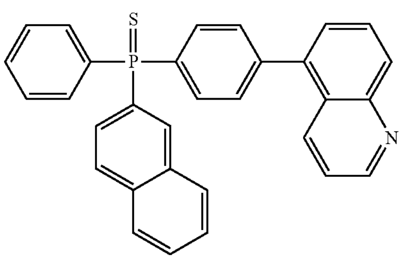
(1-147)
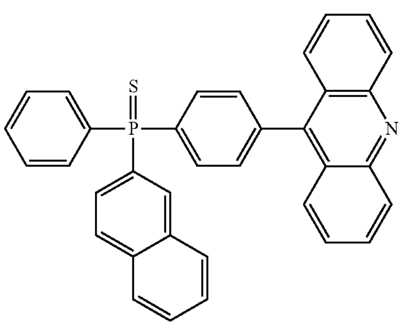
(1-148)
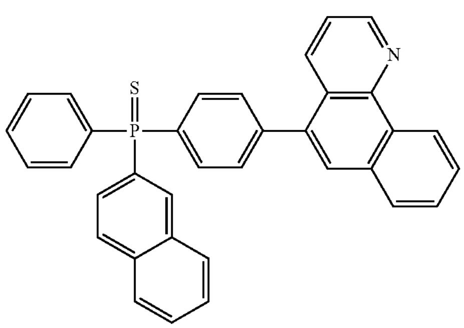
(1-149)
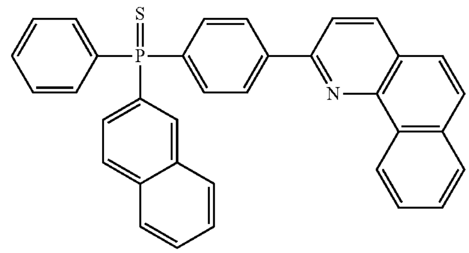
(1-150)
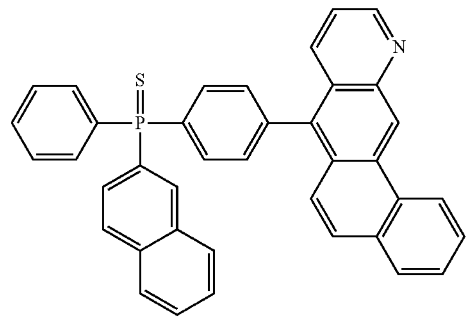
(1-151)
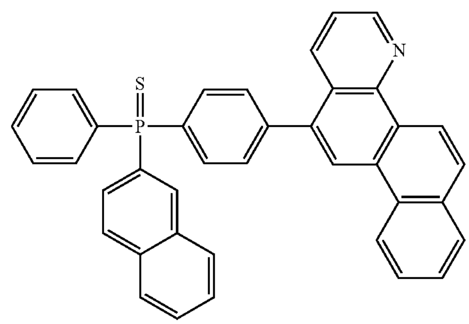
(1-152)
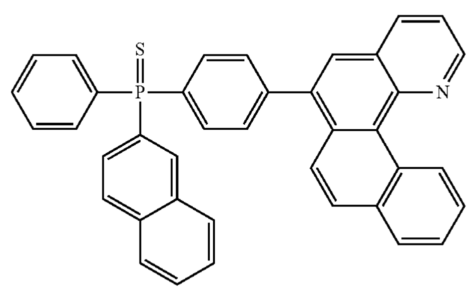
(1-153)
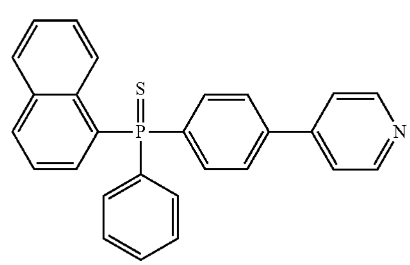

-continued
(1-154)
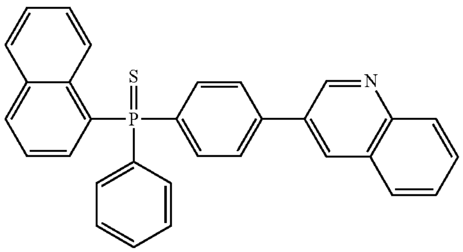
(1-155)
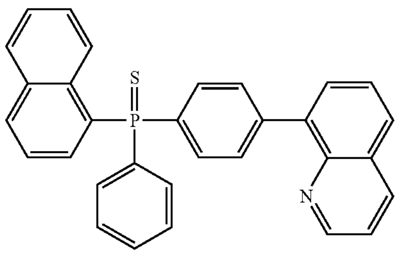
(1-156)
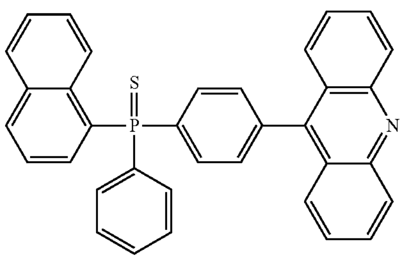
(1-157)
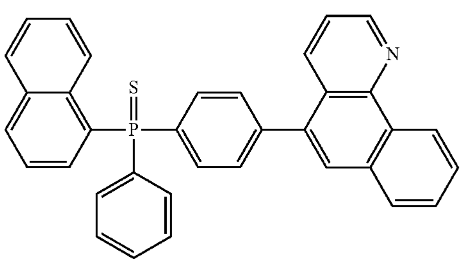
(1-158)
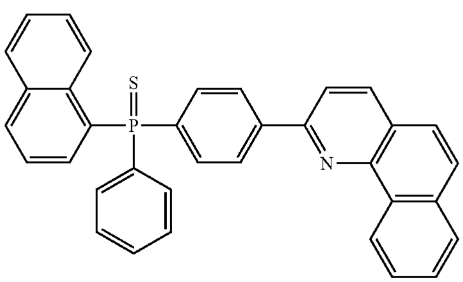
-continued
(1-159)
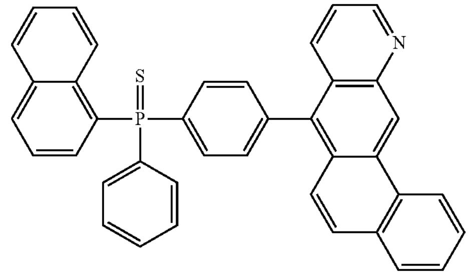
(1-160)
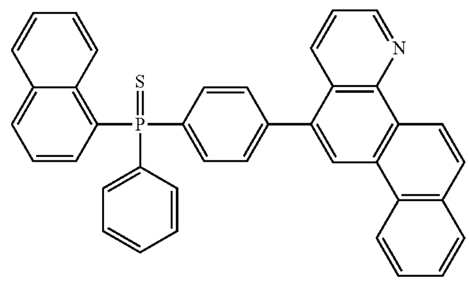
(1-161)
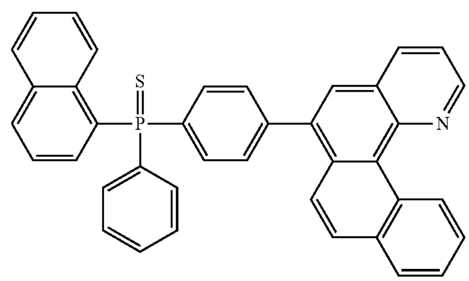
(1-162)
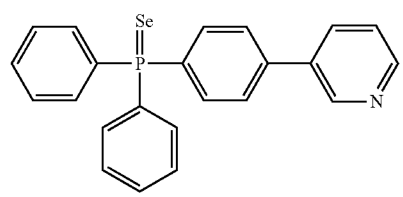
(1-163)
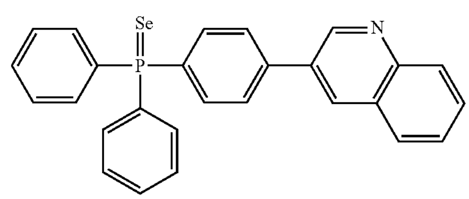
(1-164)
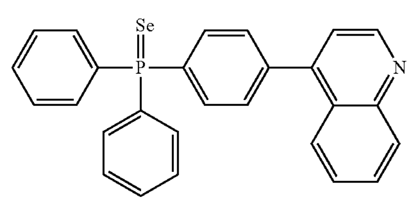

-continued
(1-165)
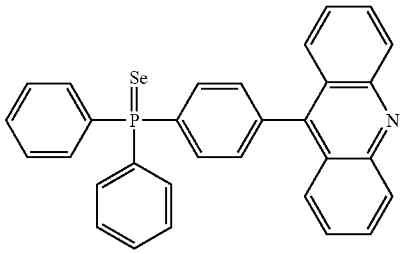
(1-166)
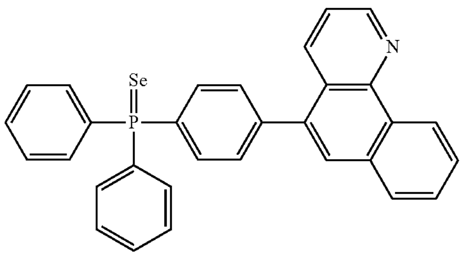
(1-167)
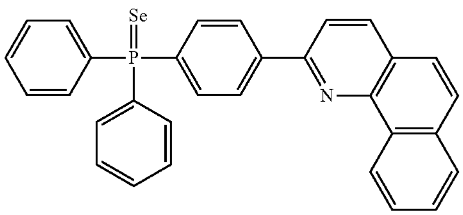
(1-168)
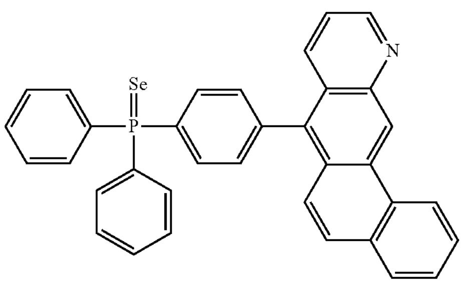
(1-169)
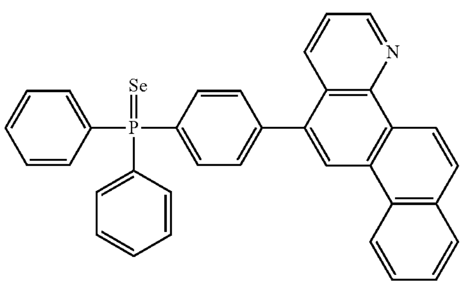
(1-170)
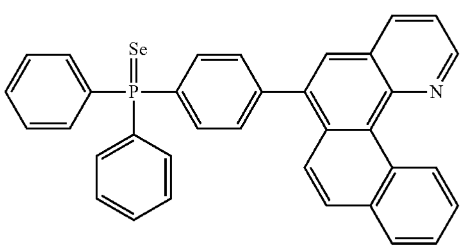
-continued
(1-171)
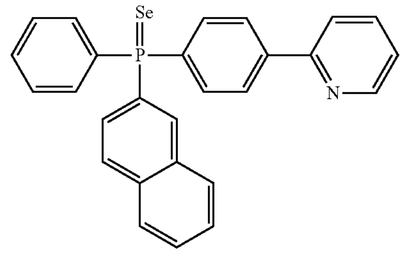
(1-172)
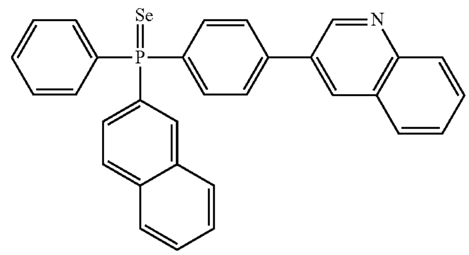
(1-173)
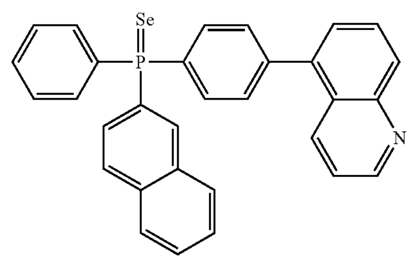
(1-174)
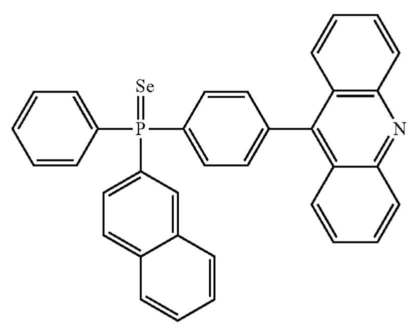
(1-175)
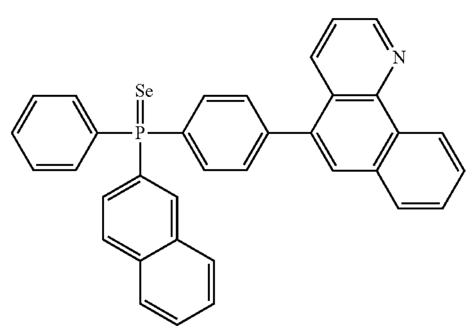

-continued
(1-176)
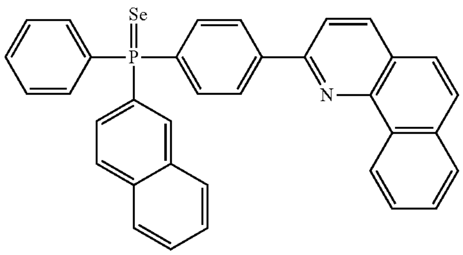
(1-177)
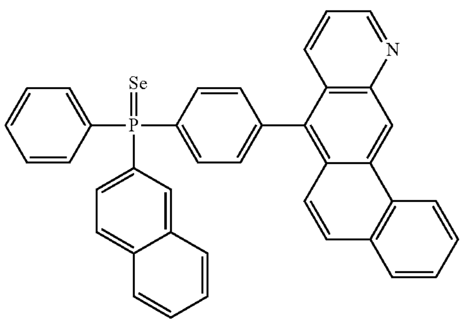
(1-178)
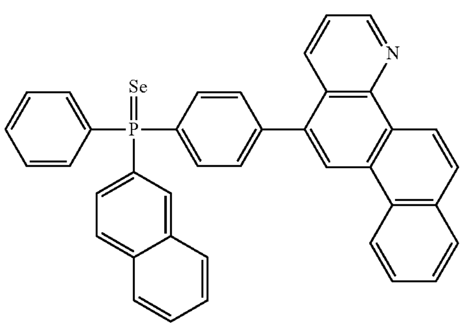
(1-179)
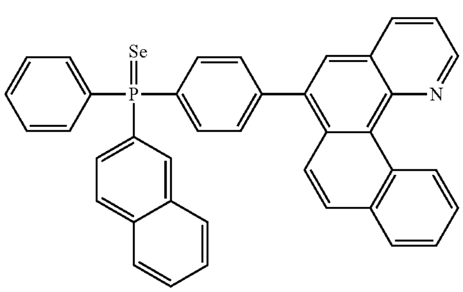
(1-180)
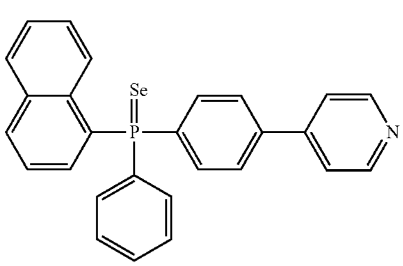
-continued
(1-181)
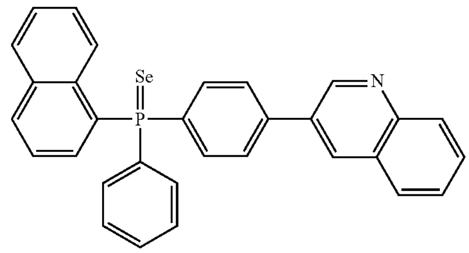
(1-182)
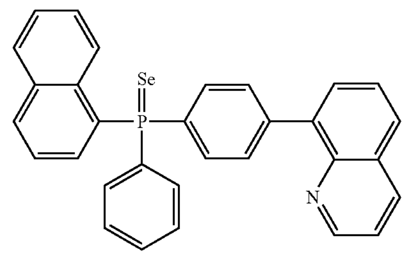
(1-183)
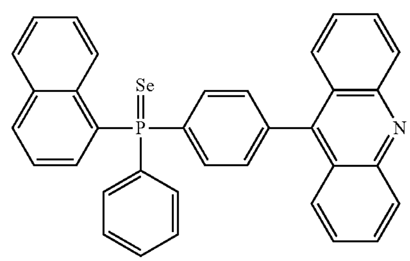
(1-184)
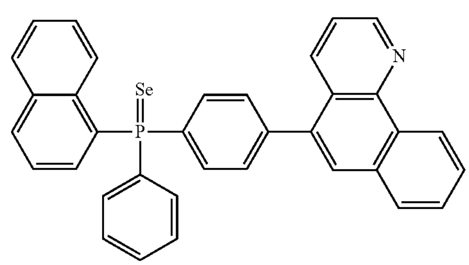
(1-185)
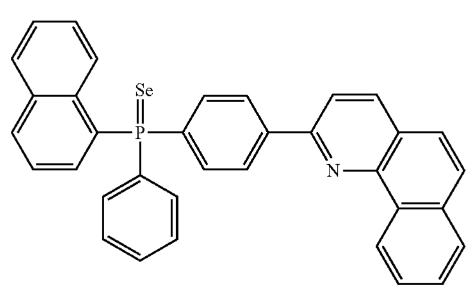

-continued (1-186)

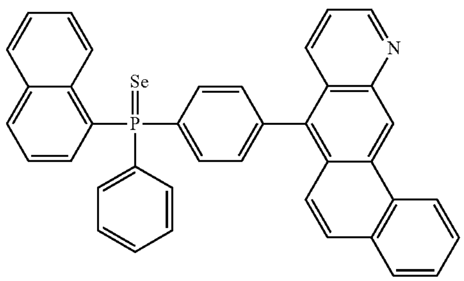

(1-187)

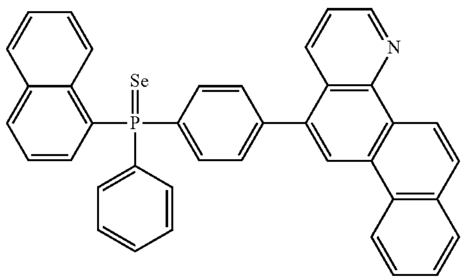

(1-188)

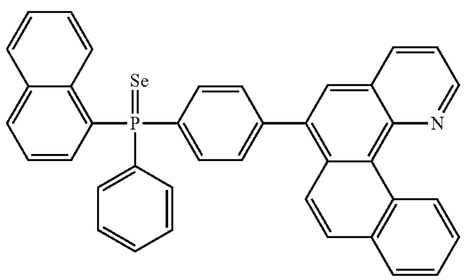

The thickness of the electron transfer layer 40 may be about 100 Å to about 1,000 Å, e.g., 100 Å to 500 Å. When the thickness of the electron transfer layer 40 satisfies the above-stated range, an excellent electron transfer characteristic may be acquired without a substantial increase of a driving voltage.

The electron transfer layer 40 may be formed using various methods such as a vacuum deposition method, a spin coating method, a casting method, or the like. When the vacuum deposition method and the spin coating method are used to form the electron transfer layer 40, the deposition conditions may vary according to a compound that is used to form the electron transfer layer 40.

An organic light emitting element according to another exemplary embodiment may form an electron transfer layer by doping lithium quinolate (Liq) in the compound represented by Chemical Formula 1. In an implementation, a doping concentration may be about 50 wt %. For example, the compound represented by Chemical Formula 1 and Liq may be deposited with a weight ratio of 1:1 when forming the electron transfer layer.

In the organic light emitting element according to an embodiment, an, e.g., anthracene-based compound, represented by Chemical Formula 2 may be used as a host of the emission layer 50 and a, e.g., phosphine-based, compound represented by Chemical Formula 1 may be used as an electron transfer layer, so that carrier balance may be improved, efficiency of the organic light emitting element may be enhanced, and life span may be increased.

Next, referring to FIG. 3, an organic light emitting element according to another embodiment will be described.

Figure 3:
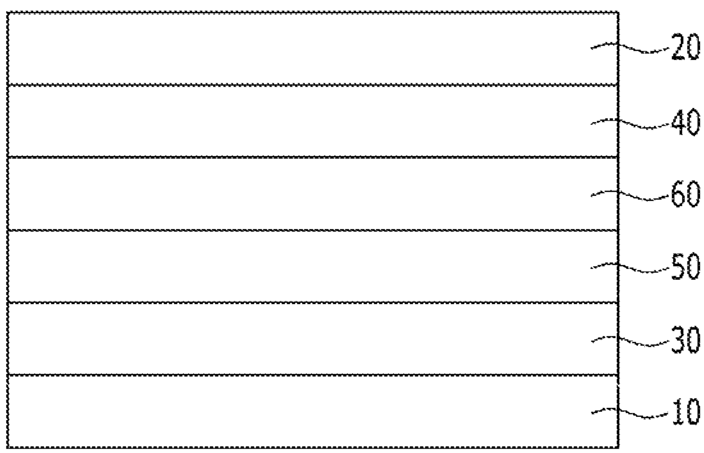

Referring to FIG. 3, an organic light emitting element according to the present exemplary embodiment may include an anode 10 and a cathode 20 facing each other, an emission layer 50 between the anode 10 and the cathode 20, a hole transfer layer 30 between the anode 10 and the emission layer 50, and an electron transfer layer 40 between the cathode 20 and the emission layer 50, and may further include a hole blocking layer 60 between the emission layer 50 and the electron transfer layer 40. In addition, although it is not illustrated, an electron blocking layer between the emission layer 50 and the hole transfer layer 30 may be additionally included.

The cathode, the anode, and the emission layer of the organic light emitting element according to the present exemplary embodiment may be the same as those of the organic light emitting element according to the exemplary embodiment of FIG. 1. Repeated descriptions of similar constituent elements may be omitted.

In the organic light emitting element according to the present exemplary embodiment, the hole blocking layer 60 may include a first compound represented by the following Chemical Formula 1.

[Chemical Formula 1]

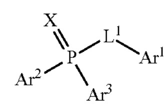

In Chemical Formula 1,

X may be S, O, or Se, and $L^1$ may be an independent single bond, or may include, e.g., a substituted or unsubstituted C6 to C30 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group, $Ar^1$ to $Ar^3$ may each independently be hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

The first compound (e.g., represented by Chemical Formula 1) may be represented by the following Chemical Formula 3. For example, the hole blocking layer may include a compound represented by the following Chemical Formula 3.

[Chemical Formula 3]

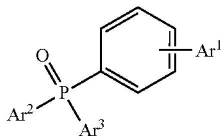

In Chemical Formula 3, $Ar^1$ to $Ar^3$ may be equal to or different from each other, and are independently hydrogen (H), fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C30 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group.

In an implementation, the first compound (e.g., represented by Chemical Formula 1) may be represented by one of the following Chemical Formula 1-1 to Chemical Formula 1-188.

(1-1)

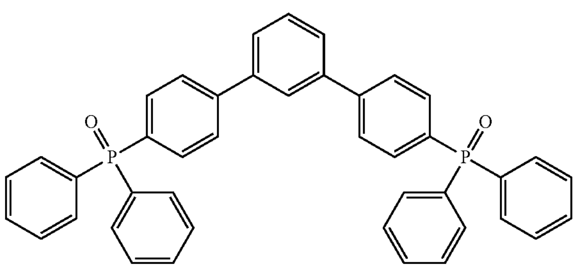

(1-2)

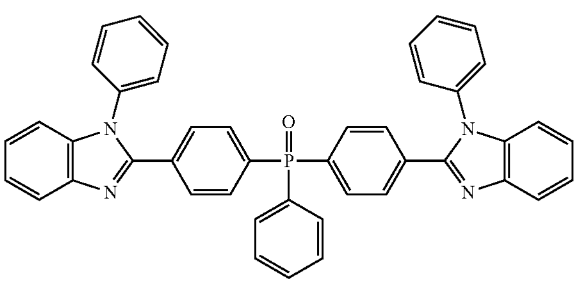

(1-3)

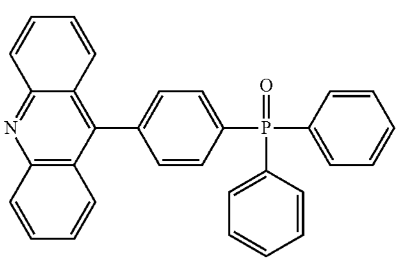

-continued (1-4)

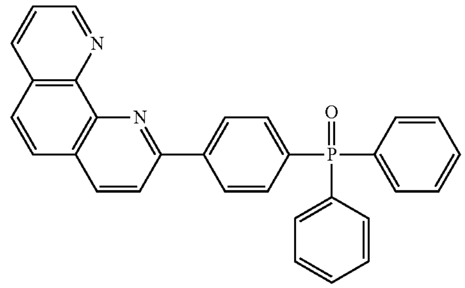

(1-5)

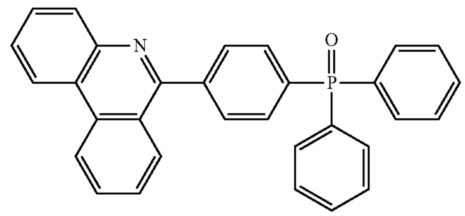

(1-6)

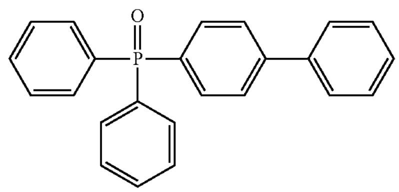

(1-7)

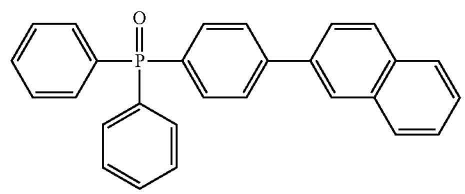

(1-8)

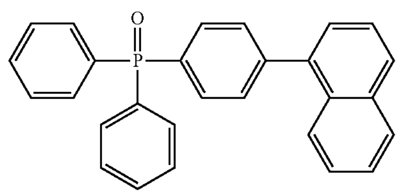

(1-9)

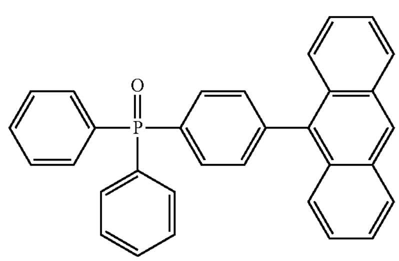

(1-10)

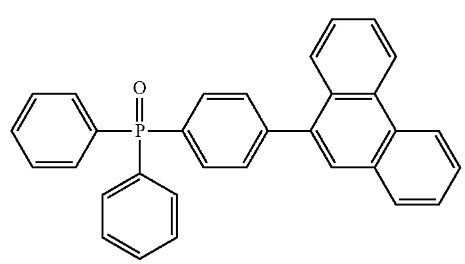

-continued
(1-11)
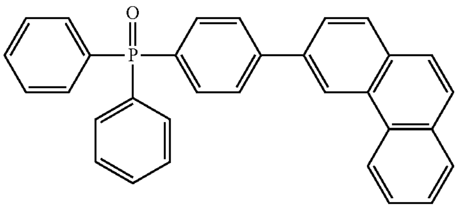
(1-12)
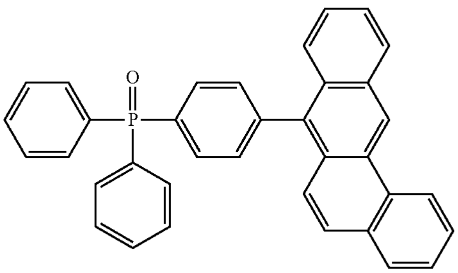
(1-13)
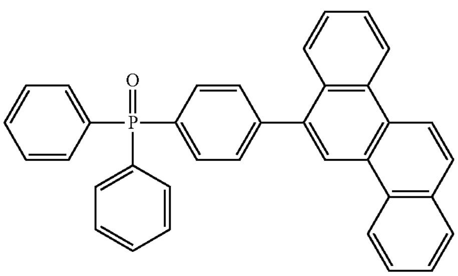
(1-14)
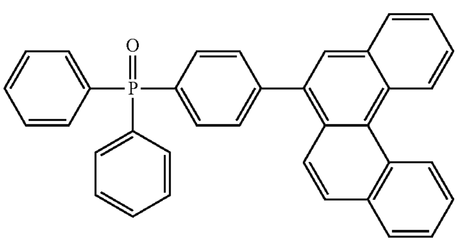
(1-15)
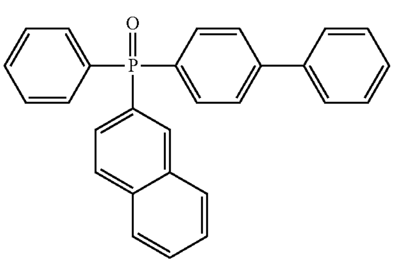
(1-16)
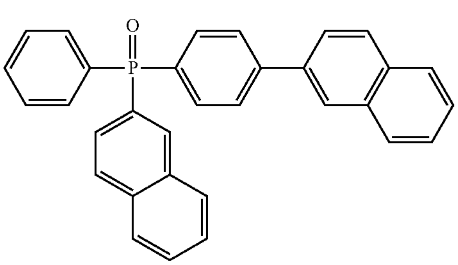
-continued
(1-17)
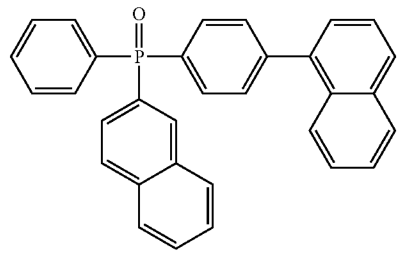
(1-18)
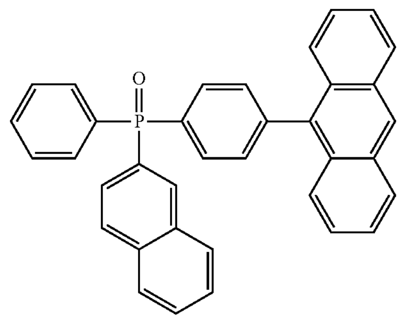
(1-19)
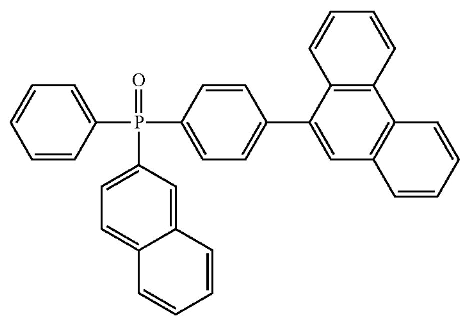
(1-20)
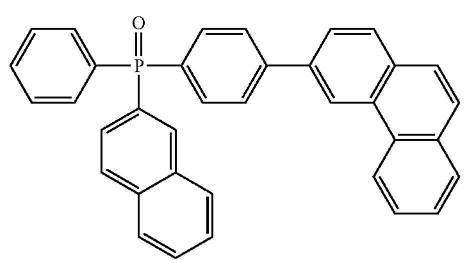
(1-21)
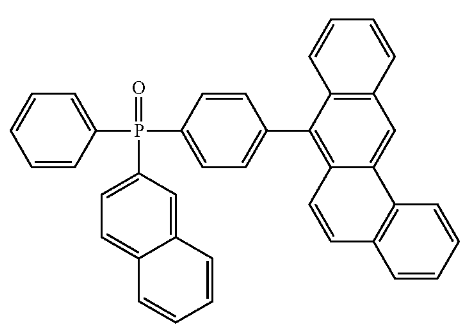

-continued
(1-22)
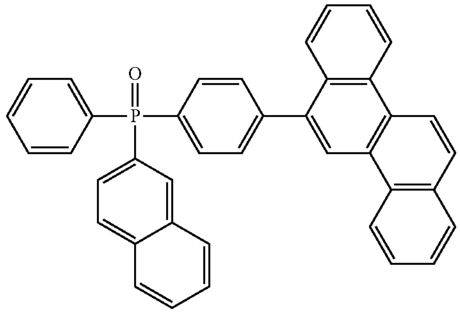
(1-23)
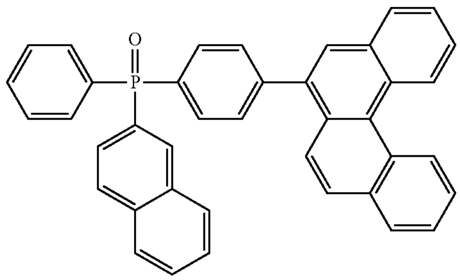
(1-24)
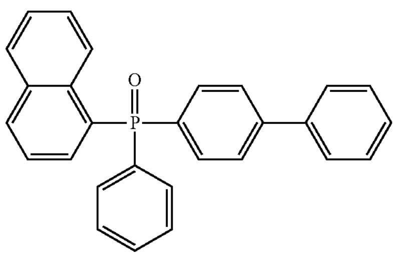
(1-25)
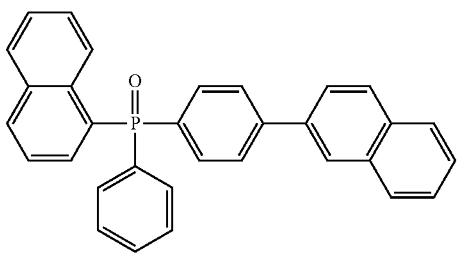
(1-26)
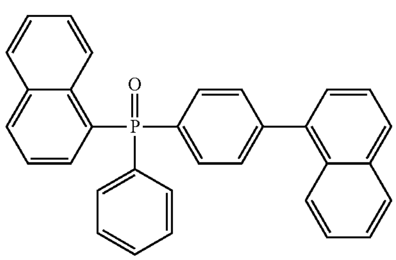
(1-27)
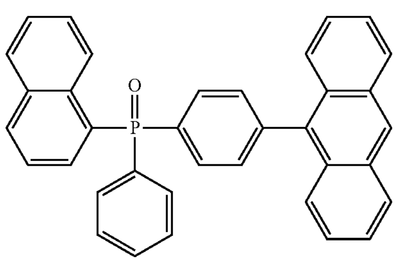
-continued
(1-28)
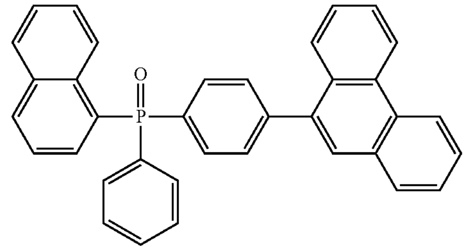
(1-29)
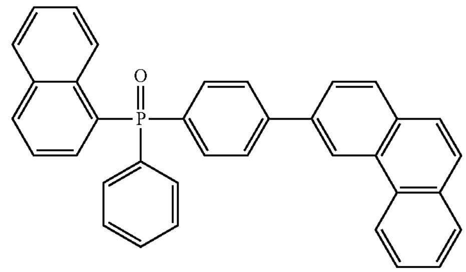
(1-30)
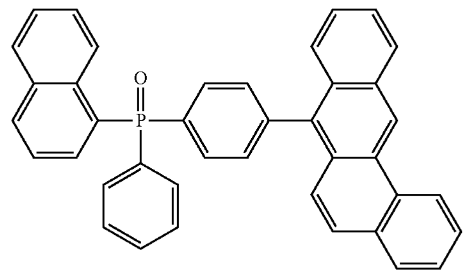
(1-31)
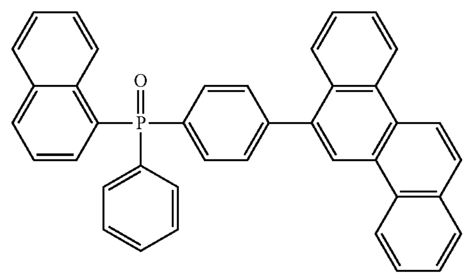
(1-32)
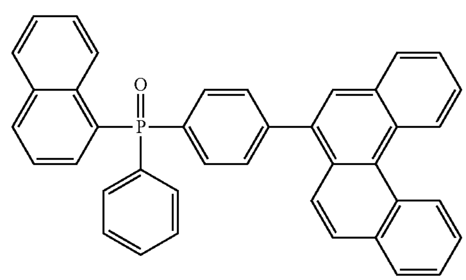
(1-33)
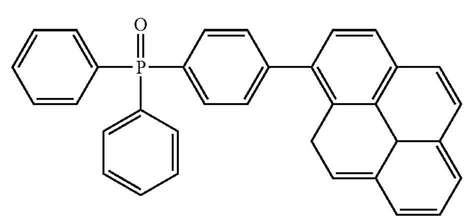

-continued
(1-34)
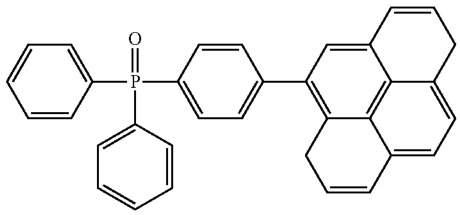
(1-35)
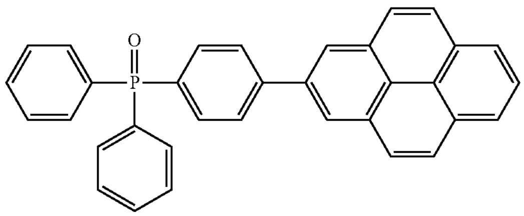
(1-36)
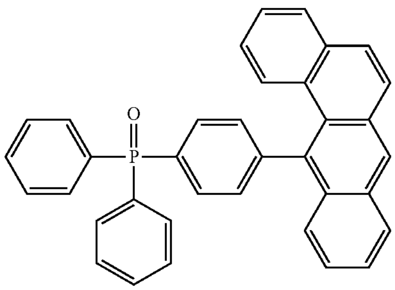
(1-37)
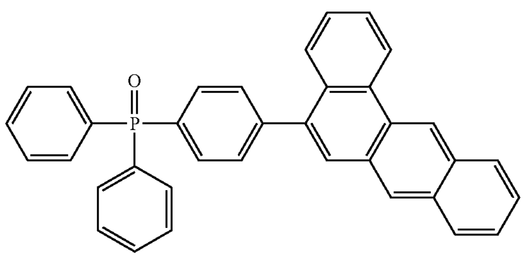
(1-38)
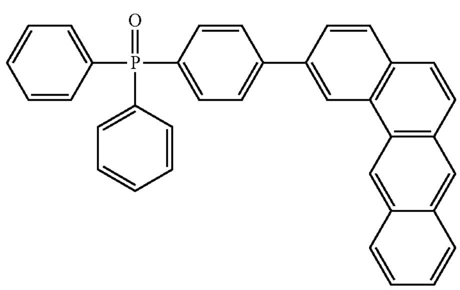
(1-39)
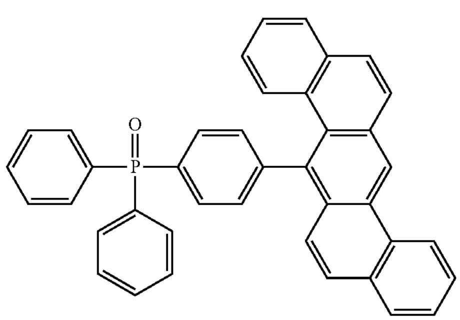
-continued
(1-40)
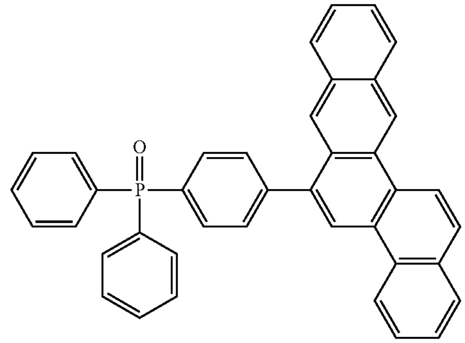
(1-41)
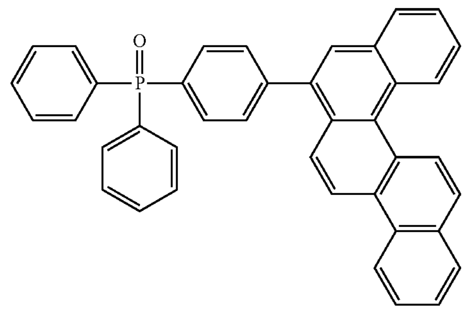
(1-42)
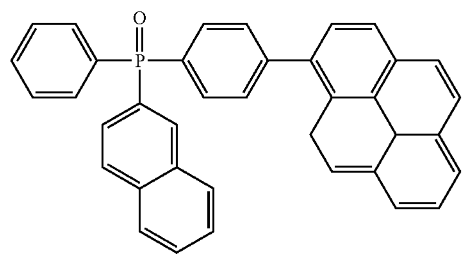
(1-43)
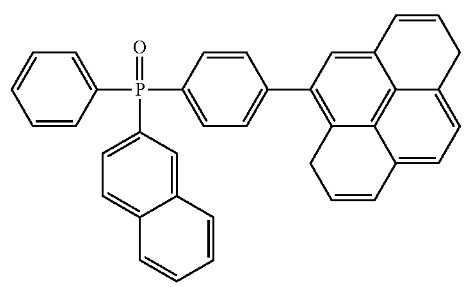
(1-44)
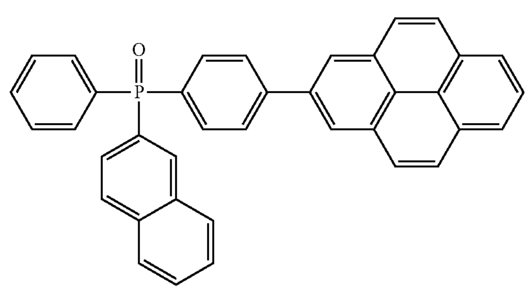

-continued
(1-45)
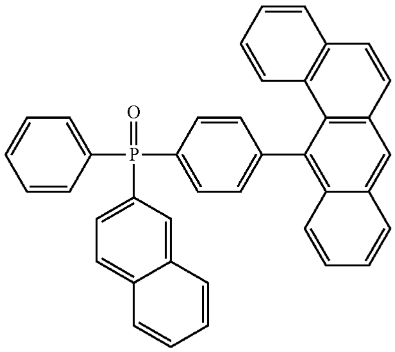
(1-46)
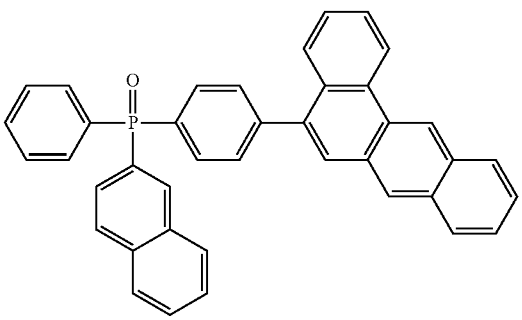
(1-47)
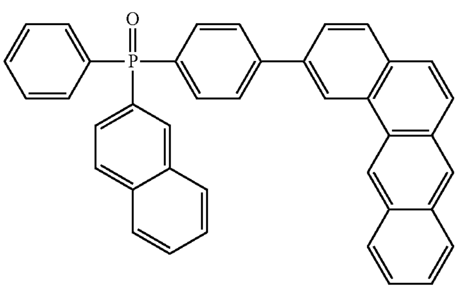
(1-48)
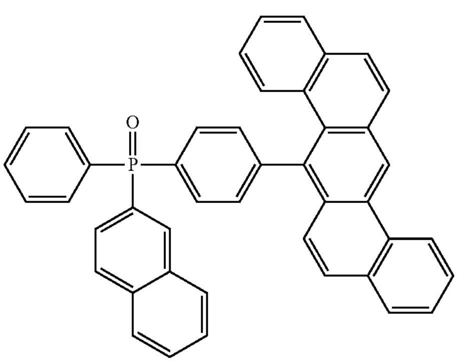
-continued
(1-49)
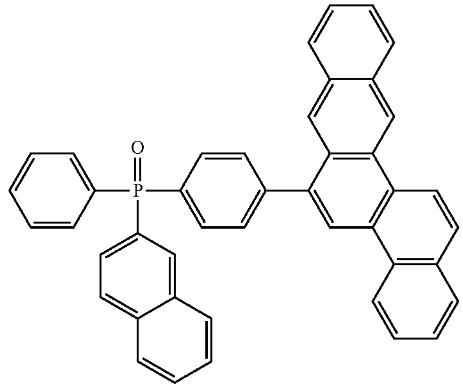
(1-50)
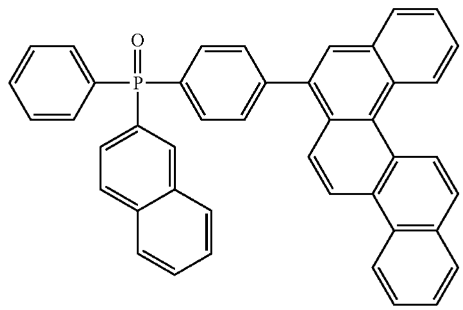
(1-51)
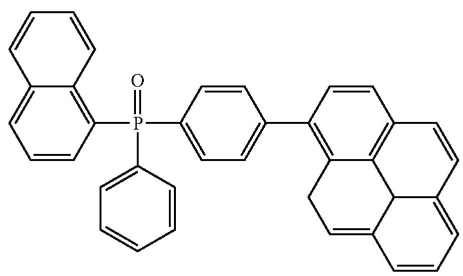
(1-52)
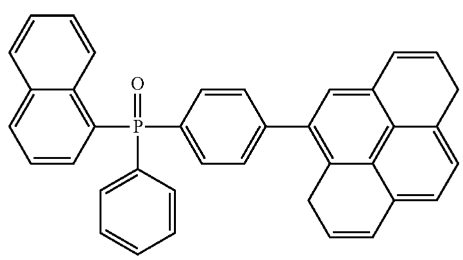
(1-53)
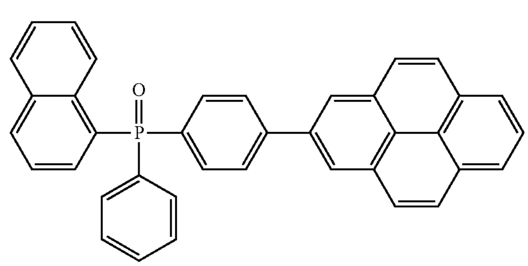

-continued
(1-54)
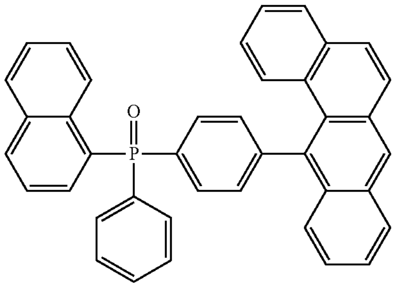
(1-55)
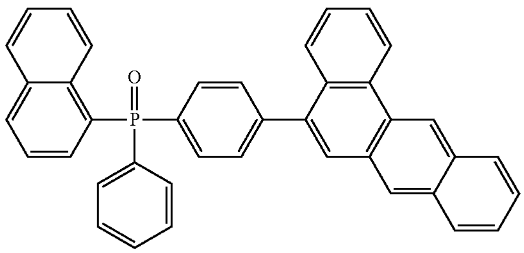
(1-56)
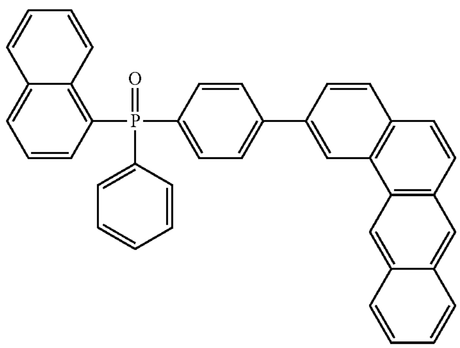
(1-57)
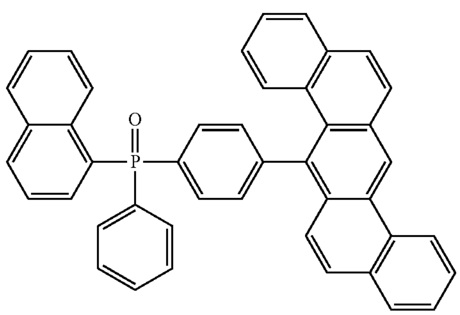
(1-58)
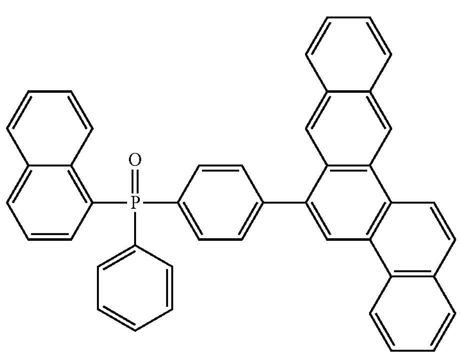
-continued
(1-59)
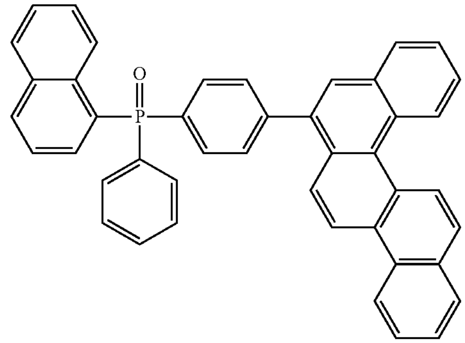
(1-60)
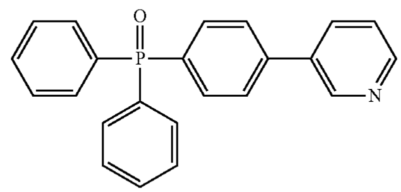
(1-61)
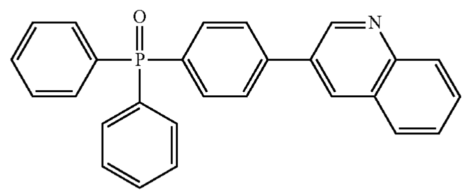
(1-62)
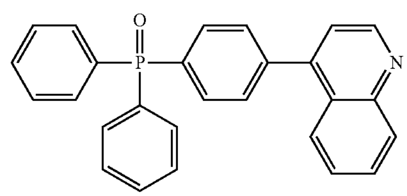
(1-63)
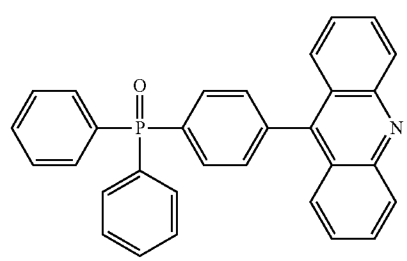
(1-64)
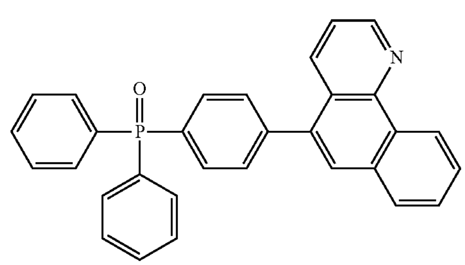

-continued
(1-65)
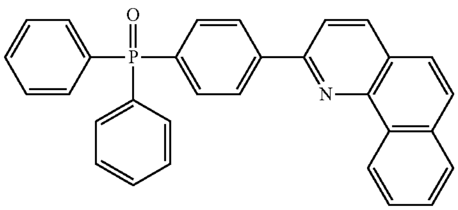
(1-66)
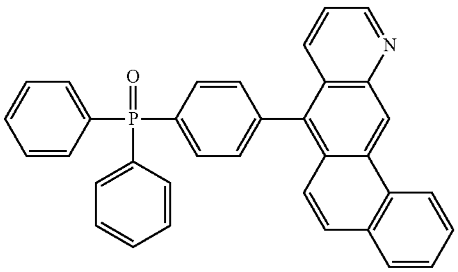
(1-67)
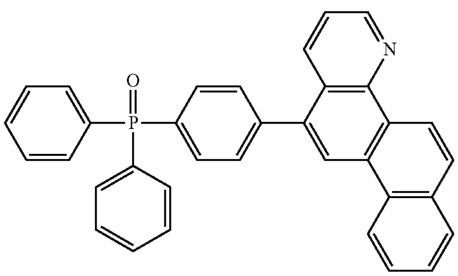
(1-68)
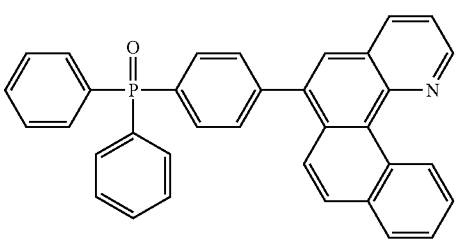
(1-69)
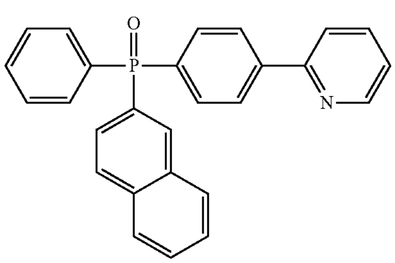
(1-70)
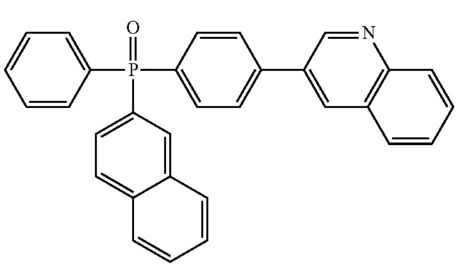
-continued
(1-71)
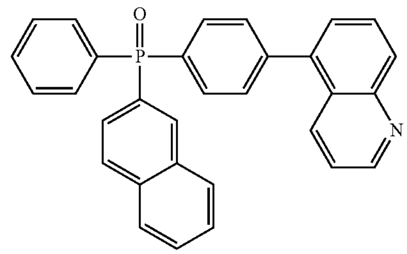
(1-72)
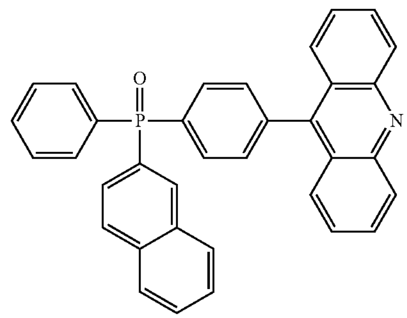
(1-73)
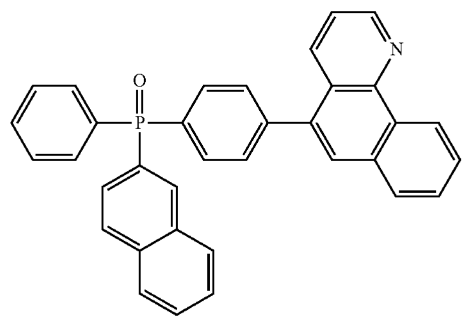
(1-74)
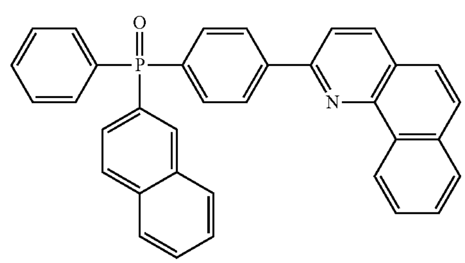
(1-75)
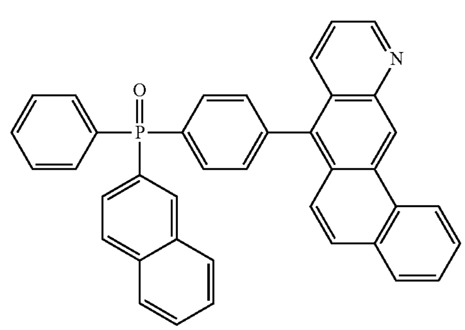

-continued
(1-76)
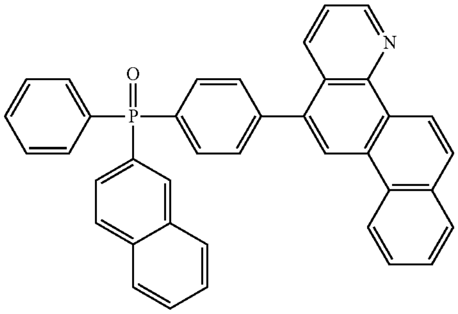
(1-77)
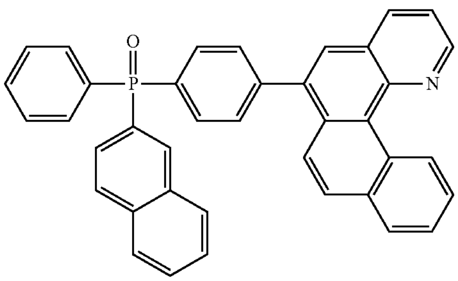
(1-78)
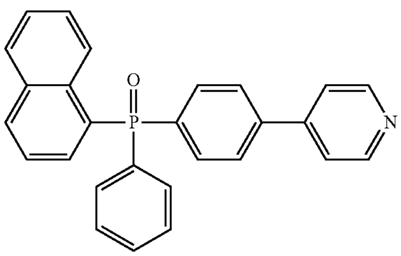
(1-79)
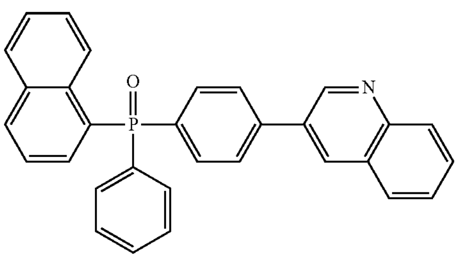
(1-80)
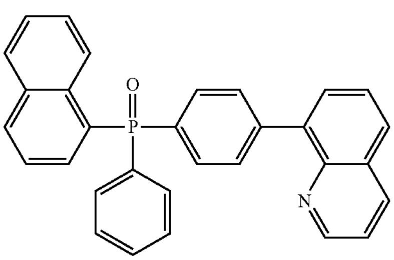
(1-81)
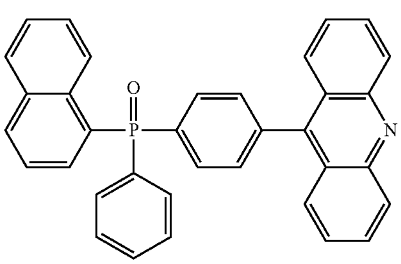
-continued
(1-82)
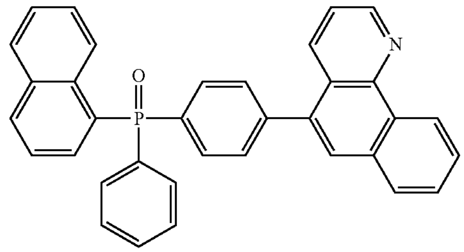
(1-83)
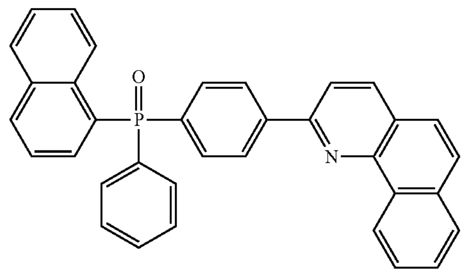
(1-84)
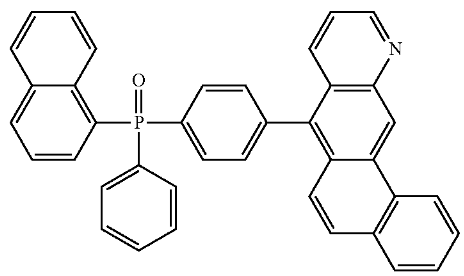
(1-85)
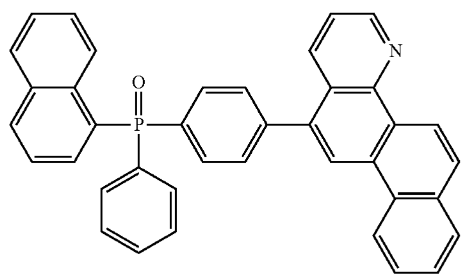
(1-86)
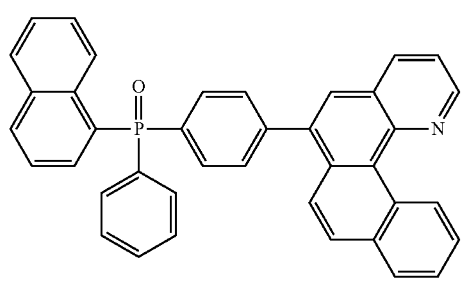
(1-87)
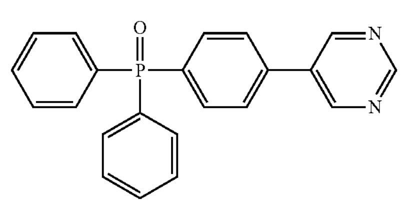

-continued
(1-88)
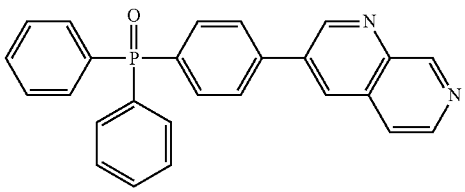
(1-89)
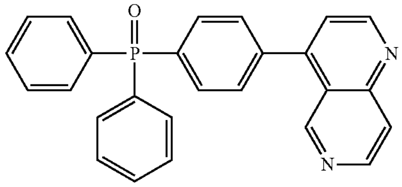
(1-90)
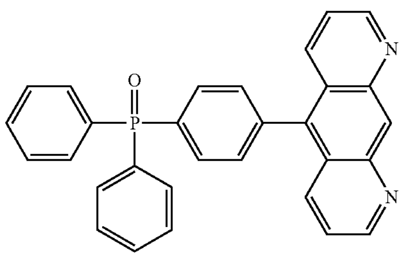
(1-91)
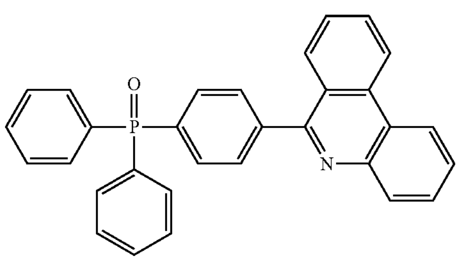
(1-92)
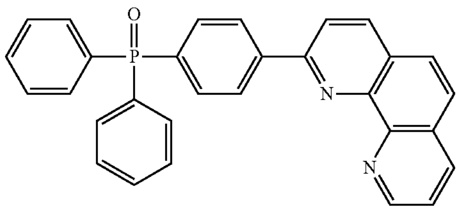
(1-93)
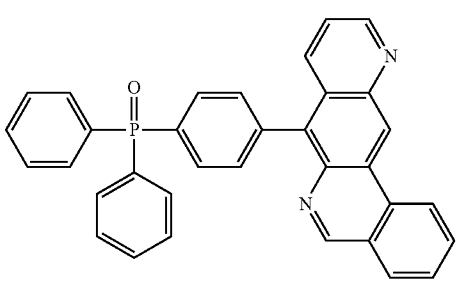
-continued
(1-94)
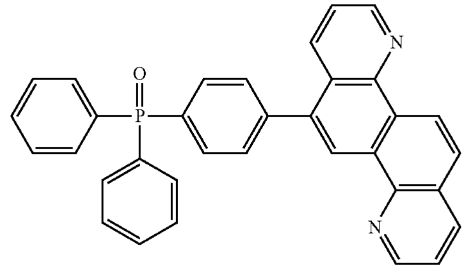
(1-95)
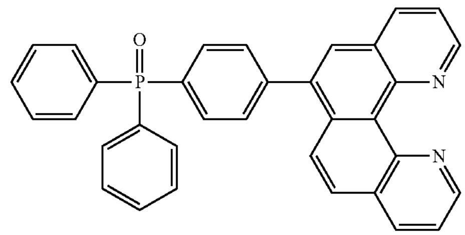
(1-96)
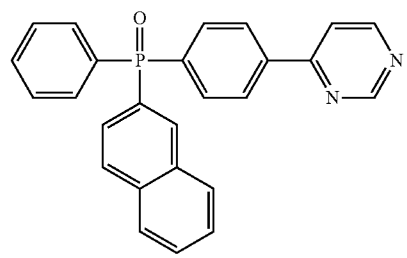
(1-97)
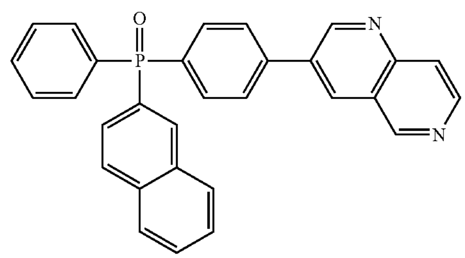
(1-98)
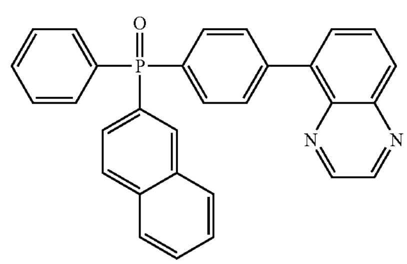
(1-99)
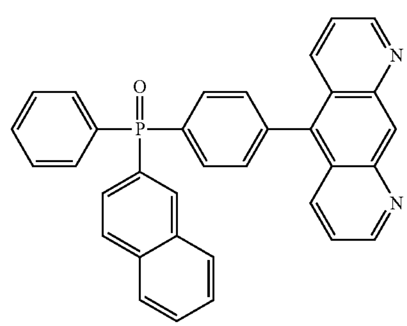

-continued
(1-100)
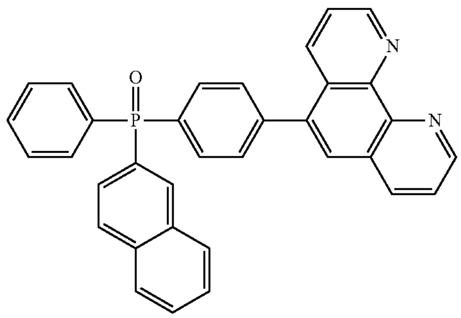
(1-101)
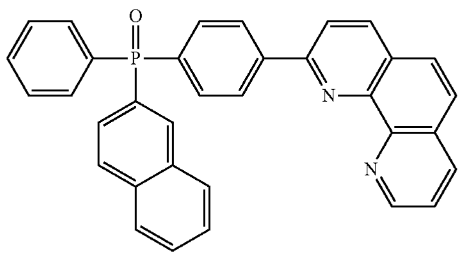
(1-102)
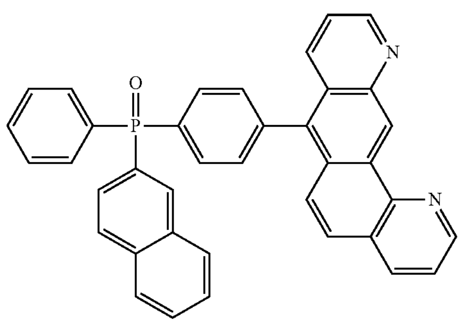
(1-103)
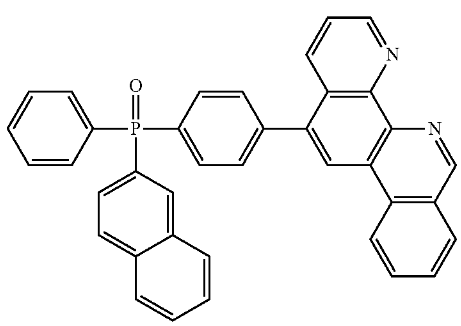
(1-104)
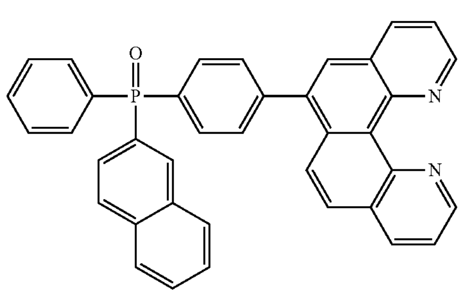
-continued
(1-105)
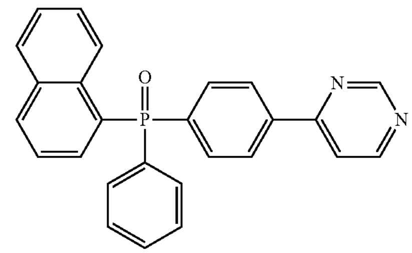
(1-106)
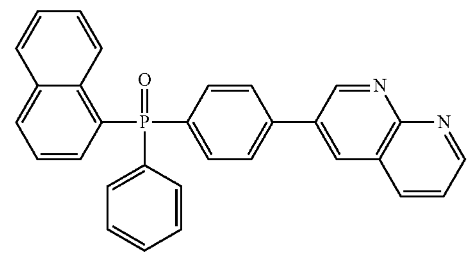
(1-107)
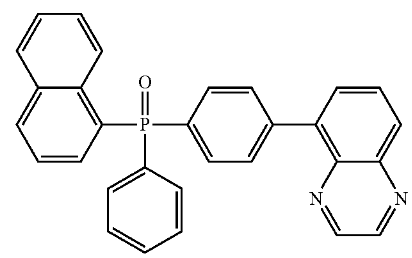
(1-108)
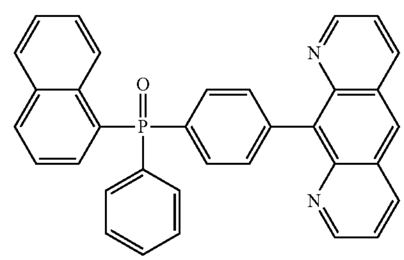
(1-109)
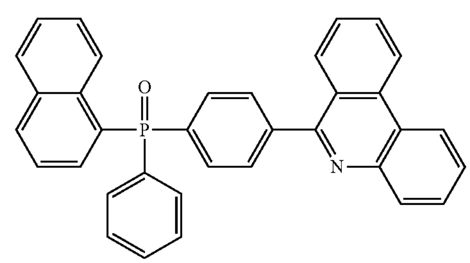
(1-110)
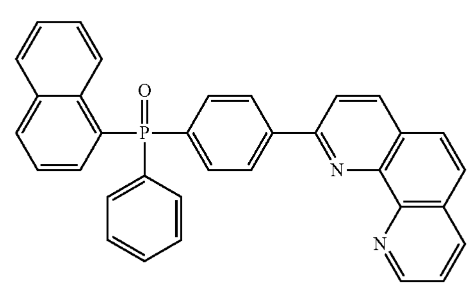

-continued
(1-111)
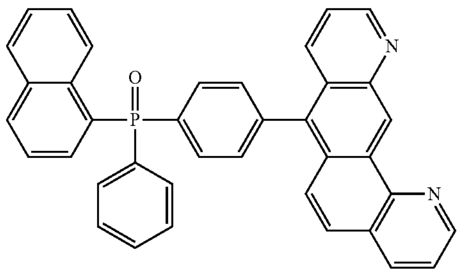
(1-112)
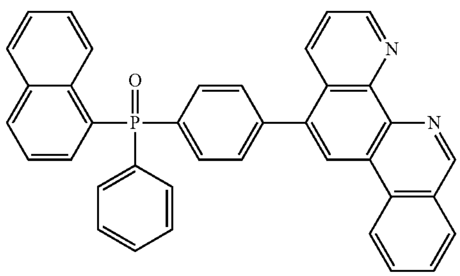
(1-113)
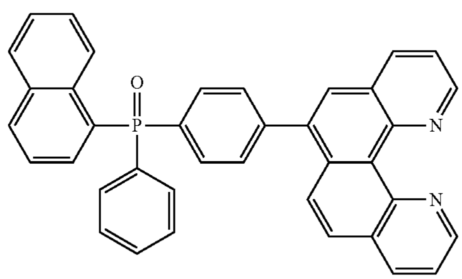
(1-114)
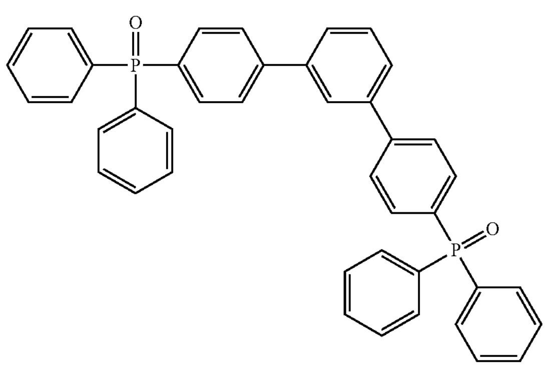
(1-115)
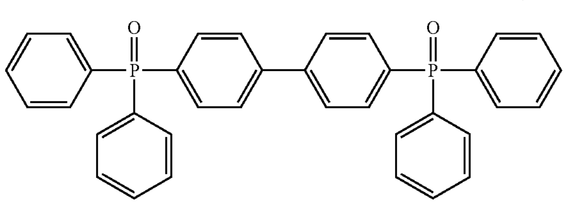
-continued
(1-116)
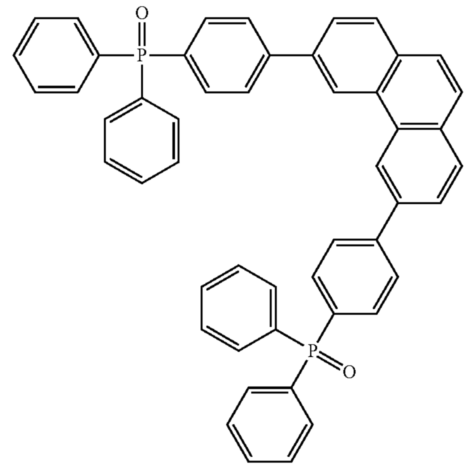
(1-117)
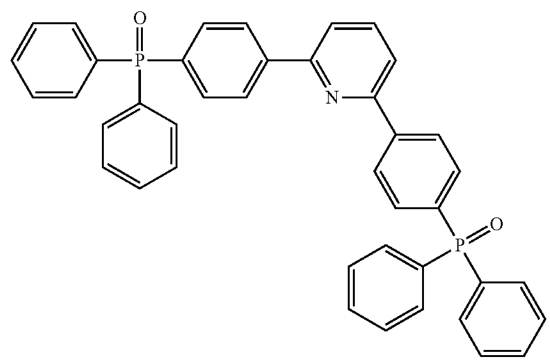
(1-118)
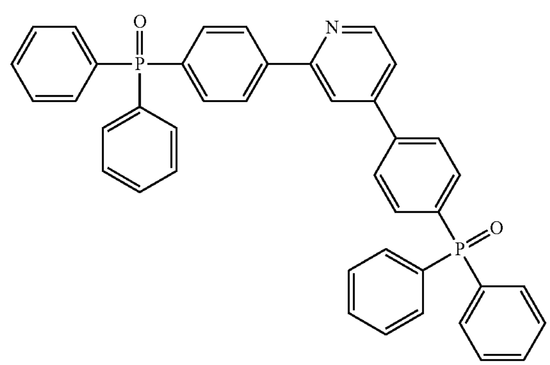
(1-119)
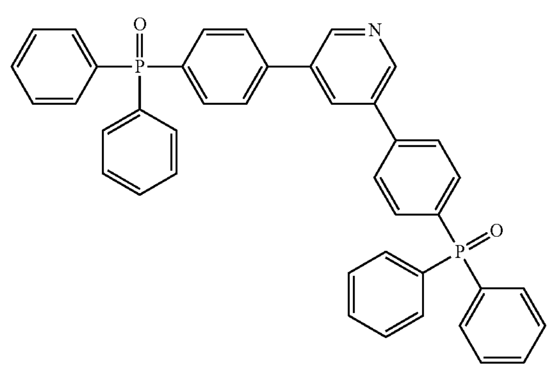

-continued
(1-120)
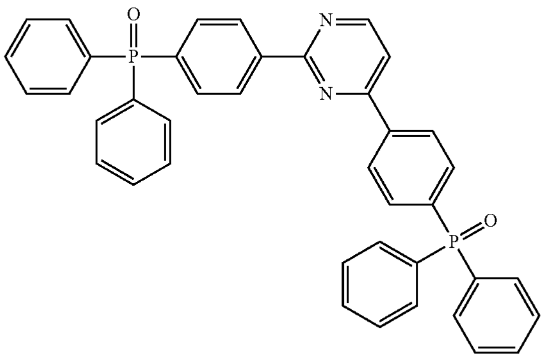
(1-121)
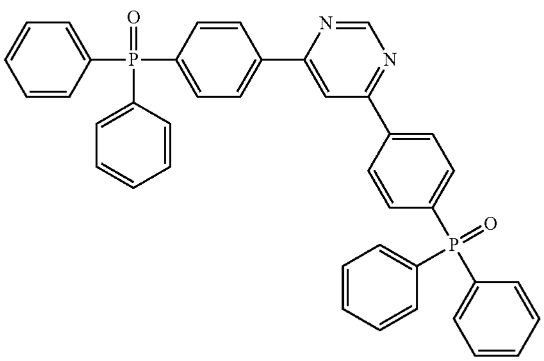
(1-122)
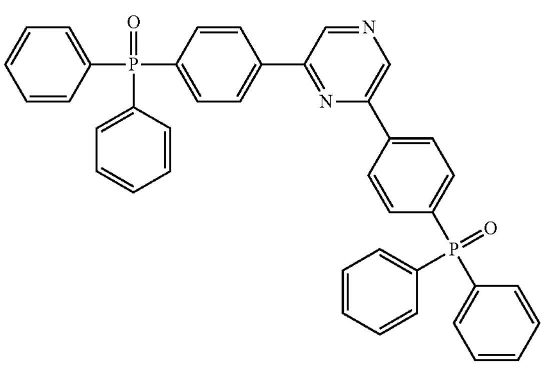
(1-123)
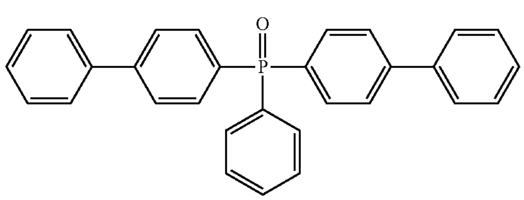
(1-124)
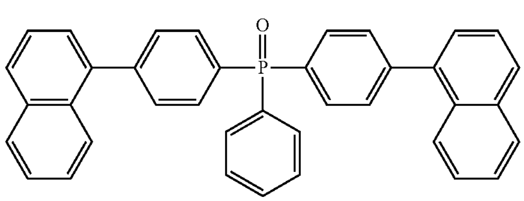
-continued
(1-125)
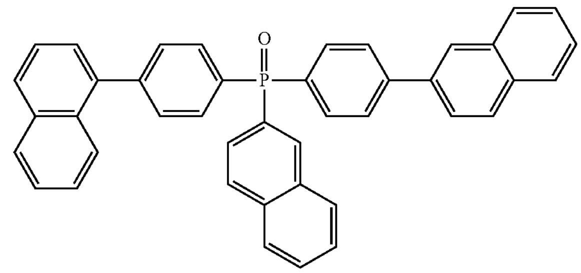
(1-126)
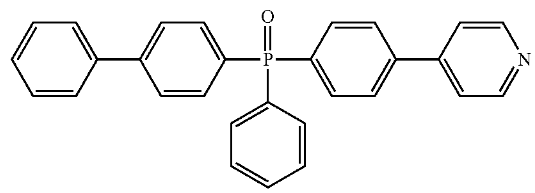
(1-127)
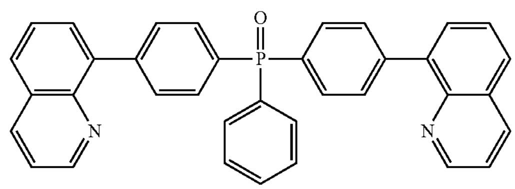
(1-128)
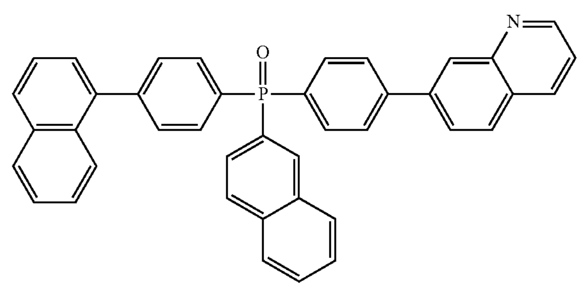
(1-129)
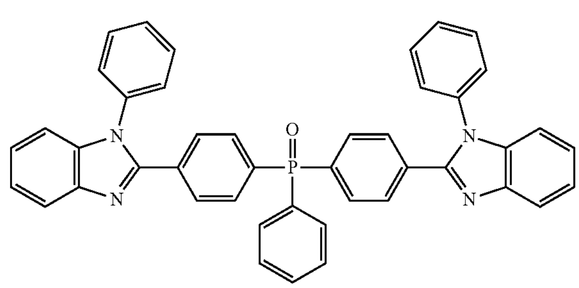
(1-130)
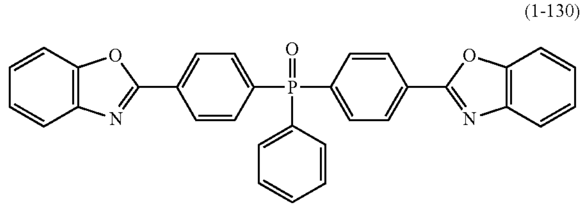

-continued
(1-131)
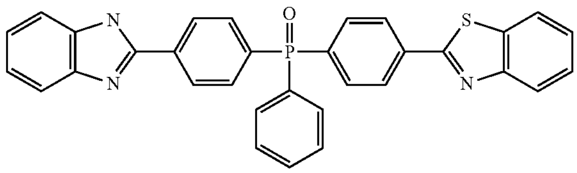
(1-132)
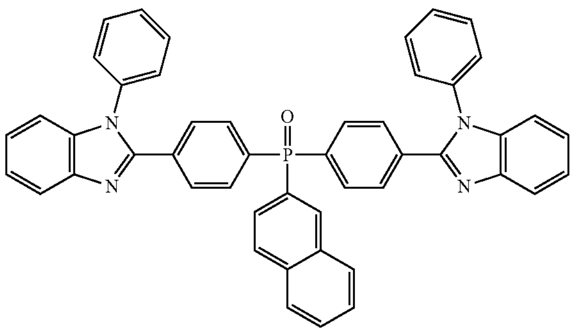
(1-133)
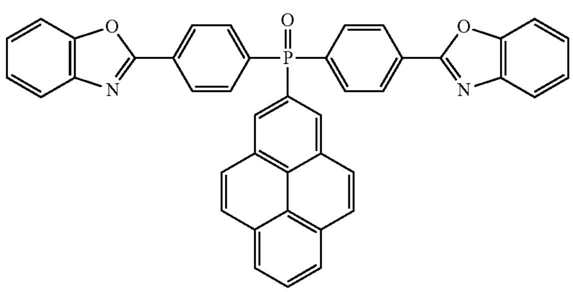
(1-134)
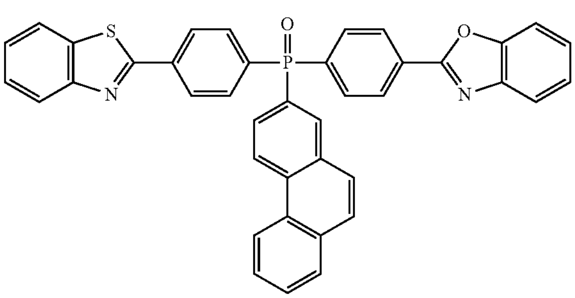
(1-135)
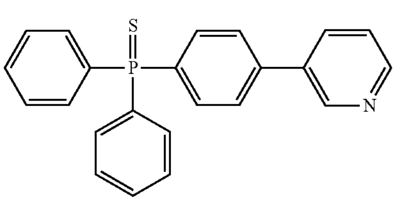
(1-136)
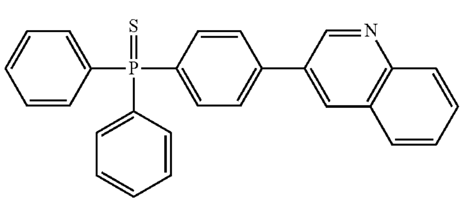
-continued
(1-137)
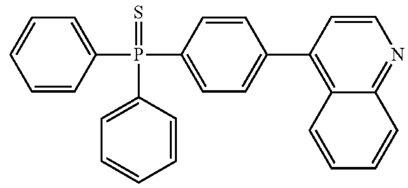
(1-138)
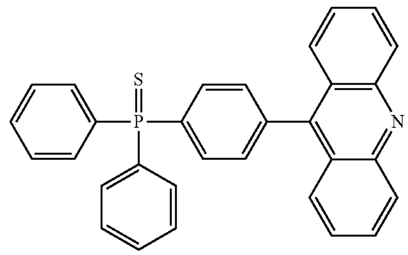
(1-139)
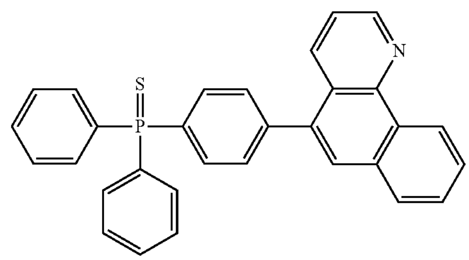
(1-140)
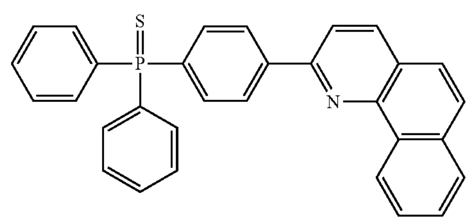
(1-141)
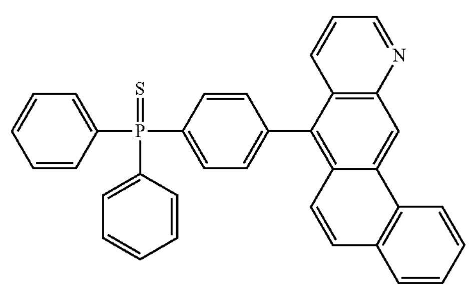
(1-142)
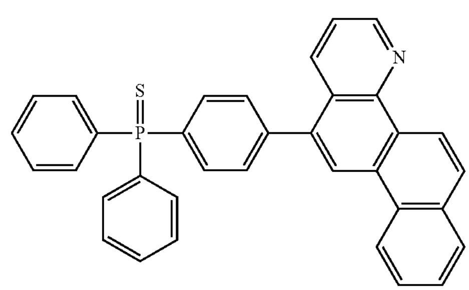

-continued
(1-143)
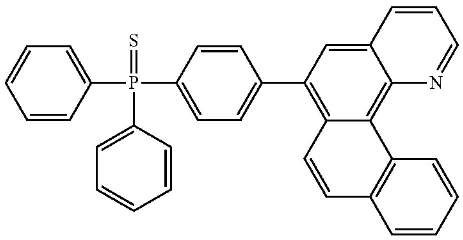
(1-144)
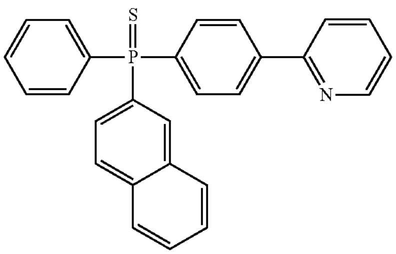
(1-145)
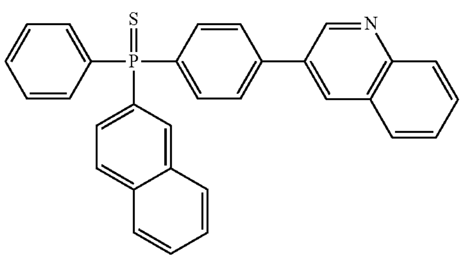
(1-146)
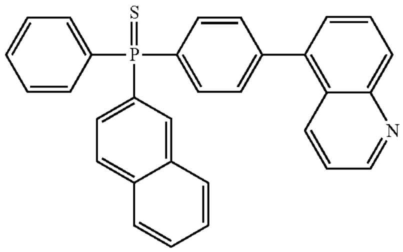
(1-147)
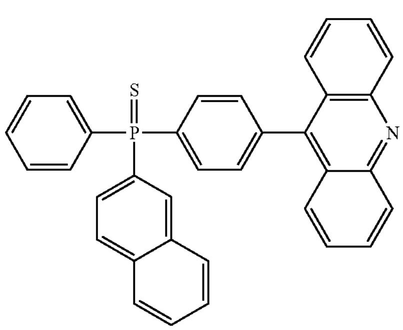
-continued
(1-148)
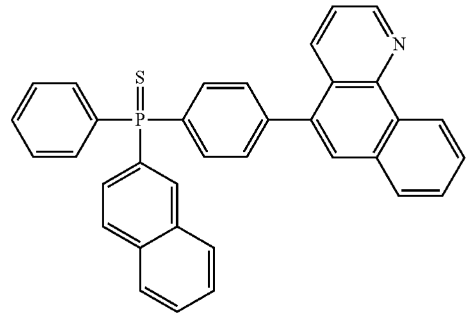
(1-149)
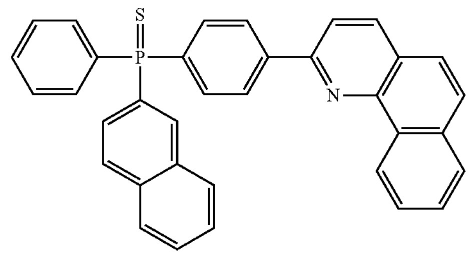
(1-150)
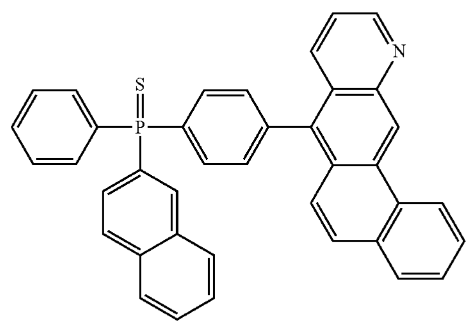
(1-151)
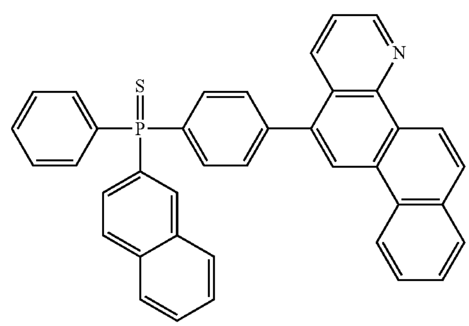
(1-152)
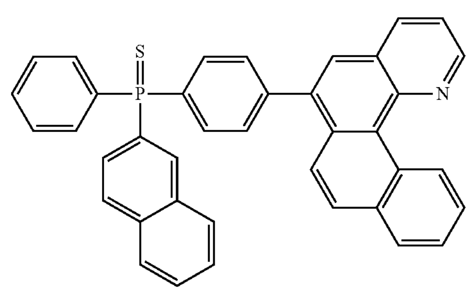

-continued
(1-153)
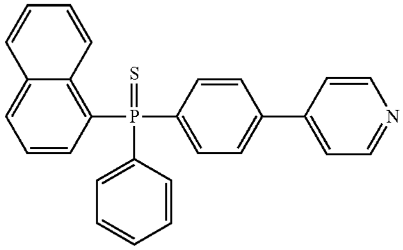
(1-154)
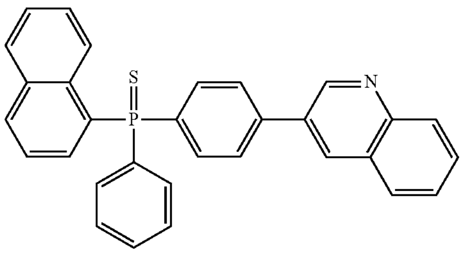
(1-155)
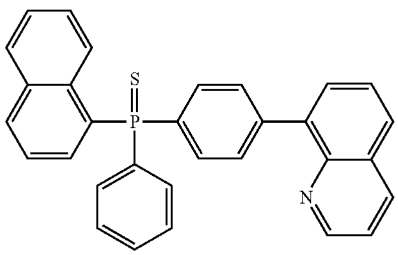
(1-156)
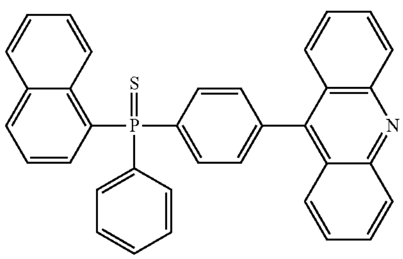
(1-157)
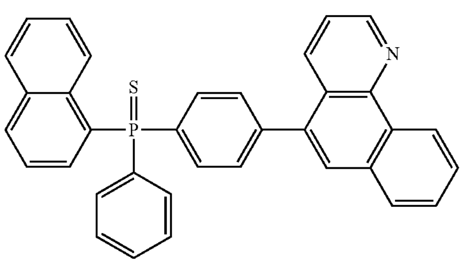
(1-158)
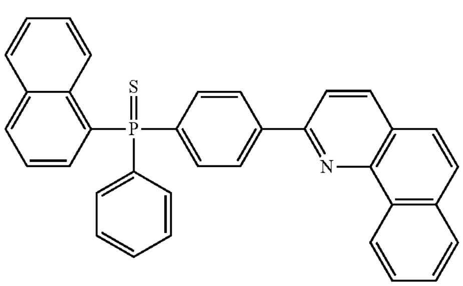
-continued
(1-159)
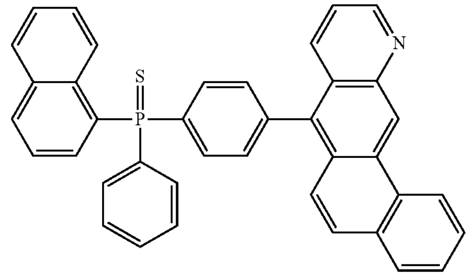
(1-160)
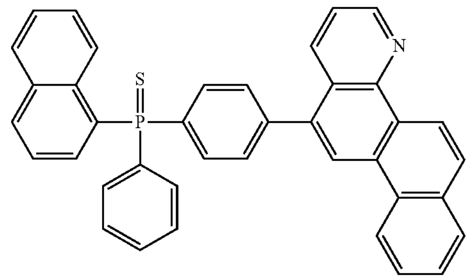
(1-161)
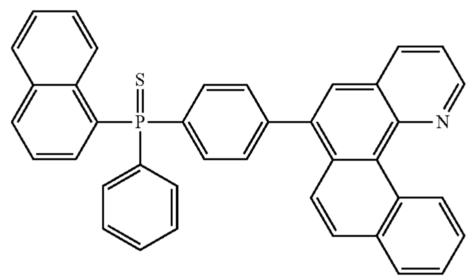
(1-162)
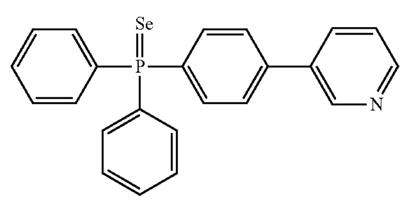
(1-163)
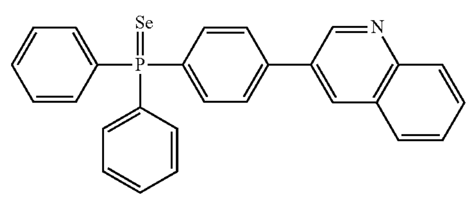
(1-164)
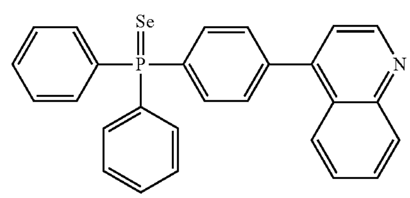

-continued
(1-165)
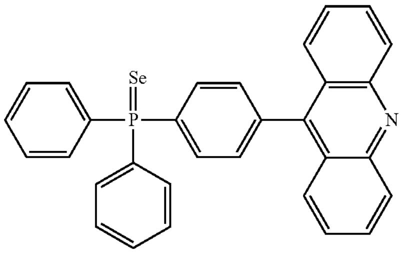
(1-166)
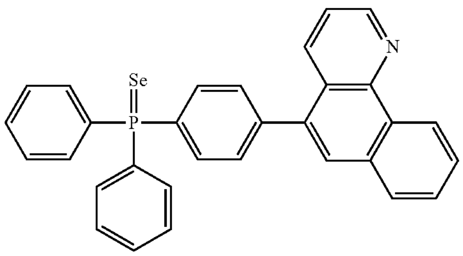
(1-167)
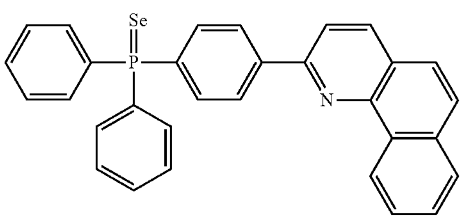
(1-168)
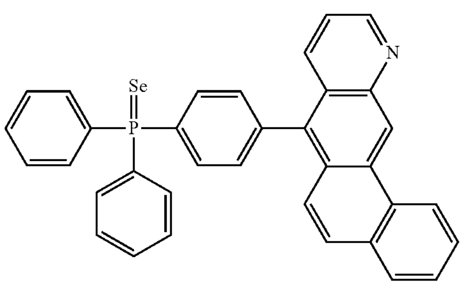
(1-169)
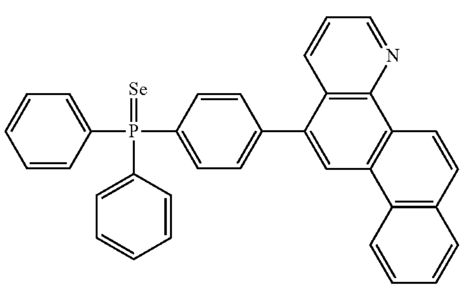
(1-170)
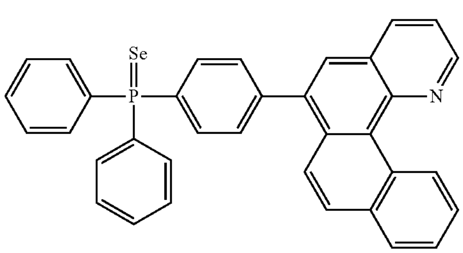
-continued
(1-171)
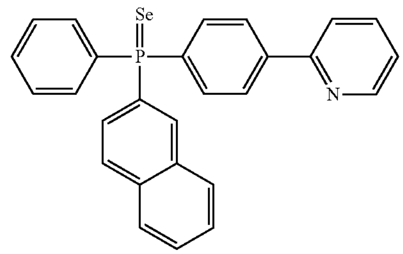
(1-172)
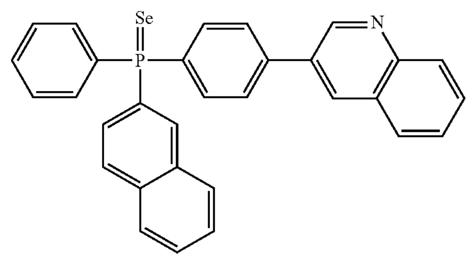
(1-173)
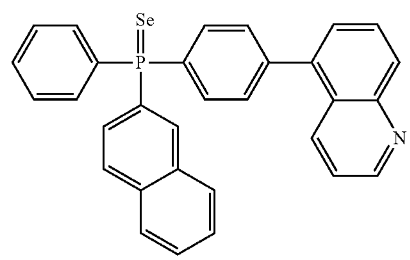
(1-174)
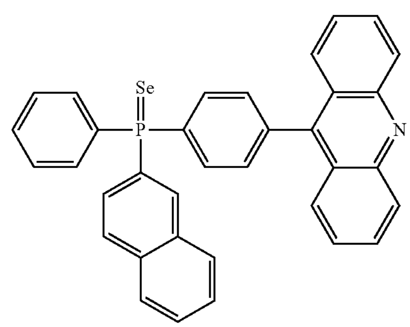
(1-175)
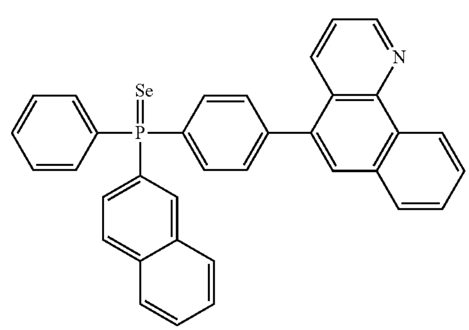

-continued
(1-176)
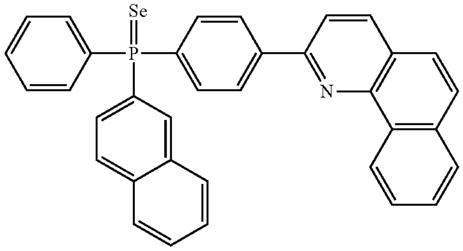
(1-177)
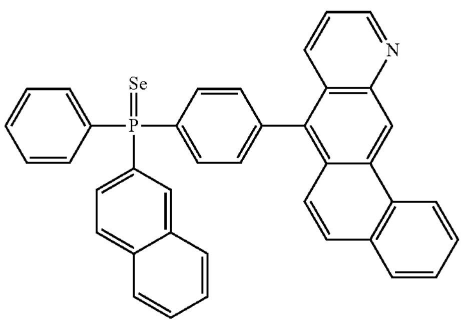
(1-178)
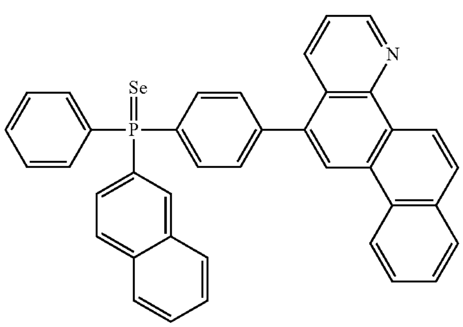
(1-179)
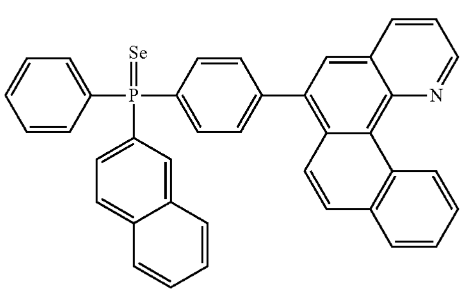
(1-180)
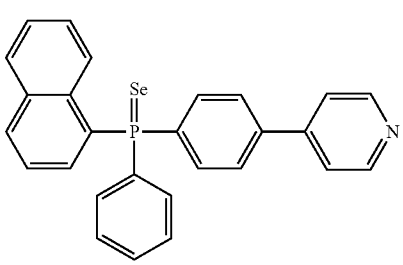
-continued
(1-181)
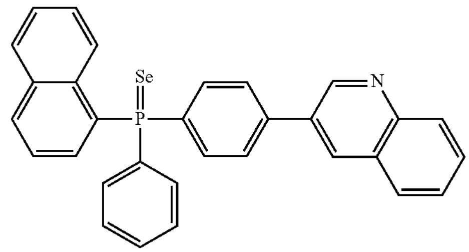
(1-182)
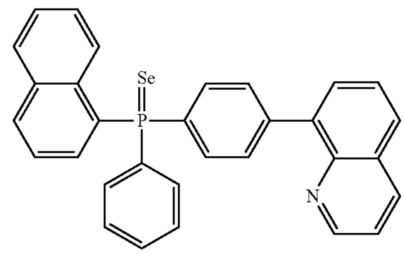
(1-183)
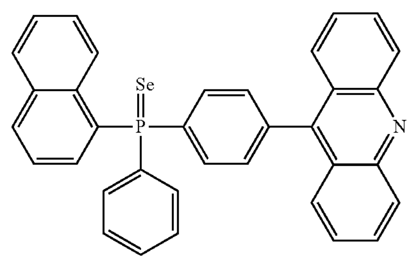
(1-184)
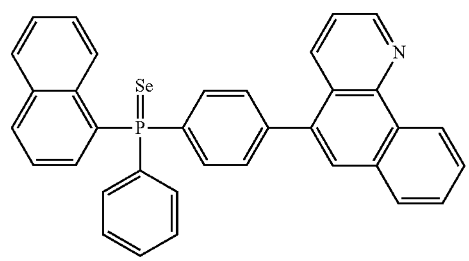
(1-185)
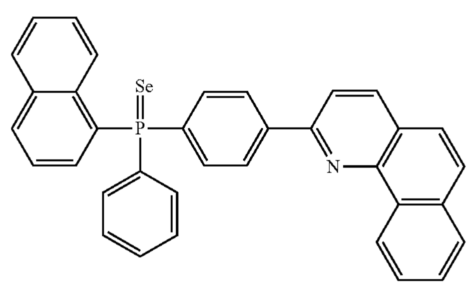
(1-186)
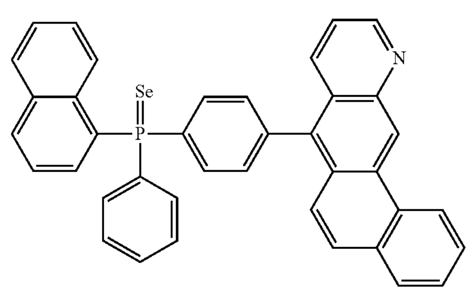

-continued (1-187)

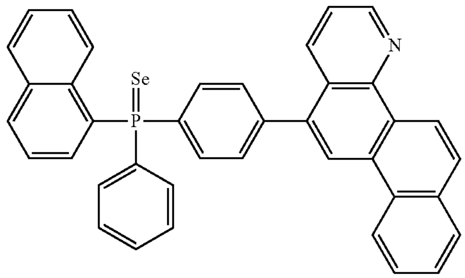

(1-188)

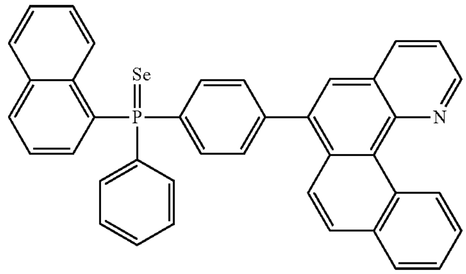

For example, the organic light emitting element according to the present embodiment may include one or more compounds represented by the following Chemical Formula 1-1 to Chemical Formula 1-188.

In the present exemplary embodiment, the emission layer 50 may be the same as the above-described emission layer. For example, a compound represented by Chemical Formula 2 may be included as a host in the emission layer 50. Repeated descriptions of similar constituent elements may be omitted.

In the present exemplary embodiment, as the electron transfer layer 40, a suitable material, e.g., a quinoline derivative, particularly, tris(8-hydroxyquinolinato)aluminum (Alq3), 3-(4-biphenyl)-4-phenyl-5-(4-tert-butylphenyl)-1,2,4-triazole (TAZ), (2-methyl-8-quninolinato)-4-phenylphenolate (Balq), bis(10-hydroxybenzo(h)quinolinato) beryllium (Bebq2), or 4,7-diphenyl-1-10-phenanthroline (BPhen), may be used. In an implementation, lithium quinolate (Liq) may be doped to the suitable material. In an implementation, a doping density may be 50 wt %.

The organic light emitting device according to an embodiment may have a structure of anode/hole injection layer/emission layer/cathode, anode/hole injection layer/hole transfer layer/emission layer/electron transfer layer/cathode, anode/hole injection layer/hole transfer layer/emission layer/electron transfer layer/electron injection layer/cathode, or anode/hole injection layer/hole transfer layer/electron blocking layer/emission layer/hole blocking layer/electron transfer layer/electron injection layer/cathode. In an implementation, the organic light emitting device may have a structure of anode/functional layer simultaneously having a hole injection function and a hole transfer function/emission layer/electron transfer layer/cathode, or anode/functional layer simultaneously having a hole injection function and a hole transfer function/emission layer/electron transfer layer/electron injection layer/cathode. In an implementation, the organic light emitting device may have a structure of anode/hole transfer layer/emission layer/functional layer simultaneously having electron injection and electron transfer functions/cathode, anode/hole injection layer/emission layer/functional layer simultaneously having electron injection and electron transfer functions/cathode, or anode/hole injection layer/hole transfer layer/emission layer/functional layer simultaneously having electron injection and electron transfer functions/cathode, but is not limited thereto.

In an implementation, the organic light emitting diode display may be realized as, e.g., a front-emission type of organic light emitting diode display, a bottom-emission type of organic light emitting diode display, or a dual-side emission type of organic light emitting diode display.

The organic light emitting diode display according to an exemplary embodiment may be provided in, e.g., a passive matrix organic light emitting display and active matrix organic light emitting display. When provided in the active matrix organic light emitting display, as a pixel electrode, the anode 10 may be electrically connected to a thin film transistor.

Figure 5:
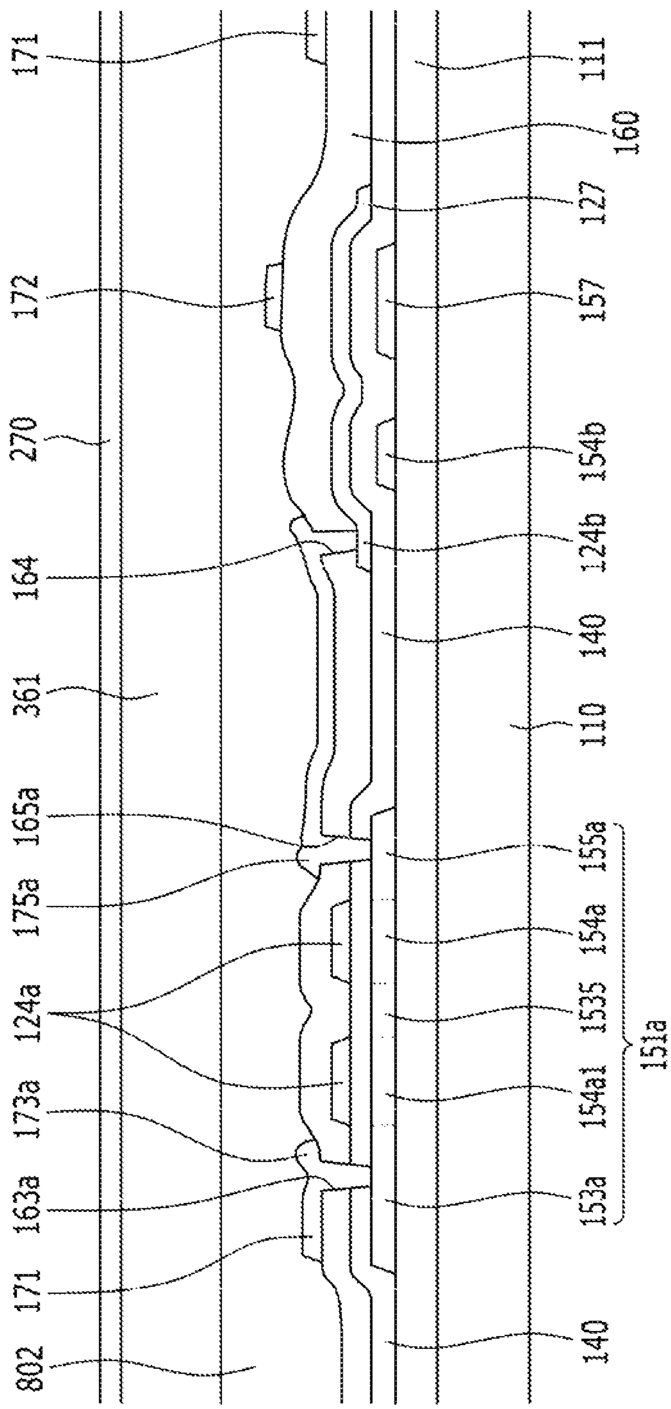
FIG. 5 illustrates a cross-sectional view of the organic light emitting device of FIG. 4, taken along the line V-V.
Figure 6:
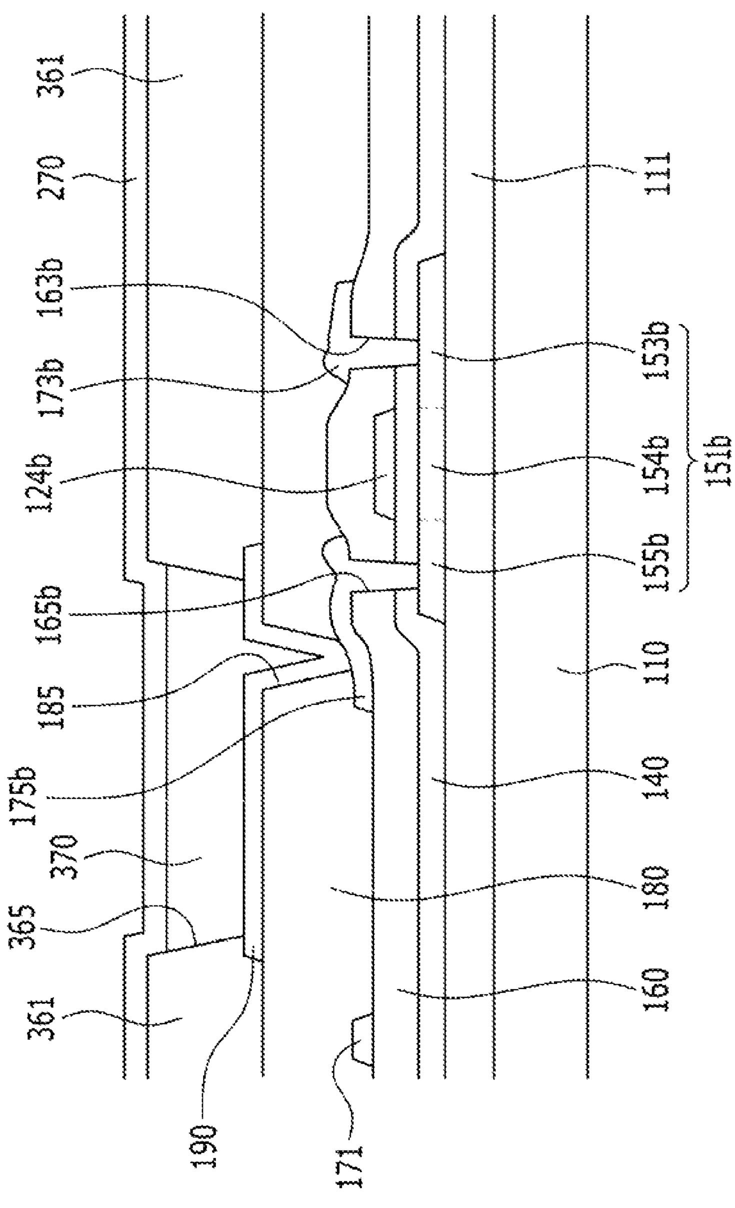
FIG. 6 illustrates a cross-sectional view of the organic light emitting device of FIG. 4, taken along the line VI-VI.

Hereinafter, an organic light emitting device including an organic light emitting element according to an exemplary embodiment will be described with reference to FIG. 4 to FIG. 6.

Figure 4:
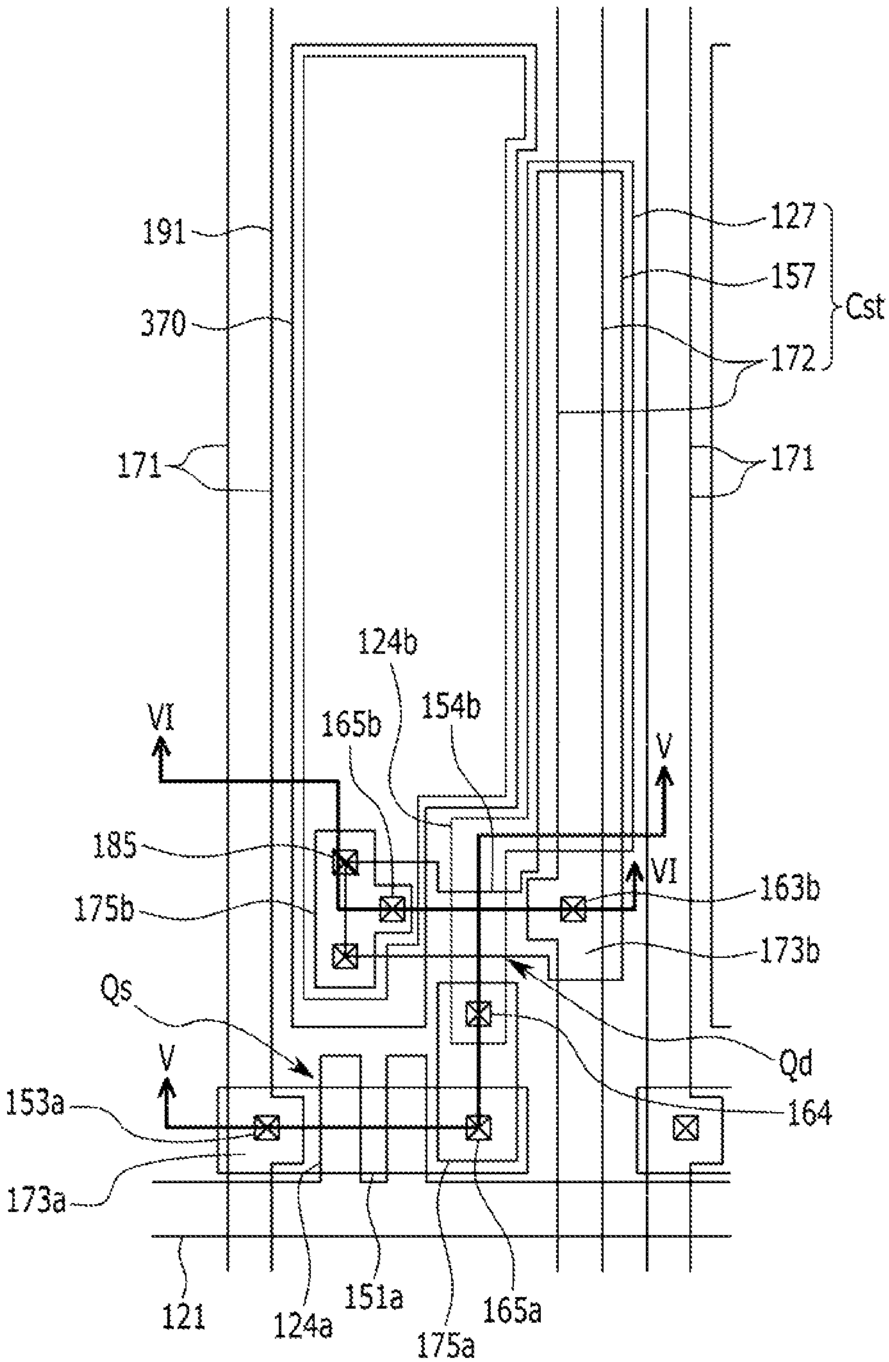
FIG. 4 illustrates a layout view of an organic light emitting device according to an exemplary embodiment.

FIG. 4 illustrates a layout view of an organic light emitting device according to an exemplary embodiment. FIG. 5 illustrates a cross-sectional view of the organic light emitting device of FIG. 4, taken along the line V-V. FIG. 6 illustrates a cross-sectional view of the organic light emitting device of FIG. 4, taken along the line VI-VI.

A blocking layer 111 made of a silicon oxide or a silicon nitride may be formed on a substrate 110 made of transparent glass or the like. The blocking layer 111 may have a dual-layer structure.

A plurality of pairs of first and second semiconductor islands 151*a* and 151*b* may be formed on the blocking layer 111. The first and second semiconductor islands 151*a* and 151*b* may be made of polysilicon or the like. Each of the semiconductor islands 151*a* and 151*b* may include a plurality of extrinsic regions including an n-type or p-type conductive impurity, and at least one intrinsic region that hardly includes a conductive impurity.

In the first semiconductor island 151*a*, the extrinsic region may include a first source region 153*a*, a first drain region 155*a*, and an intermediate region 1535, and they may be respectively doped with an n-type impurity and are separated from each other. The intrinsic region may include a pair of first channel regions 154*a*1 and 154*a*2 between the extrinsic regions 153*a*, 1535, and 155*a*.

In the second semiconductor island 151*b*, the extrinsic region may include a second source region 153*b* and a second drain region 155*b*, and they may be doped with a p-type impurity and are separated from each other. The intrinsic region may include a second channel region 154*b* between the second source region 153*b* and the second drain region 155*b* and a storage region 157 extended upwardly from the second drain region 153*b*.

The extrinsic region may further include a lightly-doped region (not shown) between the channel regions 154*a*1, 154*a*2, and 154*b* and the source and drain regions 153*a*, 155*a*, 153*b*, and 155*b*. Such a lightly-doped region may be replaced with an offset region that hardly includes an impurity.

In contrast, the extrinsic regions 153*a* and 155*a* of the first semiconductor island 151*a* may be doped with the p-type impurity, or the extrinsic regions 153*b* and 155*b* of the second semiconductor island 151*b* may be doped with the n-type impurity. The p-type conductive impurity may include boron (B), gallium (Ga), or the like, and the n-type conductive impurity may include phosphorus (P), arsenic (As), or the like.

A gate insulating layer 140 made of a silicon oxide or a silicon nitride may be formed on the semiconductor islands 151*a* and 151*b* and the blocking layer 111.

A plurality of gate lines 121 including a first control electrode 124*a* and a plurality of gate conductors including a plurality of second control electrodes 124*b* may be formed on the gate insulating layer 140.

The gate lines 121 may transmit a gate signal and may substantially extend in a horizontal direction. The first control electrode 124*a* may extend upwardly from the gate line 121 and crosses the first semiconductor island 151*a*. In this case, the first control electrode 124*a* may overlap the first channel regions 154*a*1 and 154*a*2. Each gate line 121 may include a wide end portion for connection with another layer or an external driving circuit. When a gate driving circuit generating the gate signal is integrated onto the substrate 110, the gate line 121 may be extended and thus may be directly connected with the gate driving circuit.

The second control electrode 124*b* may be separated from the gate line 121 and may overlap the second channel region 154*b* of the second semiconductor island 151*b*. The second control electrode 124*b* may form a storage electrode 127 by being extended, and the storage electrode 127 may overlap the storage region 157 of the second semiconductor island 151*b*.

The gate conductors 121 and 124*b* may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), or titanium (Ti). In an implementation, the gate conductors 121 and 124*b* may have a multilayered structure including at least two conductive layers having different physical properties. One of the conductive layers may be made of a metal having low resistivity, e.g., an aluminum-based metal, a silver-based metal, a copper-based metal, or the like, so as to reduce a signal delay or a voltage drop. In contrast, the other conductive layer may be made of another material, e.g. a material having an excellent contact characteristic with indium tin oxide (ITO) and indium zinc oxide (IZO), e.g., chromium (Cr), molybdenum (Mo), a molybdenum alloy, tantalum (Ta), titanium (Ti), or the like. An example of combination of the two conductive layers may include a chromium lower layer and an aluminum (alloy) upper layer, and an aluminum (alloy) lower layer and a molybdenum (alloy) upper layer. However, the gate conductors 121 and 124*b* may be made of various metals and conductors other than the above-stated metals and conductors.

Side surfaces of the gate conductors 121 and 124*b* may be inclined with an inclination angle of, e.g., about 30° to 80°.

An interlayer insulating film 160 may be formed on the gate conductors 121 and 124*b*. The interlayer insulating layer 160 may be made of an inorganic insulator such as a silicon nitride or a silicon oxide, an organic insulator, a low-dielectric insulator, and the like. A dielectric constant of the low-dielectric insulator may be 4.0 or less, and —Si:C:O, a-Si:O:F, or the like formed through plasma enhanced chemical vapor deposition (PECVD) may be examples of such a low-dielectric insulator. The interlayer insulating layer 160 may be formed of an organic insulator having photosensitivity, and the interlayer insulating layer 160 may have a flat surface.

A plurality of contact holes 164 exposing the second control electrode 124*b* may be formed in the interlayer insulating layer 160. In addition, a plurality of contact holes 163*a*, 163*b*, 165*a*, and 165*b* exposing the source and drain regions 153*a*, 153*b*, 155*a*, and 155*b* may be formed in the interlayer insulating layer 160.

Data lines 171, driving voltage lines 172, and a plurality of data conductors including first and second output electrodes 175*a* and 175*b* may be formed on the interlayer insulating layer 160.

The data lines 171 may transmit a data signal and may substantially extend along a vertical direction to cross the gate lines 121. Each data line 171 may include a plurality of first input electrodes 173*a* connected with the first source region 153*a* through the contact hole 163*a*, and may include a wide end portion for connection with another layer or an external driving circuit. When a data driving circuit generating the data signal is integrated onto the substrate 110, the data line 171 may be extended and then connected with the data driving circuit.

The driving voltage lines 172 may transmit a driving voltage and may substantially extend in a vertical direction to cross the gate line 121. Each of the driving voltage lines 172 may include a plurality of second input electrodes 173*b* connected with the second source region 153*b* through the contact hole 163*b*. The driving voltage lines 172 may overlap the storage electrode 127, and they may be connected with each other.

The first output electrode 175*a* may be separated from the data line 171 and the driving voltage line 172. The first output electrode 175*a* may be connected with the first drain region 155*a* through the contact hole 165*a*, and may be connected with the second control electrode 124*b* through the contact hole 164.

The second output electrode 175*b* may be separated from the data line 171, the driving voltage line 172, and the first output electrode 175*a*, and may be connected with the second drain region 155*b* through the contact hole 165*b*.

The data conductors 171, 172, 175*a*, and 175*b* may be made of a refractory material such as molybdenum, chromium, tantalum, titanium, or the like or an alloy thereof, and may have a multilayer structure formed of a conductive layer (not shown) such as a refractory metal or the like and a low-resistive material conductive layer (not shown). An example of the multilayered structure may include a double layer of a chromium or molybdenum (alloy) lower layer and an aluminum (alloy) upper layer, or a triple layer of a molybdenum (alloy) lower layer, an aluminum (alloy) middle layer, and a molybdenum (alloy) upper layer. In an implementation, the data conductors 171, 172, 175*a*, and 175*b* may be made of various metals and conductors other than the above-stated metals and conductors.

Like the gate conductors 121 and 121*b*, the data conductors 171, 172, 175*a*, and 175*b* may also have side surfaces that are inclined, e.g., at about 30° to 80° with respect to the substrate 110.

A passivation layer 180 may be formed on the data conductors 171, 172, 175*a*, and 175*b*. The passivation layer 180 may be made of an inorganic material, an organic material, a low dielectric constant insulating material, or the like.

A plurality of contact holes 185 exposing the second output electrode 175*b* may be formed in the passivation layer 180. A plurality of contact holes (not shown) exposing an end portion of the data line 171 may be formed in the passivation layer 180, and a plurality of contact holes (not shown) exposing an end portion of the gate line 121 may be formed in the passivation layer 180 and the interlayer insulating layer 160.

A plurality of pixel electrodes 190 may be formed on the passivation layer 180. Each pixel electrode 190 may be physically and electrically connected with the second output electrode 175*b* through the contact hole 185, and may be made of a transparent conductive material such as ITO or IZO or a reflective metal such as aluminum, silver, or an alloy thereof.

A plurality of contact assistants (not shown) or a plurality of connecting members (not shown) may be formed on the passivation layer 180, and they may be connected with the gate line 121 and an exposed end portion of the data line 171.

A partition 361 may be formed on the passivation layer 180. The partition 361 may define openings by surrounding a periphery of an edge of the pixel electrode 190 like a bank, and may be made of an organic insulator or an inorganic insulator. The partition 361 may be made of a photoresist including a black pigment, and in this case, the partition 361 may function as a light blocking member and may be formed through a simple process.

An organic emission layer 370 may be formed on the pixel electrode 190 and a common electrode 270 may be formed on the organic emission layer 370. In this way, an organic light emitting element including the pixel electrode 190, the organic emission layer 370, and the common electrode 270 may be formed.

The organic light emitting element may be the same as the above-described organic light emitting element. For example, the organic light emitting element may have a lamination structure including anode/emission layer/cathode, anode/hole transfer layer/emission layer/electron injection layer/cathode, anode/hole transfer layer/emission layer/hole blocking layer/electron transfer layer/cathode, or anode/hole transfer layer/emission layer/hole blocking layer/electron transfer layer/cathode.

In this case, the pixel electrode 190 may be an anode which is a hole injection electrode, and the common electrode 270 may become a cathode which is an electron injection electrode. In an implementation, according to a driving method of the organic light emitting device, the pixel electrode 190 may be a cathode and the common electrode 270 may be an anode. The hole and electron may be injected into the organic emission layer 370 from the pixel electrode 190 and the common electrode 270, respectively, and an exciton generated by coupling the injected hole and electron may fall from an excited state to a ground state to emit light.

The common electrode 270 may be formed on the organic emission layer 370. The common electrode 270 may receive a common voltage, and may be made of a reflective metal including calcium (Ca), barium (Ba), magnesium (Mg), aluminum (Al), silver (Ag), or the like, or a transparent conductive material such as ITO or IZO.

The emission layer, the hole blocking layer, and the electron injection layer may be the same as those described above. In an implementation, a second compound, e.g. a phenyl-substituted anthracene-based compound, may be included as a host of the emission layer, and a first compound, e.g., a phosphine-based compound, may be included in a hole blocking layer or an electron transfer layer.

In such an organic light emitting device, the first semiconductor island 151*a*, the first control electrode 124*a* connected to the gate line 121, and the first input electrode 173*a* and the first output electrode 175*a* connected to the data line 171 may form a switching thin film transistor Qs, and a channel of the switching thin film transistor Qs may be formed in channel regions 154*a*1 and 154*a*2 of the first semiconductor island 151*a*. The second semiconductor island 151*b*, the second control electrode 124*b* connected to the first output electrode 175*a*, the second input electrode 173*b* connected to the driving voltage line 172, and the second output electrode 175*b* connected to the pixel electrode 190 may form a driving thin film transistor Qd, and a channel of the driving thin film transistor Qd may be formed in the channel region 154*b* of the second semiconductor island 151*b*. The pixel electrode 190, the organic light emitting member 370, and the common electrode 270 may form an organic light emitting diode, and the pixel electrode 190 may become an anode and the common electrode 270 may become a cathode, or the pixel electrode 190 may become a cathode and the common electrode 270 may become an anode. The storage electrode 127, the driving voltage line 172, and the storage region 157 that overlap each other may form a storage capacitor Cst.

The switching thin film transistor Qs may transmit a data signal of the data line 171 in response to a gate signal of the gate line 121. When receiving the data signal, the driving thin film transistor Qd may flow a current that depends on a voltage difference between the second control electrode 124*b* and the second input electrode 173*b*. The voltage difference between the second control electrode 124*b* and the second input electrode 173*b* may be charged to the storage capacitor Cst and then maintained even after the switching thin film transistor Qs is turned off. The organic light emitting diode may display an image by emitting light of which the strength varies depending on a current of the driving thin film transistor Qd.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples 1-1 to 1-17

An indium tin oxide (ITO) transparent electrode was formed with a thickness of 120 nm on a glass substrate. After that, the glass substrate was cleaned using ultrasonic waves, and a pretreatment process (i.e., UV-$O_3$ treatment, heat treatment) was performed.

A compound represented by Chemical Formula 5 was deposited with a thickness of 50 nm, as a hole injection layer on a pre-treated anode, and then a compound represented by Chemical Formula 6 was deposited with a thickness of 45 nm as a hole transfer layer thereon. Then, a compound of Chemical Formula 4, which is a doping material, was simultaneously deposited at a concentration of 5 wt % to a compound of Chemical Formula 2-1, which is a host material, such that an emission layer having a thickness of 30 nm was formed.

Next, as an electron transfer layer, a compound of Chemical Formula 1-1 was deposited with a thickness of 25 nm on the emission layer. Then, as a cathode, lithium fluoride was deposited with a thickness of 0.5 nm and then aluminum was deposited with a thickness of 150 nm such that an organic light emitting element was manufactured.

[Chemical Formula 5]

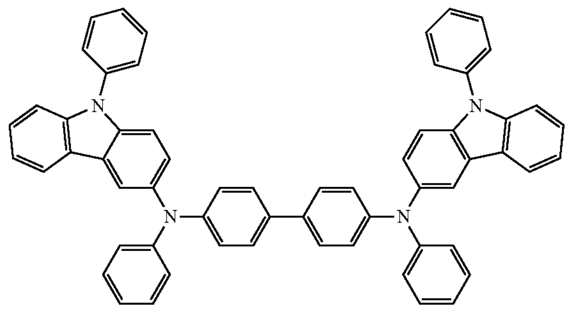

[Chemical Formula 6]

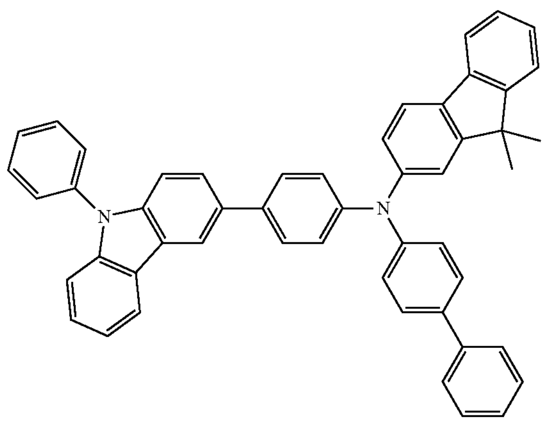

[Chemical Formula 1-1]

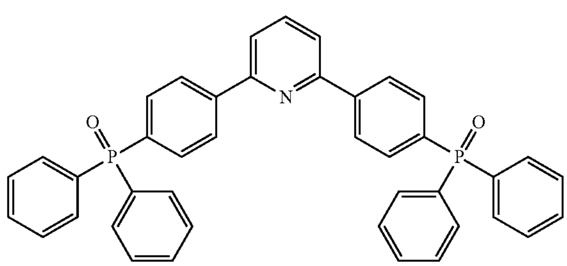

[Chemical Formula 2-1]

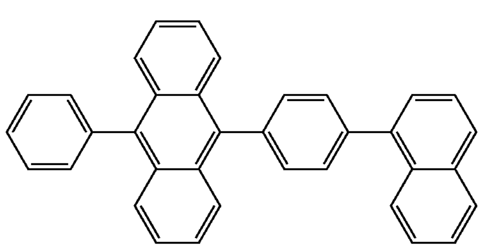

-continued

[Chemical Formula 4]

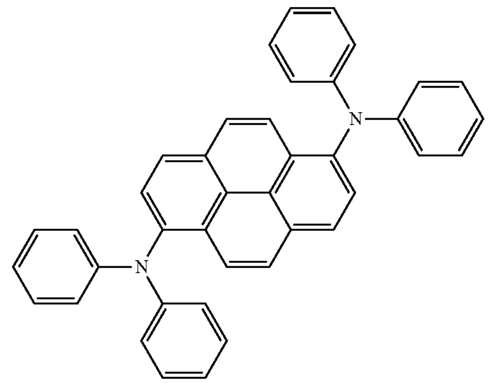

With respect to the manufactured organic light emitting element, element performance (i.e., current efficiency, Cd/A) was measured when driving with a current density of 10 mA/cm$^2$, and time (i.e., life span) until luminance was decreased to 80% from initial luminance at a current density of 50 mA/cm$^2$ was respectively measured.

For additional Examples, the host compound of the emission layer was selected from among the compounds of Chemical Formula 2-1 to Chemical Formula 2-9, and a compound of the electron transfer layer was selected from among the compounds of Chemical Formula 1-1 to Chemical Formula 1-5. Then, element performance and life span were measured under the same conditions.

[Chemical Formula 1-1 to Chemical Formula 1-5]

(1-1)

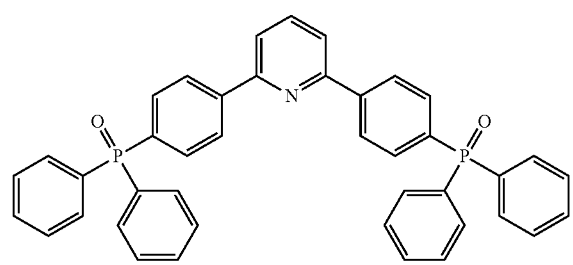

(1-2)

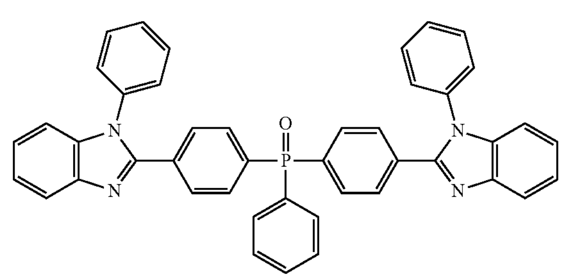

-continued
(1-3)
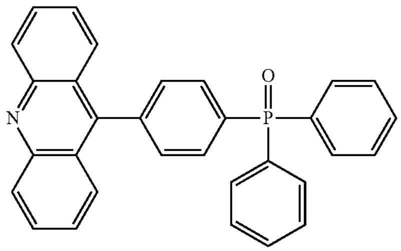
(1-4)
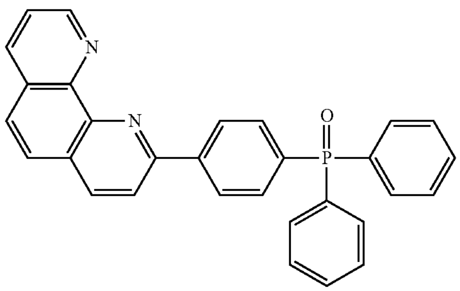
(1-5)
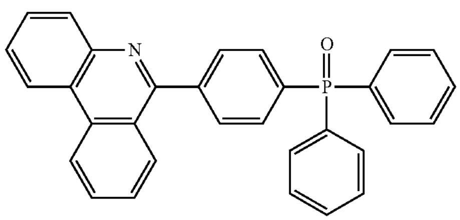
[Chemical Formula 2-1 to Chemical Formula 2-9]
(2-1)
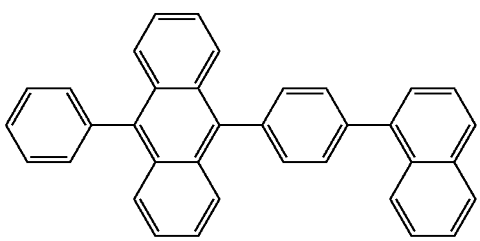
(2-2)
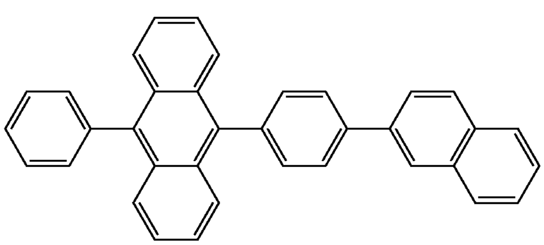
(2-3)
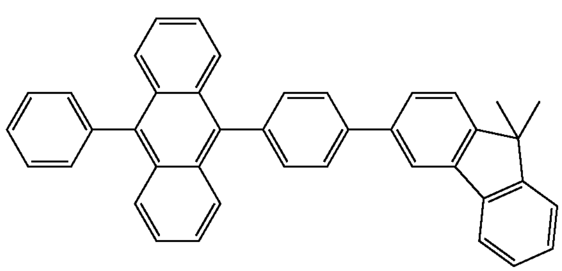
-continued
(2-4)
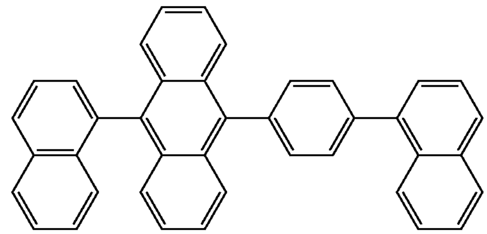
(2-5)
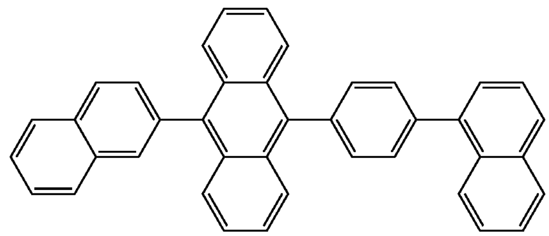
(2-6)
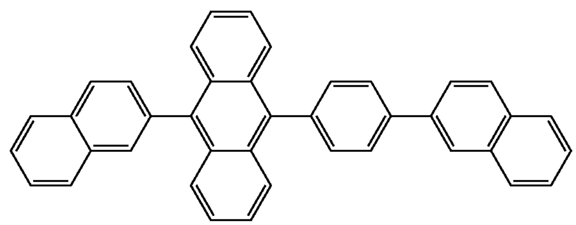
(2-7)
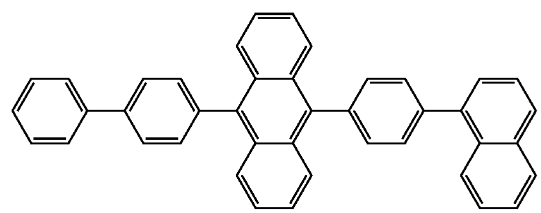
(2-8)
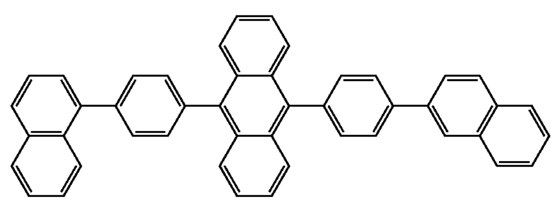
(2-9)
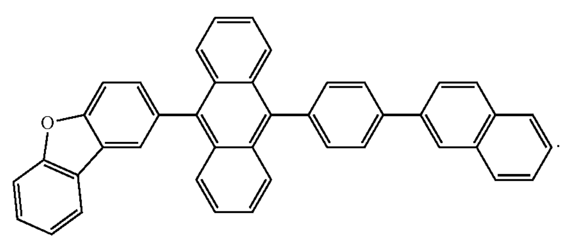
Comparative Examples 1 to 3
In addition, as Comparative Examples, organic light emitting elements were manufactured under the same conditions as of the above-described Examples, except that a host compound was changed to compounds of Chemical Formula 7 or Chemical Formula 8, below.

[Chemical Formula 7]

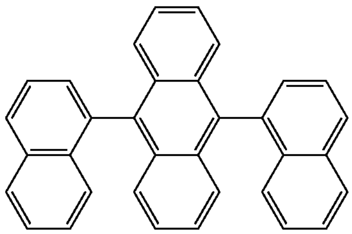

[Chemical Formula 8]

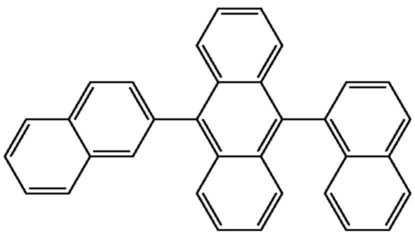

In addition, as a Comparative Example, an organic light emitting element was manufactured under the same conditions as of the above-described Examples, except that an electron transfer layer was changed to include a compound of Chemical Formula 9, below, and a host compound was changed to the compound of Chemical Formula 2-1, and then element performance and life span were measured.

[Chemical Formula 9]

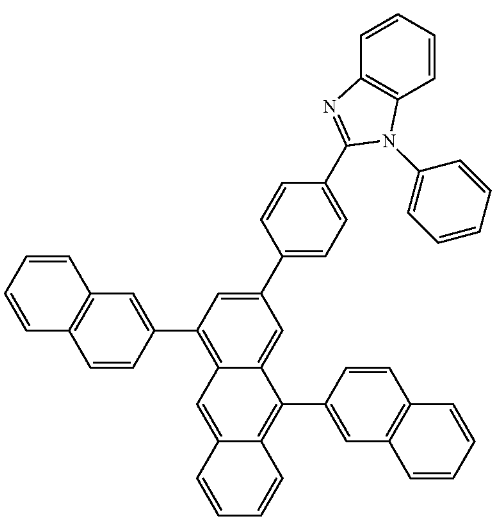

Table 1, below shows measurement results.

TABLE 1

| Example | Host | Electron transfer layer | Efficiency (cd/A) | Life span (h) |
|---|---|---|---|---|
| Example 1-1 | Chemical Formula 2-1 | Chemical Formula 1-1 | 4.8 | 100 |
| Example 1-2 | Chemical Formula 2-1 | Chemical Formula 1-2 | 5.0 | 90 |
| Example 1-3 | Chemical Formula 2-1 | Chemical Formula 1-3 | 5.2 | 110 |

TABLE 1-continued

| Example | Host | Electron transfer layer | Efficiency (cd/A) | Life span (h) |
|---|---|---|---|---|
| Example 1-4 | Chemical Formula 2-1 | Chemical Formula 1-4 | 5.3 | 110 |
| Example 1-5 | Chemical Formula 2-1 | Chemical Formula 1-5 | 5.3 | 120 |
| Example 1-6 | Chemical Formula 2-2 | Chemical Formula 1-3 | 5.2 | 120 |
| Example 1-7 | Chemical Formula 2-3 | Chemical Formula 1-3 | 5.3 | 120 |
| Example 1-8 | Chemical Formula 2-4 | Chemical Formula 1-3 | 5.0 | 130 |
| Example 1-9 | Chemical Formula 2-5 | Chemical Formula 1-3 | 5.1 | 110 |
| Example 1-10 | Chemical Formula 2-6 | Chemical Formula 1-3 | 5.2 | 120 |
| Example 1-11 | Chemical Formula 2-7 | Chemical Formula 1-3 | 5.0 | 100 |
| Example 1-12 | Chemical Formula 2-8 | Chemical Formula 1-3 | 4.9 | 110 |
| Example 1-13 | Chemical Formula 2-9 | Chemical Formula 1-3 | 5.2 | 120 |
| Example 1-14 | Chemical Formula 2-2 | Chemical Formula 1-4 | 5.3 | 130 |
| Example 1-15 | Chemical Formula 2-3 | Chemical Formula 1-4 | 5.4 | 120 |
| Example 1-16 | Chemical Formula 2-4 | Chemical Formula 1-4 | 5.1 | 110 |
| Example 1-17 | Chemical Formula 2-9 | Chemical Formula 1-4 | 5.4 | 110 |
| Comparative Example 1 | Chemical Formula 7 | Chemical Formula 1-1 | 4.3 | 80 |
| Comparative Example 2 | Chemical Formula 8 | Chemical Formula 1-1 | 4.1 | 70 |
| Comparative Example 3 | Chemical Formula 2-1 | Chemical Formula 9 | 4.5 | 60 |

As shown in Table 1, it may be seen that when the compound of Chemical Formula 1 and the compound of Chemical Formula 2 were used as an electron transfer material and a host material, respectively, efficiency and life span were be significantly improved. Referring to Table 1, in the Comparative Examples, in which the compound of Chemical Formula 1 was used as an electron transfer material and the compound of Chemical Formula 7 or Chemical Formula 8 was used as a host, efficiency, and life span were reduced compared to the Examples.

In addition, referring to Comparative Example 3, even though the compound of Chemical Formula 2 was used as a host, efficiency, and life span were reduced compared to a case that the compound of Chemical Formula 9 was used as a host.

For example, efficiency and life span of the organic light emitting element was improved by using a phenyl-substituted anthracene-based compound as a host and a phosphine-based compound in an electron transfer layer.

Examples 2-1 to 2-9 and Comparative Examples 4 to 6

An organic light emitting element was manufactured with the same condition of Example 1, except that lithium quinolate (Liq) was doped to compounds of Chemical Formula 1-1 to Chemical Formula 1-5 in an electron transfer layer. For example, as the electron transfer layer, 50 wt % of Liq was simultaneously deposited as a doping material to the compounds of Chemical Formula 1-1 to Chemical Formula 1-5. Efficiency and life span of the manufactured organic light emitting element are measured under the same conditions described above, and measurement results are shown in Table 2. Additional Examples and Comparative Examples were prepared as described above and shown in Table 2.

TABLE 2

| Exemplary Embodiment | Host | Electron transfer layer | Efficiency (cd/A) | Life span (h) |
|---|---|---|---|---|
| Exemplary Embodiment 2-1 | Chemical Formula 2-1 | Chemical Formula 1-1:Liq | 4.9 | 120 |
| Exemplary Embodiment 2-2 | Chemical Formula 2-1 | Chemical Formula 1-2:Liq | 5.1 | 110 |
| Exemplary Embodiment 2-3 | Chemical Formula 2-1 | Chemical Formula 1-3:Liq | 5.3 | 140 |
| Exemplary Embodiment 2-4 | Chemical Formula 2-1 | Chemical Formula 1-4:Liq | 5.2 | 130 |
| Exemplary Embodiment 2-5 | Chemical Formula 2-1 | Chemical Formula 1-5:Liq | 5.3 | 130 |
| Exemplary Embodiment 2-6 | Chemical Formula 2-2 | Chemical Formula 1-3:Liq | 5.3 | 130 |
| Exemplary Embodiment 2-7 | Chemical Formula 2-3 | Chemical Formula 1-3:Liq | 5.4 | 120 |
| Exemplary Embodiment 2-8 | Chemical Formula 2-4 | Chemical Formula 1-3:Liq | 5.2 | 110 |
| Exemplary Embodiment 2-9 | Chemical Formula 2-9 | Chemical Formula 1-3:Liq | 5.4 | 120 |
| Comparative Example 4 | Chemical Formula 7 | Chemical Formula 1-1:Liq | 4.2 | 90 |
| Comparative Example 5 | Chemical Formula 8 | Chemical Formula 1-1:Liq | 4.2 | 80 |
| Comparative Example 6 | Chemical Formula 2-1 | Chemical Formula 9:Liq | 4.4 | 90 |

As shown in Table 2, it may be seen that when one of the compounds of Chemical Formula 1-1 to Chemical Formula 1-5 and Liq were simultaneously included in an electron transfer layer, and one of the compounds of Chemical Formula 2-1 to Chemical Formula 2-9 was applied as a host of the emission layer, efficiency and life span were improved.

For example, the phenyl-substituted anthracene-based compound was used as a host and the Liq-doped phosphine-based compound was included in an electron transfer layer such that efficiency and life span of the organic light emitting element may be improved.

Examples 3-1 to 3-9 and Comparative Examples 10 to 12

An indium tin oxide (ITO) transparent electrode was formed with a thickness of 120 nm on a glass substrate. After that, the glass substrate was cleaned using ultrasonic waves and a pretreatment process (i.e., UV-$O_3$ treatment, heat treatment) is performed.

A compound represented by Chemical Formula 5 was deposited with a thickness of 50 nm, as a hole injection layer on a pre-treated anode, and then a compound represented by Chemical Formula 6 was deposited with a thickness of 45 nm as a hole transfer layer thereon. In addition, (as an anthracene derivative for a host or dopant material), a compound of Chemical Formula 4, which is a doping material, was simultaneously deposited at a concentration of 5 wt % with a compound of Chemical Formula 2-1 such that an emission layer having a thickness of 30 nm was formed.

After forming the emission layer, a compound of Chemical Formula 1-1 was formed with a thickness of 10 nm, as a hole blocking layer. After that, as an electron transfer layer, BPhen (4,7-diphenyl-1-10-phenanthroline) was formed with a thickness of 15 nm. In this case, when BPhen was formed as the electron transfer layer, 50 wt % of Liq was simultaneously deposited as a doping material.

After that, as a cathode, lithium fluoride was deposited with a thickness of 0.5 nm and then aluminum was deposited with a thickness of 150 nm such that an organic light emitting element is manufactured.

[Chemical Formula 5]

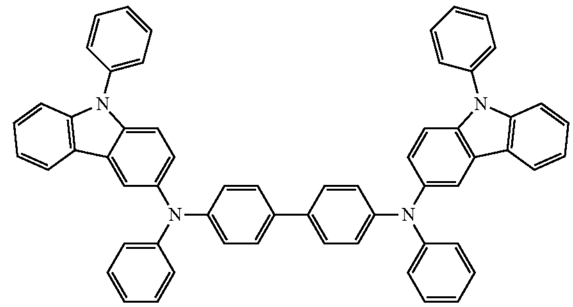

[Chemical Formula 6]

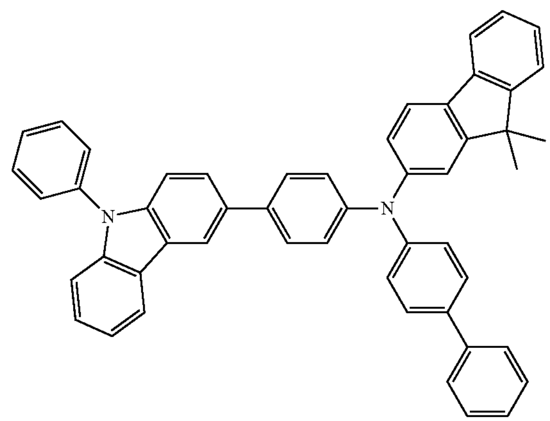

[Chemical Formula 1-1]

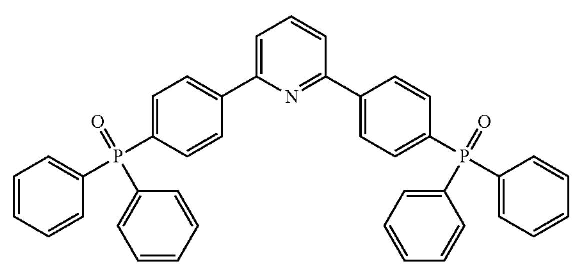

[Chemical Formula 2-1]

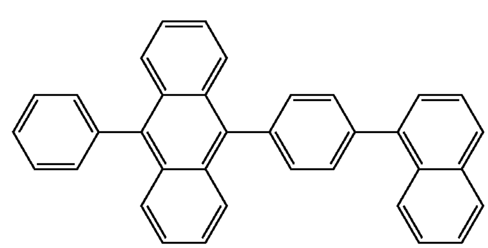

-continued

[Chemical Formula 4]

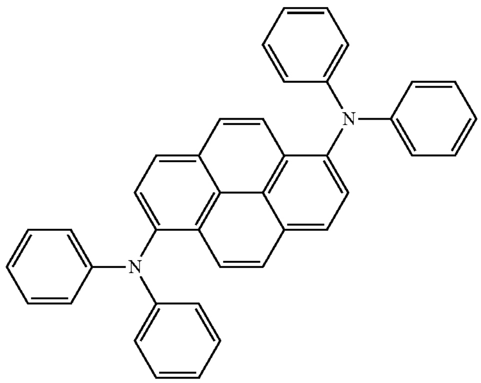

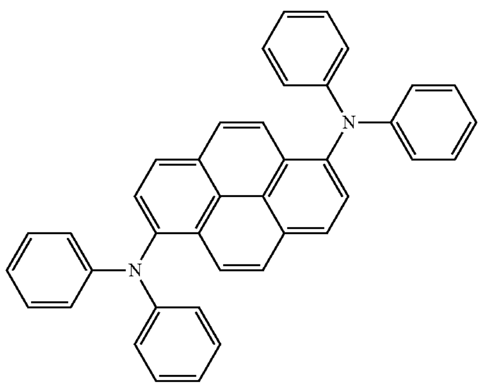

With respect to the manufactured organic light emitting element, element performance (i.e., current efficiency, Cd/A) was measured in driving with current density of 10 $mA/cm^2$, and time (i.e., life span) until luminance was decreased to 80% from initial luminance at a current density of 50 $mA/cm^2$ was respectively measured.

For the other Examples, the host compound of the emission layer was selected from among the compounds of Chemical Formula 2-1 to Chemical Formula 2-9, and a compound of the hole blocking layer was selected from among the compounds of Chemical Formula 1-1 to Chemical Formula 1-5, and then element performance and life span were measured in the same conditions.

In addition, as Comparative Examples, organic light emitting elements were manufactured under the same conditions as the Examples, except that a host compound was changed to a compound of Chemical Formula 7 or a compound of Chemical Formula 8.

[Chemical Formula 7]

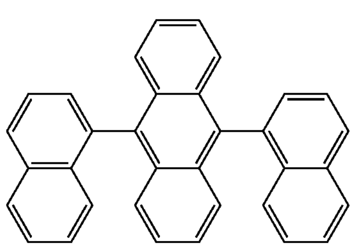

-continued

[Chemical Formula 8]

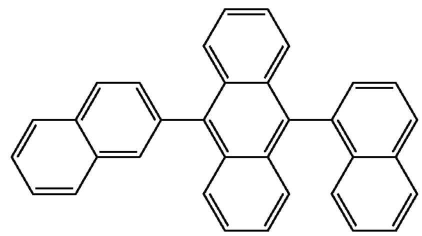

In addition, as a Comparative Example, an organic light emitting element was manufactured under the same conditions as the Examples, except that a hole blocking layer of the emission layer was changed to a compound of Chemical Formula 9 and a host compound was changed to the compound of Chemical Formula 2-1, and then element performance and life span were measured.

[Chemical Formula 9]

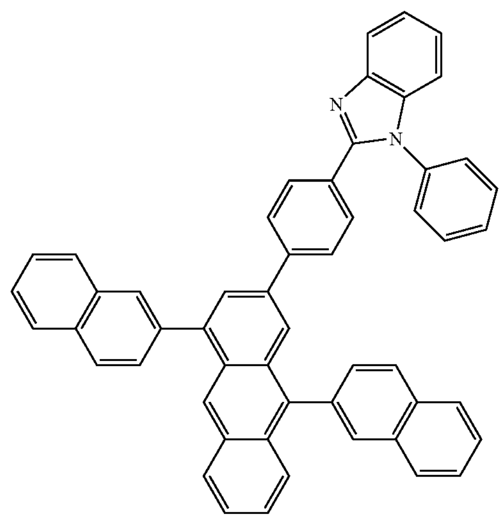

Measurement results are shown in Table 3, below.

TABLE 3

| Example | Host | Hole blocking layer | Electron transfer layer | Efficiency (cd/A) | Life span (h) |
|---|---|---|---|---|---|
| Example 3-1 | Chemical Formula 2-1 | Chemical Formula 1-1 | BPhen:Liq | 5.1 | 100 |
| Example 3-2 | Chemical Formula 2-1 | Chemical Formula 1-2 | BPhen:Liq | 5.3 | 120 |
| Example 3-3 | Chemical Formula 2-1 | Chemical Formula 1-3 | BPhen:Liq | 5.5 | 130 |
| Example 3-4 | Chemical Formula 2-1 | Chemical Formula 1-4 | BPhen:Liq | 5.5 | 120 |
| Example 3-5 | Chemical Formula 2-1 | Chemical Formula 1-5 | BPhen:Liq | 5.4 | 130 |
| Example 3-6 | Chemical Formula 2-2 | Chemical Formula 1-3 | BPhen:Liq | 5.4 | 140 |
| Example 3-7 | Chemical Formula 2-3 | Chemical Formula 1-3 | BPhen:Liq | 5.5 | 130 |
| Example 3-8 | Chemical Formula 2-4 | Chemical Formula 1-3 | BPhen:Liq | 5.2 | 110 |
| Example 3-9 | Chemical Formula 2-9 | Chemical Formula 1-3 | BPhen:Liq | 5.4 | 120 |

TABLE 3-continued

| Example | Host | Hole blocking layer | Electron transfer layer | Efficiency (cd/A) | Life span (h) |
|---|---|---|---|---|---|
| Comparative Example 10 | Chemical Formula 7 | Chemical Formula 1-6 | BPhen:Liq | 4.3 | 90 |
| Comparative Example 11 | Chemical Formula 8 | Chemical Formula 1-6 | BPhen:Liq | 4.2 | 90 |
| Comparative Example 12 | Chemical Formula 2-1 | Chemical Formula 9 | BPhen:Liq | 4.6 | 90 |

As shown in Table 3, it may be seen that when the compound of Chemical Formula 1 was included in a hole blocking layer and the compound of Chemical Formula 2 was used as a host, efficiency and life span were significantly improved.

For example, as shown in Table 1 and Table 2, not only in a case of using the compound of Chemical Formula 1 in an electron transfer layer but also in a case that the compound (e.g., phosphine-based compound) of Chemical Formula 1 is included in a hole assistant or blocking layer, when the second compound (e.g., phenyl-substituted anthracene-based compound) of Chemical Formula 2 is applied as a host, and a suitable compound is used as an electron transfer layer, efficiency and life span of the element may be improved.

By way of summation and review, some organic light emitting diode displays may have a relatively high driving voltage, low luminance and light emission efficiency, and a short lifetime.

As described above, efficiency and life span of an organic light emitting element according to an embodiment may be improved by including a, e.g., phosphine-based, compound represented by Chemical Formula 1 in a hole blocking layer or an electron transfer layer, and by applying a, e.g., phenyl-substituted anthracene-based, compound represented by Chemical Formula 2 as a host.

The embodiments may provide an organic light emitting element having high efficiency and a long life span, and an organic light emitting device including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| | |
|---|---|
| 10: anode | 20: cathode |
| 30: hole transfer layer | 40: electron transfer layer |
| 50: emission layer | 60: hole blocking layer |

What is claimed is:

1. An organic light emitting element, comprising:

a first compound represented by one of the following Chemical Formula 1-6 to 1-59, 1-123 to 1-125, and 1-135 to Chemical Formula 1-188, and a second compound represented by the following Chemical Formula 2:

(1-6)

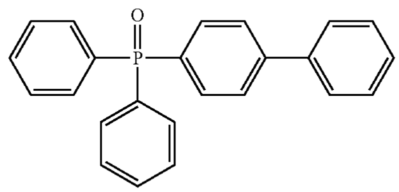

(1-7)

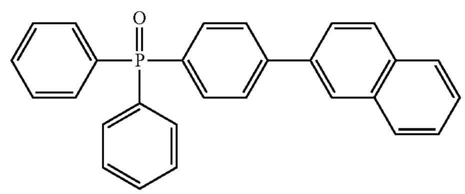

(1-8)

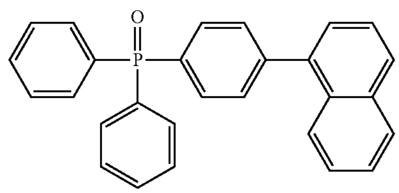

(1-9)

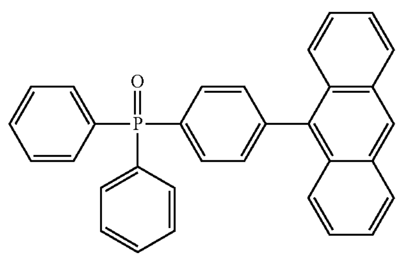

(1-10)

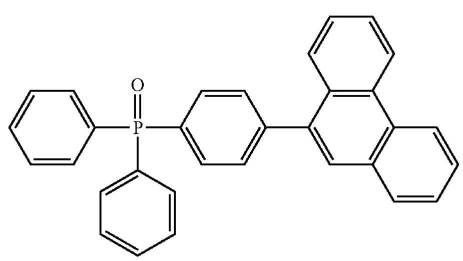

(1-11)

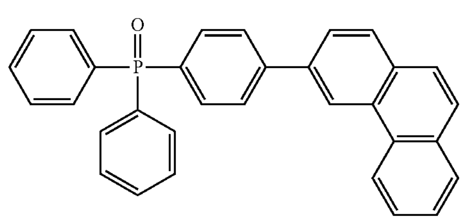

-continued
(1-12)
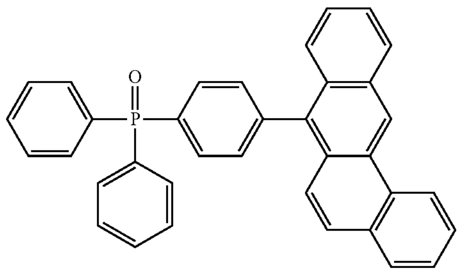
(1-13)
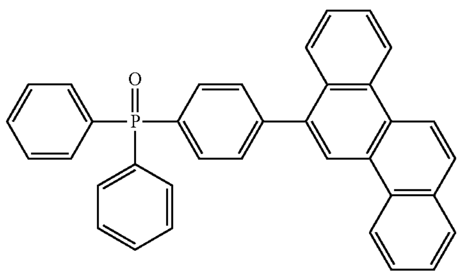
(1-14)
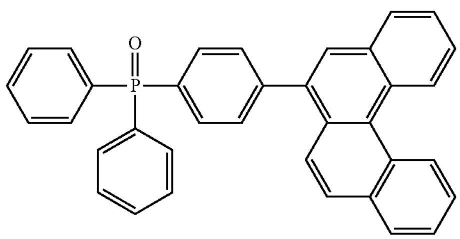
(1-15)
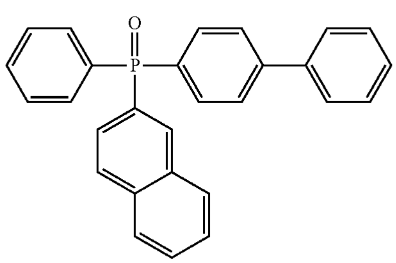
(1-16)
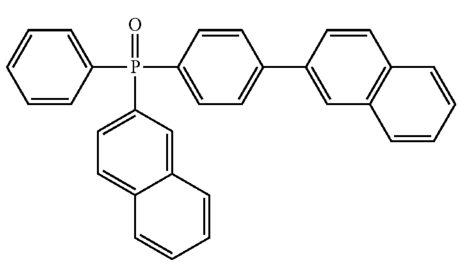
(1-17)
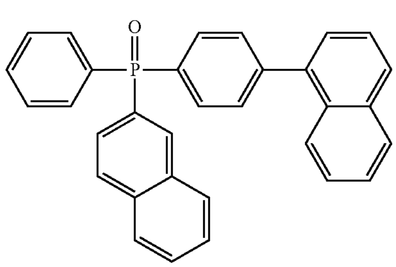
-continued
(1-18)
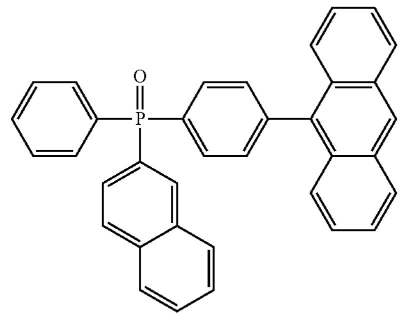
(1-19)
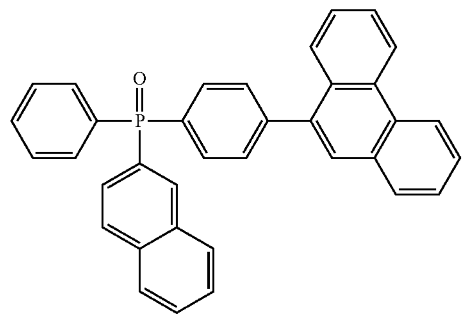
(1-20)
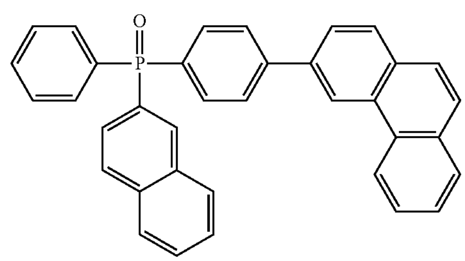
(1-21)
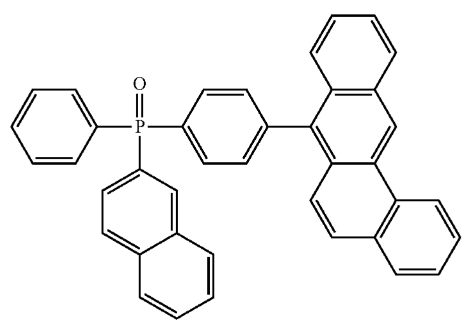
(1-22)
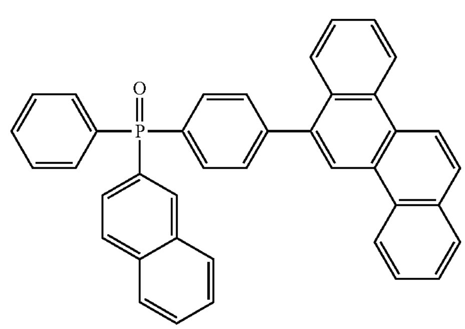

-continued
(1-23)
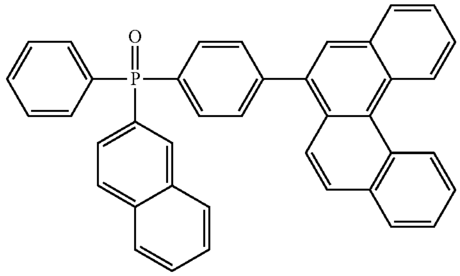
(1-24)
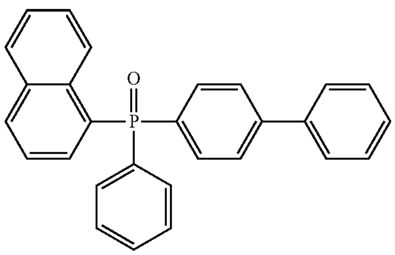
(1-25)
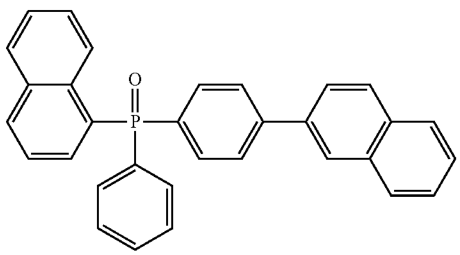
(1-26)
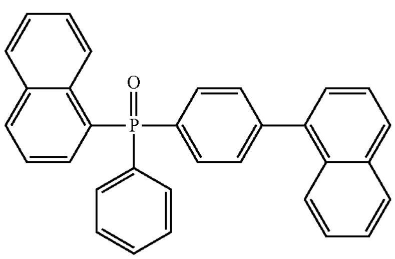
(1-27)
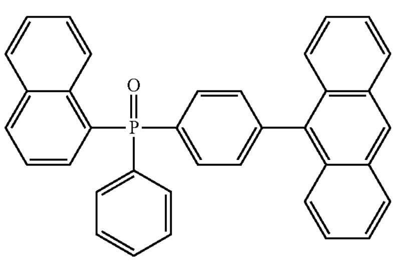
(1-28)
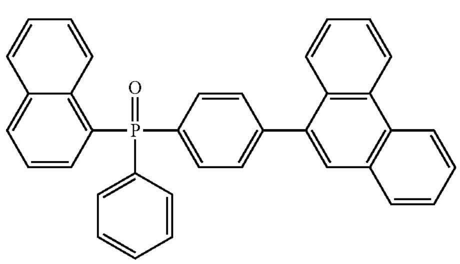
-continued
(1-29)
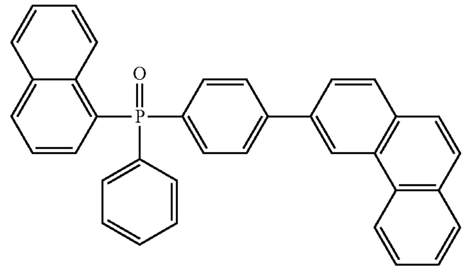
(1-30)
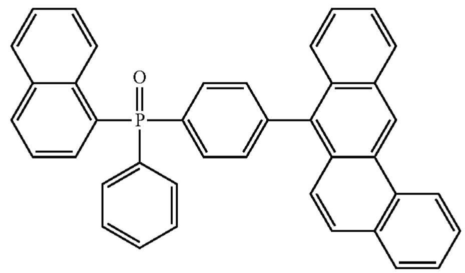
(1-31)
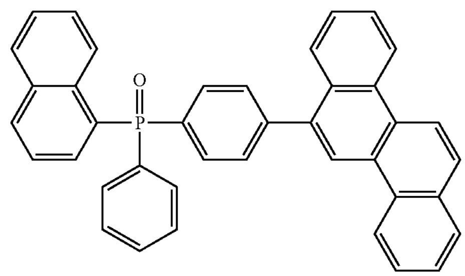
(1-32)
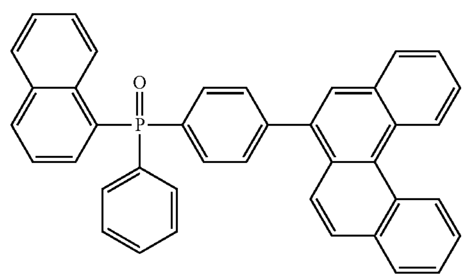
(1-33)
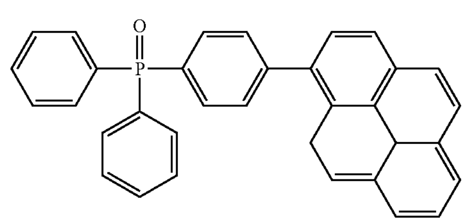
(1-34)
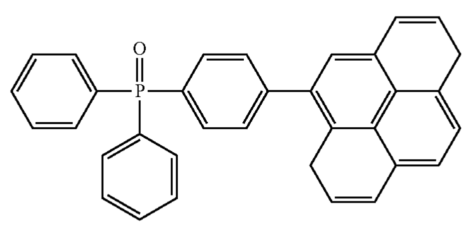

-continued
(1-35)
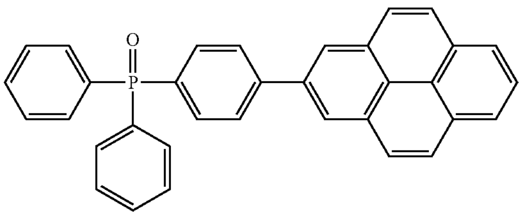
(1-36)
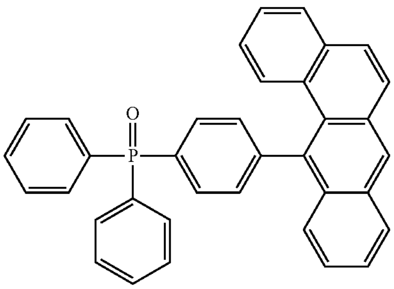
(1-37)
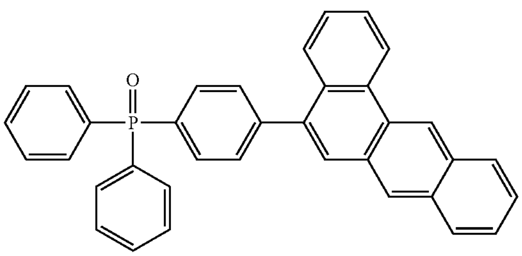
(1-38)
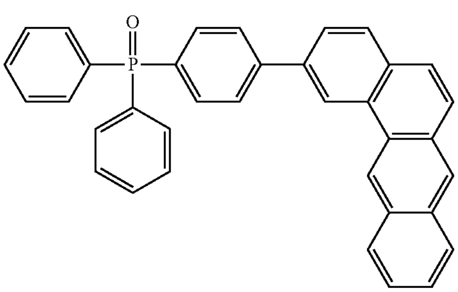
(1-39)
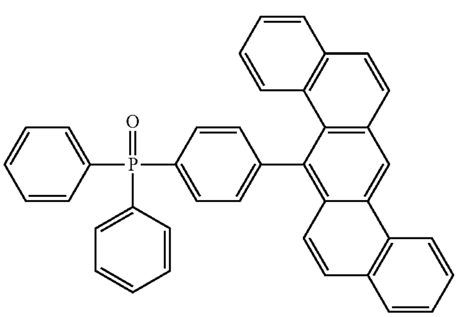
-continued
(1-40)
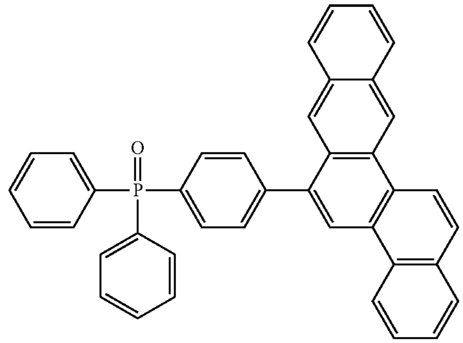
(1-41)
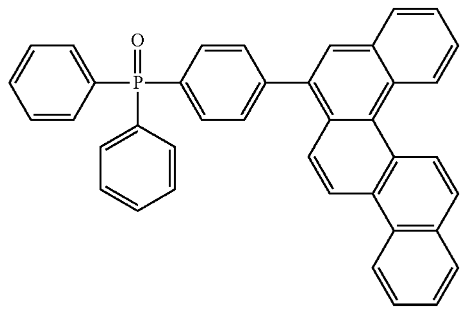
(1-42)
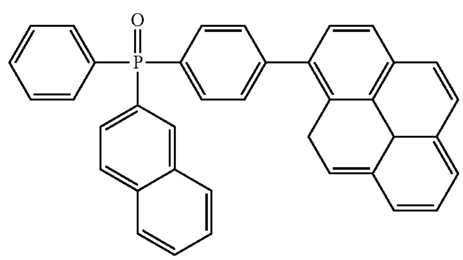
(1-43)
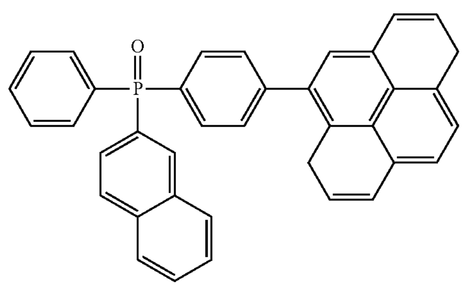
(1-44)
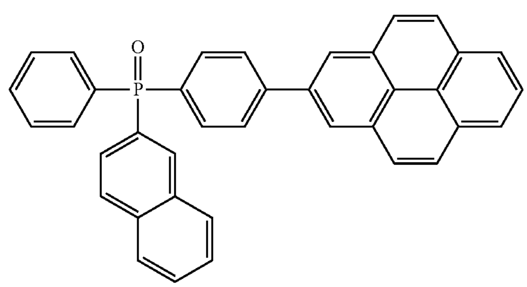

-continued
(1-45)
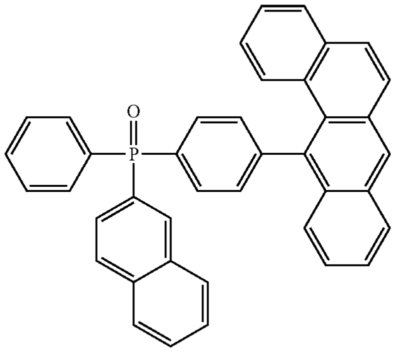
(1-46)
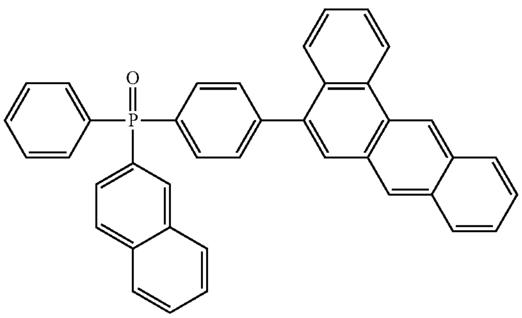
(1-47)
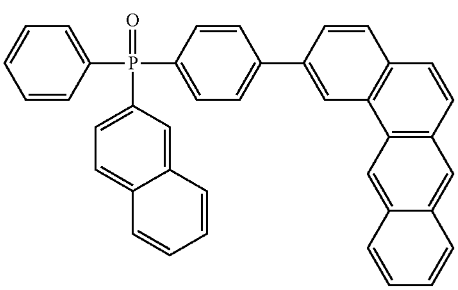
(1-48)
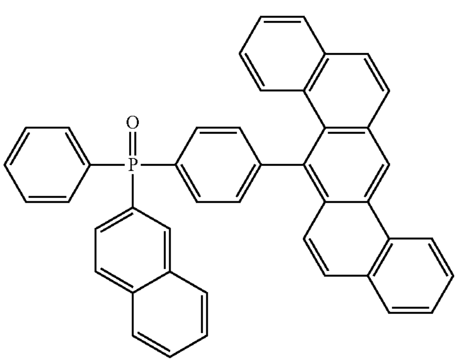
-continued
(1-49)
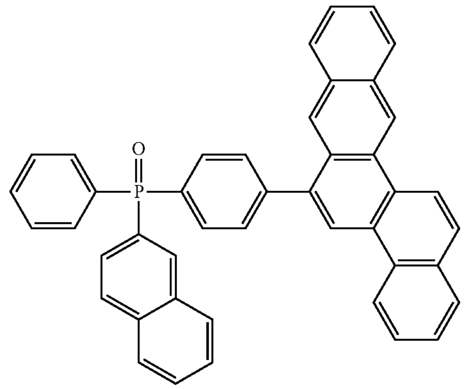
(1-50)
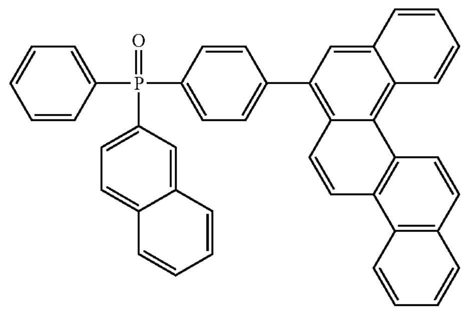
(1-51)
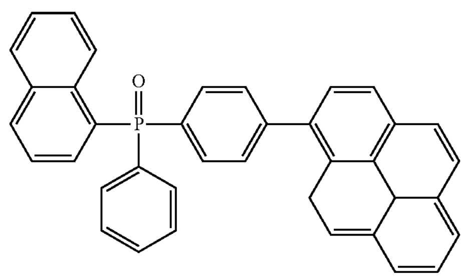
(1-52)
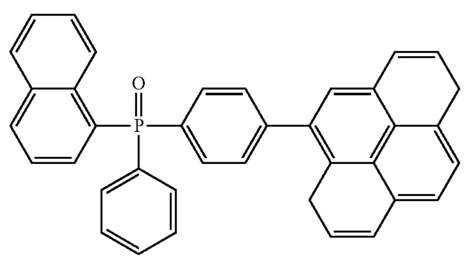
(1-53)
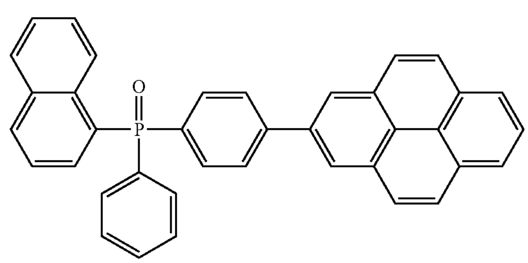

-continued
(1-54)
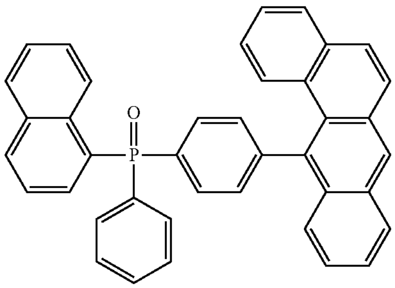
(1-55)
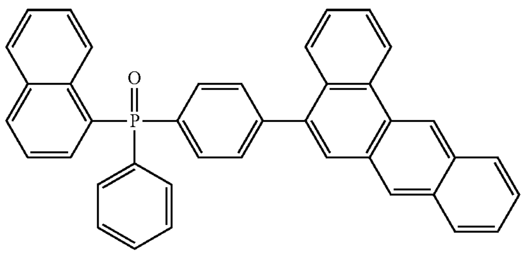
(1-56)
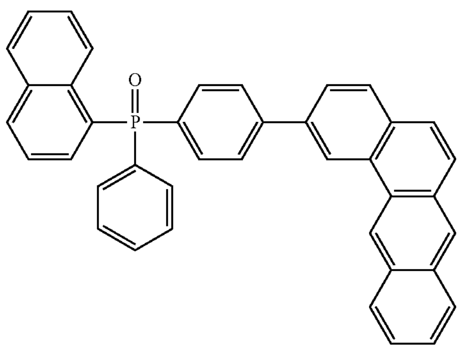
(1-57)
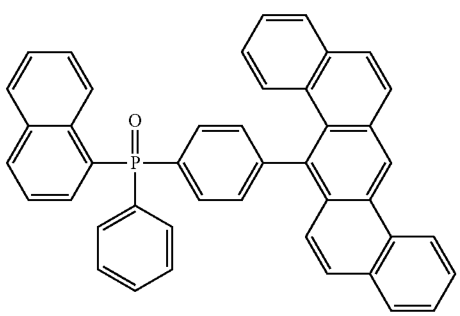
(1-58)
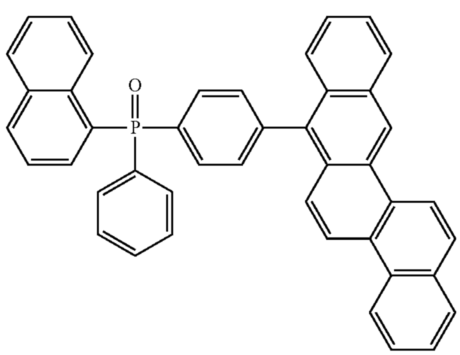
-continued
(1-59)
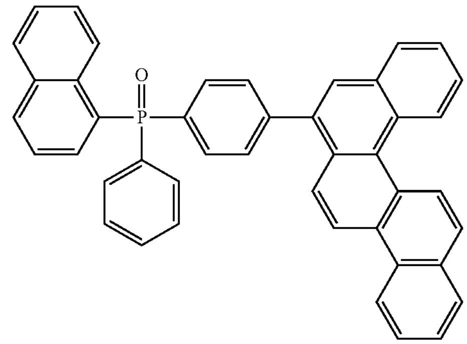
(1-123)
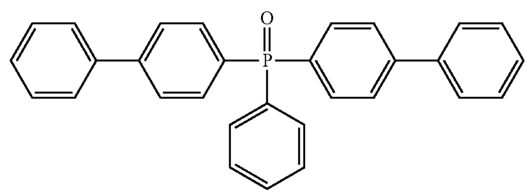
(1-124)
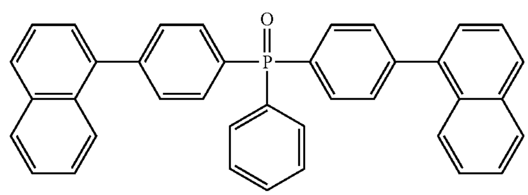
(1-125)
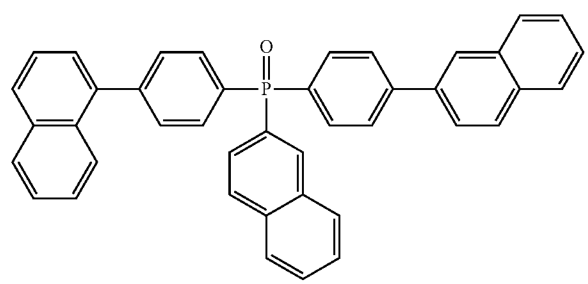
(1-135)
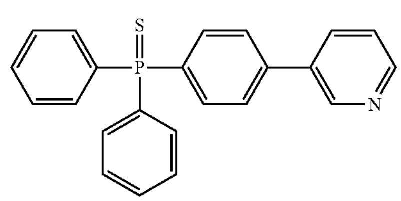
(1-136)
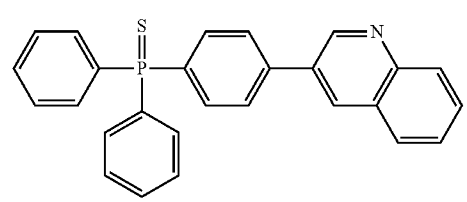

-continued
(1-137)
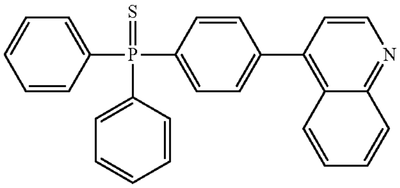
(1-138)
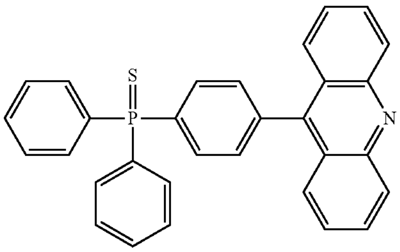
(1-139)
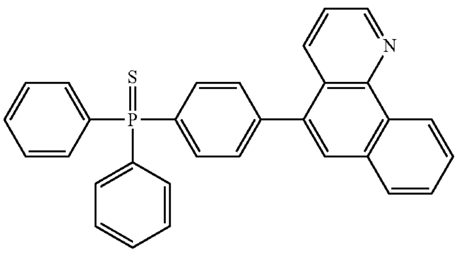
(1-140)
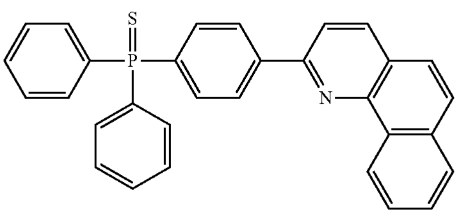
(1-141)
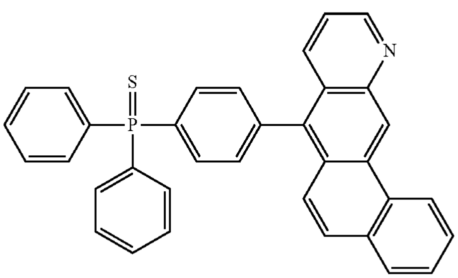
(1-142)
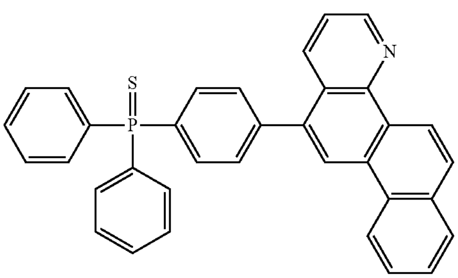
-continued
(1-143)
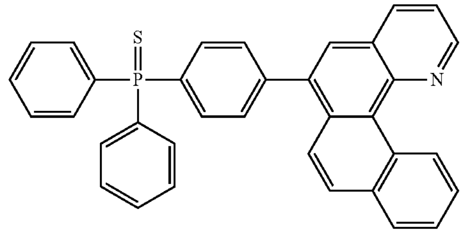
(1-144)
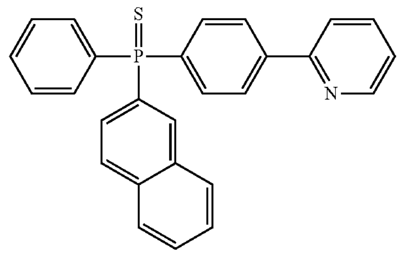
(1-145)
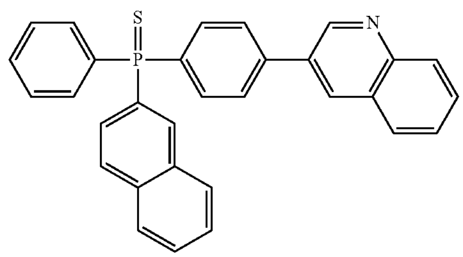
(1-146)
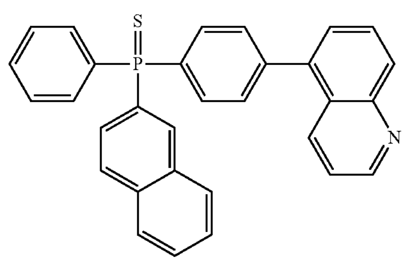
(1-147)
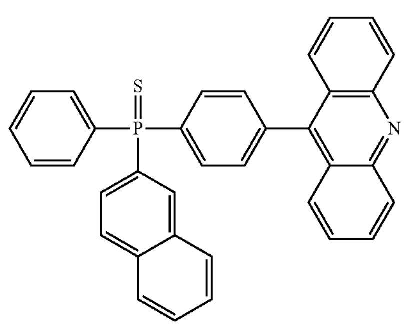

-continued
(1-148)
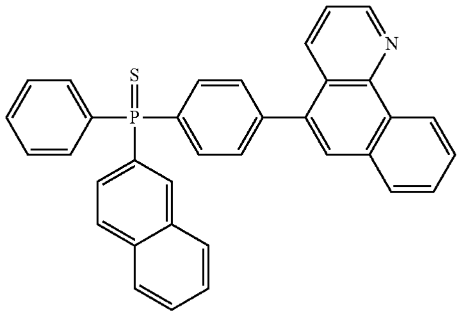
(1-149)
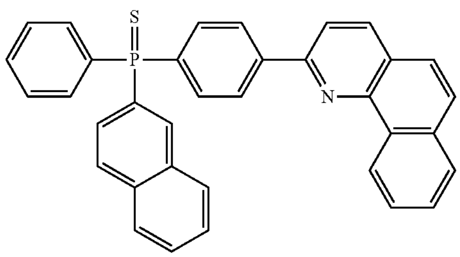
(1-150)
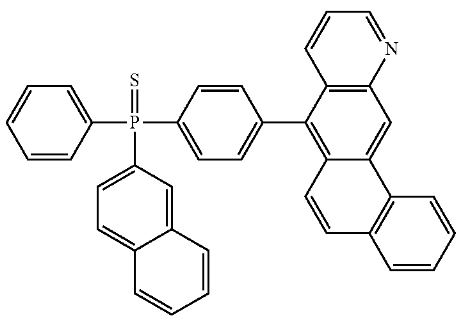
(1-151)
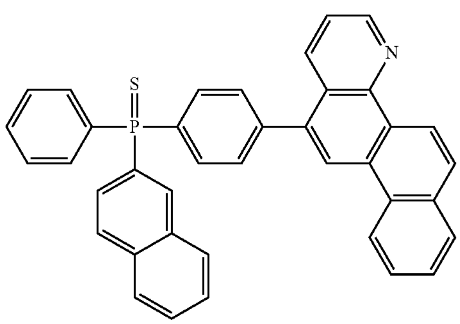
(1-152)
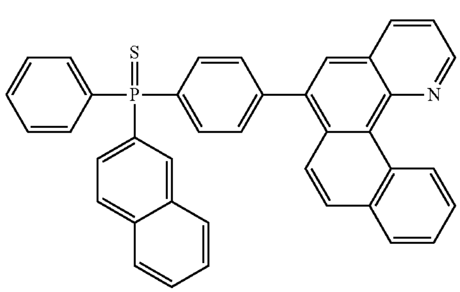
-continued
(1-153)
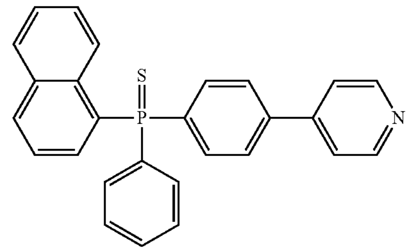
(1-154)
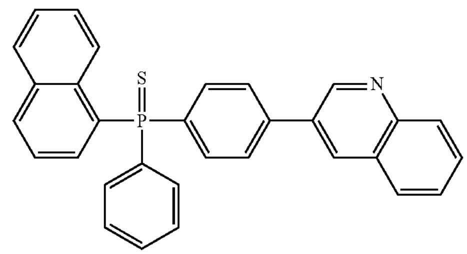
(1-155)
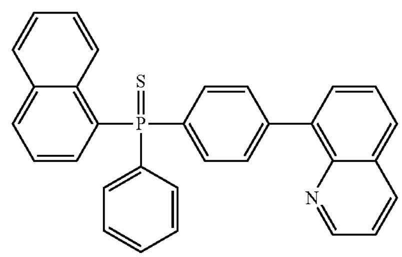
(1-156)
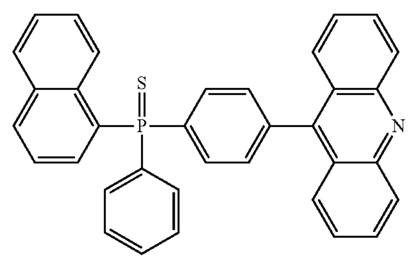
(1-157)
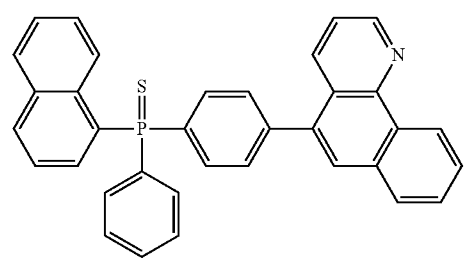
(1-158)
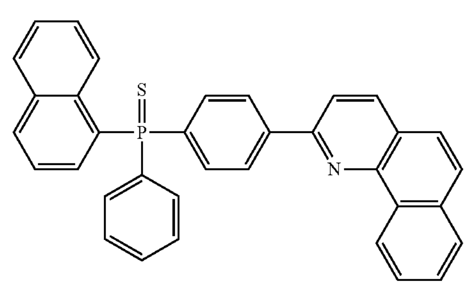

-continued
(1-159)
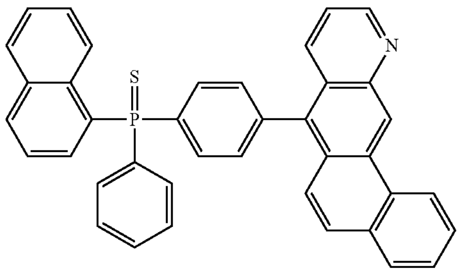
(1-160)
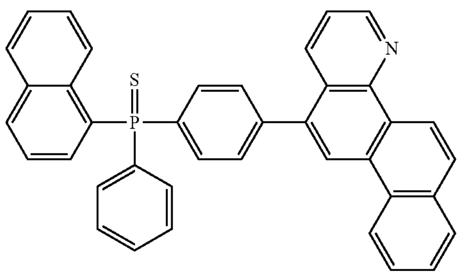
(1-161)
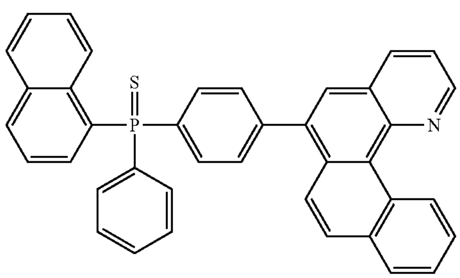
(1-162)
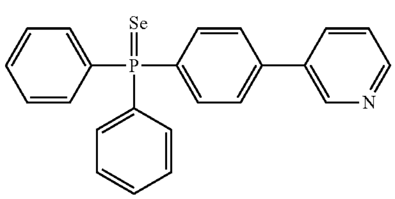
(1-163)
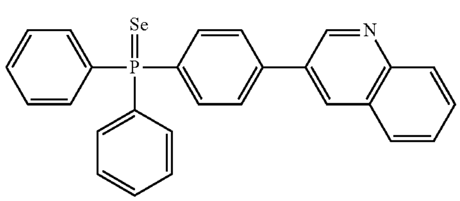
(1-164)
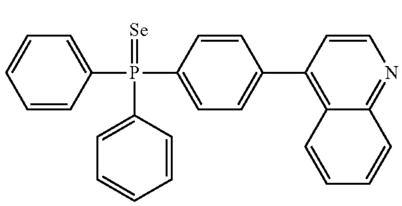
-continued
(1-165)
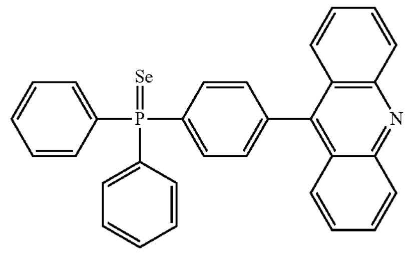
(1-166)
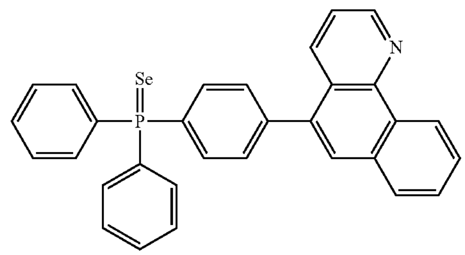
(1-167)
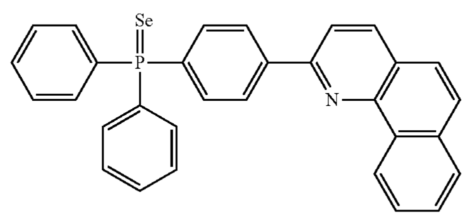
(1-168)
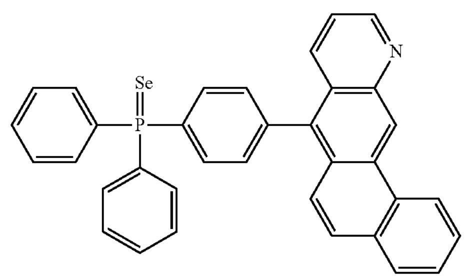
(1-169)
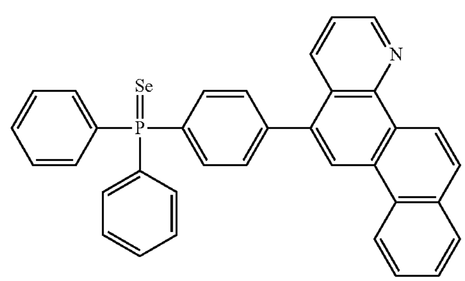
(1-170)
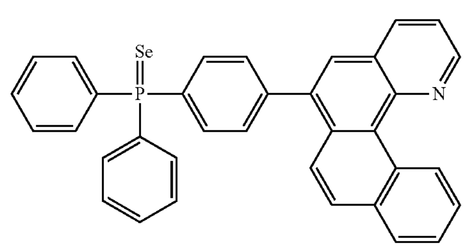

-continued
(1-171)
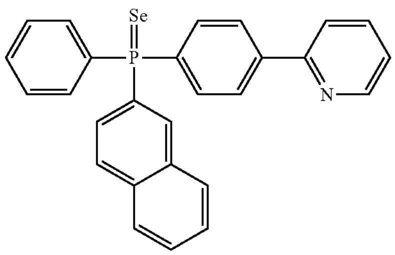
(1-172)
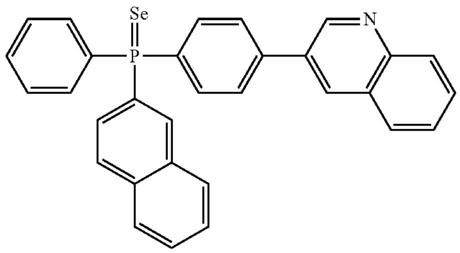
(1-173)
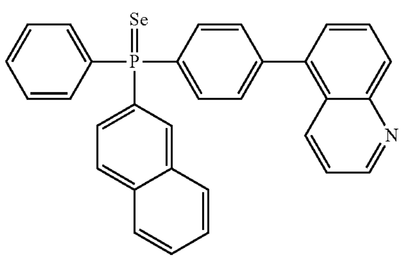
(1-174)
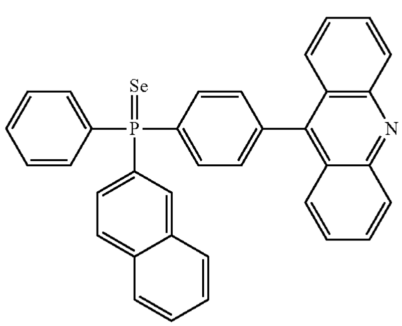
(1-175)
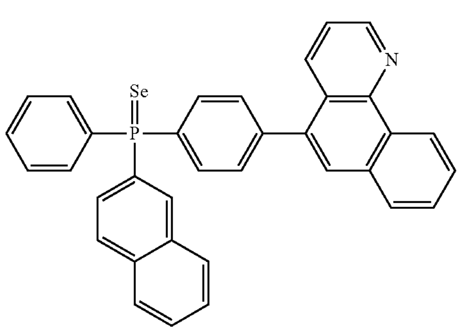
-continued
(1-176)
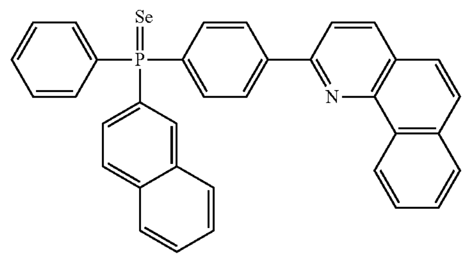
(1-177)
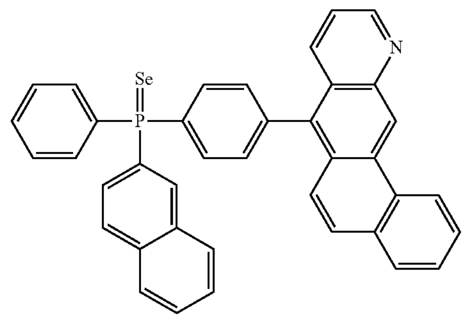
(1-178)
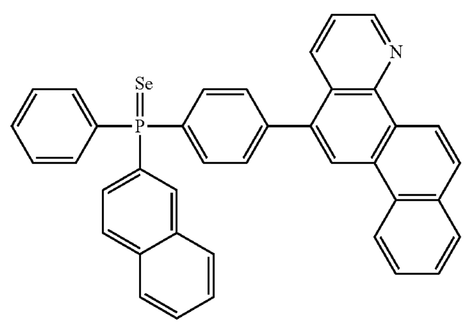
(1-179)
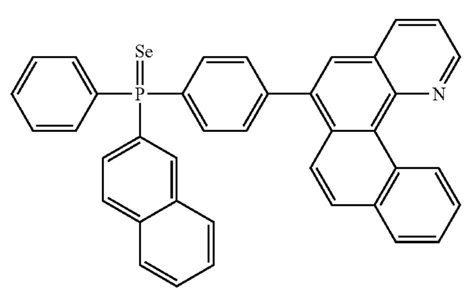
(1-180)
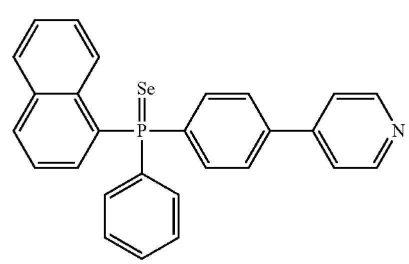

-continued (1-181)

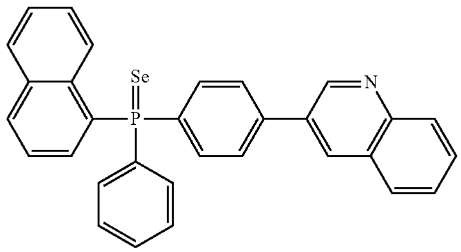

(1-182)

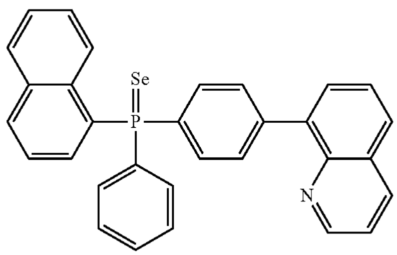

(1-183)

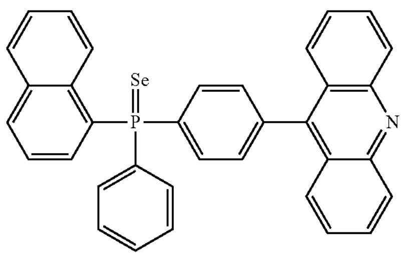

(1-184)

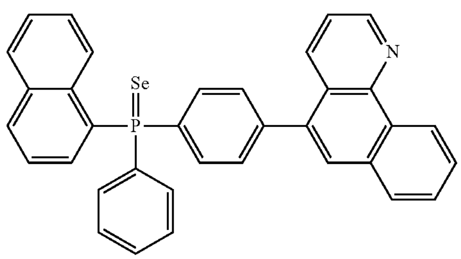

(1-185)

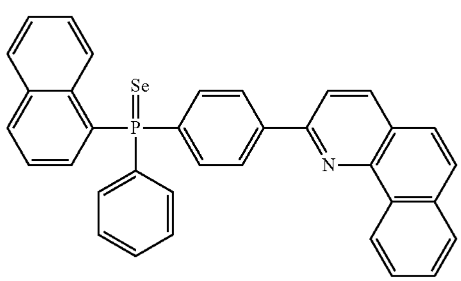

(1-186)

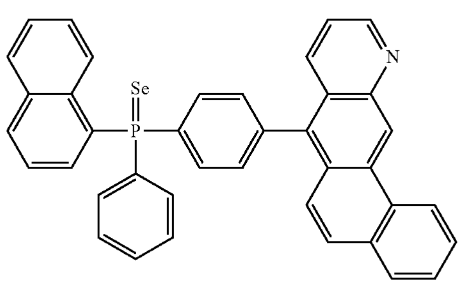

-continued (1-187)

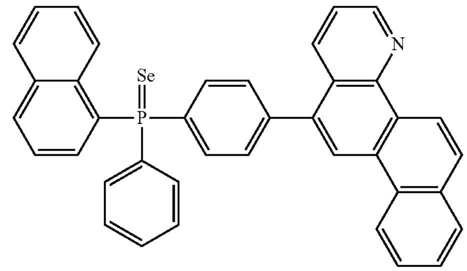

(1-188)

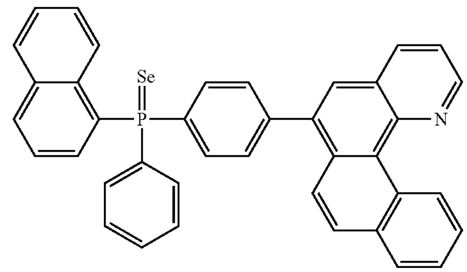

[Chemical Formula 2]

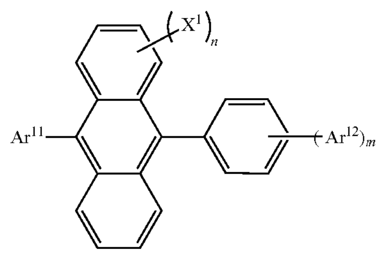

wherein, in Chemical Formula 2, $Ar^{11}$ is a substituted or unsubstituted C6 to C30 aryl group or a substituted or unsubstituted C6 to C30 heteroaryl group, m is an integer of 0 to 3, $Ar^{12}$ is a substituted or unsubstituted C5 to C30 aryl group or a substituted or unsubstituted C5 to C30 heteroaryl group, when m is 2 or more, each $Ar^{12}$ is the same as or different from one another, $X^1$ is hydrogen (H), deuterium, fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C60 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group, n is an integer of 0 to 8, and when n is 2 or more, each $X^1$ is the same as or different from one another.

2. The organic light emitting element as claimed in claim 1, wherein:

the organic light emitting element includes:

an anode and a cathode facing each other;

an emission layer between the anode and the cathode;

a hole transfer layer between the anode and the emission layer; and an electron transfer layer between the cathode and the emission layer, the electron transfer layer includes the first compound, and the emission layer includes the second compound.

3. The organic light emitting element as claimed in claim 2, wherein the electron transfer layer further includes lithium quinolate (Liq).

4. The organic light emitting element as claimed in claim 1, wherein $Ar^{11}$ of Chemical Formula 2 is a substituted or unsubstituted phenyl group.

5. The organic light emitting element as claimed in claim 1, wherein the second compound represented by Chemical Formula 2 is represented by one of the following Chemical Formula 2-1 to Chemical Formula 2-147:

(2-1)

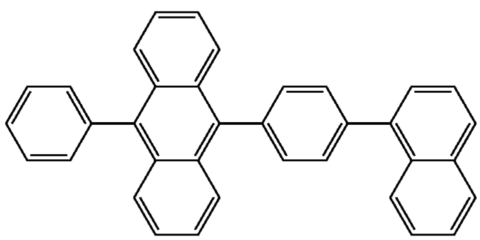

(2-2)

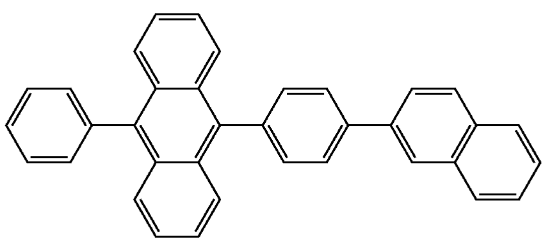

(2-3)

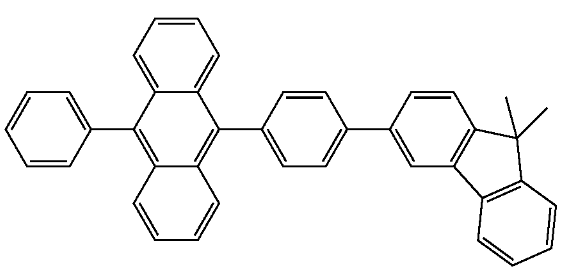

(2-4)

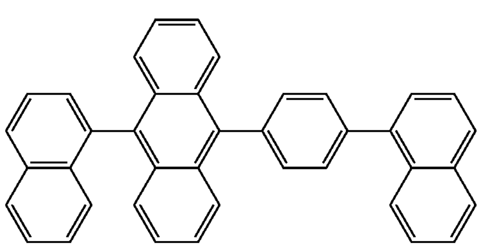

-continued (2-5)

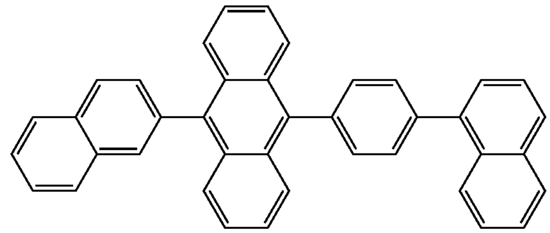

(2-6)

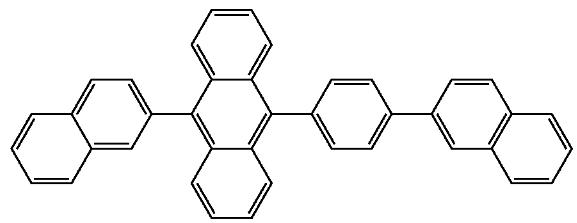

(2-7)

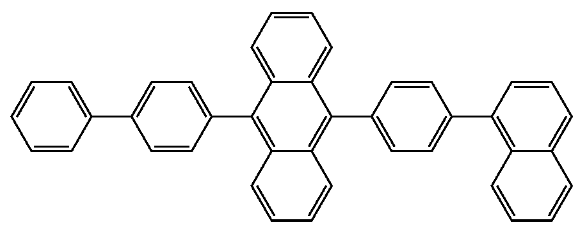

(2-8)

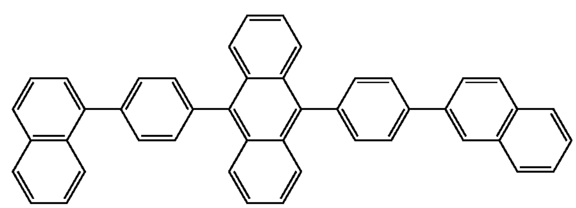

(2-9)

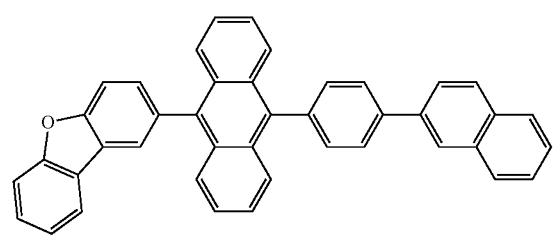

(2-10)

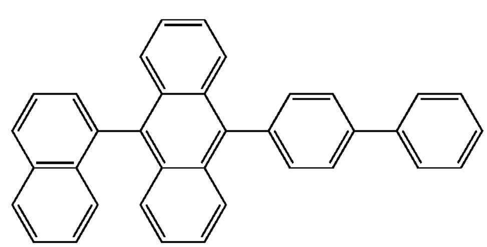

-continued
(2-11)
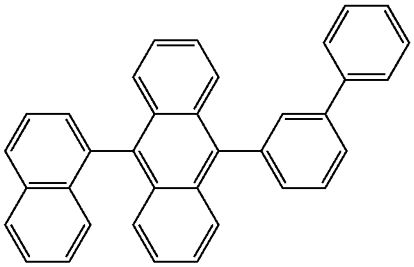
(2-12)
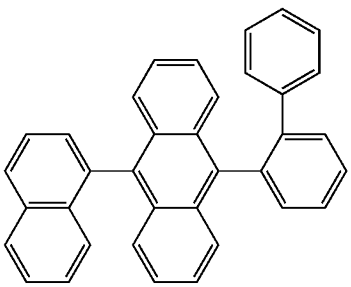
(2-13)
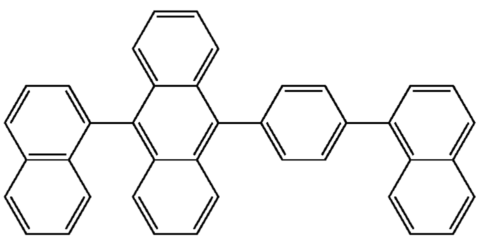
(2-14)
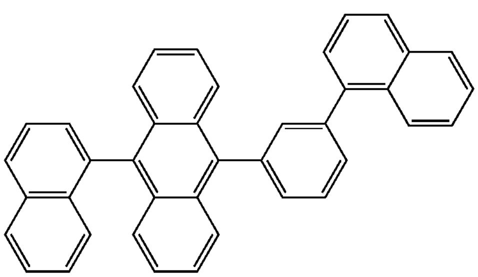
(2-15)
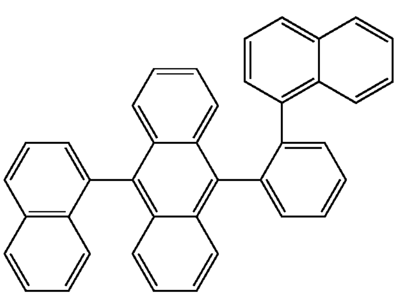
(2-16)
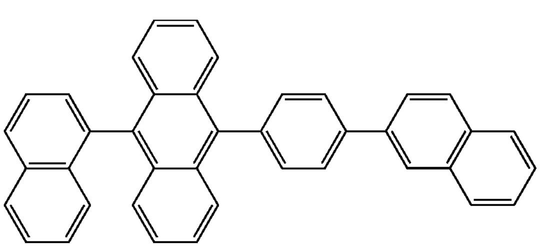
-continued
(2-17)
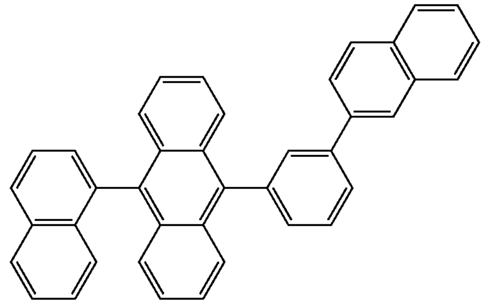
(2-18)
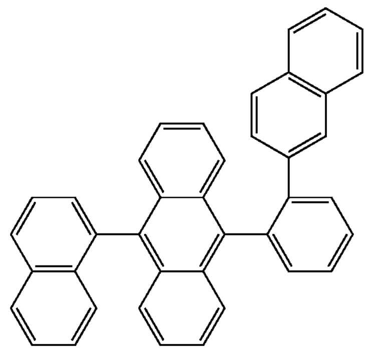
(2-19)
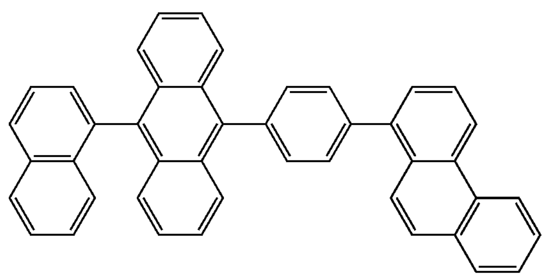
(2-20)
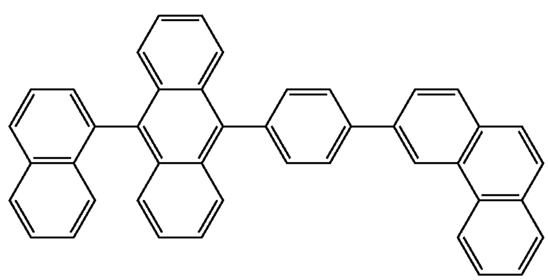
(2-21)
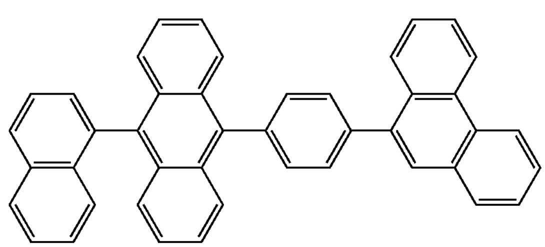

-continued
(2-22)
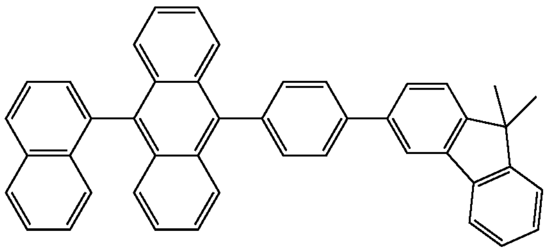
(2-23)
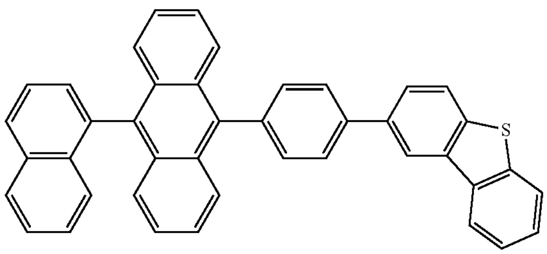
(2-24)
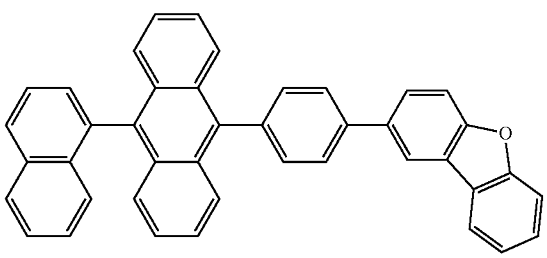
(2-25)
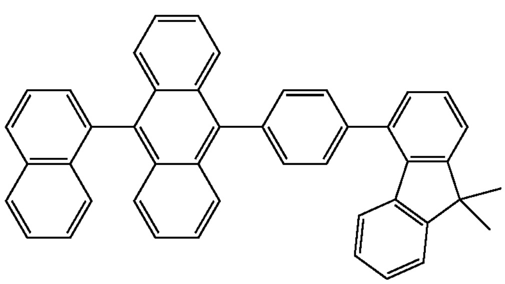
(2-26)
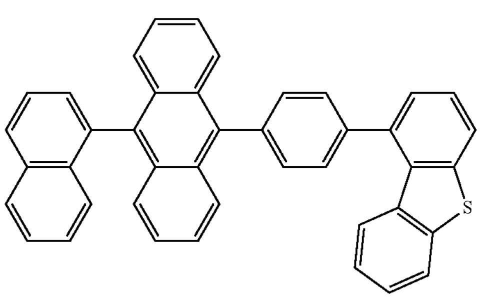
-continued
(2-27)
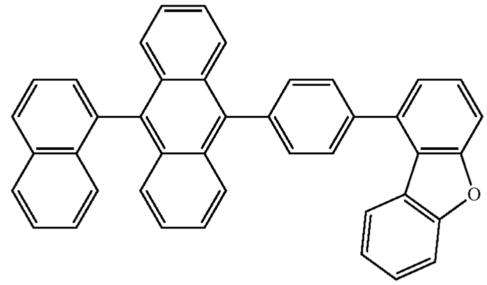
(2-28)
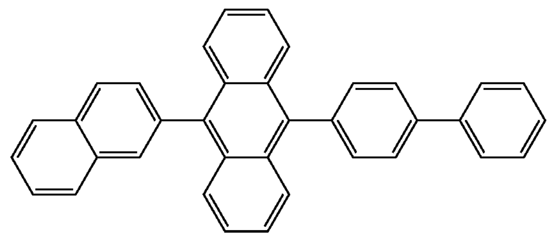
(2-29)
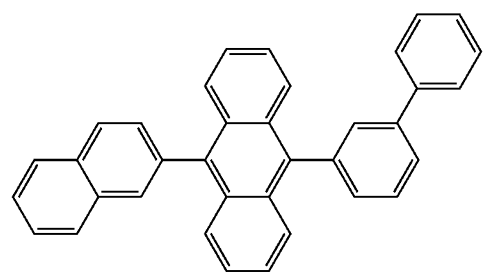
(2-30)
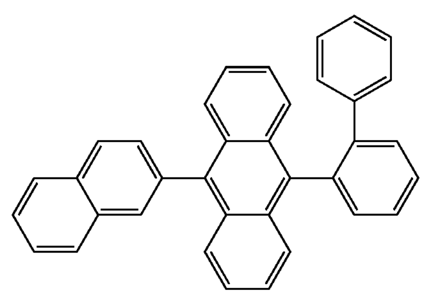
(2-31)
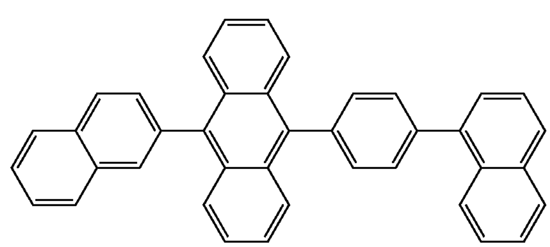

(2-32)
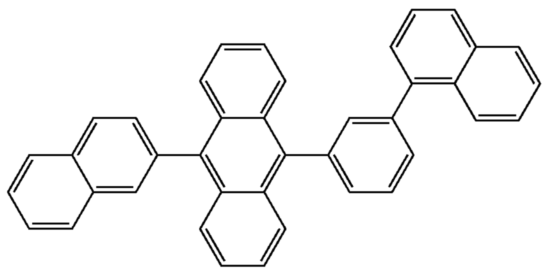
(2-33)
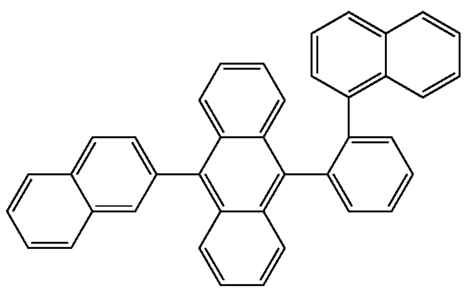
(2-34)
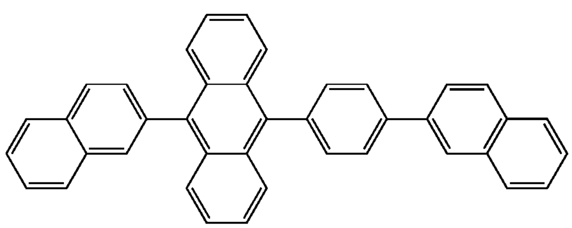
(2-35)
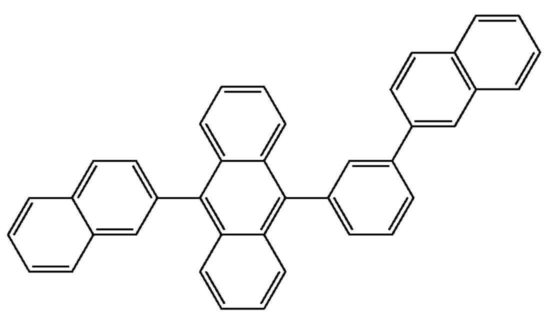
(2-36)
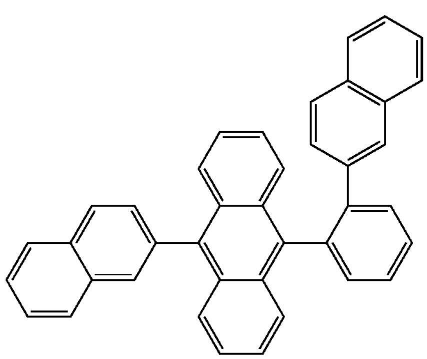
(2-37)
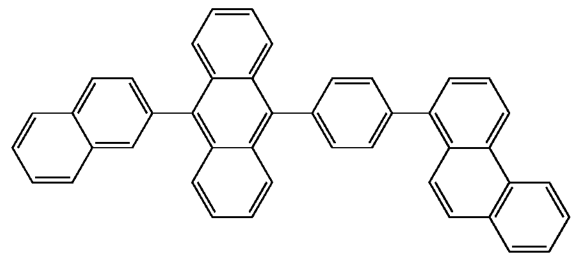
(2-38)
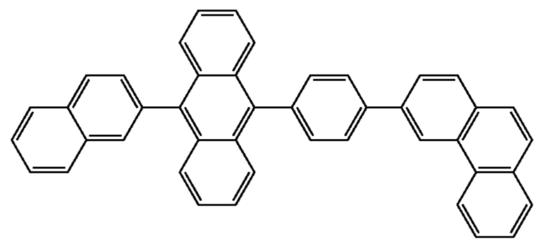
(2-39)
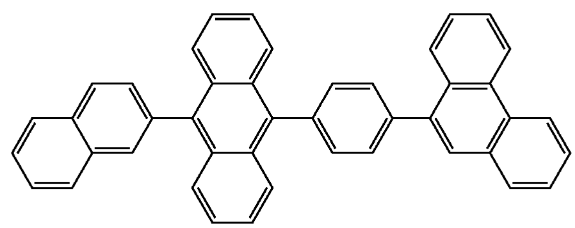
(2-40)
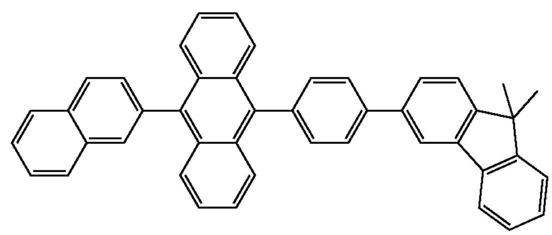
(2-41)
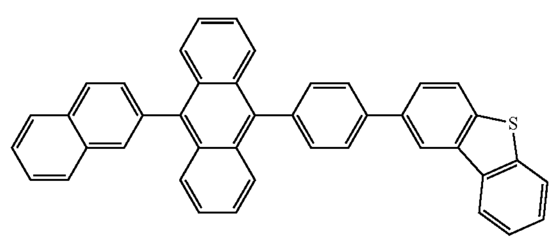
(2-42)
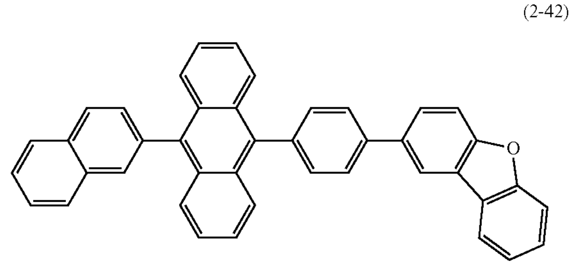

-continued
(2-43)
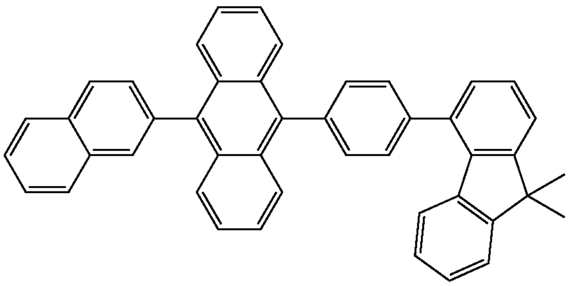
(2-44)
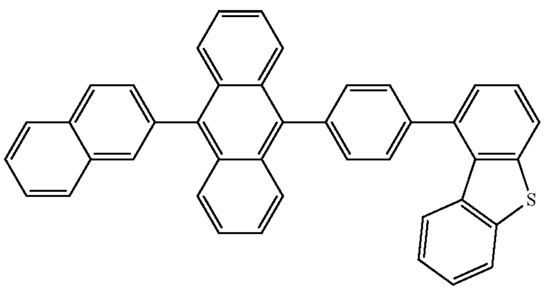
(2-45)
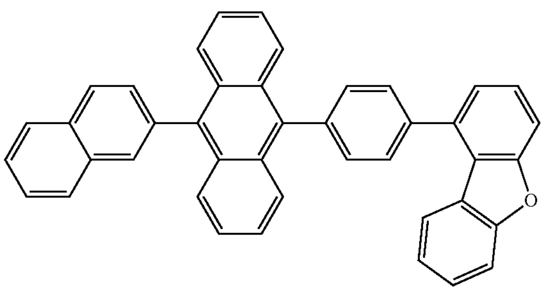
(2-46)
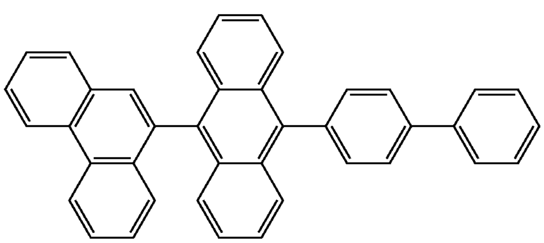
(2-47)
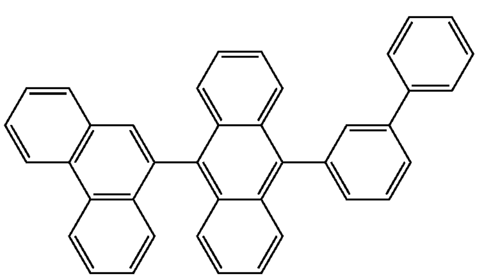
-continued
(2-48)
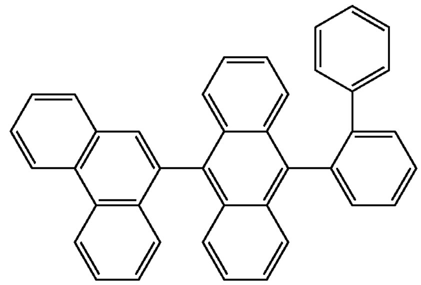
(2-49)
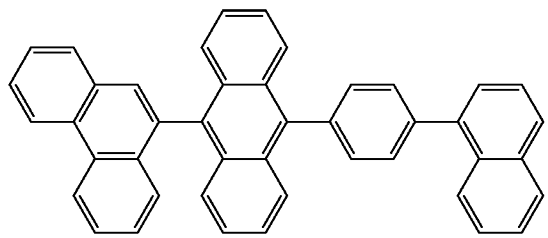
(2-50)
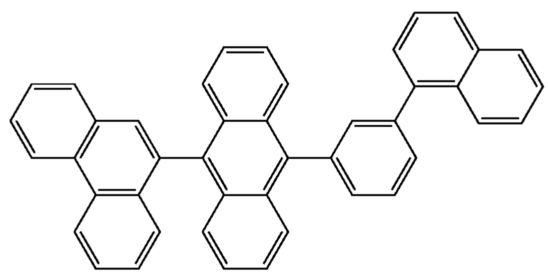
(2-51)
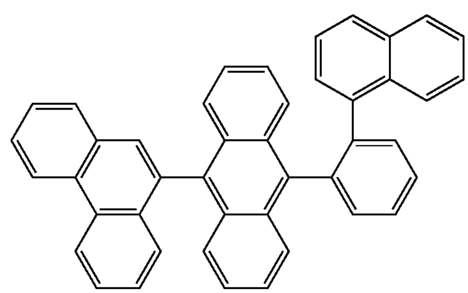
(2-52)
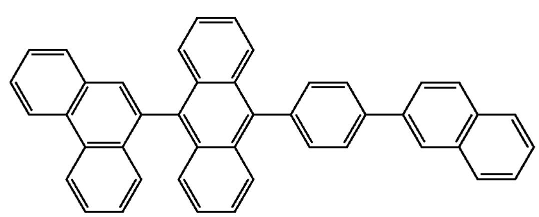

-continued
(2-53)
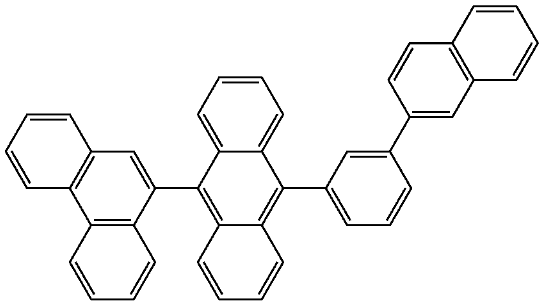
(2-54)
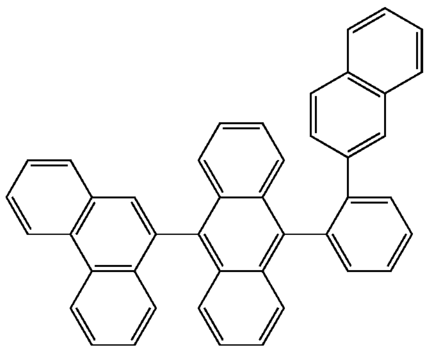
(2-55)
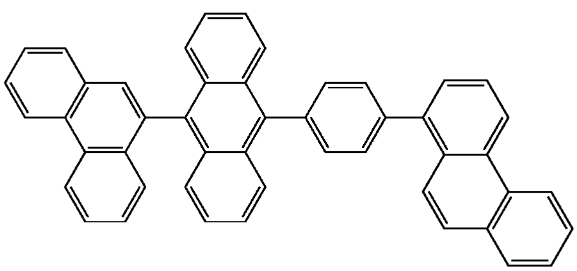
(2-55)
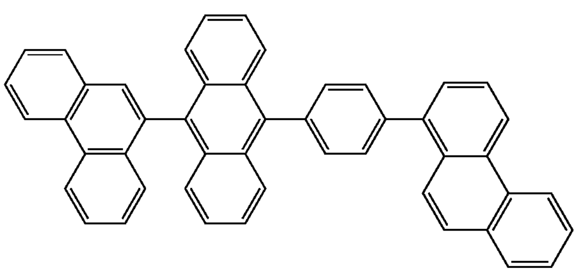
(2-56)
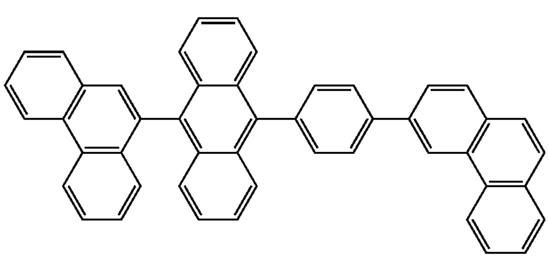
-continued
(2-57)
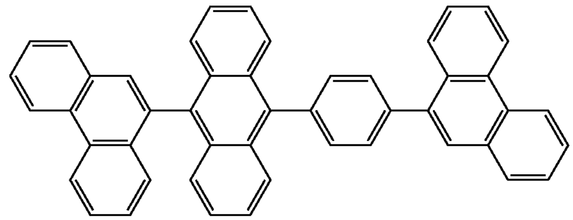
(2-58)
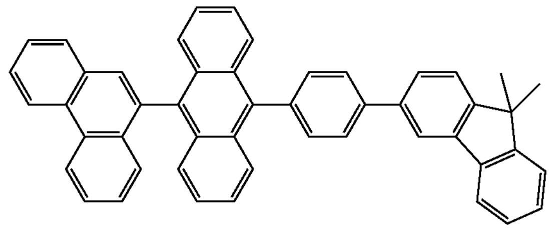
(2-59)
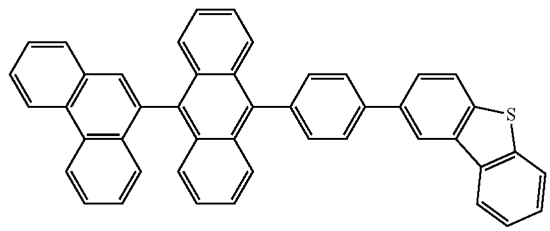
(2-60)
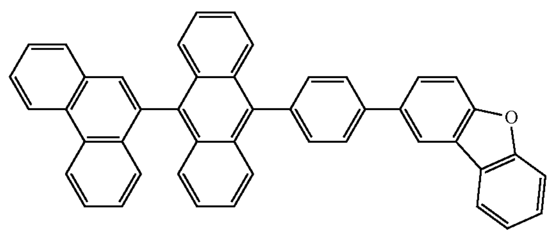
(2-61)
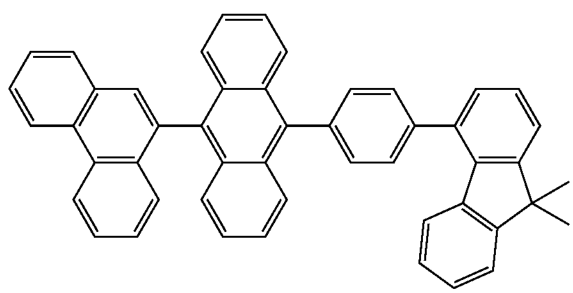
(2-62)
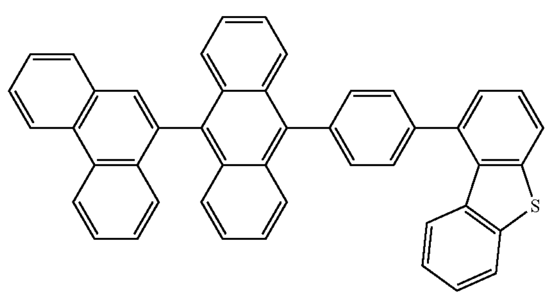

(2-63)
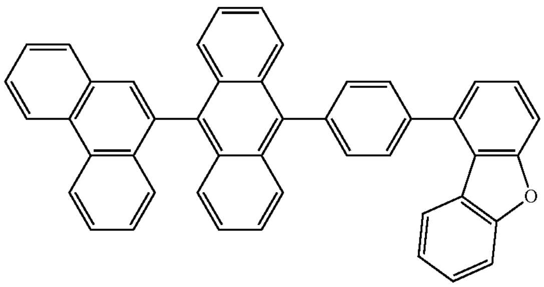
(2-64)
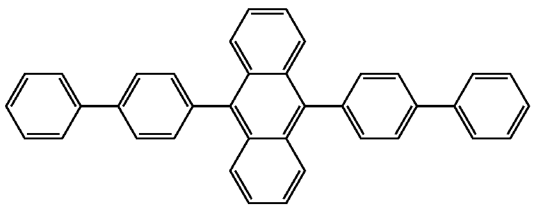
(2-65)
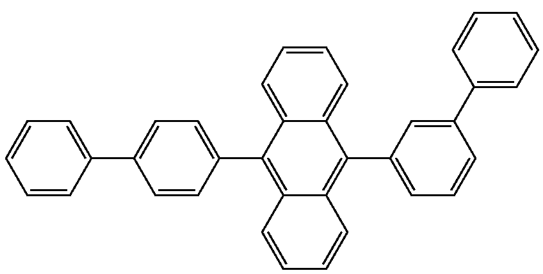
(2-66)
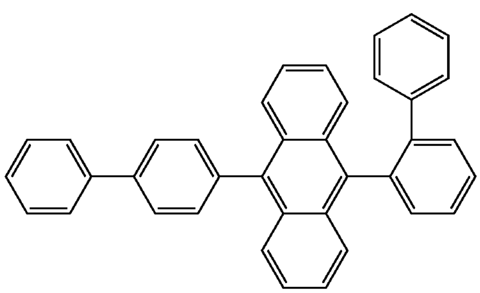
(2-67)
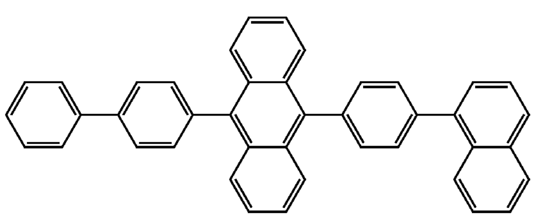
(2-68)
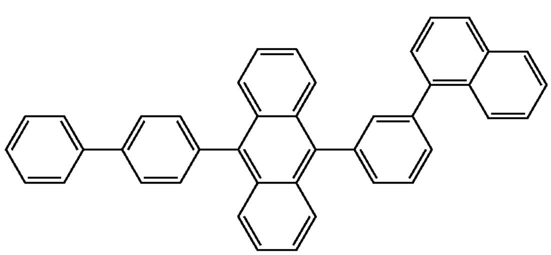
(2-69)
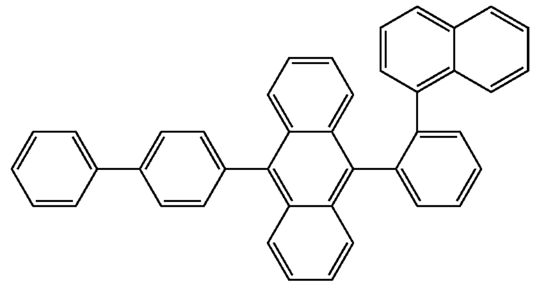
(2-70)
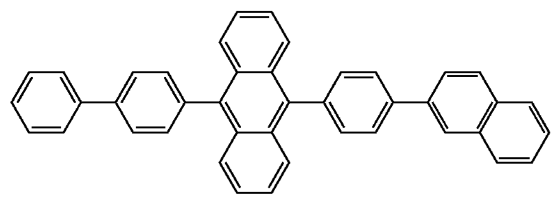
(2-71)
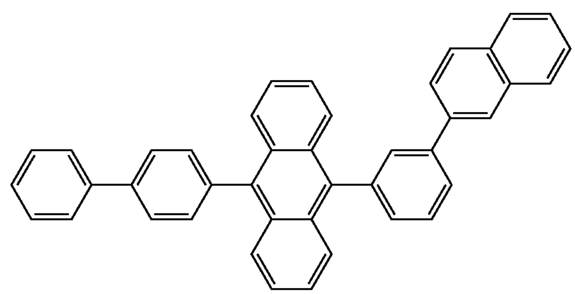
(2-72)
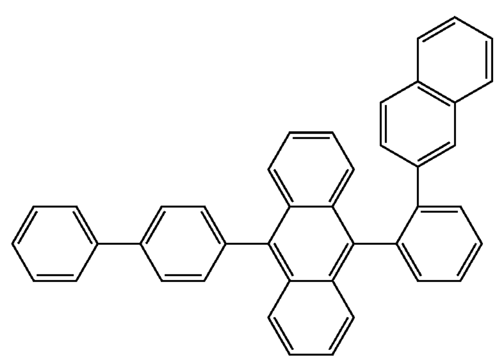
(2-73)
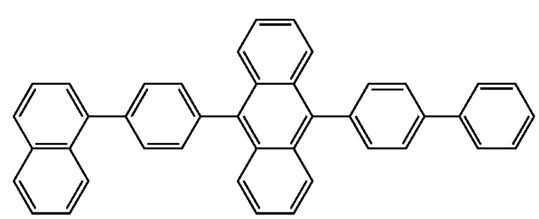

-continued
(2-74)
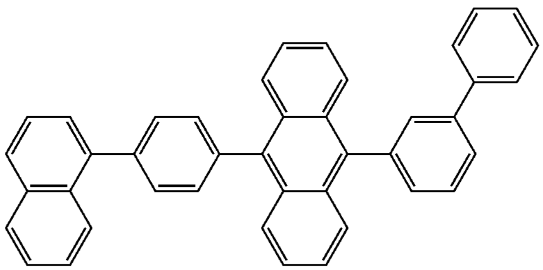
(2-75)
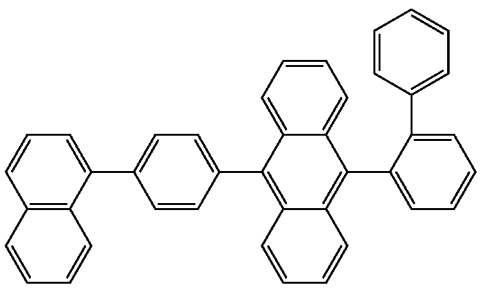
(2-76)
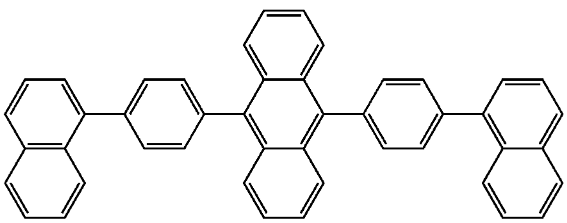
(2-77)
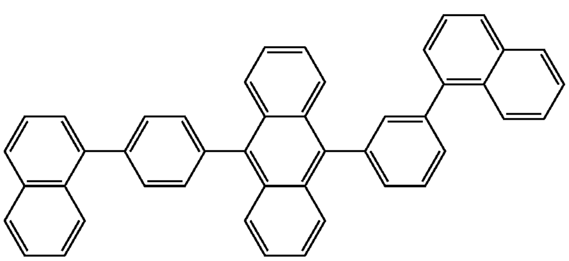
(2-78)
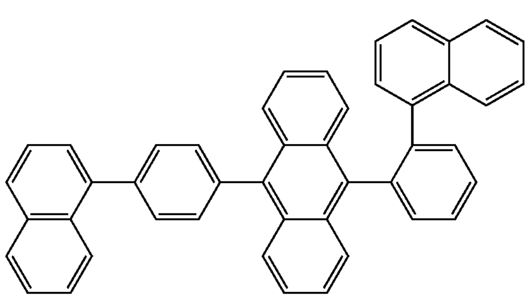
(2-79)
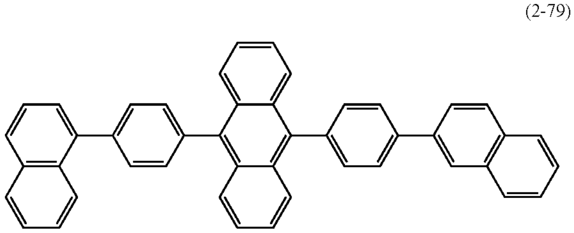
-continued
(2-80)
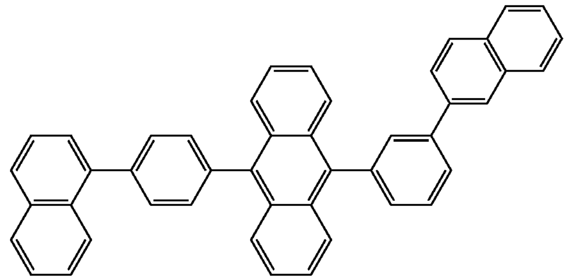
(2-81)
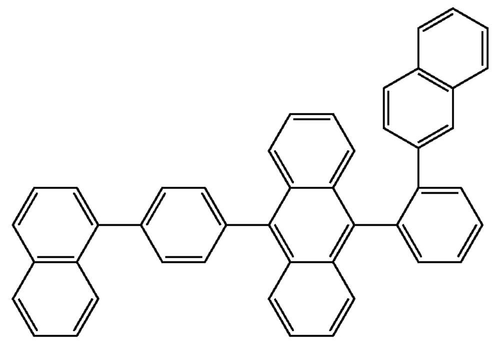
(2-82)
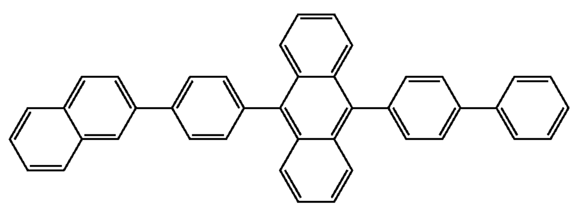
(2-83)
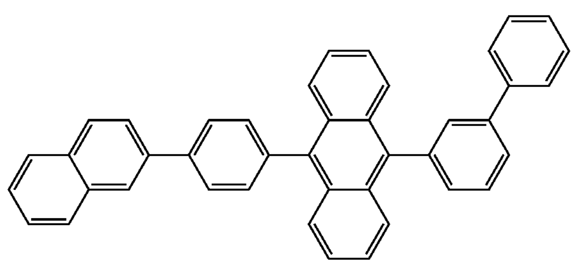
(2-84)
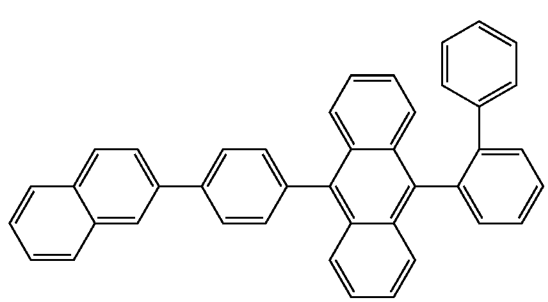

(2-85)
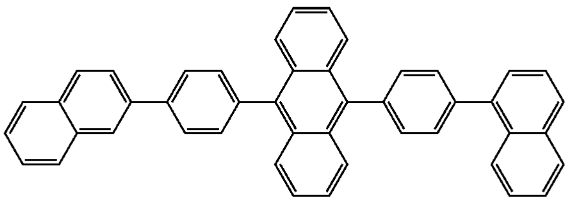
(2-86)
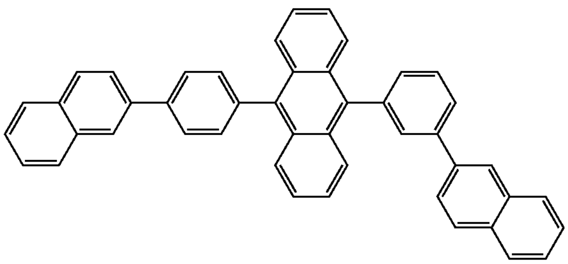
(2-87)
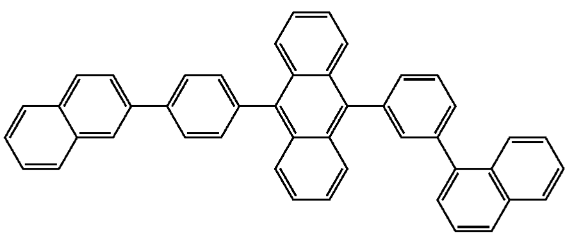
(2-88)
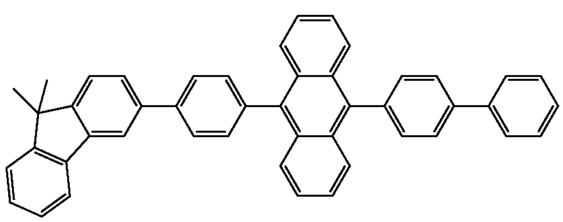
(2-89)
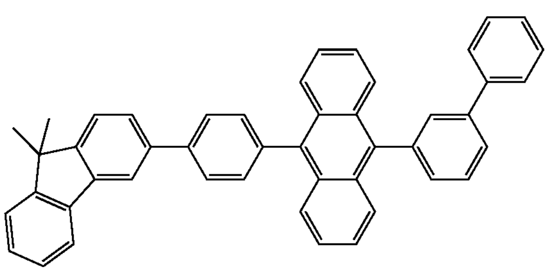
(2-90)
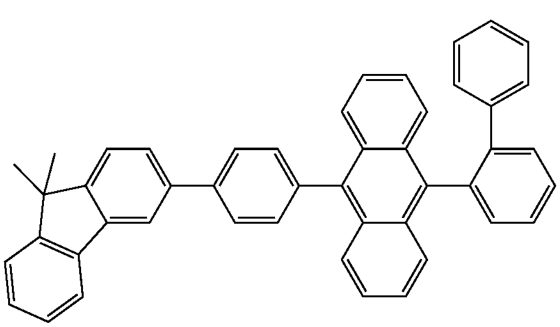
(2-91)
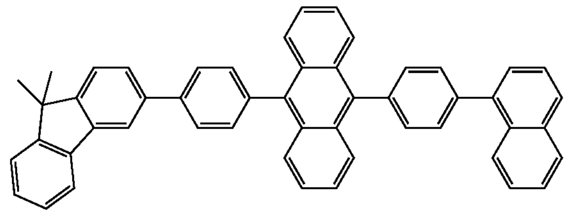
(2-92)
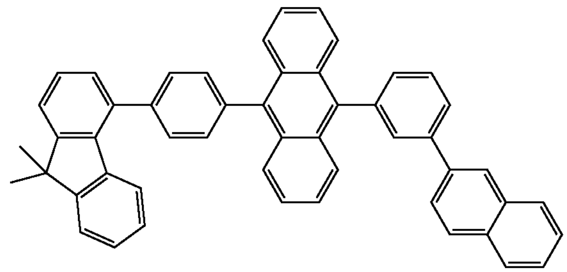
(2-93)
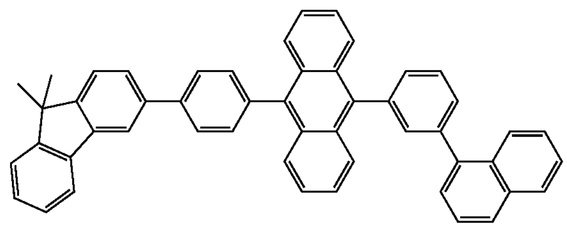
(2-94)
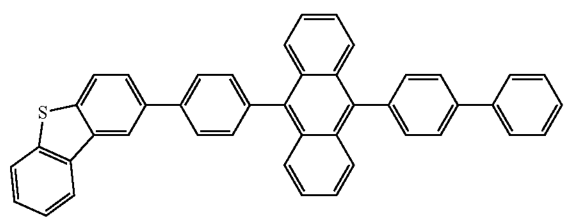
(2-95)
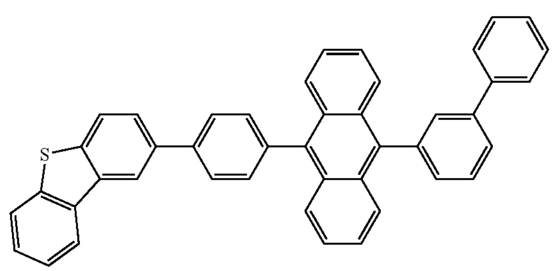
(2-96)
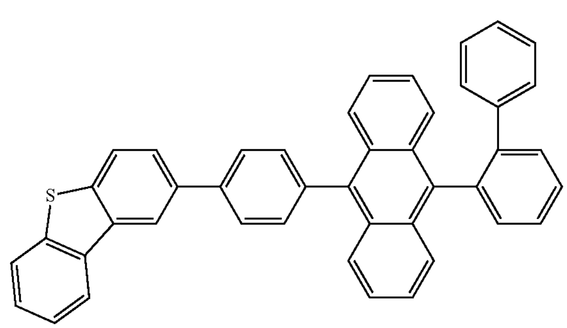

-continued
(2-97)
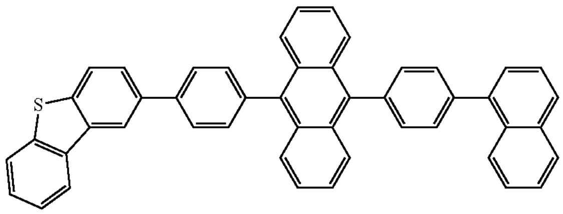
(2-98)
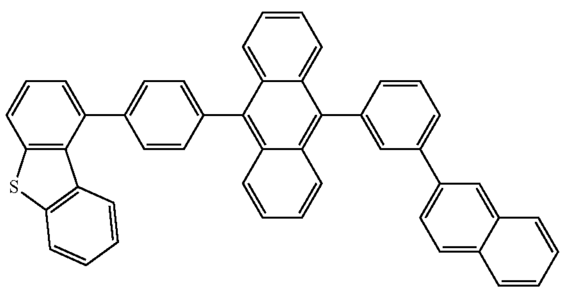
(2-99)
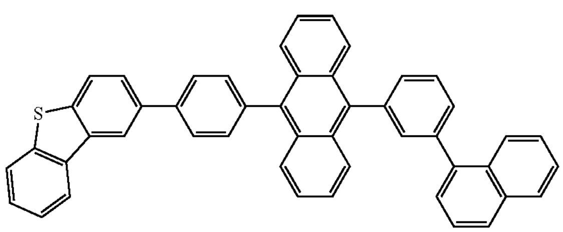
(2-100)
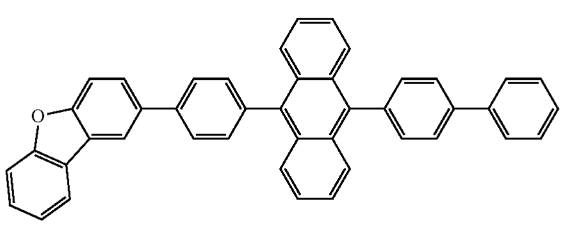
(2-101)
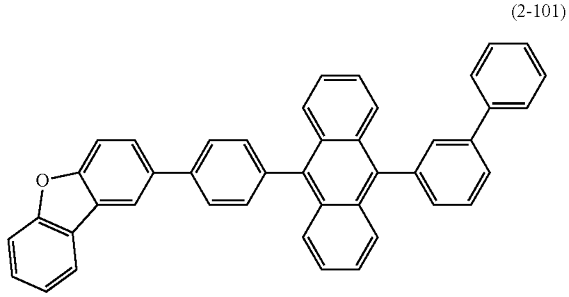
-continued
(2-102)
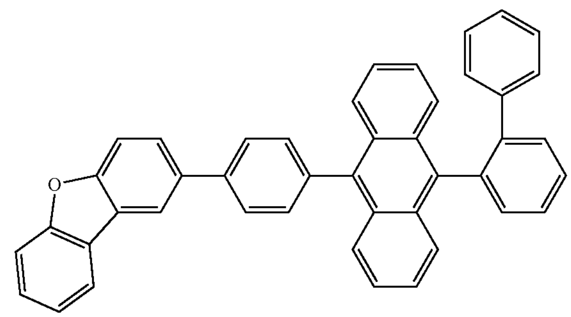
(2-103)
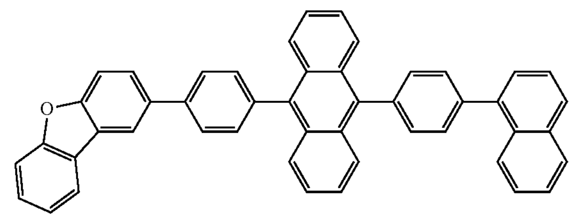
(2-104)
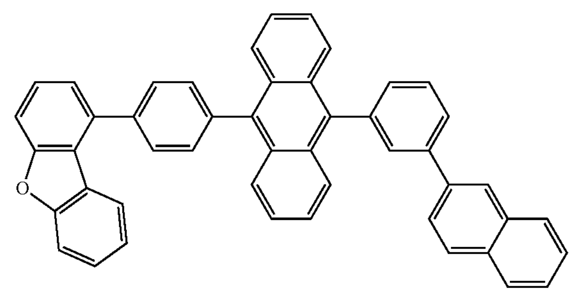
(2-105)
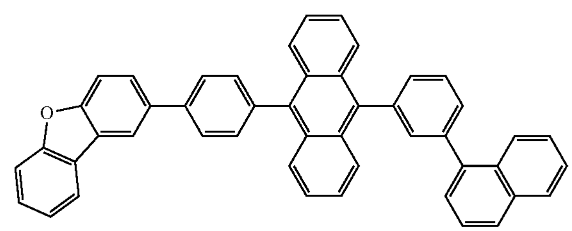
(2-106)
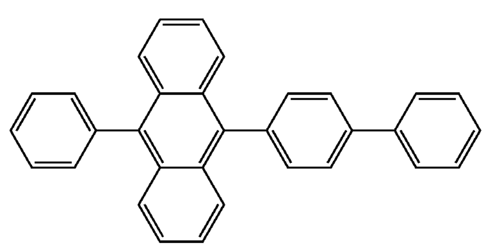

-continued
(2-107)
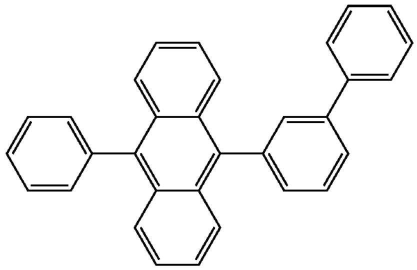
(2-108)
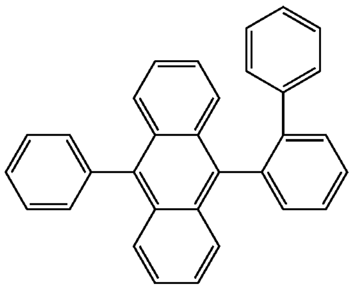
(2-109)
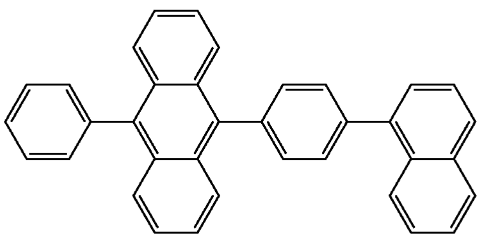
(2-110)
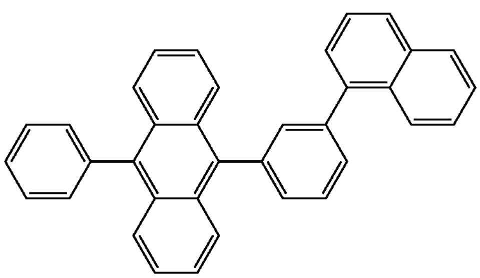
(2-111)
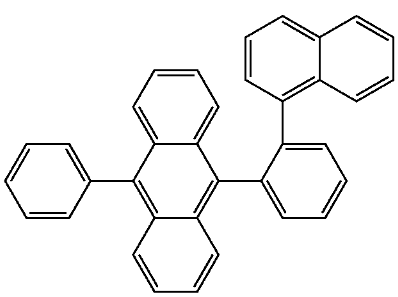
(2-112)
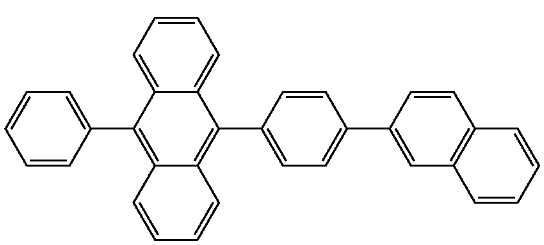
-continued
(2-113)
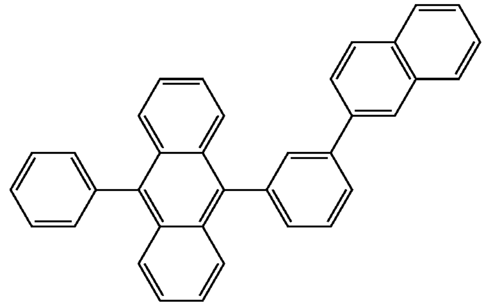
(2-114)
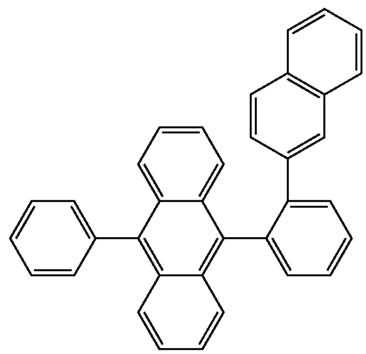
(2-115)
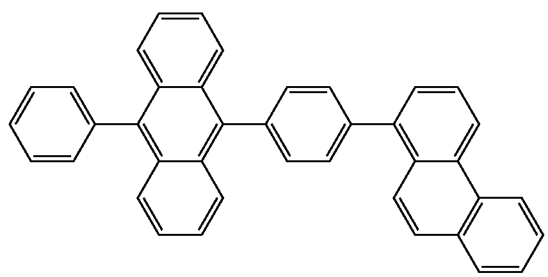
(2-116)
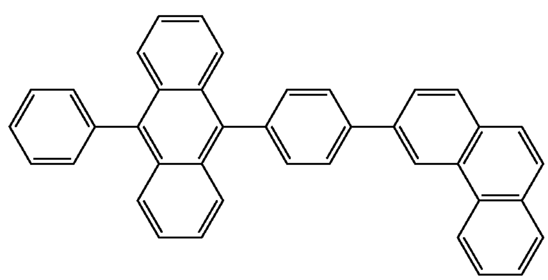
(2-117)
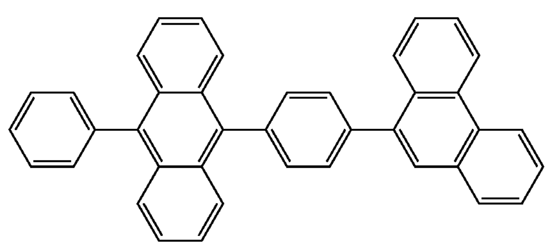

-continued
(2-118)
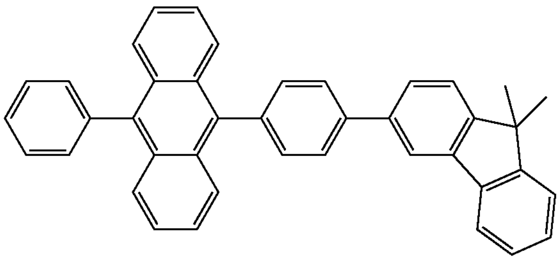
(2-119)
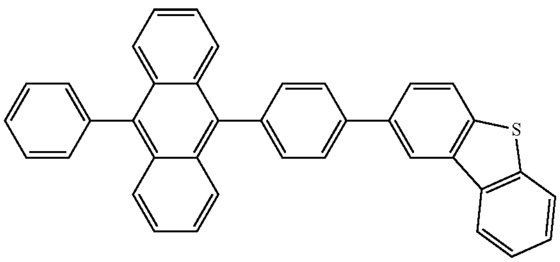
(2-120)
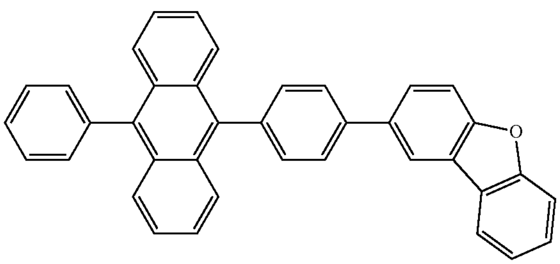
(2-121)
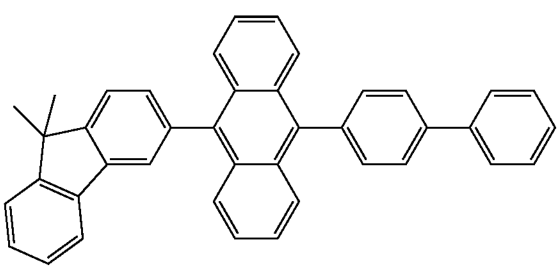
(2-122)
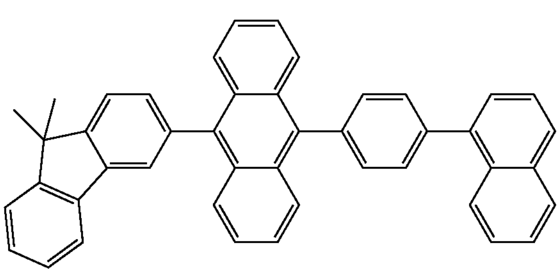
-continued
(2-123)
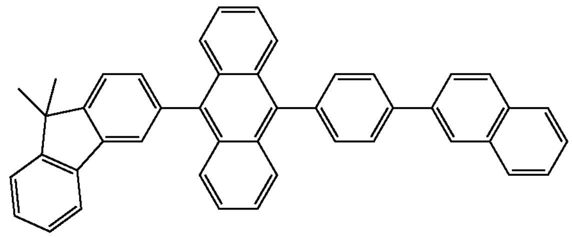
(2-124)
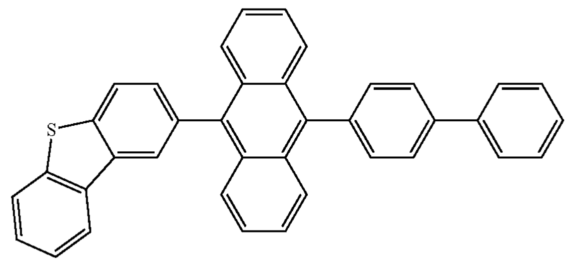
(2-125)
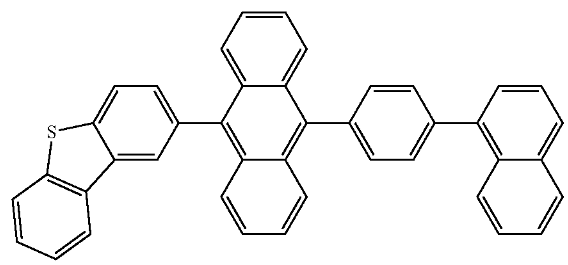
(2-126)
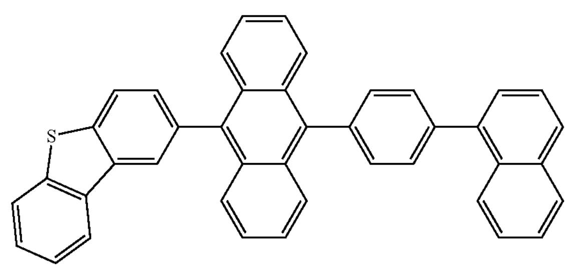
(2-127)
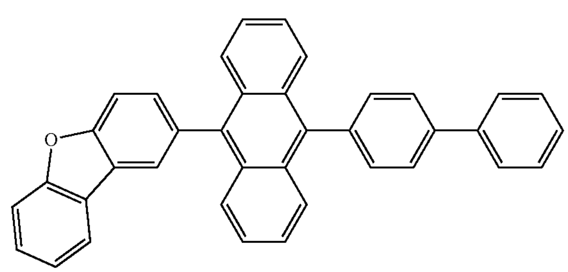

-continued
(2-128)
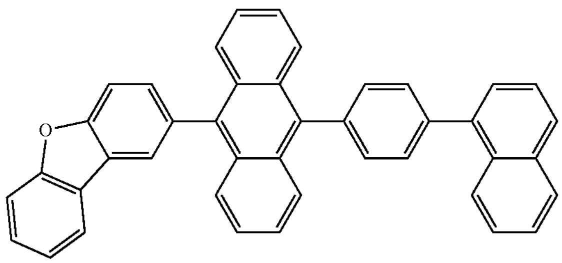
(2-129)
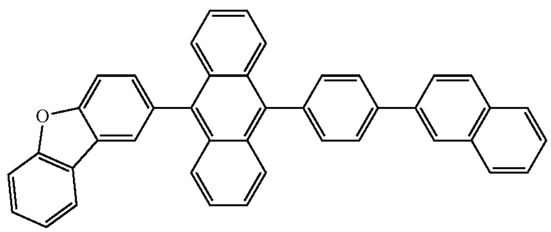
(2-130)
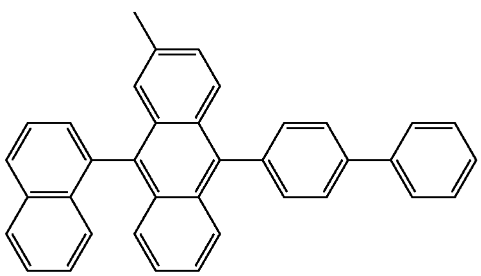
(2-131)
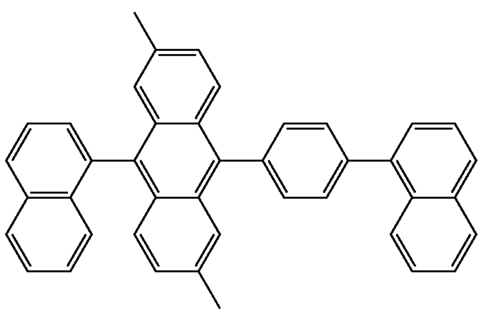
(2-132)
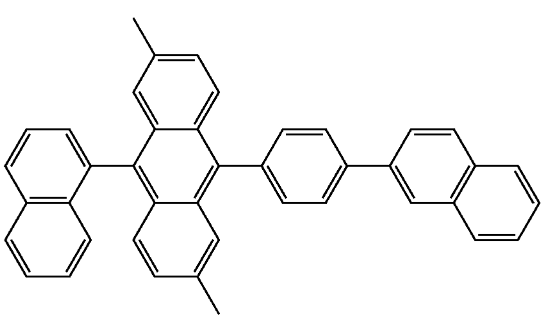
-continued
(2-133)
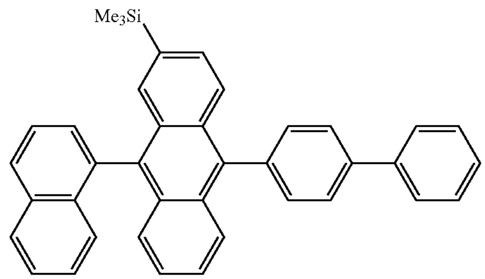
(2-134)
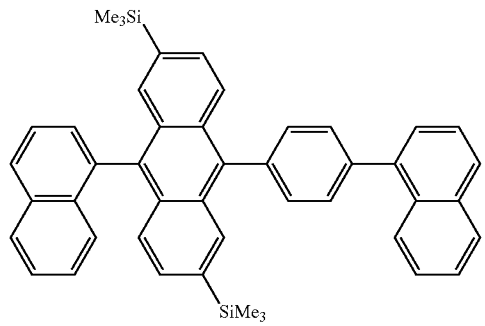
(2-135)
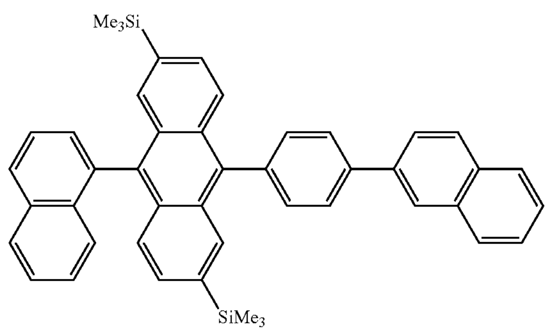
(2-136)
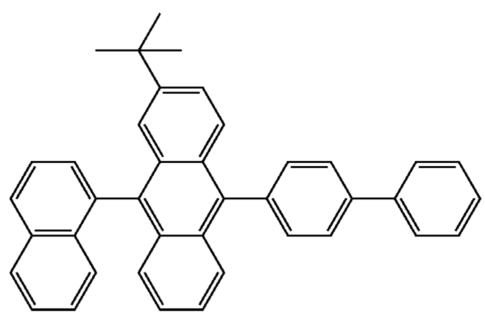
(2-137)
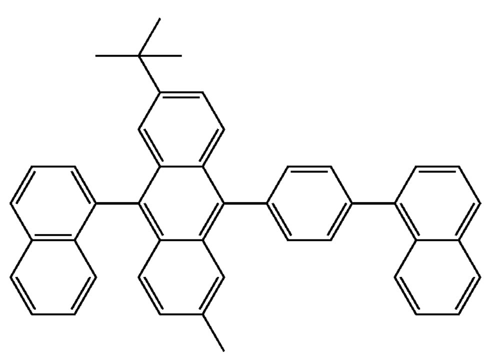

(2-138)
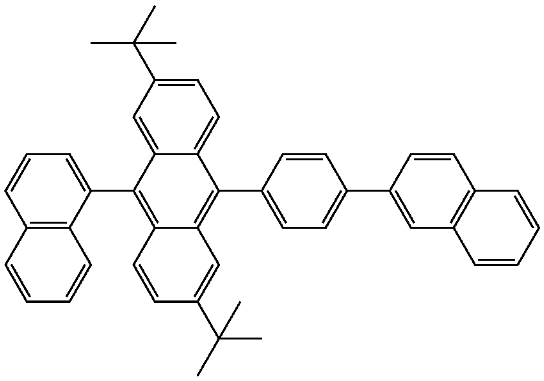
(2-139)
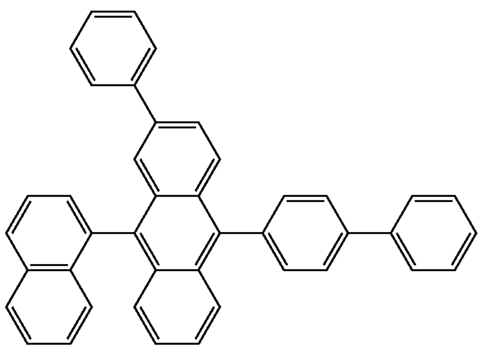
(2-140)
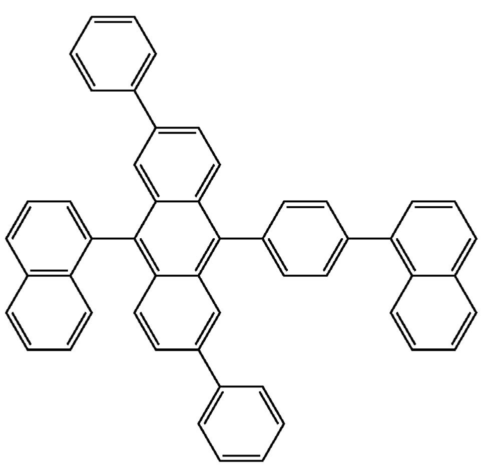
(2-141)
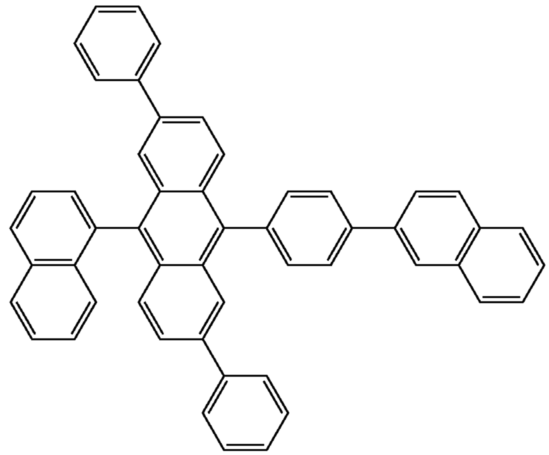
(2-142)
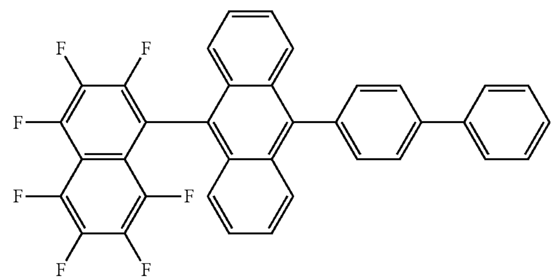
(2-143)
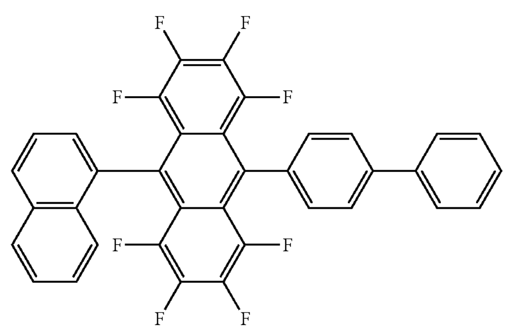
(2-144)
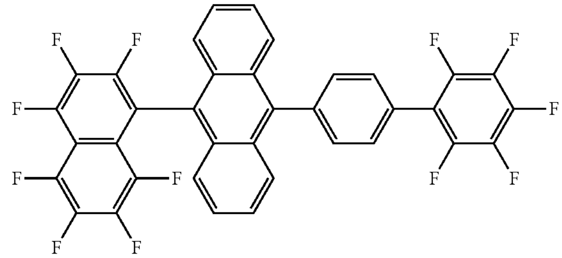

-continued (2-145)

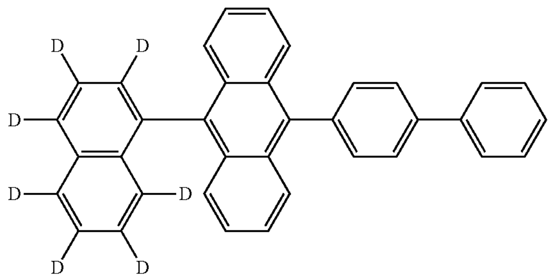

(2-146)

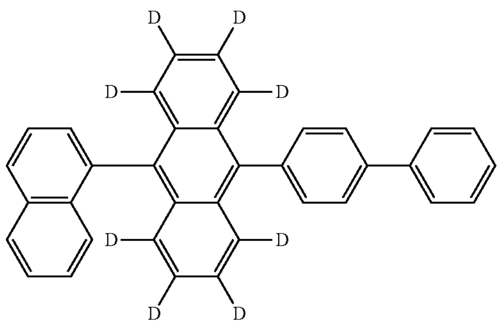

(2-147)

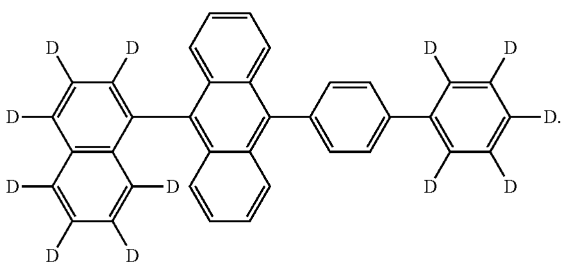

6. The organic light emitting element as claimed in claim 1, wherein:

the organic light emitting element includes:

an anode and a cathode facing each other;

an emission layer between the anode and the cathode;

a hole transfer layer between the anode and the emission layer; and an electron transfer layer and a hole blocking layer between the cathode and the emission layer, the hole blocking layer includes the first compound, and the emission layer includes the second compound.

7. An organic light emitting device, comprising:

a substrate;

gate lines on the substrate;

data lines and a driving voltage line crossing the gate lines;

a switching thin film transistor connected with one of the gate lines and data lines;

a driving thin film transistor connected with the switching thin film transistor and the driving voltage line; and an organic light emitting element connected with the driving thin film transistor, wherein the organic light emitting element includes:

a first compound represented by one of the following Chemical Formula 1-6 to 1-59, 1-123 to 1-125, and 1-135 to Chemical Formula 1-188, and a second compound represented by the following Chemical Formula 2:

(1-6)

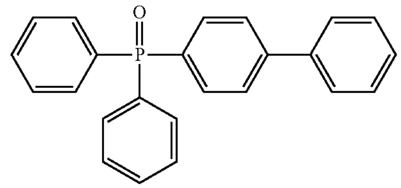

(1-7)

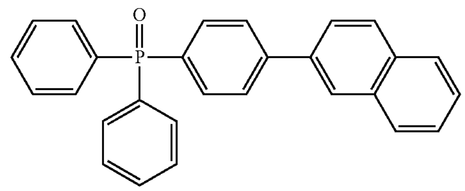

(1-8)

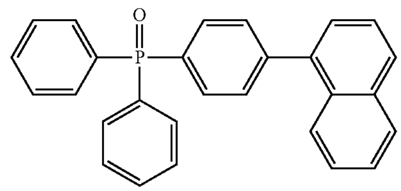

(1-9)

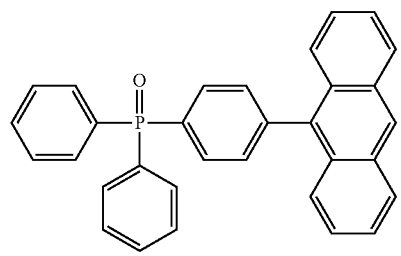

(1-10)

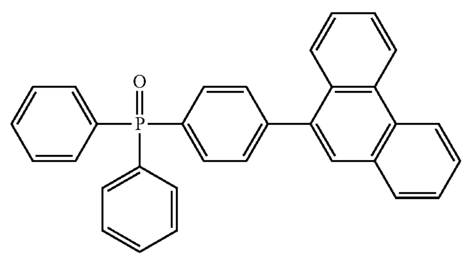

(1-11)

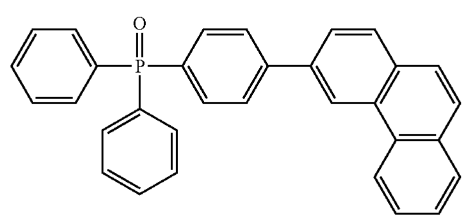

(1-12)

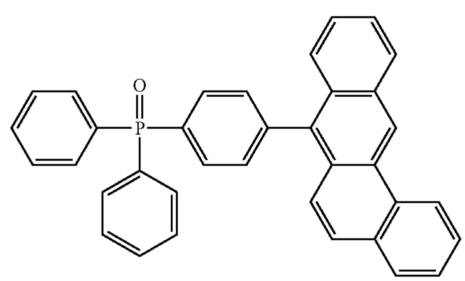

-continued
(1-13)
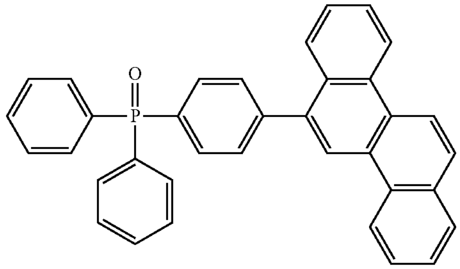
(1-14)
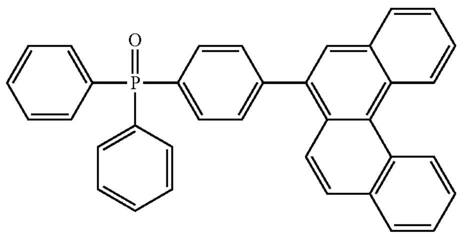
(1-15)
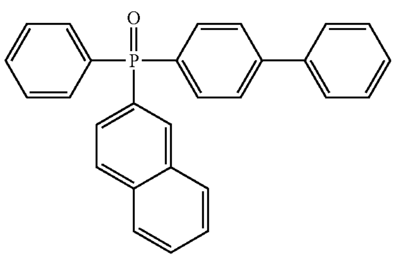
(1-16)
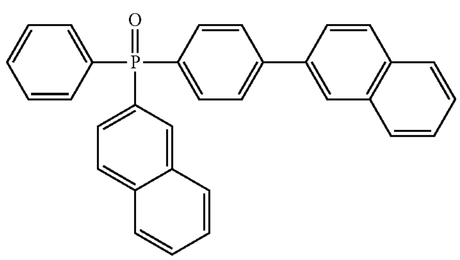
(1-17)
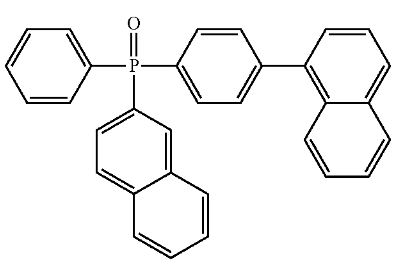
(1-18)
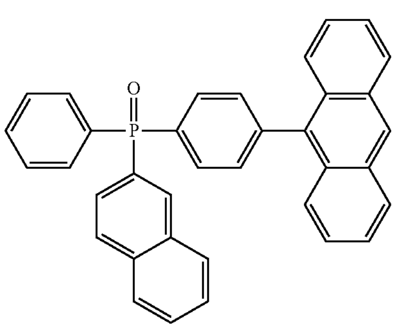
-continued
(1-19)
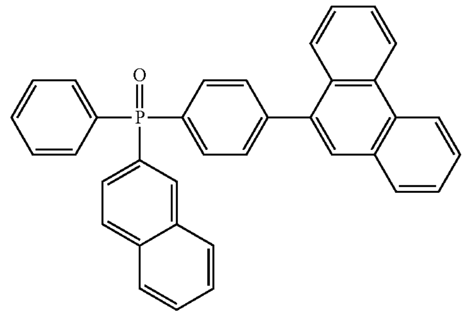
(1-20)
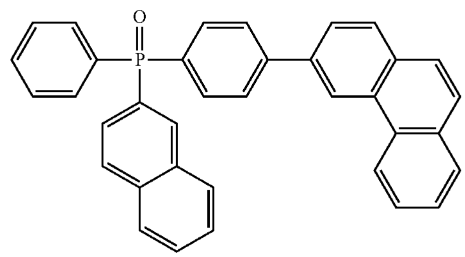
(1-21)
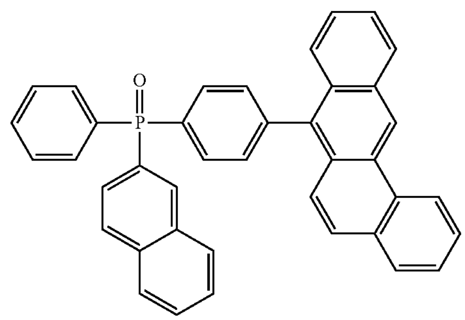
(1-22)
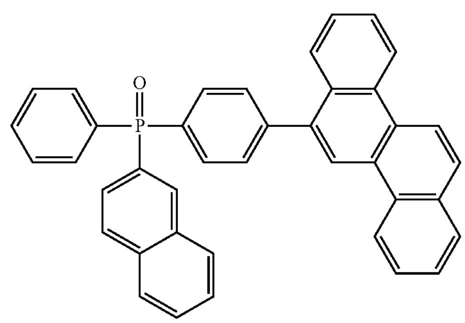
(1-23)
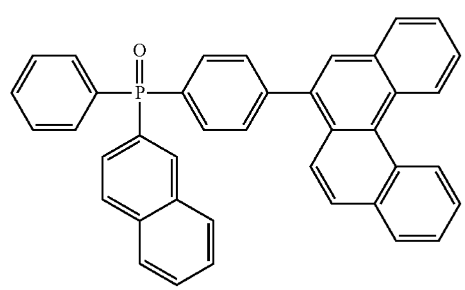

-continued
(1-24)
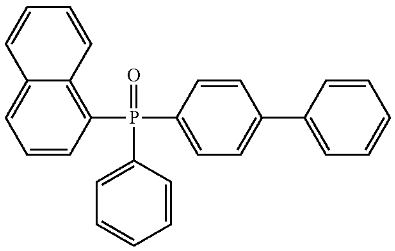
(1-25)
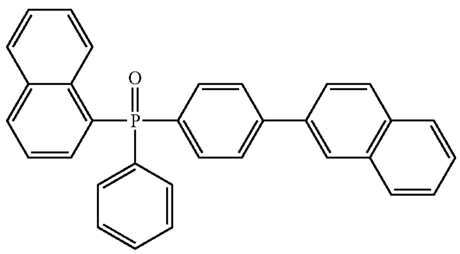
(1-26)
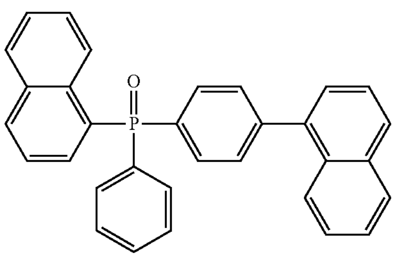
(1-27)
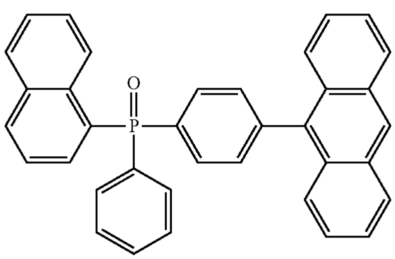
(1-28)
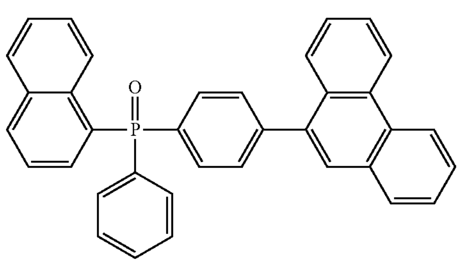
(1-29)
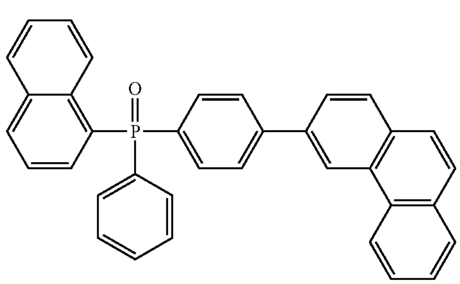
-continued
(1-30)
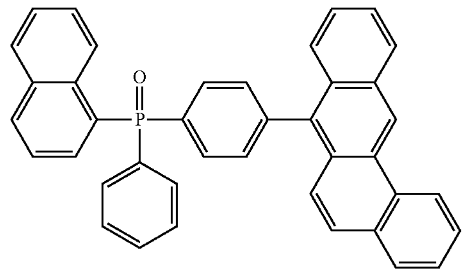
(1-31)
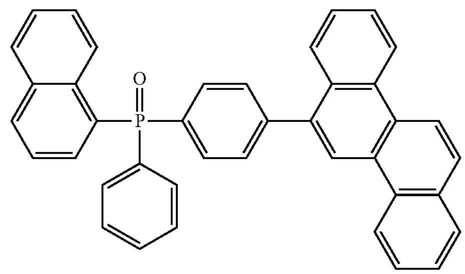
(1-32)
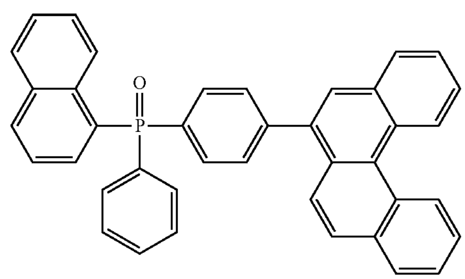
(1-33)
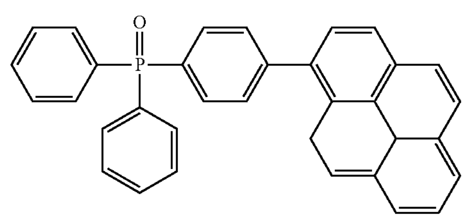
(1-34)
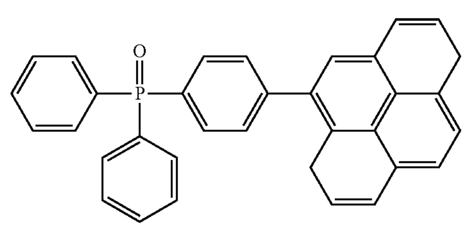
(1-35)
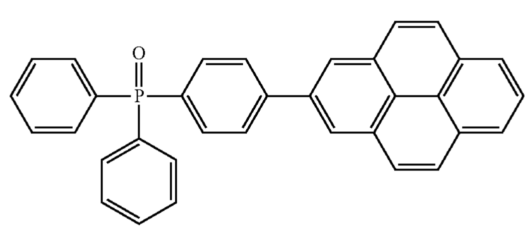

-continued
(1-36)
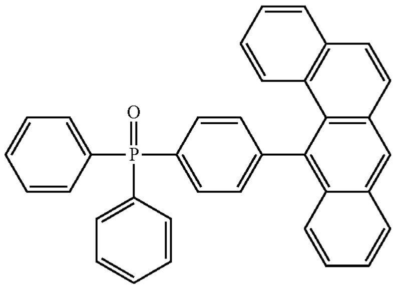
(1-37)
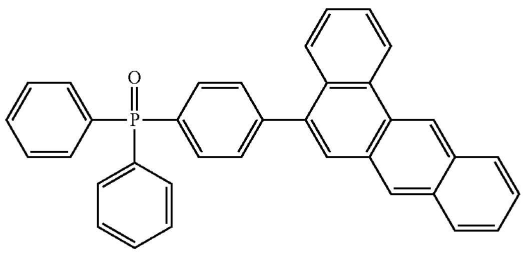
(1-38)
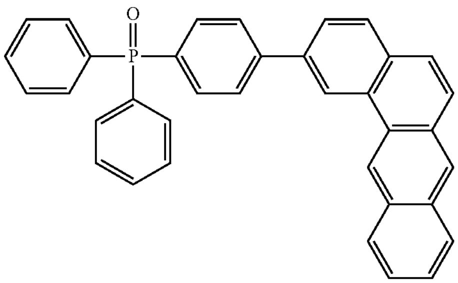
(1-39)
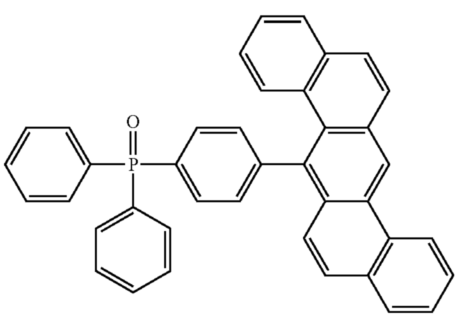
(1-40)
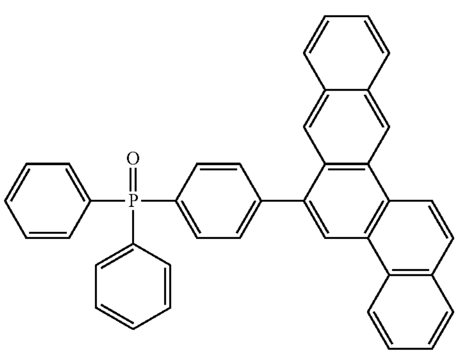
-continued
(1-41)
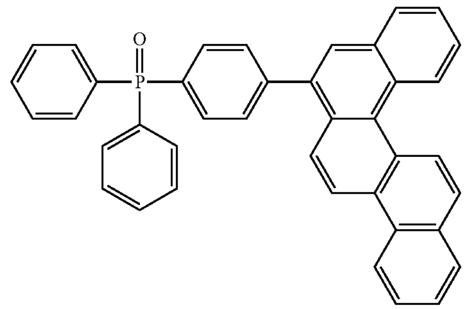
(1-42)
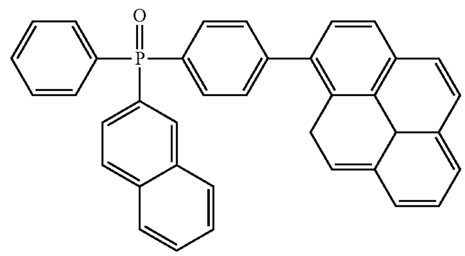
(1-43)
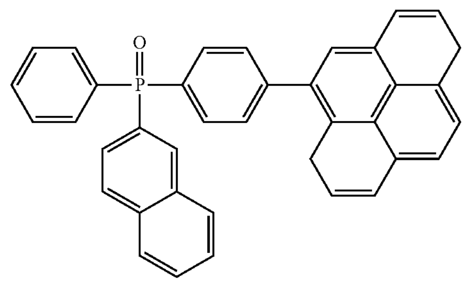
(1-44)
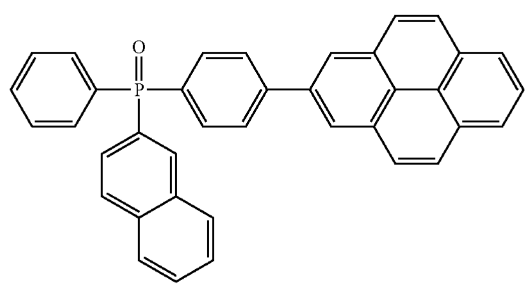
(1-45)
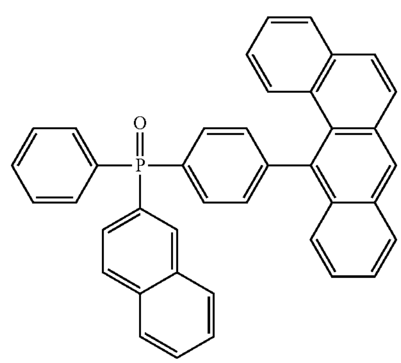

-continued
(1-46)
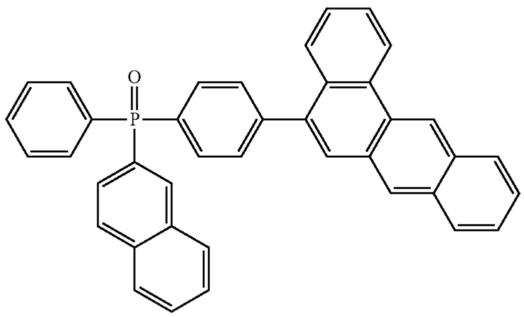
(1-47)
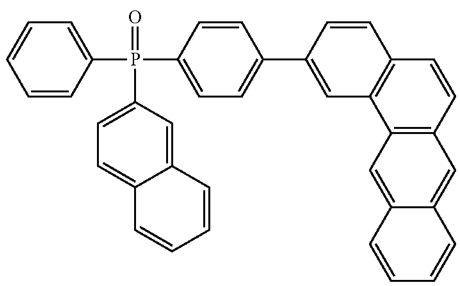
(1-48)
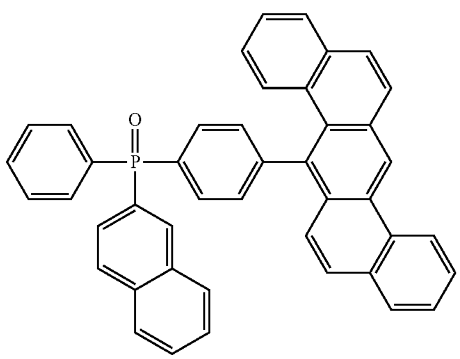
(1-49)
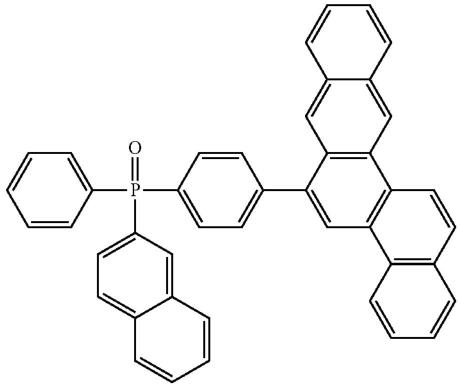
-continued
(1-50)
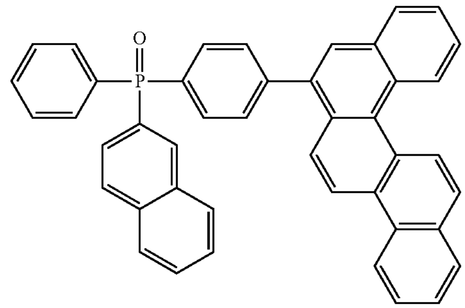
(1-51)
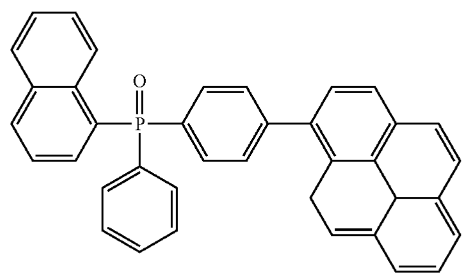
(1-52)
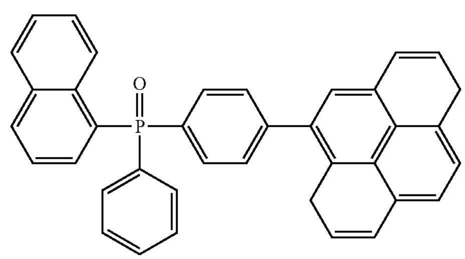
(1-53)
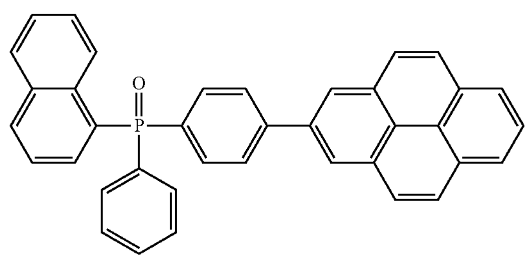
(1-54)
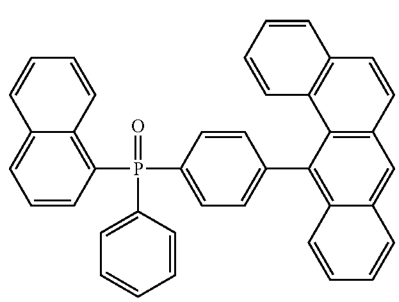

-continued
(1-55)
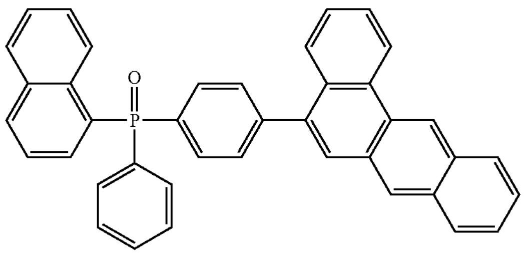
(1-56)
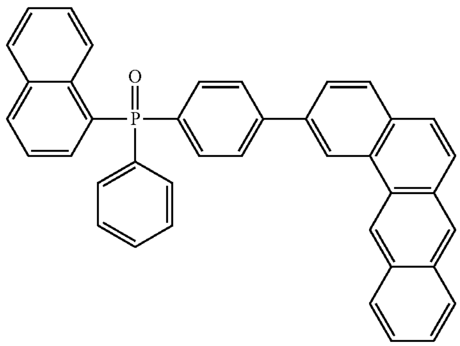
(1-57)
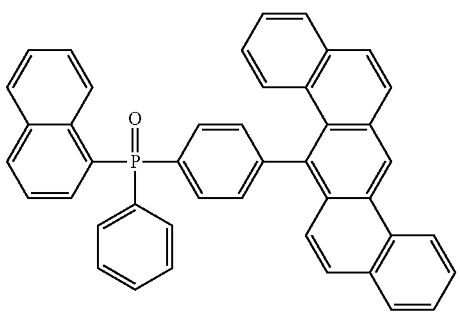
(1-58)
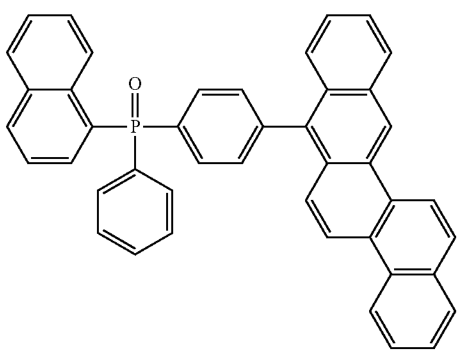
(1-59)
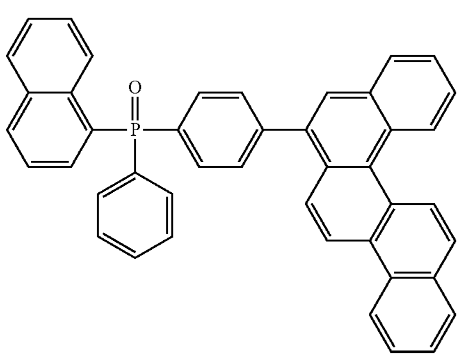
-continued
(1-123)
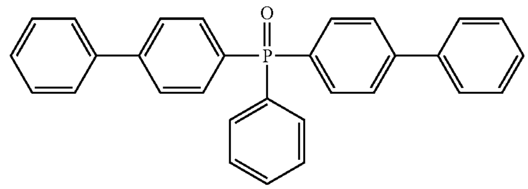
(1-124)
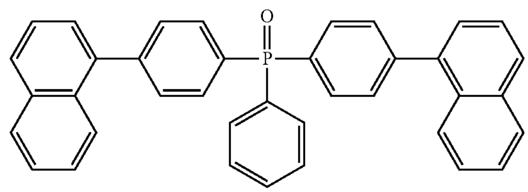
(1-125)
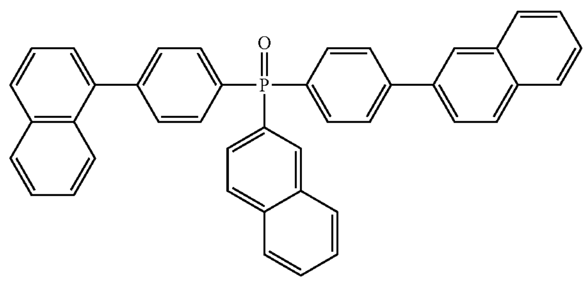
(1-135)
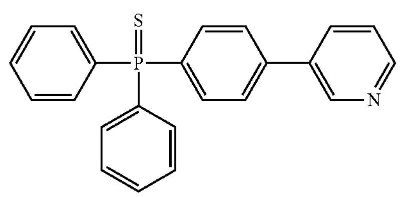
(1-136)
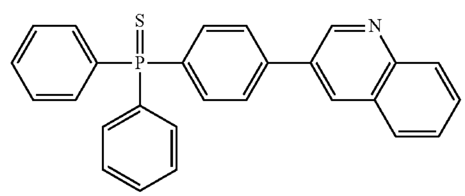
(1-137)
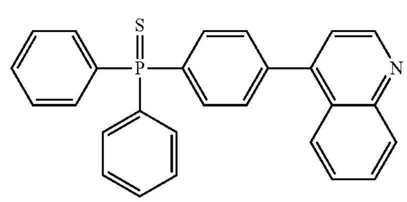
(1-138)
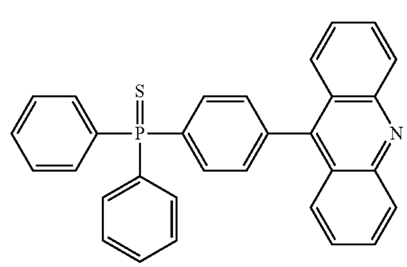

-continued
(1-139)
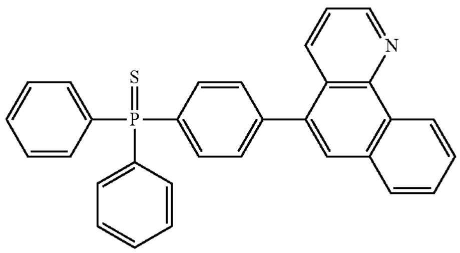
(1-140)
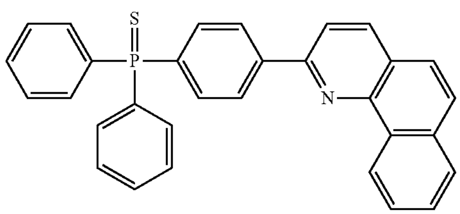
(1-141)
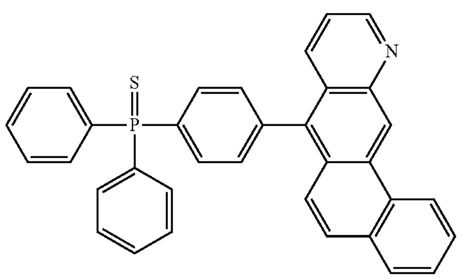
(1-142)
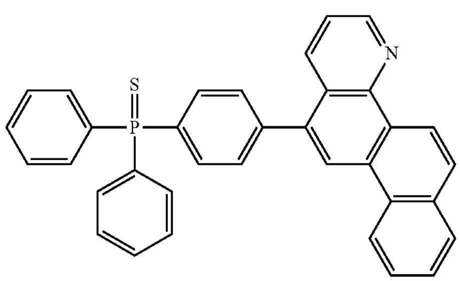
(1-143)
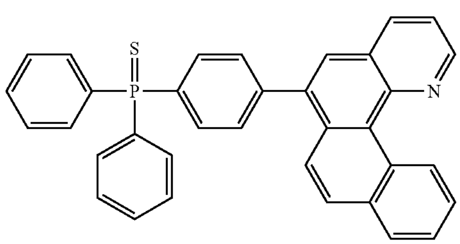
(1-144)
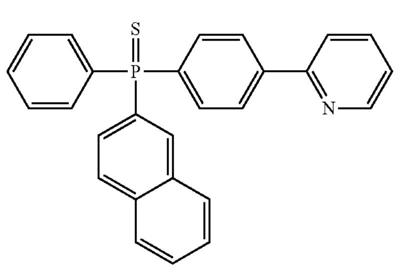
-continued
(1-145)
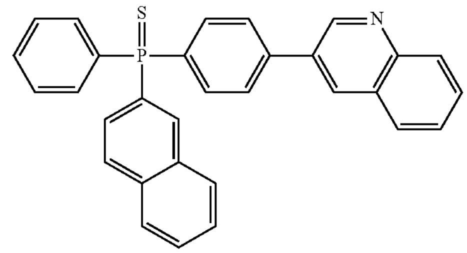
(1-146)
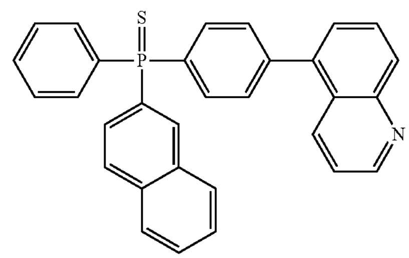
(1-147)
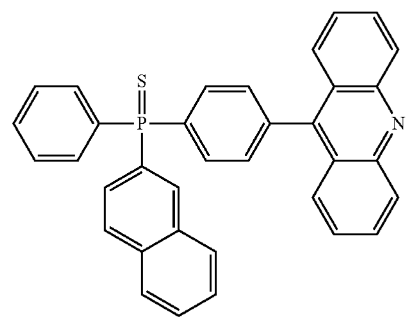
(1-148)
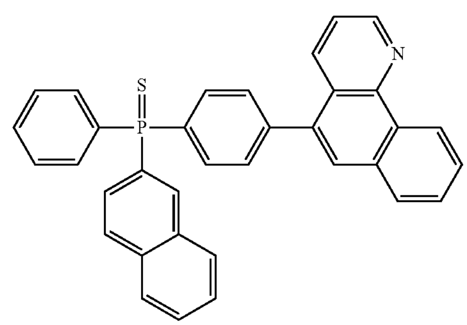
(1-149)
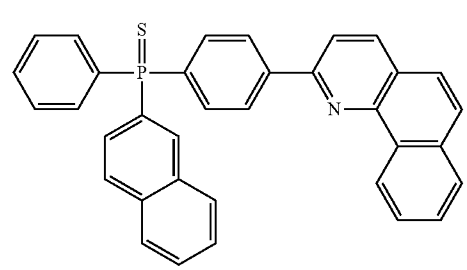

-continued
(1-150)
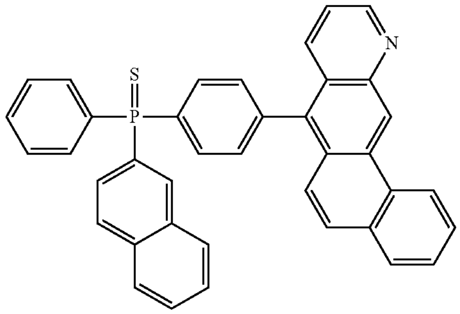
(1-151)
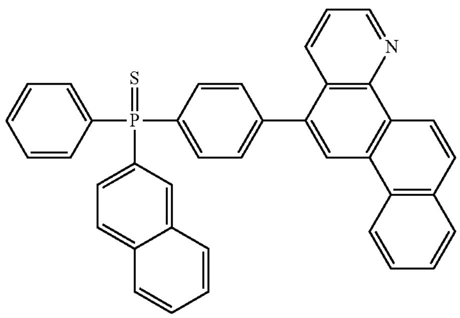
(1-152)
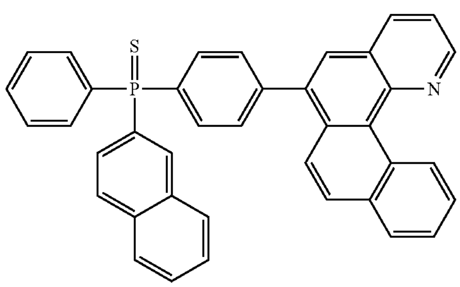
(1-153)
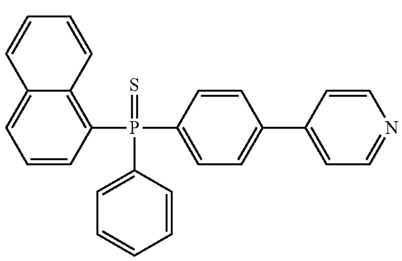
(1-154)
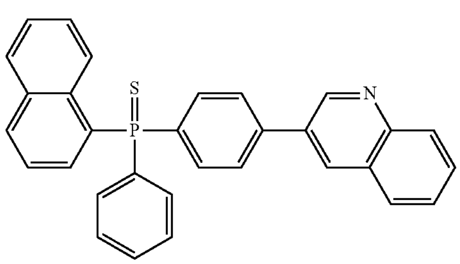
-continued
(1-155)
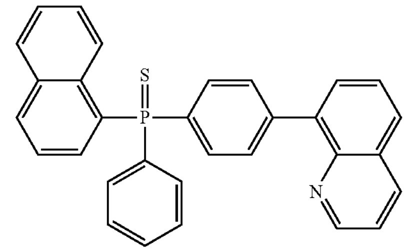
(1-156)
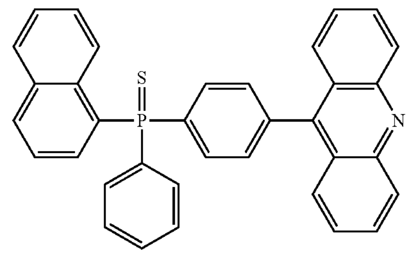
(1-157)
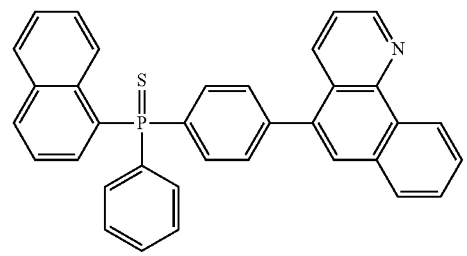
(1-158)
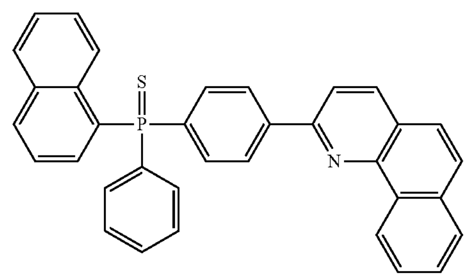
(1-159)
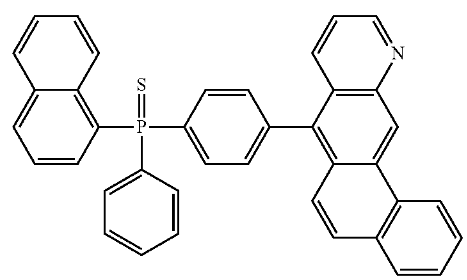
(1-160)
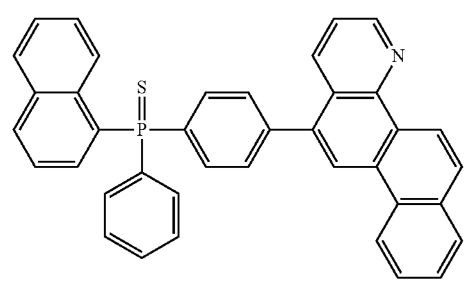

-continued
(1-161)
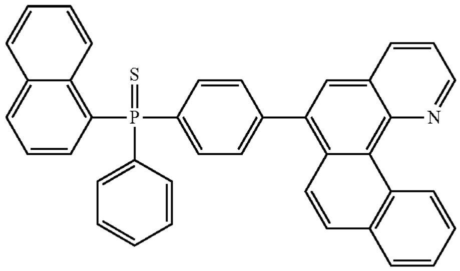
(1-162)
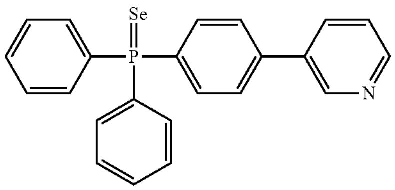
(1-163)
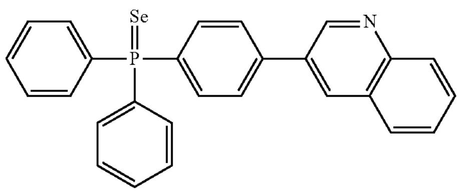
(1-164)
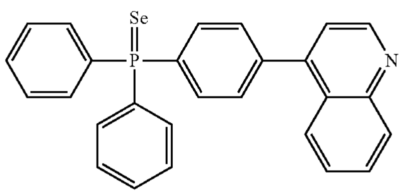
(1-165)
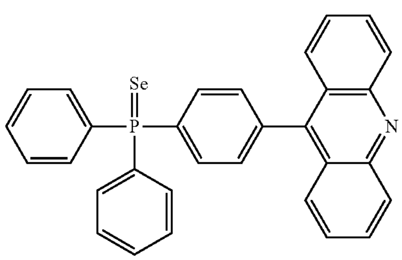
(1-166)
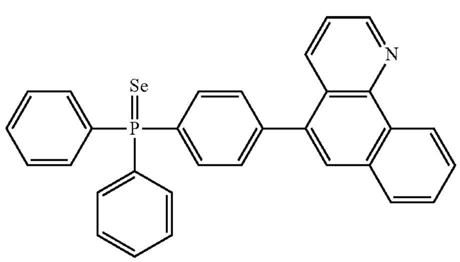
(1-167)
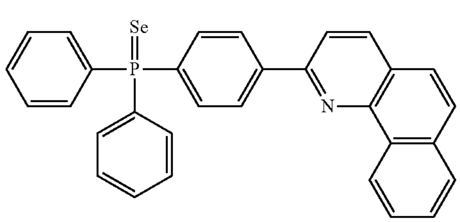
-continued
(1-168)
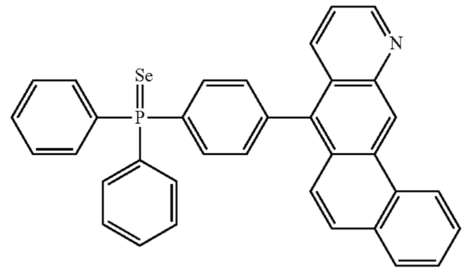
(1-169)
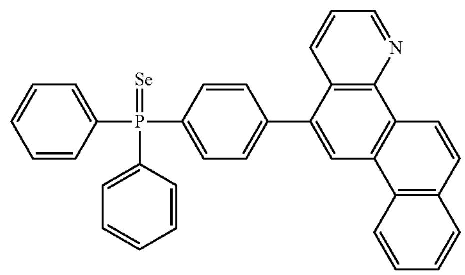
(1-170)
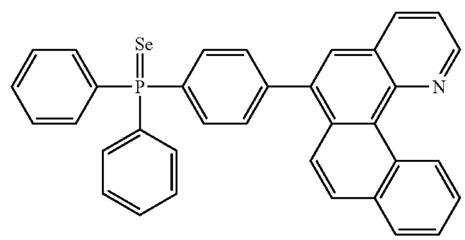
(1-171)
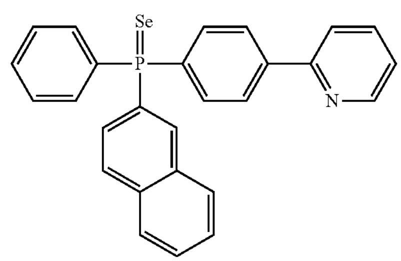
(1-172)
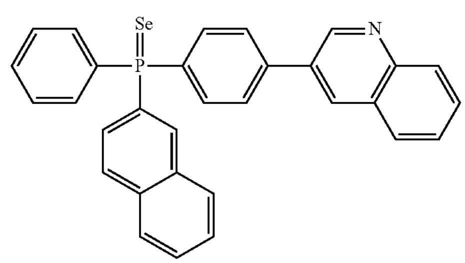
(1-173)
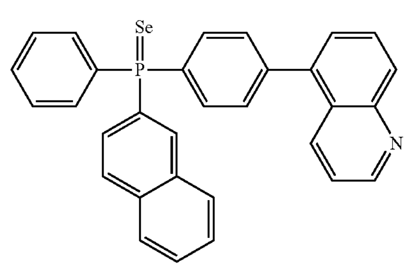

-continued
(1-174)
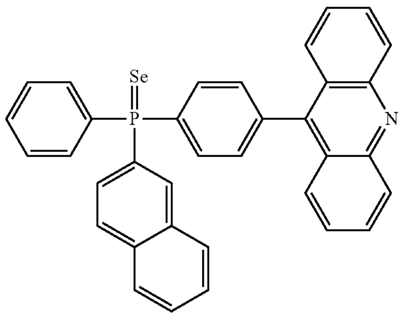
(1-175)
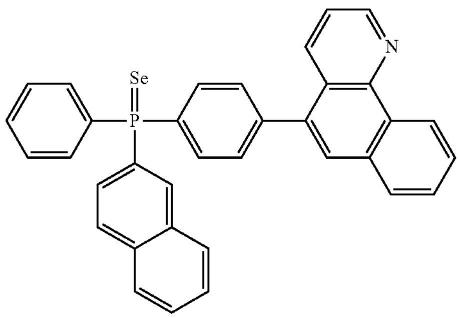
(1-176)
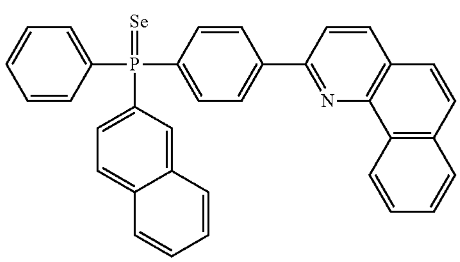
(1-177)
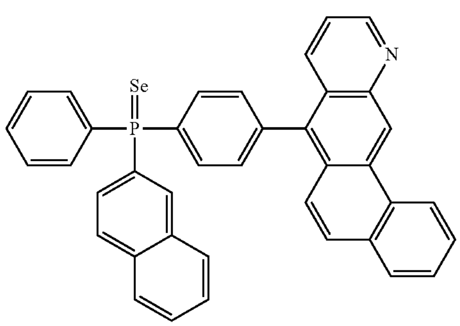
(1-178)
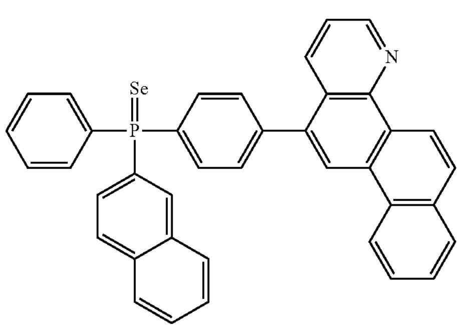
-continued
(1-179)
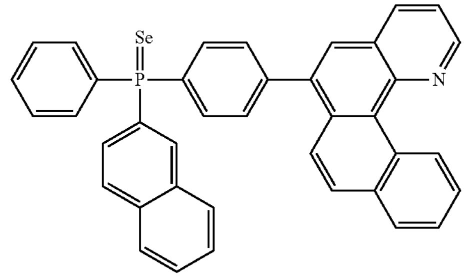
(1-180)
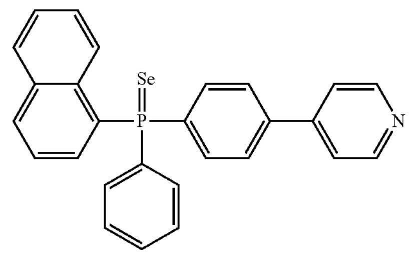
(1-181)
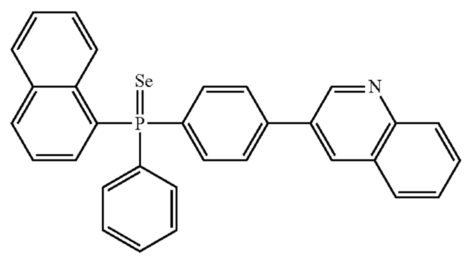
(1-182)
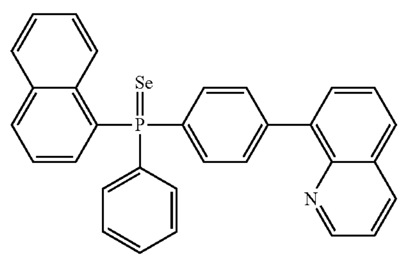
(1-183)
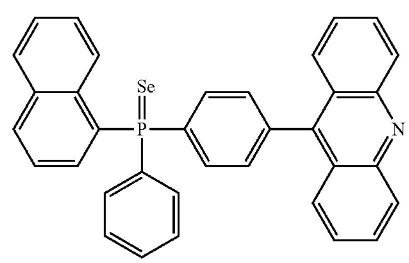
(1-184)
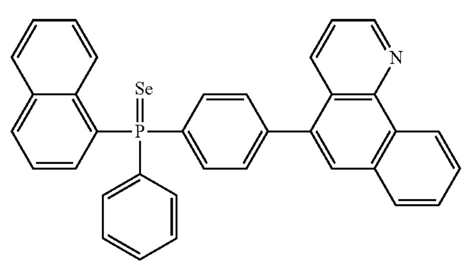

-continued (1-185)

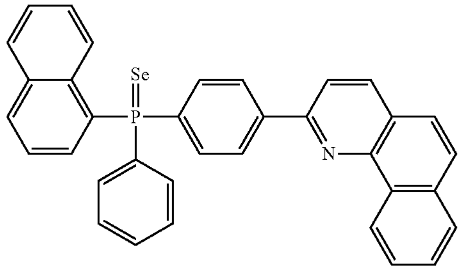

(1-186)

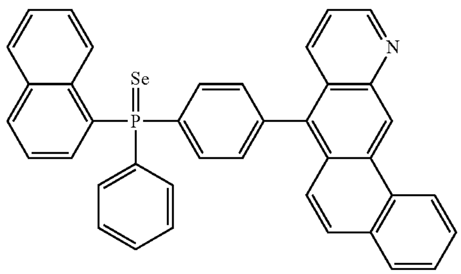

(1-187)

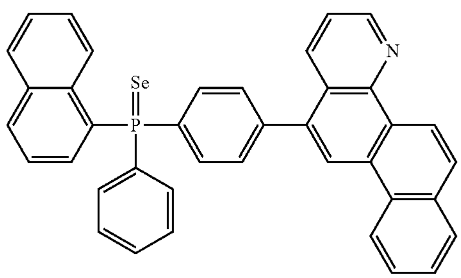

(1-188)

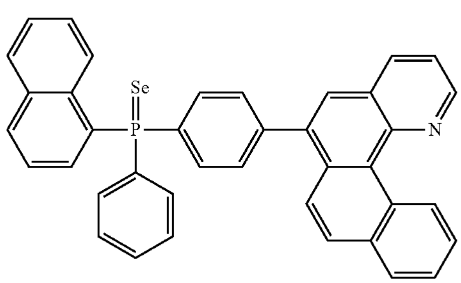

[Chemical Formula 2]

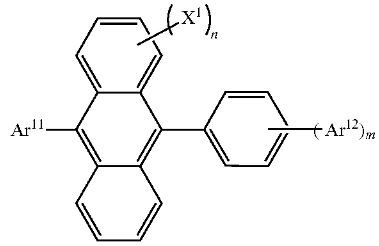

wherein, in Chemical Formula 2, $Ar^{11}$ is a substituted or unsubstituted C6 to C30 aryl group or a substituted or unsubstituted C6 to C30 heteroaryl group, m is an integer of 0 to 3, $Ar^{12}$ is a substituted or unsubstituted C5 to C30 aryl group or a substituted or unsubstituted C5 to C30 heteroaryl group, when m is 2 or more, each $Ar^{12}$ is the same as or different from one another, $X^1$ denotes hydrogen (H), deuterium, fluorine (F), a cyano group (—CN), a substituted or unsubstituted C1 to C20 alkyl group, a substituted or unsubstituted C1 to C20 alkoxy group, a substituted or unsubstituted C1 to C20 haloalkyl group, a substituted or unsubstituted C1 to C20 haloalkoxy group, a substituted or unsubstituted C1 to C10 alkylsilyl group, a substituted or unsubstituted C6 to C60 arylsilyl group, a substituted or unsubstituted C6 to C30 aromatic hydrocarbon group, a substituted or unsubstituted C6 to C30 condensed aromatic hydrocarbon group, a substituted or unsubstituted C2 to C30 aromatic heterocyclic group, or a substituted or unsubstituted C2 to C30 condensed aromatic heterocyclic group, n is an integer of 0 to 8, and when n is 2 or more, each $X^1$ is the same as or different from one another.

8. The organic light emitting device as claimed in claim 7, wherein:

the organic light emitting element includes:

an anode and a cathode that face each other;

an emission layer between the anode and the cathode;

a hole transfer layer between the anode and the emission layer; and an electron transfer layer between the cathode and the emission layer, the electron transfer layer includes the first compound, and the emission layer includes the second compound.

9. The organic light emitting device as claimed in claim 7, wherein the second compound represented by Chemical Formula 2 is represented by one of the following Chemical Formula 2-1 to Chemical Formula 2-147:

(2-1)
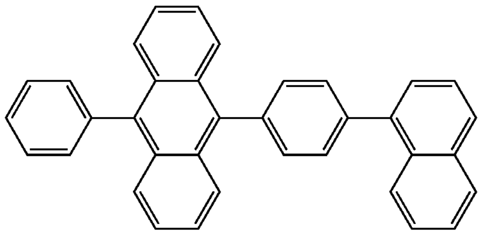
(2-2)
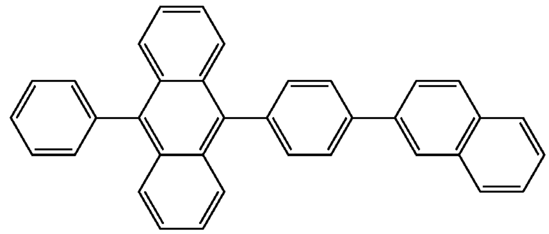
(2-3)
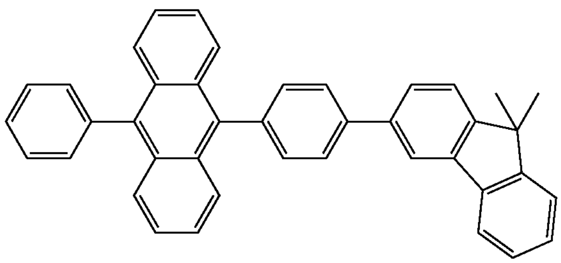
(2-4)
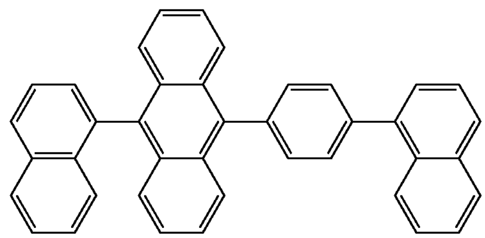
(2-5)
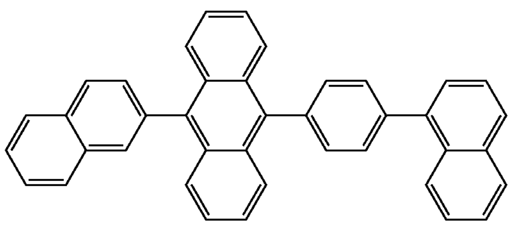
(2-6)
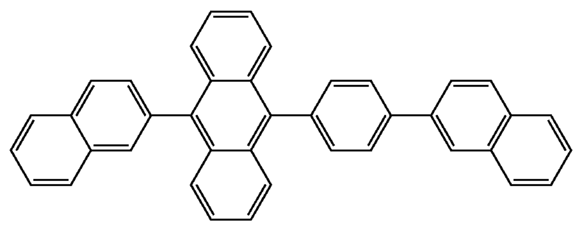
(2-7)
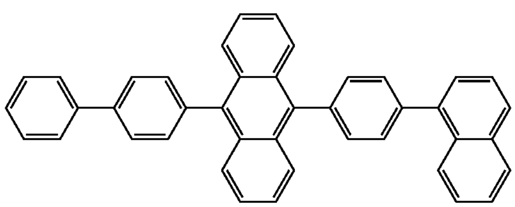
(2-8)
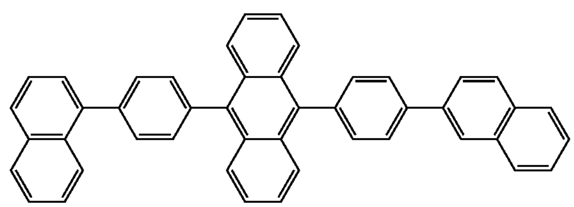
(2-9)
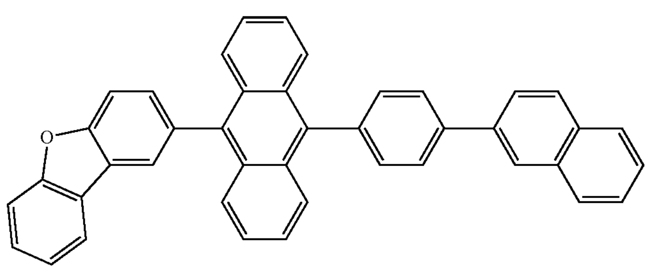
(2-10)
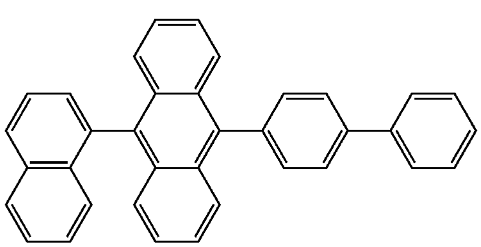
(2-11)
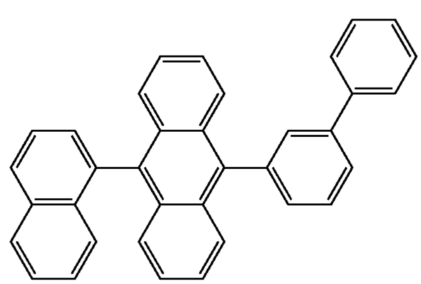

-continued
(2-12)
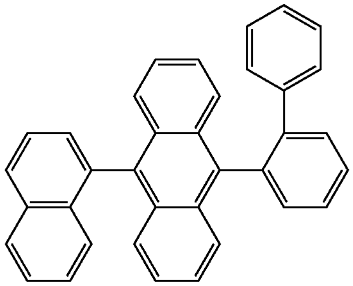
(2-13)
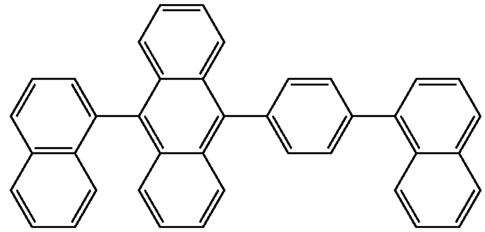
(2-14)
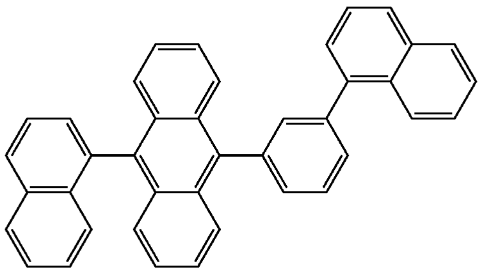
(2-15)
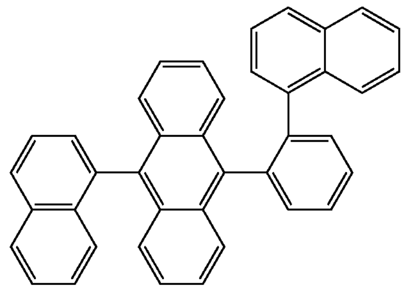
(2-16)
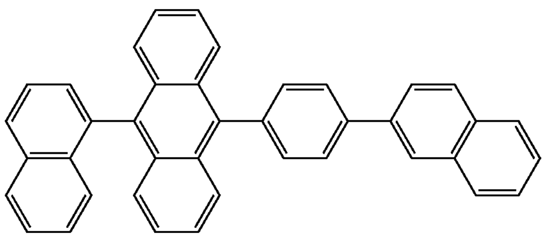
(2-17)
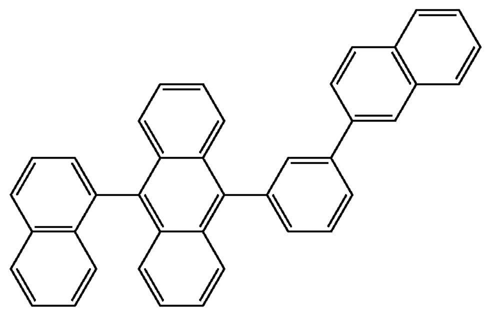
(2-18)
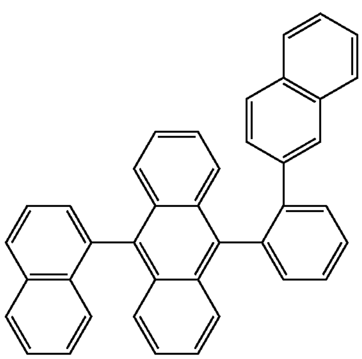
(2-19)
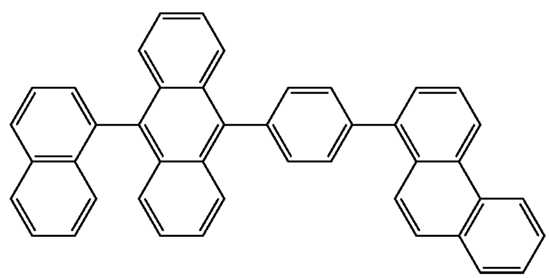
(2-20)
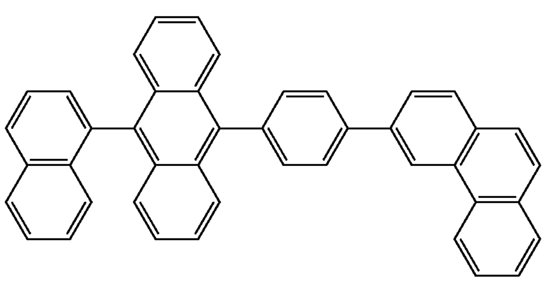
(2-21)
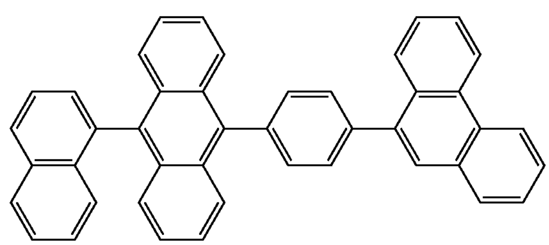

-continued
(2-22)
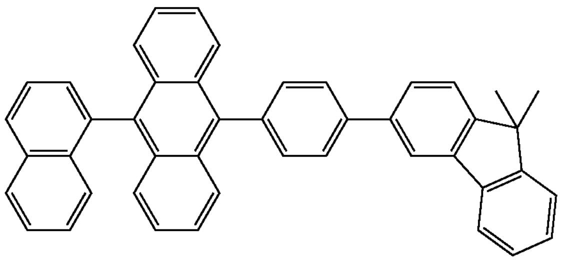
(2-23)
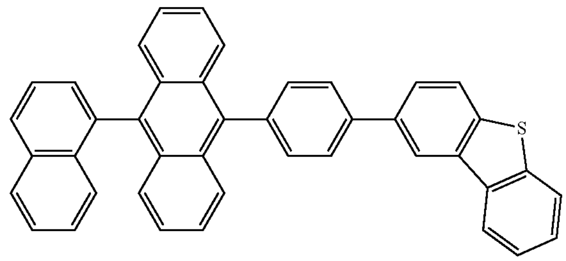
(2-24)
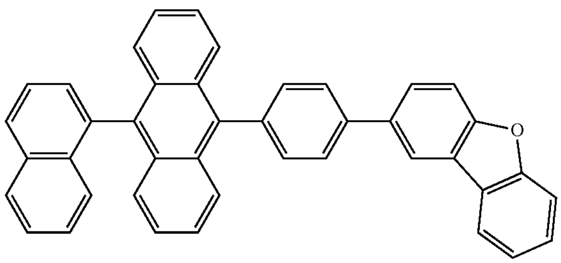
(2-25)
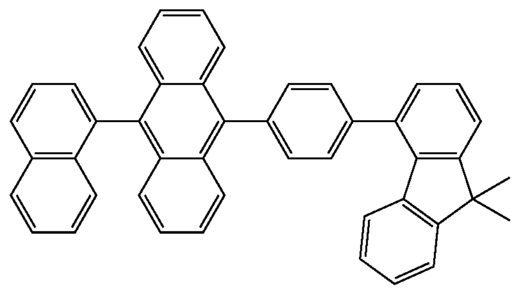
(2-26)
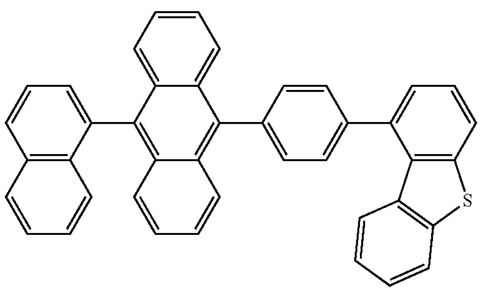
(2-27)
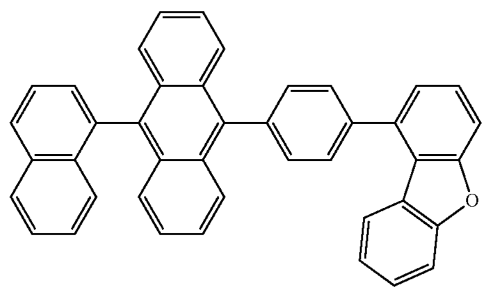
(2-28)
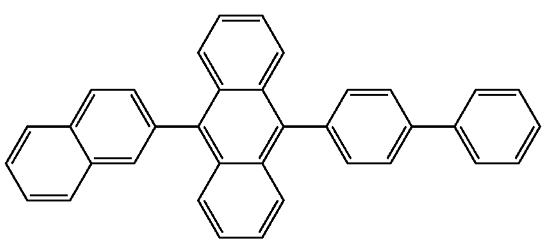
(2-29)
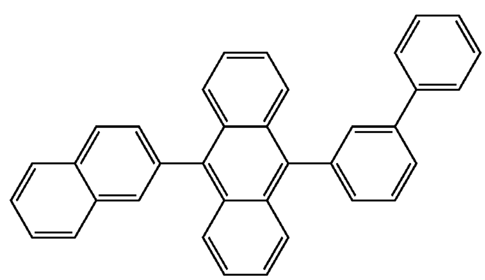
(2-30)
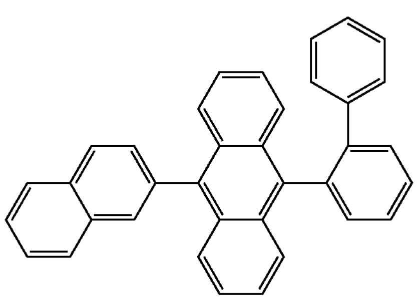
(2-31)
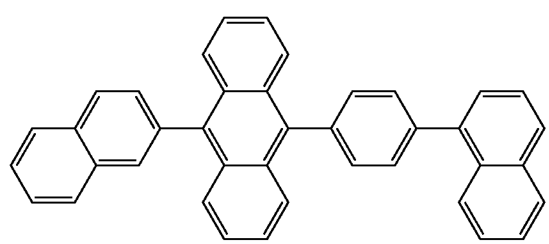

-continued
(2-32)
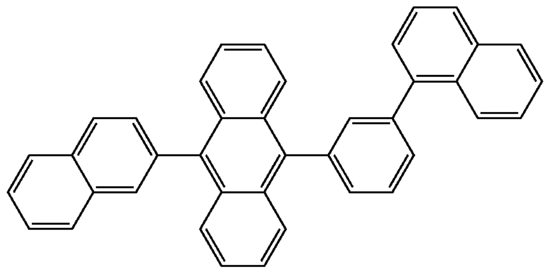
(2-33)
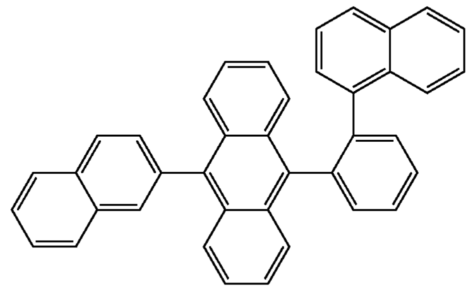
(2-34)
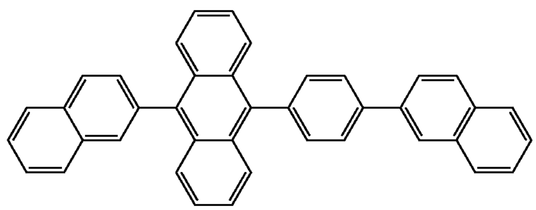
(2-35)
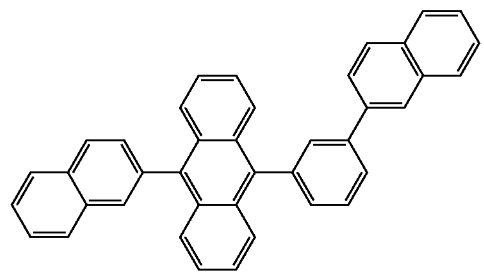
(2-36)
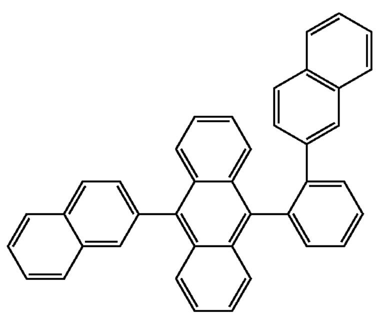
(2-37)
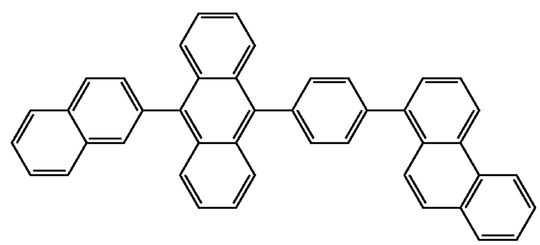
(2-38)
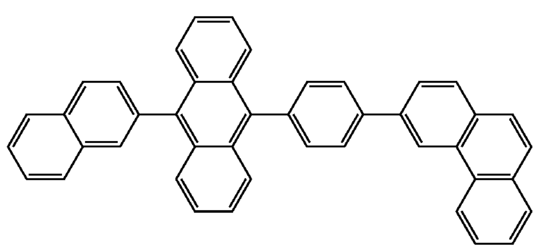
(2-39)
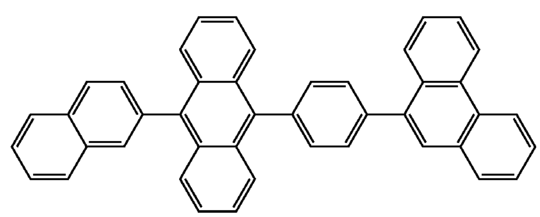
(2-40)
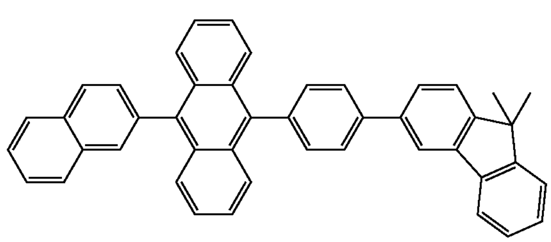
(2-41)
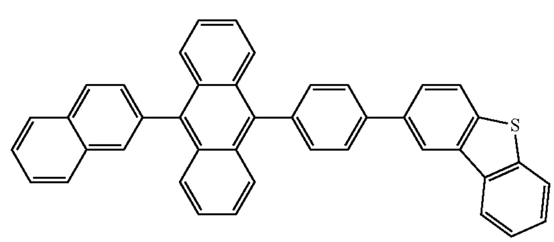

-continued
(2-42)
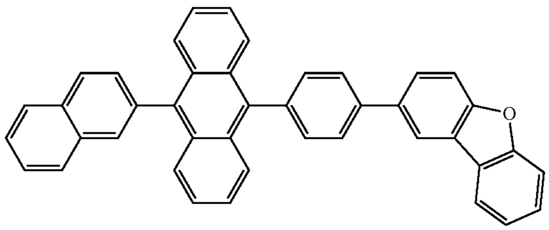
(2-43)
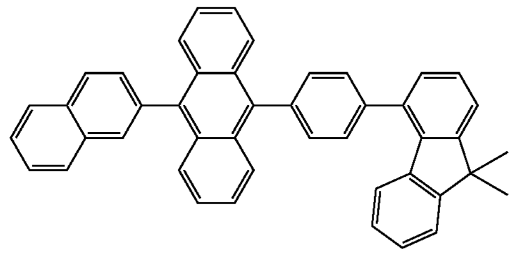
(2-44)
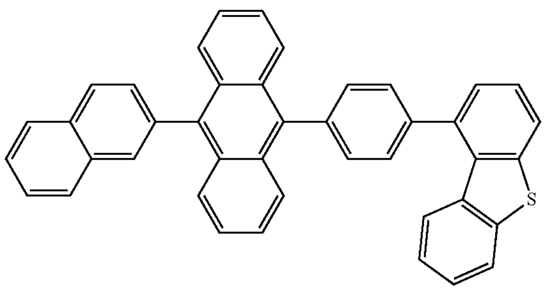
(2-45)
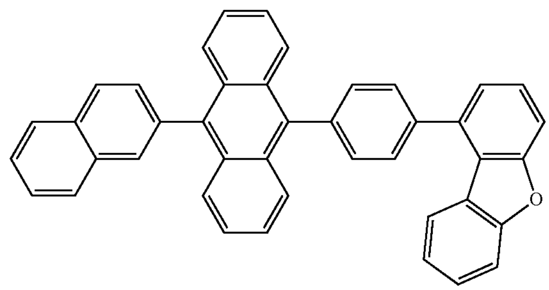
(2-46)
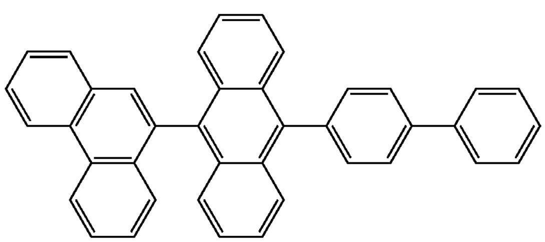
(2-47)
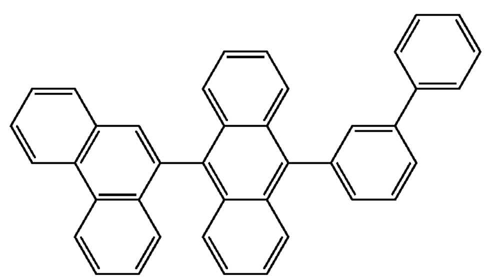
(2-48)
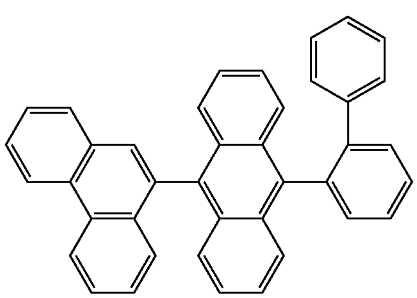
(2-49)
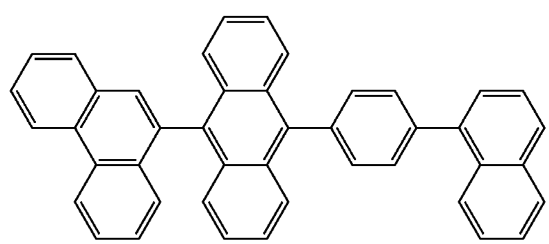
(2-50)
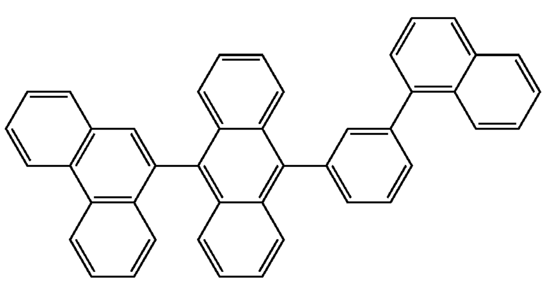
(2-51)
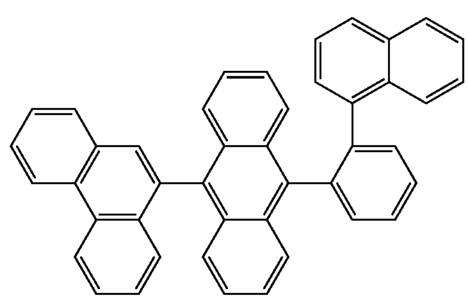

-continued
(2-52)
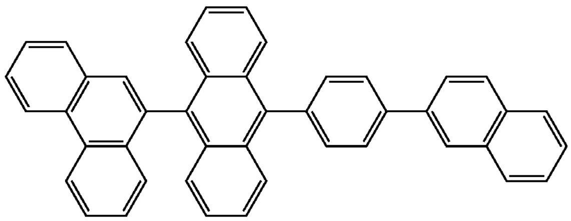
(2-53)
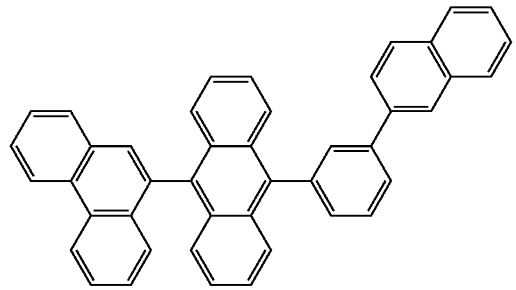
(2-54)
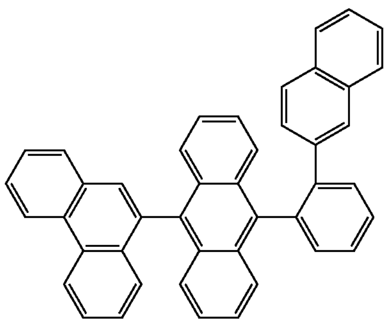
(2-55)
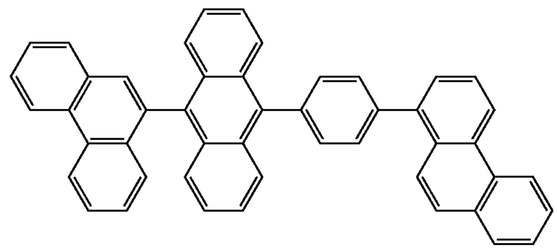
(2-56)
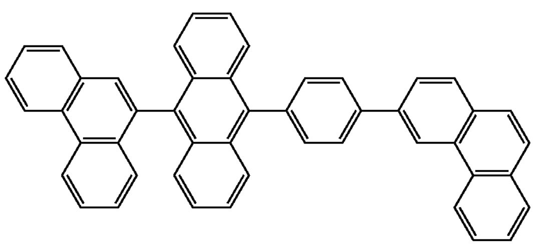
(2-57)
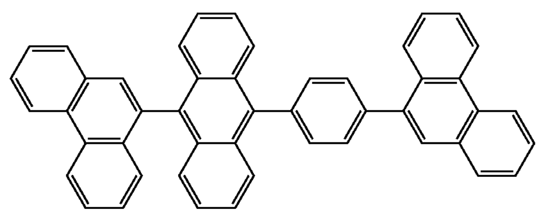
(2-58)
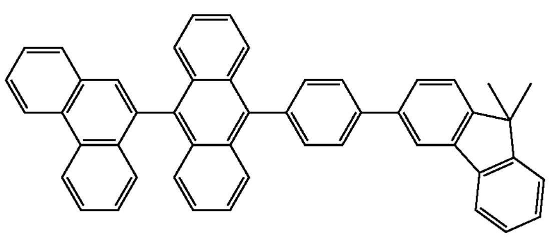
(2-59)
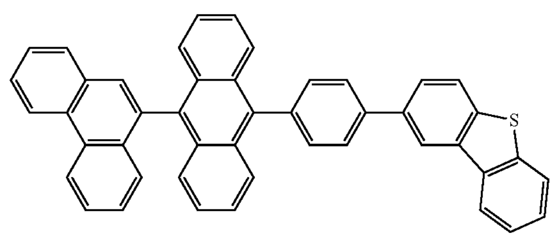
(2-60)
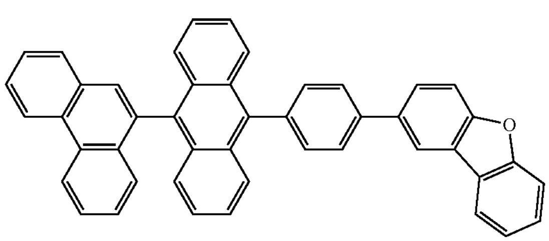
(2-61)
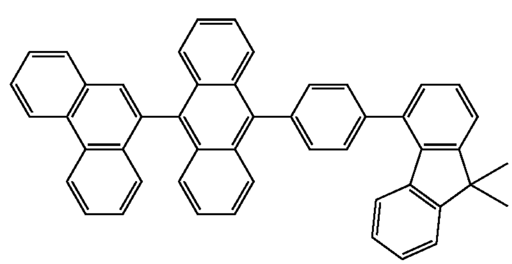

-continued
(2-62)
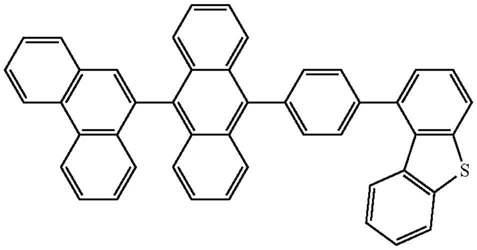
(2-63)
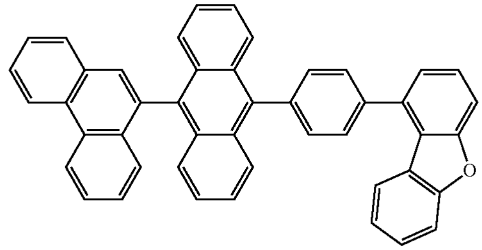
(2-64)
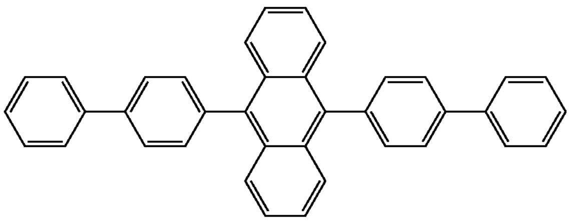
(2-65)
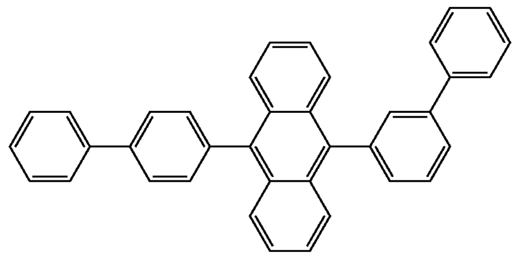
(2-66)
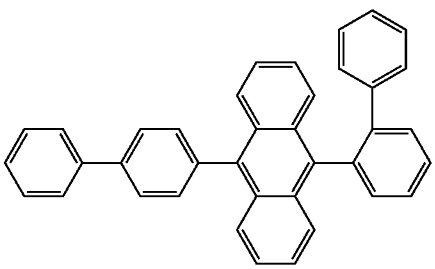
(2-67)
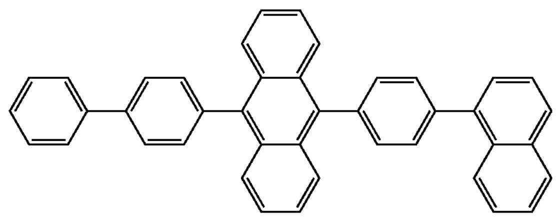
(2-68)
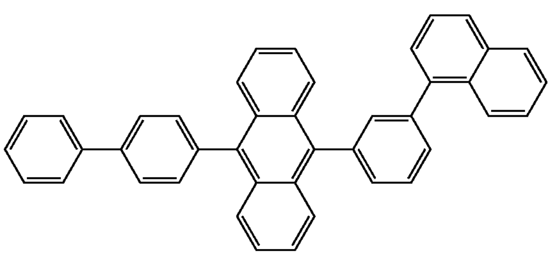
(2-69)
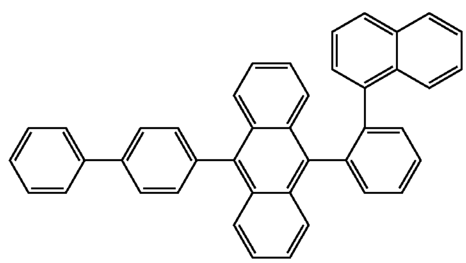
(2-70)
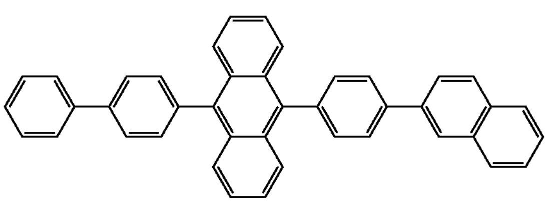
(2-71)
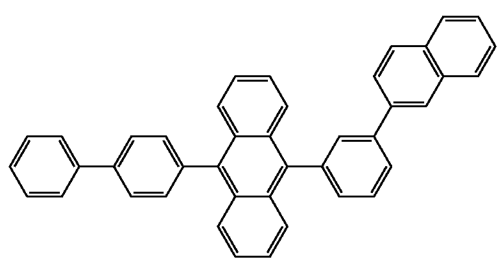

-continued
(2-72)
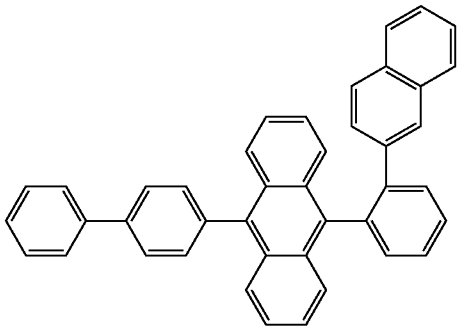
(2-73)
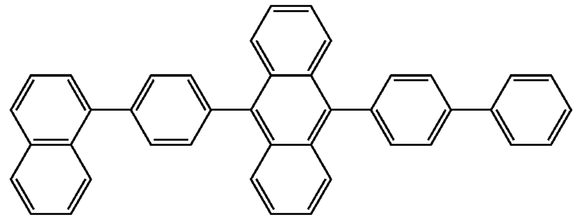
(2-74)
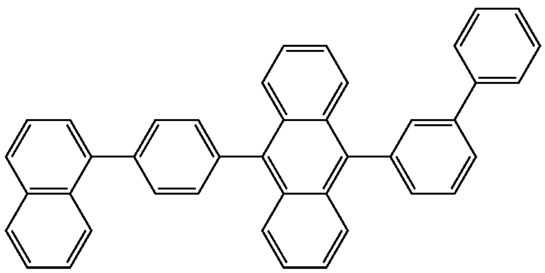
(2-75)
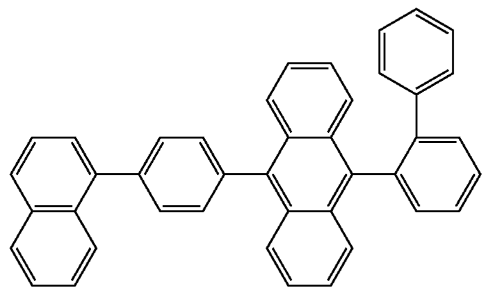
(2-76)
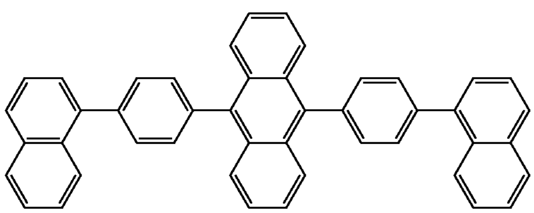
(2-77)
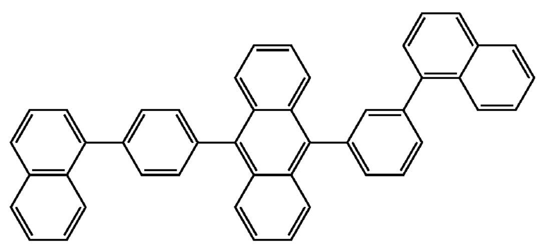
(2-78)
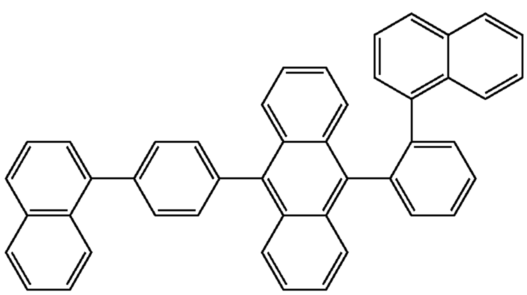
(2-79)
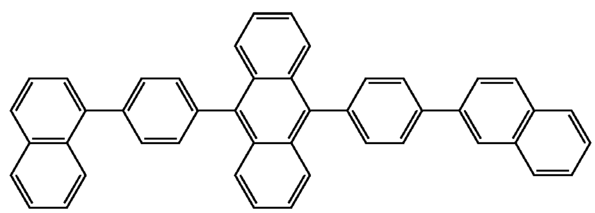
(2-80)
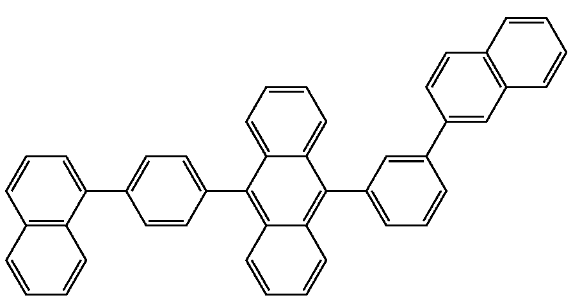
(2-81)
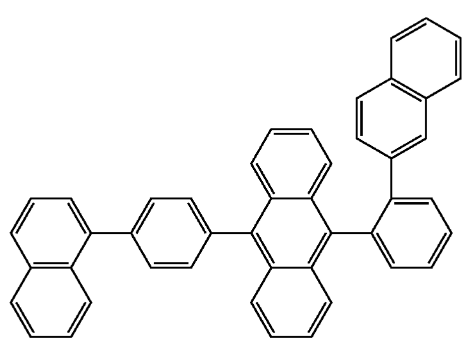

-continued
(2-82)
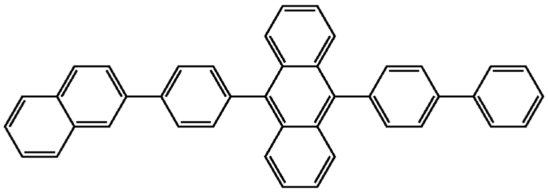
(2-83)
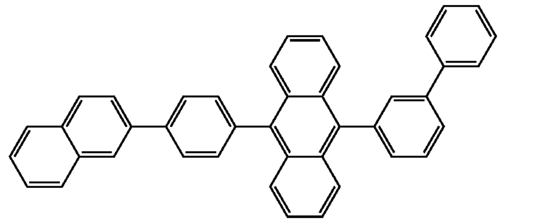
(2-84)
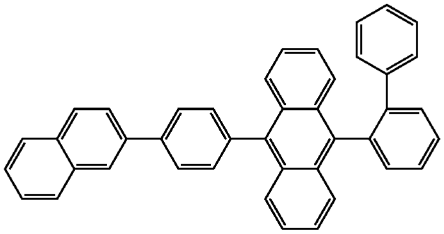
(2-85)
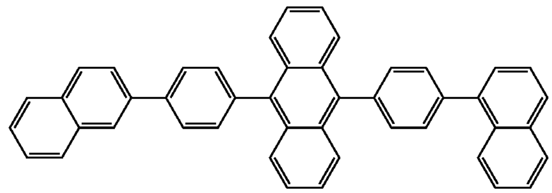
(2-86)
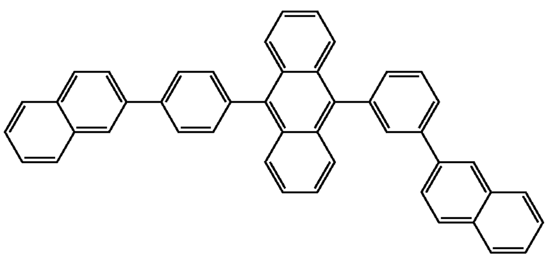
(2-87)
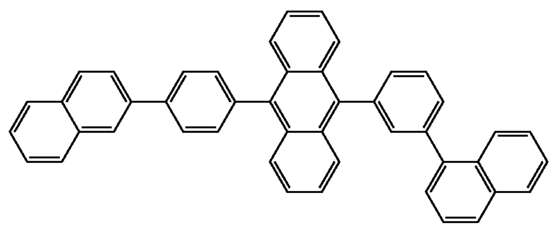
(2-88)
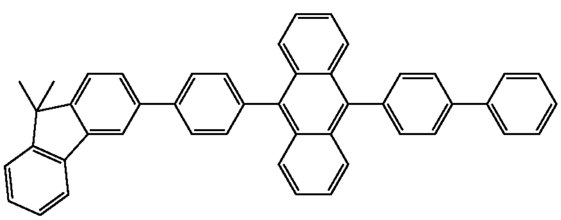
(2-89)
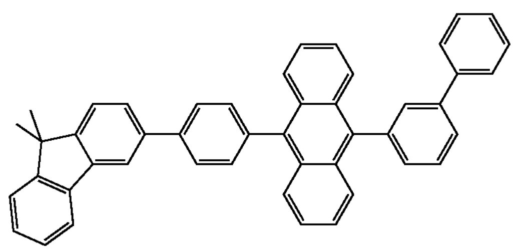
(2-90)
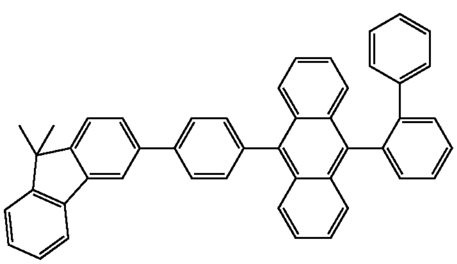
(2-91)
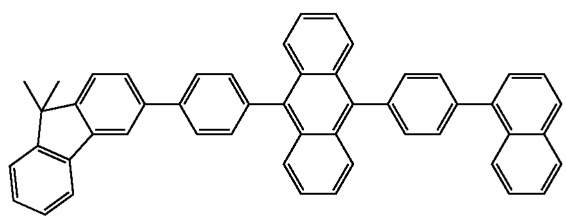
(2-92)
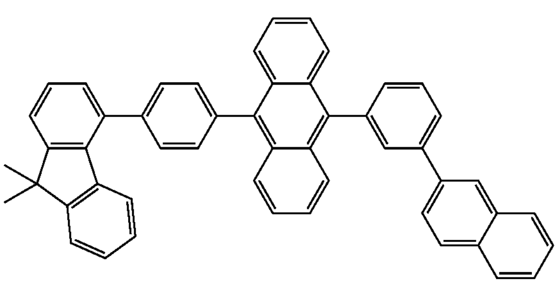
(2-93)
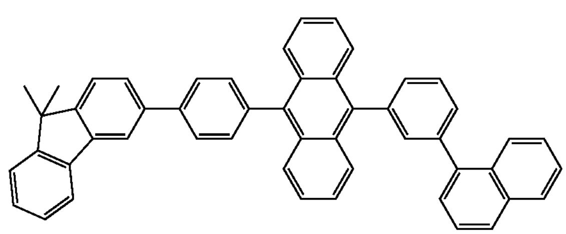

-continued
(2-94)
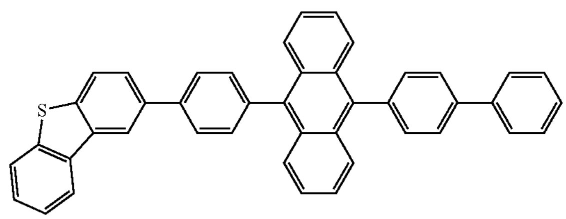
(2-95)
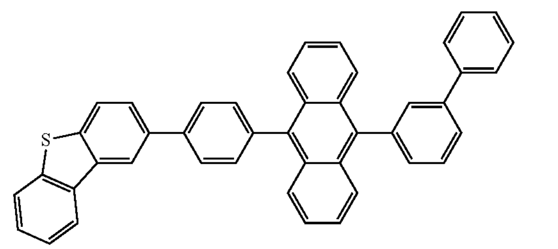
(2-96)
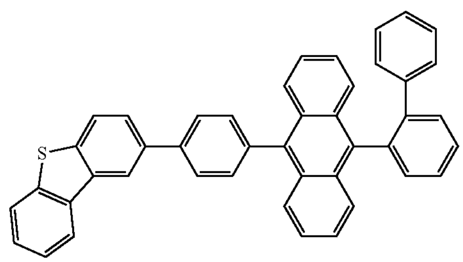
(2-97)
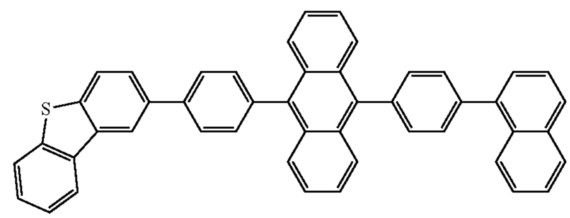
(2-98)
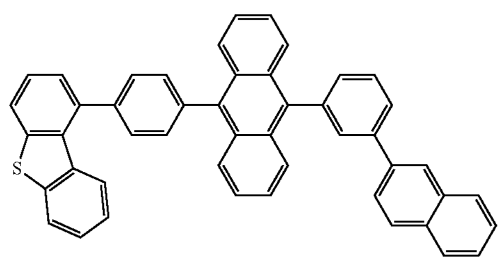
(2-99)
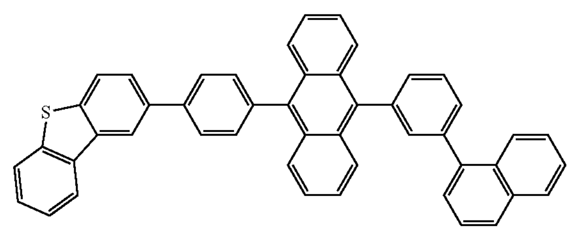
(2-100)
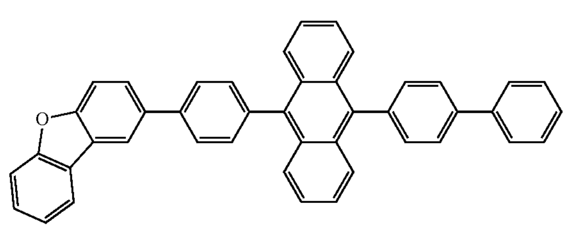
(2-101)
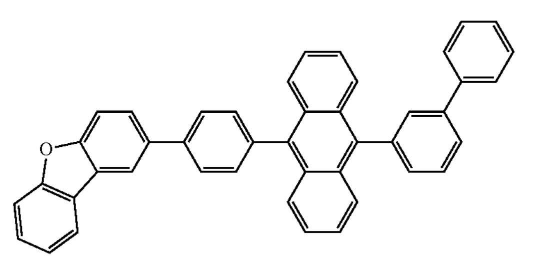
(2-102)
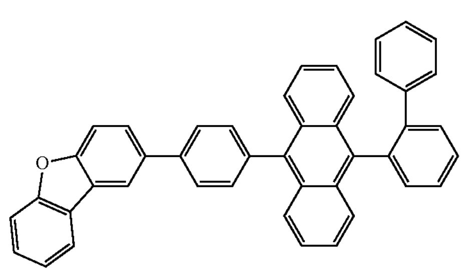
(2-103)
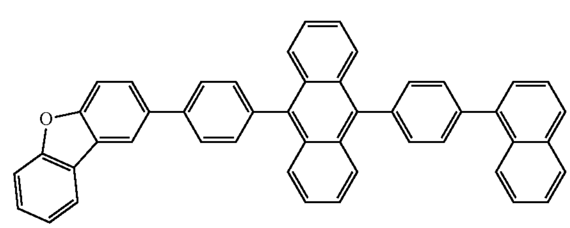

-continued
(2-104)
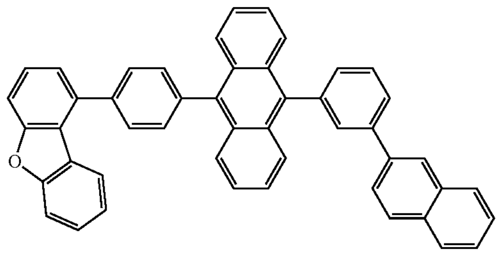
(2-105)
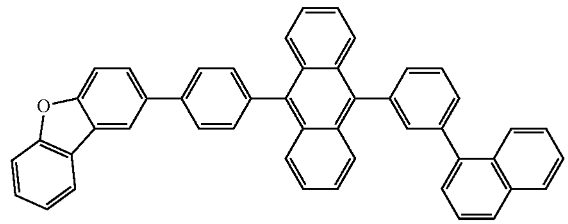
(2-106)
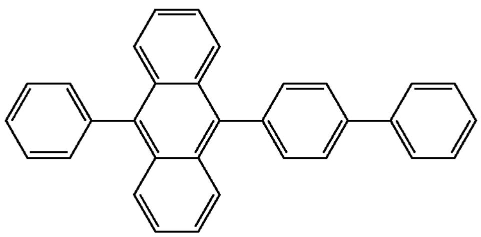
(2-107)
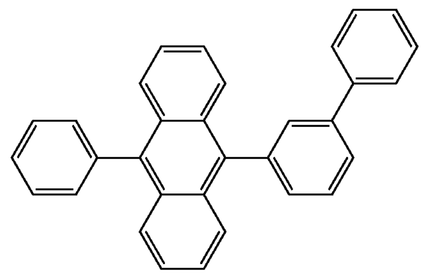
(2-108)
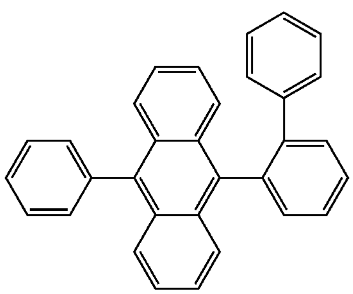
(2-109)
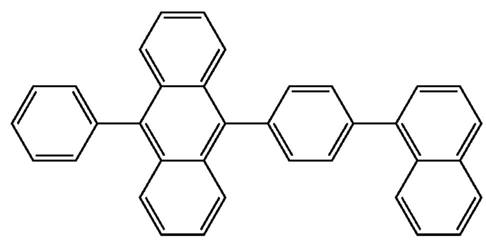
(2-110)
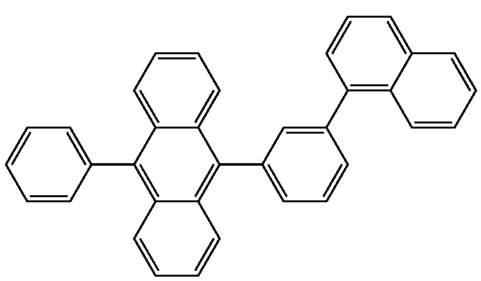
(2-111)
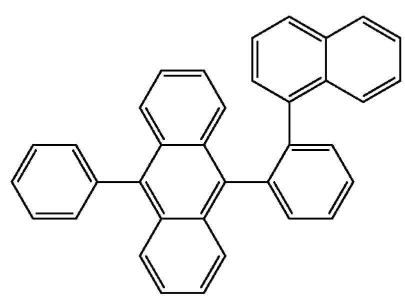
(2-112)
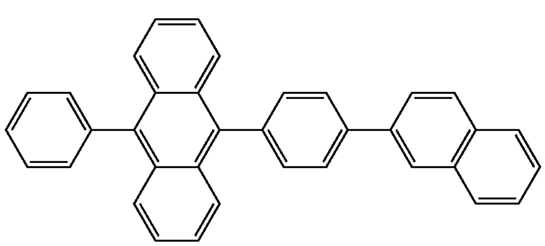
(2-113)
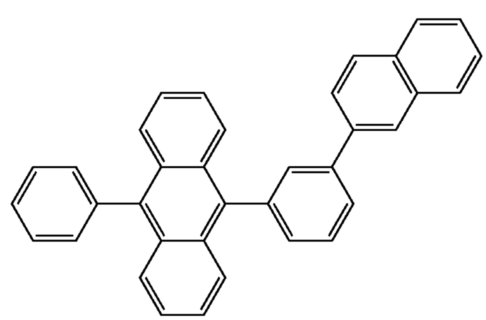

-continued
(2-114)
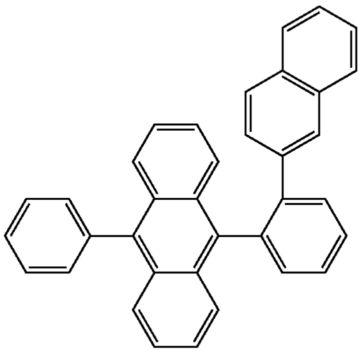
(2-115)
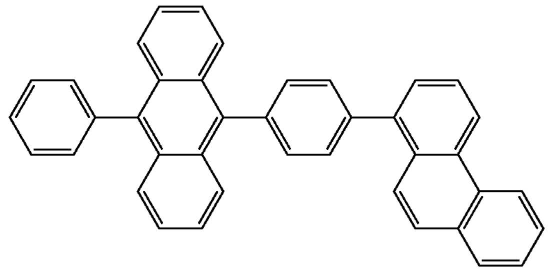
(2-116)
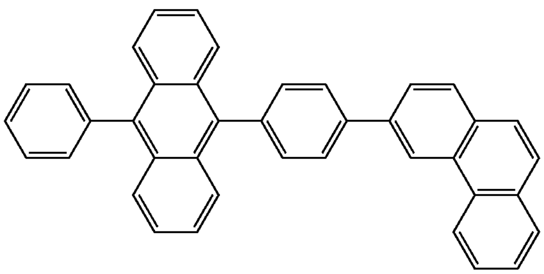
(2-117)
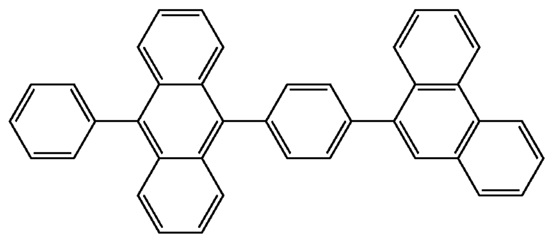
(2-118)
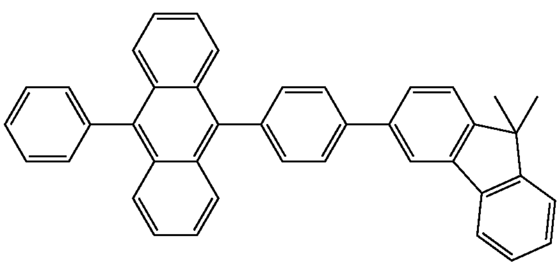
(2-119)
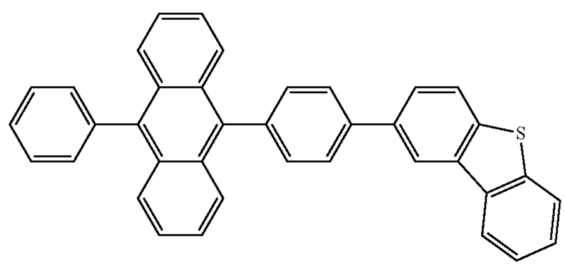
(2-120)
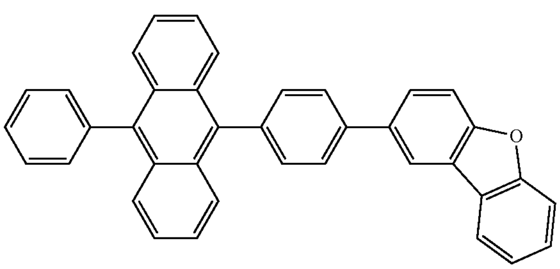
(2-121)
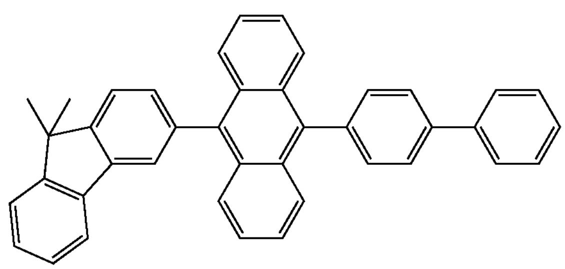
(2-122)
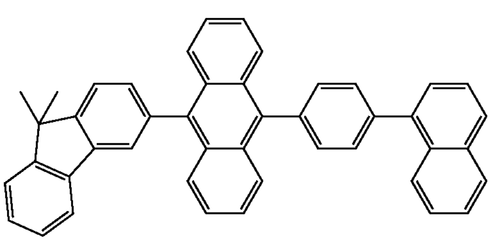
(2-123)
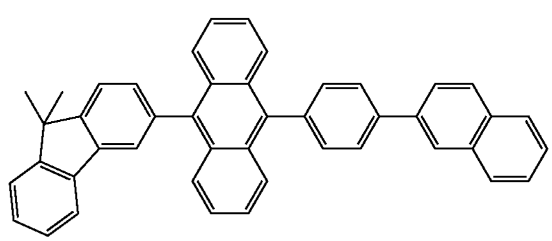

-continued
(2-124)
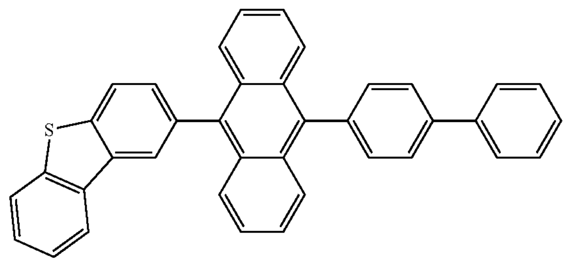
(2-125)
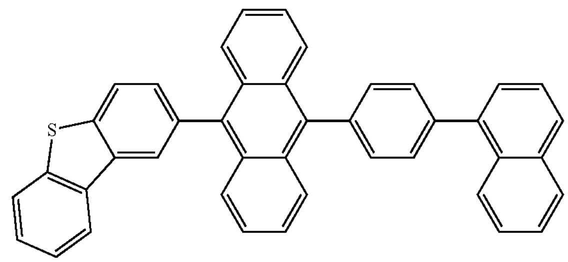
(2-126)
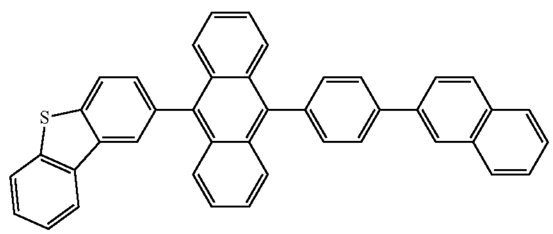
(2-127)
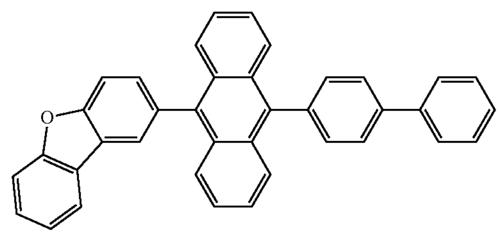
(2-128)
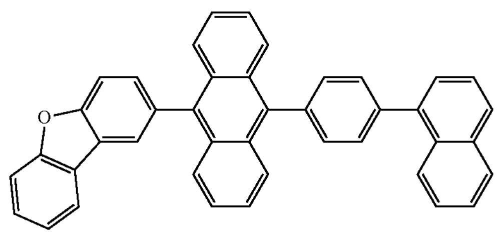
(2-129)
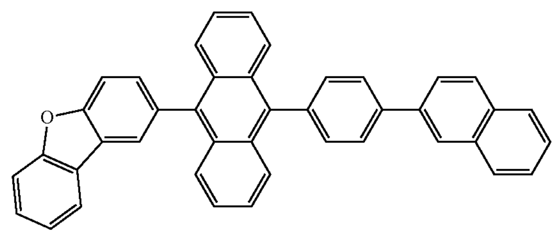
(2-130)
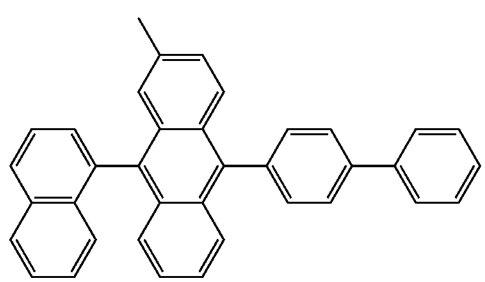
(2-131)
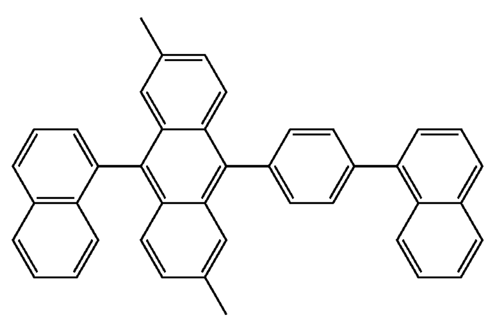
(2-132)
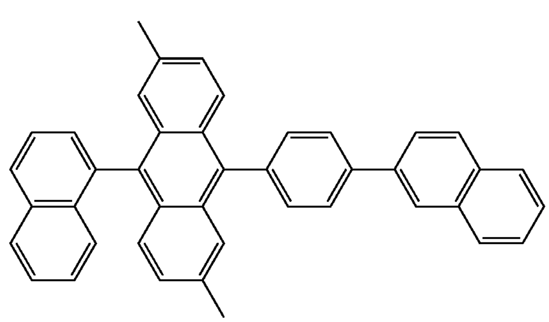
(2-133)
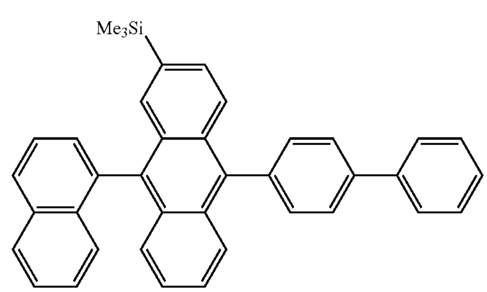

-continued
(2-134)
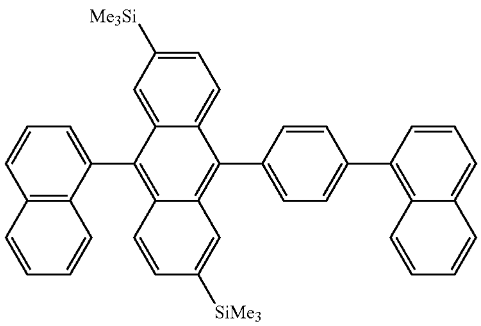
(2-135)
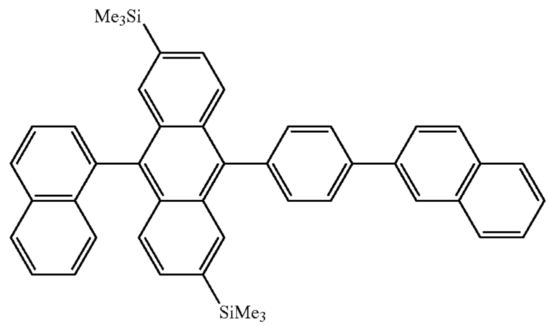
(2-136)
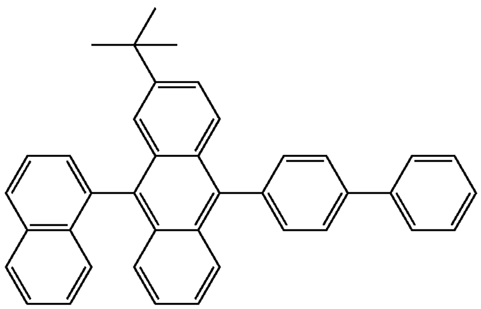
(2-137)
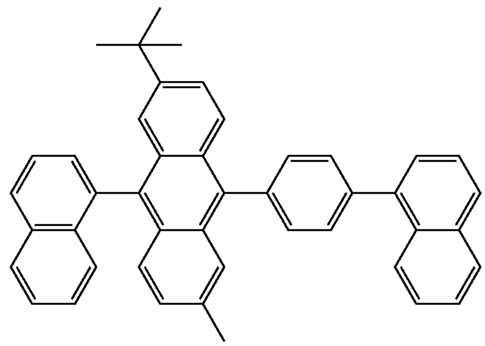
(2-138)
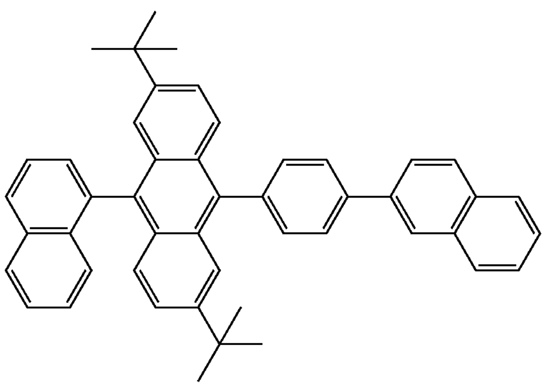
(2-139)
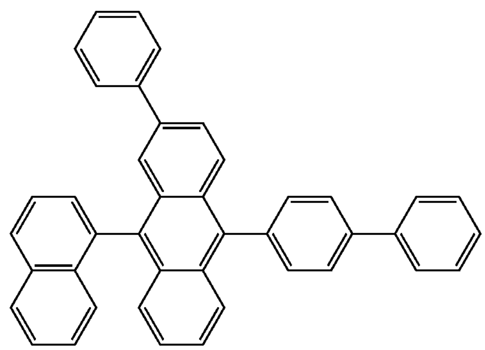
(2-140)
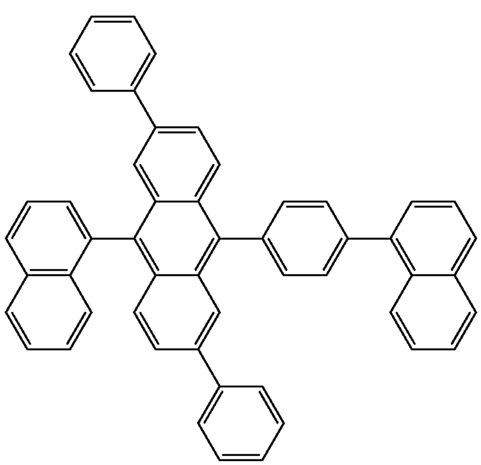
(2-141)
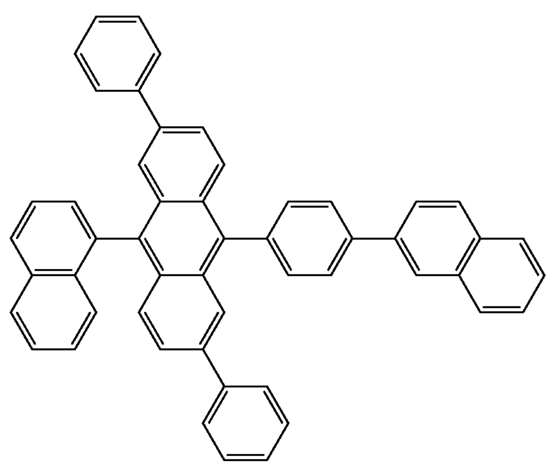

-continued (2-142)

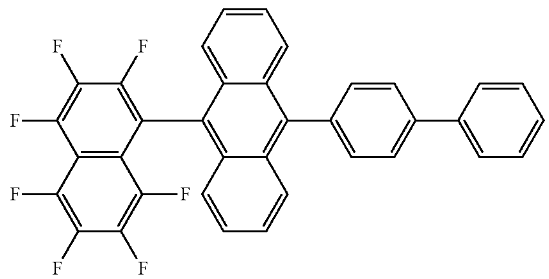

(2-143)

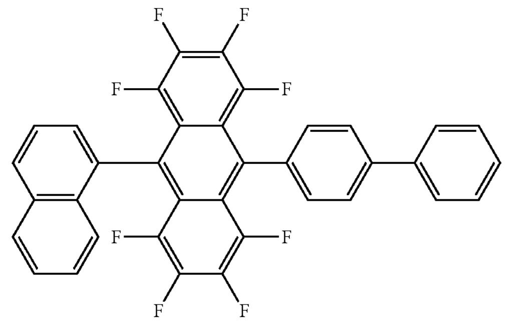

(2-144)

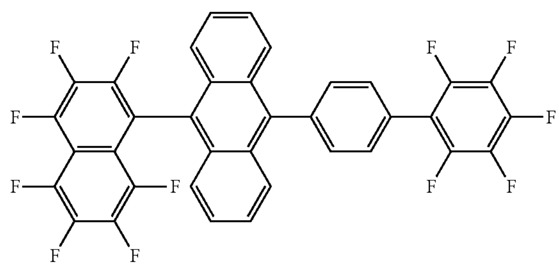

(2-145)

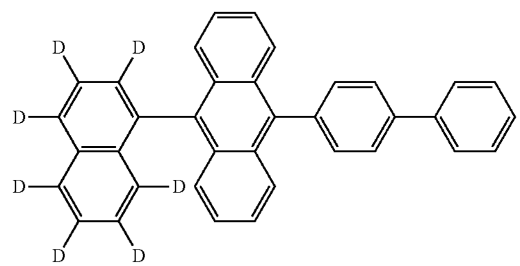

(2-146)

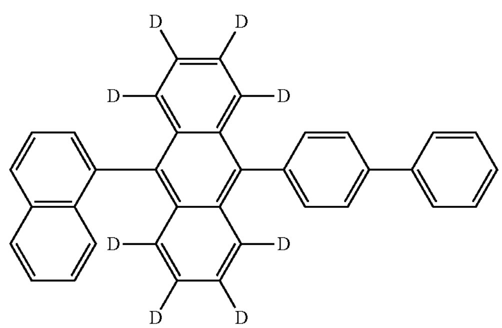

(2-147)

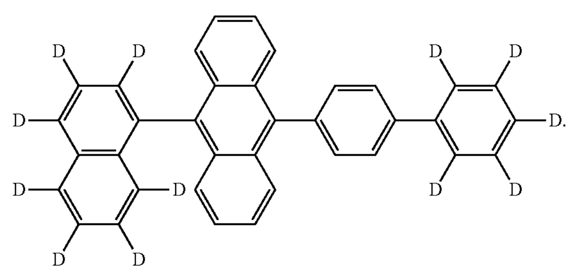

10. The organic light emitting device as claimed in claim 7, wherein:

the organic light emitting element includes:

an anode and a cathode that face each other;

an emission layer between the anode and the cathode;

a hole transfer layer between the anode and the emission layer; and an electron transfer layer and a hole blocking layer between the cathode and the emission layer, the hole blocking layer includes the first compound, and the emission layer includes the second compound.

11. The organic light emitting device as claimed in claim 10, wherein the second compound represented by Chemical Formula 2 is represented by one of the following Chemical Formula 2-1 to Chemical Formula 2-147:

(2-1)

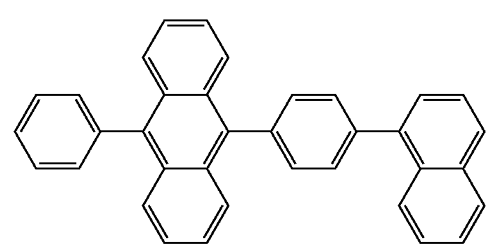

(2-2)

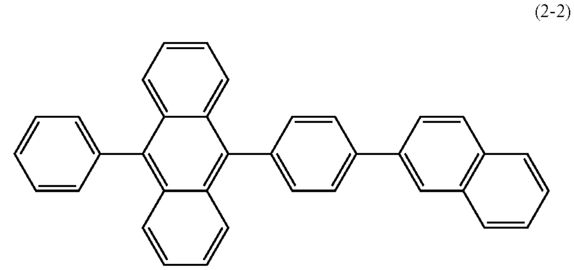

-continued
(2-3)
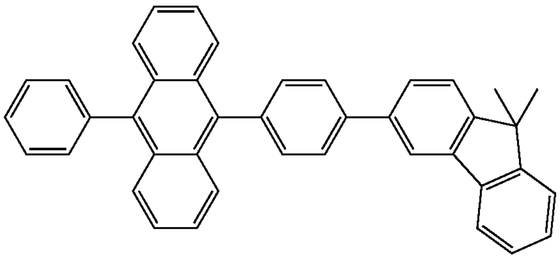
(2-4)
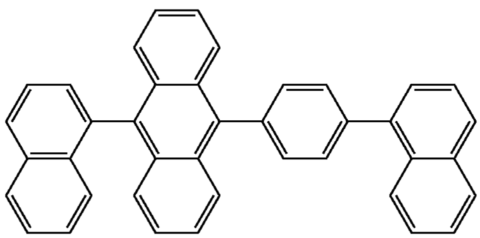
(2-5)
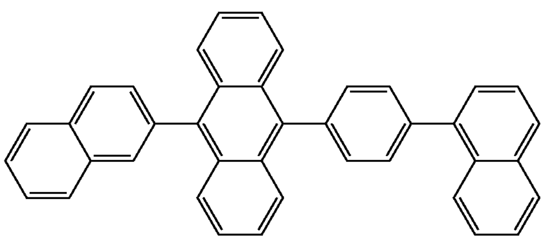
(2-6)
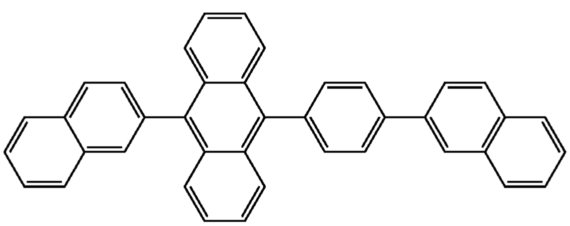
(2-7)
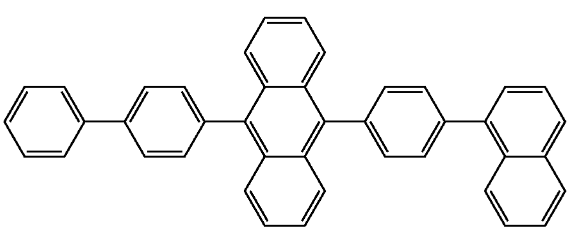
(2-8)
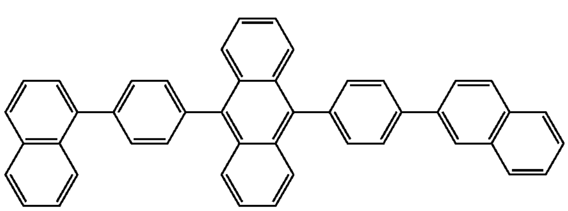
-continued
(2-9)
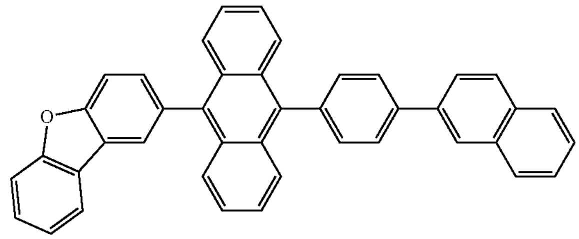
(2-10)
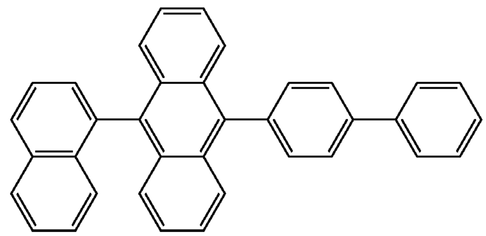
(2-11)
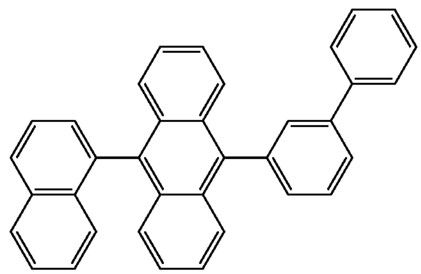
(2-12)
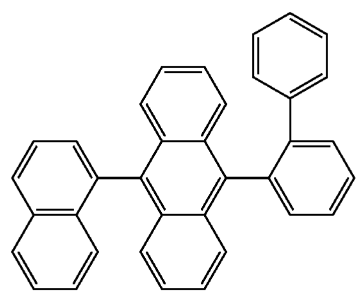
(2-13)
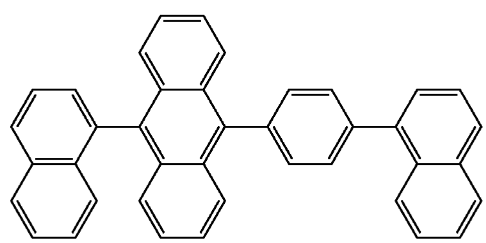
(2-14)
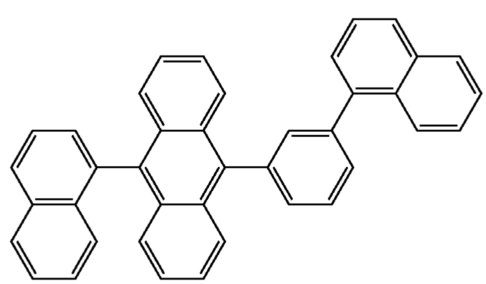

-continued
(2-15)
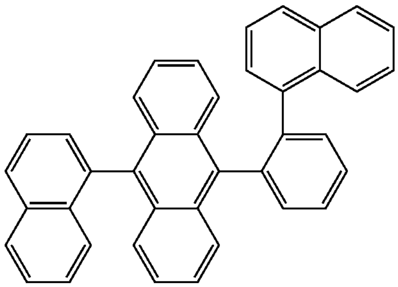
(2-16)
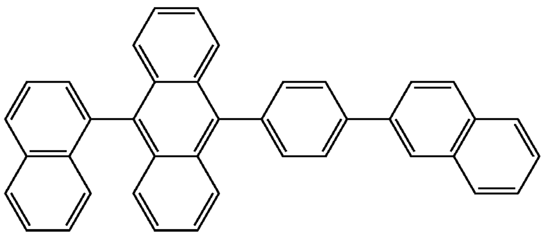
(2-17)
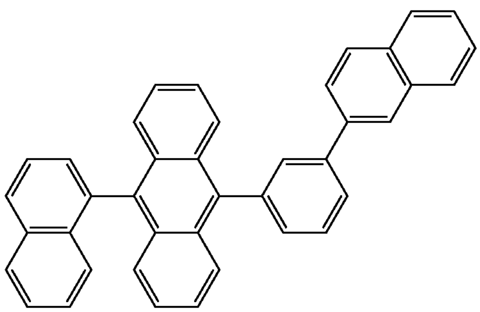
(2-18)
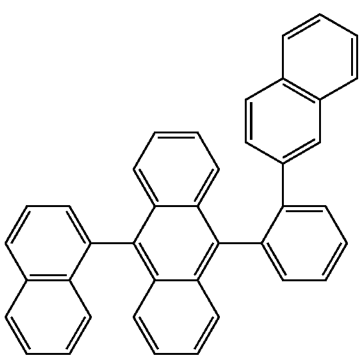
(2-19)
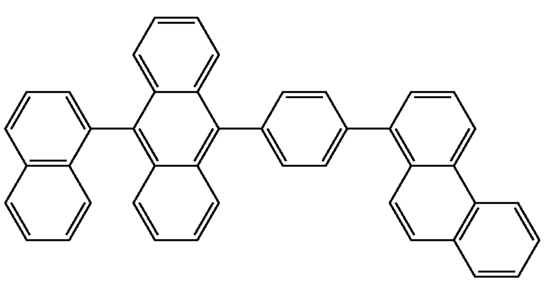
-continued
(2-20)
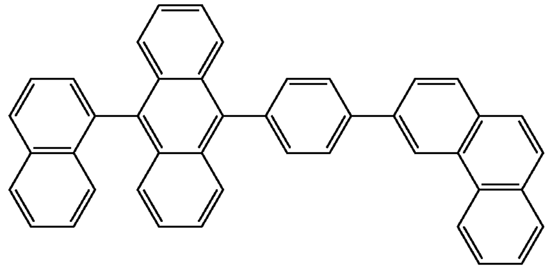
(2-21)
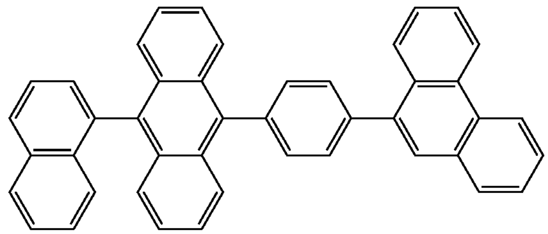
(2-22)
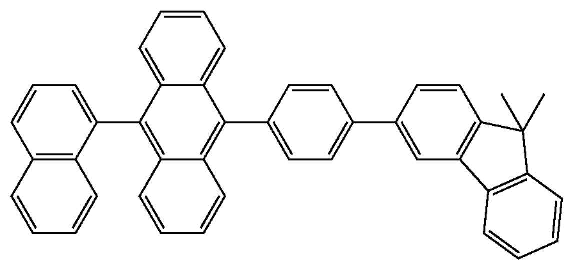
(2-23)
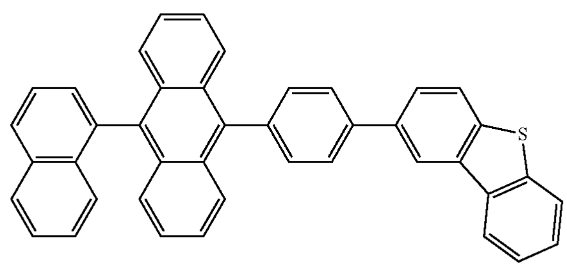
(2-24)
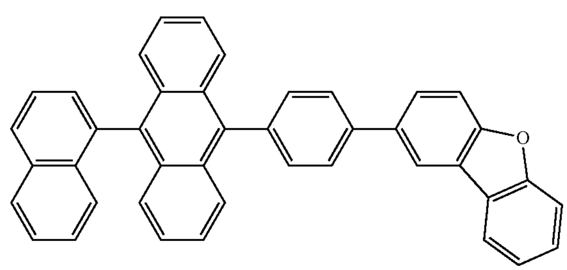

-continued
(2-25)
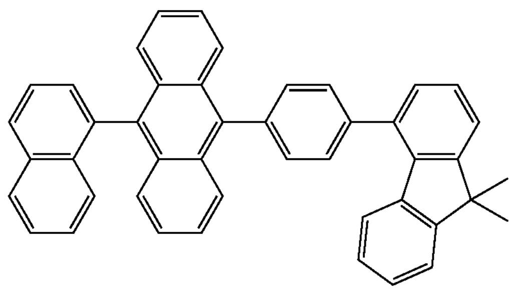
(2-26)
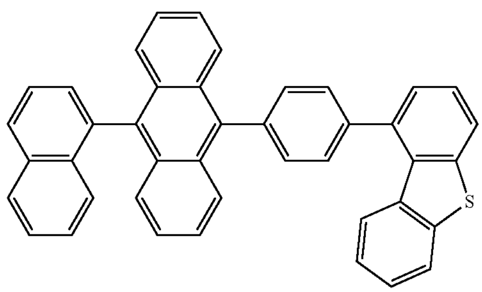
(2-27)
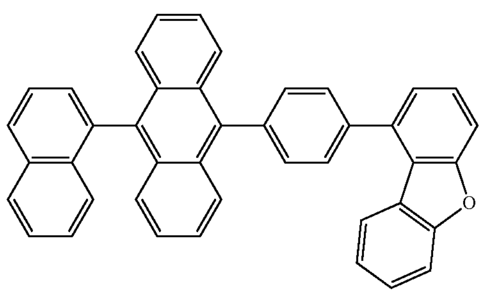
(2-28)
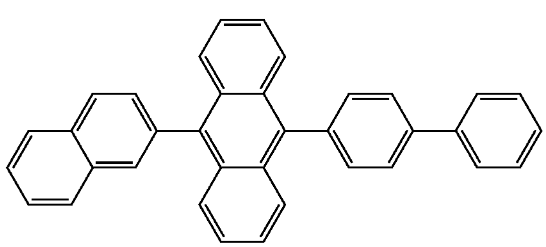
(2-29)
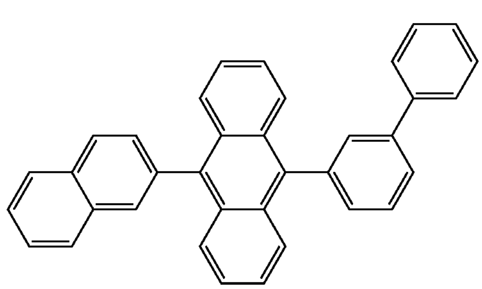
-continued
(2-30)
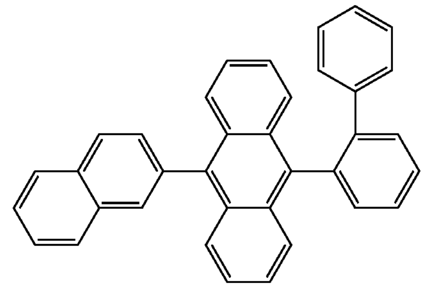
(2-31)
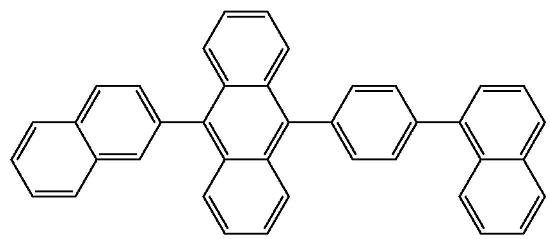
(2-32)
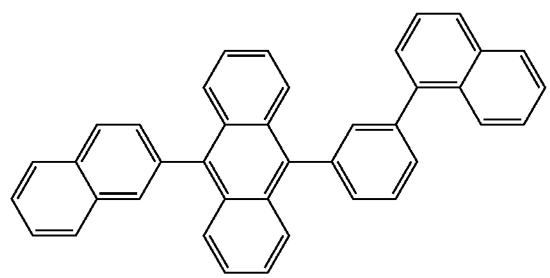
(2-33)
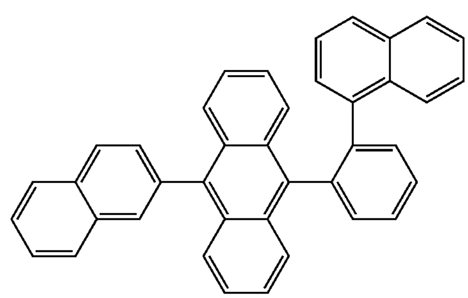
(2-34)
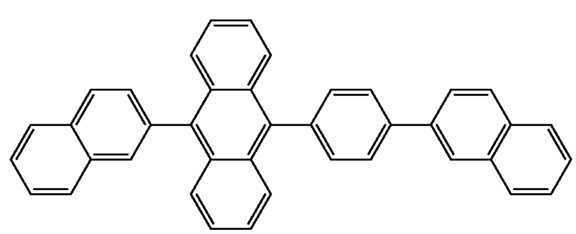

-continued
(2-35)
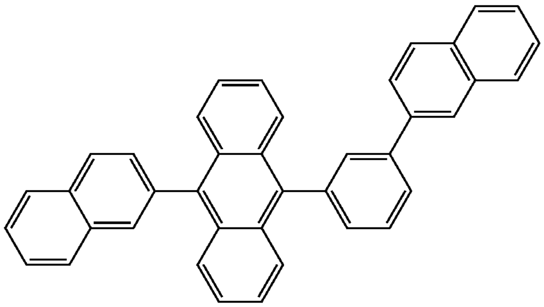
(2-36)
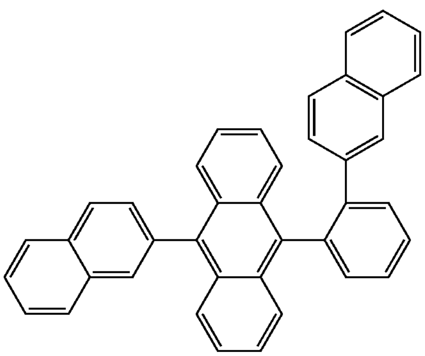
(2-37)
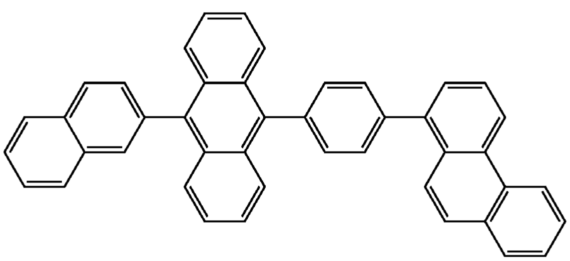
(2-38)
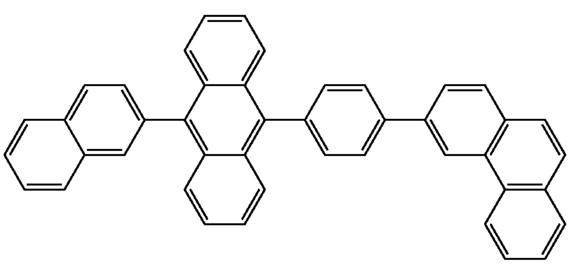
(2-39)
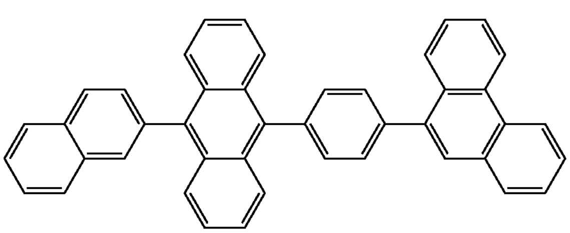
-continued
(2-40)
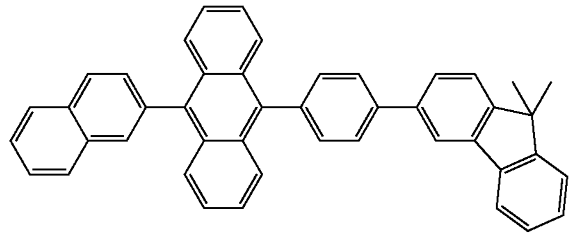
(2-41)
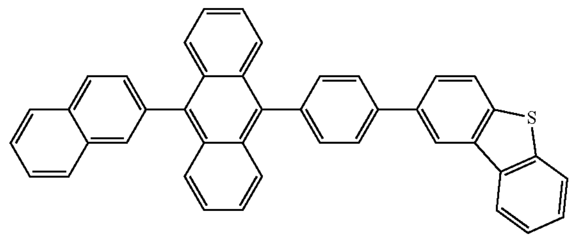
(2-42)
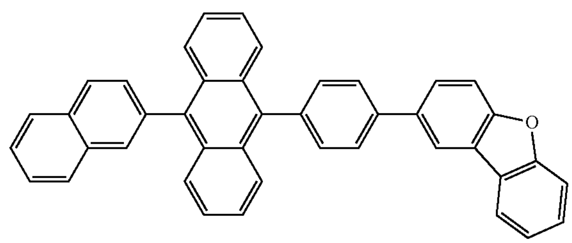
(2-43)
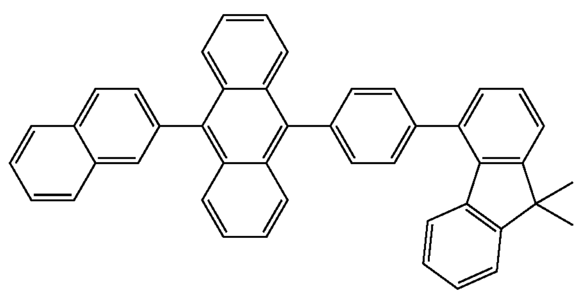
(2-44)
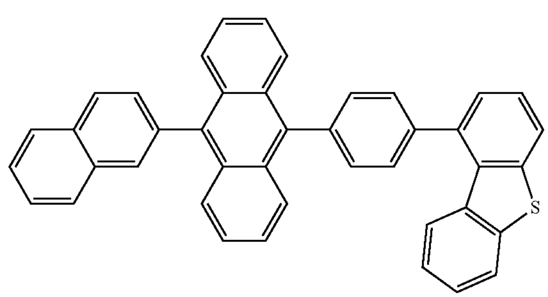

-continued
(2-45)
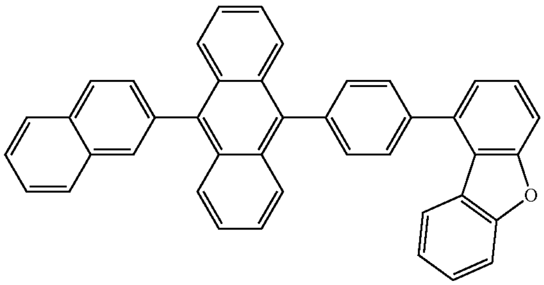
(2-46)
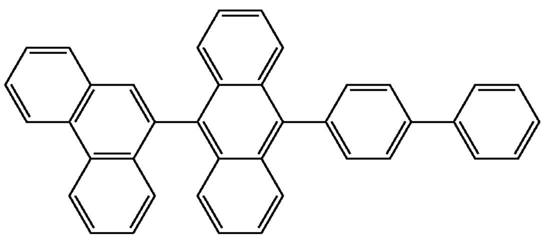
(2-47)
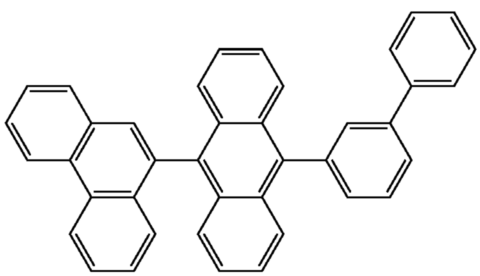
(2-48)
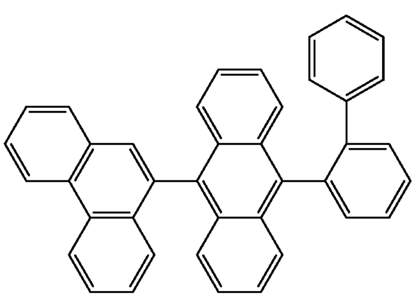
(2-49)
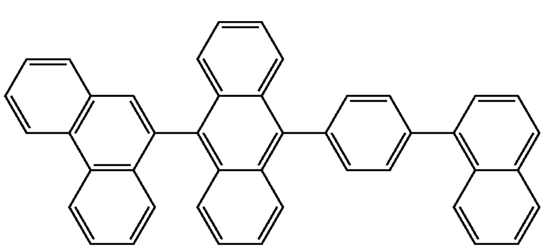
-continued
(2-50)
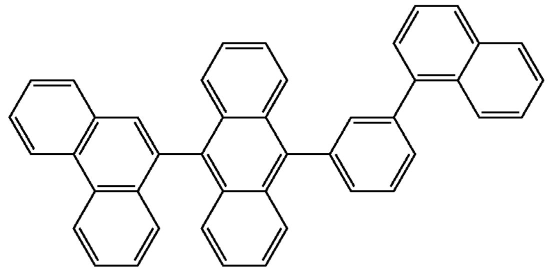
(2-51)
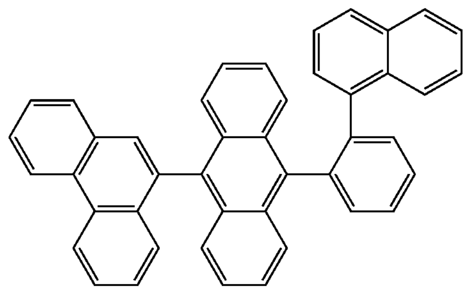
(2-52)
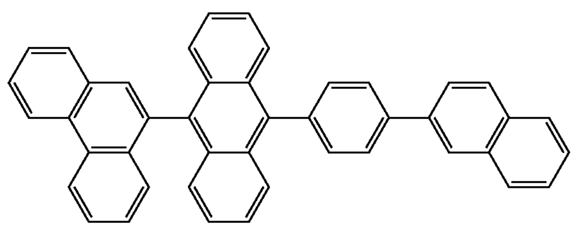
(2-53)
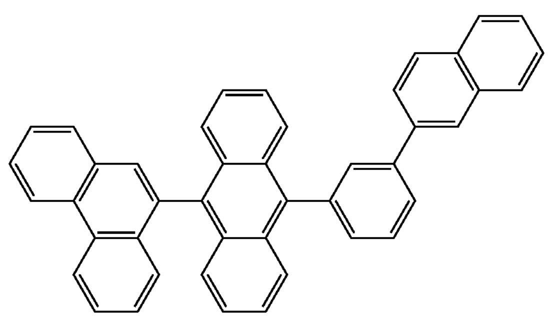
(2-54)
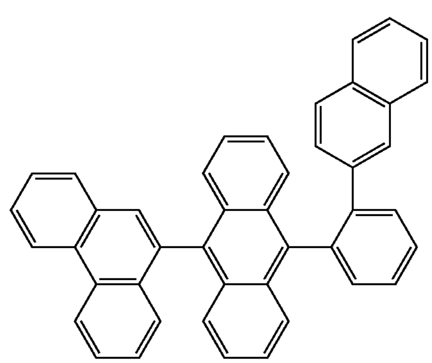

-continued
(2-55)
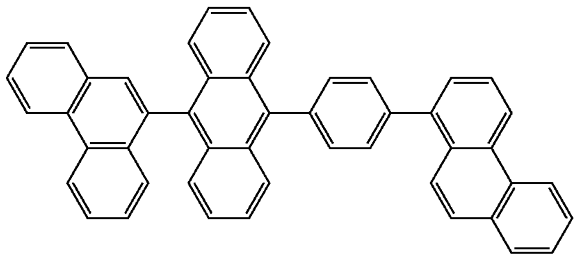
(2-56)
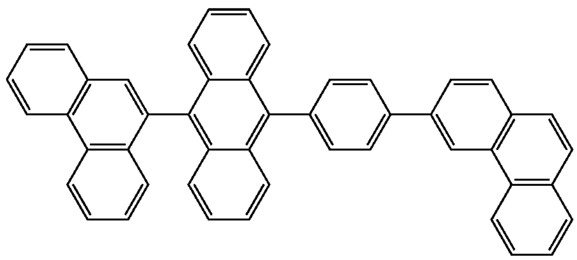
(2-57)
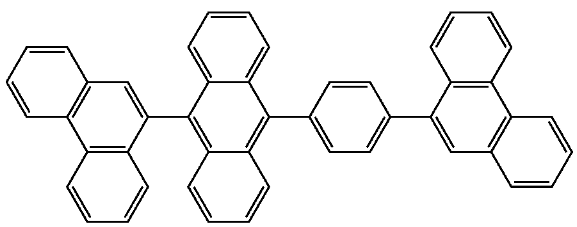
(2-58)
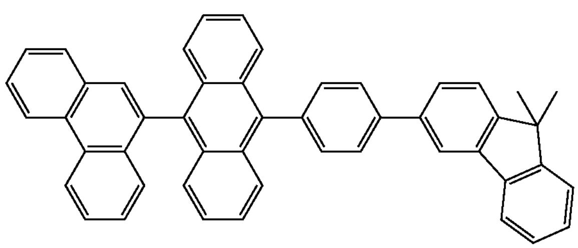
(2-59)
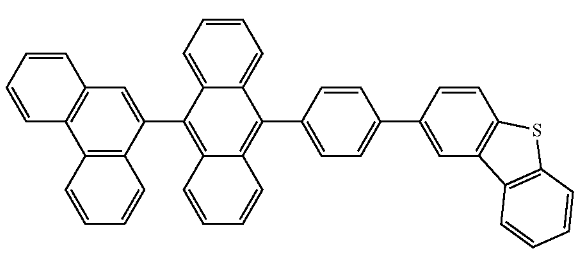
(2-60)
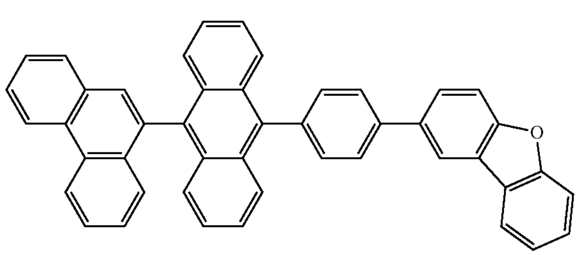
-continued
(2-61)
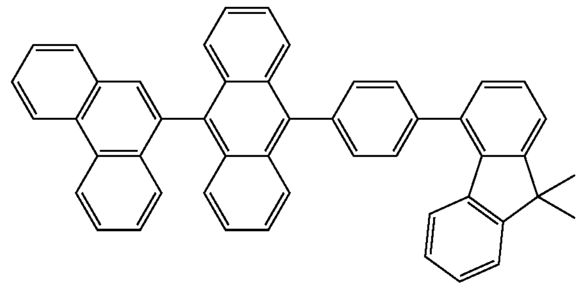
(2-62)
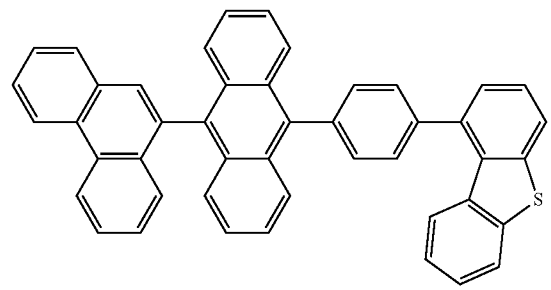
(2-63)
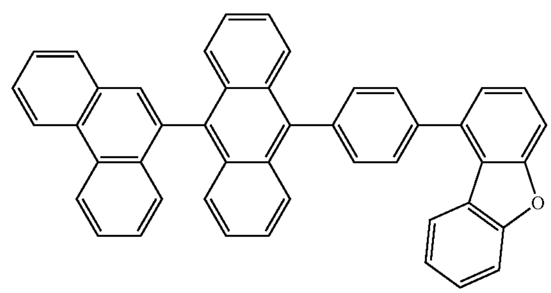
(2-64)
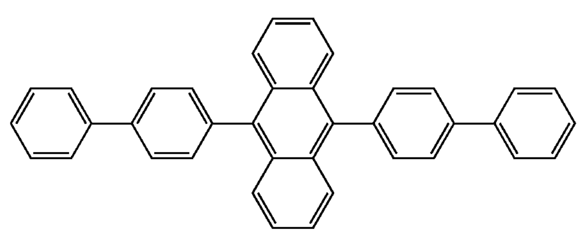
(2-65)
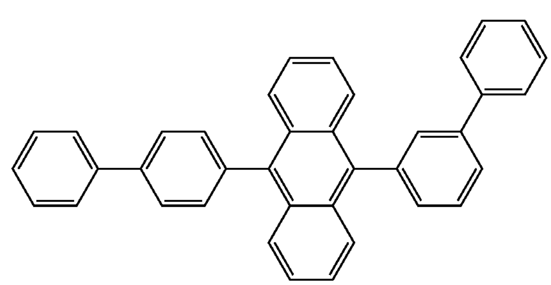

-continued
(2-66)
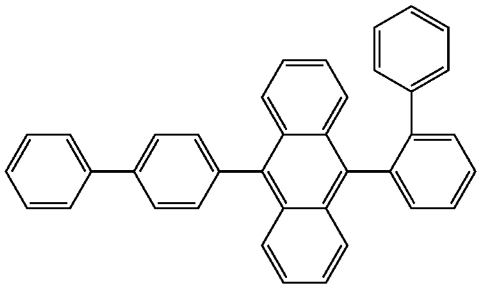
(2-67)
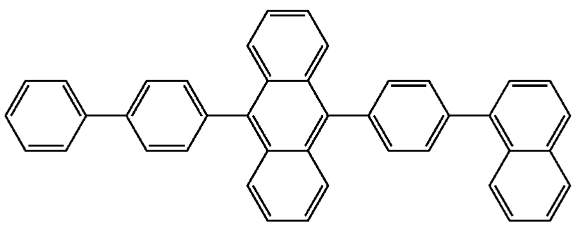
(2-68)
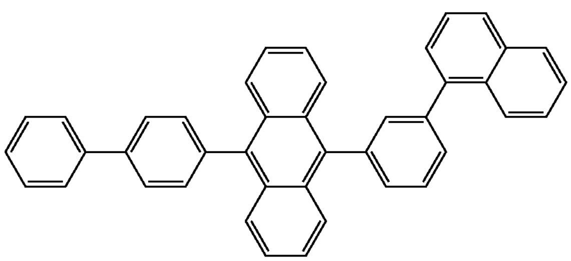
(2-69)
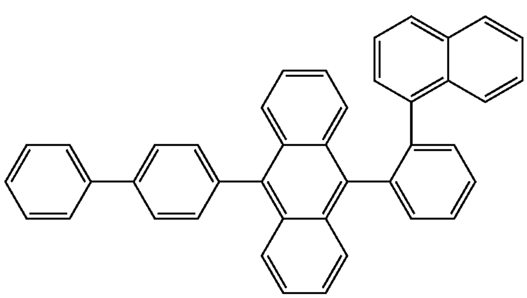
(2-70)
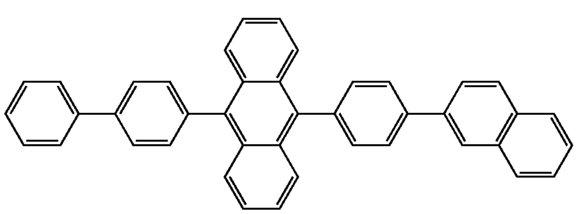
-continued
(2-71)
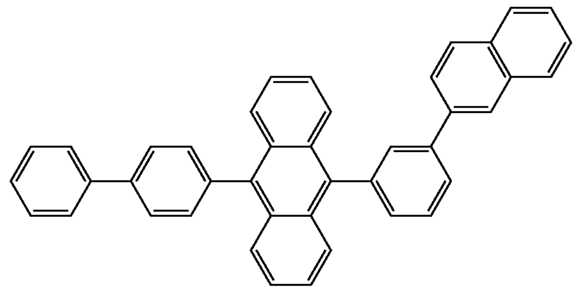
(2-72)
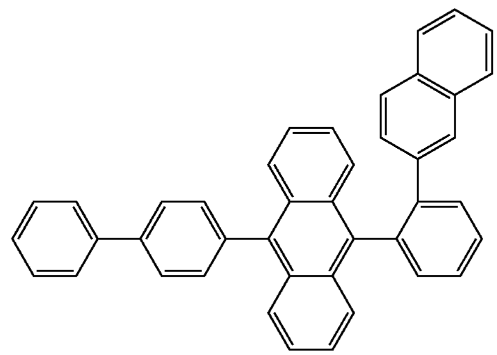
(2-73)
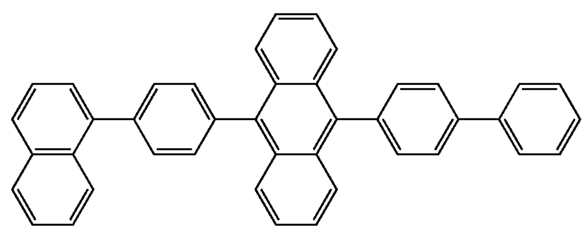
(2-74)
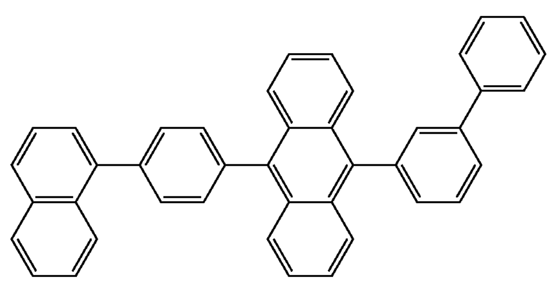
(2-75)
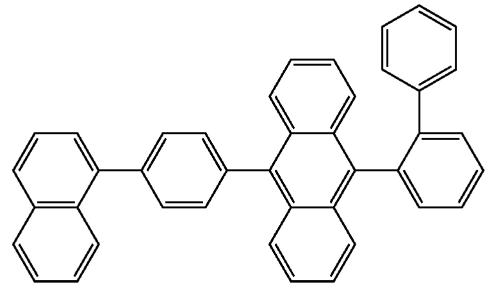

-continued
(2-76)
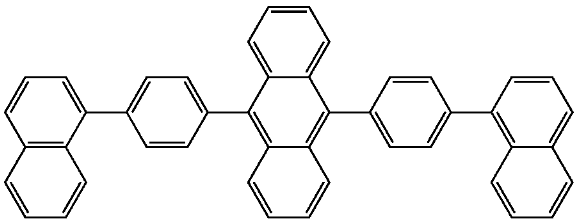
(2-77)
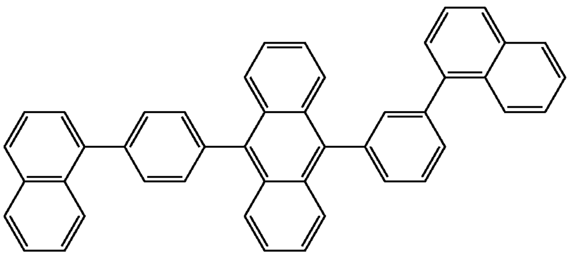
(2-78)
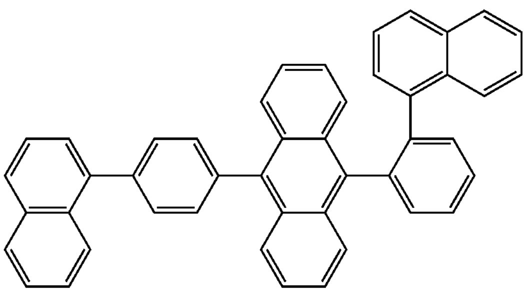
(2-79)
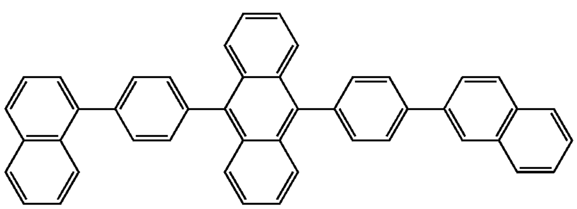
(2-80)
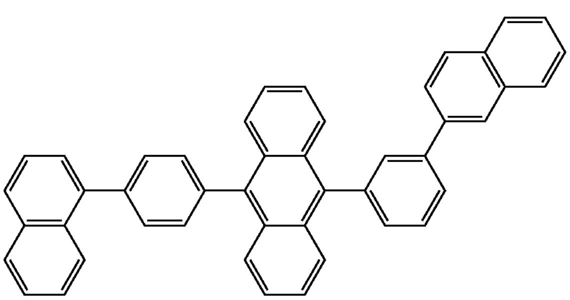
-continued
(2-81)
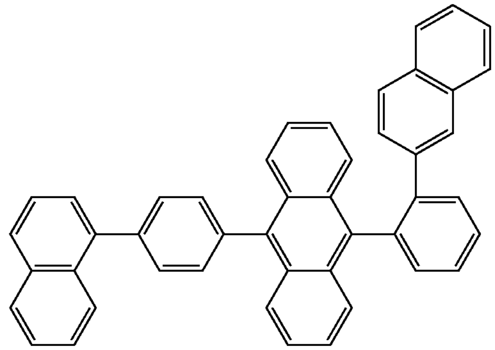
(2-82)
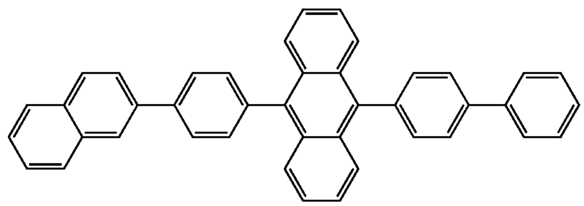
(2-83)
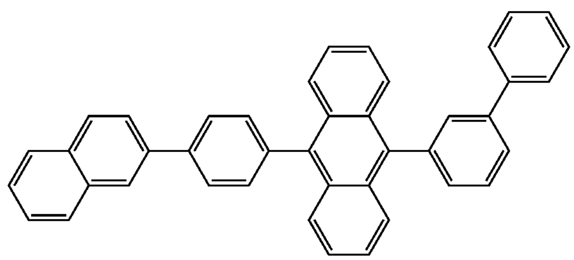
(2-84)
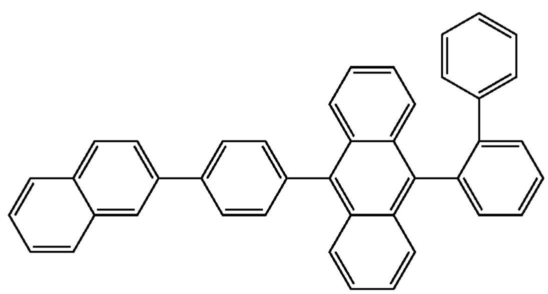
(2-85)
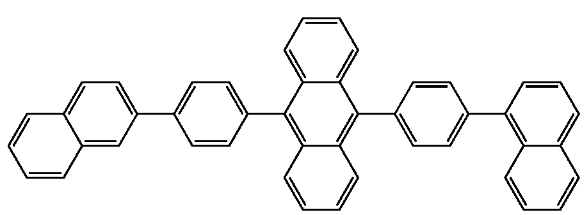

-continued
(2-86)
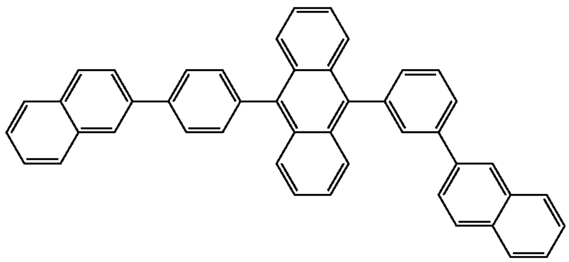
(2-87)
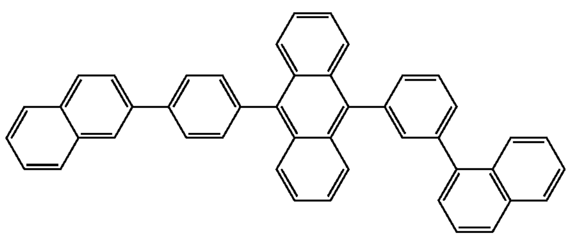
(2-88)
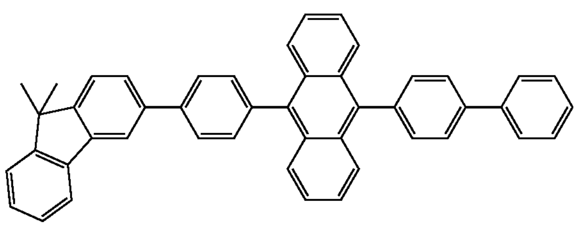
(2-89)
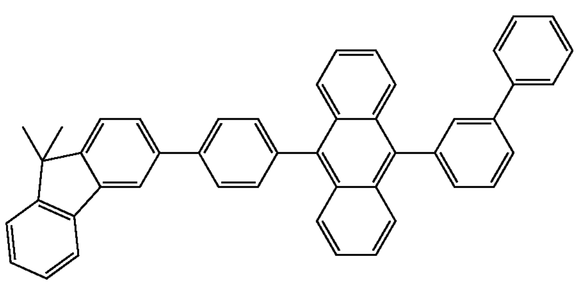
(2-90)
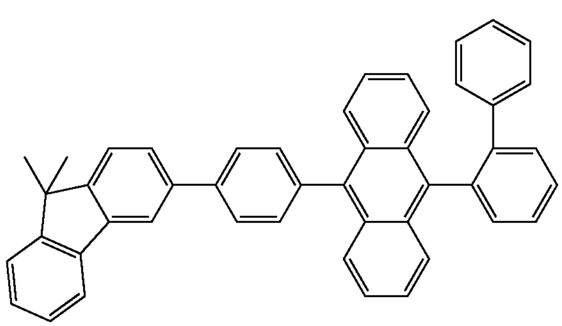
-continued
(2-91)
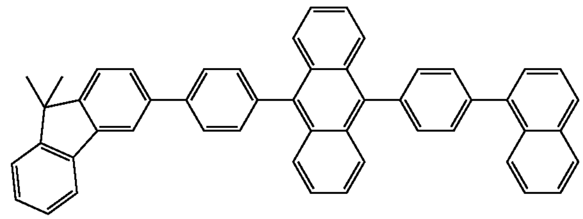
(2-92)
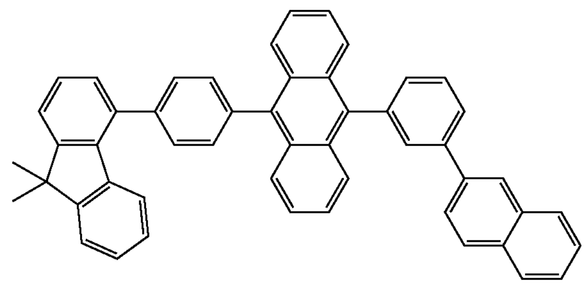
(2-93)
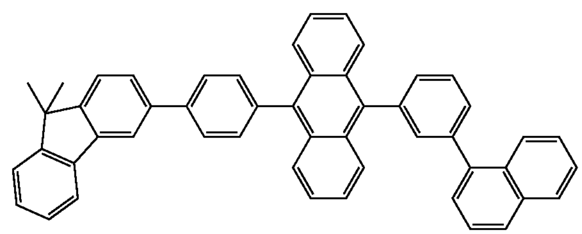
(2-94)
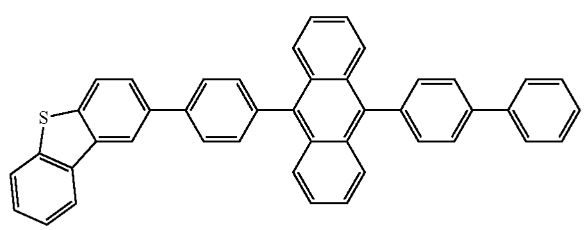
(2-95)
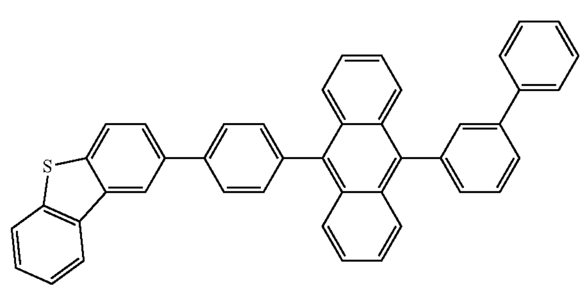

-continued
(2-96)
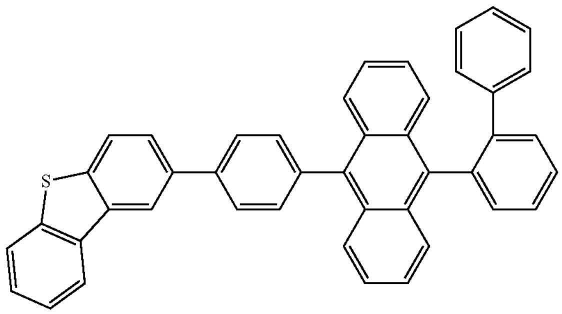
(2-97)
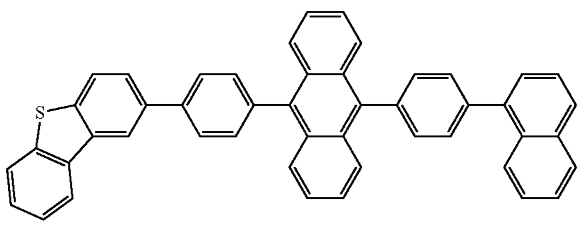
(2-98)
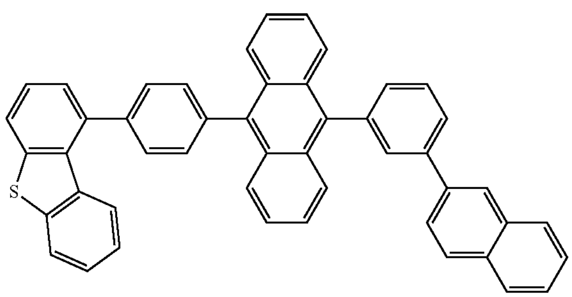
(2-99)
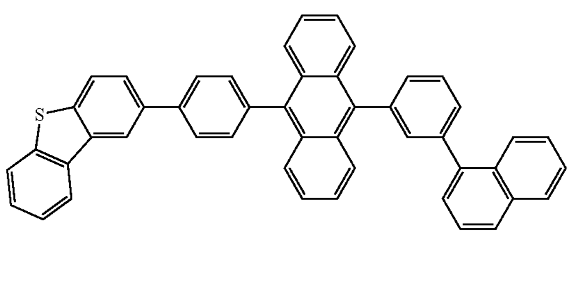
(2-100)
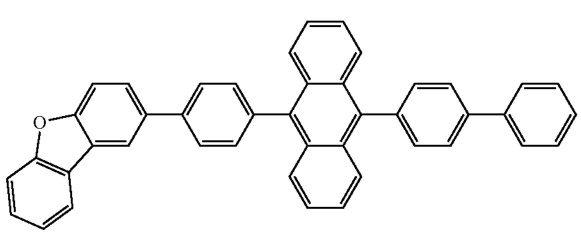
-continued
(2-101)
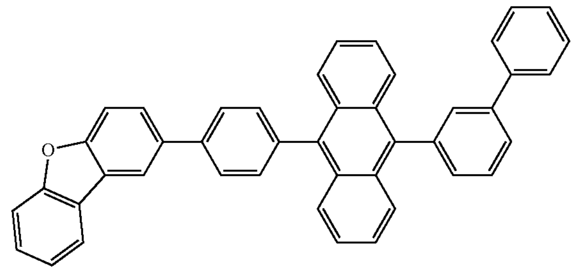
(2-102)
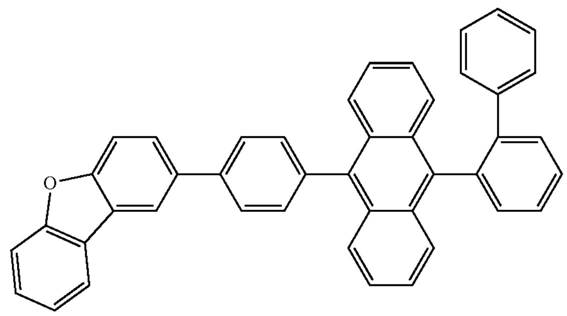
(2-103)
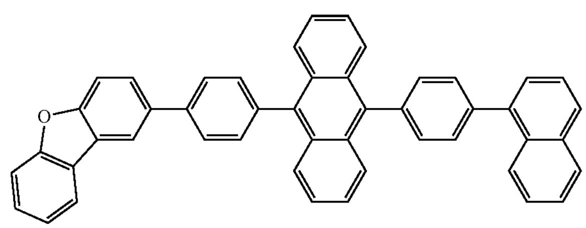
(2-104)
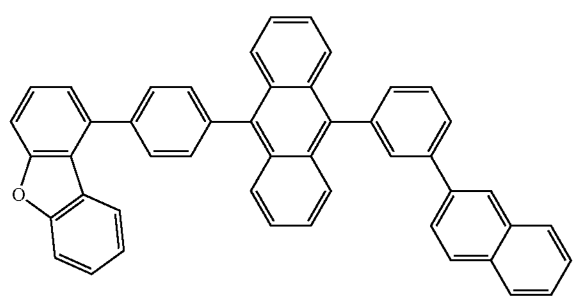
(2-105)
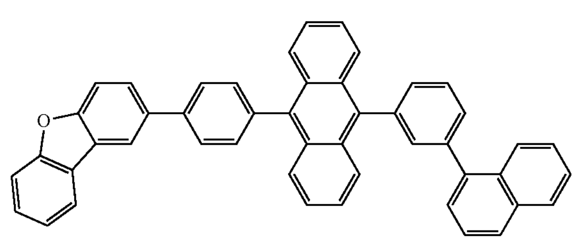

-continued
(2-106)
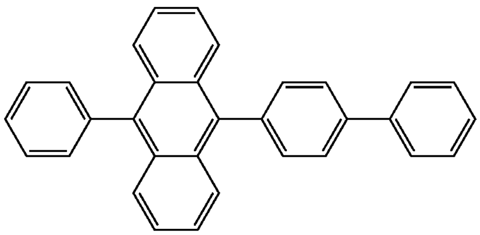
(2-107)
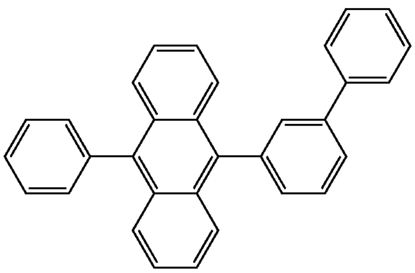
(2-108)
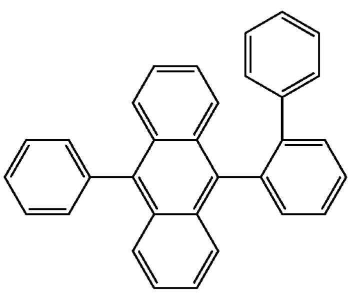
(2-109)
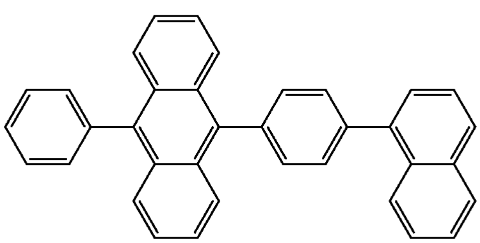
(2-110)
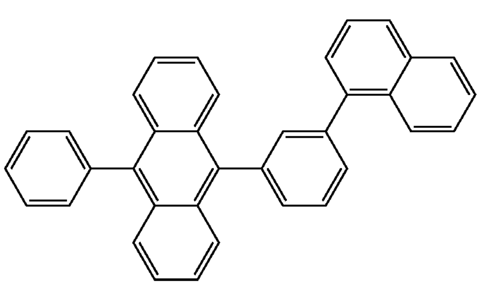
-continued
(2-111)
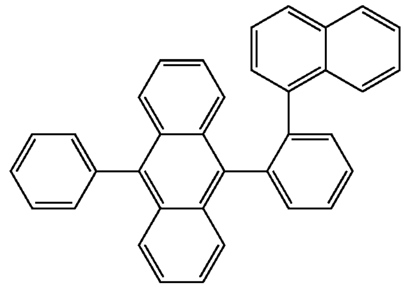
(2-112)
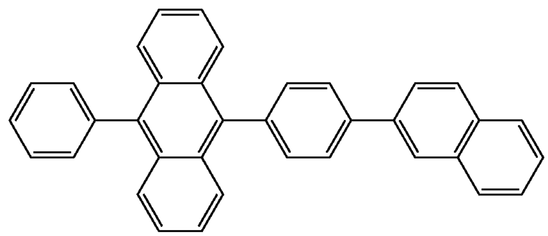
(2-113)
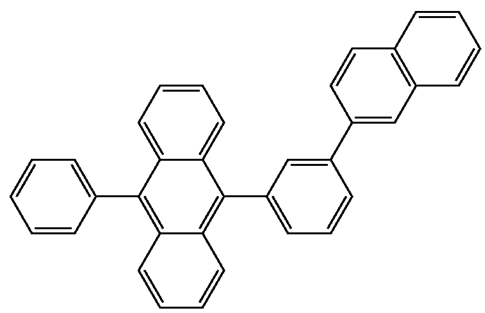
(2-114)
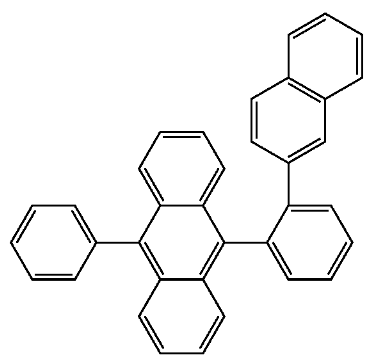
(2-115)
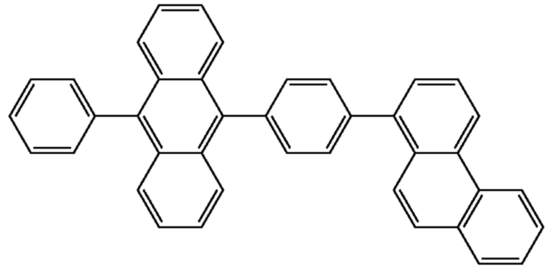

-continued
(2-116)
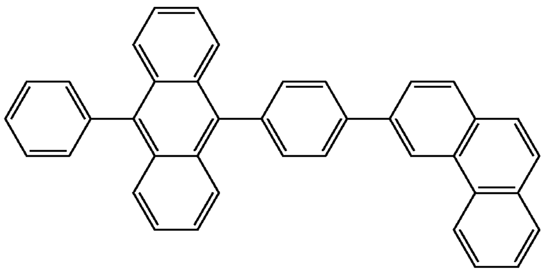
(2-117)
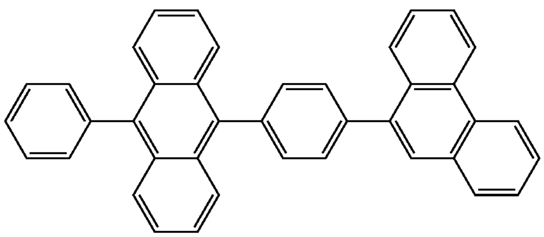
(2-118)
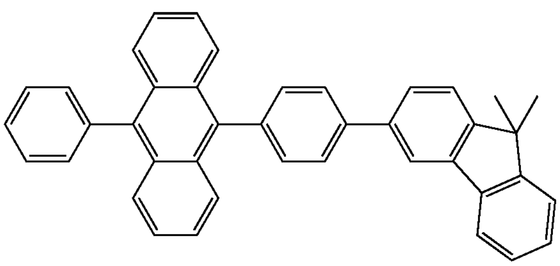
(2-119)
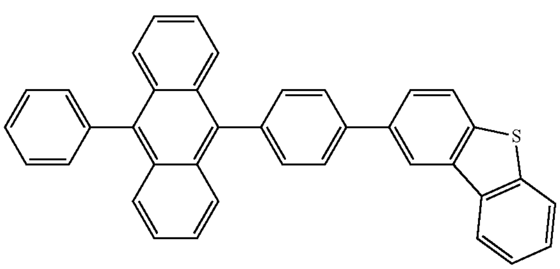
(2-120)
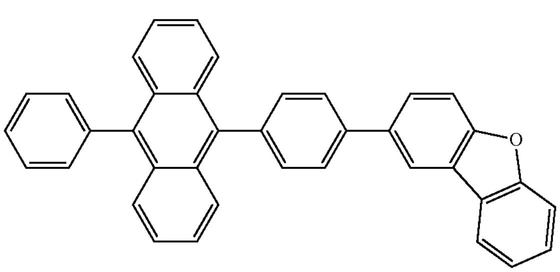
-continued
(2-121)
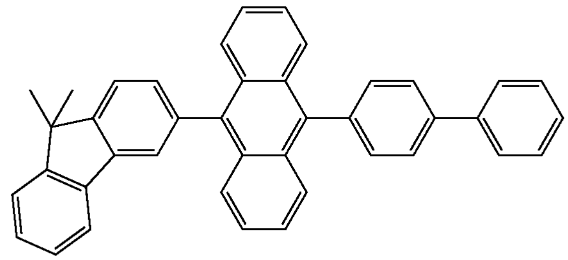
(2-122)
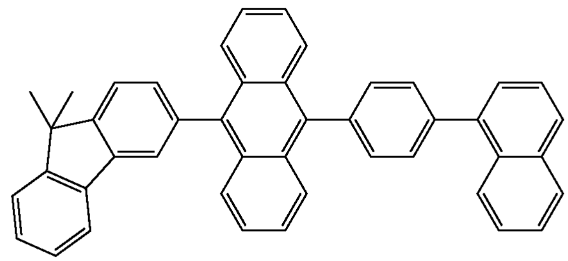
(2-123)
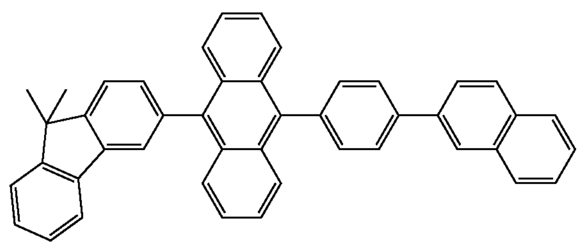
(2-124)
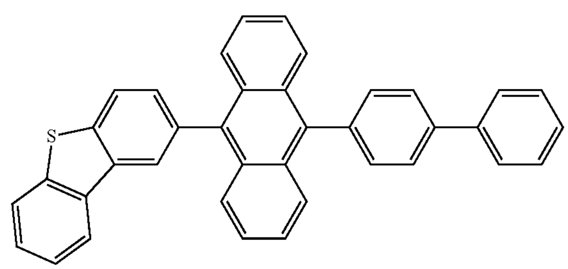
(2-125)
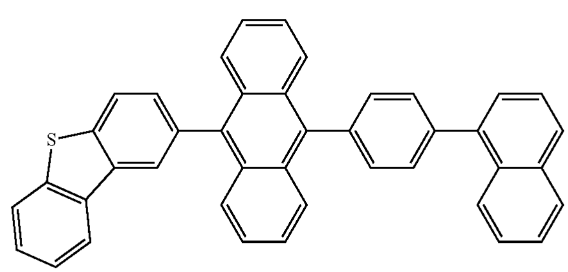

-continued
(2-126)
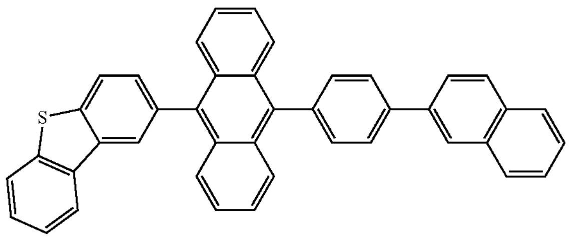
(2-127)
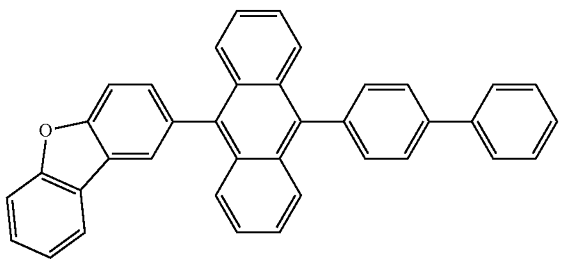
(2-128)
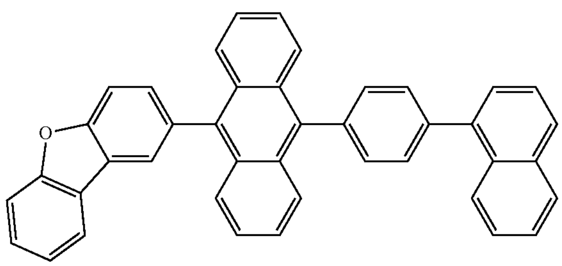
(2-129)
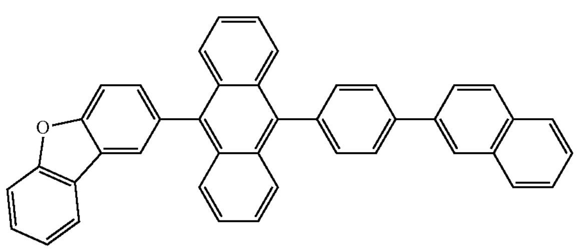
(2-130)
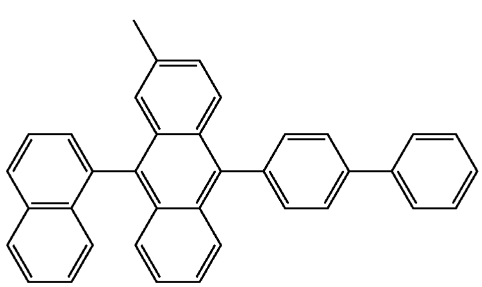
-continued
(2-131)
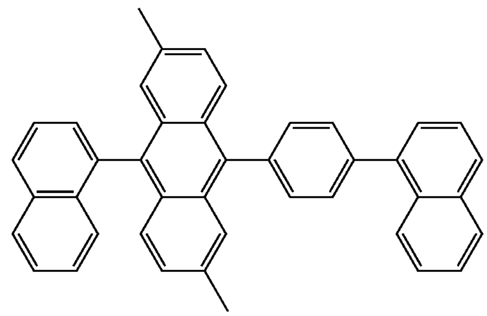
(2-132)
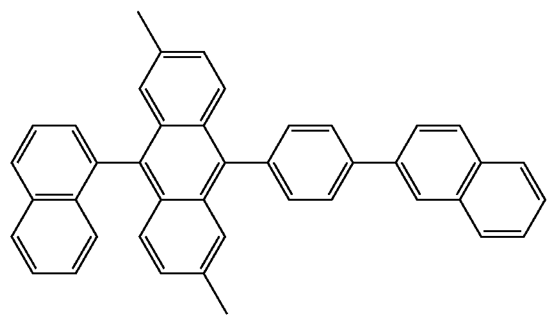
(2-133)
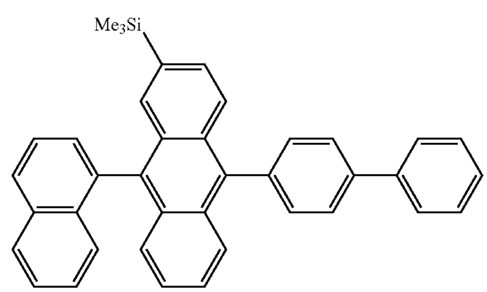
(2-134)
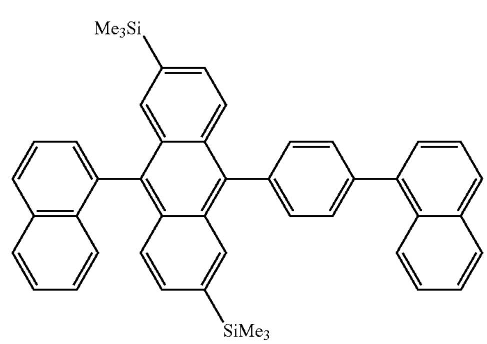

-continued
(2-135)
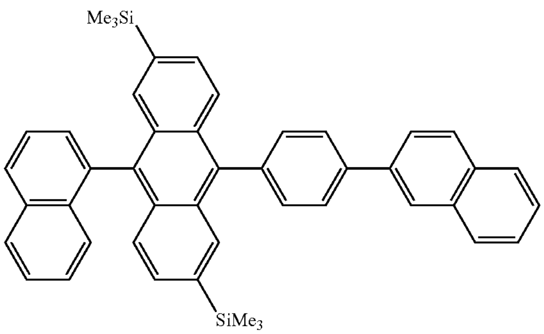
(2-136)
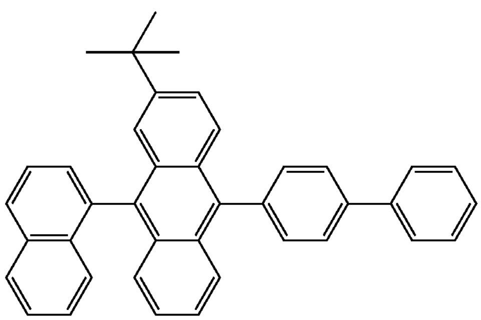
(2-137)
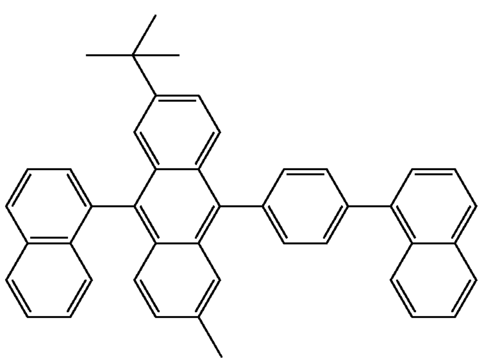
(2-138)
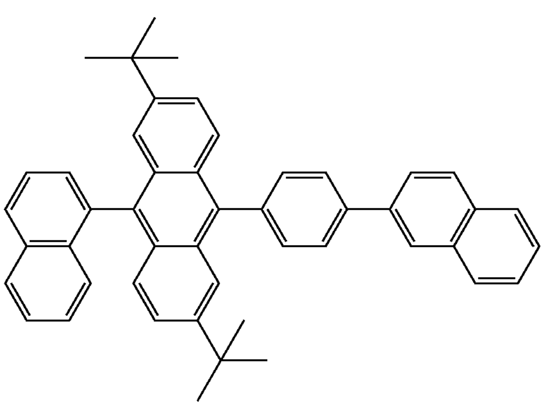
-continued
(2-139)
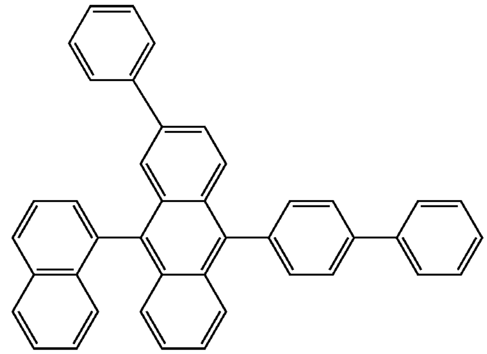
(2-140)
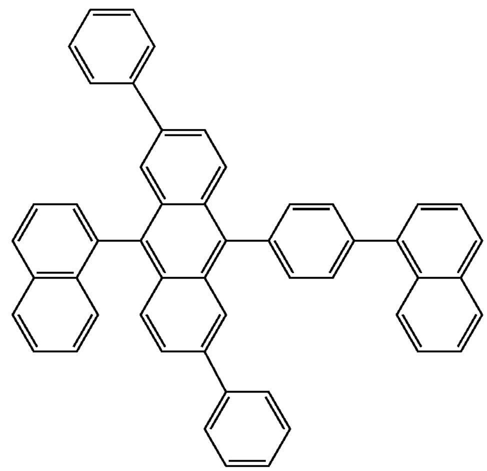
(2-141)
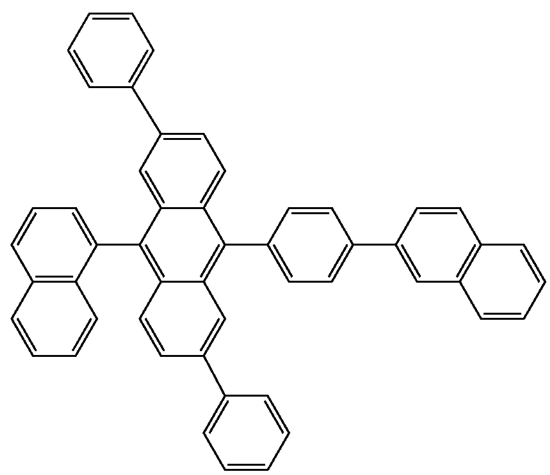
(2-142)
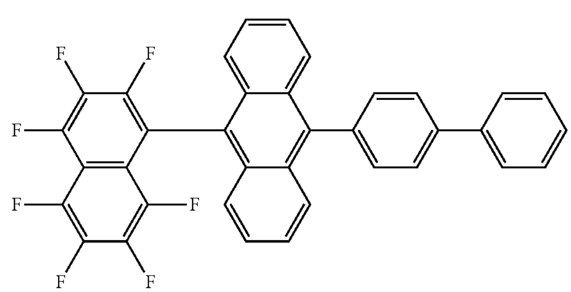

-continued
(2-143)
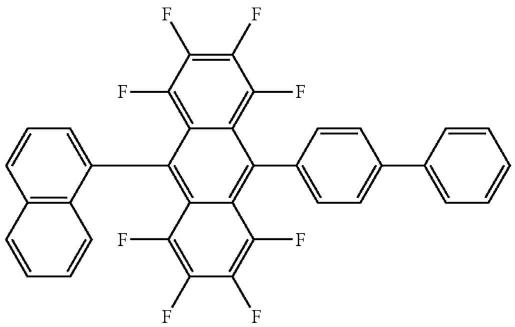
(2-144)
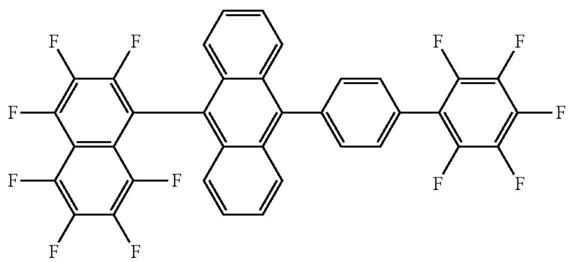
(2-145)
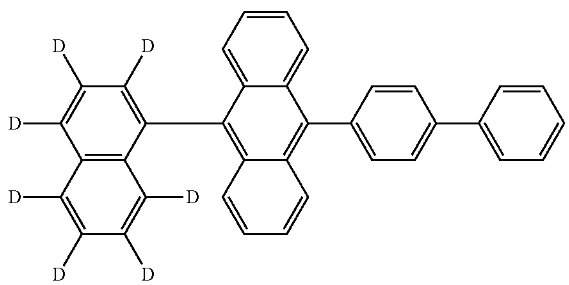
-continued
(2-146)
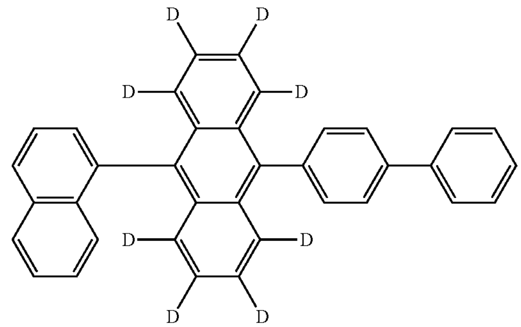
(2-147)
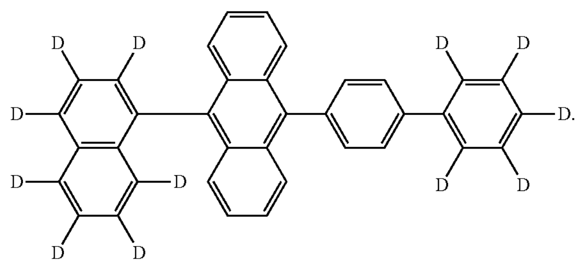
* * * * *